US007940931B1

(12) United States Patent
Harvey et al.

(10) Patent No.: US 7,940,931 B1
(45) Date of Patent: May 10, 2011

(54) SIGNAL PROCESSING APPARATUS AND METHODS

(75) Inventors: John Christopher Harvey, New York, NY (US); James William Cuddihy, New York, NY (US)

(73) Assignee: Personalized Media Communications LLC, New York, NY (US)

( * ) Notice: Subject to any disclaimer, the term of this patent is extended or adjusted under 35 U.S.C. 154(b) by 0 days.

(21) Appl. No.: 08/487,411

(22) Filed: Jun. 7, 1995

Related U.S. Application Data

(63) Continuation of application No. 08/113,329, filed on Aug. 30, 1993, which is a continuation of application No. 08/056,501, filed on May 3, 1993, now Pat. No. 5,335,277, which is a continuation of application No. 07/849,226, filed on Mar. 10, 1992, now Pat. No. 5,233,654, which is a continuation of application No. 07/588,126, filed on Sep. 25, 1990, now Pat. No. 5,109,414, which is a continuation of application No. 07/096,096, filed on Sep. 11, 1987, now Pat. No. 4,965,825, which is a continuation-in-part of application No. 06/829,531, filed on Feb. 14, 1986, now Pat. No. 4,704,725, which is a continuation of application No. 06/317,510, filed on Nov. 3, 1981, now Pat. No. 4,694,490.

(51) Int. Cl.
*H04N 7/18* (2006.01)

(52) U.S. Cl. ........ 380/211; 713/163; 709/245; 709/246; 709/247; 370/270; 725/135

(58) Field of Classification Search .............. 455/2, 3.1, 455/4.1, 4.2, 5.1; 348/6, 7, 10, 12, 13, 16; 380/211; 713/163–165; 709/244–248; 370/270–272; 725/27–28, 31–32
See application file for complete search history.

(56) References Cited

U.S. PATENT DOCUMENTS 33,189 A 9/1861 Dougal
(Continued)

FOREIGN PATENT DOCUMENTS

CA 1216977 6/1983
(Continued)

OTHER PUBLICATIONS

"Automatic Commercial Insertion Equipemnt for Unattended Insertion of Local Advertising", kILLION, "Cablematic Inc.", NCTA1984, pp. 15-22, Dec. 1984.*

(Continued)

*Primary Examiner* — Andy S Rao
(74) *Attorney, Agent, or Firm* — Goodwin Procter LLP

(57) ABSTRACT

A unified system of programming communication. The system encompasses the prior art (television, radio, broadcast hardcopy, computer communications, etc.) and new user specific mass media. Within the unified system, parallel processing computer systems, each having an input (e.g., 77) controlling a plurality of computers (e.g., 205), generate and output user information at receiver stations. Under broadcast control, local computers (73, 205), combine user information selectively into prior art communications to exhibit personalized mass media programming at video monitors (202), speakers (263), printers (221), etc. At intermediate transmission stations (e.g., cable television stations), signals in network broadcasts and from local inputs (74, 77, 97, 98) cause control processors (71) and computers (73) to selectively automate connection and operation of receivers (53), recorder/players (76), computers (73), generators (82), strippers (81), etc. At receiver stations, signals in received transmissions and from local inputs (225, 218, 22) cause control processors (200) and computers (205) to automate connection and operation of converters (201), tuners (215), decryptors (224), recorder/players (217), computers (205), furnaces (206), etc. Processors (71, 200) meter and monitor availability and usage of programming.

8 Claims, 22 Drawing Sheets

U.S. PATENT DOCUMENTS

| | | | | | |
|---|---|---|---|---|---|
| 27,810 | A | | 11/1873 | Buehrle | 325/321 |
| 1,927,702 | A | | 9/1933 | Foss | 705/36 |
| 1,992,271 | A | | 2/1935 | Williams | |
| 2,046,381 | A | | 7/1936 | Hicks et al. | |
| 2,117,638 | A | | 5/1938 | Walter | |
| 2,192,217 | A | | 3/1940 | Bellamy et al. | |
| 2,217,881 | A | | 10/1940 | Allen | |
| 2,236,077 | A | | 3/1941 | Smith | |
| 2,264,563 | A | | 12/1941 | Burnstead | |
| 2,418,127 | A | | 4/1947 | Labin | 178/44 |
| 2,511,085 | A | | 6/1950 | Smith | 381/104 |
| 2,563,448 | A | | 8/1951 | Aram | 178/5.1 |
| 2,570,209 | A | | 10/1951 | Cotsworth, III | |
| 2,573,349 | A | | 10/1951 | Miller et al. | 725/14 |
| 2,731,197 | A | | 1/1956 | Parker et al. | 235/60 |
| 2,769,023 | A | | 10/1956 | Loew et al. | 725/143 |
| 2,788,387 | A | | 4/1957 | Druz | 380/320 |
| 2,855,993 | A | | 10/1958 | Rahmel | 358/84 |
| 2,864,865 | A | | 12/1958 | Morris | 568/430 |
| 2,864,885 | A | | 12/1958 | Morris | 178/5.1 |
| 2,866,962 | A | | 12/1958 | Ellet | 380/227 |
| 2,969,427 | A | | 1/1961 | See | 348/705 |
| 2,995,624 | A | | 8/1961 | Watters | |
| 3,008,000 | A | | 11/1961 | Morchand | 725/138 |
| 3,011,153 | A | | 11/1961 | Haselton et al. | |
| 3,016,091 | A | | 1/1962 | Daniele | 162/391 |
| 3,029,308 | A | | 4/1962 | Adler et al. | |
| 3,071,642 | A | | 1/1963 | Mountjoy et al. | 725/151 |
| 3,071,649 | A | | 1/1963 | Goodall | 179/1.5 |
| 3,082,402 | A | | 3/1963 | Scantlin | |
| 3,107,274 | A | | 10/1963 | Roschke | 178/5.1 |
| 3,133,986 | A | | 5/1964 | Morris et al. | 178/5.1 |
| 3,213,201 | A | | 10/1965 | Flood et al. | 370/381 |
| 3,238,297 | A | | 3/1966 | Pawley et al. | 380/240 |
| 3,244,806 | A | | 4/1966 | Morris | 725/151 |
| 3,251,051 | A | | 5/1966 | Harries | 340/345 |
| RE26,331 | E | | 1/1968 | Borthman et al. | |
| 3,363,250 | A | | 1/1968 | Jacobson | 340/825.17 |
| 3,366,731 | A | | 1/1968 | Wallerstein | |
| 3,368,031 | A | | 2/1968 | Eisele | |
| 3,371,071 | A | | 2/1968 | Webb | 428/355 EN |
| 3,387,082 | A | | 6/1968 | Farber et al. | |
| 3,387,083 | A | | 6/1968 | Farber et al. | |
| 3,387,268 | A | | 6/1968 | Epstein | 340/825.26 |
| 3,390,234 | A | | 6/1968 | Glidden | |
| 3,430,004 | A | | 2/1969 | Shenk | |
| 3,470,309 | A | | 9/1969 | Nyberg | 178/5.1 |
| 3,472,962 | A | | 10/1969 | Sanford | |
| 3,475,547 | A | | 10/1969 | Sarlund | |
| 3,478,166 | A | | 11/1969 | Reiter et al. | 178/5.1 |
| 3,478,342 | A | | 11/1969 | Alldritt et al. | |
| 3,485,946 | A | * | 12/1969 | Jackson et al. | 455/3.1 |
| 3,493,674 | A | | 2/1970 | Houghton | 178/5.6 |
| 3,526,843 | A | | 9/1970 | Sanville | 329/104 |
| 3,531,583 | A | | 9/1970 | Walker | 380/230 |
| 3,531,586 | A | | 9/1970 | Bass et al. | 725/151 |
| 3,536,833 | A | | 10/1970 | Guanella | 380/28 |
| 3,546,684 | A | | 12/1970 | Maxwell et al. | 340/172.5 |
| 3,569,937 | A | | 3/1971 | Heatter | 340/825.75 |
| 3,573,747 | A | | 4/1971 | Adams et al. | 705/37 |
| 3,584,142 | A | | 6/1971 | Schoeffler | 178/6.8 |
| 3,586,767 | A | * | 6/1971 | Morchand | 348/4 |
| 3,586,771 | A | | 6/1971 | Hamburger et al. | 725/1 |
| 3,588,357 | A | | 6/1971 | Sellari | |
| 3,601,528 | A | | 8/1971 | McVoy | 724/143 |
| 3,602,891 | A | | 8/1971 | Clark et al. | 340/172.5 |
| 3,606,688 | A | * | 9/1971 | Zawels et al. | 455/3.1 |
| 3,609,697 | A | | 9/1971 | Blevins et al. | 717/2 |
| 3,612,752 | A | | 10/1971 | Banning, Jr. | 178/5.1 |
| 3,624,516 | A | | 11/1971 | Rando et al. | |
| 3,627,914 | A | | 12/1971 | Davies | 348/722 |
| 3,639,686 | A | | 2/1972 | Walker et al. | 178/5.8 R |
| 3,648,270 | A | | 3/1972 | Metz et al. | 345/24 |
| 3,649,749 | A | | 3/1972 | Gibson | 178/5.6 |
| 3,651,261 | A | | 3/1972 | Guanella | 178/22 |
| 3,651,471 | A | | 3/1972 | Haselwood et al. | 340/172.5 |
| 3,657,699 | A | | 4/1972 | Rocher et al. | 380/265 |
| 3,659,046 | A | | 4/1972 | Angeleri et al. | 380/43 |
| 3,666,888 | A | | 5/1972 | Sekimoto | 178/69.5 TV |
| 3,668,307 | A | | 6/1972 | Face et al. | 178/5.6 |
| 3,676,580 | A | | 7/1972 | Beck | 725/16 |
| 3,684,823 | A | | 8/1972 | McVoy | 178/5.1 |
| 3,693,090 | A | | 9/1972 | Gabriel | 725/1 |
| 3,696,297 | A | * | 10/1972 | Otero | 455/3.1 |
| 3,703,684 | A | | 11/1972 | McVoy | 725/16 |
| 3,716,835 | A | | 2/1973 | Weinberg et al. | 340/825.27 |
| 3,723,637 | A | | 3/1973 | Fujio et al. | 178/5.2 R |
| 3,725,672 | A | | 4/1973 | Reuter | 327/176 |
| 3,729,581 | A | | 4/1973 | Anderson | 348/640 |
| 3,731,197 | A | | 5/1973 | Clark | 380/36 |
| 3,733,430 | A | * | 5/1973 | Thompson et al. | 455/2 |
| 3,733,431 | A | | 5/1973 | Kirk, Jr. et al. | 178/5.1 |
| 3,736,369 | A | | 5/1973 | Vogelman et al. | 380/228 |
| 3,737,858 | A | | 6/1973 | Turner et al. | |
| 3,744,043 | A | | 7/1973 | Walden et al. | 340/870.7 |
| 3,746,780 | A | | 7/1973 | Stetten et al. | 386/95 |
| 3,746,799 | A | | 7/1973 | Gentges | 178/22 |
| 3,749,845 | A | | 7/1973 | Fraser | 370/433 |
| 3,752,908 | A | | 8/1973 | Boenke et al. | 178/5.6 |
| 3,754,211 | A | | 8/1973 | Rocher et al. | 714/749 |
| 3,755,624 | A | | 8/1973 | Sekimoto | 178/69.5 TV |
| 3,757,225 | A | | 9/1973 | Ulicki | 725/1 |
| 3,761,888 | A | | 9/1973 | Flynn | 710/18 |
| 3,764,983 | A | | 10/1973 | Stok | 340/150 |
| 3,769,579 | A | | 10/1973 | Harney | 325/31 |
| 3,773,977 | A | | 11/1973 | Guanella | 380/36 |
| 3,773,979 | A | | 11/1973 | Kirk, Jr. et al. | 179/15 FD |
| 3,777,053 | A | | 12/1973 | Wittig et al. | 178/5.1 |
| 3,778,058 | A | | 12/1973 | Rausch | 463/3 |
| 3,778,715 | A | | 12/1973 | Schmidt et al. | |
| 3,778,721 | A | * | 12/1973 | Moran | 455/181.1 |
| 3,789,131 | A | | 1/1974 | Harney | 178/5.1 |
| 3,789,137 | A | | 1/1974 | Newell | 386/98 |
| 3,790,700 | A | | 2/1974 | Callais et al. | 178/5.1 |
| 3,794,922 | A | | 2/1974 | Osborn et al. | 325/53 |
| 3,795,763 | A | | 3/1974 | Golding et al. | 178/5.6 |
| 3,798,359 | A | | 3/1974 | Feistel | 380/37 |
| 3,798,610 | A | | 3/1974 | Bliss et al. | 709/236 |
| 3,803,491 | A | | 4/1974 | Osborn | 325/53 |
| 3,806,814 | A | | 4/1974 | Forbes | 725/119 |
| 3,813,482 | A | | 5/1974 | Blonder | 178/5.1 |
| 3,819,852 | A | | 6/1974 | Wolf | 348/478 |
| 3,824,332 | A | | 7/1974 | Horowitz | 380/222 |
| 3,824,467 | A | | 7/1974 | French | 380/35 |
| 3,825,893 | A | | 7/1974 | Bossen et al. | 714/757 |
| 3,826,863 | A | | 7/1974 | Johnson | 178/5.1 |
| 3,833,757 | A | | 9/1974 | Kirk, Jr. et al. | 725/144 |
| 3,835,387 | A | | 9/1974 | Rooks et al. | 725/151 |
| 3,842,196 | A | | 10/1974 | Loughlin | 348/486 |
| 3,842,206 | A | | 10/1974 | Barsellotti et al. | |
| 3,845,391 | A | | 10/1974 | Crosby | 455/39 |
| 3,848,082 | A | * | 11/1974 | Summers | 348/460 |
| 3,848,193 | A | | 11/1974 | Martin et al. | 325/53 |
| 3,849,729 | A | | 11/1974 | Van Baggem | 325/31 |
| 3,858,240 | A | | 12/1974 | Golding et al. | |
| 3,859,458 | A | | 1/1975 | Takezawa et al. | 348/24 |
| 3,859,596 | A | | 1/1975 | Jannery et al. | 325/31 |
| 3,882,289 | A | | 5/1975 | Walding et al. | 200/11 D |
| 3,882,392 | A | | 5/1975 | Harney | 725/79 |
| 3,885,089 | A | | 5/1975 | Callais et al. | 178/5.1 |
| 3,886,302 | A | | 5/1975 | Kosco | 178/5.1 |
| 3,886,454 | A | | 5/1975 | Oakley et al. | 325/52 |
| 3,889,054 | A | | 6/1975 | Nagel et al. | 178/6.8 |
| 3,890,461 | A | | 6/1975 | Vogelman et al. | 380/228 |
| 3,891,792 | A | | 6/1975 | Kimura | 348/622 |
| 3,893,031 | A | | 7/1975 | Majeau et al. | 380/274 |
| 3,894,176 | A | | 7/1975 | Mellon | 380/230 |
| 3,894,177 | A | | 7/1975 | Howell et al. | 178/5.6 |
| 3,896,262 | A | | 7/1975 | Hudspeth et al. | 178/5.1 |
| 3,896,266 | A | | 7/1975 | Waterbury | 179/1 SB |
| 3,898,378 | A | | 8/1975 | Hinoshita et al. | |
| 3,899,633 | A | | 8/1975 | Sorenson et al. | 380/207 |
| 3,899,639 | A | | 8/1975 | Cleveley et al. | |
| 3,906,450 | A | | 9/1975 | Prado, Jr. | 340/150 |
| 3,909,512 | A | | 9/1975 | Omori et al. | 386/75 |
| 3,911,216 | A | | 10/1975 | Bartek et al. | 380/46 |
| 3,911,419 | A | | 10/1975 | Bates et al. | 345/162 |

| | | | | | |
|---|---|---|---|---|---|
| 3,914,534 | A | | 10/1975 | Forbes | 380/220 |
| 3,916,091 | A | | 10/1975 | Kirk, Jr. et al. | 178/5.1 |
| 3,919,462 | A | | 11/1975 | Hartung et al. | 380/235 |
| 3,921,151 | A | | 11/1975 | Guanella | 380/36 |
| 3,922,482 | A | | 11/1975 | Gabriel et al. | 725/31 |
| 3,922,492 | A | | 11/1975 | Lumsden | |
| 3,924,059 | A | | 12/1975 | Horowitz | 178/5.1 |
| 3,924,187 | A | | 12/1975 | Dormans | 325/52 |
| 3,934,079 | A | | 1/1976 | Barnhart | 725/131 |
| 3,936,593 | A | | 2/1976 | Aaronson et al. | 380/219 |
| 3,936,594 | A | | 2/1976 | Schubin et al. | 380/238 |
| 3,936,595 | A | * | 2/1976 | Yanagimachi et al. | 348/24 |
| 3,943,447 | A | | 3/1976 | Shomo, III | 325/308 |
| 3,944,931 | A | | 3/1976 | Usami et al. | 455/192.2 |
| 3,947,624 | A | | 3/1976 | Miyake | 178/6 |
| 3,947,882 | A | | 3/1976 | Lightner | 360/92 |
| 3,947,972 | A | | 4/1976 | Freeman | 35/8 A |
| 3,949,313 | A | | 4/1976 | Tamada et al. | 341/50 |
| 3,950,618 | A | | 4/1976 | Bloisi | 179/2 AS |
| 3,956,615 | A | | 5/1976 | Anderson et al. | 705/72 |
| 3,958,081 | A | | 5/1976 | Ehrsam et al. | 178/22 |
| 3,958,088 | A | | 5/1976 | Vieri | |
| 3,961,137 | A | * | 6/1976 | Hutt et al. | 348/2 |
| 3,962,535 | A | | 6/1976 | Haskell | |
| 3,970,790 | A | | 7/1976 | Guanella | 380/36 |
| 3,971,888 | A | | 7/1976 | Ching et al. | |
| 3,973,206 | A | | 8/1976 | Haselwood et al. | 325/455 |
| 3,974,451 | A | | 8/1976 | Maeder | |
| 3,975,583 | A | * | 8/1976 | Meadows | 348/460 |
| 3,975,585 | A | | 8/1976 | Kirk, Jr. et al. | 178/5.1 |
| 3,978,449 | A | | 8/1976 | Sanders et al. | 714/823 |
| 3,987,397 | A | | 10/1976 | Belcher et al. | 325/308 |
| 3,987,398 | A | | 10/1976 | Fung | 725/127 |
| 3,988,528 | A | | 10/1976 | Yanagimachi et al. | 348/24 |
| 3,988,550 | A | | 10/1976 | Ts'ao | |
| 3,990,012 | A | | 11/1976 | Karnes | 325/308 |
| 3,990,050 | A | | 11/1976 | Kolettis et al. | 710/23 |
| 3,993,955 | A | | 11/1976 | Belcher et al. | 725/33 |
| 3,996,586 | A | | 12/1976 | Dillon et al. | 340/347 DD |
| 3,997,718 | A | | 12/1976 | Ricketts et al. | 725/114 |
| 4,004,085 | A | | 1/1977 | Makino et al. | 340/324 |
| 4,006,297 | A | | 2/1977 | Koga | |
| 4,008,369 | A | | 2/1977 | Theurer et al. | 358/84 |
| 4,011,414 | A | | 3/1977 | Warren | |
| 4,013,875 | A | | 3/1977 | McGlynn | 235/150.2 |
| 4,015,286 | A | | 3/1977 | Russell | 358/13 |
| 4,017,697 | A | | 4/1977 | Larson | 200/5 A |
| 4,019,201 | A | | 4/1977 | Hartung et al. | 358/124 |
| 4,020,419 | A | | 4/1977 | Caspari et al. | 325/421 |
| 4,024,574 | A | | 5/1977 | Nieson | 358/117 |
| 4,024,575 | A | | 5/1977 | Harney et al. | 358/118 |
| 4,025,851 | A | * | 5/1977 | Haselwood et al. | 455/3.1 |
| 4,025,947 | A | | 5/1977 | Michael | 348/705 |
| 4,025,948 | A | | 5/1977 | Loshin | 380/228 |
| 4,027,100 | A | | 5/1977 | Ishiguro | |
| 4,027,267 | A | | 5/1977 | Larsen | 329/106 |
| 4,027,331 | A | | 5/1977 | Nicol | 358/135 |
| 4,031,543 | A | | 6/1977 | Holz | |
| 4,031,548 | A | | 6/1977 | Kato et al. | 358/188 |
| 4,034,990 | A | | 7/1977 | Baer | |
| 4,035,838 | A | * | 7/1977 | Bassani et al. | 348/2 |
| 4,042,958 | A | | 8/1977 | Saylor et al. | 358/141 |
| 4,044,376 | A | | 8/1977 | Porter | 358/84 |
| 4,045,811 | A | | 8/1977 | Dingwall | |
| 4,045,814 | A | | 8/1977 | Hartung et al. | 358/124 |
| 4,047,221 | A | | 9/1977 | Yasuda et al. | |
| 4,048,562 | A | | 9/1977 | Haselwood et al. | 325/31 |
| 4,048,619 | A | | 9/1977 | Forman, Jr. et al. | 370/485 |
| 4,049,906 | A | | 9/1977 | Hafner et al. | 178/2 C |
| 4,052,737 | A | * | 10/1977 | Robertson et al. | 348/6 |
| 4,054,911 | A | * | 10/1977 | Fletcher et al. | 348/463 |
| 4,056,684 | A | | 11/1977 | Lindstrom | |
| 4,058,830 | A | | 11/1977 | Gulnet et al. | 380/212 |
| 4,059,729 | A | | 11/1977 | Eddy et al. | 179/15 BF |
| 4,060,832 | A | | 11/1977 | Devimeux et al. | |
| 4,061,577 | A | | 12/1977 | Bell | |
| 4,061,879 | A | | 12/1977 | Wintzer | 179/15 BA |
| 4,064,490 | A | * | 12/1977 | Nagel | 395/200.09 |
| 4,068,264 | A | | 1/1978 | Pires | 380/233 |
| 4,068,265 | A | | 1/1978 | Russell | |
| 4,070,693 | A | | 1/1978 | Shutterly | 358/123 |
| 4,075,660 | A | | 2/1978 | Horowitz | 358/124 |
| 4,078,316 | A | | 3/1978 | Freeman | 35/8 A |
| 4,079,419 | A | | 3/1978 | Siegle et al. | 358/193 |
| 4,081,612 | A | | 3/1978 | Hafner | 370/393 |
| 4,081,753 | A | | 3/1978 | Miller | 455/158.2 |
| 4,081,754 | A | | 3/1978 | Jackson | 325/396 |
| 4,081,831 | A | | 3/1978 | Tang et al. | 358/114 |
| 4,081,832 | A | | 3/1978 | Sherman | |
| 4,086,434 | A | | 4/1978 | Bocchi | 79/2 AM |
| 4,088,958 | A | | 5/1978 | Suzuki et al. | 325/396 |
| 4,091,417 | A | | 5/1978 | Nieson | 358/117 |
| 4,095,258 | A | | 6/1978 | Sperber | 358/120 |
| 4,096,542 | A | | 6/1978 | Pappas et al. | 361/196 |
| 4,104,486 | A | | 8/1978 | Martin et al. | 379/106.06 |
| 4,104,681 | A | | 8/1978 | Saylor et al. | 358/141 |
| 4,107,734 | A | | 8/1978 | Percy et al. | 358/84 |
| 4,107,735 | A | | 8/1978 | Frohbach | 358/84 |
| 4,112,317 | A | | 9/1978 | Everswick | 307/308 |
| 4,112,383 | A | | 9/1978 | Burgert | 329/50 |
| 4,112,464 | A | | 9/1978 | Gulf et al. | 380/241 |
| 4,114,841 | A | | 9/1978 | Muhlfelder et al. | 244/166 |
| 4,115,662 | A | | 9/1978 | Gulnet et al. | 380/212 |
| 4,115,807 | A | | 9/1978 | Pires | 380/233 |
| 4,117,605 | A | | 10/1978 | Kurland et al. | 35/9 A |
| 4,118,669 | A | | 10/1978 | Fung | |
| 4,120,003 | A | | 10/1978 | Mitchell et al. | 358/142 |
| 4,120,030 | A | | 10/1978 | Johnstine | 713/190 |
| 4,124,887 | A | | 11/1978 | Johnson et al. | 364/107 |
| 4,126,762 | A | | 11/1978 | Martin et al. | 179/2 A |
| 4,130,833 | A | | 12/1978 | Choenet | 380/220 |
| 4,131,881 | A | | 12/1978 | Robinson | 340/167 R |
| 4,135,156 | A | * | 1/1979 | Sanders et al. | 370/57 |
| 4,135,213 | A | | 1/1979 | Wintfeld et al. | 358/142 |
| 4,138,726 | A | | 2/1979 | Girault et al. | 345/113 |
| 4,141,034 | A | | 2/1979 | Netravali et al. | |
| 4,142,156 | A | | 2/1979 | Freund | 325/309 |
| 4,144,495 | A | | 3/1979 | Metzger | 325/4 |
| 4,145,717 | A | | 3/1979 | Guif et al. | 358/121 |
| 4,148,066 | A | * | 4/1979 | Saylor | 348/468 |
| 4,148,070 | A | | 4/1979 | Taylor | |
| 4,156,253 | A | | 5/1979 | Steudel | 358/11 |
| 4,156,931 | A | | 5/1979 | Adelman et al. | 364/900 |
| 4,160,120 | A | | 7/1979 | Barnes et al. | 380/29 |
| 4,161,751 | A | | 7/1979 | Ost | 725/25 |
| 4,162,483 | A | | 7/1979 | Entenman | 340/147 R |
| 4,163,252 | A | | 7/1979 | Mistry et al. | 358/118 |
| 4,163,254 | A | | 7/1979 | Block et al. | 380/233 |
| 4,163,255 | A | | 7/1979 | Pires | 380/233 |
| 4,168,396 | A | | 9/1979 | Best | 713/190 |
| 4,170,782 | A | | 10/1979 | Miller | 725/14 |
| 4,171,513 | A | | 10/1979 | Otey et al. | 380/43 |
| 4,172,213 | A | | 10/1979 | Barnes et al. | 380/29 |
| 4,180,709 | A | | 12/1979 | Cosgrove et al. | 179/2 AM |
| 4,186,413 | A | | 1/1980 | Mortimer | 348/473 |
| 4,189,748 | A | | 2/1980 | Reis | |
| 4,195,288 | A | | 3/1980 | Morton | |
| 4,196,310 | A | | 4/1980 | Forman et al. | 380/46 |
| 4,196,448 | A | | 4/1980 | Whitehouse et al. | |
| 4,199,656 | A | | 4/1980 | Saylor | 178/66.1 |
| 4,199,781 | A | | 4/1980 | Doumit | 358/83 |
| 4,199,791 | A | | 4/1980 | Corey | 360/69 |
| 4,199,809 | A | | 4/1980 | Pasahow et al. | 364/200 |
| 4,200,770 | A | | 4/1980 | Hellman et al. | 380/30 |
| 4,200,913 | A | | 4/1980 | Kuhar et al. | 341/23 |
| 4,201,887 | A | | 5/1980 | Burns | |
| 4,203,166 | A | | 5/1980 | Ehrsam et al. | |
| 4,205,343 | A | | 5/1980 | Barrett | 358/147 |
| 4,207,524 | A | | 6/1980 | Purchase | 375/22 |
| 4,213,124 | A | | 7/1980 | Barda et al. | 340/706 |
| 4,214,273 | A | | 7/1980 | Brown | 358/188 |
| 4,215,366 | A | | 7/1980 | Davidson | 358/124 |
| 4,215,369 | A | | 7/1980 | Iijima | |
| 4,215,370 | A | | 7/1980 | Kirk, Jr. | 375/240.01 |
| 4,216,497 | A | | 8/1980 | Ishman et al. | 358/84 |
| 4,217,609 | A | | 8/1980 | Hatori et al. | |
| 4,218,697 | A | | 8/1980 | Leventer | |
| 4,218,698 | A | | 8/1980 | Bart et al. | 358/22 |

| | | | | | |
|---|---|---|---|---|---|
| 4,222,068 | A | | 9/1980 | Thompson | 358/120 |
| 4,222,073 | A | | 9/1980 | Hirashima | |
| 4,224,678 | A | | 9/1980 | Lynch et al. | |
| 4,225,884 | A | * | 9/1980 | Block et al. | 348/1 |
| 4,225,918 | A | | 9/1980 | Beadle et al. | 364/200 |
| 4,225,967 | A | | 9/1980 | Miwa et al. | 455/68 |
| 4,230,990 | A | * | 10/1980 | Lert et al. | 348/4 |
| 4,232,193 | A | | 11/1980 | Gerard | 380/36 |
| 4,236,217 | A | | 11/1980 | Kennedy | 702/61 |
| 4,237,484 | A | | 12/1980 | Brown et al. | 375/240.12 |
| 4,237,486 | A | | 12/1980 | Shimp | 348/475 |
| 4,238,853 | A | | 12/1980 | Ehrsam et al. | |
| 4,238,854 | A | | 12/1980 | Ehrsam et al. | |
| 4,245,245 | A | * | 1/1981 | Matsumoto et al. | 348/7 |
| 4,245,246 | A | | 1/1981 | Cheung | 358/124 |
| 4,246,611 | A | | 1/1981 | Davies | 358/194 |
| 4,247,106 | A | | 1/1981 | Jeffers et al. | 463/29 |
| 4,247,947 | A | | 1/1981 | Miyamoto | 455/38 |
| 4,250,489 | A | | 2/1981 | Dudash et al. | 340/825.02 |
| 4,250,521 | A | * | 2/1981 | Wright | 348/617 |
| 4,250,524 | A | | 2/1981 | Tomizawa | 380/232 |
| 4,251,691 | A | * | 2/1981 | Kakihara et al. | 455/3.1 |
| 4,253,114 | A | | 2/1981 | Tang et al. | 380/212 |
| 4,253,157 | A | | 2/1981 | Kirschner et al. | 707/104 |
| 4,258,386 | A | | 3/1981 | Cheung | 358/84 |
| 4,258,423 | A | | 3/1981 | Lane et al. | |
| 4,262,329 | A | | 4/1981 | Bright et al. | 713/164 |
| 4,264,924 | A | | 4/1981 | Freeman | 358/86 |
| 4,264,925 | A | | 4/1981 | Freeman et al. | 725/138 |
| 4,266,243 | A | | 5/1981 | Shutterly | 358/121 |
| 4,271,506 | A | | 6/1981 | Broc et al. | |
| 4,272,784 | A | | 6/1981 | Saito et al. | 358/127 |
| 4,273,962 | A | | 6/1981 | Wolfe | 179/7.1 R |
| 4,275,411 | A | | 6/1981 | Lippel | 348/472 |
| 4,283,602 | A | | 8/1981 | Adams et al. | 380/41 |
| 4,284,976 | A | | 8/1981 | Gable et al. | 340/825.43 |
| 4,286,281 | A | | 8/1981 | Suzuki | 386/12 |
| 4,287,592 | A | | 9/1981 | Paulish et al. | 370/403 |
| 4,288,809 | A | | 9/1981 | Yabe | 348/468 |
| 4,290,141 | A | | 9/1981 | Anderson et al. | 725/24 |
| 4,290,142 | A | | 9/1981 | Schnee et al. | 455/3 |
| 4,292,650 | A | | 9/1981 | Hendrickson | 358/123 |
| 4,295,155 | A | | 10/1981 | Jarger et al. | 358/12 |
| 4,295,223 | A | | 10/1981 | Shutterly | 455/72 |
| 4,301,542 | A | | 11/1981 | Weintraub et al. | 455/353 |
| 4,302,771 | A | | 11/1981 | Gargini | 725/119 |
| 4,302,775 | A | | 11/1981 | Widergren et al. | |
| 4,304,990 | A | | 12/1981 | Atalla | 380/45 |
| 4,305,101 | A | * | 12/1981 | Yarbrough et al. | 358/908 |
| 4,305,131 | A | | 12/1981 | Best | 345/327 |
| 4,306,250 | A | | 12/1981 | Summers et al. | |
| 4,306,289 | A | | 12/1981 | Lumley | 713/190 |
| 4,306,305 | A | | 12/1981 | Doi et al. | 714/755 |
| 4,307,446 | A | | 12/1981 | Barton et al. | 710/131 |
| 4,310,854 | A | | 1/1982 | Baer et al. | 358/143 |
| 4,312,016 | A | | 1/1982 | Glaab et al. | 348/706 |
| 4,313,132 | A | | 1/1982 | Doles et al. | 725/26 |
| 4,314,367 | A | | 2/1982 | Bakka et al. | 370/422 |
| 4,316,055 | A | | 2/1982 | Feistel | 380/37 |
| 4,316,217 | A | | 2/1982 | Rifken | 358/86 |
| 4,316,245 | A | | 2/1982 | Luu et al. | 709/106 |
| 4,317,215 | A | * | 2/1982 | Tabata et al. | 348/6 |
| 4,318,047 | A | | 3/1982 | Dawson | 328/112 |
| 4,318,125 | A | | 3/1982 | Shutterly | 380/236 |
| 4,318,126 | A | | 3/1982 | Sassler | |
| 4,318,127 | A | | 3/1982 | Fukuda et al. | |
| 4,318,128 | A | | 3/1982 | Sauvanet | |
| 4,319,079 | A | | 3/1982 | Best | 713/190 |
| 4,319,353 | A | | 3/1982 | Alvarez, III et al. | 370/104 |
| 4,320,256 | A | | 3/1982 | Freeman | 179/6.04 |
| 4,322,745 | A | | 3/1982 | Saeki et al. | 380/242 |
| 4,323,921 | A | * | 4/1982 | Guillou | 358/114 |
| 4,323,922 | A | | 4/1982 | den Toonder et al. | 358/117 |
| 4,325,078 | A | | 4/1982 | Seatom et al. | 380/230 |
| 4,329,675 | A | | 5/1982 | Van Hulle | 725/32 |
| 4,329,684 | A | | 5/1982 | Monteath et al. | 345/180 |
| 4,329,711 | A | | 5/1982 | Cheung | 358/114 |
| 4,330,794 | A | | 5/1982 | Sherwood | 380/206 |
| 4,331,973 | A | | 5/1982 | Eskin et al. | 358/84 |
| 4,331,974 | A | * | 5/1982 | Cogswell et al. | 455/5.1 |
| 4,332,980 | A | | 6/1982 | Reynolds et al. | 370/259 |
| 4,333,107 | A | | 6/1982 | McGuire et al. | |
| 4,333,152 | A | | 6/1982 | Best | |
| 4,334,242 | A | | 6/1982 | Mangold | 386/46 |
| 4,335,426 | A | | 6/1982 | Maxwell et al. | 364/200 |
| 4,336,553 | A | | 6/1982 | den Toonder et al. | 380/206 |
| 4,336,559 | A | | 6/1982 | Koyama et al. | 260/73.05 |
| 4,337,480 | A | | 6/1982 | Bourassin et al. | 348/552 |
| 4,337,483 | A | | 6/1982 | Guillou | 358/114 |
| 4,338,628 | A | | 7/1982 | Payne et al. | 380/213 |
| 4,338,643 | A | | 7/1982 | Tadokoro | 360/135 |
| 4,339,798 | A | | 7/1982 | Hedges et al. | 463/26 |
| 4,340,903 | A | | 7/1982 | Tamura | 348/187 |
| 4,340,906 | A | | 7/1982 | den Toonder et al. | 358/124 |
| 4,341,925 | A | | 7/1982 | Frosch et al. | 178/22.17 |
| 4,343,042 | A | | 8/1982 | Schrock et al. | 455/5 |
| 4,346,696 | A | | 8/1982 | Brunet | 358/188 |
| 4,347,498 | A | | 8/1982 | Lee et al. | 340/825.02 |
| 4,347,532 | A | | 8/1982 | Korver | 348/565 |
| 4,351,028 | A | | 9/1982 | Peddie et al. | 364/483 |
| 4,353,088 | A | | 10/1982 | den Toonder et al. | 380/206 |
| 4,354,201 | A | | 10/1982 | Sechet et al. | 358/122 |
| 4,355,372 | A | | 10/1982 | Johnson et al. | 364/900 |
| 4,355,415 | A | | 10/1982 | George et al. | 455/185 |
| 4,357,548 | A | | 11/1982 | Preslar | |
| 4,358,672 | A | | 11/1982 | Hyatt et al. | 235/380 |
| 4,358,790 | A | | 11/1982 | Summers | |
| 4,359,223 | A | | 11/1982 | Baer et al. | |
| 4,360,827 | A | | 11/1982 | Braun | 358/85 |
| 4,360,828 | A | | 11/1982 | Briggs, Jr. et al. | 725/114 |
| 4,360,881 | A | | 11/1982 | Martinson | 364/493 |
| 4,361,730 | A | | 11/1982 | Barber et al. | 179/5 R |
| 4,361,848 | A | | 11/1982 | Poignet et al. | 358/1 |
| 4,361,851 | A | | 11/1982 | Asip et al. | 358/84 |
| 4,361,877 | A | | 11/1982 | Dyer et al. | 702/176 |
| 4,361,903 | A | | 11/1982 | Ohta | 455/2 |
| 4,364,081 | A | | 12/1982 | Hashimoto et al. | 348/617 |
| 4,365,110 | A | | 12/1982 | Lee et al. | 380/28 |
| 4,365,249 | A | | 12/1982 | Tabata | 340/825.3 |
| 4,365,267 | A | | 12/1982 | Tsuda | 358/84 |
| 4,367,488 | A | * | 1/1983 | Leventer et al. | 348/467 |
| 4,367,548 | A | | 1/1983 | Cotten, Jr. et al. | 359/125 |
| 4,367,557 | A | | 1/1983 | Stern et al. | 725/149 |
| 4,368,483 | A | * | 1/1983 | Liu | 348/617 |
| 4,368,486 | A | | 1/1983 | Degoulet et al. | 348/598 |
| 4,369,333 | A | | 1/1983 | Gemperle et al. | 178/22.13 |
| 4,369,462 | A | | 1/1983 | Tornizawa et al. | |
| 4,369,464 | A | | 1/1983 | Temime | |
| 4,374,437 | A | * | 2/1983 | Citta et al. | 455/184.1 |
| RE31,182 | E | | 3/1983 | Crager et al. | 178/3 |
| 4,375,579 | A | | 3/1983 | Davida et al. | 380/28 |
| 4,375,650 | A | | 3/1983 | Tiemann | |
| 4,375,651 | A | | 3/1983 | Templin et al. | 348/731 |
| 4,377,870 | A | | 3/1983 | Anderson et al. | 455/2 |
| 4,378,470 | A | | 3/1983 | Murto et al. | 179/2 C |
| 4,379,205 | A | | 4/1983 | Wyner | 380/28 |
| 4,380,027 | A | | 4/1983 | Leventer et al. | 358/147 |
| 4,381,522 | A | * | 4/1983 | Lambert | 348/7 |
| 4,381,562 | A | | 4/1983 | Acampora | |
| 4,382,256 | A | | 5/1983 | Nagata | 340/825.44 |
| 4,383,257 | A | | 5/1983 | Giallanza et al. | 340/825.47 |
| 4,383,273 | A | | 5/1983 | Lunn | 348/725 |
| 4,385,324 | A | | 5/1983 | Shioda et al. | 348/781 |
| 4,385,384 | A | | 5/1983 | Rosbury et al. | 371/22 |
| 4,386,416 | A | | 5/1983 | Giltner et al. | 364/900 |
| 4,386,436 | A | | 5/1983 | Kocher et al. | 455/151 |
| 4,388,643 | A | | 6/1983 | Aminetzah | 358/123 |
| 4,388,644 | A | | 6/1983 | Ishman et al. | 358/84 |
| 4,388,645 | A | * | 6/1983 | Cox et al. | 358/147 |
| 4,388,664 | A | | 6/1983 | Ishman et al. | 361/93.6 |
| 4,389,671 | A | | 6/1983 | Posner et al. | 380/235 |
| 4,390,898 | A | | 6/1983 | Bond et al. | |
| 4,390,901 | A | | 6/1983 | Keiser et al. | 358/147 |
| 4,390,904 | A | | 6/1983 | Johnston et al. | 358/335 |
| 4,392,135 | A | | 7/1983 | Ohyagi | 340/825.44 |
| 4,393,277 | A | | 7/1983 | Besen et al. | 179/2 A |
| 4,394,687 | A | | 7/1983 | Hutt et al. | 358/147 |
| 4,394,691 | A | | 7/1983 | Amano et al. | 348/734 |

| | | | | | |
|---|---|---|---|---|---|
| 4,394,762 | A | | 7/1983 | Nabeshima | 714/758 |
| 4,395,757 | A | | 7/1983 | Bienvenu et al. | 709/104 |
| 4,396,915 | A | | 8/1983 | Farnsworth et al. | 340/870.03 |
| 4,396,946 | A | | 8/1983 | Bond | 380/226 |
| 4,396,947 | A | | 8/1983 | Cheung | 380/222 |
| 4,398,216 | A | | 8/1983 | Field et al. | 380/238 |
| 4,400,587 | A | | 8/1983 | Taylor et al. | 379/113 |
| 4,402,009 | A | * | 8/1983 | Rathjens | 348/169 |
| 4,404,589 | A | | 9/1983 | Wright, Jr. | 358/86 |
| 4,405,942 | A | | 9/1983 | Block et al. | 380/214 |
| 4,408,345 | A | | 10/1983 | Yashiro et al. | 455/3 |
| 4,410,911 | A | | 10/1983 | Field et al. | 358/121 |
| 4,410,917 | A | | 10/1983 | Newdoll et al. | 360/15 |
| 4,411,017 | A | | 10/1983 | Talbot | 455/26 |
| 4,413,339 | A | | 11/1983 | Riggle et al. | 714/765 |
| 4,414,516 | A | | 11/1983 | Howard | 333/21 A |
| 4,414,621 | A | | 11/1983 | Bown et al. | 364/200 |
| 4,415,771 | A | | 11/1983 | Martinez | 179/5 R |
| 4,418,425 | A | | 11/1983 | Fennel et al. | 455/27 |
| 4,419,699 | A | | 12/1983 | Christopher et al. | |
| 4,420,656 | A | | 12/1983 | Freeman | 179/6.04 |
| 4,420,833 | A | | 12/1983 | Noirel | |
| 4,422,093 | A | | 12/1983 | Pargee, Jr. | 725/115 |
| 4,422,105 | A | | 12/1983 | Rodesch et al. | 358/903 |
| 4,422,486 | A | | 12/1983 | Maret | 144/117 R |
| 4,424,532 | A | | 1/1984 | den Toonder et al. | 380/226 |
| 4,424,533 | A | | 1/1984 | Rzeszewski | 358/167 |
| 4,425,578 | A | | 1/1984 | Haselwood et al. | 358/84 |
| 4,425,579 | A | | 1/1984 | Merrell | 358/86 |
| 4,425,581 | A | | 1/1984 | Schweppe et al. | 348/510 |
| 4,425,664 | A | | 1/1984 | Sherman et al. | 375/8 |
| 4,426,698 | A | | 1/1984 | Pargee, Jr. | 371/37 |
| 4,427,968 | A | | 1/1984 | York | 340/310 |
| 4,429,385 | A | | 1/1984 | Cichelli et al. | 370/92 |
| 4,430,669 | A | * | 2/1984 | Cheung | 358/122 |
| 4,430,731 | A | * | 2/1984 | Gimple et al. | 348/1 |
| 4,433,207 | A | | 2/1984 | Best | 713/190 |
| 4,433,211 | A | | 2/1984 | McCalmont et al. | 179/1.5 S |
| 4,433,379 | A | | 2/1984 | Schenk et al. | 364/200 |
| 4,434,323 | A | | 2/1984 | Levine et al. | 380/260 |
| 4,434,436 | A | | 2/1984 | Kleykamp et al. | 380/209 |
| 4,434,438 | A | | 2/1984 | Rzeszewski | 358/167 |
| 4,434,464 | A | | 2/1984 | Suzuki et al. | 711/164 |
| 4,439,761 | A | * | 3/1984 | Fleming et al. | 348/468 |
| 4,439,784 | A | * | 3/1984 | Furukawa et al. | 455/5.1 |
| 4,439,785 | A | | 3/1984 | Leonard | 358/120 |
| 4,443,660 | A | | 4/1984 | DeLong | 178/22.04 |
| 4,446,519 | A | | 5/1984 | Thomas | 711/164 |
| 4,449,114 | A | | 5/1984 | Fascenda et al. | 340/988 |
| 4,449,246 | A | | 5/1984 | Seiler et al. | 455/9 |
| 4,449,247 | A | | 5/1984 | Waschka, Jr. | 455/9 |
| 4,450,477 | A | * | 5/1984 | Lovett | 348/7 |
| 4,450,481 | A | | 5/1984 | Dickinson | 358/114 |
| 4,450,531 | A | | 5/1984 | Kenyon et al. | 364/604 |
| 4,451,700 | A | | 5/1984 | Kempner et al. | 179/2 AS |
| 4,451,701 | A | | 5/1984 | Bendig | 179/2 TV |
| 4,454,538 | A | | 6/1984 | Toriumi | 358/86 |
| 4,454,543 | A | | 6/1984 | Lund et al. | 358/118 |
| 4,454,594 | A | | 6/1984 | Heffron et al. | 364/900 |
| 4,455,570 | A | * | 6/1984 | Saeki et al. | 455/4.1 |
| 4,458,109 | A | | 7/1984 | Mueller-Schloer | 178/22.11 |
| 4,458,315 | A | | 7/1984 | Uchenick | 364/ 200 |
| 4,460,922 | A | | 7/1984 | Ensinger et al. | 358/122 |
| 4,461,002 | A | | 7/1984 | Nanko | 714/798 |
| 4,461,032 | A | | 7/1984 | Skerlos | 455/4 |
| 4,462,076 | A | | 7/1984 | Smith, III | 364/200 |
| 4,462,078 | A | | 7/1984 | Ross | 364/300 |
| 4,464,679 | A | | 8/1984 | Wargo | 348/510 |
| 4,467,139 | A | | 8/1984 | Mollier | 713/181 |
| 4,467,356 | A | | 8/1984 | McCoy | 348/385.1 |
| 4,468,701 | A | | 8/1984 | Burcher et al. | 358/181 |
| 4,471,163 | A | | 9/1984 | Donald et al. | 705/55 |
| 4,471,164 | A | | 9/1984 | Henry | 380/30 |
| 4,471,352 | A | | 9/1984 | Soulliard et al. | 340/825.44 |
| 4,472,801 | A | | 9/1984 | Huang | 370/411 |
| 4,473,068 | A | | 9/1984 | Oh | 128/92 D |
| 4,473,824 | A | | 9/1984 | Claytor | 340/825.27 |
| 4,475,123 | A | | 10/1984 | Dumbauld et al. | 358/114 |
| 4,475,153 | A | | 10/1984 | Kihara et al. | 364/145 |
| 4,475,189 | A | | 10/1984 | Herr et al. | 370/62 |
| 4,476,535 | A | | 10/1984 | Loshing et al. | 364/480 |
| 4,476,573 | A | | 10/1984 | Duckeck | 455/45 |
| RE31,735 | E | | 11/1984 | Davidson | 380/235 |
| 4,484,027 | A | | 11/1984 | Lee et al. | 178/22.13 |
| 4,484,217 | A | | 11/1984 | Block et al. | 358/84 |
| 4,484,218 | A | * | 11/1984 | Boland et al. | 455/4.1 |
| 4,484,328 | A | | 11/1984 | Schlafly | 370/85 |
| 4,486,773 | A | | 12/1984 | Okubo | 358/84 |
| 4,486,853 | A | | 12/1984 | Parsons | 345/418 |
| 4,488,179 | A | | 12/1984 | Kruger et al. | 358/181 |
| 4,488,289 | A | | 12/1984 | Turner | 370/60 |
| 4,489,220 | A | | 12/1984 | Oliver | 179/2 AM |
| 4,489,316 | A | | 12/1984 | MacQuivey | 340/700 |
| 4,491,945 | A | | 1/1985 | Turner | 370/60 |
| 4,491,983 | A | | 1/1985 | Pinnow et al. | 455/612 |
| 4,492,820 | A | | 1/1985 | Kennard et al. | 985/1 |
| 4,494,142 | A | | 1/1985 | Mistry | 358/118 |
| 4,494,156 | A | | 1/1985 | Kadison et al. | 360/48 |
| 4,494,230 | A | | 1/1985 | Turner | 370/60 |
| 4,495,623 | A | | 1/1985 | George et al. | 371/38 |
| 4,496,975 | A | | 1/1985 | Noirel | 358/147 |
| 4,500,987 | A | | 2/1985 | Hasegawa | 370/462 |
| 4,503,287 | A | | 3/1985 | Morris et al. | 178/22.08 |
| 4,503,538 | A | | 3/1985 | Fritz | 371/28 |
| 4,504,831 | A | | 3/1985 | Jahr et al. | 340/870.03 |
| 4,506,387 | A | | 3/1985 | Walter | 455/612 |
| 4,507,680 | A | | 3/1985 | Freeman | 358/86 |
| 4,509,073 | A | | 4/1985 | Baran et al. | 358/86 |
| 4,510,623 | A | | 4/1985 | Bonneau et al. | 455/181 |
| 4,512,011 | A | | 4/1985 | Turner | 370/60 |
| 4,513,174 | A | | 4/1985 | Herman | 711/214 |
| 4,513,324 | A | | 4/1985 | Poetsch et al. | 358/214 |
| 4,514,761 | A | | 4/1985 | Merrell et al. | |
| 4,518,989 | A | * | 5/1985 | Yabiki et al. | 348/12 |
| 4,520,404 | A | | 5/1985 | Von Kohorn | 358/335 |
| 4,521,806 | A | | 6/1985 | Abraham | 358/86 |
| 4,527,194 | A | | 7/1985 | Sirazi | 358/86 |
| 4,528,588 | A | | 7/1985 | Lofberg | 340/5.1 |
| 4,528,589 | A | | 7/1985 | Block et al. | 358/122 |
| 4,531,020 | A | | 7/1985 | Wechselberger et al. | 178/22.08 |
| 4,531,021 | A | | 7/1985 | Bluestein et al. | 178/22.08 |
| 4,532,540 | A | | 7/1985 | Wine | 358/112 |
| 4,532,547 | A | | 7/1985 | Bennett | 358/148 |
| 4,533,943 | A | | 8/1985 | Poirier | |
| 4,533,948 | A | | 8/1985 | McNamara et al. | 358/122 |
| 4,533,949 | A | | 8/1985 | Fujimura et al. | 358/122 |
| 4,534,024 | A | | 8/1985 | Maxemchuk et al. | |
| 4,535,355 | A | | 8/1985 | Arn et al. | 358/123 |
| 4,536,791 | A | | 8/1985 | Campbell et al. | 358/122 |
| 4,538,174 | A | | 8/1985 | Gargini et al. | 358/86 |
| 4,538,176 | A | * | 8/1985 | Nakajima et al. | 358/86 |
| 4,539,676 | A | | 9/1985 | Lucas | 370/60 |
| 4,540,849 | A | | 9/1985 | Oliver | 179/2 AM |
| 4,543,616 | A | | 9/1985 | Brooks | 358/335 |
| 4,544,963 | A | | 10/1985 | Jacoby et al. | 360/40 |
| 4,546,382 | A | | 10/1985 | McKenna et al. | 358/84 |
| 4,546,387 | A | | 10/1985 | Glaab | 358/186 |
| 4,547,804 | A | | 10/1985 | Greenberg | 358/1.42 |
| 4,553,252 | A | | 11/1985 | Egendorf | 377/15 |
| 4,554,418 | A | | 11/1985 | Toy | 179/2 DP |
| 4,554,584 | A | | 11/1985 | Elam et al. | 358/165 |
| 4,558,180 | A | | 12/1985 | Scordo | |
| 4,558,464 | A | | 12/1985 | O'Brien, Jr. | 455/4 |
| 4,562,306 | A | | 12/1985 | Chou et al. | 178/22.08 |
| 4,562,465 | A | | 12/1985 | Glaab | 358/120 |
| 4,562,495 | A | | 12/1985 | Bond et al. | 360/78 |
| 4,563,702 | A | | 1/1986 | Heller et al. | 358/119 |
| 4,566,030 | A | | 1/1986 | Nickerson et al. | 358/84 |
| 4,567,359 | A | | 1/1986 | Lockwood | 235/381 |
| 4,567,512 | A | | 1/1986 | Abraham | 358/86 |
| 4,570,930 | A | | 2/1986 | Matheson | 273/1 E |
| 4,573,072 | A | | 2/1986 | Freeman | 358/86 |
| 4,573,151 | A | | 2/1986 | Jotwani | 370/ 56 |
| 4,574,305 | A | | 3/1986 | Campbell et al. | 358/86 |
| 4,575,750 | A | | 3/1986 | Callahan | 358/86 |
| 4,577,289 | A | | 3/1986 | Comerford et al. | 364/900 |
| 4,578,536 | A | | 3/1986 | Oliver et al. | 179/2 AM |
| 4,578,718 | A | | 3/1986 | Parker et al. | 360/10.3 |

| | | | | |
|---|---|---|---|---|
| 4,580,134 | A | 4/1986 | Campbell et al. | 345/152 |
| 4,580,165 | A | 4/1986 | Patton et al. | 358/148 |
| 4,580,779 | A | 4/1986 | Kanamaru et al. | |
| 4,583,128 | A | 4/1986 | Anderson, Jr. et al. | 358/302 |
| 4,584,641 | A | 4/1986 | Guglielmino | 364/200 |
| 4,586,134 | A | 4/1986 | Norstedt | 364/ 200 |
| 4,588,991 | A | 5/1986 | Atalla | 340/825.31 |
| 4,589,064 | A | 5/1986 | Chiba et al. | 364/200 |
| 4,590,516 | A | 5/1986 | Abraham | 358/86 |
| 4,591,248 | A | 5/1986 | Freeman | 352/133 |
| 4,591,664 | A | 5/1986 | Freeman | 179/ 6.06 |
| 4,591,906 | A | 5/1986 | Morales-Garza et al. | 358/84 |
| 4,592,546 | A | 6/1986 | Fascenda et al. | 273/1 E |
| 4,593,353 | A | 6/1986 | Pickholtz | 705/55 |
| 4,593,376 | A | 6/1986 | Volk | 364/900 |
| 4,594,609 | A | 6/1986 | Romao et al. | 358/119 |
| 4,595,950 | A | 6/1986 | Löfberg | 358/122 |
| 4,595,952 | A | 6/1986 | Filliman | 358/47 |
| 4,596,021 | A | 6/1986 | Carter et al. | 375/5 |
| 4,597,058 | A | 6/1986 | Izumi et al. | 364/900 |
| 4,598,288 | A | 7/1986 | Yarbrough et al. | 340/5.74 |
| 4,599,611 | A | 7/1986 | Bowker et al. | 340/721 |
| 4,599,644 | A * | 7/1986 | Fischer | 348/10 |
| 4,599,647 | A | 7/1986 | George et al. | 358/122 |
| 4,600,918 | A | 7/1986 | Belisomi et al. | 340/711 |
| 4,600,921 | A | 7/1986 | Thomas | 340/825.31 |
| 4,600,942 | A | 7/1986 | Field et al. | |
| 4,602,279 | A | 7/1986 | Freeman | 358/86 |
| 4,603,232 | A | 7/1986 | Kurland et al. | 179/2 AS |
| 4,605,964 | A | 8/1986 | Chard | 358/147 |
| 4,605,973 | A | 8/1986 | Von Kohorn | 358/335 |
| 4,608,456 | A | 8/1986 | Paik et al. | 179/1.5 S |
| 4,611,227 | A | 9/1986 | Brockhurst et al. | 358/147 |
| 4,611,242 | A | 9/1986 | Williams | |
| 4,613,901 | A | 9/1986 | Gilhousen et al. | 358/122 |
| 4,614,971 | A | 9/1986 | Maney et al. | 348/466 |
| 4,616,263 | A | 10/1986 | Eichelberger | 358/185 |
| 4,620,224 | A | 10/1986 | Lee et al. | 358/119 |
| 4,621,259 | A | 11/1986 | Schepers et al. | 340/707 |
| 4,621,285 | A | 11/1986 | Schilling et al. | 358/120 |
| 4,623,920 | A | 11/1986 | Dufresne et al. | 358/122 |
| 4,625,235 | A | 11/1986 | Watson | 358/86 |
| 4,626,892 | A | 12/1986 | Nortrup et al. | 358/21 R |
| 4,630,108 | A | 12/1986 | Gomersall | 358/84 |
| 4,630,262 | A | 12/1986 | Callens et al. | 370/81 |
| 4,631,585 | A | 12/1986 | Wine | 348/510 |
| 4,633,297 | A | 12/1986 | Skerlos et al. | 358/22 |
| RE32,326 | E * | 1/1987 | Nagel et al. | 348/466 |
| 4,634,807 | A | 1/1987 | Chorley et al. | 178/22.08 |
| 4,634,808 | A | 1/1987 | Moerder | 178/22.14 |
| 4,635,121 | A | 1/1987 | Hoffman et al. | 358/188 |
| 4,636,851 | A | 1/1987 | Drury et al. | 380/215 |
| 4,636,854 | A | 1/1987 | Crowther et al. | |
| 4,636,858 | A | 1/1987 | Hague et al. | 358/147 |
| 4,638,181 | A | 1/1987 | Deiss | 307/243 |
| 4,638,357 | A | 1/1987 | Heimbach | 358/121 |
| 4,638,359 | A | 1/1987 | Watson | 358/147 |
| 4,639,779 | A | 1/1987 | Greenberg | 358/142 |
| 4,641,205 | A | 2/1987 | Beyers, Jr. | 360/33.1 |
| 4,641,253 | A | 2/1987 | Mastran | 364/328 |
| 4,641,307 | A | 2/1987 | Russell | 370/60 |
| 4,642,688 | A | 2/1987 | Lowry et al. | |
| 4,644,396 | A | 2/1987 | Iwasaki | 380/6 |
| 4,646,075 | A | 2/1987 | Andrews et al. | 340/747 |
| 4,646,145 | A | 2/1987 | Percy et al. | 358/84 |
| 4,647,964 | A | 3/1987 | Weinblatt | 358/84 |
| 4,647,974 | A | 3/1987 | Butler et al. | 358/185 |
| 4,649,533 | A | 3/1987 | Chorley et al. | 370/58 |
| 4,656,629 | A | 4/1987 | Kondoh et al. | 370/85 |
| 4,658,093 | A | 4/1987 | Hellman | 380/25 |
| 4,658,290 | A | 4/1987 | McKenna | 358/84 |
| 4,658,292 | A | 4/1987 | Okamoto et al. | |
| 4,677,434 | A | 6/1987 | Fascenda | 380/23 |
| 4,677,466 | A | 6/1987 | Lert, Jr. et al. | 358/84 |
| 4,677,552 | A | 6/1987 | Sibley, Jr. | 705/37 |
| 4,677,611 | A | 6/1987 | Yanosy, Jr. et al. | 370/85 |
| 4,677,685 | A | 6/1987 | Kurisu | 455/4 |
| 4,680,581 | A | 7/1987 | Kozlik et al. | 340/825.06 |
| 4,680,797 | A | 7/1987 | Benke et al. | 704/211 |
| 4,682,292 | A | 7/1987 | Bue et al. | 701/35 |
| 4,684,980 | A * | 8/1987 | Rast et al. | 455/3.2 |
| 4,685,056 | A | 8/1987 | Barnsdale, Jr. et al. | 364/200 |
| 4,685,131 | A | 8/1987 | Horne | 380/ 20 |
| 4,688,105 | A | 8/1987 | Bloch et al. | 386/38 |
| 4,688,247 | A | 8/1987 | Davidov | 380/19 |
| 4,689,022 | A | 8/1987 | Peers et al. | 434/307 |
| 4,689,619 | A | 8/1987 | O'Brien, Jr. | 340/825.08 |
| 4,689,661 | A | 8/1987 | Barbieri et al. | 375/240.01 |
| 4,692,817 | A | 9/1987 | Theis | 360/12 |
| 4,692,819 | A | 9/1987 | Steele | 360/72.1 |
| 4,694,490 | A | 9/1987 | Harvey et al. | 380/20 |
| 4,694,491 | A | 9/1987 | Horne et al. | 380/ 20 |
| 4,695,879 | A | 9/1987 | Weinblatt | |
| 4,695,880 | A | 9/1987 | Johnson et al. | |
| 4,695,953 | A | 9/1987 | Blair et al. | 364/410 |
| 4,696,034 | A | 9/1987 | Wiedemer | 380/16 |
| 4,697,281 | A | 9/1987 | O'Sullivan | 379/59 |
| 4,701,794 | A | 10/1987 | Fröling et al. | 358/147 |
| 4,704,725 | A | 11/1987 | Harvey et al. | 380/48 |
| 4,706,109 | A | 11/1987 | Murray | 348/481 |
| 4,706,121 | A | 11/1987 | Young | 358/142 |
| 4,706,282 | A | 11/1987 | Knowd | 380/3 |
| 4,707,828 | A | 11/1987 | Yamada | 370/85 |
| 4,709,418 | A | 11/1987 | Fox et al. | 455/612 |
| 4,710,919 | A | 12/1987 | Oliver et al. | 370/96 |
| 4,710,955 | A | 12/1987 | Kauffman | 380/10 |
| 4,712,105 | A | 12/1987 | Köhler | 340/825.69 |
| 4,712,238 | A | 12/1987 | Gilhousen et al. | 380/ 20 |
| 4,712,239 | A | 12/1987 | Frezza et al. | 380/20 |
| 4,713,837 | A | 12/1987 | Gordon | |
| 4,716,588 | A | 12/1987 | Thompson et al. | |
| 4,718,107 | A | 1/1988 | Hayes | 455/4 |
| 4,722,526 | A | 2/1988 | Tovar et al. | 273/1 E |
| 4,723,302 | A | 2/1988 | Fulmer et al. | 455/2 |
| 4,724,491 | A | 2/1988 | Lambert | 358/310 |
| 4,725,886 | A | 2/1988 | Galumbeck et al. | 358/147 |
| 4,728,949 | A | 3/1988 | Platte et al. | 340/825.37 |
| 4,731,679 | A | 3/1988 | O'Gwynn et al. | 360/73 |
| 4,733,301 | A | 3/1988 | Wright, Jr. | 358/181 |
| 4,734,764 | A | 3/1988 | Pocock et al. | 358/86 |
| 4,736,420 | A | 4/1988 | Katznelson et al. | |
| 4,736,422 | A | 4/1988 | Mason | 380/120 |
| 4,737,993 | A | 4/1988 | DeVilbiss | 455/180 |
| 4,739,510 | A | 4/1988 | Jeffers et al. | 380/15 |
| 4,740,890 | A | 4/1988 | William | 364/200 |
| 4,742,516 | A | 5/1988 | Yamaguchi | 370/312 |
| 4,742,543 | A | 5/1988 | Frederiksen | 380/237 |
| 4,744,080 | A | 5/1988 | Brennand et al. | 280/21 |
| 4,745,468 | A | 5/1988 | Von Kohorn | 358/84 |
| 4,745,598 | A | 5/1988 | Ulug | 370/89 |
| 4,747,139 | A | 5/1988 | Taaffe | 380/44 |
| 4,748,560 | A | 5/1988 | Kataoka | 364/200 |
| 4,748,619 | A | 5/1988 | Vigarie et al. | 370/349 |
| 4,750,036 | A | 6/1988 | Martinez | 358/147 |
| 4,750,213 | A | 6/1988 | Novak | 455/67 |
| 4,751,578 | A | 6/1988 | Reiter et al. | 358/183 |
| 4,751,665 | A | 6/1988 | Cappello et al. | 364/748 |
| 4,751,732 | A | 6/1988 | Kamitake | 380/20 |
| 4,752,834 | A | 6/1988 | Koombes | 358/335 |
| 4,754,326 | A | 6/1988 | Kram et al. | 364/900 |
| 4,755,871 | A | 7/1988 | Morales-Garza et al. | 358/84 |
| 4,755,883 | A | 7/1988 | Uehira | 358/335 |
| 4,761,646 | A | 8/1988 | Choquet et al. | 340/825.52 |
| 4,763,317 | A | 8/1988 | Lehman et al. | 370/58 |
| 4,768,087 | A | 8/1988 | Taub et al. | 358/84 |
| 4,768,110 | A | 8/1988 | Dunlap et al. | 360/33.1 |
| 4,768,144 | A | 8/1988 | Winter et al. | 364/200 |
| 4,768,229 | A | 8/1988 | Benjamin et al. | 380/20 |
| 4,771,456 | A | 9/1988 | Martin et al. | 380/10 |
| 4,772,887 | A * | 9/1988 | Dunkerton et al. | 455/92 |
| 4,774,583 | A | 9/1988 | Kellar et al. | 348/585 |
| 4,775,935 | A | 10/1988 | Yourick | 364/401 |
| 4,777,354 | A | 10/1988 | Thomas | |
| 4,780,910 | A | 10/1988 | Huddleston et al. | |
| 4,782,387 | A * | 11/1988 | Sabri et al. | 348/424 |
| 4,782,401 | A | 11/1988 | Faerber et al. | 358/335 |
| 4,783,846 | A | 11/1988 | Wachob | 455/151 |
| 4,785,420 | A | 11/1988 | Little | 364/513.5 |

4,786,979 A 11/1988 Claus et al. .................. 358/335
4,787,063 A 11/1988 Muguet ........................ 364/900
4,787,085 A 11/1988 Suto et al. ................. 370/110.1
4,789,863 A 12/1988 Bush ....................... 340/825.35
4,792,849 A 12/1988 McCalley et al. .............. 358/86
4,792,973 A 12/1988 Gilhousen et al. ............. 380/24
RE32,835 E 1/1989 Howard ..................... 333/21 A
4,796,181 A 1/1989 Wiedemer .................... 364/406
4,802,114 A 1/1989 Sogame ....................... 364/900
4,803,725 A 2/1989 Horne et al. .................. 380/44
4,805,014 A 2/1989 Sahara et al. .................. 358/86
4,805,020 A 2/1989 Greenberg ................... 358/147
4,807,031 A 2/1989 Broughton et al. .......... 358/142
4,809,267 A 2/1989 Higuchi et al. .............. 370/460
4,809,274 A 2/1989 Walker et al. .................. 371/37
4,812,843 A 3/1989 Champion, III et al. ...... 340/905
4,813,011 A 3/1989 Kulakowski et al. ......... 364/900
4,814,756 A 3/1989 Chauvel ....................... 345/565
4,815,129 A 3/1989 Griffin et al. .................. 380/15
4,816,904 A 3/1989 McKenna et al. .............. 358/84
4,816,905 A 3/1989 Tweedy et al. ................. 358/86
4,821,032 A 4/1989 Shimada et al. ......... 340/825.21
4,821,097 A 4/1989 Robbins
4,821,102 A 4/1989 Ichikawa et al. ............. 358/183
4,825,050 A 4/1989 Griffith et al. ............... 235/379
4,827,508 A 5/1989 Shear ............................... 380/4
4,829,372 A 5/1989 McCalley et al. .............. 358/86
4,831,526 A 5/1989 Luchs et al. ..................... 705/4
4,833,710 A 5/1989 Hirashima ..................... 380/20
4,835,777 A 5/1989 DeLuca et al. ............... 714/822
4,837,799 A 6/1989 Prohs et al. .................. 379/224
4,837,858 A 6/1989 Ablay et al. ................... 455/34
4,839,917 A 6/1989 Oliver ............................ 379/45
4,841,386 A 6/1989 Schiering ....................... 360/69
4,843,482 A 6/1989 Hegendorfer ................ 358/335
D302,178 S 7/1989 King ............................... D20/1
4,845,491 A 7/1989 Fascenda et al. ........ 340/825.44
4,847,698 A 7/1989 Freeman ...................... 358/343
4,847,699 A 7/1989 Freeman ...................... 358/343
4,847,700 A 7/1989 Freeman ...................... 358/343
4,849,817 A 7/1989 Short ........................... 358/142
4,855,842 A 8/1989 Hayes et al. ................. 358/342
4,857,999 A 8/1989 Welsh ............................ 358/84
4,860,379 A * 8/1989 Schoeneberger et al. ....... 348/12
4,862,268 A * 8/1989 Campbell et al. ............ 348/467
4,864,615 A 9/1989 Bennett et al. .................. 380/21
4,866,706 A 9/1989 Christophersen et al. .... 370/85.7
4,868,866 A * 9/1989 Williams .......................... 348/6
4,876,592 A 10/1989 Von Kohorn ................... 358/84
4,876,736 A 10/1989 Kiewit ............................. 455/2
4,879,611 A 11/1989 Fukui et al. ..................... 360/69
4,885,579 A 12/1989 Sandbank ................ 340/825.72
4,885,632 A 12/1989 Mabey et al. .................. 358/84
4,887,172 A 12/1989 Steele ....................... 360/73.06
4,887,296 A 12/1989 Horne
4,888,638 A 12/1989 Bohn ............................. 358/84
4,888,796 A 12/1989 Olivo, Jr. ..................... 379/101
4,890,320 A 12/1989 Monslow et al. .............. 380/10
4,890,321 A 12/1989 Seth-Smith et al. ........... 380/20
4,891,703 A 1/1990 Noudan ....................... 358/142
4,893,248 A 1/1990 Pitts et al. ............... 364/464.01
4,897,867 A 1/1990 Foster et al. .................. 379/94
RE33,189 E 3/1990 Lee et al.
4,907,260 A 3/1990 Prohs et al. .................. 379/224
4,907,273 A 3/1990 Wiedemer ...................... 380/16
4,908,707 A 3/1990 Kinghorn ..................... 358/147
4,908,713 A * 3/1990 Levine ...................... 455/181.1
4,908,834 A 3/1990 Wiedemer ........................ 380/5
4,908,845 A 3/1990 Little ............................. 379/51
4,908,859 A 3/1990 Bennett et al.
4,912,552 A 3/1990 Allison, III et al. ........... 358/84
4,914,517 A 4/1990 Duffield .................... 358/191.1
4,916,539 A 4/1990 Galumbeck ................... 358/142
4,926,255 A 5/1990 Von Kohorn ................... 358/84
4,930,158 A 5/1990 Vogel ............................... 380/5
4,930,160 A 5/1990 Vogel
4,931,871 A 6/1990 Kramer ........................ 358/142
4,931,877 A 6/1990 Gebhardt et al. ............ 358/335
4,935,870 A 6/1990 Burk, Jr. et al. .............. 364/200
4,937,821 A 6/1990 Boulton
4,939,773 A 7/1990 Katz ............................ 379/204
4,941,040 A 7/1990 Pocock et al. ................. 358/86
4,942,616 A 7/1990 Linstroth et al. ............. 704/275
4,943,963 A 7/1990 Waechter et al. ........... 370/94.1
4,945,412 A 7/1990 Kramer ........................ 358/142
4,945,563 A 7/1990 Horton et al. ..................... 380/5
4,947,302 A 8/1990 Callahan ...................... 362/233
4,949,187 A 8/1990 Cohen .......................... 358/335
4,954,899 A 9/1990 Tanabe et al. ............. 358/191.1
4,959,720 A 9/1990 Duffield et al. ........... 358/191.1
4,963,994 A 10/1990 Levine ......................... 358/335
4,963,995 A 10/1990 Lang ............................ 358/335
4,965,825 A 10/1990 Harvey et al. ..................... 380/9
4,967,273 A 10/1990 Greenberg ................... 358/142
4,969,209 A 11/1990 Schwob ....................... 455/158
4,974,252 A 11/1990 Osborne ......................... 379/92
4,975,951 A 12/1990 Bennett .......................... 380/20
4,977,455 A 12/1990 Young .......................... 358/142
4,977,594 A 12/1990 Shear ............................... 380/4
4,982,430 A 1/1991 Frezza et al. ................... 380/50
4,989,104 A 1/1991 Schulein et al. ............ 360/72.1
4,991,011 A 2/1991 Johnson et al. .............. 358/141
4,991,025 A 2/1991 Eigeldinger ................. 358/310
4,993,003 A 2/1991 Fechner et al. ................ 368/47
4,993,066 A 2/1991 Jenkins .......................... 380/16
4,994,908 A 2/1991 Kuban et al. ................... 358/86
4,995,078 A 2/1991 Monslow et al. .............. 380/10
5,001,554 A 3/1991 Johnson et al. ................ 358/86
5,002,491 A 3/1991 Abrahamson et al. ........ 434/322
5,003,384 A 3/1991 Durden et al. ................. 358/84
5,003,591 A 3/1991 Kauffman et al. ............. 380/10
5,010,459 A 4/1991 Taylor et al. ................... 362/85
5,010,571 A 4/1991 Katznelson ....................... 380/4
5,012,510 A 4/1991 Schaubs et al. ................ 379/92
5,013,038 A 5/1991 Luxenberg et al. .......... 273/439
5,014,125 A 5/1991 Pocock et al. ................. 358/86
5,016,272 A 5/1991 Stubbs et al. ..................... 380/5
5,016,273 A 5/1991 Hoff ............................... 380/10
4,745,468 A 6/1991 Von Kohorn ................... 358/84
5,027,400 A 6/1991 Baji et al. ....................... 380/20
5,029,207 A 7/1991 Gammie ........................ 380/10
5,034,807 A 7/1991 Von Kohorn ................... 358/84
5,036,537 A 7/1991 Jeffers et al. .................... 380/20
RE33,662 E 8/1991 Blair et al. .................... 364/410
5,038,211 A 8/1991 Hallenbeck .................. 358/142
5,045,816 A 9/1991 Bramhall et al. ............ 332/105
5,045,848 A 9/1991 Fascenda ................ 340/ 825.26
5,045,947 A 9/1991 Beery ....................... 358/192.1
5,047,867 A 9/1991 Strubbe et al. ............... 358/335
5,047,928 A 9/1991 Wiedemer .................... 364/406
5,050,213 A 9/1991 Shear ............................. 380/25
5,055,924 A 10/1991 Skutta ............................ 358/84
5,057,915 A 10/1991 Von Kohorn ................... 358/84
5,057,932 A 10/1991 Lang ............................ 358/335
5,058,160 A 10/1991 Banker et al. .................. 380/20
5,060,140 A 10/1991 Brown et al. ................ 364/200
5,062,136 A 10/1991 Gattis et al. .................... 380/18
5,067,149 A 11/1991 Schneid et al. .............. 379/224
5,072,418 A 12/1991 Boutaud et al. .......... 364/715.06
5,075,771 A 12/1991 Hashimoto .................... 358/84
RE33,808 E * 1/1992 Wright, Jr. ........................ 455/2
5,083,271 A 1/1992 Thacher et al. .............. 364/411
5,083,800 A 1/1992 Lockton ....................... 273/439
5,089,885 A 2/1992 Clark ............................. 358/86
5,093,718 A 3/1992 Hoarty et al. .................. 358/84
5,093,921 A 3/1992 Bevins, Jr. ....................... 455/4
5,099,348 A 3/1992 Huddleston et al.
5,101,267 A 3/1992 Morales-Garza .............. 358/84
5,108,115 A 4/1992 Berman et al. ............... 273/439
5,109,414 A 4/1992 Fechner et al. ................ 368/47
5,111,401 A 5/1992 Everett, Jr. et al. ...... 364/424.02
5,113,496 A 5/1992 McCalley et al. ............ 395/200
5,120,076 A 6/1992 Luxemberg et al. .......... 273/439
5,124,942 A 6/1992 Nielsen et al. ............... 395/100
5,128,752 A 7/1992 Von Kohorn ................... 358/84
5,132,992 A 7/1992 Yurt et al. .................... 375/122
5,133,079 A 7/1992 Ballantyne et al. ............ 455/4.1
RE34,034 E 8/1992 O'Sullivan ..................... 379/59

| | | | | |
|---|---|---|---|---|
| 5,140,419 | A | 8/1992 | Galumbeck et al. | 358/142 |
| 5,142,677 | A | 8/1992 | Ehlig et al. | 395/650 |
| 5,142,690 | A | 8/1992 | McMullan, Jr. et al. | 455/6.1 |
| 5,144,663 | A | 9/1992 | Kudelski et al. | 380/16 |
| 5,144,664 | A | 9/1992 | Esserman et al. | 380/20 |
| 5,148,482 | A | 9/1992 | Bocci et al. | 380/48 |
| 5,151,789 | A | 9/1992 | Young | 358/194.1 |
| 5,152,011 | A | 9/1992 | Schwob | 455/158.5 |
| 5,152,012 | A | 9/1992 | Schwob | 455/158.5 |
| 5,155,590 | A | 10/1992 | Beyers, II et al. | 358/86 |
| 5,155,591 | A | 10/1992 | Wachob | 358/86 |
| 5,155,812 | A | 10/1992 | Ehlig et al. | 395/275 |
| 5,157,716 | A | 10/1992 | Naddor et al. | 379/92 |
| 5,164,839 | A | 11/1992 | Lang | 358/335 |
| 5,172,111 | A | 12/1992 | Olivo, Jr. | 340/825.31 |
| 5,172,413 | A | 12/1992 | Bradley et al. | 380/20 |
| 5,177,604 | A | 1/1993 | Martinez | 358/86 |
| 5,181,113 | A | 1/1993 | Chang | 358/142 |
| 5,185,796 | A | 2/1993 | Wilson | 380/21 |
| 5,187,797 | A | 2/1993 | Nielsen et al. | 395/800 |
| 5,191,410 | A | 3/1993 | McCalley et al. | 358/86 |
| 5,195,092 | A | 3/1993 | Wilson et al. | 370/94.2 |
| 5,195,134 | A | 3/1993 | Inoue | 380/20 |
| 5,202,916 | A | 4/1993 | Oliver | 379/106 |
| 5,204,768 | A | 4/1993 | Tsakiris et al. | 359/148 |
| 5,208,665 | A | 5/1993 | McCalley et al. | 358/86 |
| 5,212,553 | A | 5/1993 | Maruoka | 358/188 |
| 5,213,337 | A | 5/1993 | Sherman | 273/439 |
| 5,216,504 | A | 6/1993 | Webb et al. | 358/139 |
| 5,216,552 | A | 6/1993 | Dunlap et al. | 360/33.1 |
| 5,220,501 | A | 6/1993 | Lawlor et al. | 364/408 |
| 5,222,137 | A | 6/1993 | Barrett et al. | 380/21 |
| 5,223,924 | A | 6/1993 | Strubbe | 358/86 |
| 5,225,902 | A | 7/1993 | McMullan, Jr. | 358/86 |
| 5,226,177 | A | 7/1993 | Nickerson | 455/2 |
| 5,227,874 | A | 7/1993 | Von Kohorn | 358/84 |
| 5,231,493 | A | 7/1993 | Apitz | 358/146 |
| 5,233,654 | A | 8/1993 | Harvey et al. | 380/20 |
| 5,235,415 | A | 8/1993 | Bonicel et al. | 358/84 |
| 5,235,619 | A | 8/1993 | Beyers, II et al. | 375/38 |
| 5,235,634 | A | 8/1993 | Oliver | 379/106 |
| 5,237,417 | A | 8/1993 | Hayashi et al. | 358/183 |
| 5,237,610 | A | 8/1993 | Gammie et al. | 380/10 |
| 5,239,575 | A | 8/1993 | White et al. | 379/107 |
| 5,247,364 | A | 9/1993 | Banker et al. | 358/191.1 |
| 5,247,575 | A | 9/1993 | Sprague et al. | 380/9 |
| 5,251,324 | A | 10/1993 | McMullan, Jr. | 455/2 |
| 5,251,909 | A | 10/1993 | Reed et al. | 273/439 |
| 5,252,077 | A | 10/1993 | Schott | 434/335 |
| 5,253,066 | A | 10/1993 | Vogel | 358/188 |
| 5,253,275 | A | 10/1993 | Yurt et al. | 375/122 |
| 5,254,977 | A | 10/1993 | MacDonald | 345/150 |
| 5,255,086 | A | 10/1993 | McMullan, Jr. et al. | 358/86 |
| 5,260,778 | A | 11/1993 | Kauffman et al. | 358/86 |
| 5,266,944 | A | 11/1993 | Carroll et al. | 340/825.36 |
| 5,267,305 | A | 11/1993 | Prohs et al. | 379/233 |
| 4,706,121 | A | 12/1993 | Young | 358/142 |
| 5,267,865 | A | 12/1993 | Lee et al. | 434/350 |
| 5,270,809 | A | 12/1993 | Gammie et al. | 358/84 |
| 5,276,678 | A | 1/1994 | Hendrickson et al. | 370/62 |
| 5,283,639 | A | 2/1994 | Esch et al. | 348/6 |
| 5,283,734 | A | 2/1994 | Von Kohorn | 364/412 |
| 5,283,819 | A | 2/1994 | Glick et al. | 379/90 |
| 5,291,554 | A | 3/1994 | Morales | 380/5 |
| 5,293,357 | A | 3/1994 | Hallenbeck | 348/734 |
| 5,294,229 | A | 3/1994 | Hartzell et al. | 434/336 |
| 5,301,233 | A | 4/1994 | Coutrot et al. | 380/23 |
| 5,303,042 | A | 4/1994 | Lewis et al. | 348/14 |
| 5,307,173 | A | 4/1994 | Yuen et al. | 358/335 |
| 5,313,618 | A | 5/1994 | Pawloski | 395/500 |
| 5,313,648 | A | 5/1994 | Ehlig et al. | 395/800 |
| 5,319,789 | A | 6/1994 | Ehlig et al. | 395/800 |
| 5,319,792 | A | 6/1994 | Ehlig et al. | 395/800 |
| 5,321,750 | A | 6/1994 | Nadan | 380/20 |
| 5,327,421 | A | 7/1994 | Hiller et al. | 370/60.1 |
| 5,327,554 | A | 7/1994 | Palazzi, III et al. | 395/600 |
| 5,335,276 | A | 8/1994 | Thompson et al. | 380/21 |
| 5,335,277 | A | 8/1994 | Harvey et al. | 380/20 |
| 5,343,239 | A | 8/1994 | Lappington et al. | 348/12 |
| 5,343,300 | A | 8/1994 | Hennig | 348/478 |
| 5,345,445 | A | 9/1994 | Hiller et al. | 370/60.1 |
| 5,345,446 | A | 9/1994 | Hiller et al. | 370/60.1 |
| 5,345,501 | A | 9/1994 | Shelton | 379/89 |
| 5,349,687 | A | 9/1994 | Ehlig et al. | 395/800 |
| 5,351,130 | A | 9/1994 | Dugan et al. | 358/725 |
| 5,351,970 | A | 10/1994 | Fioretti | 273/439 |
| 5,353,121 | A | 10/1994 | Young et al. | 348/563 |
| 5,367,330 | A | 11/1994 | Haave et al. | 348/7 |
| 5,374,951 | A | 12/1994 | Welsh | 348/4 |
| 5,414,773 | A | 5/1995 | Handelman | 380/49 |
| 5,420,647 | A | 5/1995 | Levine | 348/734 |
| 5,420,923 | A | 5/1995 | Beyers, II et al. | 380/20 |
| 5,430,552 | A | 7/1995 | O'Callaghan | 358/335 |
| 5,432,558 | A | 7/1995 | Kim | 348/460 |
| 5,459,789 | A | 10/1995 | Tamer et al. | 380/20 |
| 5,465,385 | A | 11/1995 | Ohga et al. | 455/6.1 |
| 5,475,754 | A | 12/1995 | Bridgewater et al. | 380/20 |
| 5,485,509 | A | 1/1996 | Oliver | 379/106 |
| 5,488,654 | A | 1/1996 | Oliver | 379/106 |
| 5,532,754 | A | 7/1996 | Young et al. | 348/569 |
| 5,534,883 | A | 7/1996 | Koh | 345/31 |
| 5,535,362 | A | 7/1996 | Ami et al. | 395/474 |
| 5,548,338 | A | 8/1996 | Ellis et al. | 348/473 |
| 5,552,833 | A | 9/1996 | Henmi et al. | 348/460 |

FOREIGN PATENT DOCUMENTS

| | | | | |
|---|---|---|---|---|
| CA | 1189612 | | | 6/1985 |
| CA | 1216977 | | | 1/1987 |
| DE | 23 38 380 | | | 2/1975 |
| DE | 2356969 | | | 5/1975 |
| DE | 24 53 441 | | | 5/1976 |
| DE | 29 04 981 | A | * | 8/1979 |
| DE | 2823175 | | | 11/1979 |
| DE | 2831014 | | | 4/1980 |
| DE | 29 18 846 | | | 11/1980 |
| DE | 3020787 | | | 12/1981 |
| DE | 3039949 | | | 5/1982 |
| DE | 3112249 | | | 10/1982 |
| DE | 33 28 001 | | | 2/1985 |
| DE | 33 35 082 | | | 4/1985 |
| DE | 3337204 | A1 | | 4/1985 |
| EP | 0 020 242 | | | 12/1980 |
| EP | 0 035 456 | | | 9/1981 |
| EP | 0 046 108 | | | 2/1982 |
| EP | 46108 | | | 2/1982 |
| EP | 0 049 184 | | | 4/1982 |
| EP | 49184 | | | 4/1982 |
| EP | 0 055 167 | | | 6/1982 |
| EP | 55167 | | | 6/1982 |
| EP | 0 055 674 | | | 7/1982 |
| EP | 0 056 649 | | | 7/1982 |
| EP | 56649 | | | 7/1982 |
| EP | 0 077 712 | | | 4/1983 |
| EP | 77712 | | | 4/1983 |
| EP | 0 078 185 | | | 5/1983 |
| EP | 78185 | | | 5/1983 |
| EP | 0 103 438 | A1 | | 3/1984 |
| EP | 0 128 481 | A2 | | 12/1984 |
| EP | 0 152 251 | | | 8/1985 |
| EP | 187417 | | | 7/1986 |
| EP | 0 206 821 | | | 12/1986 |
| EP | 0 217 308 | A2 | | 4/1987 |
| EP | 0 583 196 | A1 | | 2/1994 |
| FR | 79-03351 | | | 2/1979 |
| FR | 80/02901 | | | 12/1980 |
| FR | 2496376 | | | 6/1982 |
| FR | 2516733 | | | 5/1983 |
| GB | 857862 | | | 1/1961 |
| GB | 1204190 | | | 9/1970 |
| GB | 1213357 | | | 11/1970 |
| GB | 1370535 | | * | 10/1974 |
| GB | 1396981 | | | 6/1975 |
| GB | 1515309 | | | 6/1978 |
| GB | 1523307 | | | 8/1978 |
| GB | 2016874 | | | 2/1979 |
| GB | 1543502 | | | 4/1979 |
| GB | 1 554 411 | | | 10/1979 |
| GB | 1 565 319 | | | 4/1980 |

| | | | |
|---|---|---|---|
| GB | 2 034 995 | 6/1980 | |
| GB | 1582563 | 1/1981 | |
| GB | 2051527 | 1/1981 | |
| GB | 1584111 | 2/1981 | |
| GB | 2067379 | 7/1981 | |
| GB | 2 081 948 A | 2/1982 | |
| GB | 2081948 | 2/1982 | |
| GB | 2090504 | 7/1982 | |
| GB | 2103455 | 2/1983 | |
| GB | 2 155 283 | 9/1983 | |
| GB | 2 126 002 A | 3/1984 | |
| GB | 2164229 | 3/1986 | |
| GB | 2167917 | 6/1986 | |
| GB | 2 185 670 A | 7/1987 | |
| JP | 53-068124 | 6/1978 | |
| JP | 55-26792 | 2/1980 | |
| JP | 55-49084 | 4/1980 | |
| JP | 55-79585 | 6/1980 | |
| JP | 56-47179 | 4/1981 | |
| JP | 56116385 | 9/1981 | |
| JP | 58-156279 | 9/1983 | |
| JP | 58-209276 | 12/1983 | |
| JP | 59-160387 | 9/1984 | |
| JP | 59-224988 | 12/1984 | |
| JP | 60-123182 | 7/1985 | |
| JP | 60-256289 | 12/1985 | |
| JP | 61-148988 | 7/1986 | |
| JP | 61-174889 | 8/1986 | |
| JP | 61-236284 | 10/1986 | |
| JP | 62-12285 | 1/1987 | |
| JP | 62060378 | 3/1987 | |
| PL | 204525 | 2/1978 | |
| WO | WO80/00292 | 2/1980 | |
| WO | WO8002093 | * 10/1980 | ................... 348/460 |
| WO | WO 81/02961 | 10/1981 | |
| WO | WO8102961 | * 10/1981 | |
| WO | WO83/00789 | 3/1983 | |
| WO | WO 83/00789 | 3/1983 | |
| WO | WO 85/03830 | 8/1985 | |
| WO | WO 87/04884 | 8/1987 | |
| WO | WO89/02682 | 3/1989 | |

OTHER PUBLICATIONS

"An Automatic Programming Control System for Cable TV", Beck et al, pp. PMC 005188-PMC 005193.*

"Television Network Automated by Mini Computer-Controlled Channels", "Computer Design", vol. 15, No. 11, pp. 58,59,62,66,70, Nov. 1976.*

"VIMACS—A Vertical Interval Machine Control System", Greenberg et al, pp. KC011395-KC011401.*

"Automated Videotape Delay of Satellite Transmissions", CHIDDIX, "Satellite Communications Magazine", 2 Pages, May 1978.*

"From Satellite to Earth Station to Studio to S-T-L to MDS Transmitter to Home; Pay Television Comes to Anchorage Alaska", VERGA, "Telecommunications Systems, Inc.", Baltimore, MD. pp. 76-80.*

"Television Line 21 Encoded Information and it's Impact on Receiver Design", IEEE Transactions on Broadcasts and TV Receivers, Breeze, pp. 234-237, Nov. 1972.*

"Telesoft-Value Added Teletext", Hedger et al, IEEE Transactions on Consumer Electronics, vol. CE-26, pp. 555-566, Aug. 1980.*

"Broadcast Telesoftware: Experience with Oracle" ; Hedger; Online Conferences; pp. 413-429, 1980.*

"A Public Broadcaster's View of Teletext in the United States", Gunn et al., 1980.*

Touch Tone Teletext —A Combined Teletext—Viewdata System, Robinson et al. IEEE Transactions on Consumer Electronics vol. CE-25, No. 3, Jul. 1979.*

Hedger et al, "Telesoftware-Value Added Teletext", IEEE Transactions on Consumer Electronics< vol. CE-26, Aug. 1980.*

Gunn et al., "A Public Broadcaster's View of Teletext in the United States", Mar. 1980.*

Green et al., "Oracle on Independent Television", IBA Technical Review, Sep. 1976, pp. 18-31.*

Hanas et al.,"An Addressable Satellite Encryption System For Preventing Signal Piracy", Nov. 1981, pp. 631-635.

National Cable Television Association Executive Seminar Series, *Videotex Services*, Oct. 1980, pp. 1-155.

Kokado et al.,"A Programmable TV Receiver", Feb. 1976, pp. 69-82.

J. Hedger et al., "Telesoftware-Value Added Teletext",Aug. 1980, pp. 555-567.

Marti , B.,"The Concept Of A Universal Teletext" Jun. 1979, pp. 1-11.

Article re: America's Talk-Back Television Experiment: Qube.

Article re: "Teletext-Applications in Electronic Publishing".

Article re: A Description of the Broadcast Telidon System.

Article re: EPEOS—Automatic Program Recording System by G. Degoulet.

Article re: Teletext signals transmitted in UK . . . .

Article re: New services offered by a packet data broadcasting system.

Article re: Philips TV set indicates station tunign and color settings on screen.

Vincent,A.et al., "Telidon Teletest System Field Triasl" (Abstract).

Rzeszeewski, T.,"A New Telletex Channel".

Numaguchi,Y. et al., "Compatibility and Transmision Characteristics of Digital Signals Inserted in the Field-Blanking Interval of the Television Signal" (Abstract).

Zimmerman, R. et al., Bildschirmtextesysteme (Abstract).

Pilz, F., "Digital Codierte Uebertragungen von Text and Graphik in den Vertikal-anstastintervallen des Fernsehsignas" (Abstract).

Pilz, F., "Uebertragung Insaitryliches Informationen, Insbesondere von Texten, in Ungenutryten Zeilen der Vertikal-Anstastlueke des Fernsehsignals" (Abstract).

Numaguchi,Y., Wie man Stillstehende Bilder Uebertraegt. Ueberlick Ueber Teletext-, Fernseheinzelbild-Und Faksimile-Uebertragunsverfahren (Abstract).

Transcript, Videotex, Viewdata, and Teletext: Viewdata '801 Online Conference on Videotex, Viewdata and Teletext, London. Mar. 26-28, 1980 (Abstract).

Graf, P.H., "Antiope-Uebertragung fuer Breitbandige Videotex-Verteildienste", 1981.

Poubread, J.J., "Cryptage' du Son Pour la Televiser A Peague" 1981 (Abstract).

Graf, P.H., "Das Videotex-System Antiope" 1980 (Abstract).

Vardo, J.C., "Les Emetteurs de Television et la Diffusion de Donnees" 1980 (Abstract).

Noirel, Y., "Constructin D'un Reseau de Diffusion de Donnees Par Paquets" 1979 (Abstract).

Vardo, J.C., "Effet de Distorsions en Diffusion de Donnes. II. Resultats Theoriques" 1979 (Abstract).

Baerfuss, C., "Experiences de Diffusion de Donnees dans un Canal de Television" 1979 (Abstract).

Blineau, J., "Liasons Telex a Support Video Sur Des Circuits de Television Internationaux" 1979 (Abstract).

Dublet, G., "Methodes Utilisees et Principaux Resultats Obtenus Lors D'Une Campagne de esure 'Didon' Dans la Refion Centre-est" 1978 (Abstract).

Guinet, Y., "Etude Comparative des Systems de Teletexte en Radio-Diffusion. Quelques Avantages de la Diffusion des Donnees Par Paques Applique an Teletexte" 1977 (Abstract).

Goff, R., "A Review of Teletext" 1978 (Abstract).

Haplinsky, C.H., "The D**(2)B A One Logical Wire Bus for Consumer Applications" 1981.

Cazals, A., "cts Techniques du Teletexte Diffuse" 1981 (Abstract).

Sechet, C. et al., "Epees et Ia Viideomessagerie" 1981 (Abstract).

Cayet, A. "La Peritelevison Face a Son Public" 1981 (Abstract).

"La Telematique au Service Des Entreprises et des Particliers: Les Reseaux—Les Produits Noveaux—Les Aplication" 1980 (Abstract).

Sechet, C., "Antiope Teletext Captioning" 1980.

Lambert, O. et al., "Antiope and D.R.C.S." 1980.

Broggini, P., "Antiope: La Bonne Information Au Bon Moment" 1980 (Abstract).

Strauch, D., "(Texte Sur Ecran An Nivenn International. Viewdata 80. Premeire Confirence Mendiale Sur Viewdata, Video text at Teletext, a Londres)" 1980.

Strauch, D., (Las Media De Telecommunication Devant la Rapture. Les Nonvellas Methodes Presentees a L'Exposition International 1979 de Radio (Et Television)) 1979.

Eymery, G., "Le Teletexte Antiope System D'Information a La Demande" 1979-1980 (Abstract).
Brasq , R., "Micro 8 Bits Dans Linite Gestion da Terminal de Videotex Antiope".
Hughes, JW,"Videotex and Teletext Systems" 1979.
Marti, B., "Terminolegie Des Services de Communication De Texte" 1979 (Abstract).
Schreber, H., "Antiope et Tietae, La Tele-Informatique Sur L ecran De Votre Televiscur" 1978 (Abstract).
Kulpok, a., "Videotext, Teletext, Bilschimzeiting" 1979 (Abstract).
Cochard, J.P. et al., "Antiope Prototype da Teletexte De Demain" 1979 (Abstract).
Messerschmid, U., "Videotext: Ein Nueur Informations dienst in Fernschrund funk" 1978 (Abstract).
D'Argoewes, T. et al, "La Chaine Vieo: Magnetoscopes, Videodisqhes, Andiodisques" 1979 (Abstract).
Klingler, R., "Les Systemes de Teletexte Unidirectionals" 1978 (Abstract).
Guillermin, J., "Dix Annees D'Antomatisation Au Service De la Radiodiffusion" 1977 (Abstract).
Brusq, R., "Le Terminal de Teletexte Antiope" 1977 (Abstract).
Guinet, Y., "Les Systemes des Teletextes Antiope" 1977 (Abstract).
Schwartz, C. et al., "Specification Preliminarie du Systeme Teletexte Antope" 1977 (Abstract).
United States International Trade Commission notice of decision not to review Admin. law judges initial dismissal of complaint (case involves certain recombinantly Produced Human Growth Hormones).
U.S. I.T.C.'s order granting Complainants Motion to Desqualify the Law Firm of Finnegan, Henderson et al. (Case involves Certain Cardiac Pacemakers and Components therof).
Decision in *Ford Motor Company* v. *Jerome H. Lemelson*.
General Counsel's recommendation to U.S.I.T.C. to refuse a patent-based section 337 investigation based on a complaint filed not by the owner of the patents in issue, but by nonexclusive licensees.
Portion of ITC's Industry and Trade Summary serial publication.
ITC Admin. Judges Order #9: Initial Determination Terminating Investigation (Investigation #337-TA-373).
"LSI Circuits for Teletext and Viewdata—The Lucy Generation" published by Mullard Limited, Mullard House (1981) .
2 page article by Nicholas Negroponte in SID 80 Digest titled, "17. 4/10:25 a.m.: Soft Fonts", pp. 184-185.
IEEE Consumer Electronics Jul. 1979 issue from Spring Conference titled, "Consumer Text Display Systems", pp. 235-429.
Videotext '81 published by Online Conferences Ltd., for the May 20-22, 1981 Confemece, pp. 1-470.
"Teletext and Viewdata Costs as Applied to the U.S. Market" Published by Mullard House (1979), pp. 1-8.
CCETT publication titled, "Didon Diffusion de donnees parpaquets".
Dalton,C.J., "International Broadcasting Convention" (1968), Sponsors: E.E.A., I.E.E., I.E.E.E., I.E.R.E., etc.
Shorter, D.E.L., "The Distribution of Television Sound by Pulse-Code Modulation Signals Incorporated in the Video Waveform".
Chorky, J.M., Shorter, D.E.L., "International Broadcasting Convention" (1970), pp. 166-169.
The Implementation of the Sound-in-Sync project for Eurovision (Feb. 1975), pp. 18-22.
Maegele, Manfred, "Digital Transmissions of Two Television Sound Channels in Horizontal Banking", pp. 68-70.
Weston, J.D., "Digital TV Transmission for the European Communications Satellite" (1974), pp. 318-325.
Golding, L., "A 15 to 25 Mhz Digital Television System for Transmission of Commercial Color Television" (1967), pp. 1-26.
Huth, Gaylord K., Digital Television System Design Study: Final Report (Nov. 28, 1976), prepared for NASA Lyndon B. Johnson Space Center.
Weston, J.D., "Transmission of Television by Pulse Code modulation", Electrical Communication (1967), pp. 165-172.
Golding, L., "F1-Ditec-A-Digital Television Communications System for Satellite Links," Telecommunications Numeriques Par Satellite.
Haberle, H. et al.,"Digital TVv Transmission via Satellite", Electrical Communications (1974).
Dirks, H. et al., TV-PCM6 Integrated Sound and Vision Transmission System, Electrical Communication (1977), pp. 61-67.
Talygin, N. V. et al., The "Orbita" Ground Station for Receiving Television Programs Relayed by Satellites, Elecktrovinz, pp. 3-5.
1973 NAB Convention Program, Mar. 25-28, 1973.
Portions of Electonic Engineer's Reference Book (1989)—Multichannel sound systems, Teletext transmission, cable television, ISDN applications, etc.
Yoshido, Junko, teletext back in focus: VBI service revived as alternative delivery system, Electronic Engineering Times (1994) (Abstract).
Blankenhom, Dana, "Int'l Teletext expands market (International Teletext Communication Inc.)," NewsBytes (1993) (Abstract).
Collin, Simon, PC Text II (Hardware Review (Shortlist), PC User (1990).
Alfonzetti, Salvatore, "Interworking between teletext and OSI systems," Computer Communications (1989).
Gabriel, Michael R., Videotex and teletex: Waiting for the 21st century?, Education Technology (1988).
Voorman, J.O. et al., A one-chip Automatic Equalizer for Echo Reduction in Teletext , IIEE Transactions on Consumer Electronics, pp. 512-529.
National Online Meeting: Proceedings—1982 sponsored by: Online Review, pp. 547-551.
MacKenzie, G.A., A Model for the UK Teletext Level 2 Specification (Ref: GTV2 242 Annex 6" based on the ISO Layer model.
Chambers, J.P., A Domestic Television Program Delivery Services, British Broadcasting Corporation, pp. 1-5.
McKenzie, G.A., UK Teletext—The Engineering Choices, Independent Broadcasting Authbrity, pp. 1-8.
Adding a new dimension to British television, Electronic Engineering (1974).
Jones, Keith, The Development of Teletext, pp. 1-6.
Marti, B. et al., Discrete, service de television cryptee, Revue de radiodiffusion—television (1975), pp. 24-30.
Ando, Heiichero et al., Still-Picture Broadcasting—A new Informational and Instructional Broadcasting System, IEEE Transactions on Broadcasting (1973), pp. 68-76.
Sauter, Dietrich, "Intelligente Komponenten Fur Das Afra-Bus-Fernsteuersystem", Rundfunk technischen Mittelungen, pp. 54-57.
Hogel, T. et al., "Afra-Bus-ein digitales Fersteuersysten fur Femsehstudion Komplexe", Femseh-Und Kino-Technik (1974), pp. 13-14.
Hogel, G., "Das Afra-Bus System: 2. Technische Struktur des AFRA-Bus-Systems", Fernseh-Und Kino-Technik (1975), pp. 395-400.
Krauss, G., "Das AFRA-Bus-System: 4. Wirtschaftlich Keitsbetrachtungen und Rationalisierung seifekte beim Einsatz des AFRA-Bus-Systems",Fernseh-Und Kino-Technik (1976), pp. 40-49.
Wellhausen, H. "Das AFRA-Bus-System: 1. Grundsatzliche-Betrachtungen und Rationlisierung und Automatisierun in den Fernschbetreben", Fernseh-Und Kino-Technik (1975), pp. 353-356.
Sauter, D., "Das AFRA-Bus-System: 3. Einsatz-moglich Keiten des Afra-Bus Systems in Fernsehbetrieben", Fernseh-Und Kino-Technik (1976), pp. 9-13.
B.B.C.I.B.A., Specification of Standards for information transmission by digitally coded signals in the field—blanking interval of 625-line systems (1974), pp. 5-40.
Centre Commun Des De Television et Telecommunications, Specification du Systeme Di Teletext, Antiope.
Heller, Arthur, VPS—Ein Neues System Zuragsgesteurten Programmanfzeichnung, Rundfunk technisde Mitteilungen, pp. 162-169.
Institut fur Rundfunktechnik, ARD/SDF/ZXEI—Richlinie "Video Programm-System", pp. 1-30.
Buro der Technischen Kommission, "Niederschrift uber die Besprechung zwischen Rundfunkanstalten (Techik, Sendeleiter) und ZVEI zur Einfuhrung des Video-Programm-Systems", pp. 1-4.
Buro der Technischen Kommission, Ergebnisse und Festlegungen anda "Blich einer Besprechung zwishen Rundfunanstalten . . . ", pp. 1-4.

Koch, H. et al., "Bericht der ad hoc—Arbeitsgruppe 'Videotext programmiert Videorecorder' der TEKO", pp. 1-40.
European Broadcasting Union, "Specification of the Domestic Video Programme Delivery Control System", pp. 1-72.
ARD/ZDF/ZVEI-Richtlinie "Video Programme System".
Reports on Developments in USA, Teletext, EIA Meeting.
Videotex '81: A Special Report.
Tarrant, D.R., "Teletext for the World".
Clifford, Colin et al., "Microprocessor Based, Software Defined Television Controller", IEEE Transaction on Consumer Electronics (1978), pp. 436-441.
Hughes, William L. et al., "Some Design Considerations for Home Interactive Terminals", IEEE Transactions on Broadcasting (1971).
Mothersdale, Peter L , "Teletext and viewdata: new information systems using the domestic television receiver", Electronics Record (1979), pp. 1349-1354.
Betts, W.R., "Viewdata: the evolution of home and business terminals", Proc.IEE (1979), pp. 1362-1366.
Hutt, P.R., "Thical and practical ruggedness of UK teletext transmission", Proc.IEE (1979), pp. 1397-1403.
Rogers, B.J., "Methods of measurement on teletext receivers and decoders", Proc.IEE (1979), pp. 1404-1407.
Green, N., "Subtitling using teletext service—technical and editorial aspects", Proc.IEE (1979), pp. 1408-1416.
Chambers, M.A., "Teletext—enhancing the basic system", PROC. IEE (1979), pp. 1425-1428.
Crowther, G.O., "Adaptation of UK Teletex System for 525/60 Operation", IEEE Transactions on Consumer Electronics (1980), pp. 587-596.
Marti, B. et al., Discrete, service de television cryptee , Revue de radiodiffusion—television (1975), pp. 24-30.
Lopinto, John, "The Application of DRCS within the North American Broad cast Teletext Specification", IEEE Transactions on Consumer Electronics (1982), pp. 612-617.
BBC, BBC Microcomputer: BBC Microcomputer with Added Processor and Teletex Adaptor (Manual).
Green, N. W., "Picture Oracle," On Independent Television Companies Association Limited Letterhead.
National Captioning Institute, Comments on the Matter of Amendment of Part 73, Subpart E. of the Federal Communications Rules Government Television Stations to Authorize Teletext (before F.C.C.).
Balchin, C., "Videotext and the U.S.A.", I.C. Product Marketing Memo.
Koteen and Burt, "British Teletext/Videotex".
EIA Teletext SubCommittee Meetings, Report on USA Visit.
Brighton's Experience with Software for Broadcast (Draft).
The institution of Electronic and Radio Engineers, Conference on Electronic Delivery of Data and Software.
AT&T, "Videotex Standard Presentation Level Protocol".
Various Commissioner statements on Authorization of Teletext Transmissions by TV Stations, BC Docket No. 81-741.
Report and Order of FCC on the Matter of Amendment of Parts 2,73, and 76 of the Commission's Rules to Authorize the Transmission of Teletext by TV Stations, pp. 1-37.
IBA Technical Review of Digital Television, pp. 1-64.
National Cable Television Association report, "Videotex Services" given at Executive Seminar.
Lexis Research results for Patent No. 4,145,717.
Web page—Company Overview of Norepack Corporation.
Coversheet titled, "Zing".
*Lemelson* v. *Apple Computer, Inc*. patent case in The Bureau of National Affairs, 1996.
A computer printout from Library Search.
Electronic Industries Association—Teletext Subcommittee Rask Group A—Systems Minutes of Meeting mar. 30, 1981 at Zenith plus attachments.
Electronic Industries Association—Teletext Subcommittee Task Group a Systems Interim Report, Mar. 30, 1981 by Stuart Lipoff, Arthur D. Little Inc.
Minutes of Eletronic Industries Association Teletext Subcommittee Task Force B—Laboratory & Field Tests Mar. 30, 1981.
National Captioning Institute Report, "The 1980 Closed-Captioned Television Audience".
Electronic Industries Assoc.—Teletext Subcommittee—Steering Committee Minutes of Meeting on Mar. 31, 1981.
Aug. 6, 1990 letter from Herb Zucker to Walter Ciciora with attachment.
Articles, information sheets under cover sheet "QVP—Pay Per View" Nov. 29, 1982.
National Cable Television Association report, "Videotex Services".
Scala Info Channel Advertisement, "The Art of Conveying A Message".
Zenith Corporation's Z-Tac Systems information includes Z-tac specifications, access list, etc.
Report by Cablesystems Engineering Ltd. on, "Zenith Addressable System and Operating Procedures" and Advertising documents.
Memo from W. Thomas to G. Kelly on Jan. 21, 1982 Re: Modified ZTAC/Multi Channel.
Notations by Walt Ciciora dated Aug. 19, 1981 referring to Virtext figures.
Stamped Zenith Confidential, "Preliminay Specification for Basic Text".
Report titled "The Necams Business Plan," dated Mar. 18, 1994.
The Personalized Mass Media Corp. reported titled, "Portfolio of Programming Examples" by Harvey, Keil, & Parker 1991.
Petition to FCC dated Mar. 26, 1981 titled, "Petition for Rulemaking of Unighted Kingdom Teletext Industry Goup," also 1 page of handwritten notes from Walter Ciciora.
"Enhanced Computer Controlled Teletext for 525 Line Systems (Usecct) Saa 5245 User Manual" report by J.R. Kinghorn.
"Questions and Answers about Pay TV" by Ira Kamen.
Oak Industries 1981 Annual Report.
Article, "50 Different Uses For At Home 2-Way Cable TV Systems" by Morton Dubin.
Derwent Info Ltd. search. Integrated broadcasting & Computer Processing system. Inventor J. Harvey/J. Cuddihy.
Telefax from Aden Hooiveld to Jones, Day, Reavis & Pogue Re: European Patent Appi. No. 88908836.5 and abstract plus related correspondence and Derwent search.
Advertisement in royal TV Society Journal (1972) for PYE TVT.
Letter to Dean Russell listing "reference papers", pp. 1-4.
Letter from George McKenzie to Dean Russell Re: *PMM Corp*., v. *TWC Inc*.
Reisebericht (German memo).
Blanpunk (German memo).
"Relevant papers for *Weather Channel* V *PMMC*".
Letter to Peter Hatt Re: BVT: Advisory UK Industry Contact Group.
Incomplete report on Antiope.
Memo FCC: Next Moves.
Memo—Re: British Teletext—ABC.
Memo with FCC Report and Order Authorizing Teletext Transmission.
Manual.
Notes to Section 22.4: Simple Block Encipherment Algorithm.
Memos on Zenith and Teletext.
Memo to Bernie Kotten about National Cable TV Association meeting and efforst to encourage Sony to integrate teletext chip sets into its TV.
Memo's from Koteen & Naftalin.
Description of patents from Official Gazette.
Explanation of Collateral Estoppel.
BNA's Intellectual Property Library on CD's summary of *Jamesbury Corporation* v. *United States*.
BNA's Intellectual Property printouts of *Lemelson* v. *Apple Computer, Inc*.
ITC Judge Order denying Motion for Summary Judgment in the Matter of Certain Memory Devices with Increased Capacitance and Products Containing Same, Investigation #337-TA-371.
Decision in court case *Corbett* v. *Chisolm and Schrenk* invovling patent #3,557,265.
Matthew Beaden Printouts regarding interference practice and the Board Interference.
BNA's Intellectual Property Library on CD printouts about *Corbett* v. *Chisolm*.

Numerous Group W business cards including James Cuddihy.
The Broadcast Teloetext Specification, published by the BBC, The IBA and the British Radio Equipment Manufacturers' Association (1976).
Kahn, et al., "Advances in Packet Radio Technology," . . . Proceedings of the IEEE, vol. 66, No. 11, Nov. (1978) pp. 1468-1495.
Clifford, C., "A Universal Controller for Text Display Systems," IEEE Transactions on Consumer Electronics, (1979) pp. 424-429.
Harden, B., "TeletextNiewdata LSI," IEEE Transactions on Consumer Electronics, (1979), pp. 353-358.
Bown, H. et al., "Comparative Terminal Realizatins with Alpha-Geometric Coding," IEEE Transaction on Consumer Electronics, (1980), pp. 605-614.
Crowther, "Dynamically Redefinable Character Sets—D.R.C.S.," IEEE Transaction on Consumer Electronics, (1980), pp. 707-716.
Chambers, John et al., "The Development of a Coding Hierarchy for Enhanced UK Teletext," IEEE Transaction on Consumer Electronics, (1981), pp. 536-540.
Reexamination of U.S. Patent No. 4,706,121.
U.S. Patent Application by T. Diepholz (U.S. Appl. No. 06/266,900).
List of relevant or searched patents.
88908836.5 and Amendments to John C. Harvey,. European Patent Office.
88908836.5 International Application to John C. Harvey.
Kruger, H.E., "Memory Television, the ZPS Digital Identification System," pp. 1-9.
Stern, "An Auotmated Programming Control Sysem for Cable TV".
Yamane et al., "System and apparatus for automatic Monitoring control of Broadcast Circuits".
Zettl, "Television Production Handbook", second edition.
Schiller et al., "CATV Program Origination and Production".
Hughes et al., Some Design Considerations for Home Interactive Terminals, IEEE Transaction on Broadcasting, vol. BC-17, No. 2, Jun. 1971.
Kaneko et al., "Digital Transmission of Broadcast Television with Reduced Bit Rate."
Gautier, C., "Automatic Program Recording Systems".
Nov. 1975, Kahn et al., "Advances in Packet Radio Technology," Proceedings of IEEE, vol. 6.6, No. 11.
May 27, 1979, Marti, B., "The Concept of Universal Teletext," CCETT, Rennes 11th International Television Symposium Paper, V11 A-3A, pp. 1-11.
"Videotex Services," National Cable Television Association Executive Seminar Series, NCTA Washington, Oct. 1980, pp. III-VII, 1-3, 23-27.
Feb. 1985, "Specification du service de classe A, TeleDiffusion de France," Anitope.
Jun. 1981, Gautier, J.P. "Language Telediffuse de Messagerie du Project Ecrans Hybrides," Antiope/Didon system.
Jun. 1985, Auer, R., "Die Warteschlange Uberlistet," Funkschau, pp. 53-56.
May 1981, Grethlein, M., "Videotext und Bildschirmtext," Funkschau, Heft 5, 1981, pp. 69-73.
Heider, et al., Heider, et al., "Videotext und Bildschirmtext," Grundig Technische Informationen, Heft 4/5, 1980, pp. 171-195.
Jun. 1984, Kombinierer fur Videotextsignal, "Runfunktechnische Mitteilungen," Jahrgang 28, 1984 , Heft 6, pp. 273-289.
Chorafas, "Interactive Videotex: The Domesticated Computer," 1981, Petrocelli Books, New York.
Hinton, "Character rounding for the Wireless Word teletex decoder," Wireless World, Nov. 1978, pp. 49-53, vol. 84 No. 1515 IPC Business Press, United Kingdom.
Kruger, "Speicherfernsehen, Das Digitale Kennungssystem ZPS," Proceedings 9th International Congress Microelectroncis, pp. 39-45.
"Fernsehempfanq rund urn die Uhr" Funk Technik, Mar. 1981, vol. 36.
Various Articles following cover sheet titled "QVP—Pay Per View" Nov. 29, 1982.
"Advanced Minicomputer-based Systems for Banking and Financial Institutions," Money Management Systems, Incorporated, brochure, 1980, 9 pages.
"Advanced Transmission Techniques," SMPTE Journal, Report on the 121st Technical Conference, Jan. 1980, vol. 89, pp. 31-32.
"American National Standard" "dimensions of video, audio and tracking control records on 2-in video magnetic tape quadruplex recoreded at 15 and 7.5 in/s," SMPTE Journal, Oct. 1981, pp. 988-989.
"American National Standard" "time and control code for video and audio tape for 525-line/60-field television systems," SMPTE Journal, Aug. 1981, pp. 716-717.
"Anderson: Progress Committee Report for 1979—Television," SMPTE Journal, May 1980, vol. 89, pp. 324-328.
"Application of Direct Broadcast Satellite Corporation for a Direct Broadcast Satellite System," Before the Federal Communications, Washington, D.C., Gen. Docket No. 80-603, Jul. 16, 1981.
"Cable TV Advertising," Paul Kogan Associates, Inc., No. 22, Feb. 18, 1981, 6 pages.
"CAMP," Arbitron Cable, The Arbitron Company, product brochure, May 1980, 8 pages.
"Contraband code," Closed Circuit, Broadcasting, Sep. 28, 1970, 1 page.
"Did the ad run?", Media Decisions, Jul. 1969, pp. 44 et se.
"Digisonics pushes its coding method," Broadcasting, Dec. 7, 1970, p. 37.
"Digisonics TV Monitor System Finds Defenders," Advertising Age, Dec. 8, 1969, 1 page.
"Digisonics violated standards, says BAR," Broadcasting, Oct. 5, 1970, pp. 21-23.
"Digisonics' Aim is Info Bank, Not Just Proof of Performance," Advertising Age, No. 9, 1970, 4 pages.
"Digisonics' dilemma," Media Decisions, Jun. 1971, 6 pages.
"Everything you've always wanted to know about TV Ratings," A.C. Nielsen Company, brochure, 1976.
"How to increase training productivity through Videodisc and Microcomputer systems," seminar brochure, 1981.
"IDC begins monitoring," At Deadline, Broadcasting, Sep. 14, 1970, p. 9.
"IDC encoding system still alive at FCC," Broadcasting, Sep. 27, 1971, p. 31.
"In this corner, Digisonics!", Media Decisions, Jun. 1968, 5 pages.
"Index to SMPTE—Sponsored American National Standards, Society Recommended Practices, and Engineering Committee Recommendations," 1980 Index to SMPTE Journal, SMPTE Journal, pp. I-15 to I-20.
"Index to Subjects—Jan.-Dec. 1976 • vol. 85," 1976 Index to SMPTE Journal, SMPTE Journal, vol. 85, pp. I-5 to I-13, I-15.
"Index to Subjects—Jan.-Dec. 1977 • vol. 86," 1977 Index to SMPTE Journal, SMPTE Journal, vol. 86, pp. I-5 to I-14.
"Index to Subjects—Jan.-Dec. 1979 • vol. 88," 1979 Index to SMPTE Journal, SMPTE Journal, vol. 88, pp. I-4 to I-10.
"Index to Subjects—Jan.-Dec. 1980 • vol. 89," 1980 Index to SMPTE Journal, SMPTE Journal, pp. I-5 to I-11.
"Index to vol. 87 Jan.-Dec. 1978," SMPTE Journal, Part II to Jan. 1979 SMPTE Journal, pp. I-1, I -4 to I-14.
"Listeners," Closed Circuit, Broadcasting, 1 page.
"Management With The Nielsen Retail Index System," A.C. Nielsen Company, 1980.
"Measuring The Cable Audience," Ogilvy & Mather, Advertising, 1980, pp. H1-H8.
"No Digisonics friends show in comments," Broadcasting, May 24, 1971, p. 62.
"Preliminary List of Papers," SMPTE Journal, Sep. 1980, vol. 89, p. 677.
"Proposed SMPTE Recommended Practice" "Vertical Interval Time and Control Code for Video Tape for 525-Line/60-Field Television Systems," SMPTE Journal, Sep. 1981, pp. 800-801.
"SMPTE Journal Five-Year Index 1971-1975," SMPTE Journal.
"SMPTE Journal Five-Year Index 1976-1980," SMPTE Journal.
"Talent pay code put off," At Deadline, Broadcasting, Nov. 9, 1970, p. 9.
"Teletext (Broadcast Videotext) Begins in the United States" by Richard H. Veith, Logica, Inc. at National Online Meeting: Proceedings—1982 sponsored by Online Review, pp. 547-551.
"Television," SMPTE Journal, May 1981, pp. 375-379.
"The TCR-119 Reader," Gray Engineering Laboratories, SMPTE Journal, May 1980, vol. 89, p. 438, (advertisement).

"Vidbits," Advertising Age, Sep. 21, 1981, p. 70.
"Video Tape Recording Glossary," SMPTE Journal, Oct. 1980, vol. 89, p. 733.
"Window on the World" "The Home Information Revolution," Business Week, Jun. 29, 1981, pp. 74-83.
9 Digital Television Developments, Independent Broadcasting Authority (Iba) Technical Review, pp. 19-31.
A System of Data Transmission In The Field Blanking Period Of The Television Signal, Iba Technical Review, Digital Television, pp. 37-44.
Addressable Cable Television Control System with Vertical Interval Data Transmission, Campbell et al. abandoned U.S. Appl. No. 384,937, pp. 1-28, abstract, claims 1-42, Figs. 1-13 (Mar. 1980).
Addressable control—A big first step toward the marriage of computer, cable, & consumer, Larry C. Brown, (Pioneer Communications of America), Cable.
Alfonzetti, Salvatore, "Interworking between teletext and OSI systems," Computer Communications (1989).
Ancillary Signals for Television, U.S. Dept. of Commerce, Sep. 1975.
Anderson, The Vertical Interval: A General-Purpose Transmission Path, Sep. 1971.
Appx. B of Petition to FCC, p. 72, filed Jul. 29, 1980.
Barlow, Automatic Switching in the CBC—An Update, Sep. 1, 1976.
Beakhurst, D.J., et al., "Teletext and Viewdata—A Comprehensive Component Solution," Illustrations, Proceedings, IEE, vol. 126, Dec. 1979, pp. 1382-1385.
BS-14, Broadcast Specification, Television Broadcast Videotext, Telecommunication Regulatory Service, Jun. 19, 1981.
Collin, Simon, PC Text II (Hardware Review (Shortlist), PC User (1990).
DeGoulet, et al., "Automatic Program Recording System" Radio diff. ET TV Nov. 1975.
Diederich, Electronic Image and Tone Return Equipment With Switching System and Remote Control Receiver for Television Decoder, May 22, 1975.
Enhanced graphis for Teletext, R.H. Vivian, Aug. 1981, IEEE pp. 541-550.
Etkin, Vertical Interval Signal Applications, Broadcast Engineering, pp. 30-35, Apr. 1970.
Federal Register/vol. 64, No. 146/Friday, Jul. 30, 1999.
Ferre, "Goodbye, TV Snow", Electronic Servicing, May 1977, pp. 14-22.
Gaucher et al., Automatic Program Recording System, Nov. 1, 1975.
Howell, "A Primer on Digital Television" Journal of the SMPTE, Jul. 1975, 538-541.
Hutt, "A System of Data Transmission in the Field Blanking Period of the Television Signal" , SLICE pp. 37-44, Jun. 1973.
John Hedger, Oracle ((TCA), U.K. (1980).
Kamishima, et al., A Monitor Device of a Switcher System, May 8, 1981.
Lopinto, John, "The Application of DRCS within the North American Broad cast Teletext Specification", IEEE Transactions on Consumer Electronics (1982), pp. 612-617.
Memo from W. Thomas to G. Kelly on Jan. 21, 1982 Re: Modified ZTAC/Multi Channel.
Memo to Bernie Kotten about National Cable TV Association meeting and efforts to encourage Sony to integrate teletext chip sets into its TV, Mar. 25, 1986.
Money, "CEEFAX/Oracle: reception techniques (part 1)" Television, Jul. 1975, vol. 25, No. 9, pp. 396-398.
O'Donnell, John et al., "Videodisc Program Production Manual," Sony, 1981.
O'Connor, Ad Hoc Committee on Television Broadcast Ancillary Signals, Journal of the SMPTE, vol. 82, Dec. 1973.
Petition for Ruremaking filed with the FCC by CBS Inc. On Jul. 29, 1980, p. 72 of Appendix B.
Portions of Electonic Engineer's Reference Book (1989)—Multichannel sound systems, Teletext transmission, cable television, ISDN applications, etc.
Present Status of Still.Picture Television, Research & Development, Nhk.
Report and Order of FCC on the Matter of Amendment of Parts 2,73, and 76 of the Commission's Rules to Authorize the Transmission of Teletext by TV Stations, pp. 1-37, May 20, 1983.
Schubin, The First Nationwide Live Stereo Simulcast Network, SMPTE Journal, vol. 86, Jan. 1977.
SMPTE Journal, May 1980, vol. 89, p. 391, no title.
Stagg, "An integrated Teletext and Viewdata Receiver" The SERT Journal vol. 11, Oct. 1977, pp. 210-213.
Stern, et al., An Automated Programming Control System for Cable TV.
Systems of VSA-Videographic (KCO26867).
Taylor, John P., "Comsat bid to FCC for DBS authorization: Is direct broadcasting the wave of the future?", Television/Radio Age, Mar. 23, 1981, pp. A-22-A-24 and A-26 and A-28-A-31.
Taylor, John P., "Comsat bid to FCC for DBS authorization: Questions of finances, 'localism,' monopoly," Television/Radio Age, May 4, 1981, pp. 42-44 and 80-81.
Taylor, John P., "Fourteen DBS authorization applications to FCC differ greatly in both structure and operations," Television/Radio Age, Oct. 5, 1981, pp. 40-42 and 116-119.
Teletext Receiver LSI Data Acquisition and Copntrol, G.O. Growther, et al., Jan. 1976 pp. 9/1-9/5.
Television Network Automated By Mini Computer-Controlled Channels, "Computer Design", vol. 15, No. 11, pp. 58,59,62,66,70.
The institution of Electronic and Radio Engineers, Conference on Electronic Delivery of Data and Software, Pub. No. 69, Sep. 1986.
The Specification of the Parent Application of Campbell et al., filed Mar. 1980 (WO 81/02961 PCT).
Various Commissioner statements on Authorization of Teletext Transmissions by TV Stations, BC Docket No. 81-741, Mar. 31, 1983.
Viewdata, First World Conference on Viewdata, Videotext and Teletext, Mar. 26, 1980, pp. 431-445.
VSA's Teletext Products, Videographic Systems of America.
Zettl, Television Production Handbook, Jan. 1, 1969.
Art Kleiman, "Heathkit GR-2001—Programmable Color TV," Radio Electronics, May 1977.
James, A., "Oracle—Broadcasting the Written Word," *Wireless Word*, Jul. 1975.
Came, E. Bryan, "The Wired Household," *IEEE Spectrum*, Oct. 1979, p. 61-66.
McKenzie, G.A., "Oracle—An Information Broadcasting Service Using Data Transmission in the Vertical Interval " *Journal of the SMPTE*, vol. 83, No. 1, Jan. 1974, pp. 6-10.
Edwardson, S.M., "CEEFAX: A Proposed New Broadcasting Service," *Journal of the SMPTE*, Jan. 1974, p. 14-19.
J. Chiddix, "Automated Videotape Delay of Satellite Transmissions," *Satellite Communications Magazine*, May 1978 (reprint—2 pages).
J. Chiddix, "Tape Speed Errors in Line-Locked Videocassette Machines for CATV Applications," *TVC*, Nov. 1977 (reprint—2 pages).
CRC Electronics, Inc. Product Description, "Model TD-100—Time Delay Videotape Controller," 2 pages.
CRC Electronics, Inc., Net Price List—Mar. 1, 1980 (TD-100 Time Delay Videotape Controller), 1 page.
CRC Electronics, Inc. Product Description, "Model P-1000 Videocassette Programmer," 4 pages.
CRC Electronics, Inc., Net Price List—Jul. 31, 1981 (P-1000 Video Machine Programmer), 1 page.
Tunmann, E.O. et al. (Tele-Engineering Corp.), "Microprocessor For CATV Systems " *Cable 78—Technical Papers*, National Cable Television Association 27th Annual Convention, New Orleans, LA, Apr. 30-May 3, 1978 ("*Cable 78*"), pp. 70-75.
Vega, Richard L. (Telecommunications Systems, Inc.), "From Satellite to Earth Station to Studio to S-T-L to MDS Transmitter to the Home; Pay Television Comes to Anchorage, Alaska," *Cable 78*, pp. 76-80.
Wright, James B. et al. (Rockford Cablevision, Inc.), "The Rockford Two-Way Cable Project: Existing and Projected Technology," *Cable 78*, pp. 20-28.
Fannetti, John D. et al. (City of Syracuse), "The Urban Market: Paving the Way for Two-Way Telecommunications," *Cable 78*, pp. 29-33.

Schnee Rolf M. et al. (Heinrich-Hertz-Institut Berlin (West)), "Technical Aspects of Two-Way CATV Systems in Germany," *Cable 78*, pp. 34-41.
Dickinson, Robert V.C. (E-Com Corporation), "A Versatile, Low Cost System for Implementing CATV Auxiliary Services," *Visions '79—Technical Papers*, National Cable Television Association 28th Annual Convention, Las Vegas, NV, May 20-23, 1979, ("*Visions '79*"), pp. 65-72.
Evans, William E. et al. (Manitoba Telephone System), "An Intercity Coaxial Cable Electronic Highway," *Visions '79*, pp. 73-79.
Schrock, Clifford B. (C.B. Schrock and Associates, Inc.), "Pay Per View, Security, and Energy Controls Via Cable: The Rippling River Project," *Visions '79*, pp. 80-85.
Southworth, Glen (Colorado Video, Inc.), "Narrow-Band Video: The UPI 'Newstime' Technology," *Visions '79*, pp. 86-88.
Daly IV, Raymond E. (Computer Cablevision, Inc.), "Potential Use of Microcomputers—The Threats to Technical Personnel, Manufacturers and Owners," *Visions '79*, pp. 124-126.
Grabenstein, James B. (Potomac Valley Television Co., Inc.), "System Design and Operation with 'Basic'," *Visions '79* (Appendix B), p. 127.
Amell, Richard L. (Cox Cable Communications, Inc.), "Computer-Aided CATV System Design," *Visions '79*, pp. 128-133.
Yoshino, Hirokazu et al. (Matsushita Electric Industrial Co., Ltd.), "Multi-Information System Using Fiber Optics," *Visions '79*, pp. 134-137.
Albright, Thomas G. (Printer Terminal Communications Corporation), "Cable Service: A Data Distribution Link," *Visions of the 80's—Technical Papers*, National Cable Television Association 29th Annual Convention, Dallas, TX, May 18-21, 1980 ("*Visions of the 80's*"), pp. 30-34.
Blineau, Joseph J. (Centre Commun d'Études de Télévision et Télécommunications), "Measuring Methods and Equipments for Data Packet Broadcasting," *Visions of the 80's*, pp. 35-39.
Katz, Harold W. (Interactive Systems/3M), "Status Report on EIA Broadband Modem Standards " *Visions of the 80's*, pp. 40-44.
Lopinto, John J. (Home Box Office), "Considerations for Implementing Teletext in the Cable System," *Visions of the 80's*, pp. 45-48.
O'Brien, Jr., Thomas E. (General Instrument Corporation), "System Design Criteria of Addressable Terminals Optimized for the CATV Operator," *Visions of the 80's*, pp. 89-91.
Ost, Clarence S. et al. (Electronic Mechanical Products Co.), "High-Security Cable Television Access System," *Visions of the 80's*, pp. 92-94.
Bacon, John C. (Scientific-Atlanta, Inc.), "Is Scrambling the Only Way'?," *Visions of the 80's*, pp. 95-98.
Davis, Allen (Home Box Office), "Satellite Security," *Visions of the 80's*, pp. 99-100.
Mannino, Joseph A. (Applied Date Research, Inc.), "Computer Applications in Cable Television," *Visions of the 80's*, pp. 116-117.
Beck, Ann et al. (Manhattan Cable TV), "An Automated Programming Control System for Cable TV," *Visions of the 80's*, pp. 122-127.
Schloss, Robert E. et al. (Omega Communications, Inc.), "Controlling Cable TV Head Ends and Generating Messages by Means of a Micro Computer," *Visions of the 80's*, pp. 136-138.
Eissler, Charles 0. (Oak Communications, Inc.), "Addressable Control," *Cable: '81 The Future of Communications—Technical Papers*, National Cable Television Association 30th Annual Convention, Los Angeles, CA, May 29-Jun. 1, 1981 ("*Cable: '81*"), pp. 29-33.
Schoeneberger, Carl F. (TOCOM, Inc.), "Addressable Terminal Control Using the Vertical Interval," *Cable: '81*, pp. 34-40.
Stern, Joseph L. (Stern Telecommunications Corporation), "Addressable Taps," *Cable: '81*, p. 41.
Brown, Larry C. (Pioneer Communications of America), "Addressable Control—A Big First Step Toward the Marriage of Computer, Cable, and Consumer" *Cable: '81*, pp. 42-46.
Grabowski, Ralph E. (VISIONtec), "The Link Between the Computer and Television," *Cable: '81*, pp. 99-100.
Ciciora, Ph.D., W.S. (Zenith Radio Corporation), "VIRTEXT & VIRDATA: Adventures in Vertical Interval Signaling," *Cable: '81*, pp. 101-104.
Gilbert, Bill et al. (TEXSCAN Corporation), "Automatic Status Monitoring for a CATV Plant," *Cable: '81*, pp. 124-128.
Ciciora, Walter et al., "An Introduction to Teletext and Viewdata with Comments on Compatibility " *IEEE Transactions on Consumer Electronics*, vol. CE-25, No. 3, Jul. 1979 ("*Consumer Electronics*"), pp. 235-245.
Tanton, N. E. "UK Teletext—Evolution And Potential," *Consumer Electronics*, pp. 246-250.
Bright, Roy D., "Prestel—The World's First Public Viewdata Service," *Consumer Electronics*, pp. 251-255.
Bown, H.G. et al., "Telidon: A New Approach to Videotex System Design " *Consumer Electronics*, pp. 256-268.
Chitnis, A.M. et al., "Videotex Services: Network and Terminal Alternatives," *Consumer Electronics*, pp. 269-278.
Hedger, J. "Telesoftware: Home Computing Via Broadcast Teletext," *Consumer Electronics*, pp. 279-287.
Crowther, G.O., "Teletext and Viewdata Systems and Their Possible Extension to Europe and USA," *Consumer Electronics*, pp. 288-294.
Gross, William S., "Info-Text, Newspaper of the Future," *Consumer Electronics*, pp. 295-297.
Robinson, Gary et al., "'Touch-Tone' Teletext—A Combined Teletext-Viewdata System," *Consumer Electronics*, pp. 298-303.
O'Connor, Robert a., "Teletext Field Tests," *Consumer Electronics*, pp. 304-310.
Blank, John, "System and Hardware Considerations of Home Terminals With Telephone Computer Access," *Consumer Electronics*, pp. 311-317.
Plummer, Robert P. et al., "4004 Futures for Teletext and Videotex in the U.S.," *Consumer Electronics*, pp. 318-326.
Marti, B. et al., The Antiope Videotex System, *Consumer Electronics*, pp. 327-333.
Frandon, P. et al., "Antiope LSI," *Consumer Electronics*, pp. 334-338.
Crowther, G.O., "Teletext and Viewdata Costs As Applied to the U.S. Market," *Consumer Electronics*, pp. 339-344.
Mothersole, Peter L., "Teletext Signal Generation Equipment and Systems," *Consumer Electronics*, pp. 345-352.
Harden, Brian, "Teletext/Viewdata LSI," *Consumer Electronics*, pp. 353-358.
Swanson, E. et al., "An Integrated Serial to Parallel Converter for Teletext Application," *Consumer Electronics*, pp. 359-361.
Neal, C. Bailey et al., "A Frequency-Domain Interpretation of Echoes and Their Effect on Teletext Data Reception," *Consumer Electronics*, pp. 362-377.
Goyal, Shri K. et al., "Reception of Teletext Under Multipath Conditions," *Consumer Electronics*, pp. 378-392.
Prosser, Howard F., "Set Top Adapter Considerations for Teletext," *Consumer Electronics*, pp. 393-399.
Suzuki, Tadahiko et al., Television Receiver Design Aspects for Employing Teletext LSI, *Consumer Electronics*, pp. 400-405.
Baer, Ralph H., "Tele-Briefs—A Novel User-Selectable Real Time News Headline Service for Cable TV," *Consumer Electronics*, pp. 406-408.
Sherry, L.A., "Teletext Field Trials in the United Kingdom," *Consumer Electronics*, pp. 409-423.
Clifford, Colin, "A Universal Controller for Text Display Systems," *Consumer Electronics*, pp. 424-429.
Barlow, "The Design of an Automatic Machine Assignment System", *Journal of the SMPTE*, Jul. 1975, vol. 84, p. 532-537.
Barlow, "The Automation of Large Program Routing Switchers", *SMPTE Journal*, Jul. 1979, vol. 88, p. 493-497.
Barlow, "The Computer Control of Multiple-Bus Switchers", *SMPTE Journal*, Sep. 1976, vol. 85, p. 720-723.
Barlow, "The Assurance of Reliability", *SMPTE Journal*, Feb. 1976, vol. 85, p. 73-75.
Barlow, "Some Features of Computer-Controlled Television Station Switchers", *Journal of the SMPTE*, Mar. 1972, vol. 81, p. 179-183.
Barlow et al., "A Universal Software for Automatic Switchers", *SMPTE Journal*, Oct. 1978, vol. 87, p. 682-683.
Butler, "PCM-Multiplexed Audio in a Large Audio Routing Switcher", *SMPTE Journal*, Nov. 1976, vol. 85, pp. 875-877.
Dickson et al., "An Automated Network Center", *Journal of the SMPTE*, Jul. 1975, vol. 84, p. 529-532.
Edmondson et al., "NBC Switching Central", *SMPTE Journal*, Oct. 1976, vol. 85, p. 795-805.

Flemming, "NBC Television Central—An Overview", *SMPTE Journal*, Oct. 1976, vol. 85, p. 792-795.
Horowitz, "CBS" New-Technology Station, WBBM-T, *SMPTE Journal*, Mar. 1978, vol. 87, p. 141-146.
Krochmal et al., "Television Transmission Audio Facilities at NBC New York", *SMPTE Journal*, Oct. 1976, vol. 85, p. 814-816.
Kubota et al., "The Videomelter", *SMPTE Journal*, Nov. 1978, vol. 87, p. 753-754.
Mausler, "Video Transmission Video Facilities at NBC New York", *SMPTE Journal*, Oct. 1976, vol. 85, p. 811-814.
Negri, "Hardware Interface Considerations for a Multi-Channel Television Automation System", *SMPTE Journal*, Nov. 1976, vol. 85, p. 869-872.
Paganuzzi, "Communication in NBC Television Central", *SMPTE Journal*, Nov. 1976, vol. 85, p. 866-869.
Roth et al., "Functional Capabilities of a Computer Control System for Television Switching", *SMPTE Journal*, Oct. 1976, vol. 85, p. 806-811.
Rourke, "Television Studio Design—Signal Routing and Measurement", *SMPTE Journal*, Sep. 1979, vol. 88, p. 607-609.
Yanney, Sixty-Device Remote-Control System for NBC's Television Central Project, *SMPTE Journal*, Nov. 1976, vol. 85, p. 873-877.
Young et al., "Developments in Computer-Controlled Television Switches", *Journal of the SMPTE*, Aug. 1973, vol. 82, p. 658-661.
Young et al., "The Automation of Small Television Stations", *Journal of the SMPTE*, Oct. 1971, vol. 80, p. 806-811.
Zborowski, "Automatic Transmission Systems for Television", *SMPTE Journal*, Jun. 1978, vol. 87, p. 383-385.
"Landmark forms cable weather news network," Editor & Publisher, (Aug. 8, 1981) p. 15.
"Broadcast Teletext Specification," published jointly by British Broadcasting Corporation, Independent Broadcasting Authority, British Radio Equipment Manufactures' Association (Sep. 1976), pp. 1-24.
"Colormax Cable captioning—16,000,000 Subs Need It!," Colormax Electronic Corp. (advertisement), 3 pages.
"7609 Sat-A-Dat Decoder/Controller," Group W Satellite Communications (advertisement) 2 pages.
"Teletext Timing Chain Circuit (SAA5020)," (Aug. 1978), pp. 109.
"Teletext Video Processor (Saa 5030)," Mullard (Dec. 1979), pp. 1-9.
"Video Text Decoder Systems (Signetics)", *Phillips IC Product Line Summary* (May 1981), pp. 15-16.
"Teletext Acquisition and Control Circuit (SAA5040 Series)," Mullard (Jun. 1980), pp. 1-16.
"Asynchronous Data Transmission System Series 2100 VIDATA, "Wagener Communications, Inc. (advertisement), 2 pages.
"Zenith VIRTEXTTM . . . Vertical Interval Region Text and Graphics," Zenith Radio Corporation (flyer), 7 pages.
Anon, "Television Network Automated by Microcomputer-Controlled Channels," Computer Design, vol. 15, No. 11, (Nov. 1976), pp. 50, 59, 62, 66 and 70.
Kinik, et al., "A Network Control System for Television Distribution by Satellite," *Journal of The SMPTE*, Feb. 1975, vo. 84, No. 2, pp. 63-67.
Chiddix, "Videocassette Banks Automate Delayed Satellite Programming," Aug. 1978, TV Comunications, pp. 38-39.
Cumal, et al., "Automating Television Operating Centers," Bell Laboratories Record, Mar. 1978, pp. 65-70.
Baran, Paul (Packetcable Inc.), "Packetcable: A New Interactive Cable SystemTechnology," *Cable '82—Technical Papers*, National Cable Television Association 31st Annual Convention, Las Vegas, NV, May 3-5, 1982 (*Cable'82*), pp. 1-6.
Tunmann, Ernest O. (Tele-Engineering Corporation), "Two-Way Cable TV Technologies," *Cable'82*, pp. 7-15.
Dickinson, Robert V.C. (E-COM Corporation), "Carriage of Multiple One-Way and Interactive Service on CATV Networks," *Cable'82*, pp. 16-21.
McNamara, R.P. et al. (Sytek, Incorporated), "MetroNet: An Overview of a CATV Regional Data Network," *Cable'82*, pp. 22-31.
Eissler, Charles (Oak Communications Systems), "Addressable Control for the Small System," *Cable'82*, pp. 32-36.
Mesiya, M.F. et al. (Times Fiber Communications, Inc.), "Mini-Hub Addressable Distribution System for Hi-Rise Application," *Cable'82*, pp. 37-42.
Thomas, William L. (Zenith Radio Corporation), "Full Field Tiered Addressable Teletext," *Cable'82*, pp. 44-46.
Langley, Don et al. (University of Cincinnati and Rice-Richter Associates), "Interactive Split Screen Teleconferencing," *Cable'82*, pp. 47-50.
Klare, Stephen W. (Scientific—Atlanta), "Bandwidth-Efficient, High-Speed Modems for Cable Systems," *Cable'82*, pp. 72-78.
Jubert, Jay (Wang Laboratories, Inc.), "Wangnet, A Cable-Based Localnet," *Cable'82*, pp. 79-81.
Switzer, I. (Cable America, Inc.), "Cable TV Advances and TV Receiver Compatibility Problems," *Cable'82*, pp. 114-118.
Skrobko, John (Scientific-Atlanta Incorporated), "Improving CATV System Reliability with Automatic Status Monitoring and Bridger Switching," *Cable'82*, pp. 133-137.
Dahlquist, John (Jerrold Division, General Instrument Corporation), "Techniques for Improving Continuity of Service in a CATV Distribution System," Abstract, *Cable'82*, p. 138.
Polishuk, Paul Dr. (Information Gatekeepers, Inc.) "Present Status of Fiber Optics Technology and its Impact on the CATV Industry," *Cable'82*, pp. 142-147.
Dufresne, Michel (Videotron Communications LTEE), "New Services: An Integrated Cable Networks's Approach," *Cable'82*, pp. 156-160.
Stanton, Gary W. (Southern Satellite Systems), "Downloading and Addressing via Teletext," *Cable'82*, pp. 161-165.
Goldberg, Efrem I. (GTE Laboratories Incorporated), "Videotex on Two-Way Cable Television Systems—Some Technical Considerations," *Cable'82*, pp. 166-174.
Noirel, Yves (CCETT/Rennes, France), "Abstract of paper entitled Data Broadcasting: "DIDON" and "DIODE" Protocols," *Cable'82*, pp. 175-179.
von Meister, William F (Digital Music Company), "The Home Music Store," *Cable'82*, pp. 180-182.
Brown, Jr., Robert R. (Cima Telephone and Television), "Inter Bridger Trunking for IInformation Services," *Cable'82*, pp. 183-189.
Alvord, Charles, Dr. (Communications Technology Management, Inc.), "Creating Standards for Interconnect Systems," *Cable'82*, pp. 190-196.
Schrock, Clifford B. (Cable Bus Systems Corporation), "Can Noise and Ingress Coexist with Two-Way Services?," *Cable'82*, pp. 205-209.
The Weather Channel, "The Weather STAR Satellite Transponder Addressable Receiver," Operation/Installation Manual, Rev. 01.5/82.
Lafayette, Jon, "TV ad monitor system starts tests here Mon.," *New York Post*, Oct. 18, 1985, p. 63.
Jones, Stacy V., "Patents/Monitoring Display of TV Ads," *The New York Times*, Oct. 19, 1985, p. 34.
Remley, F.M., "Television Technology," *SMPTE Journal*, May 1982, pp. 458-462.
Proposed American National Standard, "Electrical and Mechanical Characteristics for Digital Control Interface," *SMPTE Journal*, Sep. 1982, pp. 888-897.
Zaludek, Jerry P., "Videotape—Past, Present, and Future," *SMPTE Journal*, Apr. 1982, pp. 356-360.
Kary, Michael Loran, "Video-Assisted Film Editing System," *SMPTE Journal*, Jun. 1982, pp. 547-551.
Glover, S. "Automatic Switching at the Edmonton Television Studios," *SMPTE Journal*, Nov. 1966, vol. 75, pp. 1089-1092.
Barlow, M.W.S., "The Remote Control of Multiplexed Telecine Chains," *SMPTE Journal*, Apr. 1971, vol. 80, pp. 270-275.
Campbell, Keith D., "An Automated Video-Tape Editing System," *Journal of the SMPTE*, Mar. 1970, vol. 79, pp. 191-194.
Bonney, R.B. et al., "A Proposed Standard Time and Control Code for Video-Tape Editing," *Journal of the SMPTE*, Mar. 1970, vol. 79, pp. 186-190.
Barlow, M., Letter to the Editor, "Re: Coding and Packaging Film for Broadcasting," *Journal of the SMPTE*, Oct. 1969, vol. 78, p. 889.
Barlow, M., Letter to the Editor, "Re: Automation of Telecine Equipment," *Journal of the SMPTE*, Apr. 1970, vol. 79, pp. 345-346.

Matley, J. Brian, "A Digital Framestore Synchronizer," *SMPTE Journal*, Jun. 1976, vol. 85, pp. 385-388.
Connolly, W.G. et al., "The Electronic Still Store: A Digital System for the Storage and Display of Still Pictures," *SMPTE Journal*, Aug. 1976, vol. 85, pp. 609-613.
Sadashige, K., "Overview of Time-Base Correction Techniques and Their Applications," *SMPTE Journal*, Oct. 1976, vol. 85, pp. 787-791.
Siocos, C.A., "Satellite Technical and Operational Committee—Television (STOC-TV) Guidelines for Waveform Graticules," *SMPTE Journal*, Nov. 1976, vol. 85, pp. 878-879.
Rodgers, Richard W., "Design Considerations for a Transmission and Distribution System for SMPTE Time-Code Signals," *SMPTE Journal*, Feb. 1977, vol. 86, pp. 69-70.
Allan, J.J., III, et al., "A Computer-Controlled Super-8 Projector," *SMPTE Journal*, Jul. 1977, vol. 86, pp. 488-489.
Hamalainen, K.J., "Videotape Editing Systems Using Microprocessors," *SMPTE Journal*, Jun. 1978, vol. 87, pp. 379-382.
McCoy, Reginald F.H., "A New Digital Video Special-Effects Equipment," *SMPTE Journal*, Jan. 1978, vol. 87, pp. 20-23.
Leonard, Eugene, "Considerations Regarding the Use of Digital Data to Generate Video Backgrounds," *SMPTE Journal*, Aug. 1978, vol. 87, pp. 499-504.
Swetland, George R., "Applying the SMPTE Time and Control Code to Television Audio Post Production," *SMPTE Journal*, Aug. 1978, vol. 87, pp. 508-512.
Moore, J.K., et al., "A Recent Innovation in Digital Special Effects, The CBS 'Action Track' System," *SMPTE Journal*, Oct. 1978, vol. 87, pp. 673-676.
Connolly, William G., "Videotape Program Production at CBS Studio Center," *SMPTE Journal*, Nov. 1978, vol. 87, pp. 761-763.
Nicholls, William C., "A New Edit Room Using One-Inch Continuous-Field Helical VTRs," *SMPTE Journal*, Nov. 1978, vol. 87, pp. 764-766.
"Index to vol. 87 Jan.-Dec. 1978" *SMPTE Journal*, Part II to Jan. 1979 *SMPTE Journal*, pp. I-1, I-4 to I-14.
Wetmore, R. Evans, "System Performance Objectives and Acceptance Testing of the Public Television Satellite Interconnection System," *SMPTE Journal*, Feb. 1979, vol. 88, pp. 101-111.
Bates, George W., "Cut/Lap: A New Method for Programmable Fades and Soft Edit Transitions Using a Single Source VTR," *SMPTE Journal*, Mar. 1979, vol. 88, pp. 160-161.
Douglas, W. Gordon, "PBS Satellite Interconnection Technical Operations and Maintenance," *SMPTE Journal*, Mar. 1979, vol. 88, pp. 162-163.
Oliphant, Andrew et al., "A Digital Telecine Processing Channel," *SMPTE Journal*, Jul. 1979, vol. 88, pp. 474-483.
Bates, George W. et al, "Time Code Error Correction Utilizing a Microprocessor," *SMPTE Journal*, Oct. 1979, vol. 88, pp. 712-715.
Geise, Heinz-Dieter, "The Use of Microcomputers and Microprocessors in Modern VTR Control," *SMPTE Journal*, Dec. 1979, vol. 88, pp. 831-834.
"Advanced Transmission Techniques," *SMPTE Journal*, Report on the 121st Technical Conference, Jan. 1980, vol. 89, pp. 31-32.
"Anderson: Progress Committee Report for 1979—Television," *SMPTE Journal*, May 1980, vol. 89, pp. 324-328.
*SMPTE Journal*, May 1980, vol. 89, p. 391, no title.
"The TCR-119 Reader," Gray Engineering Laboratories, *SMPTE Journal*, May 1980, vol. 89, p. 438, (advertisement).
Hopkins, Robert S., Jr., "Report of the Committee on New Technology," *SMPTE Journal*, Jun. 1980, vol. 89, pp. 449-450.
Limb, J.O. et al, "An Interframe Coding Technique for Broadcast Television," *SMPTE Journal*, Jun. 1980, vol. 89, p. 451.
"Preliminary List of Papers," *SMPTE Journal*, Sep. 1980, vol. 89, p. 677.
Davis, John T., "Automation of a Production Switching System," *SMPTE Journal*, Oct. 1980, vol. 89, pp. 725-727.
"Video Tape Recording Glossary," *SMPTE Journal*, Oct. 1980, vol. 89, p. 733.
Advertisement, "CTVM 3 series of Barco master control color monitors", "Barco TV Modulator, Model VSBM 1/S", "VICMACS Type 1724 Vertical Interval Machine Control System", "Videotape Editing Controllers by US JVC Corp., RM-70U, RM-82U, RM-88U", *SMPTE Journal*, Oct. 1980, vol. 89, p. 820 et seq.
Ciciora, Walter, "Teletext Systems: Considering the Prospective User," *SMPTE Journal*, Nov. 1980, vol. 89, pp. 846-849.
Hathaway, R.A. et al., "Development and Design of the Ampex Auto Scan Tracking (AST) System," *SMPTE Journal*, Dec. 1980, vol. 89, p. 931.
Connor, Denis J., "Network Distribution of Digital Television Signals," *SMPTE Journal*, Dec. 1980, vol. 89, pp. 935-938.
Table of Contents, *SMPTE Journal*, Feb. 1981, vol. 90, No. 2, 1 page.
Table of Contents, *SMPTE Journal*, Mar. 1981, vol. 90, No. 3, 1 page.
Table of Contents, *SMPTE Journal*, Apr. 1981, vol. 90, No. 4, 1 page.
Table of Contents, *SMPTE Journal*, May 1981, vol. 90, No. 5, 1 page.
"Television," *SMPTE Journal*, May 1981, pp. 375-379.
Table of Contents, *SMPTE Journal*, Jan. 1981, vol. 90, No. 1, 1 page.
Table of Contents, *SMPTE Journal*, Jun. 1981, vol. 90, No. 6, 1 page.
Table of Contents, *SMPTE Journal*, Jul. 1981, vol. 90, No. 7, 1 page.
Table of Contents, *SMPTE Journal*, Aug. 1981, vol. 90, No. 8, 1 page.
Table of Contents, *SMPTE Journal*, Sep. 1981, vol. 90, No. 9, 1 page.
Table of Contents, *SMPTE Journal*, Oct. 1981, vol. 90, No. 10, 1 page.
Kaufman, Paul A. et al., "The Du Art Frame Count Cueing System," *SMPTE Journal*, Oct. 1981, pp. 979-981.
Table of Contents, *SMPTE Journal*, Nov. 1981, vol. 90, No. 11, 1 page.
Table of Contents, *SMPTE Journal*, Dec. 1981, vol. 90, No. 12, 1 page.
Powers, Kerns H., "A Hierarchy of Digital Standards for Teleproduction in the Year 2001," *SMPTE Journal*, Dec. 1981, pp. 1150-1151.
Rice, Michael, "Toward Enhancing the Social Benefits of Electronic Publishing," Report of Meeting, an Aspen Institute Planning Meeting, *Communications and Society Forum Report*, Feb. 25-26, 1987.
Rice, Michael, "Toward Improved Computer Software for Education and Entertainment in the Home," Report of an Aspen Institute Planning Meeting, *Communications and Society Forum Report*, Jun. 3-4, 1987.
Gano, Steve, "Teaching 'real world' systems," 1 page, 1987.
Pollack, Andrew, "Putting 25,000 Pages on a CD," *New York Times*, 1 page, Mar. 4, 1987.
Gano, Steve, "A Draft of a Request for Proposals Concerning the Adoption of Computer Technology in the Home," Jan. 1988, Draft 1987 Steve Gano.
COMSAT, "Communications Satellite Corporation Magazine," No. 7,1982.
COMSAT, "Satellite to Home Pay Television," no date.
COMSAT, "Annual Report 1981."
"Comsaes STC: Poised for blastoff into TV's space frontier," *Broadcasting*, Feb. 22, 1982, pp. 38-45.
"At Sequent Computer, One Size Fits All," *Business Week*, Sep. 17, 1984, 1 page.
Hayashi, Alden, M., "Can Logic Automation model its way to success?", *Electronic Business*, Aug. 1, 1986, 1 page.
"Imager monitors the bloodstream," *High Technology*, Mar. 1987, 1 page.
Merritt, Christopher R.B., M.D., "Doppler blood flow imaging: integrating flow with tissue data," *Diagnostic Imaging*, Nov. 1986, pp. 146-155.
Eisenhammer, John, "Will Europe's Satellite TV Achieve Lift-Off?", *Business*, Aug. 1986, pp. 56-60.
Hayes, Thomas C., "New M.C.C. Chief's Strategy: To Speed Payoff on Research," *The New York Times*, Jun. 24, 1987, 2 pages.
Collins, Glenn, "For Many, a Vast Wasteland Has Become a Brave New World," *New York Times*, no date, 2 pages.
Gleick, James, "U.S. is Lagging on Forecasting World Weather," *The New York Times*, Feb. 15, 1987, 2 pages.
Browning, E.S., "Sony's Perseverance Helped It Win Market For Mini-CD Players," *Wall Street Journal*, Feb. 27, 1986, 2 pages.
Dragutsky, Paula, "Data in the bank is booming biz," *New York Post*, Apr. 29, 1985, 1 page.
Wayne, Leslie, "Dismantling the Innovative D.R.I.," *The New York Times*, Dec. 16, 1984, 2 pages.
Sanger, David E., "A Computer Full of Surprises," *The New York Times*, May 8, 1987, 2 pages.

Hoffman, Paul, "The Next Leap In Computers," *The New York Times Magazine*, Dec. 7, 1986, 6 pages.
Taylor, Thayer C., "Laptops and the Sales Force: New Stars in the Sky," pp. 81-84.
Parker, Edwin B., "Satellite micro earth stations—a small investment with big returns," *Data Communications*, Jan. 1983, 5 pages.
"Micro Key System," Video Associates Labs, product description.
"SMPTE Journal Five-Year Index 1971-1975," *SMPTE Journal*.
"SMPTE Journal Five-Year Index 1976-1980," *SMPTE Journal*.
"SMPTE Journal Five-Year Index 1981-1985," *SMPTE Journal*, vol. 95, No. 1, Jan. 1986.
"SMPTE Journal Five-Year Index 1986-1990," *SMPTE Journal*, vol. 100, No. 1, Jan. 1991.
"Annual Index 1982," *SMPTE Journal*, vol. 91, Jan.-Dec. 1982, pp. 1253-1263.
"Highlights, SMPTE, The 124th SMPTE Conference," *SMPTE Journal*, Jan. 1983, p. 3.
*SMPTE Journal*, Jan. 1983, pp. 64, 69-70, 87-90, 92-98.
"Highlights, SMPTE," *SMPTE Journal*, Feb. 1983, p. 163.
"Highlights, SMPTE," *SMPTE Journal*, Mar. 1983, p. 267.
"Highlights, SMPTE," *SMPTE Journal*, Apr. 1983, p. 355.
Thomas, L. Merle, "Television," *SMPTE Journal*, Apr. 1983, pp. 407-410.
"Highlights, SMPTE," *SMPTE Journal*, May 1983, p. 547.
"Highlights, SMPTE," *SMPTE Journal*, Jun. 1983, p. 627.
"Highlights, SMPTE," *SMPTE Journal*, Jul. 1983, p. 715.
"Highlights, SMPTE," *SMPTE Journal*, Aug. 1983, p. 803.
Tooms, Michael S. et al., "The Evolution of a Comprehensive Computer Support System for the Television Operation," *SMPTE Journal*, Aug. 1983, pp. 824-833.
"Highlights, SMPTE," *SMPTE Journal*, Sep. 1983, p. 907.
"Highlights, SMPTE," *SMPTE Journal*, Oct. 1983, p. 1027.
"Highlights, SMPTE," *SMPTE Journal*, Nov. 1983, p. 1173.
"Highlights, SMPTE," *SMPTE Journal*, Dec. 1983, p. 1269.
"Index to Subjects—Jan.-Dec. 1983 • vol. 92," Annual Index 1983, *SMPTE Journal*, pp. 1385-1391.
"Highlights, SMPTE," *SMPTE Journal*, Jan. 1984, p. 3.
"Index to Subjects—Jan.-Dec., 1984 • vol. 93," Annual Index 1984, *SMPTE Journal*, pp. 1211-1217.
"Highlights, SMPTE," *SMPTE Journal*, Jan. 1985, p. 3.
Barlow, Michael W.S., "Application of Personal Computers in Engineering," *SMPTE Journal*, Jan. 1985, pp. 27-30.
"Television Systems and Broadcast Technology," *SMPTE Journal*, Jan. 1985, pp. 172-175.
"Highlights, SMPTE," *SMPTE Journal*, Feb. 1985, p. 181.
Day, Alexander G., "From Studio to Home—How Good is the Electronic Highway?", *SMPTE Journal*, Feb. 1985, pp. 216-217.
"Highlights, SMPTE," *SMPTE Journal*, Mar. 1985, p. 265.
"Proposed Smpte Recommended Practice, Storage of Edit Decision Lists on 8-in. Flexible Diskette Media," *SMPTE Journal*, Mar. 1985, pp. 353-354.
McCroskey, Donald C., "Television," *SMPTE Journal*, Apr. 1985, pp. 382-395.
"Highlights, SMPTE," *SMPTE Journal*, Apr. 1985, p. 361.
*SMPTE Journal*, Apr. 1985, pp. 366-368, 473-478.
"Highlights, SMPTE," *SMPTE Journal*, May 1985, p. 545.
Morii, Yutaka, et al., "A New Master Control System for NHKk's Local Stations," *SMPTE Journal*, May 1985, pp. 559-564.
Kuca, Jay, et al., "A Fifth-Generation Routing Switcher Control System," *SMPTE Journal*, May 1985, pp. 566-571.
"Highlights, SMPTE," *SMPTE Journal*, Jun. 1985, p. 641.
"Highlights, SMPTE," *SMPTE Journal*, Jul. 1985, p. 721.
Busby, E.S., "Digital Component Television Made Simple," *SMPTE Journal*, Jul. 1985, pp. 759-762.
"Highlights, SMPTE," *SMPTE Journal*, Aug. 1985, p. 801.
Rayner, Bruce, "High-Level Switcher Interface Improves Editing Techniques," *SMPTE Journal*, Aug. 1985, pp. 810-813.
Hayes, Donald R., "Vertical-Interval Encoding for the Recordable Laser Videodisc," *SMPTE Journal*, Aug. 1985, pp. 814-820.
"SMPTE Recommended Practice, Video Record Parameters for 1-in Type C Helical-Scan Video Tape Recording," *SMPTE Journal*, Aug. 1985, pp. 872-873.
"Proposed SMPTE Recommended Practice, Time and Control Codes for 24, 25, or 30 Frame-Per-Second Motion-Picture Systems," *SMPTE Journal*, Aug. 1985, pp. 874-876.
"Proposed SMPTE Recommended Practice, Data Tracks on Low-Dispersion Magnetic Coatings on 35-mm Motion-Picture Film," *SMPTE Journal*, Aug. 1985, pp. 877-878.
"Highlights," *SMPTE Journal*, Sep. 1985, p. 881.
"Proposed SMPTE Recommended Practice, Control Message Architecture," *SMPTE Journal*, Sep. 1985, pp. 990-991.
"Proposed SMPTE Recommended Practice, Tributary Interconnection," *SMPTE Journal*, Sep. 1985, pp. 992-995.
"Highlights," *SMPTE Journal*, Oct. 1985, p. 1001.
Zimmerman, Frank, "Hybrid Circuit Construction for Routing Switchers," *SMPTE Journal*, Oct. 1985, pp. 1015-1019.
"Highlights," *SMPTE Journal*, Nov. 1985, p. 1155.
Sabatier, J., et al., "The D2-MAC-Packet System for All Transmission Channels," *SMPTE Journal*, Nov. 1985, pp. 1173-1179.
"Highlights," *SMPTE Journal*, Dec. 1985, p. 1243.
Shiraishi, Yuma, "History of Home Videotape Recorder Development," *SMPTE Journal*, Dec. 1985, pp. 1257-1263.
"Index to Subjects—Jan.-Dec. 1985 • vol. 94," Annual Index 1985, *SMPTE Journal*, pp. 1351-1357.
"Highlights," *SMPTE Journal*, Jan. 1986, p. 3.
"Proposed American National Standard for component digital video recording—19-mm type D-1 cassette—tape cassette," *SMPTE Journal*, Mar. 1986, pp. 362-363.
"Index to SMPTE-Sponsored American National Standards and Society Recommended Practices and Engineering Guidelines," *SMPTE Journal*, Annual Index 1987, pp. 1258, 1260-1262.
Rice, Philip, et al, "Development of the First Optical Videodisc," *SMPTE Journal*, Mar. 1982, pp. 277-284.
Kubota, Yasuo, "The Videomelter," *SMPTE Journal*, vol. 87, Nov. 1978, pp. 753-754.
"USTV Direct Satellite to Home Television Service," General Instrument News Release, Aug. 1982.
"Second Senior Executive Conference on Productivity Improvement," SALT, Society for Applied Learning Technology, Dec. 4-6, 1986.
"New Publications for 1987 from The Videodisc Monitor," advertisement, 2 pages.
"The Videodisc Monitor," vol. IV: No. 10, Oct. 1986.
"The Videodisc Monitor," vol. IV: No. 12, Dec. 1986.
Smith, Charlles C., "Computer Update" "Program Notes," *TWA Ambassador*, Sep. 1982, pp. 74-90.
Harrar, George, "Opening Information Floodgates," *American Way*, Oct. 1982, pp. 53-56.
"Publishers Go Electronic," Business Week, Jun. 11, 1984, pp. 84-97.
"Serious Software Helps the Home Computer Grow Up," *Business Week*, Jun. 11, 1984, pp. 114-118.
"Videoconferencing: No Longer Just a Sideshow," *Business Week*, Nov. 12, 1984, pp. 116-120.
"Ratings War," *Forbes*, Aug. 1, 1983, 1 page.
Kindel, Stephen, "Pictures at an exhibition," *Forbes*, Aug. 1, 1983, pp. 137-139.
"Merrill Lynch and IBM Form Joint Venture To Market Financial Data Systems and Services," News Release, Mar. 1984, 2 pages.
Branch, Charles, "Text Over Video," *PC World*, Dec. 1983, pp. 202-210.
"Window on the World" "The Home Information Revolution," *Business Week*, Jun. 29, 1981, pp. 74-83.
"Correspondence School Via 1Computer Is Planned," *The New York Times*, Sep. 13, 1983, 1 page.
"'SMART' Digital TV Sets May Replace The Boob Tube," *Business Week*, Sep. 26, 1983, p. 162, 2 pages.
"Round Two For Home Computer Makers," *Business Week*, Sep. 19,1983, pp. 93-95.
"High Technology," *Business Week*, Jan. 11, 1982, pp. 74-79.
Kneale, Dennis, "Stations That Show Only Ads Attract a Lot of TV Street Wathcers," *The Wall Street Journal*, Sep. 23, 1982, 1 page.
"Video Kitchen" "Commercial Prospects For Food Data-Base Management," Prospectus for a Multiclient Study from American Information Exchange, 1982.
I/Net Corporation, Company Brochure.

Diamond, David, "Why Television's Business Programs Haven't Turned a Profit," *The New York Times*, Jun. 16, 1985, pp. F10-F11.
Tagliabue, John, "ITT's Key D8. West German Unit," *The New York Times*, Apr. 29, 1985, p. D8.
Tagliaferro, John, "Tag Lines," 1982, 1 page
"PBS Project With Merrill," newsarticle, Apr. 4, 1983.
"Merrill Lynch sinks $4M into FNN's Data Cast service," *Cable Vision*, Mar. 11, 1985, p. 23.
"Merrill Lynch bullish on new data service," *Electronic Media*, Feb. 28, 1985, p. 4.
"Merrill Lynch Plans Stock-Quote Service Linked to IBM's PC," *The Wall Street Journal*, Mar. 21, 1984, p. 60.
Sanger, David E., "Public TV Joins Venture to Send Finance Data to Computer Users," *The New York Times*, Feb. 21, 1985, pp. 1 and D8.
Dolnick, Edward, "Inventing The Future," *The New York Times Magazine*, Aug. 23, 1987.
"Everything you've always wanted to know about TV Ratings," A.C. Nielsen Company, brochure, 1978.
"Management With The Nielsen Retail Index System," A.C. Nielsen Company, 1980.
Pollack, Andrew, "Computer Programs as University Teachers," *The New York Times*, 4 pages.
"Business Television" "Changing the Way America Does Business," PSN, 1986.
Merrell, Richard G., "TAC-Timer," *1986 NCTA Technical Papers*, 1986, pp. 203-206.
"Universal Remote Control," Radio Shack, Owner's Manual, 4 pages.
Long, Michael, E., "The VCR Interface," *1986 NCTA Technical Papers*, 1986, pp. 197-202.
"Flexible programmieren mit VPS," *Funkschau*, (German publication), 1985. (translation provided).
Chase, Scott, "Corporate Satellite Networks No Longer A Luxury But Rather A Necessity," *Via Satellite*, Jul. 1987, pp. 18-21.
Diamond, Sam, "Turning Television Into A Business Tool," *High Technology*, Apr. 1987, 2 pages.
"The Portable PLUS Personal Computer," Hewlett-Packard, advertisement, Mar. 1986.
"The Portable PLUS for Professionals In Motion," Hewlett-Packard, advertisement, Jul. 1985.
"KBTV Kodak Business TeleVision," Kodak, brochure, Sep. 1987.
"Broadway Video," Brochure, Feb. 1987.
"Digital TV set to burst on U.S. mart," *New York Post*, 2 pages.
Prospectus, Vikonics, Inc., Jul. 14, 1987.
Prospectus, Digitext, Inc., Feb. 27, 1986.
Prospectus, Color Systems Technology, Inc., Aug. 13, 1986.
Prospectus, Cheyenne Software, Inc., Oct. 3, 1985.
1986 Annual Report, The Allen Group Inc.
Wilson, Donald H., "A Process For Creating A National Legal Computer Research Service In The United States," remarks at the conference on *World Peace Through World Law* and *World Assembly of Judges*, Belgrade, Yugoslavia, Jul. 23, 1971.
Pollack, Andrew, "Teletext is Ready for Debut," *The New York Times*, Feb. 18, 1983, 2 pages.
"Sunny Outlook for Landmark's John Wynne; Landmark Communications Inc.," *Broadcasting*, Lexis-Nexis, Jul. 27, 1987.
"Applications Information VCR-3001A Universal Videocassette Control Module," Channelmatic, Inc., product description, 5 pages, Mar. 1984.
Killion, Bill, "Advertising," *SAT Guide*, Jul. 1982.
"PL-5A Price List Typical Systems," Channelmatic, Inc., Nov. 1984.
"Channelmatic SPOTMATIC Random Access Commercial Insert System," Channelmatic, Inc., product description, Jul. 1983.
Killion, Bill, "Automatic Commercial Insertion Equipment For The Unattended Insertion of Local Advertising," paper presented at 33rd Annual National Cable Television Association Convention, Jun. 1984.
"Channelmatic SDA-1A Sync Stripping Pulse Distribution Amplifier," Channelmatic, Inc., product description, 1 page.
"Broadcast Quality Random Access Commercial Insert System Featuring the Channelmatic SPOTMATIC Z," Channelmatic, Inc., product description, 1 page.
"Audio Level Detector ALD-3000A," Channelmatic, Inc., product description, Mar. 1984, 1 page.
"CVS-3000A Commercial Verification System," Channelmatic, Inc., product description, Mar. 1984,1 page.
"Four-Channel Commercial Insert System Featuring the Channelmatic CIS-1A SPOMATIC Jr," Channelmatic, Inc., product description, 1 page.
"Local Program Playback System Featuring the Channelmatic VCR-3005A-5 Videocassette Sequencer," Channelmatic, Inc., product description, 1 page.
"Channelmatic BBX-1A Billibox Bypass and Test Switcher," Channelmatic, Inc., product description, 2 pages.
"Channelmatic's Handimod I," Channelmatic, Inc., product description, 2 pages.
"SPOTMATIC Jr. Single VCR Commercial Insert System," Channelmatic, Inc., product description, 4 pages.
"PL-1A Price List, 3000 Series Equipment," Channelmatic, Inc., Feb. 1985, 2 pages.
"PL-2B 1000 Series Price List, 1.75×19 Inch Rack Mounting," Channelmatic, Inc., Jul. 1985.
"VPD-3001A Signal Presence Detector," Channelmatic, Inc., product description, Mar. 1984, 1 page.
"Channelmatic CMG-3008A 8-Page Color Message Generator Module," Channelmatic, Inc., product description, 1 page.
"Tone Switching System Model TSSs-3000A-1," Channelmatic, Inc., product description, 1 page.
"Series 3000 Satellite Receiver Controllers," Channelmatic, Inc., product description, 2 pages.
"Channelmatic UAA-6A Universal Audio Amplifier," Channelmatic, Inc., product description, 1 page.
"Channelmatic ADA-3006A Audio Distribution Amplifier," Channelmatic, Inc., product description, 1 page.
"Channelmatic ADA-1A, ADA-2A, ADA-3A Audio Distribution Amplifier," Channelmatic, Inc., product description, 1 pages.
"Channelmatic VDA-3006A Video Distribution Amplifier," Channelmatic, Inc., product description, 1 page.
"Channelmatic VDA-1A, VDA-2A, VDA-3A Video Distribution Amplifier," Channelmatic, Inc., product description, 1 page.
"Channelmatic AVS-10A Patchmaster," Channelmatic, Inc., product description, 2 pages.
"Broadcast Break Sequencer Model BBS-3006A," Channelmatic, Inc., product description, Mar. 1984, 1 page.
"Audio-Video Emergency Alert System," Channelmatic, Inc., product description, Mar. 1984, 2 pages.
"VCR Automation System LPS-3000A," Channelmatic, Inc., product description, Mar. 1984, 2 pages.
"Clock Switching System Model CCS-3000A-1," Channelmatic, Inc., product description, Mar. 1984, 1 page.
"Channelmatic PCM-3000A Superclock Programmable Controller Module," Channelmatic, Inc., product description, 2 pages.
"PL-3A Price List Videocassette Changers," Channelmatic, Inc., Nov. 1984, 1 page.
Channelmatic, Inc., advertisement, "Looking at Local Ad Sales?", 1 page.
"Channelmatic Television Switching and Control Equipment 3000 Series," Channelmatic, Inc., product descriptions, 1984.
"CIS-1A Spotmatic Jr. & CIS-2A Li'L Moneymaker," Channelmatic, Inc., Installation and Operations Guide, 950-0066-00, V1.0.
"1986 Annual Report to Shareowners, Customers and Employees," The Dun & Bradstreet Corporation.
Landro, Laura, "CBS, AT&T May Start Videotex Business In '83 if 7-Month Home Test Is Successful," *The Wall Street Journal*, Sep. 28, 1982, p. 8.
"Video Visionaries," *Review*, Sep. 1982, pp. 95-103.
"Video-Game Boom Continues Despite Computer Price War," Technology, *The Wall Street Journal*, Oct. 1, 1982, p. 33.
Dunn, Donald H., editor, "How to Pick Your Stocks by Computer," Personal Business, *Business Week*, Sep. 12, 1983, pp. 121-122.
Sandberg-Diment, Erik, "Instruction Without Inspiration," Personal Computers, *The New York Times*, Sep. 6, 1983, p. C4.
Pace, Eric, "Videotex: Luring Advertisers," *Tthe New York Times*, Oct. 14, 1982.

"Will Knight-Ridder Make News With Videotex?", Media, *Business Wee*, Aug. 8, 1983, pp. 59-60.
Kneale, Dennis, et al., "Merrill Lynch and IBM Unveil Venture To Deliver Stock-Quote Data to IBM PCs," *The Wall Street Journal*, Mar. 22, 1984, p. 8.
"Merrill Lynch Joins I.B.M. in Venture, " *The New York Times*, Mar. 22, 1984, 1 page.
Kneale, Dennis, "Merrill Lynch Plans Stock-Quote Service Linked to I.B.M.'s PC," *The Wall Street Journal*, Mar. 21, 1984, 1 page.
"A Videotex Pioneer Pushes Into The U.S. Market," *Business Week*, Apr. 16, 1984, p. 63.
Gregg, Gail, "The Boom In On-Line Information," New Businesses, *Venture*, Mar. 1984, pp. 98-102.
Sanger, David E., "Trading Stock By Computer," Technology, *The New York Times*, Mar. 29, 1984, 1 page.
Saddler, Jeanne et al., "COMSAT, Citing Risks, Ends Negotiations With Prudential on Satellite—TV Venture," *The Wall Street Journal*, Dec. 3, 1984, p. 51.
Pollack, Andrew, "Electronic Almanacs Are There for the Asking," *The New York Times*, Mar. 18, 1984, 1 page.
Connelly, Mike, "Knight-Ridder's Cutbacks at Viewtron Show Videotex Revolution is Faltering," *The Wall Street Journal*, Nov. 2, 1984, p. 42.
"Time Inc. May Drop Teletext," newspaper article, 1 page.
Pollack, Andrew, "Time Inc. Drops Teletext Experiment," newspaper article, 1 page.
Arenson, Karen W., "CBS, I.B.M., Sears Join in Videotex Venture," newspaper article, 1 page.
"E.F. Hutton to Start A Videotex Service," newspaper article, 1 page.
Dunn, Donald H., editor, "Devices That Let You Track Stocks Like A Floor Trader," Personal Business, *Business Week*, Jul. 25, 1983, pp. 83-84.
"United Satellite Racing Competitors," newspaper article, 1 page.
Fantel, Hans, "Videotex to Expand What a TV Can Do," article, 1 page.
"Zenith and Taft Co. In Teletext Venture," *The New York Times*, p. D3.
Pollack, Andrew, "Videodisk's Data Future," *The New York Times*, Oct. 7, 1982, p. D2.
Pace, Eric, "Videotex In Years To Come," Advertising, *The New York Times*, Sep. 1, 1982, p. D15.
Middleton, Teresa, "The Education Utility," *American Educator*, Winter 1986, pp. 18-25.
Perlez, Jane, "Teachers Act to Increase Decision-Making Power," *The New York Times*, Jul. 8, 1986, 1 page.
Couzens, Michael, "Invasion of the People Meters," *Channels*, Jun. 1986, pp. 40-45.
Behrens, Steve, "*People Meters* vs. *The Gold Standard*," *Channels*, p. 72, Sep. 1987.
Diamond, Edwin, "Attack of the People Meters," *New York*, pp. 38-41, Aug. 24, 1987.
"Ratings Brawl (Is Nielsen losing its grip?)" *Time*, p. 57, Jul. 20, 1987.
Sheets, Kenneth R., "No go. TV networks nix new high-tech rating system," *U.S. News & World Report*, p. 39, Jul. 20, 1987.
Lieberman, David, "The Networks' Big Headache," *Business Week*, pp. 26-28, Jul. 6, 1987.
Barbieri, Rich, "Perfecting the Body Count," *Channels*, p. 15, Jun. 1987.
Dumaine, Brian, "Who's Gypping Whom in TV Ads?", *Fortune*, pp. 78-79, Jul. 6, 1987.
Behrens, Steve, "People Meters' Upside," *Channels*, p. 19, May 1987.
"People Meters," *The New Yorker*, pp. 24-25, Mar. 2, 1987.
Zoglin, Richard, "Peering Back at the Viewer," *Time*, p. 84, Jun. 30, 1986.
Kanner, Bernice, "Now, People Meters," *New York*, 3 pages, May 19, 1986.
Trachtenberg, Jeffrey A., "Anybody home out there?", *Forbes*, pp. 169-170, May 19, 1986.
Waters, Harry F. et al., "Tuning in on the Viewer," *Newsweek*, p. 68, Mar. 4, 1985.
Berss, Marcia, "Tune in," *Forbes*, p. 227, Sep. 24, 1984.
"Financial News Network Eyeing Teletext Service Tied To Home Computers," *International Videotex Teletext News*, Dec. 1983, 1 page.
Prospectus, Financial News Network, Inc., Jul 13, 1982.
"ELRA Group Cablemark Reports vol. I," *SAT Guide*, Feb. 1982, 1 page.
"DOWALERT," Brochure, 1983, 6 pages.
New York Stock Exchange, Inc., Computer Input Services, Schedule of Monthly Charges, Aug. 1, 1981, 1 page.
New York Stock Exchange, Inc., Market Data Services, Schedule of Monthly Charges, Jan. 1, 1982, 1 page.
"Introducing DowAlert," brochure, 1982, 8 pages.
"Dow Jones Cable Information Services," Company Brochure, 1982.
"Personal Portfolio Button," brochure, JS&A, 1982.
"Business news breakthrough from Dow Jones," advertisement, *The Wall Street Journal*, Jun. 10, 1982, p. 47.
"Charting a More Profitable Course For Your Portfolio?", advertisement, Dow Jones News/Retrieval, *The Wall Street Journal*, Jun. 24,1982, p. 40.
"Now you can get the precise business and financial news you want . . . throughout the business day." "Dow Alert," brochure, 1982.
Promotional letter, "Dow Jones Cable News," Dow Jones & Company, Inc., Jan. 1, 1982, 2 pages.
"1981 Annual Report," Quotron Systems, Inc.
Prospectus, Quotron Systems, Inc., Nov. 1982.
"Threat to Quotron Discounted," *The New York Times*, 1984, 2 pages.
"Quotron's Central Position in Statistics Service Is Facing Competition From Several Challengers," *The Wall Street Journal*, Feb. 2, 1984, p. 59.
"European Security Prices Are Now Available As New Service From Quotron Systems," News Release, Sep. 21, 1984, 1 page.
"1983 Annual Report," Quotron Systems, Inc.
"The Revolution Continues . . . ", Regency Systems, Inc., company brochure, 1984, 6 pages.
"How personal computers can backfire," *Business Week*, Jul. 12, 1982, pp. 56-59.
"Taking control of computer spending," *Business Week*, Jul. 12, 1982, pp. 59-60.
Meserve, Everett T., "A History of Rabbits," *Datamation*, pp. 188-192.
Meserve, Everett T. (Bill), 136. "The Future of Rabbits," *Datamation*, Jan. 1982, pp. 130-136.
PC Ideas International Corp., product catalog, 7 pages, 1985.
UltiTech, Inc., "The Portable Interactive Videodisc System 3," brochure, 1985.
Sony Video Communications, "LDP-1000A Laser Videodisc Player," product description, 1983, 2 pages.
TMS Inc., Digital Laser Technology, product information, 1984, 16 pages.
Sony Video Communications, "Videodisc, Premastering and Formatting," brochure, 1982.
Pioneer Video, Inc., "LD-V4000 Industrial Laserdisc Player," product description, Feb. 1984, 2 pages.
Pioneer Video, Inc., "LD-V6000 Industrial Laserdisc Player," product description, May 1985, 2 pages.
Pioneer Video, Inc., "LD-V6000 Industrial Laserdisc Player," products price list, Apr. 1984, 1 page.
Pioneer Video, Inc., "Customer Support Publications," 2 pages.
Pioneer Video, Inc., "Pioneer LD-V1000 Laserdisc Player," price list, Feb. 1984, 1 page.
Pioneer Video, Inc., "LD-V1000 Laserdisc Player," product description, Feb. 1985, 2 pages.
Pioneer Video, Inc., "LD-V4000 Laserdisc Player," products price list, Dec. 1983, 1 page.
"Space-Age Navigation for the Family Car," reprinted from *Business Week*, Jun. 18,1984, 2 pages.
Held, Thomas et al., "Videodisc to Lure and to Learn," reprinted from *The Journal of the International Television Association*, International Television, May 1984, 4 pages.
Sony, "Sony View System, The Intelligent Video System," product description, 1985, 2 pages.
Sony, "LDP-2000 Series, VideoDisc Players," brochure, 1985, 12 pages.

Digital, "Vax Producer, A System for Creating Interactive Applications," product bulletin, May 1984, 8 pages.
"LASERDATA Announces Trio Encoder at the SALT Show," News release, Aug. 21, 1985, 3 pages.
"LASERDATA Still Frame Audio Premastering Guide," advertisement, 3 pages.
"LASERDATA Trio Encoder Product Description," product description, 4 pages.
"PC Trio," LASERDATA, product description, 2 pages.
LASERDATA, price list, Aug. 1, 1985, 4 pages.
News Release, Industrial Training Corporation, Merger of IIAT with and into ITC, Jun. 11, 1985, 1 page.
"A Touch-Screen Disc (Devlin Interviews the Producer)," reprinted from E&ITV magazine, vol. 16, No. 5, May 1984, 4 pages.
"Interactive Videodisc in Education and Training," Seventh Annual Conference, Society for Applied Learning Technology, conference agenda, Aug. 1985.
"Inter Active Video from . . . ," BCD Associates, brochure, 1985.
*The Videodisc Monitor*, vol. II: No. 8, Aug. 1984, 16 pages.
"Products From The VideoDisc Monitor," order form, 2 pages.
"Interactive Video Served on a disc," Scotch Laser Videodisc, 3M, brochure, 8 pages.
Scotch Laser Videodisc, Price List, May 1,1984, 2 pages.
"How to find the pot of gold at the end of this rainbow," Scotch Videodisc, 3M, brochure.
Scotch Laser Videodisc, Prices for Special Services, Feb. 15, 1984, 2 pages.
Scotch Laser Videodisc, Master Tape Specifications, May 1984, 2 pages.
"IEV Graphics and Interactive Video Products," IEV Corporation, product information, 1 page.
"IEV-20 High-Resolution Color Graphics for the IBM-PC," IEV Corporation, product description, 1 page.
"IEV-40 Graphics Overlay and Video Disc and Tape Control For The IBM-PC," IEV Corporation, product description, 1 page.
"IEV-10 A Direct Replacement for the IBM Color/Graphics Adapter Card with Video Overlay Capability," IEV Corporation, product description, 1 page.
"Model 60 Graphics Overlay and Disc or Tape Controller," IEV Corporation, product description, 1 page.
"The IRIS System," Silicon Graphics, Inc., product brochure, 1983.
"IRIS 1400, High Performance Geometry Computer," Silicon Graphics, Inc., product specification, 2 pages.
"IRIS 1000/1200, High Performance Geometry Terminals," Silicon Graphics, Inc., product specification, 2 pages.
"IRIS 1500, High Performance Geometry Computer," Silicon Graphics, Inc., product specification, 2 pages.
"The IRIS Graphics System," Silicon Graphics, Inc., system description, 1983, 6 pages.
"UNIX, Operating System for the IRIS Geometry Computer," Silicon Graphics, Inc., product specification, 1 page.
"IRIS Graphics Library, Programming Support for IRIS Systems," Silicon Graphics, Inc., product specification, 1 page.
"ETHERNET, 10mbit per second Local Area Network," Silicon Graphics, Inc., product specification, 2 pages.
Sony, SONY Video Communications, "PVM-1910/PVM-1911 19" Trinitron Color Video Monitors, product brochure, 1984, 8 pages.
"Computer Controls for Video Production," EECO Eecoder Still-Frame Decoder VAC-300, product brochure, 1984, 4 pages.
O'Donnell, John et al., "Videodisc Program Production Manual," SONY, 1981.
"Still Frame Audio Encoder," LASERDATA, product description, 2 pages.
"TRIO 110," LASERDATA, product description, 2 pages.
"LD-V6000, Industrial Laserdisc Player," A Technical Perspective, Pioneer Video, Inc., May 1984.
"SWSD System," Stills With Sound and Data, Pioneer Video, Inc., product description, Aug. 1984, 2 pages.
Pioneer Video, Inc., Price List, Industrial Disc Replication and Program Development Services, May 1984, 4 pages.
"V: Link 1000," Visage, Inc., product description, 1984, 2 pages.
"The University of Delaware Videodisc Music Series presents Interactive Videodisc Instruction in Music," advertisement, 8 pages.
"Interactive Videodisc in Education and Training," Sixth Annual Conference, Society for Applied Learning Technology, conference agenda, Aug. 1984, 2 pages.
"Sony engineering introduces to industry the new Sony Laser VideoDisc," Sony Video Communications, product brochure, 12 pages.
"GraphOver 9500," Hi-Res Graphics Overlays for NTSC Video, New Media Graphics, product description, 1983, 4 pages.
"New Horizons in Interactive Video," Puffin product advertisement, IEV Corporation, 2 pages.
IEV Feb. 1985 Price List, 1 page.
"Fast Forth" "No Other Forth Comes Close," IEV Corporation, product brochure.
"Pro 68 Advanced Technology 16/32 Bit Co-Processor for IBM PC, PC/XT PC/AT and Capatibles," Hallock Systems Company, Inc., product description, 7 pages.
"Pro 68 Software Facts," Hallock Systems Company, Inc., product description, 6 pages.
"Pro CAD A Pro 68 Software Product," Hallock Systems Company, Inc., product description, 4 pages.
"V: Station 2000 System," Visage, Inc., product description, 2 pages.
"Upgrade Packages," Visage, Inc., product description, 1 pages.
"Development Software," Visage, Inc., product description, 4 pages.
"V: Link Modules," Visage, Inc., product description, 4 pages.
Visage, Price List, Visage, Inc., Apr. 1985, 4 pages.
Kalowski, Nathan, "Player, Monitor, Interface," reprinted from Jan. 1985 issue of *Data Training*, 4 pages.
"Five Authoring Languages Now Available For Use With Visage Interactive Video Systems," Visage News Release, Visage, Inc., Mar. 18, 1985, 5 pages.
"GraphOver 9500," Hi-Res Hi-Speed Graphics Overlays For Videodisc, New Media Graphics, product description, 1985, 4 pages.
"PC-VideoGraph," Hi-Res PC Graphics For Videotaping or Display, New Media Graphics, product description, 1985, 4 pages.
"PC-GraphOver," Interactive Video With Graphics Overlays, New Media Graphics, product description, 1985, 4 pages.
"Off-the-shelf raster scan display generator creates composite video image," reprinted by *Defense Systems Review and Military Communications*, Jan. 1985, p. 55.
"The NTN Entertainment Network," NTN Entertainment Network, programming information sheet, 2 pages.
Dickey, Glenn, "A Game That's Better Than The Real Thing," *San Francisco Chronicle*, Dec. 17, 1985, p. 63.
Connell, Steve, "Arm-Chair Quarterbacking (Computer football game makes fans the play-callers)," *The Sacramento Union*, Jan. 23, 1986, 3 pages.
Gunn, William, "Get Ready For Monday Night Football," *Night Club and Bar*, Jul. 1986, pp. 20-22.
Brack, Fred, "QB1 Anyone?", *Alaska Airlines*, Aug. 1986, 2 pages.
Dickey, Glenn, "QB1: Bringing The Game Into The Bar," *Sport Magazine*, Oct. 1986, 1 page.
"The Most Exciting Customer and Revenue Building Program Since Sports were First Shown on T.V.", NTN Communications, Inc., QB1 product brochure, 1986, 4 pages.
"NTN—The Company," NTN Communications, Inc., company description, 1 page.
NTN Communications, Inc., "Trivia Countdown," and "Trivia Showdown," product descriptions, 1 page.
Pottle, Jack T. et al., "The Impact of Competitive Distribution Technologies on Cable Television," Report, prepared for the National Cable Television Association, Mar. 1982.
"Consumer Electronics: A $40-Billion American Industry," a report prepared by Arthur D. Little, Inc. for the Electronic Industries Association/Consumer Electronics Group, Apr. 1985.
"Times Mirror Videotex/Infomart Joint Venture," *Times Mirror*, Background, Jan. 8, 1982, 3 pages.
Cable Advertising Conference Feb. 9, 1982, conference agenda, Cabletelevision Advertising Bureau, Inc., 6 pages.
True Stereo Television, Series 1600 Warner-Amex Stereo Processers, Wegener Communications, Inc., product description, 1982, 3 pages.
"EUROM—a single-chip c.r.t. controller for videotex," Mullard, Technical publication, 1984, 12 pages.

"EUROM" "A display IC for CEPT Videotex," Mullard, product information, Feb. 1984, 6 pages.
"Satellite-Delivered Text Service Signs 4 Carriers," Multichannel News, Jun. 18, 1984, p. 18.
Aarsteinsen, Barbara, "How the Chip Spurs TV Growth," "The promise of digital television has stirred the U.S. Industry," *The New York Times*, May 20, 1984, 1 page.
Pollack, Andrew, "As Usual, Here Come The Japanese," *The New York Times*, May 20, 1984, 1 page.
"Unleashing IBM Could Help A Satellite Venture Blast Off," *Business Week*, May 28, 1984, 2 pages.
Mayer, Martin, "Here comes Ku-band," *Forbes*, May 21, 1984, pp. 65-72.
"The UCSD p-System Version IV," SOFTECH Microsystems, product description, 2 pages.
"UCSD p-System Languages, Version IV UCSD Pascal, FORTRAN-77, Basic and Assembler," SOFTECH Microsystems, product description, 2 pages.
"Add-On Features, UCSD p-System Version IV," SOFTECH Microsystems, product description, 2 pages.
"USCD p-System, Version IV.1," SOFTECH Microsystems, product description, 4 pages.
SOFTECH Microsystems, Product Order Form, Oct. 1982, 2 pages.
"HOMECAST, A Consumer Market Service from ICM Services," Chase Econometrics, product brochure, 2 pages.
"Consumer Systems Industry Service," research notes, Gartner Group, Inc., Jun. 22, 1983, 13 pages.
*Download*, Monthly Newsletter, vol. 1, No. 1, May 1984.
Nocera, Joseph, "Death of a Computer," *Texas Monthly*, Apr. 1984.
Special Report, *Business Week*, Jul. 16, 1984, pp. 84-111.
Zenith, Video Hi-Tech Component TV, product brochure, Aug. 1982, 8 pages.
Ferretti, Fred, "For Major-League Addicts, A Way to Win a Pennant," *The New York Times*, Jul. 8, 1980, 1 page.
Friedman, Jack, "The Most Peppery Game Since The Hot Stove League? It's Rotisserie Baseball," *People weekly*, Apr. 23, 1984, 2 pages.
"Information Package For MDS Applicants," Department of Communications Radio Frequency Management Division, Oct. 1986.
Department of Transport and Communications Radio Frequency Management Division, Licensing Procedures for Ancillary Communications Services (ACS).
Minister for Communications Guidelines for Provision of Video and Audio Entertainment and Information Services, Oct. 13, 1986.
Christopher, Maurine, "BAR cable service set," *Advertising Age*, Sep. 21, 1981, pp. 68 & 72.
"In this corner, Digisonics!", *Media Decisions*, Jun. 1968, 5 pages.
"Did the ad run?", *Media Decisions*, Jul. 1969, pp. 44 et seq.
"Digisonics TV Monitor System Finds Defenders," *Advertising Age*, Dec. 8, 1969, 1 page.
"Merrill Lynch Advanced Applications Systems," Advanced Automation Systems Department, system description, publication date unknown.
Dougherty, Philip, "Gathering Intelligence For Profit," newspaper article, 1981, p. D7.
"Vidbits," *Advertising Age*, Sep. 21, 1981, p. 70.
Cooney, John E., "Counting Cable's Gold Coins," *View*, Sep. 1981, 4 pages.
"IDC begins monitoring," At Deadline, *Broadcasting*, Sep. 14, 1970, p. 9.
"Contraband code," Closed Circuit, *Broadcasting*, Sep. 28, 1970, 1 page.
"Listeners," Closed Circuit, *Broadcasting*, 1 page.
"Digisonics violated standards, says BAR," *Broadcasting*, Oct. 5, 1970, pp. 21-23.
"Talent pay code put off," At Deadline, *Broadcasting*, Nov. 9, 1970, p. 9.
"Digisonics' Aim Is Info Bank, Not Just Proof of Performance," *Advertising Age*, Nov. 9, 1970, 4 pages.
"Digisonics pushes its coding method," *Broadcasting*, Dec. 7, 1970, p. 37.
"No Digisonics friends show in comments," *Broadcasting*, May 24, 1971, p. 62.
"Digisonics' dilemma," *Media Decisions*, Jun. 1971, 6 pages.
"IDC encoding system still alive at FCC," *Broadcasting*, Sep. 27, 1971, p. 31.
Howard, Niles A., "IDC drops tv monitoring; mulls revival," reprint from *Advertising Age*, Feb. 3, 1975, 1 page.
"TELEPROOF I" "An Exciting New Development Of International Digisonics Corporation," product brochure, 13 pages.
"TELEPROOF 2," IDC Services, Inc., product description, 6 pages.
"The Best Reason To Buy Odetics On-Air Automation Systems Today?" Advertisement, Odetics Broadcast, 1 page.
"Advertising on Cable" "Automatic Commercial Insertion-Plus-Automatic Print-Out Verification With the New Ad Machine and Ad Log," Advertisement, Tele-Engineering Corporation, 4 pages.
"NTN Communications, Inc. Entertainment Network Program Schedule," Advertisement, NTN Communications, Inc., 2 pages.
"Interactive Football For The Home," Advertisement, U.S. Videotel, 2 pages.
"NTN Programming," Advertisement, NTN Communications, Inc., 2 pages.
"Electronic Surveys, Inc. Signs NTN Contract," News Release, NTN Communications, Inc. Carlsbad, CA, 2 pages.
Andrews, Edmund L., "AT&T Sees the Future in Games," *The New York Times*, Business Day, 2 pages.
"Total Teleconferencing Solutions For Your Communication and Training Needs," brochure, Parker Communications Corporation, Parker Associates.
"PSN Signs Fourth High Technology Customer As Amdahl Corporation Implements Business Television," PSN News, News Release, Private Satellite Network, Inc., 2 pages.
PSN, Private Satellite Network, Inc., product information for MISTS, Mass Interactive Simultaneous Telecommunications System, 6 pages.
"Broadcasting Services," brochure, PSN, Private Satellite Network, Inc., 6 pages.
Martin, Vivian B., "Companies use TV talk shows to inform workers," *The Hartford Journal*, Business Weekly, 1 page.
Fisher, Lawrence M., "TV: Growing Corporate Tool," *The New York Times*, 2 pages.
Vaughan, Kimithy, "Evolution of Corporate Television Networks," *Teleconference*, The Business Communication Magazine, pp. 38-40.
"New in Teleconferencing Resources," advertisement, Parker Associates, 4 pages.
"Business Television Services," Irwin Communications, Inc., brochure, 1 page.
"Corporate Capabilities," Irwin Communications, Inc., brochure, 1 page.
"Introducing RSVP: The latest breakthrough for cable!", advertisement, Arbitron, 1 page.
"Viacom Unit Will Tap Into Pay Networks," newspaper article, 1 page.
"Show or Tell?", Advertising material, The Weather Star 4000, The Weather Channel, 8 pages.
"Video Hi-Tech Component TV," CV 1950, CV 510, CV 540, CV 520, CV 150,advertisement, Zenith Radio Corporation, 4 pages.
"Point-To-Multipoint Data Communication Network Services," product description, Equatorial Communications Company, 5 pages.
"C-100 Series Micro Earth Stations for Satellite Data Distribution," product description, Equatorial Communications Company, 4 pages.
"C-200 Micro Earth Station for Satellite Data Communications," product description, Equatorial Communications Company, 3 pages.
"Interactive Data Communication Network Services," product description, Equatorial Communications Company, 3 pages.
"Data Communications Network Description," product description, Equatorial Communications Company, 5 pages.
Landro, Laura, "Satellite Company Signs Merrill Lynch For Its Video Service," *The Wall Street Journal*, 1 page.
"ELITE 2000 Creation System," IBM Compatible Information Display System, advertisement, Display Systems International, Inc., 1 page.
"Video Database Management . . . When Words Are Not Enough," advertisement, U.S. Video, 2 pages.
"U.S. Video presents . . . True Computer-Video Overlays," The Raster Master RM-110, product description, U.S. Video, 2 pages.

"Now You Can Find Just The Right Image Every Time Quickly and Easily with Image Search and The IBM PC/XT," advertisement, Online Computer Systems, Inc., 1 page.
"Touch the Future Today," advertisement, MetaMedia Systems, Inc., 1 page.
"Training solutions for the 80's and beyond," advertisement, Online Computer Systems, Inc., 2 pages.
"Experienced Educator/Trainers," "Use the new PILOT plus Training System to develop highly interactive courseware on your IBM PC that will run on most microcomputers," advertisement, Online Computer Systems, Inc., 2 pages.
"Technical Specifications For Hardware And Software Products," Online Products Corporation, 9 pages.
"Museum Image Series," product information, Online Products Corporation, 2 pages.
"Omega Vision," product description, Omega Management Group Corp., 2 pages.
"VISAGE Visual Information Systems," Interactive Video Products, brochure, Visage, Inc.
"Now The Future is Clear," Visage Visual Information Systems, brochure, Visage, Inc., 4 pages.
"Speak Through The Power of Today's Technology," Quest, product description, Allen Communication, 4 pages.
"Universal Video Controller," product description, Allen Communication, 2 pages.
"Video-Microcomputer Interface," product description, Allen Communication, 2 pages.
"The Leader in Interactive Video," advertisement, Allen Communication, 2 pages.
"Allen Communication Price List," Allen Communication, 1 page.
"Touché Interactive videodisc training by IIAT," advertisement, IIAT, International Institute of Applied Technology, Inc., 1 page.
"Touché Interactive Videodisc System," product description, IIAT, International Institute of Applied Technology, Inc., 2 ppages.
"IIAT ST-1000A IIAT Training Station," product description, IIAT, International Institute of Applied Technology, Inc., 2 pages.
"IIAT ST-1000B IIAT Training Station," product description, IIAT, International Institute of Applied Technology, Inc., 2 pages.
"IIAT International Institute of Applied Technology, Inc.," company description, 4 pages.
"PILOT plus Course Authoring Interpreter," IIAT Products, product description, 1 page.
"Touch Monitor/Videodisc Player Interface Card and Video Switch Box," IIAT Products, product description, 1 page.
"Touch Sensitive Monitor Interface Card for Apple II," IIAT Products, product description, 1 page.
"Touchpoint, A Total Eclipse of Existing Technology," product description, Allen Communication, 2 pages.
"Totally Integrated Interactive System—TII-PC," product description, Allen Communication, 2 pages.
"Most Valuable Peripheral," product description, Allen Communication, 2 pages.
"Allen Communication Introduces Integrated Interactive Video Systems," brochure, 2 pages.
"Automation, Control and Monitoring Systems," brochure, Jasmin Electronics Limited.
"Jasmin," company brochure, Jasmin Electronics Limited, 4 pages.
"Jasmin Teletext Systems," advertisement, Jasmin Electronics Limited, 4 pages.
"Jasmin Process Control Systems," advertisement, Jasmin Electronics Limited, 4 pages.
"Teleprompter of Denver Channel Line Up," 2 pages.
"City of Seal Beach Channel Utilization Guide," 3 pages.
"V: Link 1910: the Single-Slot VGA Interactive Video Solution," product description, Visage, Inc., 4 pages.
"The OASYS Authoring System," advertisement, Online Computer Systems, Inc., 1 pages.
"Advertisers Guide to Cable TV Terms," brochure, Cable Ad Associates, Inc.
"Cable Audience Measurement Study," A Prospectus based upon recommendations of the Ad Hoc Cable Measurement Committee, pamphlet.
Kane, Sharyn et al., "Technology in the First Person," reprint from Delta Air Lines' SKY magazine, 4 pages.
"Training Systems," brochure, WICAT systems, Training Systems Division, 4 pages.
"The Consultant," advertisement, Co-Opportunities, Sales Development Information Systems, a division of Jefferson-Pilot Communications Company.
"Introducing Spot Data," "Cable Ad Sales Just Got Better," advertisement, TV Data Technologies, 4 pages.
"Do You Want to be Making $5-$10 a Subscriber—Right Now?" "Join Us in Our Success!", advertisement, Multi-Image Systems, 1 page.
"Mediastar," "The message is clear," brochure, Multi-Image Systems, 6 pages.
"Art to Go" "The Business Builder in a Box," advertisement, Multi-Image Systems, 1 page.
"Few Things in Life Work As Well As TAPSCAN," advertisement, TASCAN Incorporated, 6 pages.
"Dow Jones Cable News Service Daily Features Financial Markets," product summary, 1 page.
"Financial News Network The Business Connection," brochure, Financial News Network, 8 pages.
"The Financial News Network Means Business," advertisement, The Financial News Network, 1 page.
"The Dawn of a New Era in Financial News Broadcasting," advertisement, Financial News Network, 1 page.
"FNN Financial News Network," advertisement, brief review of research from the Stanford Research Institute's VALS study, and research from ELRA Group Cablemark Reports vol. I, 4 pages.
"Industrial Skills Training With The Touch of a Finger . . . Introducing . . . Activ," Advanced Concepts in Touch-Interactive Video, advertisement, Industrial Training Corporation, 4 pages.
"Eca," brochure, Effective Communication Arts, Inc., 4 pages.
"ODC 612 Encoder/Generator," product description, Optical Disc Corporation, 2 pages.
". . . The Recordable Laser Videodisc—RLV," product description, Optical Disc Corporation, 2 pages.
"ODC 610 Videodisc Recording System," product description, Optical Disc Corporation, 2 pages.
"Hitachi New CD-ROM Drive CDR-2500," product description, Hitachi, Ltd., 2 pages.
"Hitachi CD-ROM Drive CDR-1502S," product description, Hitachi, Ltd., 6 pages.
"Fernsehempfang rund um die Uhr" Funk Technik, Mar. 1981, vol. 36.
"Method for the Transmission of Additional Information," German Patent Application submitted by Blaupunkt Werke GMBH, filed May 31, 1980.
"Eine Neue Generation Mikroprozessorgesteuerter Datensender Und -Empfänger Für Alle Varianten Der Datenübertragung in Der V-Lücke Des Fernsehisgnals", A. Ebner and K. Schuster, Rundfunktechnische Mitteilungen, vol. 26, No. 5, pp. 215-220.
"A Novel Television Add-On Data Communication System", Jan., 1974, Patrick T. King, Society of Motion Picture and Television Engineers Journal, vol. 83.
"Actual Two-Way Systems," Ronald K. Jurgen, IEEE Spectrum, Nov. 1971.
"Additional Information Within the Television Signal", Sep. 1970, R. A. O'Connor Journal of the Society of Motion Picture and Television Engineers, vol. 79, No. 9, p. 824.
"Applications of Information Networks," J.C.R. et al, Proceedings of the IEEE, vol. 66, No. 11, pp. 1330-1346, Nov. 1978.
"Automated Control Units for Advertising on Cable," G. Morgan, Image Technology, vol. 68, No. 9, pgs. 457, 460, Sep. 1986.
"Coded Information Within the Picture Area", Feb. 1974, Wilton R. Holm, , Society of Motion Picture and Television Engineers Journal, vol. 83.
"Color Decode a PCM NTSC Television Signal", Jun. 1974, John P. Rossi, Society of Motion Picture and Television Engineers Journal, vol. 83.
"Comparison of Technology and Capital Costs of New Home Services," Metin B. Akgun, IEEE Transactions on Cable Television, vol. CATV-5, No. 3, Jul. 1980.

"Codifica Numerica Del Segnale Sonoro—Interfaccia Per Gil Apparati Professionali", Oct. 1985, M. Barbero and M. Occhiena, Elettronica e Telecomunicazi oni, vol. 34, No. 5, pp. 209-216.
"Encryption-based security systems", May 29-Jun. 1, 1987, Wechselberger, NCTA Convention Records pp. 148-152.
"Experiences with Piolot Projects in North America, Japan, and Europe", 1977, Eds. W. Kaiser, H. Marko, and E. Witte, Two-Way Cable Television.
"Going for the Microcomputer Market with Commercial Telesoftware", 1982, M. Shain, Viewdata 82.
"Hard encrypted video & audio television system", Mar. 15-18, 1986, Jeffers, Glaab 8&. Griffin, NCTA Convention Records pp. 232-234.
"Hybrid Addressability," Stubbs & Holobinko, National Cable Television Association Convention, pp. 255-265,Jun. 3-6, 1984.
"Individualized Still-Picture Communication on a Two-Way Broad-Band CATV System," Koji Maeda, IEEE Transactions on Communications, vol. COM-23, No. 1, Jan. 1975.
"Low Cost Interactive Home TV Terminal," Stetten & Mason, National Cable Television Association Convention, pp. 49-53, Jul. 6-9, 1971.
"Measurement and Control of TV Transmitters," Shelley and Smart, Society of Motion Picture and Television Engineers Journal, vol. 80, Nov. 1971.
"Off Premises Addressability," Preschutti, National Cable Television Association Convention, pp. 48-57, Jun. 2-5, 1985.
"On Distributed Communications," Paul Baran, The RAND Corporation, vols. 1-10.
"Operational Implementation of a Broadcast Television Frame Synchronizer", Mar. 1975, Robert J. Butler , Socie of Motion Picture and Television Engineers Journal, vol. 84.
"Pilot Two-Way CATV Systems," Ernest K. Smith, IEEE Transactions on Communications, vol. COM-23, No. 1, Jan. 1975.
"Some Methods of Automatic Analysis of Television Test Signals", Dec. 1971, R. H. Vivian, Society of Motion Picture and Television Engineers Journal, vol. 80.
"SRS E1 Segundo Interim Test Report," Callais, National Cable Television Association Convention, pp. 384-407, May 14-17, 1972.
"Status Monitoring System,"Hale, National Cable Television Association Convention, pp. 153-158, 1974.
"Television Applications and Transmission of Digital Data in the Vertical Blanking Interval", 1980, J. J. Lopinto ITC/USA/'80, International Telemetering Conference, p. 650, pp. 345-349.
"Television Central," Socie of Motion Picture and Television Engineers Journal, vol. 85, Oct. 1976.
"The Digital Video Effects System," Patten, Society of Motion Picture and Television Engineers Journal, vol. 87, Apr. 1978.
"The Magnavox Premium TV System," Forbes & Cooley, National Cable Television Association Convention, p. 100-104, Jun. 17-20, 1973.
"The Subscriber Response System," Durfee & Callais, National Cable Television Association Convention, pp. 28-48, Jul. 6-9, 1971.
"TV Frame Synchronizer," Kano, et al., Society of Motion Picture and Television Engineers Journal, vol. 84, Mar. 1975.
"Two-Way Coax TV System Handles All Communication Needs," George F. Benton, Communications News, Apr. 1975.
"Use of Low Frequency Bi-Directional Digital Transmission on Cable," Ellis, National Cable Television Association Convention, pp. 38-45, Apr. 17-20, 1977.
"Videotex & Teletext," Technical Panel, National Cable Television Association Convention, pp. 160-184, Jun. 12-15, 1983.
"Videotex Networks," J. Stynen and M. Keymolen, Revue HF, vol. 1, No. 12, pp. 413-424, 1981.
"Videotex Technologies," Technical Panel, National Cable Television Association Convention, pp. 99-123, May 29-Jun. 1, 1981.
Das Digitales Fernsehkennungssystem ZPSs, H. Eckhard Krüger, ntz Bd. 35 (1982) Helft 6 ("The Digital Television Identification System ZPS," ntz, vol. 35, No. 6, 1982, pp. 368-376).
Digitales Kennungssystem ZPS, Dr. H. E. Krger, Forderungsvorhaben TK 0054/3 ("Digital Identification System ZPS," Dr. H. E. Krüger, Research Project TK 0054/3, Final Report, Oct. 1, 1978 to Oct. 31, 1979).
Hi-OVIS Development Project, M. KaWahata, Presented in Two-Way Cable Television, Experiences with Pilot Projects in North America, Japan and Europe, Proceedings of a Symposium Held in Munich, Apr. 27-29, 1977, pp. 135-142.
Kinghorn, J.R., 11/00/85, "Using Extensions to World System Teletext," IEEE Transactions on Consumer Electronics, vol. CE-31, No. 4, pp. 661-666.
The Videotex and Teletext Handbook, Hurly et al., Harper and Row Publishers, Inc., 1985.
Two-Way Applications for Cable Television Systems in the '70s, Ronald K. Jurgen, Editor, IEEE Spectrum, Nov. 1971.
Vereinbarung ZVEI/ARD/ZDF ZUR ZRD/ZDF/ZVEI—Tichtlinie "Video-Programm-System (VPS)," ARD/ZDF, Dec. 4, 1984 (Memorandum of Understanding ZVEI/ARD/ZDF on the ARD/ZDF/ZVEI Guideline for a 'Video Programming System (VPS)').
Videoprogrammsystem DER 2. Generation, Von Gunther Stacker, net 40 (1986), Heft 7/8 ("Second-Generation Video Programming Systems," Von Gunther Stacker, net vol. 7/8 No. 40 (1986), pp. 311-315).
Videotext Programmiert Videoheimgerate (VPV), Gerhard Eitz, Karl-Ulrich Oberlies, Fundfunktechnische Mitteilunge, Jahrg. 30 (1986), H. 5 ("VCR Programming via Teletext").
Videotext Programmiert Videorecorder, Von Gunther Hofmann, Andreas Neuman, Karl-Ulrich Oberlies and Eckhard Schadwinkel, Rundfunktech Mitteilunger, Jahrg. 26 (1982) H. 6 ("Videotext Programs Video Recorder").
Videotext Und Bildschirmtext MIT Den LSI-Schaltungden SAA 5020, SAA 5030, SAA 5041 Und SAA 5051, Valvo, Technische Information fur die Industrie, Apr. 1980 (Videotext and Interactive Videotex With the LSI-Circuits SAA 5020, SAA 5030, SAA 5041 and SAA 5051).
Viewdata: A Public Information Utility, Second Edition, 1980, Dr. Adrian V. Stokes.
Wunschprogramm AUS DER Fernsehzeitschrift, Funkschau Dec. 1981, pp. 6070 ("Recording Programs From the Program Guide," Funkschau Dec. 1982, pp. 60-70).
Gaines, B.R. and Sams, J., "Minicomputers in Security Dealing," çomputer, Sep. 1976, pp. 6-15.
Kazama et al., "Automatic storage and retrieval of video taped programs", Apr. 1979.
Transcript of Viewdata '80, first world conference on viewdata, videotex, and teletext, Mar. 26-28, 1980, London.
Brown et al., Project Score, pp. 624-630, 1960.
Burkhardt et al., "Digitial Television Transmisson With 34 Mbit/s".
Byloff, "Automatic Control of Video Tape Equipment at NBC, Burbank," by the National Broadcasting Company, Inc. In 1959.
Charles Gerrish, "QUBE"—Interactive Video on the Move.
Crowther, et al., G.O., "Teletext Receiver LSI Data Acquisition and Control," Jan. 13, 1976, pp. 911-915.
M.W.S., Barlow, "Automatic Switching in tbe CBC—An Update".
Marsden, "Master Control Techniques," v 9 of the "Journal of the Television Society ," 1959.

* cited by examiner

PROGRAMMING
CONTROL INFORMATION
SWITCH CONTROL INSTRUCTIONS

SIGNAL PROCESSING APPARATUS AND METHODS

CROSS-REFERENCE TO RELATED APPLICATIONS

This is a continuation of application Ser. No. 08/113,329, filed Aug. 30, 1993, herein incorporated by reference in its entirety, which is a continuation of application Ser. No. 08/056,501, filed May 3, 1993, now U.S. Pat. No. 5,335,277, which was a continuation of application Ser. No. 07/849,226, filed Mar. 10, 1992, now U.S. Pat. No. 5,233,654, which was a continuation of application Ser. No. 07/588,126, filed Sep. 25, 1990, now U.S. Pat. No. 5,109,414, which was a continuation of application Ser. No. 07/096,096, filed Sep. 11, 1987, now U.S. Pat. No. 4,965,825, which was a continuation-in-part of application Ser. No. 06/829,531, filed Feb. 14, 1986, now U.S. Pat. No. 4,704,725, which was a continuation of application Ser. No. 06/317,510, filed Nov. 3, 1981, now U.S. Pat. No. 4,694,490.

BACKGROUND OF THE INVENTION

The invention relates to an integrated system of programming communication and involves the fields of computer processing, computer communications, television, radio, and other electronic communications; the fields of automating the handling, recording, and retransmitting of television, radio, computer, and other electronically transmitted programming; and the fields of regulating, metering, and monitoring the availability, use, and usage of such programming.

For years, television has been recognized as a most powerful medium for communicating ideas. And television is so-called "user-friendly"; that is, despite technical complexity, television is easy for subscribers to use.

Radio and electronic print services such as stock brokers' so-called "tickers" and "broad tapes" are also powerful, user friendly mass media. (Hereinafter, the electronic print mass medium is called, "broadcast print.")

But television, radio, and broadcast print are only mass media. Program content is the same for every viewer. Occasionally one viewer may see, hear, or read information of specific relevance to him (as happens when a guest on a television talk show turns to the camera and says, "Hi, Mom"), but such electronic media have no capacity for conveying user specific information simultaneously to each user.

For years, computers have been recognized as having unsurpassed capacity for processing and displaying user specific information.

But computer processing is not a mass medium. Computers operate under the control of computer programs that are inputted by specific users for specific purposes, not programs that are broadcast to and executed simultaneously at the stations of mass user audiences. And computer processing is far less user friendly than, for example, television.

Today great potential exists for combining the capacity of broadcast communications media to convey ideas with the capacity of computers to process and output user specific information. One such combination would provide a new radio-based or broadcast print medium with the capacity for conveying general information to large audiences—e.g., "Stock prices rose today in heavy trading,"—with information of specific relevance to each particular user in the audience—e.g., "but the value of your stock portfolio went down." (Hereinafter, the new media that result from such combinations are called "combined" media.)

Unlocking this potential is desirable because these new media will add substantial richness and variety to the communication of ideas, information and entertainment. Understanding complex subjects and making informed decisions will become easier.

To unlock this potential fully requires means and methods for combining and controlling receiver systems that are now separate—television and computers, radio and computers, broadcast print and computers, television and computers and broadcast print, etc.

But it requires much more.

To unlock this potential fully requires a system with efficient capacity for satisfying the demands of subscribers who have little receiver apparatus and simple information demands as well as subscribers who have extensive apparatus and complex demands. It requires capacity for transmitting and organizing vastly more information and programming than any one-channel transmission system can possibly convey at one time. It requires capacity for controlling intermediate transmission stations that receive information and programming from many sources and for organizing the information and programming and retransmitting the information and programming so as to make the use of the information and programming at ultimate receiver stations as efficient as possible.

To unlock this potential also requires efficient capacity for providing reliable audit information to (1) advertisers and others who pay for the transmission and performance of programming and (2) copyright holders, pay service operators, and others such as talent who demand, instead, to be paid. This requires capacity for identifying and recording (1) what television, radio, data, and other programming and what instruction signals are transmitted at each transmission station and (2) what is received at each receiver station as well as (3) what received programming is combined or otherwise used at each receiver station and (4) how it is received, combined, and/or otherwise used.

Moreover, this system must have the capacity to ensure that programming supplied for pay or for other conditional use is used only in accordance with those conditions. For example, subscriber station apparatus must display the commercials that are transmitted in transmissions that advertisers pay for. The system must have capacity for decrypting, in many varying ways, programming and instruction signals that are encrypted and for identifying those who pirate programming and inhibiting piracy.

It is the object of this invention to unlock this great potential in the fullest measure by means of an integrated system of programming communication that joins together all these capacities most efficiently.

Computer systems generate user specific information, but in any given computer system, any given set of program instructions that causes and controls the generation of user specific information is inputted to only one computer at a time.

Computer communications systems do transmit data point-to-multipoint. The Dataspeed Corporation division of Lotus Development Corporation of Cambridge, Mass. transmits real-time financial data over radio frequencies to microcomputers equipped with devices called "modios" that combine the features of radio receivers, modems, and decryptors. The Equatorial Communications Company of Mountain View, Calif. transmits to similarly equipped receiver systems by satellite. At each receiver station, apparatus receive the particular transmission and convert its data content into unencrypted digital signals that computers can process. Each subscriber programs his subscriber station apparatus to select particular data of interest.

This prior art is limited. It only transmits data; it does not control data processing. No system is preprogrammed to simultaneously control a plurality of central processor units, operating systems, and pluralities of computer peripheral units. None has capacity to cause simultaneous generation of user specific information at a plurality of receiver stations. None has any capacity to cause subscriber station computers to process received data, let alone in ways that are not inputted by the subscribers. None has any capacity to explain automatically why any given information might be of particular interest to any subscriber or why any subscriber might wish to select information that is not selected or how any subscriber might wish to change the way selected information is processed.

As regards broadcast media, systems in the prior art have capacity for receiving and displaying multiple images on television receivers simultaneously. One such system for superimposing printed characters transmitted incrementally during the vertical blanking interval of the television scanning format is described in U.S. Pat. No. 3,891,792 to Kimura. U.S. Pat. No. 4,310,854 to Baer describes a second system for continuously displaying readable alphanumeric captions that are transmitted as digital data superimposed on a normal FM sound signal and that relate in program content to the conventional television information upon which they are displayed. These systems permit a viewer to view a primary program and a secondary program.

This prior art, too, is limited. It has no capacity to overlay any information other than information transmitted to all receiver stations simultaneously. It has no capacity to overlay any such information except in the order in which it is received. It has no capacity to cause receiver station computers to generate any information whatsoever, let alone user specific information. It has no capacity to cause overlays to commence or cease appearing at receiver stations, let alone commence and cease appearing periodically.

As regards the automation of intermediate transmission stations, various so-called "cueing" systems in the prior art operate in conjunction with network broadcast transmissions to automate the so-called "cut-in" at local television and radio stations of locally originated programming such as so-called "local spot" advertisements.

Also in the prior art, U.S. Pat. No. 4,381,522 to Lambert describes a cable television system controlled by a minicomputer that responds to signals transmitted from viewers by telephone. In response to viewers' input preferences, the computer generates a schedule which determines what prerecorded, so-called local origination programs will be transmitted, when, and over what channels. The computer generates a video image of this schedule which it transmits over one cable channel to viewers which permits them to see when they can view the programs they request and over what channels. Then, in accordance with the schedule, it actuates preloaded video tape, disc or film players and transmits the programming transmissions from these players to the designated cable channels by means of a controlled video switch.

This prior art, too, is limited. It has no capacity to schedule automatically or transmit any programming other than that loaded immediately at the play heads of the controlled video players. It has no capacity to load the video players or identify what programming is loaded on the players or verify that scheduled programs are played correctly. It has no capacity to cause the video players to record programming from any source. It has no capacity to receive programming transmissions or process received transmissions in any way. It has no capacity to operate under the control of instructions transmitted by broadcasters. It has no capacity to insert signals that convey information to or control, in any way, the automatic operation of ultimate receiver station apparatus other than television receivers.

As regards the automation of ultimate receiver stations, in the prior art, U.S. Pat. No. 4,337,480 to Bourassin et al. describes a dynamic interconnection system for connecting at least one television receiver to a plurality of television peripheral units. By means of a single remote keyboard, a viewer can automatically connect and disconnect any of the peripheral units without the need manually to switch systems or fasten and unfasten cabling each time. In addition, using a so-called "image-within-image" capacity, the viewer can superimpose a secondary image from a second peripheral unit upon the primary image on the television display. In this fashion, two peripheral units can be viewed simultaneously on one television receiver. U.S. Pat. No. 4,264,925 to Freeman et. al. describes a multi-channel programming transmission system wherein subscribers may select manually among related programming alternatives transmitted simultaneously on separate channels.

This prior art, too, is limited. It has no capacity for interconnecting or operating a system at any time other than the time when the order to do so is entered manually at the system or remote keyboard. It has no capacity for acting on instructions transmitted by broadcasters to interconnect, actuate or tune systems peripheral to a television receiver or to actuate a television receiver or automatically change channels received by a receiver. It has no capacity for coordinating the programming content transmitted by any given peripheral system with any other programming transmitted to a television receiver. It has no capacity for controlling two separate systems such as, for example, an automatic radio and television stereo simulcast. It has no capacity for selectively connecting radio receivers to radio peripherals such as computers or printers or speakers or for connecting computers to computer peripherals (except perhaps a television set). It has no capacity for controlling the operation of decryptors or selectively inputting transmissions to decryptors or outputting transmissions from decryptors to other apparatus. It has no capacity for monitoring and maintaining records regarding what programming is selected or played on any apparatus or what apparatus is connected or how connected apparatus operate.

The prior art includes a variety of systems for monitoring programming and generating so-called "ratings." One system that monitors by means of embedded digital signals is described in U.S. Pat. No. 4,025,851 to Haselwood, et al. Another that monitors by means of audio codes that are only "substantially inaudible" is described in U.S. Pat. No. 3,845,391 to Crosby. A third that automatically monitors a plurality of channels by switching sequentially among them and that includes capacity to monitor audio and visual quality is described in U.S. Pat. No. 4,547,804 to Greenberg.

This prior art, too, is limited. It has capacity to monitor only single broadcast stations, channels or units and lacks capacity to monitor more than one channel at a time or to monitor the combining of media. At any given monitor station, it has had capacity to monitor either what is transmitted over one or more channels or what is received on one or more receivers but not both. It has assumed monitored signals of particular format in particular transmission locations and has lacked capacity to vary formats or locations or to distinguish and act on the absence of signals or to interpret and process in any fashion signals that appear in monitored locations that are not monitored signals. It has lacked capacity to identify encrypted signals then decrypt them. It has lacked capacity to record and also transfer information to a remote geographic location simultaneously.

As regards recorder/player systems, many means and methods exist in the prior art for recording television or audio programming and/or data on magnetic, optical or other recording media and for retransmitting prerecorded programming. Video tape recorders have capacity for automatic delayed recording of television transmissions on the basis of instructions input manually by viewers. So-called "interactive video" systems have capacity for locating prerecorded television programming on a given disc and transmitting it to television receivers and locating prerecorded digital data on the same disc and transmitting them to computers.

This prior art, too, is limited. It has no capacity for automatically embedding signals in and/or removing embedded signals from a television transmission then recording the transmission. It has no capacity for controlling the connection or actuation or tuning of external apparatus. It has no capacity for retransmitting prerecorded programming and controlling the decryption of said programming, let alone doing so on the basis of signals that are embedded in said programming that contain keys for the decryption of said programming. It has no capacity for operating on the basis of control signals transmitted to recorder/players at a plurality of subscriber stations, let alone operating on the basis of such signals to record user specific information at each subscriber station.

As regards decoders and decryptors, many different systems exist, at present, that enable programming suppliers to restrict the use of transmitted programming to only duly authorized subscribers. The prior art includes so-called "addressable" systems that have capacity for controlling specific individual subscriber station apparatus by means of control instructions transmitted in broadcasts. Such systems enable broadcasters to turn off subscriber station decoder/decryptor apparatus of subscribers who do not pay their bills and turn them back on when the bills are paid.

This prior art, too, is limited. It has no capacity for decrypting combined media programming. It has no capacity for identifying then selectively decrypting control instructions embedded in unencrypted programming transmissions. It has no capacity for identifying programming transmissions or control instructions selectively and transferring them to a decryptor for decryption. It has no capacity for transferring the output of a decryptor selectively to one of a plurality of output apparatus. It has no capacity for automatically identifying decryption keys and inputting them to a decryptor to serve as the key for any step of decryption. It has no capacity for identifying and recording the identity of what is input to or output from a decryptor. It has no capacity for decrypting a transmission then embedding a signal in the transmission—let alone for simultaneously embedding user specific signals at a plurality of subscriber stations. It has no capacity for distinguishing the absence of an expected signal or controlling any operation when such absence occurs.

Further significant limitations arise out of the failure to reconcile aspects of these individual areas of art—monitoring programming, automating ultimate receiver stations, decrypting programming, generating the programming itself, etc.—into an integrated system. These limitations are both technical and commercial.

For example, the commercial objective of the aforementioned monitoring systems of Crosby, Haselwood et. al., and Greenberg is to provide independent audits to advertisers and others who pay for programming transmissions. All require embedding signals in programming that are used only to identify programming. Greenberg, for example, requires that a digital signal be transmitted at a particular place on a select line of each frame of a television program. But television has only so much capacity for transmitting signals outside the visible image; it is inefficient for such signals to serve only one function; and broadcasters can foresee alternate potential for this capacity that may be more profitable to them. Furthermore, advertisers recognize that if the systems of Crosby, Haselwood and Greenberg distinguish TV advertisements by means of single purpose signals, television receivers and video tape recorders can include capacity for identifying said signals and suppressing the associated advertisements. Accordingly, no independent automatic comprehensive so-called "proof-of-performance" audit service has yet proven commercially viable.

As a second example, because of the lack of a viable independent audit system, each service that broadcasts encrypted programming controls and services at each subscriber station one or more receiver/decryptors dedicated to its service alone. Lacking a viable audit system, services do not transmit to shared, common receiver/decryptors.

These are just two examples of limitations that arise in the absence of an integrated system of programming communication.

It is an object of the present invention to overcome these and other limitations of the prior art.

SUMMARY OF THE INVENTION

The present invention consists of an integrated system of methods and apparatus for communicating programming. The term "programming" refers to everything that is transmitted electronically to entertain, instruct or inform, including television, radio, broadcast print, and computer programming as well as combined medium programming. The system includes capacity for automatically organizing multi-channel communications. Like television, radio, broadcast print, and other electronic media, the present invention has capacity for transmitting to standardized programming that is very simple for subscribers to play and understand. Like computer systems, the present invention has capacity for transmitting data and control instructions in the same information stream to many different apparatus at a given subscriber station, for causing computers to generate and transmit programming, and for causing receiver apparatus to operate on the basis of programming and information received at widely separated times.

It is the further purpose of this invention to provide means and methods whereby a simplex point-to-multipoint transmission (such as a television or radio broadcast) can cause simultaneous generation of user specific information at a plurality of subscriber stations. One advantage of the present invention is great ease of use. For example, as will be seen, a subscriber can cause his own information to be processed in highly complex ways by merely turning his television receiver on and tuning to a particular channel. Another advantage of the present invention is its so-called "transparency"—subscribers see none of the complex processing taking place. Another advantage is privacy. No private information is required at transmitting stations, and no subscriber's information is available at any other subscriber's station.

It is the further purpose of this invention to provide means and methods whereby a simplex broadcast transmission can cause periodic combining of relevant user specific information and conventional broadcast programming simultaneously at a plurality of subscriber stations, thereby integrating the broadcast information with each user's own information. One advantage of the present invention is its use of powerful communication media such as television to reveal the meaning of the results of complex processing in ways that appear clear and simple. Another advantage is that receiver stations that lack said capacity for combining user specific information into television or radio programming can continue, without modification, to receive and display the conventional television or radio and without the appearance of any signals or change in the conventional programming.

It is the further purpose of this invention to provide means and methods for the automation of intermediate transmission stations that receive and retransmit programming. The programming may be delivered by any means including over-the-air, hard-wire, and manual means. The stations may transmit programming over-the-air (hereinafter, "broadcast") or over hard-wire (hereinafter, "cablecast"). They may transmit single channels or multiple channels. The present invention includes capacity for automatically constructing records for each transmitted channel that duplicate the logs that the Federal Communications Commission requires broadcast station operators to maintain.

It is the further purpose of this invention to provide means and methods for the automation of ultimate receiver stations, especially the automation of combined medium and multichannel presentations. Such ultimate receiver stations may be private homes or offices or commercial establishments such as theaters, hotels, or brokerage offices.

It is the further purpose of this invention to provide means and methods for identifying and recording what television, radio, data, and other programming is transmitted at each transmission station, what programming is received at each receiver station, and how programming is used. In the present invention, certain monitored signals may be encrypted, and certain data collected from such monitoring may be automatically transferred from subscriber stations to one or more remote geographic stations.

It is a further purpose of this invention to provide means and methods for recording combined media and/or multichannel programming and for playing back prerecorded programming of such types.

It is a further purpose of this invention to provide a variety of means and methods for restricting the use of transmitted communications to only duly authorized subscribers. Such means and methods include techniques for encrypting programming and/or instructions and decrypting them at subscriber stations. They also include techniques whereby the pattern of the composition, timing, and location of embedded signals may vary in such fashions that only receiving apparatus that are preinformed regarding the patterns that obtain at any given time will be able to process the signals correctly.

The present invention employs signals embedded in programming. Embedded signals provide several advantages. They cannot become separated inadvertently from the programming and, thereby, inhibit automatic processing. They occur at precise times in programming and can synchronize the operation of receiver station apparatus to the timing of programming transmissions. They can be conveniently monitored.

In the present invention, the embedded signals contain digital information that may include addresses of specific receiver apparatus controlled by the signals and instructions that identify particular functions the signals cause addressed apparatus to perform.

In programming transmissions, given signals may run and repeat, for periods of time, continuously or at regular intervals. Or they may run only occasionally or only once. They may appear in various and varying locations. In television they may appear on one line in the video portion of the transmission such as line 20 of the vertical interval, or on a portion of one line, or on more than one line, and they will probably lie outside the range of the television picture displayed on a normally tuned television set. In television and radio they may appear in a portion of the audio range that is not normally rendered in a form audible to the human ear. In television audio, they are likely to lie between eight and fifteen kilohertz. In broadcast print and data communications transmissions, the signals may accompany conventional print or data programming in the conventional transmission stream but will include instructions that receiver station apparatus are preprogrammed to process that instruct receiver apparatus to separate the signals from the conventional programming and process them differently. In all cases, signals may convey information in discrete words, transmitted at separate times or in separate locations, that receiver apparatus must assemble in order to receive one complete instruction.

(The term "signal unit" hereinafter means one complete signal instruction or information message unit. Examples of signal units are a unique code identifying a programming unit, or a unique purchase order number identifying the proper use of a programming unit, or a general instruction identifying whether a programming unit is to be retransmitted immediately or recorded for delayed transmission. The term "signal word" hereinafter means one full discrete appearance of a signal as embedded at one time in one location on a transmission. Examples of signal words are a string of one or more digital data bits encoded together on a single line of video or sequentially in audio. Such strings may or may not have predetermined data bits to identify the beginnings and ends of words. Signal words may contain parts of signal units, whole signal units, or groups of partial or whole signal units or combinations.)

In the present invention, particular signal processing apparatus (hereinafter called the "signal processor") detect signals and, in accordance with instructions in the signals and preprogramming in the signal processor, decrypt and/or record and/or control station apparatus by means of the signals and/or discard the signals. The apparatus include one or more devices that can selectively scan transmission frequencies as directed and, separately, capacity to receive signals from one or more devices that continuously monitor selected frequencies. The frequencies may convey television, radio, or other programming transmissions. The input transmissions may be received by means of antennas or from hard-wire connections. The scanners/switches, working in parallel or series or combinations, transfer the transmissions to receiver/decoder/detectors that identify signals encoded in programming transmissions and convert the encoded signals to digital information; decryptors that may convert the received information, in part or in whole, to other digital information according to preset methods or patterns; and one or more processor/monitors and/or buffer/comparators that organize and transfer the information stream. The processors and buffers can have inputs from each of the receiver/detector lines and evaluate information continuously. From the processors and buffers, the signals may be transferred to external equipment such as computers, videotape recorders and players, etc. And/or they may be transferred to one or more internal digital recorders that receive and store in memory the recorded information and have connections to one or more remote sites for further transmission of the recorded information. The apparatus has means for external communication and an automatic dialer and can contact remote sites and transfer stored information as required in a predetermined fashion or fashions. The apparatus has a clock for determining and recording time as required. It has a read only memory for recording permanent operating instructions and other information and a programmable random access memory controller ("PRAM controller") that permits revision of operating patterns and instructions. The PRAM controller may be connected to all internal operating units for full flexibility of operations.

Signal processing apparatus that are employed in specific situations that require fewer functions than those provided by the signal processor described above may omit one or more of the specific operating elements described above.

A central objective of the present invention is to provide flexibility in regard to installed station apparatus. At any given time, the system must have capacity for wide variation in individual station apparatus in order to provide individual subscribers the widest range of information options at the least cost in terms of installed equipment. Flexibility must exist for expanding the capacity of installed systems by means of transmitted software and for altering installed systems in a modular fashion by adding or removing components. Flexibility must exist for varying techniques that restrict programming to duly authorized subscribers in order to identify and deter pirates of programming.

Other objects, features, and advantages of this invention will appear in the following descriptions and the appended claims.

DESCRIPTION OF THE PREFERRED EMBODIMENTS

One Combined Medium

Figure 1:
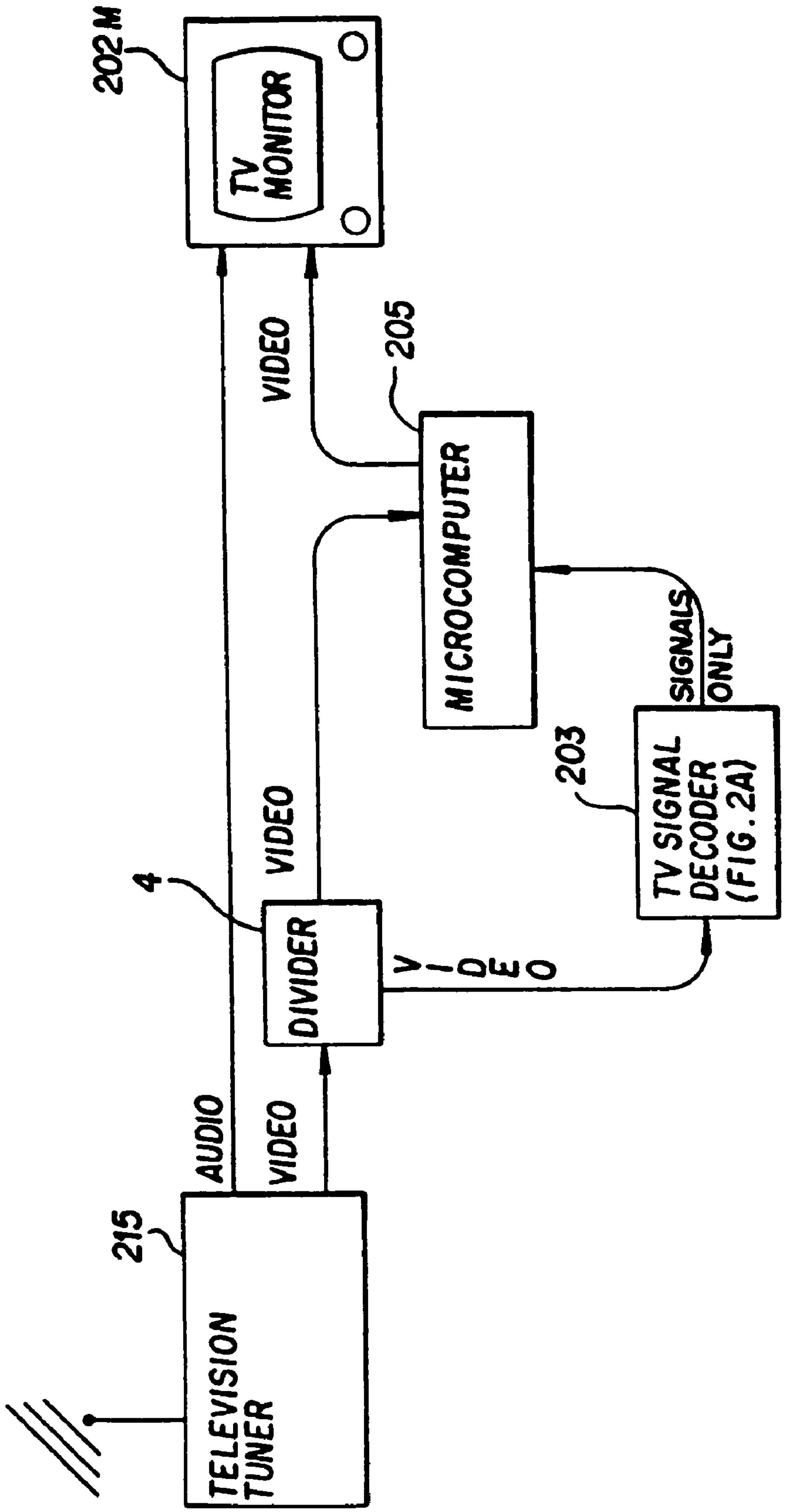
FIG. 1 is a block diagram of a video/computer combined medium receiver station.

FIG. 1 shows a video/computer combined medium subscriber station. Via conventional antenna, the station receives a conventional television broadcast transmission at television tuner, 215. The Model CV510 Electronic TV Tuner of the Zenith Radio Corporation of Chicago, Ill., which is a component of the Zenith Video Hi-Tech Component TV system, is one such tuner. This tuner outputs conventional audio and composite video transmissions. The audio transmission is inputted to TV monitor, 202M. The video transmission is inputted to video transmission divider, 4, which is a conventional divider that splits the transmission into two paths. One is inputted continuously to TV signal decoder, 203, and the other to microcomputer, 205. TV signal decoder, 203, which is described more fully below, has capacity for receiving a composite video transmission; detecting digital information embedded therein; correcting errors in the received information by means of forward error checking techniques, well known in the art; converting the received information, as may be required, by means of input protocol techniques, well known in the art, into digital signals that microcomputer, 205, can receive and process and that can control the operation of microcomputer, 205; and transferring said signals to microcomputer, 205. Microcomputer, 205, is a conventional microcomputer system with disk drives that is adapted to have capacity for receiving signals from decoder, 203; for generating computer graphic information; for receiving a composite video transmission; for combining said graphic information onto the video information of said transmission by graphic overlay techniques, well known in the art; and for outputting the resulting combined information to a TV monitor, 202M, in a composite video transmission. One such system is the IBM Personal Computer of International Business Machines Corporation of Armonk, N.Y. with an IBM Asynchronous Communications Adapter installed in one expansion slot and a PC-MicroKey Model 1300 System with Techmar Graphics Master Card, as supplied together by Video Associates Labs of Austin, Tex., installed in two other slots. Microcomputer, 205, receives digital signals from decoder, 203, at its asynchronous communications adapter and the video transmission from divider, 4, at its PC-MicroKey 1300 System. It outputs the composite video transmission at its PC-MicroKey System. Microcomputer, 205, has all required operating system capacity—eg., the MS/DOS Version 2.0 Disk Operating System of Microsoft, Inc. of Bellvue, Wash. with installed device drivers. TV monitor, 202M, has capacity for receiving composite video and audio transmissions and for presenting a conventional television video image and audio sound. One such monitor is the Model CV1950 Color Monitor of the Zenith Radio Corporation.

In the example, the subscriber station of FIG. 1 is in New York City and is tuned to the conventional broadcast television transmission frequency of channel 13 at 8:30 PM on a Friday evening when the broadcast station of said frequency, WNET, commences transmitting a television program about stock market investing, "Wall Street Week." Said WNET station is an intermediate transmission station for said program which actually originates at a remote television studio in Owings Mills, Md. (Hereinafter, a studio or station that originates the broadcast transmission of programming is called the "program originating studio.") From said program originating studio said program is transmitted by conventional television network feed transmission means, well known in the art, to a large number of geographically dispersed intermediate transmission stations that retransmit said program to millions of subscriber stations where subscribers view said program. Said network transmission means may include so-called landlines, microwave transmissions, a satellite transponder, or other means.

At said subscriber station, microprocessor, 205, contains a conventional 5¼" floppy disk at a designated one of its disk drives that holds a data file recorded in a fashion well known in the art. Said file contains information on the portfolio of financial instruments owned by the subscriber that identifies the particular stocks in the portfolio, the number of shares of each stock owned at the close of business of each business day from the end of the previous week, and the closing share prices applicable each day. Decoder, 203, is preprogrammed to detect digital information on a particular line or lines (such as line 20) of the vertical interval of its video transmission input; to correct errors in said information; to convert said corrected information into digital signals usable by microcomputer, 205; and to input said signals to microcomputer, 205, at its asynchronous communications adapter. Microcomputer, 205, is preprogrammed to receive said input of signals at its asynchronous communications adapter and to respond in a predetermined fashion to instruction signals embedded in the "Wall Street Week" programming transmission.

Other similarly configured and preprogrammed subscriber stations also tune to the transmission of said "Wall Street Week" program by given intermediate transmission stations. At each subscriber station, the records in the contained financial portfolio file hold, in identical format, information on the particular investments of that station's subscriber.

At the start of the transmission of said "Wall Street Week" program, all subscriber station apparatus is on and fully operational.

At said program originating studio, at the outset of said program transmission, a first series of control instructions is generated, embedded sequentially on said line or lines of the vertical interval, and transmitted on the first and each successive frame of said television program transmission, signal unit by signal unit and word by word, until said series has been transmitted in full. The instructions of said series are addressed to and control the microcomputer, 205, of each subscriber station.

In said series in full—and in any one or more subsequent series of instructions—particular instructions are separated, as may be required, by time periods when no instruction that controls the microcomputer, 205, of any station is transmitted which periods allow sufficient time for the microcomputer, 205, of each and every subscriber station to complete functions controlled by previously transmitted instructions and commence waiting for a subsequent instruction, in a waiting fashion well known in the art, before receiving a subsequent instruction.

Tuner, 215, receives this television transmission, converts the received television information into audio and composite video transmissions, and transmits the audio to monitor, 202M, and the video via divider, 4, to microcomputer, 205, and decoder, 203. Decoder, 203, detects the embedded instruction information, corrects it as required, converts it into digital signals usable by microcomputer, 205, and transmits said signals to microcomputer, 205.

With each step occurring in a predetermined fashion or fashions, well known in the art, this first set of instructions commands microcomputer, 205, (and all other subscriber station microcomputers simultaneously) to interrupt the operation of its central processor unit (hereinafter, "CPU") and any designated other processors; then to record the contents of the registers of its CPU and any other designated processors either at a designated place in random access memory (hereinafter, "RAM") or on the contained disk; then to set its PC-MicroKey 1300 to the "GRAPHICS OFF" operating mode in which mode it transmits all received composite video information to monitor, 202M, without modification; then to record all information in RAM with all register information in an appropriately named file such as "INTERUPT.BAK" at a designated place on the contained disk; then to clear all RAM (except for that portion of RAM containing the so-called "operating system" of said microcomputer, 205) and all registers of said CPU and any other designated processors; then to wait for further instructions from decoder, 203.

Operating in said preprogrammed fashion under control of said first set of instructions, microcomputer, 205, reaches a stage at which the subscriber can input information only under control of signals embedded in the broadcast transmission and can reassume control of microcomputer, 205, (so long as microcomputer, 205, remains on and continues, in a predetermined fashion, to receive said embedded transmitted signals) only by executing a system reset (or so-called "warm boot") which on an IBM PC is accomplished by depressing simultaneously the "Ctrl", "Alt" and "Del" keys on the console keyboard.

(Hereinafter, this first set of instructions is called the "control invoking instructions," and the associated steps are called "invoking broadcast control.")

After completing all steps of invoking broadcast control, the microcomputer at each subscriber station (including microcomputer, 205) is preprogrammed (1) to evaluate particular initial instructions in each distinct series of received input instructions to ascertain how to process the information of said series and (2) to operate in a predetermined fashion or fashions in response to said initial instructions.

Subsequently, a second series of instructions is embedded and transmitted at said program originating studio. Said second series is detected and converted into usable digital signals by decoder, 203, and inputted to microcomputer, 205, in the same fashion as the first series. Microcomputer, 205, evaluates the initial signal word or words which instruct it to load at RAM (from the input buffer to which decoder, 203, inputs) and run the information of a particular set of instructions that follows said word or words just as the information of a file named FILE.EXE, recorded on the contained floppy disk, would be loaded at RAM (from the input buffer to which the disk drive of said disk inputs) and run were the command "FILE" entered from the console keyboard to the system level of the installed disk operating system. (Hereinafter, such a set of instructions that is loaded and run is called a "program instruction set.") In a fashion well known in the art, microcomputer, 205, loads the received binary information of said set at a designated place in RAM until, in a predetermined fashion, it detects the end of said set, and it executes said set as an assembled, machine language program in a fashion well known in the art.

Under control of said program instruction set and accessing the subscriber's contained portfolio data file for information in a fashion well known in the art, microcomputer, 205, calculates the performance of the subscriber's stock portfolio and constructs a graphic image of that performance at the installed graphics card. The instructions cause the computer, first, to determine the aggregate value of the portfolio at each day's close of business by accumulating, for each day, the sum of the products of the number of shares of each stock held times that stock's closing price. The instructions then cause microcomputer, 205, to calculate the percentage change in the portfolio's aggregate value for each business day of the week in respect to the final business day of the prior week. Then in a fashion well known in the art, the instructions cause microcomputer, 205, to enter digital bit information at the video RAM of the graphics card in a particular pattern that depicts the said percentage change as it would be graphed on a particular graph with a particular origin and set of scaled graph axes. Upon completion of these steps, the instructions cause microcomputer, 205, to commence waiting for a subsequent instruction from decoder, 203.

If the information at video RAM at the end of these steps were to be transmitted alone to the video screen of a TV monitor, it would appear as a line of a designated color, such as red, on a background color that is transparent when overlaid on a separate video image. Black is such a background color, and FIG. 1A shows one such line.

As each subscriber station completes the steps of calculation and graphic imaging performed under control of said program instruction set, information of such a line exists at video RAM at said station which information reflects the specific portfolio performance of the user of said station. Said information results from much computation, but the meaning of said information is hardly clear. FIG. 1A shows just a line.

While microcomputer, 205, performs these steps, TV monitor, 202M, displays the conventional television image and the sound of the transmitted "Wall Street Week" program. During this time the program may show the so-called "talking head" of the host as he describes the behavior of the stock market over the course of the week. Then the host says, "Now as we turn to the graphs, here is what the Dow Jones Industrials did in the week just past," and a studio generated graphic is transmitted. FIG. 1B shows the image of said graphic as it appears on the video screen of TV monitor, 202M. Then the host says, "And here is what your portfolio did." At this point, an instruction signal is generated at said program originating studio, embedded in the programming transmission, and transmitted. Said signal is identified by decoder, 203; transferred to microcomputer, 205; and executed by microcomputer, 205, at the system level as the statement, "GRAPHICS ON". Said signal instructs microcomputer, 205, at the PC-MicroKey 1300 to overlay the graphic information in its graphics card onto the received composite video information and transmit the combined information to TV monitor, 202M. TV monitor, 202M, then displays the image shown in FIG. 1C which is the microcomputer generated graphic of the subscriber's own portfolio performance overlaid on the studio generated graphic. And microcomputer, 205, commences waiting for another instruction from decoder, 203.

Figure 1A:
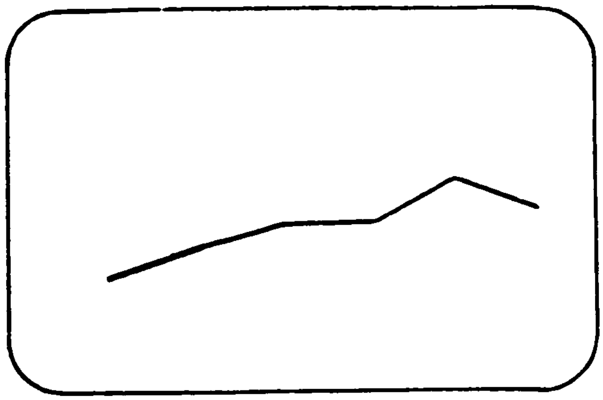
FIG. 1A shows a representative example of a computer generated, user specific graphic as it would appear by itself on the face of a display tube.
Figure 1B:
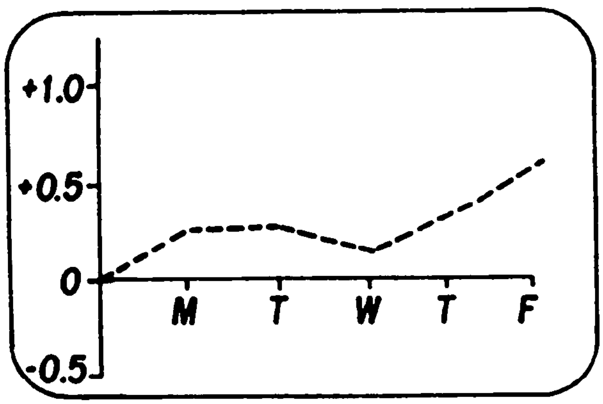
FIG. 1B shows a representative example of a studio generated graphic displayed on the face of a display tube.

By itself, the meaning of FIG. 1A is hardly clear. But when FIG. 1A is combined and displayed at the proper time with the conventional television information, its meaning becomes readily apparent. Simultaneously, each subscriber in a large audience of subscribers sees his own specific performance information as it relates to the performance information of the market as a whole.

(Hereinafter, an instruction such as the above signal of "GRAPHICS ON" that causes subscriber station apparatus to execute a combining operation in synchronization is called a "combining synch command." Said initial signal word or words that preceded the above program instruction set provide another example of a combining synch command in that said word or words synchronized all subscriber station computers in commencing loading and running information for a particular combining.)

While the TV monitor at this particular subscriber station displays this particular subscriber's own overlay information, each other subscriber station displays the specific overlay information applicable at that station.

As the program proceeds, in the same fashion a further instruction signal is generated at said studio; transmitted; detected; inputted from decoder, 203, to microcomputer, 205; and executed as "GRAPHICS OFF." Then said studio ceases transmitting the graphic image, and transmits another image such as the host's talking head. Simultaneously, the GRAPHICS OFF command causes microcomputer, 205, to cease overlaying the graphic information onto the received composite video and to commence transmitting the received composite video transmission unmodified. Thereafter the "Wall Street Week" program proceeds, and microcomputer, 205, continues to operate under control of received instructions.

This combined medium example is of a television based medium. Like conventional television, said combined medium transmits the same signals to all subscriber stations. But unlike conventional television where each subscriber views only programming viewed by every other subscriber and where said programming is known to and available at the program originating studio, each subscriber of said combined medium views programming that is personalized and private. The programming he views is his own—in the example, his own portfolio performance—and his programming is not viewed by any other subscriber nor is it available at the program originating studio. In addition, personalized programming is displayed only when it is of specific relevance to the conventional television programming of said combined medium. In the example, each subscriber views a graphic presentation of his own portfolio performance information as soon as it becomes specifically relevant to graphic information of the performance of the market as a whole. Prior to its time of specific relevance, no personalized information is displayed (despite the fact that said graphic information of the performance of the market as a whole is displayed). And said personalized information is displayed only for so long as it remains specifically relevant. As soon as its specific relevance terminates, its display terminates.

This "Wall Street Week" portfolio performance example provides but one of many examples of television based combined medium programming.

This television based combined medium is but one example of many combined media.

The Signal Processor

Figure 2:
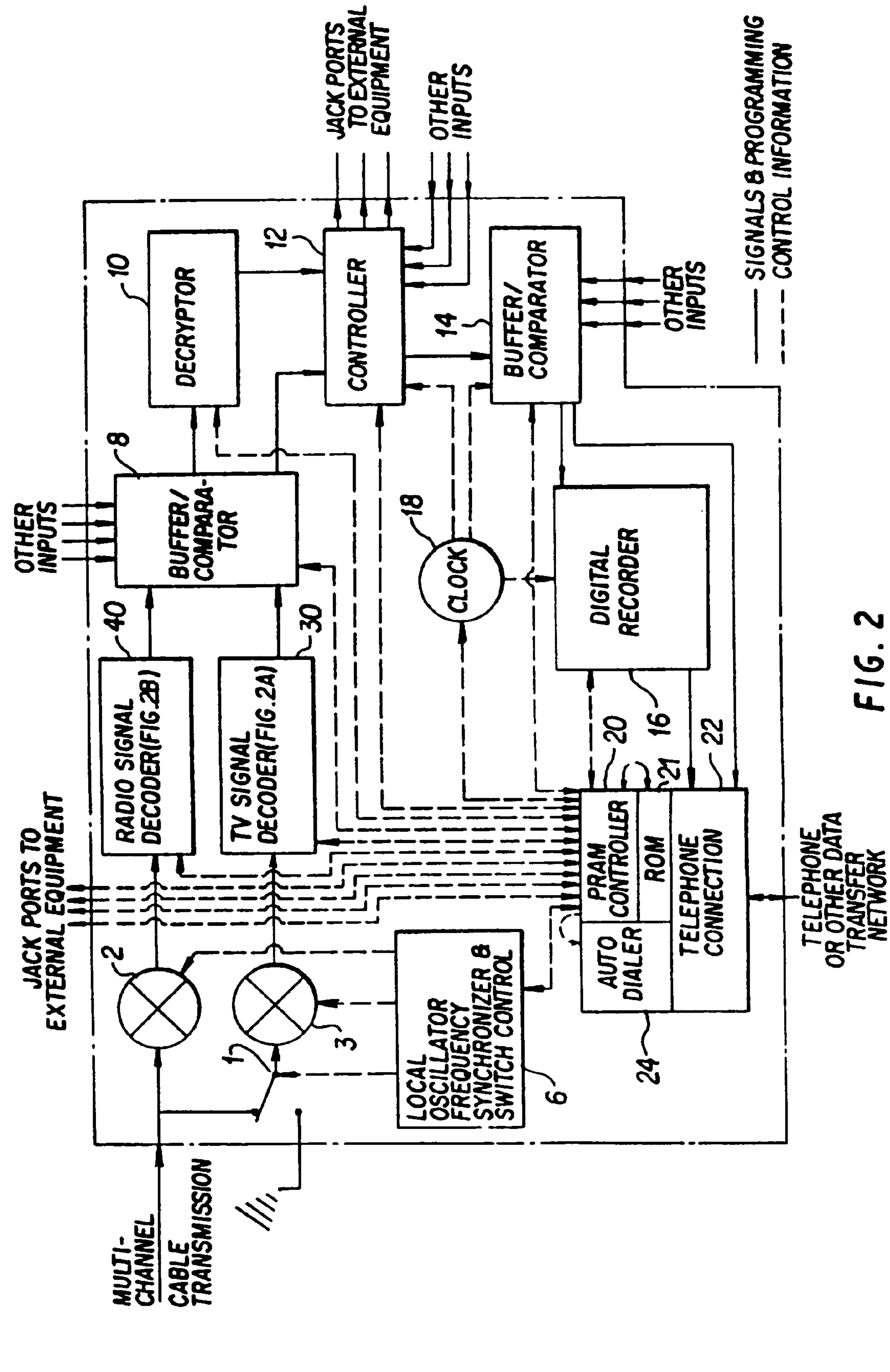
FIG. 2 is a block diagram of one embodiment of a signal processor.
Figure 2A:
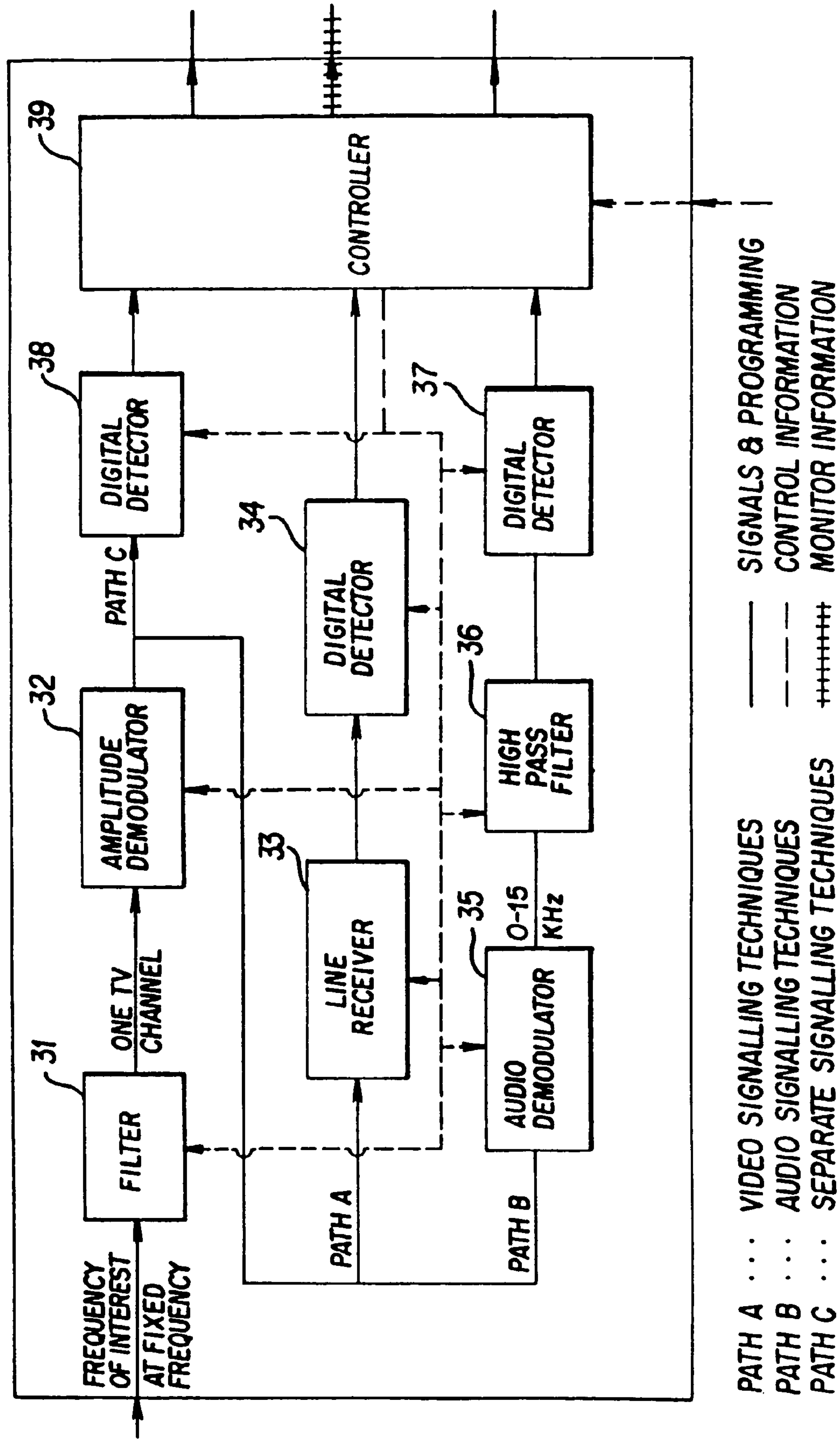
FIG. 2A is a block diagram of a TV signal decoder apparatus.
Figure 2B:
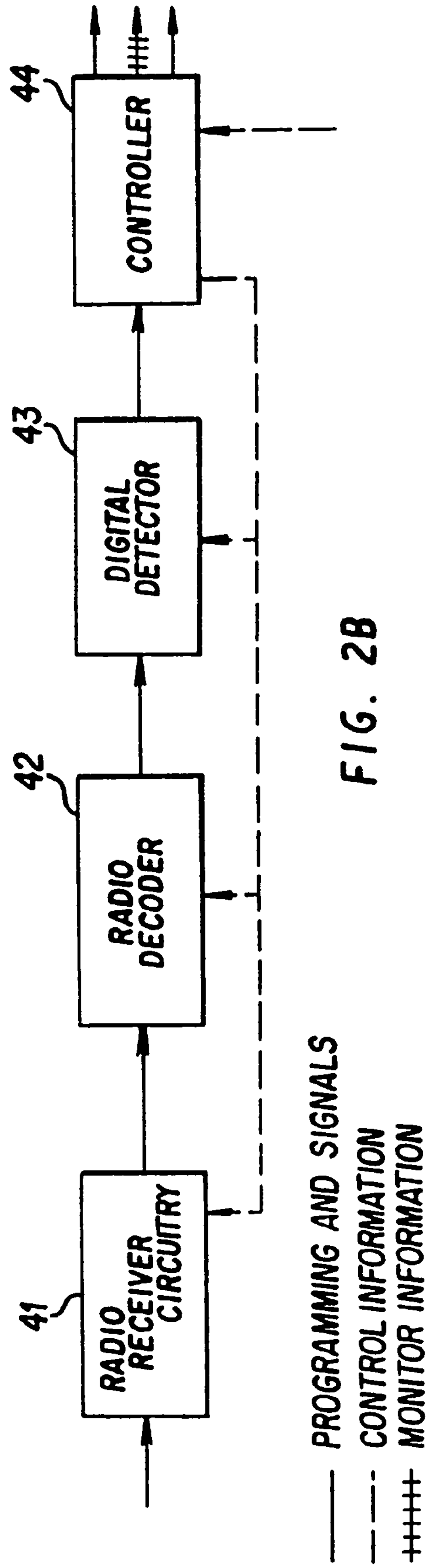
FIG. 2B is a block diagram of a radio signal decoder apparatus.
Figure 2C:
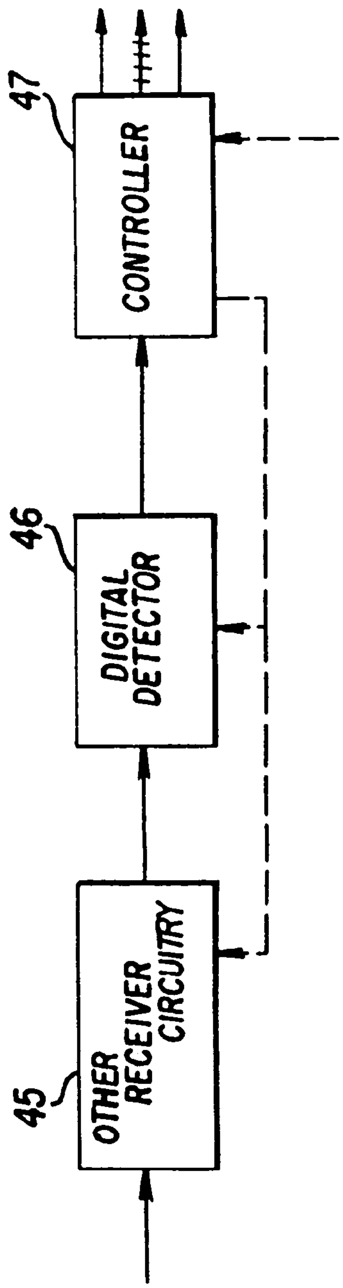
FIG. 2C is a block diagram of an other signal decoder apparatus.
Figure 2D:
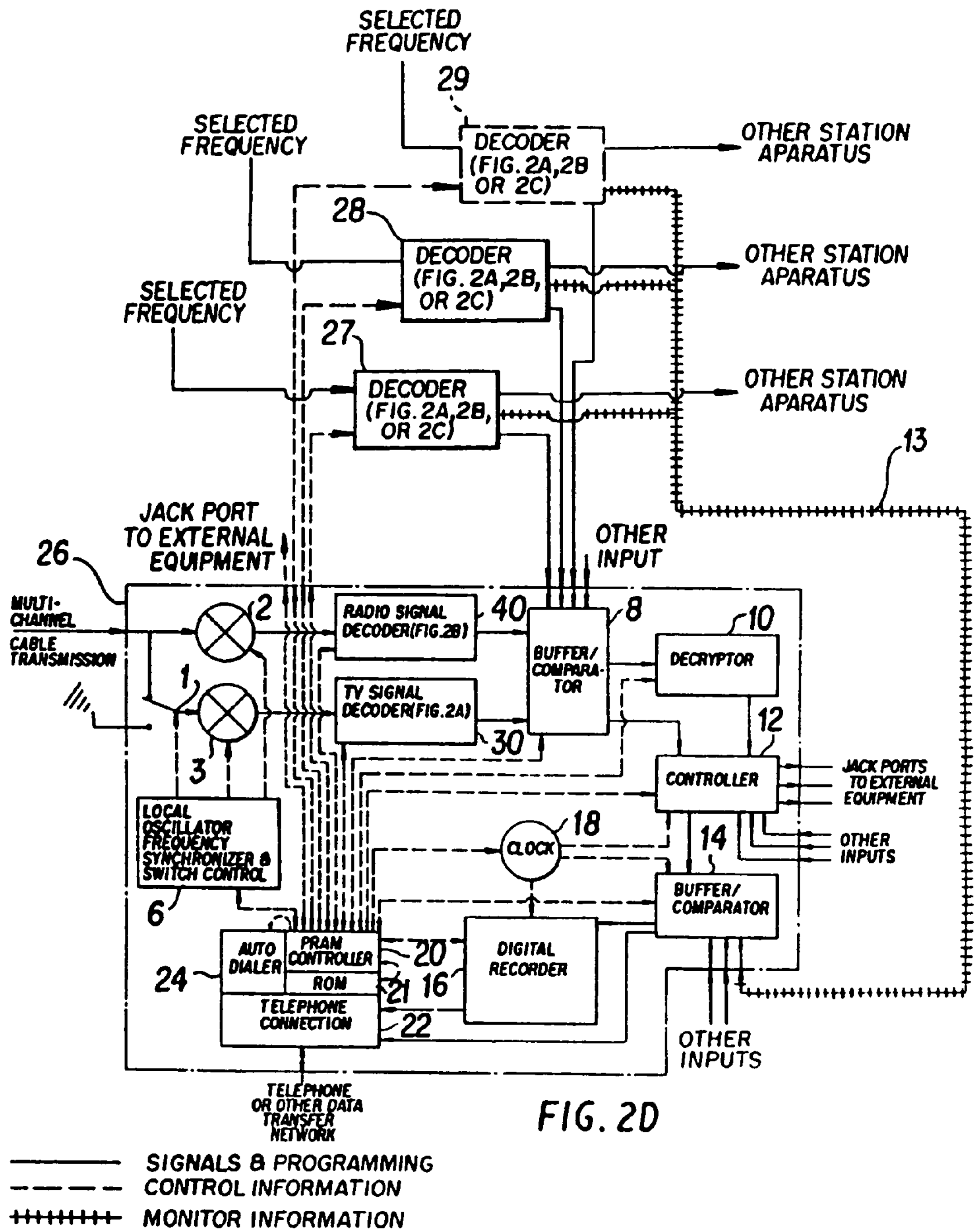
FIG. 2D is a block diagram of one embodiment of a receiver station signal processing system.
Figure 6A:
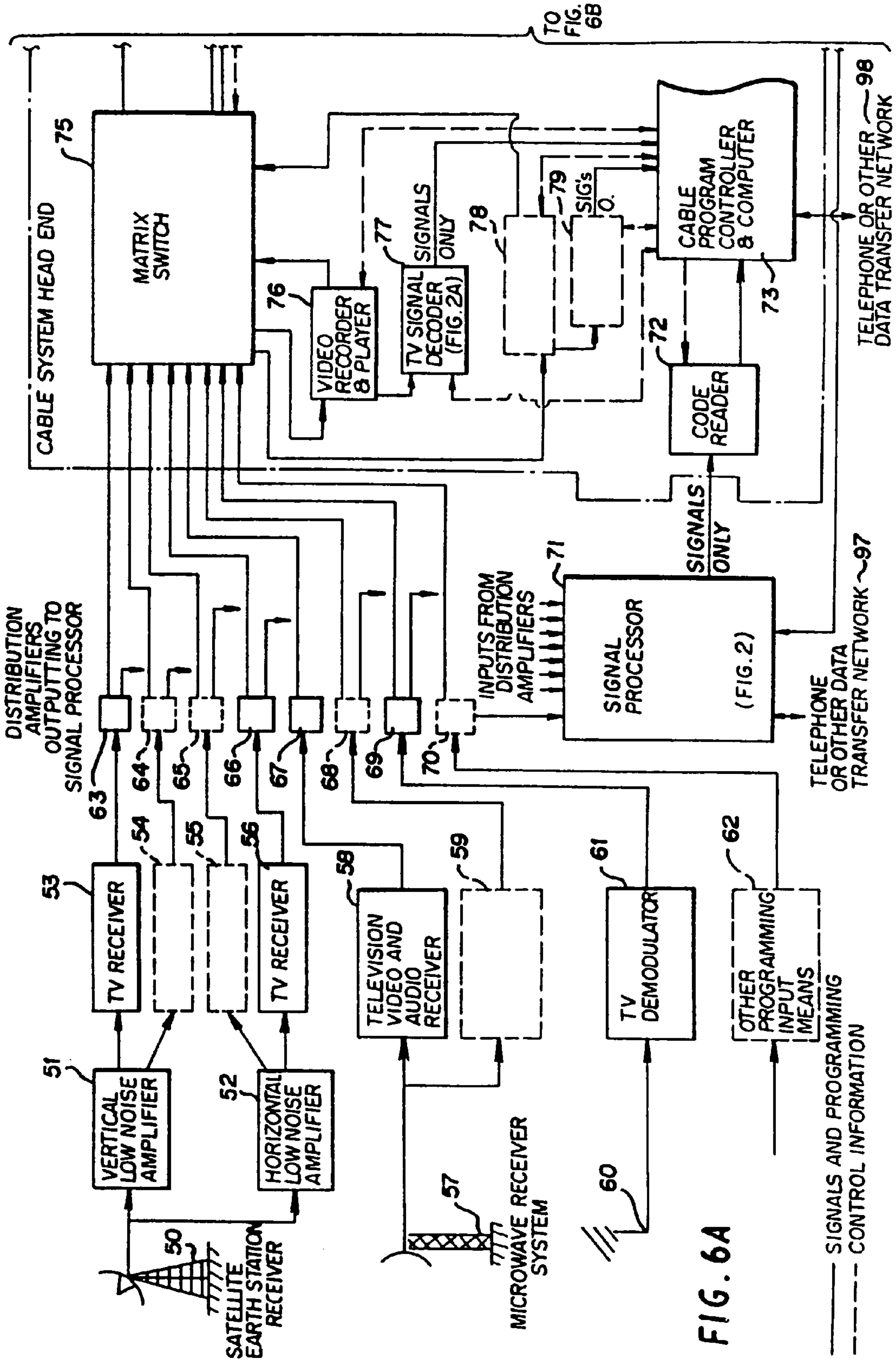
FIG. 6 is a block diagram of one example of signal processing apparatus and methods at an intermediate transmission station, in this case a cable system headend.
Figure 6B:
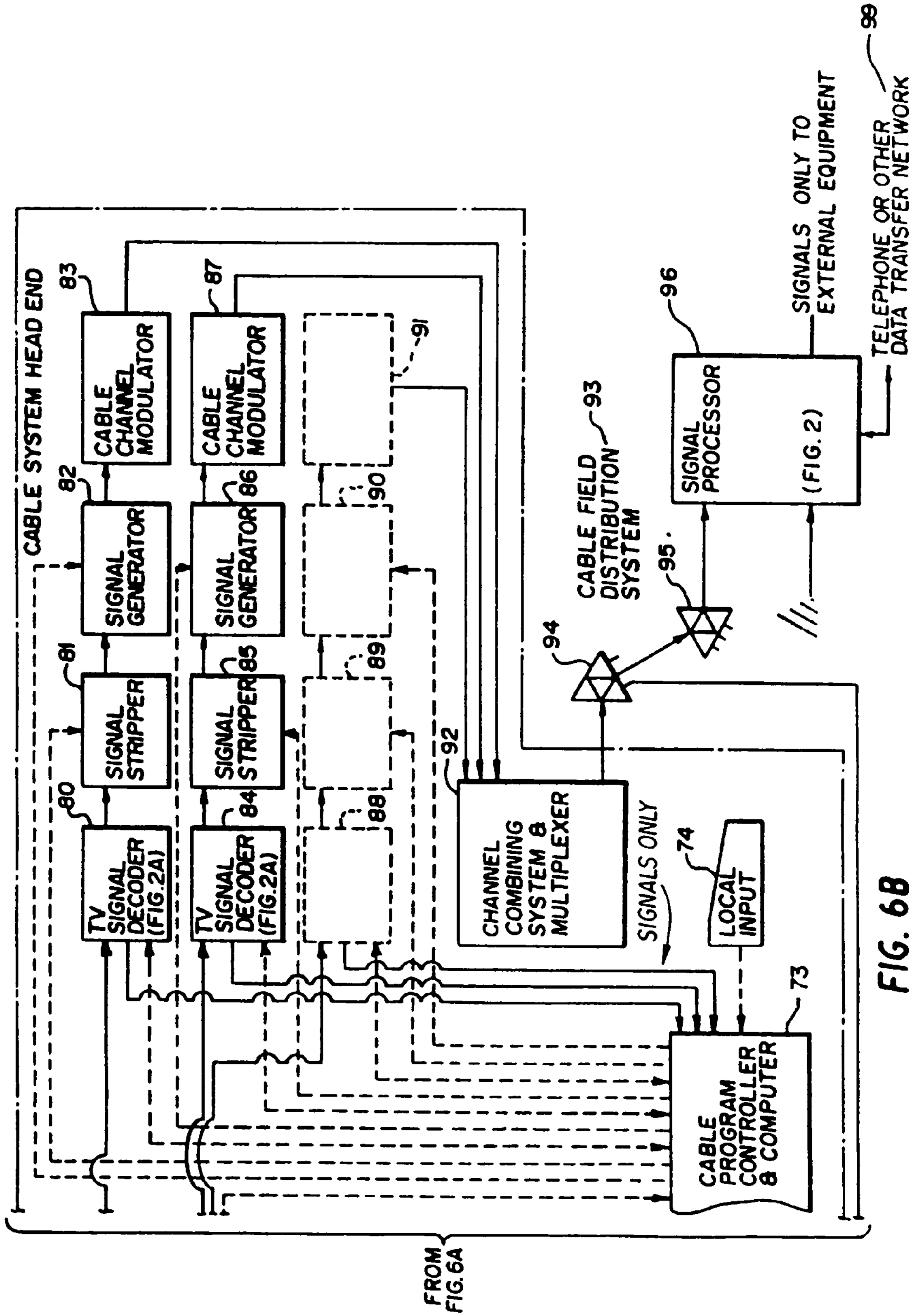
Figure 7:
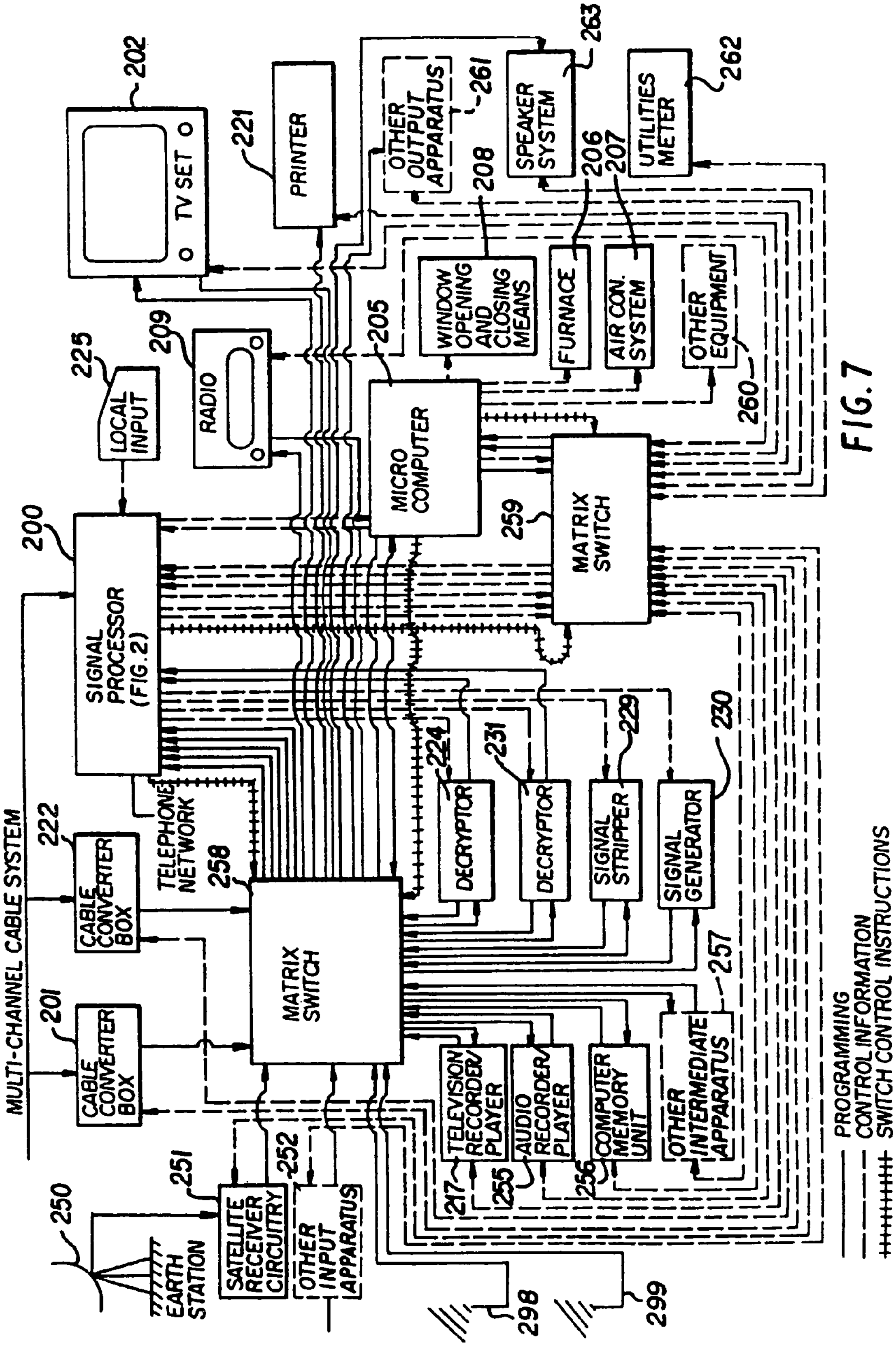
FIG. 7 is a block diagram of signal processing apparatus and methods at an ultimate receiver station.

In the present invention, the signal processor—26 in FIG. 2; 26 in the signal processor system of FIG. 2D; in the signal processor system, 71, of FIG. 6; 200 in FIG. 7; and elsewhere—is focal means for the controlling and monitoring subscriber station operations. It meters communications and enables owners of information to offer their information to subscribers in many fashions on condition of payment. It has capacity for regulating communications consumption by selectively decrypting or not decrypting encrypted programming and/or control signals and capacity for assembling and retaining meter records at each subscriber station that document the consumption of specific programming and information at said station. It has capacity for identifying the subject matter of each specific unit of programming available on each of many transmission channels at each subscriber station as said unit becomes available for use and/or viewing which enables subscriber station apparatus to determine automatically whether the subject matter of said unit is of interest and, if so, to tune automatically to said programming. It has capacity, at each station, for receiving monitor information that identifies what programming is available, what programming is used, and how said programming is used and capacity for assembling and retaining monitor records that document said availability and usage. It has capacity for transferring said meter records automatically to one or more remote automated billing stations that account for programming and information consumption and bill subscribers and said monitor records automatically to one or more remote so-called "ratings" stations that collect statistical data on programming availability and usage. It has capacities for processing information in many other fashions that will become apparent in this full specification.

FIG. 2 shows one embodiment of a signal processor. Said processor, 26, is configured for simultaneous use with a cablecast input that conveys both television and radio programming and a broadcast television input.

At switch, 1, and mixers, 2 and 3, signal processor, 26, monitors all frequencies or channels available for reception at the subscriber station of FIG. 2 to identify available programming. The inputted information is the entire range of frequencies or channels transmitted on the cable and the entire range of broadcast television transmissions available to a local television antenna of conventional design. The cable transmission is inputted simultaneously to switch, 1, and mixer, 2. The broadcast transmission is inputted to switch, 1. Switch, 1, and mixers, 2 and 3, are all controlled by local oscillator and switch control, 6. The oscillator, 6, is controlled to provide a number of discrete specified frequencies for the particular radio and television channels required. The switch, 1, acts to select the broadcast input or the cablecast input and passes transmissions to mixer, 3, which, with the controlled oscillator, 6, acts to select a television frequency of interest that is passed at a fixed frequency to a TV signal decoder, 30. Simultaneously, mixer, 2, and the controlled oscillator, 6, act to select a radio frequency of interest which is inputted to a radio signal decoder, 40.

At decoders, 30 and 40, signal processor, 26, identifies specific programming and its subject matter as said programming becomes available for use and/or viewing. Decoder, 30, which is shown in detail in FIG. 2A, and decoder, 40, which is shown in FIG. 2B, detect signal information embedded in the respective inputted television and radio frequencies, render said information into digital signals that subscriber station apparatus can process, modify particular ones of said signals through the addition and/or deletion of particular information, and output said signals and said modified signals to buffer/comparator, 8. Said decoders are considered more fully below.

Buffer/comparator, 8, receives said signals from said decoders and other signals from other inputs and organizes the received information in a predetermined fashion. Buffer/comparator, 8, has capacity for comparing a particular portions or portions of inputted information to particular preprogrammed information and for operating in preprogrammed fashions on the basis of the results of said comparing. It has capacity for detecting particular end of file signals in inputted information and for operating in preprogrammed fashions whenever said information is detected.

The process of communication metering commences at buffer/comparator, 8. In a predetermined fashion, buffer/comparator, 8, determines whether a given instance of received signal information requires decryption, either in whole or in part. In a fashion described more fully below, buffer/comparator, 8, and a controller, 20, which, too, is described more fully below, determine whether signal processor, 26, is enabled to decrypt said information. If signal processor, 26, is so enabled, buffer/comparator, 8, transfers said information to decryptor, 10. If signal processor, 26, is not so enabled, buffer/comparator, 8, discards said information in a predetermined fashion. Buffer/comparator, 8, transfers signals that do not require decryption directly to processor or controller, 12.

Decryptor, 10, is a standard digital information decryptor, well known in the art, that receives signals from buffer/comparator, 8, and under control of said controller, 20, uses conventional decryptor techniques, well known in the art, to decrypt said signals as required. Decryptor, 10, transfers decrypted signals to controller, 12.

Controller, 12, is a standard controller, well known in the art, that has microprocessor and RAM capacities and one or more ports for transmitting information to external apparatus. Said microprocessor capacity of controller, 12, is of a conventional type, well known in the art, but is specifically designed to have particular register memories, discussed more fully below. Controller, 12, may contain read only memory (hereinafter, "ROM").

Controller, 12, receives the signals inputted from buffer/comparator, 8, and decryptor, 10; analyzes said signals in a predetermined fashion; and determines whether they are to be transferred to external equipment or to buffer/comparator, 14, or both. If a signal or signals are to be transferred externally, in a predetermined fashion controller, 12, identifies the external apparatus to which the signal or signals are addressed and transfers them to the appropriate port or ports for external transmission. If they contain meter and/or monitor information and are to be processed further, controller, 12, selects, assembles, and transfers the appropriate information to buffer/comparator, 14. Controller, 12, has capacity to modify received signals by adding and/or deleting information and can transfer a given signal to one apparatus with one modification and to another apparatus with another modification (or with no modification). Controller, 12, receives time information from clock, 18, and has means to delay in a predetermined fashion the transfer of signals when, in a predetermined fashion, delayed transfer is determined to be required.

Buffer/comparator, 14, receives signal information that is meter information and/or monitor information from controller, 12, and from other inputs; organizes said received information into meter records and/or monitor records (called, in aggregate, hereinafter, "signal records") in a predetermined fashion or fashions; and transmits said signal records to a digital recorder, 16, and/or to one or more remote sites. With respect to particular simple or frequently repeated instances of signal information, buffer/comparator, 8, has capacity to determine, in a predetermined fashion or fashions, what received information should be recorded, how it should be recorded, and when it should be transmitted to recorder, 16, and/or to said remote sites and to initiate or modify signal records and to discard unnecessary information accordingly. To avoid overloading digital recorder, 16, with duplicate data, buffer/comparator, 14, has means for counting and/or discarding duplicate instances of particular signal information and for incorporating count information into signal records. Buffer/comparator, 14, receives time information from clock, 18, and has means for incorporating time information into signal records. Buffer/comparator, 14, also has means for transferring received information immediately to a remote site or sites via telephone connection, 22, and for communicating a requirement for such transfer to controller, 20, which causes such transfer. Buffer/comparator, 14, operates under control of controller, 20, and has capacity whereby controller, 20, can cause modification of the formats of and information in signal records at buffer/comparator, 14. (In circumstances where information collecting and processing functions are extensive—for example, when a given buffer/comparator, 14, must collect monitor information at a subscriber station with apparatus and/or communications flows that are extensive and complex—buffer/comparator, 14, may operate under control of a dedicated, so-called "on-board" controller, 14A, at buffer/comparator, 14, which is preprogrammed with appropriate control instructions and is controlled by controller, 20, similarly to the fashion in which controller, 12 is controlled by controller, 20.)

Digital recorder, 16, is a memory storage element of standard design that receives information from buffer/comparator, 14, and records said information in a predetermined fashion. In a predetermined fashion, recorder, 16, can determine how full it is and transmit this information to controller, 20. Recorder, 16, may inform controller, 20, automatically when it reaches a certain level of fullness.

Signal processor, 26, has a controller device which includes programmable RAM controller, 20; ROM, 21, that may contain unique digital code information capable of identifying signal processor, 26, and the subscriber station of said processor, 26, uniquely; an automatic dialing device 24; and a telephone unit, 22. A particular portion of ROM, 21, is erasable programmable ROM (hereinafter, "EPROM") or other forms of programmable nonvolatile memory. Under control particular preprogrammed instructions at that portion of ROM, 21, that is not erasable, signal processor, 26, has capacity to erase and reprogram said EPROM in a fashion that is described more fully below. Controller, 20, has capacity for controlling the operation of all elements of the signal processor and can receive operating information from said elements. Controller, 20, has capacity to turn off any element or elements of controlled subscriber station apparatus, in whole or in part, and erase any or all parts of erasable memory of said controlled apparatus.

As an apparatus in the unified system of programming communication of the present invention, a signal processor can monitor any combination of inputs and transmission frequencies, and the signal processor of FIG. 2 is but one embodiment of a signal processor. Other embodiments can receive and monitor available programming in transmission frequencies other than radio and television frequencies through the addition of one or more other signal decoders such as that of FIG. 2C described below. Embodiments can receive one or more fixed frequencies continuously at one or more decoders that monitor for available programming. For certain applications, one particular embodiment (hereinafter, "signal processor alternative #1") can be configured to receive only other inputs at buffer/comparator, 8, in which case said embodiment has no oscillator, 6; switch, 1; mixers, 2 and 3; or decoders, 30 or 40. For other particular applications, another particular embodiment (hereinafter, "signal processor alternative #2") can be configured to receive only inputs at buffer/comparator, 14, in which case said embodiment has only buffer/comparator, 14; recorder, 16; clock, 18; and the control device apparatus associated with controller, 20. Other signal processor embodiments will become apparent in this full specification. Which particular embodiment of signal processor is preferred at any given subscriber station depends on the particular communications requirements of said station.

Signal Decoders

Signal decoder apparatus such as decoder, 203, in FIG. 1 and decoders, 30 and 40, in FIG. 2 are basic in the unified system of this invention.

FIG. 2A shows a TV signal decoder that detects signal information embedded in an inputted television frequency, renders said information into digital signals that subscriber station apparatus can process, identifies the particular apparatus to which said signals are addressed, and outputs said signals to said apparatus. Decoder, 203, in FIG. 1 is one such TV signal decoder; decoder, 30, in FIG. 2 is another.

In FIG. 2A, a selected frequency is inputted at a fixed frequency to said decoder at filter, 31, which defines the particular channel of interest to be analyzed. The television channel signal then passes to a standard amplitude demodulator, 32, which uses standard demodulator techniques, well known in the art, to define the television base band signal. This base band signal is then transferred through separate paths to three separate detector devices. The apparatus of these separate paths are designed to act on the particular frequency ranges in which embedded signal information may be found. The first path, designated A, detects signal information embedded in the video information portion of said television channel signal. Path A inputs to a standard line receiver, 33, well known in the art. Said line receiver, 33, receives the information of one or more of the lines normally used to define a television picture. It receives the information only of that portion or portions of the overall video transmission and passes said information to a digital detector, 34, which acts to detect the digital signal information embedded in said information, using standard detection techniques well known in the art, and inputs detected signal information to controller, 39, which is considered in greater detail below. The second path, designated B, detects signal information embedded in the audio information portion of said television channel signal. Path B inputs to a standard audio demodulator, 35, which uses demodulator techniques, well known in the art, to define the television audio transmission and transfers said audio information to high pass filter, 36. Said filter, 36, defines and transfers to digital detector, 37, the portion of said audio information that is of interest. The digital detector, 37, detects signal information embedded in said audio information and inputs detected signal information to controller, 39. The third path, designated C, inputs the separately defined transmission to a digital detector, 38, which detects signal information embedded in any other information portion of said television channel signal and inputs detected signal information to controller, 39. Line receiver, 33; high pass filter, 36; detectors, 34, 37, and 38; and controller, 39, all operate under control of controller, 39, and in preprogrammed fashions that may be changed by controller, 39.

FIG. 2B shows a radio signal decoder that detects and processes signal information embedded in an inputted radio frequency. Decoder, 40, in FIG. 2 is one such radio signal decoder. A selected frequency of interest is inputted at a fixed frequency to standard radio receiver circuitry, 41, which receives the radio information of said frequency using standard radio receiver techniques, well known in the art, and transfers said radio information to radio decoder, 42. Radio decoder, 42, decoders the signal information embedded in said radio information and transfers said decoded information to a standard digital detector, 43. Said detector, 43, detects the binary signal information in said decoded information and inputs said signal information to controller, 44, discussed more fully below. Circuitry, 41; decoder, 42; and detector, 43, all operate under control of controller, 44, and in predetermined fashions that may be changed by controller, 44.

FIG. 2C shows a signal decoder that detects and processes signal information embedded in a frequency other than a television or radio frequency. A selected other frequency (such as a microwave frequency) is inputted to appropriate other receiver circuitry, 45, well known in the art. Said receiver circuitry, 45, receives the information of said frequency using standard receiver techniques, well known in the art, and transfers said information to an appropriate digital detector, 46. Said detector, 46, detects the binary signal information in said information and inputs said signal information to controller, 47, considered more fully below. Circuitry, 45, and detector, 46, operate under control of controller, 47, and in predetermined fashions that may be changed by controller, 47.

Each decoder is controlled by a controller, 39, 44, or 47, that has buffer, microprocessor, ROM, and RAM capacities. Said buffer capacity of controller, 39, 44, or 47, includes capacity for receiving, organizing, and storing simultaneous inputs from multiple sources while inputting information, received and stored earlier, to said microprocessor capacity of controller, 39, 44, or 47. Said microprocessor capacity of controller, 39, 44, or 47, is of a conventional type, well known in the art, and is specifically designed to have particular register memories, discussed more fully below, including register capacity for detecting particular end of file signals in inputted information. The ROM capacity of controller, 39, 44, or 47, contains microprocessor control instructions of a type well known in the art and includes EPROM capacity. Said ROM and/or said EPROM may also contain one or more digital codes capable of identifying its controller, 39, 44, or 47, uniquely and/or identifying particular subscriber station functions of said controller, 39, 44, or 47. The RAM capacity of controller, 39, 44, or 47, constitutes workspace that the microprocessor of said controller, 39, 44, or 47, can use for intermediate stages of information processing and may also contain microprocessor control instructions. Capacity exists at said controller, 39, 44, or 47, for erasing said EPROM, and said RAM and said EPROM are reprogrammable.

Controller, 39, 44, or 47, is preprogrammed to receive units of signal information, to assemble said units into signal words that subscriber station apparatus can receive and process, and to transfer said words to said apparatus. In each decoder, the controller, 39, 44, or 47, receives detected digital information from the relevant detector or detectors, 34, 37, 38, 43, and 46. Upon receiving any given instance of signal information, controller, 39, 44, or 47, is preprogrammed to process said information automatically. Controller, 39, is preprogrammed to discard received duplicate, incomplete, or irrelevant information; to correct errors in retained received information by means of forward error correction techniques well known in the art; to convert, as may be required, the corrected information, by means of input protocol techniques well known in the art, into digital information that subscriber station apparatus can receive and process; to modify selectively particular corrected and converted information in a predetermined fashion or fashions; to identify in a predetermined fashion or fashions subscriber station apparatus to which said signal information should be transferred; and to transfer said signals to said apparatus. Said controller, 39, 44, or 47, has one or more output ports for communicating signal information to said apparatus.

Controller, 39, 44, or 47, has capacity for identifying more than one apparatus to which any given signal should be transferred and for transferring said signal to all said apparatus. It has capacity for recording particular signal information in particular register memory and for transferring a given signal to one apparatus, modifying it and transferring it to a second apparatus, and modifying it again and transferring it to a third apparatus.

As described above, said controller, 39, 44, or 47, controls particular apparatus of its signal decoder and has means for communicating control information to said apparatus. Said controller, 39, 44, or 47, also has means for communicating control information with a controller, 20, of a signal processor, 26. (Said communicating means is shown clearly in FIG. 2D which is discussed below.) Via said communicating means and under control of instructions and signals discussed more fully below, said controller, 20, has capacity to cause information at said EPROM to be erased and to reprogram said microprocessor control instructions at said RAM and said EPROM.

The Signal Processor System

Signal processing apparatus and methods involve an extended subscriber station system focused on the signal processor. Said system includes external signal decoders.

FIG. 2D shows one embodiment of a signal processing system. Said system contains signal processor, 26, and external decoders, 27, 28, and 29. Each said external decoder may be a TV signal decoder (FIG. 2A) or a radio signal decoder (FIG. 2B) or an other signal decoder (FIG. 2C) depending on the nature of the selected frequency inputted. As FIG. 2D shows, each decoder, 27, 28, and 29, receives one selected frequency and has capacity for transferring detected, corrected, converted, and possibly modified signals to signal processor, 26, at buffer/comparator, 8, and also to other station apparatus. Each decoder, 27, 28, and 29, also has capacity for transferring detected, corrected, converted, and possibly modified monitor information to signal processor, 26, at buffer/comparator, 14. As FIG. 2D shows, controller, 20, has capacity to control all decoder apparatus, 27, 28, 29, 30, and 40. Controller, 20, has capacity to preprogram (or reprogram) all said decoder apparatus, 27, 28, 29, 30, and 40, and thereby controls the fashions of detecting, correcting, converting, modifying, identifying, transferring, and other functioning of said decoders.

Not every installed decoder in said signal processor system requires all the apparatus and system capacity of FIGS. 2A, 2B, and 2C. For example, because a television base band signal is inputted to decoder, 203 of FIG. 1, said decoder does not require filter, 31, and demodulator, 32, of FIG. 2A. Likewise, because decoders, 30 and 40 of FIG. 2, transfer signals only to buffer/comparator, 8, said decoders do not require capacity to transfer signals to any other apparatus, and controllers, 39 and 44, of said decoders are preprogrammed only to identify whether or not any given signal should be transferred to buffer/comparator, 8. The precise apparatus and operating fashions of any given decoder is commensurate with the operating requirements of the installation and subscriber station of said decoder.

FIG. 2D shows decoders, 27, 28, and 29, communicating monitor information to buffer/comparator, 14, of signal processor, 26, by means of bus, 13. Said bus, 13, communicates information in a fashion well known in the art, and said decoders, 27, 28, and 29, gain access to the shared transmission facility of said bus, 13, using access methods, such as contention, that are well known in the art. Controllers, 12 and 20 of FIG. 2, 39 of FIG. 2A, 44 of FIG. 2B, and 47 of FIG. 2C, all have capacity to transfer signal information by bus means. Buffer/comparator, 8 and 14, and controller, 12, of FIG. 2 all have capacity to receive other input information from bus means. Furthermore, all apparatus of FIG. 2 and of FIG. 2D can have capacity to communicate control information by one or more bus means.

Introduction to the Signals of the Integrated System

The signals of the present invention are the modalities whereby stations that originate programming transmissions control the handling, generating, and displaying of programming at subscriber stations.

(The term, "SPAM," is used, hereinafter, to refer to signal processing apparatus and methods of the present invention.)

SPAM signals control and coordinate a wide variety of subscriber stations. Said stations include so-called "local affiliate" broadcast stations that receive and retransmit single network transmissions; so-called "cable system headends" that receive and retransmit multiple network and local broadcast station transmissions; and so-called "media centers" in homes, offices, theaters, etc. where subscribers view programming. (Hereinafter, stations that originate broadcast transmissions are called "original transmission stations," stations that receive and retransmit broadcast transmissions are called "intermediate transmission stations", and stations where subscribers view programming are called "ultimate receiver stations.")

At said stations, SPAM signals address, control, and coordinate diverse apparatus, and the nature and extent of the apparatus installed at any given station can vary greatly. SPAM signals control not only various kinds of receivers and tuners; transmission switches and channel selectors; computers; printers and video and audio display apparatus; and video, audio, and digital communications transmission recorders but also signal processor system apparatus including decoders; decryptors; control signal switching apparatus; and the communications meters, called signal processors, of the present invention. Besides apparatus for communicating programming to viewers, SPAM signals also address and control subscriber station control apparatus such as, for example, furnace control units whose operations are automatic and are improved with improved information and subscriber station meter apparatus such as, for example, utilities meters that collect and transmit meter information to remote metering stations.

The information of SPAM signals includes data, computer program instructions, and commands. Data and program instructions are often recorded in computer memories at subscriber stations for deferred execution. Commands are generally for immediate execution and often execute computer programs or control steps in programs already in process. Often said data, programs, and commands control subscriber station apparatus that automatically handle, decrypt, transmit, and/or present program units of conventional television, radio, and other media.

In combined medium communications, SPAM signals also control subscriber station apparatus in the generating and combining of combined medium programming. At ultimate receiver stations, particular combined medium commands and computer programs cause computers to generate user specific programming and display said programming at television sets, speaker systems, printers, and other apparatus. (Hereinafter, instances of computer program information that cause ultimate receiver station apparatus to generate and display user specific information are called "program instruction sets.") At intermediate transmission stations, other commands and computer programs cause computers to generate and transmit program instruction sets. (Hereinafter, instances of computer program information that cause intermediate transmission station apparatus to generate program instruction set information and/or command information are called "intermediate generation sets.")

In combined medium communications, particular SPAM commands control the execution of intermediate generation sets and program instruction sets and the transmission and display of information generated by said sets. Whether said commands control apparatus at intermediate transmission stations, ultimate receiver stations, or both, the function of said commands is to control and synchronize disparate apparatus efficiently in the display of combined medium programming at ultimate receiver stations. (Accordingly, all said commands are called "combining synch commands" in this specification.) Most often, combining synch commands synchronize steps of simultaneous generating of station specific information at pluralities of stations and/or steps of simultaneous combining at pluralities of stations (which steps of combining are, more specifically, steps of simultaneous transmitting at each station of said pluralities of separate information into combined transmissions), all of which steps are timed to control simultaneous display of user specific combined medium information at each station of pluralities of ultimate receiver stations.

The present invention provides a unified signal system for addressing, controlling, and coordinating all said stations and apparatus. One objective of said system is to control diverse apparatus in the speediest and most efficient fashions. A second objective is to communicate control information in forms that have great flexibility as regards information content capacity. A third objective is to communicate information in compact forms, thereby maximizing the capacity of any given transmission means to communicate signal information.

Yet another objective is expandability. As the operating capacities of computer hardware have grown in recent decades, increasingly sophisticated software systems have been developed to operate computers. Often incompatibilities have existed between newly developed operating system software and older generations of computer hardware. It is the objective of the system of signal composition of the present invention to have capacity for expanding to accommodate newly developed subscriber station hardware while still serving older hardware generations. In practice this means that the unified system of signals does not consist, at any one time, of one fixed and immutable version of signal composition. Rather it is a family of compatible versions. At any given time, some versions communicate signal information to only the newest or most sophisticated subscriber station apparatus while at least one version communicates to all apparatus. Accordingly, this specification speaks of "simple preferred embodiments" and "the simplest preferred embodiment" rather than just one preferred embodiment. How the various versions and embodiments relate to and are compatible with one another is made clear below.

The Composition of Signal Information . . . Commands, Information Segments, and Padding Bits SPAM signals contain binary information of the sort well know in the art including bit information required for error correction using forward error correction techniques, well known in the art, in point to multi-point communications; request retransmission techniques, well known in the art, in point to point communications; and/or other error correction techniques, as appropriate.

Figure 2E:
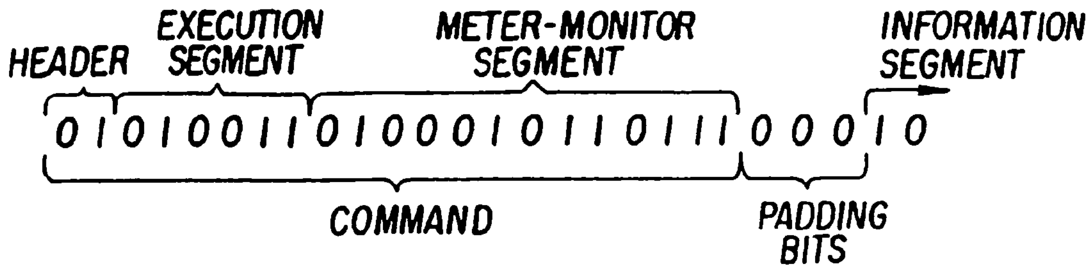
FIG. 2E illustrates one example of the composition of signal information and shows the initial binary information of a message that contains execution, meter-monitor, and information segments.

FIG. 2E shows one example of the composition of signal information (excluding bit information required for error detection and correction). The information in FIG. 2E commences with a header which is particular binary information that synchronizes all subscriber station apparatus in the analysis of the information pattern that follows. Following said header are three segments: an execution segment, a meter-monitor segment, and an information segment. As FIG. 2E shows, the header and execution and meter-monitor segments constitute a command.

A command is an instance of signal information that is addressed to particular subscriber station apparatus and that causes said apparatus to perform a particular function or functions. A command is always constituted of at least a header and an execution segment. With respect to any given command, its execution segment contains information that specifies the apparatus that said command addresses and specifies a particular function or functions that said command causes said apparatus to perform. (Hereinafter, functions that execution segment information causes subscriber station apparatus to perform are called "controlled functions.")

Commands often contain meter-monitor segments. Said segments contain meter information and/or monitor information, and the information of said segments causes subscriber station signal processor systems to assemble, record, and transmit meter records to remote billing stations and monitor records to remote ratings stations in fashions that are described more fully below.

Particular commands (called, hereinafter, "specified condition commands") always contain meter-monitor segments. Said commands cause addressed apparatus to perform controlled functions only when specified conditions exist, and meter-monitor information of said commands specifies the conditions that must exist.

In simple preferred embodiments, at any given time the number of binary information bits in any given instance of header information is a particular constant number. In other words, every header contains the same number of bits. In the simplest preferred embodiment, said constant number is two, all headers consist of two bits binary information, and commands are identified by one of three binary headers:

10—a command with an execution segment alone;

00—a command with execution and meter-monitor segments; and

01—a command with execution and meter-monitor segments that is followed by an information segment.

Execution segment information includes the subscriber station apparatus that the command of said segment addresses and the controlled functions said apparatus is to perform. ("ITS" refers, hereinafter, to intermediate transmission station apparatus, and "URS" refers to ultimate receiver station apparatus.) Examples of addressed apparatus include:

- ITS signal processors (in 71 in FIG. 6),
- ITS controller/computers (73 in FIG. 6),
- URS signal processors (200 in FIG. 7),
- URS microcomputers (205 in FIG. 7),
- URS printers (221 in FIG. 7), and
- URS utilities meters (262 in FIG. 7).

Examples of controlled functions include:

- Load and run the contents of the information segment.
- Decrypt the execution segment using decryption key G.
- Decrypt the execution and meter-monitor segments using decryption key J.
- Commence the video overlay combining designated in the meter-monitor segment.
- Modify the execution segment to instruct URS microcomputer, 205, to commence overlay designated in meter-monitor segment, record the contents of the execution and meter-monitor segments, and transfer command to URS microcomputer, 205.
- Print the contents of the information segment.
- Record the contents of the execution and meter-monitor segments; transfer them to URS decryptors, 224, and execute the preprogrammed instructions that cause URS decryptors, 224, to commence decrypting with said contents as decryption key; execute preprogrammed instructions that cause URS cable converter boxes, 222, to switch to cable channel Z; execute preprogrammed instructions that cause URS matrix switches, 258, to configure its switches to transfer the input from converter boxes, 222, to decryptors, 224, and the output from decryptors, 224, to microcomputers, 205; modify the execution segment to instruct URS microcomputers, 205, to commence loading and executing the information received from URS decryptors, 224 via URS switches, 258.

Commands can address many apparatus and execute many controlled functions. The apparatus and functions listed here are only examples. Other addressable apparatus and controlled functions will become apparent in this full specification.

Execution segment information operates by invoking preprogrammed operating instructions that exist at each subscriber station apparatus that is addressed. For example, a command to URS microcomputers, 205, to load and run the contents of the information segment following said command causes each URS microcomputer, 205, to commence processing particular instructions for loading and running that are preprogrammed at each URS microcomputer, 205.

For each appropriate addressed apparatus and controlled function combination a unique execution segment binary information value is assigned. Said command to URS microcomputers, 205, to load and run is, for example, one appropriate combination and is assigned one particular binary value that differs from all other execution segment information values. In the assignment process, no values are assigned to inappropriate combinations. For example, URS signal processors, 200, have no capacity to overlay, and no execution segment information value exists to cause URS signal processors, 200, to overlay.

For any given command, the execution segment information of said command invokes, at each relevant subscriber station apparatus, the preprogrammed operating instructions uniquely associated with its particular binary value in particular comparing and matching fashions that are described more fully below.

The determination of appropriate addressed apparatus and controlled function combinations takes into account the facts that different apparatus, at any given subscriber station, can be preprogrammed to interpret any given instance of execution segment information differently and that subscriber station apparatus can be preprogrammed to automatically alter execution segment information. For example, if signal processors, 200, are preprogrammed to process commands received at controller, 12, differently from commands received at buffer/comparator, 8, the assignment system can reduce the number of required binary values. As a more specific example, buffer/comparator, 8, receives a hypothetical command with a particular execution segment (e.g., "101110") which means "URS signal processors, 200, decrypt the execution and meter-monitor segments using decryption key J." After being decrypted and transferred to controller, 12, the particular execution segment information that controller, 12, receives (e.g., "011011") means "URS microcomputers, 205, commence overlay designated in meter-monitor segment." The controlled functions that signal processor, 200, performs are the same as those listed above in the example that begins, "Modify the . . . ," and no separate binary value is necessary for invoking these controlled functions at URS microcomputers, 200.

The preferred embodiment includes one appropriate command (hereinafter called the "pseudo command") that is addressed to no apparatus and one command that is addressed to URS signal processors, 200, (hereinafter, the "meter command") but does not instruct said processors, 200, to perform any controlled function. These commands are always transmitted with meter-monitor segment data that receiver station apparatus automatically process and record. By transmitting pseudo command and meter command signals, transmission stations cause receiver station apparatus to record meter-monitor segment information without executing controlled functions. The pseudo command enables a so-called ratings service to use the same system for gathering ratings on conventional programming transmissions that it uses for combined media without causing combined media apparatus to execute controlled functions at inappropriate times (eg., combine overlays onto displays of conventional television programming). The meter command causes apparatus such as controller, 12, of FIG. 2D to transmit meter information to buffer/comparator, 14, without performing any controlled function.

In the preferred embodiment, at any given time the number of binary information bits in any given instance of execution segment information is a particular constant number. In other words, every execution segment contains the same number of bits. Said constant number is the smallest number of bits capable of representing the binary value of the total number of appropriate addressed apparatus and controlled function combinations. And each appropriate combination is assigned a unique binary value within the range of binary numbers thus defined.

Meter-monitor segments contain meter information and/or monitor information. Examples of categories of such information include:

- meter instructions that instruct subscriber station meter apparatus to record particular meter-monitor segment information and maintain meter records of said information;
- origins of transmissions (eg., network source stations, broadcast stations, cable head end stations);
- dates and times;
- unique identifier codes for each program unit (including commercials);
- codes that identify uniquely each combining in a given combined medium program unit;
- codes that identify the subject matter of a program unit;
- unique codes for programming (other than programming identified by program unit codes) whose use obligates users to make payments (eg., royalties and residuals); and
- unique codes that identify the sources and suppliers of computer data.

The categories listed here provide only examples. Other types of information can exist in meter information and/or in monitor information, as will become apparent in this full specification.

For each category of information, a series of binary bits (hereinafter, a "field" or "meter-monitor field") exists in the meter-monitor segment to contain the information. In any given category such as origins of transmissions, each distinct item such as each network source, broadcast, or cable head end station has a unique binary information code. In the preferred embodiment, the number of information bits in that category's meter-monitor field is the smallest number of bits capable of representing the binary value of the total number of distinct items. And the information code of each distinct item is within the range of binary numbers thus defined. In the preferred embodiment, date and time fields have sixteen bits.

Few commands require meter-monitor information of every information category. Often commands require no more than the identification codes of a specific combined medium program unit and of a specific combined medium combining within said program unit.

Because the amount of information in meter-monitor segments varies from command to command, in the preferred embodiment more than one format exists at any given time for meter-monitor segment information. For example, one meter-monitor segment may contain origin of transmission, transmission date and time, and program unit information. A second may contain program unit and combining identification information. The first is transmitted in a format of three specific fields. The second is transmitted in a different format. It is even possible for different formats to exist for the same meter-monitor field. For example, one instance of date and time information designates a particular day in a particular one hundred year period. Another designates a particular hour in a particular ninety day period.

Because the number of categories of meter-monitor information varies from one command to the next, the length of meter-monitor segments varies. Unlike execution segments which, at any given time, all contain the same number of information bits, the bit length of meter-monitor segments varies. One segment may contain five fields, totaling 275 bits in length. Another may contain two fields and 63 bits. A third may contain three fields and 63 bits. Bit length is not necessarily tied to the number of fields. And at any given time, a number of different meter-monitor segment bit length alternatives exists.

In the preferred embodiment, each instance of a meter-monitor segment includes a format field that contains information that specifies the particular format of the meter-monitor segment of said instance. Within said field is a particular group of binary information bits (hereinafter, the "length token") that identifies the number of bits in a meter-monitor segment of said format. Each alternate length token has a unique binary information code. The number of information bits in each instance of a length token is the smallest number of bits capable of representing the binary value of the total number of meter-monitor segment bit length alternatives. And the unique code of each different alternative is within the range of binary numbers thus defined.

In the preferred embodiment, each distinct meter-monitor segment format (including each distinct field format) also has a unique binary information code. In cases where a given format is the only format that contains a given length token, the unique code of said token is sufficient to identify said format uniquely. For example, if a particular format is the only format that is 197 binary bits long, information that said format is 197 bits long is sufficient information to identify said format uniquely. But two or more formats that contain the same length token information require additional binary information to distinguish them uniquely. Thus the number of information bits in any given instance of a format field is the total of the number of bits in the length token plus the smallest number of bits capable of representing the number of formats that share in common the one particular length token datum that occurs most frequently in different formats. And the format code of each distinct format is within the range of binary numbers thus defined except that only length token information exists in the bits of the length token.

Figure 2F:
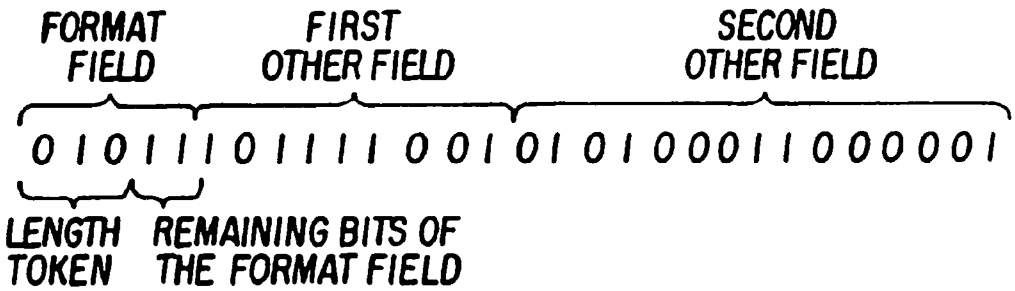
FIG. 2F shows one instance of a meter-monitor segment.

FIG. 2F illustrates one instance of a meter-monitor segment (excluding bit information required for error detection and correction). FIG. 2F shows three fields totaling thirty sequential bits. The format field is transmitted first followed by two fields of nine and sixteen bits respectively, and the bits of the length token are the first bits of said format field. The SPAM system that uses said format field has capacity for no more than eight alternate meter-monitor segment lengths and thirty-two formats. A three bit length token can specify no more than eight length alternatives, and a five bit format field can specify no more than thirty-two. Said SPAM system has no fewer than five alternate lengths because four or fewer length alternatives would be represented in a length token of two or fewer bits. In said system, three or four formats share in common the particular length token that occurs most frequently in different formats. Two formats sharing the most commonly shared length token datum would be specified in one bit; five or more sharing said datum would be represented in three or more bits. Accordingly, the format field of FIG. 2F must represent at least eight alternate formats.

In the preferred embodiment, the bits of the length token are the first bits in each meter-monitor segment. In any given command containing meter-monitor information, said bits follow immediately after the last bit of the execution segment. The remaining bits of the format field are included in each meter-monitor segment in particular locations that lie within the format of the shortest meter-monitor segment (excluding bit information required for error detection and correction). Thus if the shortest meter-monitor segment (including the format field of said segment) is thirty two bits, the bits of the format field in every instance of a meter-monitor segment lie among the first thirty two bits of said segment.

Information segments follow commands and can be of any length. Program instruction sets, intermediate generation sets, other computer program information, and data (all of which are organized in a fashion or fashions well known in the art) are transmitted in information segments. An information segment can transmit any information that a processor can process. It can transmit compiled machine language code or assembly language code or higher level language programs, all of which are well known in the art. Commands can execute such program information and cause compiling prior to execution.

A command with a "01" header is followed by an information segment. But a command with an "01" header is not the only instance of signal information that contains an information segment. In the simplest preferred embodiment, a fourth type of header is:

11—an additional information segment transmission following a "01" header command and one or more information segments which additional segment is addressed to the same apparatus and invokes the same controlled functions as said "01" command.

An instance of signal information with a "11" header contains no execution segment or meter-monitor segment information. Said instance is processed, in fashions described more fully below, by subscriber station apparatus that receive said instance as if said instance contained the execution segment information of the last "01" header command received at said apparatus prior to the receipt of said instance.

Figure 2G:
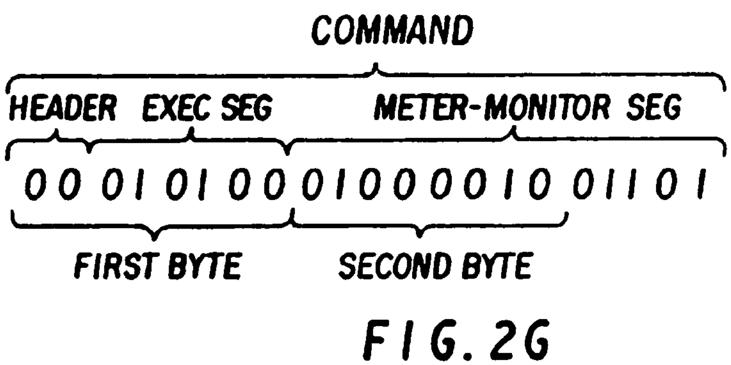
FIG. 2G shows one instance of a command that fills a whole number of byte signal words incompletely.

In determining the composition of signal information in the preferred embodiment, the present invention must take into account the fact that most computer systems communicate information in signal words that are of a constant binary length that exceeds one bit. At present, most computer information is communicated in so-called "bytes," each of which consists of eight digital bits. Failure to recognize this fact could result in incomplete signals and/or in erroneous processing in signal information. For example, FIG. 2G shows a command with a header, an execution segment, and a meter-monitor segment, each of which is of particular bit length. However, the command of FIG. 2G is only twenty-one bits long. As FIG. 2G shows, said command constitutes two bytes of eight bits each with five bits are left over. In a system that communicates information only in words that are multiples of eight, a signal whose information is represented in twenty-one information bits is incomplete. To constitute a complete communication, said signal must be transmitted in twenty-four bits. To the command of FIG. 2G, three bits must be added.

Figure 2H:
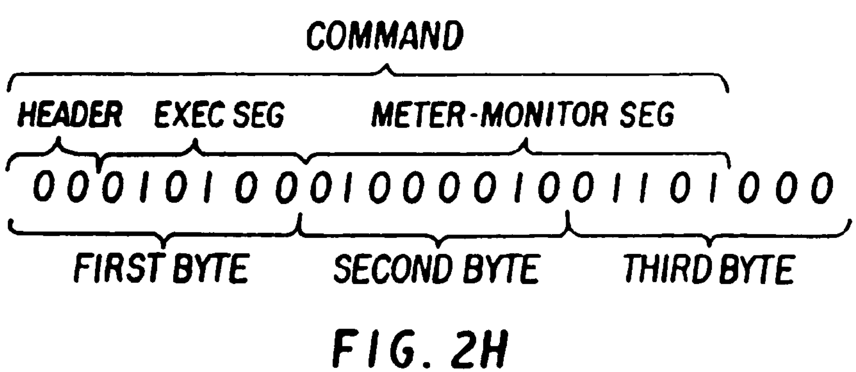
FIG. 2H shows one instance of a message that contains execution and meter-monitor segments and consists of the command of FIG. 2G with three padding bits added at the end to complete the last byte signal word.

In the preferred embodiment, at the original transmission station of any given signal transmission, particular bits are added at the end of any command that is not already a multiple of the particular signal word bit length that applies in signal processor system communications at the subscriber stations to which said transmission is transmitted. (Hereinafter, said bits are called "padding bits.") Padding bits communicate no command information nor are padding bits part of any information segment. The sole purpose of padding bits is to render the information of any given SPAM command into a bit length that is, by itself, complete for signal processor system communication. Padding bits are added to command information prior to the transmission of said information at said station, and all subscriber station apparatus are preprogrammed to process padding bits. The particular number of padding bits that are added to any given command is the smallest number of bits required to render the bit length of said command into a multiple of said signal word bit length. FIG. 2H shows three padding bits added at the end of the twenty-one command information bits of the command of FIG. 2G. to render the information of said command into a form that can be communicated in three eight-bit bytes.

In the preferred embodiment, the information of each information segment is composed and transmitted in a bit length that is, itself, exactly a multiple of the particular signal word bit length that applies in computer communications at said subscriber stations. The information of each information segment commences at the first information bit location of the first signal word of said segment and ends at the last information bit location of the last signal word. Each information segments follow a command or "11" header. More precisely, the first signal word of each information segment is the first complete signal word that follows the last information bit of said command or "11" header or the last padding bit following said command or "11" header if one or more padding bits follow.

Figure 2I:
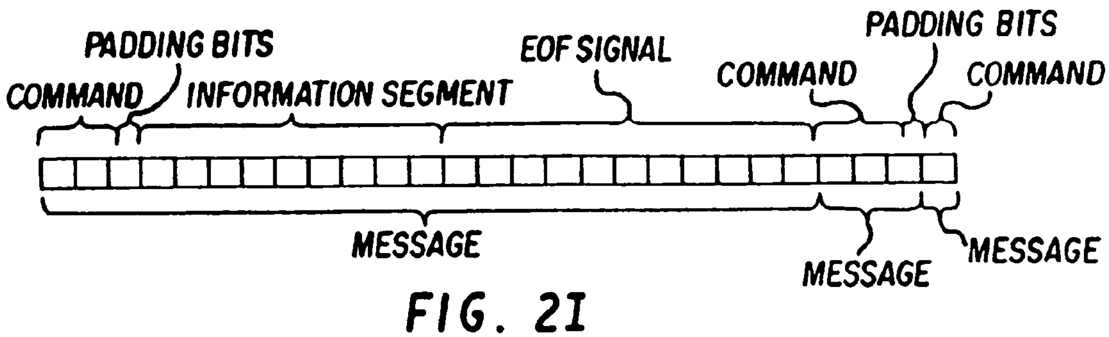
FIG. 2I shows one instance of a SPAM message stream.

As one example, FIG. 2I shows the information of FIG. 2E organized in eight-bit bytes. While the information of the execution segment in FIG. 2I follows immediately after the header and the information of the meter-monitor segment follows immediately after the execution segment, the information of the information segment does not follow immediately after the meter-monitor segment. Rather three padding bits are inserted following the command information of FIG. 2I to complete the signal word in which the last bit of command information occurs, and the information of the information segment begins at the first bit of the first complete byte following said meter-monitor segment.

The method of the preferred embodiment for composing the information of SPAM signals has significant advantages.

In signal processing, speed of execution is often of critical importance, and the preferred embodiment has significant speed advantages. Most commands require the fastest possible processing. By minimizing the bit length of headers, execution segments, and meter-monitor segments, the preferred embodiment provides compact information and control messages that are transmitted, detected, and executed, in general, in the fastest possible fashion.

In signal processing, flexibility of message structure is also of critical importance. The single, unified system of the present invention must have capacity for communicating to many different apparatus messages that vary greatly in complexity, length, and priority for speed of processing. By providing first priority segment capacity—in the simplest preferred embodiment, execution segments—that is short, rigid in format, and can communicate information to many different addressed apparatus, the preferred embodiment provides capacity to communicate a select number of high priority control messages to many alternate apparatus in the fastest possible time. By providing intermediate priority segment capacity—in the simplest preferred embodiment, meter-monitor segments—that is flexible in length, format, and information content, the preferred embodiment provides more flexible capacity to communicate control messages of slightly lower priority. By providing lowest priority segment capacity—in the simplest preferred embodiment, information segments—that can contain any binary information and be any length, the preferred embodiment provides complete flexibility to communicate any message that can be represented in digital information to any apparatus at the lowest processing priority. By transmitting message components in their order of priority—in the simplest preferred embodiment, headers and execution segments then meter-monitor segments then information segments—the preferred embodiment enables priority message instructions to affect subscriber station operations in the fastest possible fashion. By providing capacity for alternating the structure of individual messages—here alternate header capacity—so that individual control messages can be constituted only of the highest priority information or high and intermediate priority information or can be focused on the lowest priority, the preferred embodiment provides additional valuable flexibility.

Speed and flexibility are essential considerations not only in the composition of individual messages but also in the composition of message streams. In this regard, the use of "11" headers in the preferred embodiment brings valuable benefits.

Often in the course of a combined medium presentation, a series of control messages is transmitted each of which contains an information segment, addresses the same apparatus (for example, URS microcomputers, 205), and causes said apparatus to invoke the same controlled function or functions (for example, "load and run the contents of the information segment"). Often, interspersed in said series, are other control messages that address said apparatus, contain no information segments, and cause said apparatus to invoke other controlled functions (for example, "commence the video overlay combining designated in the meter-monitor segment"). By including capacity whereby, without containing execution or meter-monitor information, a given message can cause information segment information to be processed at subscriber station apparatus just as preceding information segment information was processed, the present invention increases processing efficiency. Because no execution or meter-monitor segment is transmitted, more information segment information can be transmitted in a given period of time. Because no execution or meter-monitor segment is received and processed at subscriber stations, information segment information can be received and processed faster.

In signal processing, efficiency in the control of subscriber station apparatus is yet another factor of critical importance. By composing lowest priority segment information—in the simplest preferred embodiment, information of information segments—to commence at a bit location that subscriber station apparatus are preprogrammed to define as the first location of a signal word of the form that control said apparatus in processing and to continue to a bit location that is the last location of a signal word of said form, the present invention communicates said information to said apparatus in a form that can commence the control functions communicated in said information immediately. Were information segment information communicated in any form other than that of the preferred embodiment—more specifically, were said information to be in a length other than a whole number of signal words or to commence immediately after the command or header preceding said segment rather than at the first bit of a signal word—subscriber station apparatus would need to process said information into information of a form that could control said apparatus before the information of said segment could commence the particular control functions communicated in said information.

The Organization of Message Streams . . . Messages, Cadence Information, and End of File Signals All of the information transmitted with a given header is called a "message." Each header begins a message, and each message begins with a header. More specifically, a message consists of all the SPAM information, transmitted in a given transmission, from the first bit of one header to the last bit transmitted before the first bit of the next header.

A SPAM message is the modality whereby the original transmission station that originates said message controls specific addressed apparatus at subscriber stations. The information of any given SPAM transmission consists of a series or stream of sequentially transmitted SPAM messages.

Each instance of a header synchronizes all subscriber station apparatus in the analysis of the internal structure of the message that follows.

However, for the unified system of the present invention to work, subscriber station apparatus must have capacity for distinguishing more than the internal structure of individual messages. Said apparatus must also have capacity for processing streams of SPAM messages and distinguishing the individual messages in said streams from one another. More precisely, said apparatus must have capacity for processing streams of binary information that consist only of "0" and "1" bits and distinguishing which information, among said bits, is header information.

Cadence information which consists of headers, certain length tokens, and signals that are called "end of file signals" enables subscriber station apparatus to distinguish each instance of header information in any given message stream and, hence, to distinguish the individual messages of said stream. In the present invention, subscriber station apparatus are preprogrammed to process cadence information.

SPAM messages are composed of elements—headers, execution segments, meter-monitor segments, and information segments—whose bit lengths vary. SPAM apparatus determine the bit length of said elements in different fashions, and the particular fashion that applies to any given element relates to the priority of said element for subscriber station speed of processing. First priority segment information has the highest priority for speedy processing and is of fixed binary bit length. A SPAM header is one example of a first priority segment. An execution segment is another example. Intermediate priority segment information has lower priority, varies in bit length, but contains internal length information. A Meter-monitor segment is one example of an intermediate priority segment. Lowest priority segment information has the lowest priority, varies in length, and contains no internal information for determining segment length. Each information segment is an example of a lowest priority segment.

For a message that is constituted only of first priority segments, the information of the header is sufficient to distinguish not only the structure of the message but also the location of the next header. In the simplest preferred embodiment, a message with a "10" header is one example of a message constituted only of first priority segments. Commands with "10" headers consist of header information and execution segment information. At any given time, all instances of header information are of one constant length, and all instances of execution segment information are of a second constant length. Thus all "10" commands are, themselves, of a particular header+exec constant length, said header+exec constant being the sum of said one constant plus said second constant. Because "10" messages have constant length and header information always occurs at a specific location in every instance of message information, by preprogramming subscriber station apparatus with information of said header+exec constant, the unified system of the present invention enables subscriber station apparatus to automatically identify the last command information bit of "10" messages. Said bit is always the bit that is located a particular quantity of bits after the first header bit which particular quantity equals said header+exec constant minus one. Being able to locate said last bit, said apparatus can automatically locate the next instance of header information in a fashion described below.

For messages whose elements include intermediate priority segment information but no lowest priority segment information, the information of said messages is also sufficient to distinguish message structure and the location of the next header. In the simplest preferred embodiment, each message associated with an "00" header is one such message. Messages with "00" headers consist of header and execution segment information that are, together, of said header+exec constant length plus meter-monitor segment information that contains length token information. By preprogramming subscriber station apparatus with information for processing length token information, the present invention enables said apparatus to determine the particular information bit, following any instance of a "00" header, that is the last bit of the command of said header. Said bit is always the bit that is located a particular quantity of bits after the first header bit which quantity equals said header+exec constant minus one plus the particular preprogrammed quantity that said apparatus associates, in a preprogrammed fashion described more fully below, with the particular length token of said instance. By locating said last bit, said apparatus can automatically locate the next instance of header information in the fashion described below.

For messages whose elements include lowest priority segment information, particular end of lowest priority segment information is required to distinguish full message structure and the location of the next header. In the simplest preferred embodiment, each message associated with a "01" or a "11" contains an information segment header and is one such message. Information segments vary in length, and no internal information of a command or information segment enables subscriber station apparatus to determine the length of an information segment. Thus distinctive end of file signals are required to communicate the locations of the ends of information segments to subscriber station apparatus. In the present invention, each end of file signal is transmitted immediately after the end of an information segment; said signal is part of the information of the message in which said segment occurs; and said signal is located at the end of said message. By preprogramming subscriber station apparatus to detect and process end of file signals in a fashion described more fully below, the present invention enables said apparatus to determine not only the particular information bit, following any instance of a "01" or "11" header, that is the last bit of the information segment of the message of said header but also the particular information bit, following said header, that is the last bit of said message. By locating said last bit of said message, said apparatus can automatically locate the next instance of header information in the fashion described below.

At any given time, subscriber station apparatus are preprogrammed to process only one distinct signal as an end of file signal. In order for said apparatus to distinguish an instance of said signal from all other signal information, an end of file signal must differ distinctly from all other information. Signal information, especially information transmitted in an information segment, can vary greatly in composition. Accordingly, to be distinctive, an end of file signal must be long and complex to detect.

An end of file signal consists of a particular sequence of bits of binary information. In the preferred embodiment each bit is identical to every other bit; that is, disregarding error correction information, an end of file signal consists of a sequence of "1" bits (eg. "11111111") or "0" bits (eg. "00000000"). In the preferred embodiment, end of file signals are composed of "1" bits rather than "0" bits. Zero is a value that occurs frequently in data and in mathematics, and however many bits may occur in a binary data word that consists of a series of "0" bits, the numeric value of said word remains zero. Numeric values that are represented in binary form by a sequence of "1" bits, especially a sequence that is long, occur in data and mathematics far less frequently than zero. Thus the preferred composition bit is "1" because the chance of data being joined in a given signal in such a way that two or more instance of information combine inadvertently and create the appearance of an end of file signal is far smaller if the preferred bit is "1" than if it is "0". (Hereinafter, the preferred binary end of file signal composition bit, "1", is called an "EOFS bit," and for reasons that are explained below, the alternate binary bit, "0", is called a "MOVE bit.")

In the preferred embodiment, the length of said sequence (disregarding error correction information) is the minimum reasonable length necessary to distinguish said sequence from all other sequences of transmitted signal information of said length. In the preferred embodiment, the number of bits in said sequence is greater than the number of information bits in the data words that subscriber station computers use to process data. At present, most computers are so-called "thirty-two bit machines" that process information in four-byte data words, and some high precision microprocessors such as the 8087 mathematics coprocessor distributed by the Intel Corporation of Santa Clara, Calif., U.S.A. process information internally in eighty bit registers which means that they process in 10-byte data words. Thus said sequence may be greater than eighty bits long and is probably greater than thirty-two bits. Also in the preferred embodiment, said sequence uses the full information capacity of the signal words used to communicate said sequence at subscriber stations. In computer systems that communicate information in eight-bit bytes, forty bits is the number of bits in the sequence next larger than thirty-two bits that uses the full communication capacity of the signal words in which it is communicated, and eighty-eight is the number of bits in the sequence next larger than eighty bits. In the preferred embodiment, at any given time alternate end of file signal lengths exist. One potential end of file signal length can be forty (40) bits which is five bytes of EOFS bits. Another can be eighty-eight (88) bits which is eleven bytes of EOFS bits. Which end of file signal is used for any given transmission depends on the nature of the information of the transmission in which said signal occurs and the apparatus to which said transmission is transmitted.

Being the minimum "reasonable" length means that an instance of said sequence may actually be generated, in the system of the preferred embodiment, which instance is generated as information of a command or an information segment rather than an end of file signal. Were the information of said instance to be embedded in a SPAM transmission of said system and transmitted, said instance would cause erroneously processing at subscriber station apparatus by causing itself to be detected as an end of file signal and information transmitted subsequent to said instance to be interpreted as a new SPAM message. To prevent such erroneous processing, in the preferred embodiment, after the initial generation of any given instance of SPAM message information (not including end of file signal information) and before the embedding and transmitting of said instance, said information is transmitted through an apparatus, called an "EOFS valve," that detects end of file signals and is described below. If said valve detects in said information particular information that constitutes an end of file signal, before being embedded and transmitted, the binary information of said instance is rewritten, in a fashion well known in the art that may be manual, to cause substantively the same information processing at subscriber stations without containing an instance of information that is identical to the information of an end of file signal. (Hereinafter, such pre-transmission processing of a message is called a "pre-transmission evaluation.")

Figure 2J:
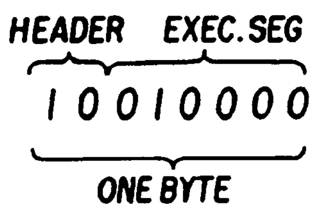
FIG. 2J shows one instance of a message that consists of just a header and an execution segment and fills one byte signal word completely.

FIG. 2I shows a series of connected rectangles and depicts one instance of a stream of SPAM messages. Each rectangle represents one signal word of binary information. FIG. 2I shows a series of three messages. Each message is composed in a whole number of signal words. The first message consists of a command followed by padding bits followed by an information segment followed by an end of file signal. The form of the command, padding bits, and the first information segment bits of said message is identical to the form of the information of FIG. 2E, given eight-bit bytes as the signal words of FIG. 2I. The second message consists of a command followed by padding bits. The form of said second message is identical to the form of the information of FIG. 2H, given eight-bit bytes as the signal words of FIG. 2I. The third message consists of a command alone. The form of said third message is identical to the form of the information of FIG. 2J, given eight-bit bytes as the signal words of FIG. 2I. FIG. 2J shows a message that is composed just of a "10" header and an execution segment. Said execution segment contains the same number of binary bits that the executions segments of FIGS. 2E and 2H contain. Said header and execution segment of FIG. 2J fill one byte of binary information precisely, and given the signal word of an eight-bit byte, no padding bits are required in the message of FIG. 2J. FIG. 2H does not show an instance of a message that starts with a "11" header. Were it to do so, said message would be comprised of said header followed by six padding bits, given eight-bit bytes as the signal words of FIG. 2I, followed by an information segment, like the information segment of the first message of FIG. 2H, followed by an end of file signal, like the end of file signal of said first message.

As FIG. 2I shows, in any given SPAM transmission, no binary information separates the binary information of one SPAM message from the next message. As soon as the information of one SPAM message ends (including all error correction information associated with said information), the next received binary information is information of the next message. Because the first information bits (as distinct from error correction bits) of any given SPAM message constitute the header information of said message, subscriber station apparatus locate the next instance of header information after any given message by locating the last information bit of the last signal word of said message. Automatically the first information bits that follow said last bit and total in number the particular number of bits in an instance of header information constitute the next instance of header information.

Subscriber station apparatus locate the last information bit of any given SPAM message in one of two fashions. One fashion applies to messages that do not end with end of file signals. The other applies to messages that do. The header information of any given message determines which fashion applies for said message.

Messages that are constituted only of first priority segment elements and messages whose elements include intermediate priority segment information but no lowest priority segment information do not end with end of file signals. In the preferred embodiment, the header information of any given one of said messages cause subscriber station apparatus to execute particular preprogrammed locate-last-message-bit instructions at a particular time. In the simplest preferred embodiment, such messages begin with "10" or "00" headers.

Receiving any given instance of said header information causes subscriber stations processing message information of said instance to execute said locate-last-message-bit instructions after locating the last segment information bit of said instance and upon completing the processing of the segment information of said instance. (The fashions whereby subscriber station apparatus locate the last command information bit of any given instance of a message with a "10" or a "00" header are described above.) In a fashion that is described more fully below, said locate-last-message-bit instructions cause said apparatus to determine whether the signal word in which said last segment information bit occurs contains one or more MOVE bits. If said signal word contains MOVE bit information, the last information bit of said signal word is the last information bit of said message. If said signal word does not contain MOVE bit information, the last information bit of said message is last information bit of the next signal word immediately following said signal word in which said last segment information bit occurs. (For reasons that relate to detecting end of file signals and are discussed more fully below, in the preferred embodiment a complete signal word of padding bits is transmitted after any given instance of a signal word that contains no MOVE bit information and in which occurs the last bit of command information of the message of said instance.)

Messages that contain lowest priority segment information end with end of file signals, and the header information of said messages do not cause subscriber station apparatus to execute particular preprogrammed locate-last-message-bit instructions. End of file signals define the ends of messages that contain lowest priority segment information. In the simplest preferred embodiment, such messages begin with "10" or "00" headers. The last information bit of the end of file signal immediately following any given "10" or "00" header information message is the last information bit of the message of said "10" or "00" header, and subscriber station apparatus are preprogrammed to locate said bit in a fashion that is described below.

After locating any given instance of a last information bit of a message, subscriber station apparatus are preprogrammed to process automatically as header information the first information bits, following said bit, that are in number the particular number of bits in an instance of header information.

In this fashion, cadence information—header information, the length tokens of messages that contain intermediate priority segment information but no lowest priority segment information, and end of file signals—enables subscriber station apparatus to distinguish each instance of header information—and, hence, each message—in any given stream of SPAM messages.

Detecting End of File Signals

In the present invention, any microprocessor, buffer/comparator, or buffer can be adapted and preprogrammed to detect end of file signals. At any given SPAM apparatus that is so adapted and preprogrammed, particular dedicated capacity exists for said detecting. Said capacity includes standard register memory or RAM capacity, well known in the art, including three particular memory locations for comparison purposes, one particular memory location to serve as a counter, and three so-called "flag bit" locations to hold particular true/false information. (Hereinafter, said three particular memory locations, said one particular memory location, and said three flag bit locations are called the "EOFS Word Evaluation Location," "EOFS Standard Word Location," and "EOFS Standard Length Location"; the "EOFS WORD Counter"; and the "EOFS WORD Flag," "EOFS Empty Flag," and "EOFS Complete Flag" all respectively.) All operating instructions required to control said memory or RAM capacity in detecting end of file signals are preprogrammed as so-called "firmware" at said apparatus. (In this specification, said dedicated capacity is called an "EOFS valve" because, in addition to detecting end of file signals, said capacity also regulates the flow of SPAM information in fashions that are described more fully below.)

At any given EOFS valve, the EOFS Word Evaluation Location and EOFS Standard Word Location are conventional dynamic memory locations each capable of holding one full signal word of binary information. The EOFS Standard Length Location and the EOFS WORD Counter are each conventional dynamic memory locations capable of holding, at a minimum, eight binary bits—that is, one byte—of information. The EOFS WORD Flag, EOFS Empty Flag, and EOFS Complete Flag are each conventional dynamic memory locations capable of holding, at a minimum, one bit of binary information.

At any given time, said valve holds particular information. At said EOFS Word Evaluation Location is one signal word of received SPAM information. At said EOFS Standard Word Location is one signal word of EOFS bits. (Hereinafter, one signal word of EOFS bits is called an "EOFS WORD.") At said EOFS Standard Length Location is information of the total number of EOFS WORDs in the particular end of file signal that applies at said time on the particular transmission received at said valve. Information of the decimal value, eleven, is at said Standard Length Location unless information of a number is placed at said Location in a fashion described below. At the EOFS WORD Counter is information of the number of EOFS WORDs that said valve has received in uninterrupted sequence. And all said Flag locations contain binary "0" or "1" information to reflect true or false conditions in relation to particular comparisons.

At any given time, any given EOFS valve receives inputted binary information of one selected SPAM transmission from one particular external transferring apparatus that is external to said valve. Said information consists of a series of discrete signal words. And said valve outputs information to one particular external receiving apparatus.

Receiving any given signal word of said transmission, causes said EOFS valve to commence, in respect to said given signal word, a particular word evaluation sequence that is fully automatic. Automatically said valve places information of said word at said EOFS Word Evaluation Location and compares the information at said Location to the EOFS WORD information at said EOFS Standard Word Location. Whenever said comparison is made, resulting in a match causes said valve automatically to set the information of said EOFS WORD Flag to "0". (Resulting in a match means that said given signal word is an EOFS WORD and may be a part of an end of file signal.) Not resulting in a match causes said valve automatically to set the information of said EOFS WORD Flag to "1". Then automatically said valve determines the value of said information at said EOFS WORD Flag, in a fashion well known in the art, and executes one of two sets of word evaluation sequence instructions on the basis of the outcome of said determining.

One set, the process-EOFS-WORD instructions, is executed whenever the information at said EOFS WORD Flag indicates that said given signal word is an EOFS WORD. Determining a value of "0" at said EOFS WORD Flag causes said valve to execute said set. Automatically the instructions of said set cause said valve to retain count information of said given signal word by increasing the value of the information at said EOFS WORD Counter by an increment of one. (Incrementing said Counter by one documents the fact that, in receiving said given signal word, said valve has received, in uninterrupted sequence, one signal word that may be part of an end of file signal more than it had received before it received said given signal word.) Then automatically said valve compares the information at said EOFS WORD Counter to the information at said EOFS Standard Length Location. Resulting in a match causes said valve automatically to set the information of said EOFS Complete Flag to "0". (A match of the information at said Counter with the information at said Location means that said given signal word is the last EOFS WORD in an uninterrupted sequence of EOFS WORDS that equals in length the length of an end of file signal; in other words, said match means that an end of file signal has been detected.) Not resulting in a match causes said valve automatically to set the information of said EOFS Complete Flag to "1". (Not resulting in a match means said EOFS WORD is not the last EOFS WORD of an end of file signal and that insufficient information has been received to determine whether or not said given signal word is part of an end of file signal.) Then automatically said valve determines the value of said information at said EOFS Complete Flag. Determining a value of "0" at said Flag, which means that an end of file signal has been detected, causes said valve to operate in a fashion described more fully below. Determining a value of "1" at said Flag causes said valve, in a fashion described more fully below, to complete said word evaluation sequence, in respect to said given signal word, without transferring any information of said given signal word to said external receiving apparatus.

The other set, the transfer-all-word-information instructions, is executed whenever the information at said EOFS WORD Flag indicates that said given signal word is not an EOFS WORD. Whenever said valve detects a signal word that is not an EOFS WORD, detecting said word means not only that said word is not part of an end of file signal but also that any EOFS WORDs retained in an uninterrupted sequence immediately prior to said word are also not part of an end of file signal. Determining a value of "1" at said EOFS WORD Flag causes said valve to execute said other set. Automatically the instructions of said other set cause said valve to compare the information at said EOFS WORD Counter to particular zero information that is among the preprogrammed information of said valve. (Not having been incremented by one under control of said process-EOFS-WORD instructions, said Counter contains information of the number of EOFS WORDs received in an uninterrupted sequence and retained at said valve at the time when said given signal word is received.) Resulting in a match causes said valve automatically to set the information of said EOFS Empty Flag to "0". (Resulting in a match means that said valve is empty of retained EOFS WORD information.) Not resulting in a match causes said valve automatically to set the information of said EOFS Empty Flag to "1". (Not resulting in a match means that said valve contains information of EOFS WORDs that have not been transferred to said external receiving apparatus.) Then automatically said valve determines the value of said information at said EOFS Empty Flag. A determining of "1" causes said valve to execute particular transfer-counted-information instructions that are not executed if the information at said Flag is "0". Under control of said instructions, said valve automatically outputs one instance of said EOFS WORD information at said EOFS Standard Word Location a particular number of times which particular number is the numerical value of the information at said EOFS WORD Counter. (In so doing, said valve transfers information of all of the signal words received before said given signal word and not transferred to said external receiving apparatus.) Then said transfer-counted-information instructions cause said valve to set the value at said EOFS WORD Counter to zero (to reflect that said valve is now empty of information of untransferred signal words). Then, whether or not said valve has executed said transfer-counted-information instructions, said valve outputs information of said given signal word at said EOFS Word Evaluation Location and completes said word evaluation sequence, in respect to said given signal word.

Whenever said valve completes said word evaluation sequence, in respect to any given signal word, said valve informs said external transferring apparatus (in a so-called "handshaking" fashion, well known in the art, or in such other flow control fashion as may be appropriate) that said valve is ready to receive next signal word information. Whenever, after transferring a given signal word, said apparatus is so informed, said apparatus transfers to said decoder the next signal word of said transmission immediately following said given signal word. Receiving said next signal word causes said valve to commence said word evaluation sequence, in respect to said next signal word. Automatically said valve places information of said next signal word at said EOFS Word Evaluation Location, and in so doing, overwrites and obliterates information of said given word at said EOFS Word Evaluation Location.

In this fashion, said valve processes each successive signal word to detect those particular uninterrupted series of EOFS WORDs that constitute end of file signals.

As described above, determining, under control of said process-EOFS-WORD instructions, that the value of the information at said EOFS Complete Flag is "0" means that an end of file signal has been detected. Determining, under control of said instructions, that said value is "0" causes said valve to execute particular complete-signal-detected instructions. Said instructions cause said valve to inform said external receiving apparatus of the presence of an end of file signal in a fashion that is the preprogrammed fashion of the microprocessor, buffer/comparator, or buffer of which said valve is an adapted component.

As one example of said fashion, for a buffer or buffer/comparator apparatus that operates under control of a controller to process received signal words and transfer signal information to a microprocessor (which may be a component of said controller), said instructions cause said valve to cause said apparatus to transmit particular EOFS-signal-detected information to said controller then to wait, in a waiting fashion well known in the art, for a control instruction from said controller. Said EOFS-signal-detected information causes said controller to determine, in a preprogrammed fashion, how to process the particular EOFS information at said valve and to transmit either a particular transmit-and-wait instruction or a particular discard-and-wait instruction to said valve. (Examples of controller operations are presented below.) Said transmit-and-wait instruction causes said valve to transfer one complete end of file signal. More precisely, said instruction causes said valve automatically to output one instance of said EOFS WORD information at said EOFS Standard Word Location a particular number of times which particular number is the numerical value of the information at said EOFS Standard Length Location. Then automatically said valve sets the information at said EOFS WORD Counter to zero (thereby signifying that no EOFS WORDs are retained), completes said word evaluation sequence, in respect to the signal word of the information at said EOFS Word Evaluation Location, and transmits particular complete-and-waiting information to said controller. Alternatively, said discard-and-wait instruction causes said valve merely to set the information at said EOFS WORD Counter to zero (thereby discarding information of said end of file signal), to complete said word evaluation sequence, in respect to said signal word of the information at said EOFS Word Evaluation Location, and to transmit said complete-and-waiting information to said controller. Subsequently, said complete-and-waiting information causes said controller to transmit further instructions that control said apparatus and said valve in the processing of further information and the detecting of further end of file signals.

In the preferred embodiment, said EOFS-signal-detected information and said complete-and-waiting information are control signals that are transmitted by said valve and said apparatus to said controller as interrupts to the CPU of said controller.

An example illustrates the operation of an EOFS valve.

FIG. 2 shows one message that is of a particular command composed of a "00" header, an execution segment, and a meter-monitor segment. The information of said command fills four bytes of binary precisely. The last bit of said meter-monitor segment is the last bit of the fourth byte of said command. But because the byte in which said last bit occurs contains no MOVE bit information, according to the rules of message composition of the preferred embodiment, one full signal word of padding bits follows said command.

When the message of FIG. 2 is transmitted, a given EOFS valve receives the transmission of said message from a particular transferring apparatus and transfers information to a particular receiving apparatus. Said valve is adapted and preprogrammed to process eight-bit bytes as signal words. The information at the EOFS Standard Word Location of said valve is the EOFS WORD of the preferred embodiment: "11111111". The EOFS Standard Length Location and EOFS WORD Counter of said valve each hold one byte of binary information. The binary information at said EOFS Standard Length Location is "00001011", a binary number whose decimal equivalent is eleven. The binary information at said EOFS WORD Counter is "00000000", a binary number whose decimal value is zero.

Receiving the first byte of said message causes said valve to place information of said byte at said EOFS Word Evaluation Location and to compare the information at said Location, "10010100", to the EOFS WORD information at said EOFS Standard Word Location, "11111111". No match results which causes said valve automatically to set the information of said EOFS WORD Flag to "1". Automatically said valve determines the value of said information at said Flag is "1" which causes said valve to execute said transfer-all-word-information instructions. Automatically said valve compares the information at said EOFS WORD Counter, zero, to said zero information that is among the preprogrammed information of said valve. (The binary value of each instance of zero information is "00000000".) A match results which causes said valve automatically to set the information of said EOFS Empty Flag to "0". Automatically said valve determines that the value of said information at said EOFS Empty Flag is "0" and skips executing said transfer-counted-information instructions. Automatically said valve continues executing conventional ones of said transfer-all-word-information instructions; transfers information of said first byte at said EOFS word evaluation location—which information is "10010100"—to said receiving apparatus; completes said word evaluation sequence, in respect to said first byte; and transfers handshake information to said transferring apparatus that informs said apparatus that said valve is ready to receive next signal word information.

Receiving said handshake information causes said transferring apparatus to transfer the next byte of said message to said valve.

Receiving said next byte, which is the second byte, causes said valve to place information of said byte at said EOFS Word Evaluation Location and to compare the information at said Location, "11001000", to the EOFS WORD information at said EOFS Standard Word Location, "11111111". No match results which causes said valve to set the information of said EOFS WORD Flag to "1". Automatically said valve determines that the information at said Flag is "1" which causes said valve to execute said transfer-all-word-information instructions. Automatically said valve compares the information at said EOFS WORD Counter, zero, to said zero information that is among the preprogrammed information of said valve. A match results which causes said valve to set the information of said EOFS Empty Flag to "0". Automatically said valve determines that the information at said EOFS Empty Flag is "0". Automatically said valve continues executing conventional transfer-all-word-information instructions; transfers information of said second byte at said EOFS word evaluation location—which information is "11001000"—to said receiving apparatus; completes said word evaluation sequence, in respect to said second byte; and informs said transferring apparatus that said valve is ready to receive next signal word information which causes said apparatus to transfer to said valve the next byte of said message.

Receiving said next byte, which is the third byte, causes said valve to place information of said byte at said EOFS Word Evaluation Location and to compare the information at said Location, "11111111", to the EOFS WORD at said EOFS Standard Word Location, "11111111". A match results, causing said valve to set the information of said EOFS WORD Flag to "0". Automatically said valve determines that the information at said Flag is "0" which causes said valve to execute said process-EOFS-WORD instructions. Automatically, in a fashion well known in the art, said valve increases the value of the information at said EOFS WORD Counter by an increment of one from "00000000" to "00000001". Automatically said valve compares the information at said EOFS WORD Counter, "00000001", to the information at said EOFS Standard Length Location, "00001011". No match results which causes said valve automatically to set the information of said EOFS Complete Flag to "1". Automatically said valve determines that the value of said information at said EOFS Complete Flag is "1" which causes said valve automatically to complete said word evaluation sequence, in respect to said third byte, without transferring any information of said byte to said receiving apparatus. Automatically said valve then informs said transferring apparatus that said valve is ready to receive next signal word information which causes said apparatus to transfer to said valve the next byte of said message.

Receiving said next byte, which is the fourth byte, causes said valve to place information of said byte at said EOFS Word Evaluation Location, which information is "11111111". In so placing said information at said Location, said valve automatically overwrites and obliterates the information of the third byte that had been at said Location. Automatically said valve then compares the information at said Location, "11111111", to the EOFS WORD information at said EOFS Standard Word Location, "11111111". A match results, causing said valve to set the information of said EOFS WORD Flag to "0". Automatically said valve determines that the information at said Flag is "0", which causes said valve to increase the value of the information at said EOFS WORD Counter from "00000001" to "00000010", a binary number whose decimal equivalent is two. Automatically said valve compares said "00000010" to the information at said EOFS Standard Length Location, "00001011". No match results which causes said valve to set the information of said EOFS Complete Flag to "1". Automatically said valve determines that the value of said information at said EOFS Complete Flag is "1" which causes said valve to complete said word evaluation sequence, in respect to said fourth byte, without transferring any information of said byte to said receiving apparatus. Automatically said valve then informs said transferring apparatus that said valve is ready to receive next signal word information which causes said apparatus to transfer to said valve the next byte of said message.

Receiving said next byte, which is the fifth and last byte, causes said valve to place information of said byte at said EOFS Word Evaluation Location, which information is "00000000". In so placing said information at said Location, said valve automatically overwrites and obliterates the information of the fourth byte at said Location. Automatically said valve then compares the information at said Location, "00000000", to the EOFS WORD information at said EOFS Standard Word Location, "11111111". No match results which causes said valve to set the information of said EOFS WORD Flag to "1". Automatically said valve determines that the information at said Flag is "1" which causes said valve to execute said transfer-all-word-information instructions. Automatically said valve compares the information at said EOFS WORD Counter, "00000010", to said zero information, "00000000", that is among the preprogrammed information of said valve. No match results which causes said valve to set the information of said EOFS Empty Flag to "1". Automatically said valve determines that the information at said EOFS Empty Flag is "1" which causes said valve to execute said transfer-counted-information instructions. Said instructions cause said valve automatically to transfer one instance of said EOFS WORD information at said EOFS Standard Word Location, "11111111", to said receiving apparatus then decrease the value of the information at said EOFS WORD Counter by a decrement of one—that is, from "00000010" to "00000001"—then compare the information at said EOFS WORD Counter to said zero information, "00000000". Because no match occurs, said valve automatically transfers one more instance of said EOFS WORD information, "11111111", to said receiving apparatus then decreases the value of the information at said EOFS WORD Counter by an additional decrement of one—that is, from "00000001" to "00000000"—then compares said information to said zero information, "00000000". A match occurs. In a fashion well known in the art, the fact of said match causes said valve automatically to continue executing transfer-all-word-information instructions. Automatically said valve transfers information of said fifth byte at said EOFS word evaluation location—which information is "00000000"—to said receiving apparatus; completes said word evaluation sequence, in respect to said fifth and last byte of the message of FIG. 2K; and informs said transferring apparatus that said valve is ready to receive next signal word information which causes said apparatus to transfer to said valve the next byte of said message as soon as said apparatus receives and is prepared to transfer said byte.

Figure 2K:
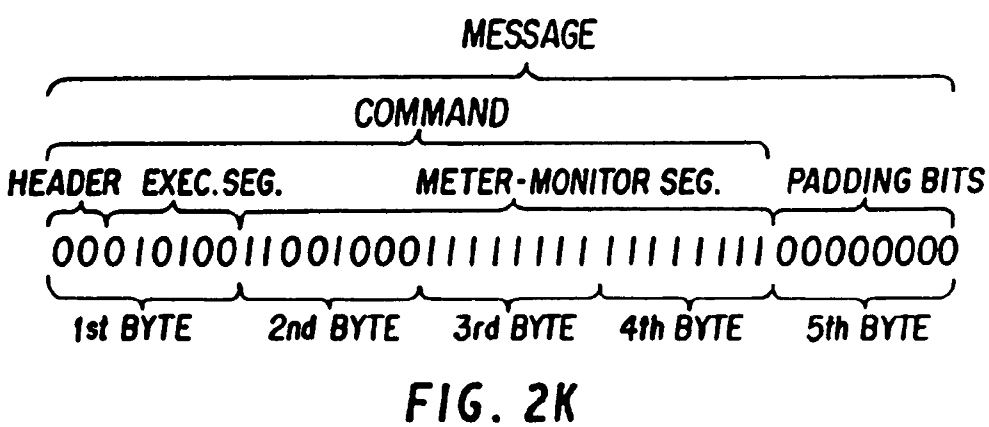
FIG. 2K shows one instance of a message that contains execution and meter-monitor segments and fills a whole number of byte signal words completely but ends with one full byte signal word of padding bits because the last byte signal word of command information is an EOFS word.

The example of FIG. 2K illustrates how receiving each signal word causes an EOFS valve to evaluate the information content of said word; to transfer words that are not EOFS WORDs; to retain count information of words that are EOFS WORDs so long as said words occur in uninterrupted sequences of EOFS WORDs which sequences are shorter than the number of EOFS WORDs in an instance of end of file signal information; and when receiving any given signal word that is not an EOFS WORD interrupts such a sequence, to transfer information of each retained EOFS WORD before transferring information of said given signal word. The example of FIG. 2K does not illustrate the detecting of an end of file signal; however, an example of such detecting is provided below.

In this specification, MOVE bits are called "MOVE" bits because MOVE bit information in any given signal word causes each EOFS valve that processes the information of said word to "move"—that is, to transfer—information of said word to receiving apparatus external to said valve during the word evaluation sequence of said word rather than retaining said information.

Reasons should now be clear why padding bits are always MOVE bits and why, in a SPAM message, a full signal word of padding bits follows a signal word that is the last signal word in which command information occurs and that contains no MOVE bits. The command of FIG. 2K is such a command, and the fourth byte is such a word. In its automatic fashion for identifying end of file signals, no EOFS valve that receives said fourth byte transfers said byte until it receives a subsequent signal word that contains a MOVE bit. In the present invention there is no assurance that every EOFS valve immediately receives a next signal word as soon as it completes the word evaluation sequence, in respect to any given signal word. Thus to ensure that all apparatus to which messages are addressed process message information in the fastest possible fashion, all messages that do not end with end of file signals do end with signal words that contain at least one MOVE bit.

One final rule of message composition remains. In order to define end of file signals precisely, a signal word that contains at least one MOVE bit is always transmitted immediately before the uninterrupted sequence of EOFS WORDs of any given end of file signal. Were a given signal word that contained no MOVE bits to be transmitted immediately before the uninterrupted sequence of a given end of file signal, said word would contain only EOFS bits and would be an EOFS WORD. Any EOFS valve processing said word and said signal would process said word as one of the EOFS WORDs of said uninterrupted sequence. Said valve would count said word erroneously as part of said sequence rather than as part of the information preceding said sequence and would count at least the last EOFS WORD of said sequence erroneously as part of the message following said signal rather than as part of said signal. In order to avoid such erroneous processing, any given instance of the uninterrupted sequence of EOFS WORDs of an end of file signal is preceded by signal word that is not an EOFS WORD.

This final rule may be satisfied in a number of different ways. For example, end of file signals could include the signal word preceding said uninterrupted sequence. Rather than being an uninterrupted sequence of eleven EOFS WORDs, an end of file signal could be twelve words long with the first word containing MOVE bit information. And subscriber station apparatus could be adapted and preprogrammed for detecting such signals.

As related above, in the preferred embodiment, end of file signals are composed just of the uninterrupted sequence of EOFS WORDs described above, and the signal words that precede said sequences are part of the last segment information preceding said signals. To prevent erroneous processing while satisfying the final rule of message composition, in any given pre-transmission evaluation of an instance of SPAM message information, if the EOFS valve of said evaluation retains information the last signal word of said information in the course of the word evaluation sequence of said word rather than transferring information of said word, the binary information of said instance is rewritten, in a fashion well known in the art that may be manual, before being embedded and transmitted. Said binary information is rewritten to end with a final signal word that contains MOVE bit information and still cause substantively the same information processing at subscriber stations.

In this fashion, the signal information of any given end of file signal is distinctive, and EOFS detectors detect end of file signals precisely.

Despite the fact that the use of end of file signals involves time consuming processing, the preferred embodiment's system for distinguishing individual messages from one another in message streams has significant advantages over alternate techniques.

By comparison with systems that process fixed length and/or fixed format messages, the use of end of file signals permits great flexibility. Messages can be of any length and can contain any information that digital receiver station apparatus can process.

By comparison with systems that distinguish messages from one another by means of distinctive signals that separate the end of each message from the beginning of the next, end of file signals are used in the preferred embodiment only with some messages. Many messages, such as the second and third messages of the message stream of FIG. 2I, do not require end of file signals. Furthermore, as will become more apparent in the course of this specification, messages that consist of commands alone often have higher priority for processing speed than do the messages that contain last segment information. Since only messages that contain last segment information require end of file signals, end of file signals are often transmitted and processed at times when speed of processing is of relative unimportance.

Finally, because long cadence signals are processed at ends of messages rather than at beginnings, the preferred embodiment reduces the relative importance of the processing speed associated with such signals even further. In the preferred embodiment, subscriber station apparatus have capacity for commencing to process received command and information segment information before receiving the end of file signal associated with said information. The commencement of processing of the command and information segment information of any given message need never be delayed until after an end of file signal, associated with said message, is detected.

The preferred embodiment has the advantage of requiring that long cadence signals that require time consuming processing be transmitted only with some messages and then only at times when processing speed is of relatively low priority. In so doing, the preferred embodiment makes it possible to transmit in the shortest, simplest formats messages that have high priority for processing speed and to process said messages the fastest fashion.

The Normal Transmission Location

SPAM signals are generated at original transmission stations or intermediate transmission stations and embedded in television or radio or other programming transmissions by conventional generating and embedding means, well known in the art. Said signals may be embedded in transmissions at said stations immediately prior to transmitting said transmissions via conventional broadcast or cablecast means, well known in the art. Alternatively, said signals may be embedded in transmissions that are then recorded, in a fashion well known in the art, on an appropriate conventional video, audio or other record media. Playing back said media on appropriate player apparatus will cause said apparatus to retransmit said transmissions with said SPAM signals embedded precisely as they were embedded when said transmissions were recorded.

SPAM signals can be embedded in many different locations in electronic transmissions. In television, SPAM signals can be embedded in the video portion or in the audio portion of the transmission. In the video portion, SPAM signals can be embedded in each frame on one line such as line 20 of the vertical interval, or on a portion of one line, or on more than one line, and they will probably lie outside the range of the television picture displayed on a normally tuned television set. SPAM signals can be embedded in radio audio transmissions. In the audio of television and radio transmissions, SPAM signals will probably be embedded in a portion of the audio range that is not normally rendered in a form audible to the human ear. In television audio, they are likely to lie between eight and fifteen kilohertz. In broadcast print and data communications transmissions, SPAM signals can accompany conventional print or data programming in the conventional transmission stream.

In television, the normal transmission location of the preferred embodiment is in the vertical interval of each frame of the television video transmission. Said location begins at the first detectable part of line 20 of the vertical interval and continues to the last detectable part of the last line of the vertical interval that is not visible on a normally tuned television set.

In radio, the preferred normal transmission location is in the audio above the range of the radio transmission that is normally audible to the human ear.

In broadcast print or data communications, the preferred normal transmission location for SPAM signals is in the same location as the conventional information. More precisely, conventional print of data information is transmitted in SPAM transmissions. Any given instance of conventional print or data information is transmitted in a SPAM information segment that is preceded by a "01" header SPAM command or a "11" header, which command or header addresses conventional print or data processing apparatus at subscriber stations and causes said apparatus to process said conventional information in the conventional fashion. In said transmissions, other SPAM commands and information address and control subscriber station apparatus in other SPAM functioning.

(Hereinafter, the preferred normal location for transmitting signals in any given communication medium is called, the "normal transmission location".)

In the preferred embodiment, while receiver station decoder apparatus may be controlled, in fashions described below, to detect information segment information outside the normal transmission locations, SPAM commands and cadence information are always transmitted in normal transmission locations. In the present invention, the object of many decoders is to detect only command information such as meter-monitor segment information. Having one unchanging location for the transmission of command information in any given television, radio, broadcast print, or data transmission permits decoder apparatus to search just one unchanging portion of said transmission to detect commands. Having the same fixed location for cadence information enables said decoder apparatus to distinguish all command information in said transmission.

Operating Signal Processor Systems . . . Introduction

Five examples illustrate methods of operating signal processing system apparatus. Each focuses on subscriber stations where the signal processor system of FIG. 2D and the combined medium apparatus of FIG. 1 share apparatus and operate in common.

Figure 3:
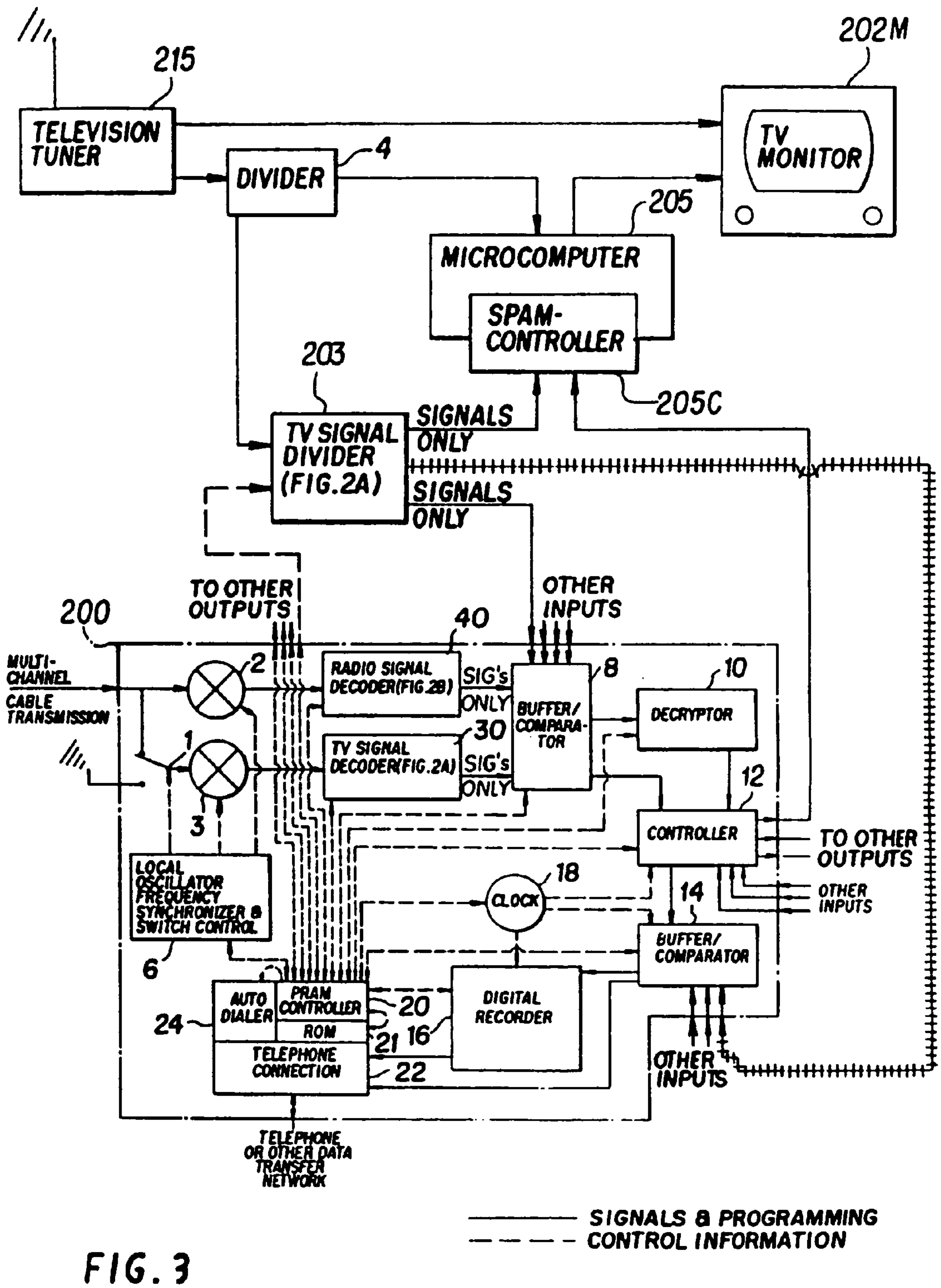
FIG. 3 is a block diagram of a video/computer combined medium receiver station with a signal processing system.

FIG. 3 shows one such subscriber station. In FIG. 3, the decoder, 203, of FIG. 1 is also an external decoder of the signal processor system of signal processor, 200. Like decoders, 27, 28, and 29, in FIG. 2D, decoder, 203, has capacity for transferring SPAM information to buffer/comparator, 8, of signal processor, 200, and to buffer/comparator, 14. In addition, signal processor, 200, has capacity for transferring SPAM signals from a particular jack port of controller, 12, to microcomputer, 205.

FIG. 3 also shows SPAM-controller, 205C, to which signals that are addressed to URS microcomputers, 205, are transferred from decoder, 203, and from signal processor, 200. SPAM-controller, 205C, is a control unit like controller, 39, of decoder, 203, with buffer capacity for receiving multiple inputs; RAM and ROM for holding operating instructions and other information; EOFS valve capacity for detecting end of file signals and regulating the flow of SPAM signals; microprocessor capacity for processing; capacity for transferring information to and receiving information from the central processor unit (hereinafter, "CPU") of microcomputer, 205; and capacity for transferring information to one or more input buffers of microcomputer, 205. SPAM-controller, 205C, operates independently of said CPU although said CPU has capacity to interrupt SPAM-controller, 205C, in an interrupt fashion well known in the art. SPAM-controller, 205C, also has capacity to control directly to the aforementioned PC-MicroKey 1300 System without affecting the operation of said CPU.

Figure 1C:
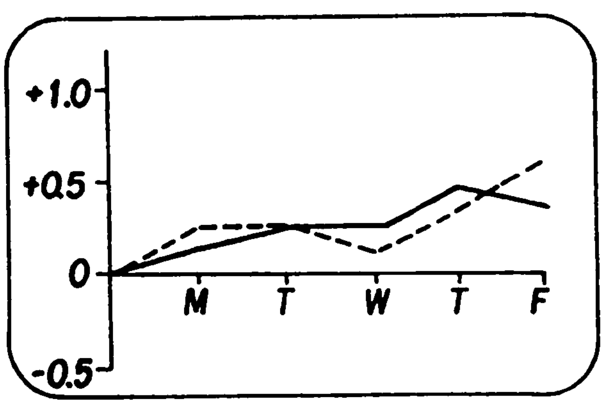
FIG. 1C shows a representative example, on the face of a display tube, of a studio graphic combined with a user specific graphic.

All five examples describe signal processing variations that relate to the FIG. 1C combining of "One Combined Medium."

The first focuses on the basic operation, in "One Combined Medium," of decoder, 203; SPAM-controller, 205C; and microcomputer, 205. No signals require decryption. No meter information is collected. No monitor information is processed. Combined information is displayed at each subscriber station.

In the second example, the combining of FIG. 1C occurs only at selected subscriber stations. The second combining synch command is partially encrypted, and said stations are preprogrammed with particular information that is necessary to decrypt said command. At said stations, said command causes its own decryption and the combining of FIG. 1C. In addition, said command causes signal processor apparatus at said stations to retain meter information that a remote billing agency can use as a basis for charging the subscribers of said stations for displaying the combined information of said combining. At all other stations, no information is decrypted, no combining occurs, and no meter information is collected.

In the third example, combined information is displayed at each subscriber station just as in the first example. In addition, monitor information is processed at selected stations for one or more so-called "ratings" agencies (such as the A. C. Nielsen Company) that collect statistics on viewership and programming usage.

The fourth example provides a second illustration of restricting the combining of FIG. 1C to selected subscriber stations through the use of encryption/decryption techniques and metering. In addition, the fourth example shows how monitor information is collected at selected ones of said selected stations.

The fifth example adds program unit identification signals identified at decoders, 30 and 40, of signal processor, 200.

In the last three examples, the first combining synch command causes selected subscriber stations to transfer recorded meter information and monitor information to one or more remote computer stations of said billing agencies and ratings agencies and causes computers at said remote agencies to receive and process said transferred information.

Each example focuses on the processing of the three signal messages of the FIG. 1C combining. The information of said messages include three combining synch commands and one program instruction set.

The first message is of the information associated with the first combining synch command. Said first command has a "01" header, an execution segment, and a meter-monitor segment of six fields. Said command is followed by an information segment that contains said program instruction set, and said information segment is followed by an end of file signal. Said first command addresses URS microcomputers, 205, and causes said computers, 205, to load and run the program instruction set transmitted in the information segment. Each meter-monitor segment field of said command contains information that identifies one of the following:

the origin of said "Wall Street Week" transmission,
the subject matter of said "Wall Street Week" program,
the program unit of said program,
the day of said transmission within a particular one hundred year period,
the supplier of the program instruction set in the information segment following said first combining synch command, and
the format of said meter-monitor segment information.

(Hereinafter, meter-monitor information that identifies the program unit of a given program may also be called the "program unit identification code".)

The second message is of the information associated with the second combining synch command. Said second command has a "00" header, an execution segment, and a meter-monitor segment of five fields and addresses URS microcomputers, 205. Said second command causes said computers, 205, to combine the FIG. 1A information of each microcomputer, 205, with the information of FIG. 1B and transmit the combined information to monitors, 202M. Each meter-monitor segment field of the second command contains information of one of the following:

the subject matter of said "Wall Street Week" program,
the program unit of said program,
the unique code of said overlay given said program unit information,
the minute of said transmission within a particular one month period, and
the format of said meter-monitor segment information.

The third message is of the information associated with the third combining synch command. Said third command has only a "10" header and an execution segment and addresses URS microcomputers, 205. Said command causes said computers, 205, to cease combining and transmit only the received composite video transmission to monitors, 202M, and to continue processing in a predetermined fashion (which fashion may be determined by the aforementioned program instruction set).

In those examples that focus on encrypted commands, the meter-monitor segments of each encrypted command includes an additional meter-monitor field:

meter instructions.

In said examples, the meter-monitor format field information of said commands reflects the presence of said additional field.

As described above, said signals are of binary information with error correcting bit information and are embedded, transmitted, and received in the normal transmission pattern of the "Wall Street Week" television transmission.

All subscriber station apparatus are fully preprogrammed to perform automatically each step of each example. No manual step is required at any station.

In each example, the apparatus of FIG. 3 are preprogrammed to detect embedded signal information, to transfer said information to addressed apparatus, and to operate under control of said information. Apparatus of decoder, 203, are preprogrammed to detect signal information embedded in the normal transmission pattern and to correct, convert, and transfer said information to its addressed apparatus. Apparatus of signal processor, 200, are preprogrammed to decrypt information upon instruction and to transfer information to its addressed apparatus. For one or more remote services that meter and charge subscribers for the use of information or that audit such remote metering services, apparatus of signal processor, 200, are preprogrammed to select, process, and record meter information and to transfer recorded meter information to one or more remote station computers.

In each example, the EOFS valves located at controller, 39, of decoder, 203; at buffer/comparator, 8, of signal processor, 200; and at SPAM-controller, 205C, are preprogrammed to detect end of file signals that consist of eleven sequentially transmitted EOFS WORDs. Thus the binary information of eleven—"00001011"—is at the EOFS Standard Length Location of each of said EOFS valves.

In the third, fourth, and fifth examples, appropriate apparatus of FIG. 3 are also preprogrammed to assemble, record, and transmit to one or more remote locations monitor information for one or more services that sample selected subscriber stations (said stations being preprogrammed for this purpose) to collect statistical data on programming and information usage and/or to audit selectively the customer accounting of remote meter services.

In each example, receiving SPAM signal information at each apparatus of FIG. 3 causes subscriber station apparatus automatically to process said information in the preprogrammed fashions of said apparatus.

At the outset of each example, particular meter record information of prior programming exists at a particular location at buffer/comparator, 14, of signal processor, 200. Said record information documents the fact that before receiving the "Wall Street Week" program, tuner, 215, transmitted to monitor, 202M, particular programming that contained embedded SPAM commands and information with particular meter instructions. Information of said commands and information caused buffer/comparator, 14, to retain said meter record information. In the third and subsequent examples, monitor record information of said prior programming also exists at a particular location at said buffer/comparator, 14, associated with the source mark of decoder, 203.

In each example, the recorder, 16, of signal processor, 200, has reached a level of fullness where the recording of the next signal record received from the buffer/comparator, 14, of signal processor, 200, will cause the quantity of signal records recorded at recorder, 16, to equal or exceed the particular fullness information of said recorder, 16. Whenever said quantity equals or exceeds said fullness information, recorder, 16, is preprogrammed to commences a particular telephone signal record transfer sequence that is fully automatic for which recorder, 16; controller, 20; auto dialer, 24; and telephone connection, 22, are each preprogrammed. Under control of the preprogrammed instructions of said sequence, signal processor, 200, telephones one or more remote billing station computers and/or one or more remote monitor information collection station computers and transfers selected record information to said computers.

In each example, all receiver station apparatus is on and fully operational.

Operating Signal Processor Systems

Example #1

The first example elaborates on the FIG. 1C combining described above in "One Combined Medium" and focuses on the operation of decoder, 203, SPAM-controller, 205C, and microcomputer, 205, on the execution of controlled functions, and on the use of cadence information to organize signal processing. The example begins as divider, 4, starts to transfer to decoder, 203, in its outputted composite video transmission, the embedded binary information of the first message. At the outset of example #1, controller, 39, of decoder, 203, and SPAM-controller, 205C, have each identified an end of file signal and await header information.

Receiving said embedded binary information at decoder, 203, (which does not include a filter, 31, or a demodulator, 32, because its input is a composite video transmission) causes line receiver, 33, automatically to detect and transfer said embedded information to digital detector, 34, which automatically detects the binary information with correcting information in said embedded information and transfers said binary information with correcting information to controller, 39. Using forward error correction techniques, well known in the art, and employing particular correcting information, controller, 39, automatically checks said information, as it is received, and corrects it as necessary then discards said particular correcting information retaining only the corrected information. Using conversion protocol techniques, well known in the art, controller, 39, then automatically converts said corrected information into binary information that receiver station apparatus can receive and process. In this fashion, the binary information of the first message—more precisely, the first combining synch command and its associated program instruction set and end of file signal—are received and converted at decoder, 203.

Once the information of any given point-to-multipoint SPAM transmission has been checked, corrected, and converted in the foregoing fashion, subscriber station apparatus communicate said information point-to-point using flow control and error correction techniques, well known in the art, that include handshaking and requesting retransmission. Thereafter, any given transmission of SPAM information, so corrected and converted, contains not only bits of communicated SPAM information but also so-called "parity bits" that convey error correcting information. At present, the conventional practice is for every ninth bit to be a parity bit that is used, in a fashion well known in the art, to check the correctness of the preceding eight bits, or "byte," of communicated data.

Frequently in this disclosure, specific quantities of bits and bit locations are cited. Said bits are often specified as being "sequential" and "in their order after conversion," and said bit locations are often "contiguous." Unless otherwise stated, said quantities refer only to bits of communicated SPAM information and bit locations that hold communicated SPAM information. No attempt is made to account for the presence of parity bits among transmitted bits of SPAM information or at particular memory locations because techniques for distinguishing bits of communicated data from parity bits and for processing bits of communicated information separately from parity bits are well known in the art.

Automatically, after said binary information is converted, said information is inputted to the EOFS valve of controller, 39, which processes said information in the fashion described above, comparing each signal word of said information to EOFS WORD information and transferring said binary information, signal word by signal word, until an end of file signal is detected.

Receiving the header and execution segment of said first message causes controller, 39, to determine that said message is addressed to URS microcomputers, 205, and to transfer said message to microcomputer, 205. So transferring said message is the controlled function that the information said header and execution segment cause controller, 39, to perform. Automatically, as said EOFS valve transfers converted binary information of said first message, controller, 39, selects and records at particular SPAM-header register memory a particular preprogrammed constant number of the first converted bits of said binary information. Said constant number is the number of bits in a SPAM command header. (Hereinafter, said constant number is called "H".) From the first bit of said binary information, H bits are selected and recorded, in their order after conversion, at said SPAM-header memory. Then, automatically, controller, 39, determines that said information at SPAM-header memory (which is the "01" header of the first combining synch command and designates a SPAM command that is followed by an information segment) does not match particular 11-header-invoking information that is "11". (In other words, the header of said message does not designate a SPAM message that consists of a header followed immediately by an information segment.) Not resulting in a match causes controller, 39, automatically to select a second preprogrammed constant number of next bits and record said bits, in their order after conversion, at particular SPAM-exec register memory. Said second constant number is the particular number of bits in a SPAM execution segment. (Hereinafter, said second constant number is called "X".) Beginning with the next bit of said binary information immediately after said H bits, controller, 39, selects X bits and records said bits, in their order after conversion, at said SPAM-exec memory. Then, automatically, by comparing the information at said SPAM-exec memory (which information is the execution segment of the first combining synch command) with preprogrammed controlled-function-invoking information, controller, 39, determines that said information at memory matches particular this-message-addressed-to-205 information that causes controller, 39, to execute particular preprogrammed transfer-to-205 instructions. Said instructions cause controller, 39, to transfer to SPAM-controller, 205C, the SPAM message associated with the particular information at SPAM-header memory. Automatically, said instructions cause controller, 39, to activate the output port that outputs to SPAM-controller, 205C, then compare said information at SPAM-header memory to preprogrammed header-identification information. Automatically, controller, 39, determines that said information matches particular "01" information. Said match causes controller, 39, automatically to execute particular transfer-a-01-or-an-11-header-message instructions.

A "01" header distinguishes a message that contains lowest priority information. Any given instance of a message with a "01" header ends with an end of file signal. Accordingly, said instructions cause controller, 39, to transfer, from the start of said message, all information received from said valve until said valve detects and transfers the information of an end of file signal. Automatically controller, 39, commences transferring said binary information, starting with said first H bits and transferring said information in its order after conversion, signal word by signal word, as said binary information is outputted by said EOFS valve. In due course, the EOFS valve of controller, 39, receives the last signal word of the information segment of said first message. To satisfy the final rule of message composition cited above, said word, being an instance of a final signal word preceding an end of file signal, contains MOVE bit information and is not an EOFS WORD. Said valve transfers said word which causes controller, 39, to transfer said word to SPAM-controller, 205C. (When said valve receives information of the next signal word after said word, the information of the EOFS WORD Counter of said valve is "00000000" because said word contained MOVE bit information.)

Immediately after embedding and transmitting said last word, the aforementioned program originating studio that is the original transmission station of the programming of "One Combined Medium" generates and embeds an end of file signal in said programming and transmits said signal. More precisely, said studio generates, embeds, and transmits eleven consecutive EOFS WORDs of binary information.

Receiving said first EOFS WORD causes said valve to place information of said WORD at the EOFS Word Evaluation Location of said valve and to compare the information at said Location to the EOFS WORD at the EOFS Standard Word Location of said valve. A match results, causing said valve, in the fashion described above, to increase the value of the information at said EOFS WORD Counter by an increment of one from "00000000" to "00000001". Automatically said valve determines, in the fashion described above, that the "00000001" at said EOFS WORD Counter does not match the "00001011" at said EOFS Standard Length Location which causes said valve to cause the apparatus that inputs signal words to said valve to transfer to said valve the next signal word of said message.

In this fashion, said valve processes sequentially the inputted information of each of the next ten EOFS WORDs, each time increasing the value of the information at said EOFS WORD Counter by an increment of one. When, in the course of the word evaluation sequence of the eleventh and last EOFS WORD, said valve so increases said value, the information at said Counter is "00001011". Automatically said valve determines that said "00001011" matches the "00001011" at said EOFS Standard Length Location which causes said valve to execute the complete-signal-detected instructions described above in "Detecting End of File Signals." Said instructions cause said valve to initiate the transmission of the aforementioned EOFS-signal-detected information to the CPU of controller, 39, as an interrupt signal then to wait for a control instruction from controller, 39, before processing inputted information further.

Receiving said EOFS-signal-detected information at said CPU causes controller, 39, to determine, in a predetermined fashion, that said end of file signal is part of a SPAM message being transferred under control of instructions invoked by transfer-to-addressed-apparatus information. Said determining causes controller, 39, automatically to transmit the aforementioned transmit-and-wait instruction to said valve which causes said valve to transfer one complete end of file signal (which signal is automatically transferred by controller, 39, to SPAM-controller, 205C). Automatically, said valve outputs, sequentially, the binary information of eleven instances of an EOFS WORD; then sets the information at said EOFS WORD Counter to "00000000"; initiates transmission of the aforementioned complete-and-waiting information to the CPU of controller, 39, as an interrupt signal; and commences waiting for a control instruction from controller, 39, before processing next inputted information. In so doing, controller, 39, transfers an end of file signal as a part of said first message and ensures that apparatus to which said message is transferred receive all cadence information necessary to process said message.

Having transferred the binary information of said first message, controller, 39, prepares all apparatus of decoder, 203, as required, to receive the next instance of SPAM message information. Automatically, controller, 39, deactivates all output ports; compares the information at said SPAM-header register memory to particular preprogrammed cause-retention-of-exec information that is "01" and determines a match which causes controller, 39, to transfer information of said information at SPAM-exec register memory to particular SPAM-last-01-header-exec register memory (thereby placing information of the execution segment of the first combining synch command at said SPAM-last-01-header-exec memory); then causes all apparatus of decoder, 203, to delete from memory all information of said binary information except information at said SPAM-last-01-header-exec memory. Then, after receiving said complete-and-waiting information, controller, 39, transmits particular reopen-flow instructions that cause said EOFS valve to recommence processing and transferring inputted signal words in its preprogrammed fashion, and controller, 39, commences waiting to receive from said valve the binary information of a subsequent SPAM header.

(If said information at SPAM-exec memory had failed to match any controlled-function-invoking information at the aforementioned comparing, said failure to match would have signified that the subscriber station of FIG. 3 did not have capacity to execute the controlled function of said command. Whenever comparing execution segment information of any given command to preprogrammed controlled-function-invoking information at any given subscriber station SPAM apparatus results in a failure to match, said failure to match causes said apparatus to discard all received information of the message of said execution segment. In the case of a "01" header message such as said first message, said apparatus discards all received information, except information at register memory, until the EOFS valve of said apparatus, operating in the aforementioned fashion, transfers said EOFS-signal-detected information to the CPU of said apparatus. Said apparatus discards said information, in a fashion described more fully below, by placing each successively received signal word at a particular memory location, and in so doing, overwriting and obliterating the information of the prior signal word. Then receiving said EOFS-signal-detected information causes said apparatus to transmit the aforementioned discard-and-wait instruction to said valve causing said valve, in its preprogrammed discard-and-wait fashion, to discard all information of the end of file signal of said message, set the information of the EOFS WORD Counter of said valve to "00000000", then transmit said complete-and-waiting information to said apparatus. Said complete-and-waiting information causes said apparatus to perform all functions performed by controller, 39, in the foregoing paragraph.)

At SPAM-controller, 205C, of the subscriber station of FIG. 3 (and at SPAM-controllers, 205C, of URS microcomputers, 205, at other subscriber stations), receiving said transferred binary information of the first message causes all apparatus automatically to process the information of said message in the preprogrammed fashions of said apparatus.

Automatically the EOFS valve of SPAM-controller, 205C, commences processing and transferring said information until an end of file signal is detected.

Receiving the header and execution segment of said first message causes SPAM-controller, 205C, to determine the controlled function or functions that said message instructs URS microcomputers, 205, to perform and to execute the instructions of said functions. Automatically, as said valve transfers information, SPAM-controller, 205C, selects the first H converted bits of said information and records said bits at particular SPAM-header-@205 register memory, then determines that said information at SPAM-header-@205 memory (which is the "01" header of the first message) does not match particular 11-header-invoking-@205 information that is "11". Not resulting in a match causes controller, 39, automatically to select the next X bits of said transferred binary information and record said bits at particular SPAM-exec-@205 register memory. Automatically SPAM-controller, 205C, compares the information at said SPAM-exec-@205 memory (which information is the execution segment of the first combining synch command) with preprogrammed controlled-function-invoking-@205 information. Said comparing results in a match with particular execute-at-205 information that causes SPAM-controller, 205C, to invoke particular preprogrammed load-run-and-code instructions that control the loading of particular binary information at the main RAM of microcomputer, 205; the running of the information so loaded; and the placing of particular identification code information at particular SPAM-controller memory. Said binary information that is loaded and run is the information that begins at the first bit of the information segment that follows said X bits, continues through the last bit of said segment, and is, in the "One Combined Medium" application, the information of said program instruction set. Automatically, SPAM-controller, 205C, executes said load-run-and-code instructions.

(No change takes place between controller, 39, and SPAM-controller, 205C, in the information of the execution segment of the first combining synch command. Thus the binary image of the particular controlled-function-invoking information that said information matches at controller, 39—more precisely, the aforementioned particular this-message-addressed-to-205 information—is identical to the binary image of the particular controlled-function-invoking-@205 information that said information matches at SPAM-controller, 205C—said particular execute-at-205 information. While said this-message-addressed-to-205 information and said execute-at-205 information are identical in image, they bear different names in this specification because they invoke different controlled functions. This is but one of many instances in this specification where a given SPAM command invokes different controlled functions at different apparatus because the apparatus are preprogrammed differently.)

To load and run said information, SPAM-controller, 205C, must locate the position, in said transferred binary information, of said first bit and said last bit. Under control of said load-run-and-code instructions, SPAM-controller, 205C, compares the information at said SPAM-header-@205 memory with particular preprogrammed header-identification-@205 information and determines that said information at memory matches particular "01" information. In other words, to locate said first bit, SPAM-controller, 205C, must process the command information of an "01" header message including the length token of a meter-monitor segment.

Under control of said load-run-and-code instructions, said match causes SPAM-controller, 205C, automatically to execute particular preprogrammed process-length-token-@205 instructions. Automatically, said instructions cause SPAM-controller, 205C, to select a third preprogrammed constant number of next bits and record said bits at particular memory. Said third constant number is the particular number of bits in an instance of SPAM meter-monitor format field length token information. (Hereinafter, said third constant number is called "L".) Beginning with the bit of said transferred binary information immediately after the last of said X bits, SPAM-controller, 205C, selects L bits and records said bits, in their order after conversion, at particular SPAM-length-info-@205 register memory. Automatically SPAM-controller, 205C, compares the information at said SPAM-length-info-@205 memory with preprogrammed token-comparison-@205 information and determines that said information at memory matches particular token-comparison-@205 information (which particular information is called, hereinafter, "W-token information"). Said match causes SPAM-controller, 205C, to place particular preprogrammed bit-length-number information at said SPAM-length-info-@205 memory. (Said particular bit-length-number information is called, hereinafter, "w-bits information".) Said information is the precise number of bits, following the last of said L bits, that remain in the meter-monitor segment of the command associated with said length token. Said number is not a preprogrammed constant value such as H, X, and L that is the same for every SPAM command with a meter-monitor segment. Rather, said number is a variable that may differ from one SPAM meter-monitor segment to the next. More precisely, it is, for any given meter-monitor segment, a selected one of several preprogrammed bit-length-number information alternatives. (Hereinafter, the number of the particular selected bit-length-number alternative associated with any given length token is called "MMS-L" to signify that said number is L bits less than the number bits in the meter-monitor segment in which said length token occurs.)

Having executed said process-length-token-@205 instructions and continuing under control of said load-run-and-code instructions, automatically SPAM-controller, 205C, adds L to the information (of MMS-L) at said SPAM-length-info-@205 memory and, in so doing, determines the exact number of bits in the meter-monitor segment of said command (which is also the exact number of bits from the first bit after the last of said X bits to the last bit of said command). (Hereinafter, the exact number of bits in any given meter-monitor segment is called, "MMS".) Then SPAM-controller, 205C, causes information of the first MMS bits of said transferred binary information that begin immediately after the last of said X bits to be stored at particular MMS-memory of SPAM-controller, 205C. In so doing, SPAM-controller, 205C, retains information of the meter-monitor segment of said first message. Then, automatically, SPAM-controller, 205C, executes particular preprogrammed instructions, including assess-padding-bit-@205 instructions, that are described more fully elsewhere in this specification and that cause said SPAM-controller, 205C, to identify the particular signal word, associated with the command information of said first message, that is the last signal word before the first signal word of the information segment of said message.

Then SPAM-controller, 205C, commences loading information at the main RAM of microcomputer, 205. Automatically, under control of said load-run-and-code instructions, SPAM-controller, 205C, instructs microcomputer, 205, to commence receiving information from SPAM-controller, 205C, and loading said information at particular main RAM, in a fashion well known in the art. Automatically SPAM-controller, 205C, commences transferring information to microcomputer, 205, beginning with said selected signal word. Automatically, as microcomputer, 205, receives said information, microcomputer, 205, loads said information at particular main RAM.

In due course, the EOFS valve of SPAM-controller, 205C, receives the aforementioned last signal word of the information segment of said first message, which is the last signal word of said program instruction set, and transfers said word which causes SPAM-controller, 205C, to transfer said word to microcomputer, 205, and microcomputer, 205, to load said word at said RAM. (After transferring said word, the information of the EOFS WORD Counter of said valve is "00000000".)

Then said valve commences receiving information of the eleven EOFS WORDs sequentially outputted by the EOFS valve of controller, 39, which information constitutes the end of file signal in said transferred binary information. Receiving the first EOFS WORD of said eleven causes the EOFS valve of SPAM-controller, 205C, to commence retaining information of said WORD in the fashion described above. Said retaining causes SPAM-controller, 205C, to stop transferring information to microcomputer, 205, and microcomputer, 205, to stop loading information at said RAM. As said valve receives all said EOFS WORD information, said valve detects said end of file signal just as the EOFS valve of controller, 39, detected the end of file signal in the binary information inputted to said valve. When, in the course of the word evaluation sequence of the eleventh and last EOFS WORD in said information, the EOFS valve of SPAM-controller, 205C, determines that the information at the EOFS WORD Counter of said valve matches the information at the EOFS Standard Length Location of said valve, said valve initiates the transmission of the aforementioned EOFS-signal-detected information to the CPU of SPAM-controller, 205C, as an interrupt signal and commences waiting for a control instruction from said CPU.

Receiving said EOFS-signal-detected information at said CPU while under control of said load-run-and-code instructions causes SPAM-controller, 205C, to cease loading and execute the remainder of said load-run-and-code instructions. Automatically SPAM-controller, 205C, causes microcomputer, 205, to cease loading information at said RAM and execute the information so loaded as so-called "machine executable code" of one so-called "job." Because information of said end of file signal is no longer needed, said instructions cause SPAM-controller, 205C, to transmit the aforementioned discard-and-wait instruction to said valve. Said instruction causes said valve to set the information at said EOFS WORD Counter to "00000000" without transferring any information of said detected end of file signal; to initiate transmission of the aforementioned complete-and-waiting information to the CPU of SPAM-controller, 205C, as an interrupt signal; and to wait for a control instruction from SPAM-controller, 205C, before processing next inputted information.

Then SPAM-controller, 205C, commences executing the code portion of said load-run-and-code instructions. The instructions of said portion cause SPAM-controller, 205C, to compare the information at said SPAM-header memory to particular load-run-and-code-header information that is "01". A match results (which indicates that said first message contains meter-monitor information). Said match causes SPAM-controller, 205C, to execute particular preprogrammed evaluate-meter-monitor-format instructions and locate-program-unit instructions. Under control of said instructions and in a fashion that is described more fully below, SPAM-controller, 205C, locates the "program unit identification code" information in the information of the meter-monitor segment stored at said MMS-memory. Then said code portion instructions cause SPAM-controller, 205C, to place said code information at particular SPAM-first-precondition register memory. In so doing, SPAM-controller completes said load-run-and-code instructions and completes the controlled functions executed by the execution segment information of said first message.

Having completed said controlled functions, automatically SPAM-controller, 205C, prepares to receive the next instance of SPAM message information. Automatically, SPAM-controller, 205C, compares the information at said SPAM-header-@205 register memory to particular preprogrammed cause-retention-of-exec-@205 information that is "01" and determines a match which causes SPAM-controller, 205C, to transfer information of said information at SPAM-exec-@205 register memory to particular SPAM-last-01-header-exec-@205 register memory. Then SPAM-controller, 205C, causes all apparatus of SPAM-controller, 205C, to delete from memory all information of said transferred binary information except information at said SPAM-first-precondition and SPAM-last-01-header-exec-@205 memories. Finally, after receiving said complete-and-waiting information, SPAM-controller, 205C, transmits particular instructions that cause said EOFS valve to commence processing and transferring inputted signal words, in its preprogrammed detecting fashion, and SPAM-controller, 205C, commences waiting to receive from said valve the binary information of a subsequent SPAM header.

As described in "One Combined Medium" above, loading and running said program instruction set causes microcomputer, 205, (and URS microcomputers, 205, at other subscriber stations) to place appropriate FIG. 1A image information at particular video RAM. In addition, running said set also causes microcomputer, 205, after completing placing said image information at said RAM, to transfer particular number-of-overlay-completed information and instructions to SPAM-controller, 205C. Said information and instructions cause SPAM-controller, 205C, to place the number "00000001" at particular SPAM-second-precondition register memory at SPAM-controller, 205C, signifying that said image information represents the first overlay of its associated video program.

(Had said information at SPAM-exec-@205 memory failed to match any execute-at-205 information at the aforementioned comparing, SPAM-controller, 205C, would have discarded discard all received information of the message of said information at SPAM-exec-@205 in the fashion described above.)

Operating S. P. Systems

Example #1

Second Message

Subsequently, the embedded information of the second message, which conveys the second combining synch command, is transferred from divider, 4, to decoder, 203.

In the same fashion that applied to the first message, receiving said embedded information causes the apparatus of decoder, 203, to detect, check, correct as necessary, and convert said information, into binary information of said second message. Automatically the EOFS valve of controller, 39, processes and transfers said information, signal word by signal word.

As with the first message, receiving the header and execution segment of said second message causes controller, 39, to determine that said message is addressed to URS microcomputers, 205, and to transfer said second message accordingly. Automatically, as said valve transfers said binary information, controller, 39, selects the first H converted bits and records said bits, in their order after conversion, at said SPAM-header register memory. Automatically controller, 39, determines that the information at said memory (which is the "00" header of the second combining synch command and signifies a SPAM command with a meter-monitor segment but no information segment) does not match said 11-header-invoking information that is "11". Not resulting in a match causes controller, 39, automatically to select the next X bits of said binary information immediately after said H bits, the execution segment of the second combining synch command, and record said X bits, in their order after conversion, at said SPAM-exec register memory. Then, automatically, by comparing the information at said SPAM-exec memory with said controlled-function-invoking information, controller, 39, determines that said information at memory matches particular preprogrammed this-message-addressed-to-205 information that invokes said transfer-to-205 instructions. Automatically, controller, 39, executes said instructions; activates the output port that outputs to SPAM-controller, 205C; compares said information at SPAM-header memory to header-identification information; and determines that said information matches particular "00" information. (In other words, the header of said second message is "00".) Said match causes controller, 39, automatically to invoke particular preprogrammed transfer-a-00-header-message instructions.

A "00" header distinguishes a message that contains intermediate priority information but no lowest priority information. To identify the length and last bit of a "00" header message, controller, 39, must process length token information and may need to execute the aforementioned assess-padding-bit instructions to determine whether a full signal word of padding follows the last signal word in which command information occurs.

Automatically, said transfer-a-00-header-message instructions cause controller, 39, to execute particular preprogrammed process-length-token instructions. Said instructions cause controller, 39, to select the first L bits of said binary information immediately after the last of said X bits and record said selected bits, in their order after conversion, at particular SPAM-length-info register memory. Said L bits are the bits of the length token of said "00" header message. Automatically controller, 39, compares the information at said SPAM-length-info memory to preprogrammed token-comparison information and determines that said information at memory matches particular X-token information. (Said X-token information is different token-comparison information from the W-token information matched by the length-token of the first message of example #1.) Said match causes controller, 39, automatically to select particular preprogrammed x-bits information that is bit-length-number information associated on a one to one basis with said X-token information and to place said x-bits information at said SPAM-length-info memory. The numeric value of said x-bits information is the MMS-L, the precise number of bits, after the last of said L bits, that remain in the meter-monitor segment associated with said L bits.

Then said transfer-a-00-header-message instructions cause controller, 39, to execute particular preprogrammed determine-command-information-word-length instructions. Said instructions cause controller, 39, to add a particular preprogrammed constant number that is the sum of H plus X plus L to the x-bits information at said SPAM-length-info memory. (Hereinafter, said constant is called "H+X+L".) In so doing, controller, 39, determines the number of bits in the command information of said "00" header message. Then controller, 39, divides the numeric information at said memory by the number of bits in one signal word and stores the quotient of said dividing at said SPAM-length-info memory. By determining said quotient, controller, 39, determines the number of signal words in said command information. (Said quotient may be an integer or a so-called "floating point number" that is a whole number plus a decimal fraction.)

Having determined said number of signal words, controller, 39, can determine whether or not the possibility exists that an instance of the aforementioned full signal word of padding bits follows the last signal word of said number of signal words. If said command information fills a whole number of signal words plus a decimal fraction, the last signal word in which command information occurs is not completely filled by command information bits. Padding bits that are MOVE bits fill out said signal word, and no possibility exists that a full signal word of padding bits follows said signal word. On the other hand, if said command information fills a whole number of signal words exactly, the last signal word in which command information occurs is completely filled by command information bits. The possibility exists that said signal word may contain no MOVE bit information and that a full signal word of padding bits may follow said signal word.

To determine whether said possibility exists, said transfer-a-00-header-message instructions cause controller, 39, to execute particular preprogrammed evaluate-end-condition instructions. In a fashion well known in the art, said instructions cause controller, 39, to identify the largest integer that is less than or equal to the information at said SPAM-length-info memory and place information of said integer at particular working register memory. Then controller, 39, compares the information at said working memory to the information at said SPAM-length-info memory. (For the information of said largest integer to equal the information of said quotient means that said quotient is an integer, that said command information fills a whole number of signal words exactly, and that the possibility exists that a full signal word of padding bits does follow the last signal word in which command information occurs.) If the information at said working memory is equal to the information at said SPAM-length-info memory, said instructions cause controller, 39, to place "0" information at particular SPAM-Flag-working register memory. Otherwise said instructions cause controller, 39, to place "1" information at said memory.

Then said transfer-a-00-header-message instructions cause controller, 39, to execute particular preprogrammed calculate-number-of-words-to-transfer instructions. Automatically, controller, 39, compares the information at said SPAM-Flag-working memory to particular end-condition-comparison information that is "0". (If the information at said SPAM-Flag-working memory is "0", said command information fills a whole number of signal words exactly; said whole number is the integer information at said working memory; but the last signal word of command information must be evaluated to ascertain whether it contains MOVE bit information.) Under control of said instructions, resulting in a match with said "0" information causes controller, 39, to subtract one (1) from the numeric value of the integer information at said working memory. (On the other hand, if the information at said SPAM-Flag-working memory is "1", said command information only partially fills the last of a whole number of signal words exactly; MOVE bits fill the remainder of the last of said words; and said whole number is one greater than said largest integer information that is at said working memory.) Under control of said instructions, not resulting in a match with said "0" information causes controller, 39, to add one to the numeric value of the integer information at said working memory.

Next said transfer-a-00-header-message instructions cause controller, 39, to execute particular preprogrammed commence-transfer instructions. Said instructions cause controller, 39, to transfer a particular number of signal words of said command information, starting with the signal word in which the first of said first H bits occurs and transferring said information in its order after conversion, signal word by signal word. Said number is the numeric value of the integer information at said working memory.

Finally, said transfer-a-00-header-message instructions cause controller, 39, to execute particular preprogrammed evaluate-padding-bits-? instructions that cause controller, 39, to compare the information at said SPAM-Flag-working memory to particular continue-? information that is "0".

Not resulting in a match means that, under control of said commence-transfer instructions, controller, 39, has transferred all command information of said "00" header message and no possibility exists that a full signal word of padding bits ends said message. Accordingly, not resulting in a match causes controller, 39, to complete said transfer-a-00-header-message instructions.

On the other hand, resulting in a match means that controller, 39, has transferred all but the last signal word of command information, and said word must be evaluated to ascertain whether it contains MOVE bit information. Accordingly, resulting in a match causes controller, 39, to execute the aforementioned assess-padding-bit instructions. Said instructions cause controller, 39, to compare said last word to particular preprogrammed end?-EOFS-WORD information that is the information of one EOFS WORD. If no match results, said word is the last word of said message. Otherwise, one full signal word of padding bits follows said word and ends said message. Accordingly, when said last word is compared to said EOFS WORD information, not resulting in a match causes controller, 39, to transfer just said last signal word, but resulting in a match causes controller, 39, to transfer said last signal word then the signal word, in said binary information, that is immediately after said signal word. In so doing, controller, 39, transfers the complete binary information of the message of the instance of header information at said SPAM-header memory and completes said transfer-a-00-header-message instructions.

Two specific cases illustrate the operation of said transfer-a-00-header-message instructions. One focuses on the "00" header message of FIG. 2H. The other focuses on the message of FIG. 2K. In either case, the signal words are eight-bit bytes, H equals two, X equals six, L equals two, and H+X+L equals ten. In both cases, controller, 39, is preprogrammed with token-comparison information, including particular 01-token information that is "01" and is associated, on a one to one basis, with particular preprogrammed 01011-bits information that is the binary representation of eleven and particular 11-token information that is "11" and is associated, on a one to one basis, with particular preprogrammed 10110-bits information that is the binary representation of twenty-two. In both cases, when said instructions are invoked, information of the first H (that is, the first two) bits of the message being processed has been recorded at SPAM-header memory and information of the next X (that is the next six, the third through the eight bits) has been recorded at SPAM-exec memory. Thus said instructions process binary information that commences at the bit that is located immediately after the eighth bit of said message which eighth bit is the last of said X bits.

FIG. 2H shows one instance of a message that contains command information that fills a whole number of signal words plus a decimal fraction. Said command information fills two bytes plus five bits (that is, 2.625 bytes). Three padding bits that are MOVE bits have been added to the third byte of said message to fill out said byte.

When said transfer-a-00-header-message instructions are executed in the course of the processing of the message of FIG. 2H, said instructions cause processing to proceed in the following fashion.

Said process-length-token instructions are executed and cause controller, 39, to select the first two bits of said binary information immediately after said eighth bit and record said bits at said SPAM-length-info memory. Said two bits are "01", the length-token of said message. (After said bits are recorded at said memory, the information at said memory is "0000000000000001".) Automatically controller, 39, commences comparing the information at said SPAM-length-info memory to said token-comparison information. In the course of said comparing, controller, 39, automatically places at particular working register memory said 01-token information that is "01". (After said information is placed at said memory, the information at said memory is "0000000000000001".) Automatically, controller, 39, compares the information at said SPAM-length-info memory to the information at said working memory, and a match results. Said match causes controller, 39, automatically to select said 01011-bits information that is the binary representation of eleven and place said information at said SPAM-length-info memory. (Eleven, which is the numeric value of said 01011-bits information, is the MMS-L of said message.)

Then automatically said determine-command-information-word-length instructions are executed. Said instructions cause controller, 39, to add H+X+L, which is the binary representation of ten, to the information at said SPAM-length-info memory. In so doing, controller, 39, places at said SPAM-length-info memory the numeric value of the number of bits in the command information of said message—twenty-one (which is eleven plus ten). Then controller, 39, divides the numeric value information at said memory (twenty-one) by the number of bits in one byte (eight) and stores the quotient of said dividing (which quotient is 2.625 and is stored in a floating point fashion) at said SPAM-length-info memory. In so doing, controller, 39, determines that said command information occupies 2.625 bytes.

Next said evaluate-end-condition instructions are executed. Said instructions cause controller, 39, to identify the integer two (2) as the largest integer that is less than or equal to the 2.625 information that is at said SPAM-length-info memory and to place binary information of said integer, two (2), at said working register memory. Automatically controller, 39, compares said two (2) information at working memory to said 2.625 information at SPAM-length-info memory. Because the information at said working memory is not equal to the information at said SPAM-length-info memory, controller, 39, automatically places "1" information at said SPAM-Flag-working register memory.

Then said calculate-number-of-words-to-transfer instructions are executed. Automatically, controller, 39, compares the information at said SPAM-Flag-working memory to said end-condition-comparison information that is "0", and no match results. (The fact that the information at said SPAM-Flag-working memory is "1", means that said command information only partially fills the last byte of said message, that MOVE bits fill the remainder of said byte, and that the number of bytes in said message is one greater than said integer information at said working memory.) Not resulting in a match causes controller, 39, to add one (1) to the numeric value two (2) that is the information at said working memory, thereby increasing the numeric value of said information at working memory to three (3).

Next said commence-transfer instructions are executed. Said instructions cause controller, 39, to transfer three (3) eight-bit bytes (which three (3) is the numeric value of the integer information at said working memory) of binary information, starting with the byte in which the first bit of said message occurs and transferring said information in its order after conversion, byte by byte. In so doing, controller, 39, transfers all information of said message to the addressed apparatus of said message.

Finally, said evaluate-padding-bits-? instructions are executed and cause controller, 39, to compare the "1" information at said SPAM-Flag-working memory to said continue-? information that is "0", and no match results. Not resulting in a match causes controller, 39, to complete said transfer-a-00-header-message instructions.

In this fashion, said transfer-a-00-header-message instructions cause controller, 39, to transfer the message of FIG. 2H to the addressed apparatus of said message.

By contrast, the second illustrative case of FIG. 2K shows a message that contains command information that fills a whole number of signal words exactly and is followed by a full signal word of padding bits. The command information of said message fills four bytes. The last of said bytes contains only EOFS bits and is an EOFS WORD. Accordingly said last byte is followed by one full byte of padding bits which one byte is the fifth and last byte of said message.

Said transfer-a-00-header-message instructions cause the message of FIG. 2K, to be processed in the following fashion.

Said process-length-token instructions cause controller, 39, to select the ninth and tenth bits of said binary information and record said bits at said SPAM-length-info memory. Said two bits are the "11" length-token of said message, and after said bits are so recorded, the information at said memory is "0000000000000011". Automatically controller, 39, commences comparing said information at SPAM-length-info memory to said token-comparison information. Automatically controller, 39, places said 11-token information that is "11" at said working register memory, after which the information at said memory is "0000000000000011". Automatically, controller, 39, compares said information at SPAM-length-info memory to said information at said working memory, and a match results. Said match causes controller, 39, automatically to select said 10110-bits information that is the binary representation of twenty-two and place said information at said SPAM-length-info memory. (Twenty-two, which is the decimal equivalent value of said 10110-bits information, is the MMS-L of said message.)

Then said determine-command-information-word-length instructions cause controller, 39, to add H+X+L, which is the binary representation of ten, to the information at said SPAM-length-info memory, making the information at said SPAM-length-info memory the binary representation of thirty-two. Then controller, 39, divides information at said memory (thirty-two) by the number of bits in one byte (eight) and stores the quotient of said dividing (which quotient is 4 and is stored in an integer fashion) at said SPAM-length-info memory. In so doing, controller, 39, determines that said command information occupies 4 bytes exactly.

Next said evaluate-end-condition instructions cause controller, 39, to identify the integer four (4) as the largest integer that is less than or equal to the 4 information at said SPAM-length-info memory and to place binary information of said integer, four (4), at said working register memory. Automatically controller, 39, determines that said four (4) information at working memory matches said 4 information at SPAM-length-info memory. Said match causes controller, 39, automatically to place "0" information at said SPAM-Flag-working register memory.

Then said calculate-number-of-words-to-transfer instructions cause controller, 39, to determine that the information at said SPAM-Flag-working memory matches said end-condition-comparison information that is "0". Said match causes controller, 39, to subtract one (1) from the numeric value, four (4), that is the information at said working memory, thereby decreasing the numeric value of said information at working memory to three (3).

Next said commence-transfer instructions cause controller, 39, to transfer three (3) eight-bit bytes (which three (3) is the numeric value of the integer information at said working memory) of binary information, starting with the byte in which the first bit of said message occurs and transferring said information in its order after conversion, byte by byte. In so doing, controller, 39, transfers all but the last byte of command information. Controller, 39, transfers the first, second, and third bytes. But the fourth byte, which is said last byte, remains untransferred.

Finally, said evaluate-padding-bits-? instructions cause controller, 39, to determine that the "0" information at said SPAM-Flag-working memory matches said continue-? information that is "0". Resulting in a match causes controller, 39, to execute said assess-padding-bit instructions. Said instructions cause controller, 39, to compare said last byte to said end-? EOFS WORD information. Because the fourth byte of the message of FIG. 2K is an EOFS WORD, a match results. Said match means that a full byte of padding bits follows said last byte of command information. Said match causes controller, 39, to transfer two bytes of binary information which bytes are the fourth and fifth bytes of said message (which fifth byte is the last signal word of said message). Then said instructions cause controller, 39, to complete said transfer-a-00-header-message instructions.

In this fashion, said transfer-a-00-header-message instructions cause controller, 39, to transfer the message of FIG. 2K to the addressed apparatus of said message.

In applicable fashions of said transfer-a-00-header-message instructions, controller, 39, transfers to SPAM-controller, 205C, the complete binary information of the message that contains the second combining synch command.

When controller, 39, completes said transfer-a-00-header-message instructions, automatically controller, 39, prepares all apparatus of decoder, 203, to receive a next SPAM message. Controller, 39, deactivates all output ports; determines that the information at said SPAM-header register memory does not match said cause-retention-of-exec information that is "11"; causes all apparatus of decoder, 203, to delete from memory all information of said binary information; then commences to wait for the binary information of a subsequent SPAM header.

At SPAM-controller, 205C, (and at the SPAM-controllers, 205C, of other URS microcomputers, 205), receiving the transferred binary information of said second message causes all apparatus automatically to process the information of said message in their preprogrammed fashions.

Automatically the EOFS valve of SPAM-controller, 205C, processes said information and transfers said information, signal word by signal word.

Receiving the header and execution segment of said second message causes SPAM-controller, 205C, to determine the controlled function or functions that said message instructs URS microcomputers, 205, to perform and to execute the instructions of said functions. Automatically, as said valve transfers information, SPAM-controller, 205C, selects the H first converted bits of said information, records said bits at said SPAM-header-@205 register memory, and determines that the information at said memory (which is the "00" header of said second message) does not match said 11-header-invoking-@205 information. No match results which causes controller, 39, automatically to select the next X bits of said transferred binary information and record said bits at particular SPAM-exec-@205 register memory. Automatically SPAM-controller, 205C, compares the information at said SPAM-exec-@205 memory with said controlled-function-invoking-@205 information. Said comparing results in a match with particular execute-conditional-overlay-at-205 information that causes SPAM-controller, 205C, to execute particular preprogrammed conditional-overlay-at-205 instructions.

Said instructions cause SPAM-controller, 205C, to execute "GRAPHICS ON" at the PC-MicroKey System of microcomputer, 205, if particular specified conditions are satisfied. To satisfy said conditions, the instance of image information at the video RAM of microcomputer, 205, (FIG. 1A) must be relevant to particular broadcast video programming transmitted immediately after the instance of broadcast programming in which said second message is embedded (FIG. 1B). More precisely, particular program unit and overlay number information specified for each instance must match. In the meter-monitor segment of the second combining synch command, said command conveys specified unit and number information for said instance of broadcast programming. If, in a fashion described below, said specified information matches particular other unit and number information, said conditional-overlay-at-205 instructions cause SPAM-controller, 205C, so to execute "GRAPHICS ON". Accordingly, said second command is one example of a specified condition command.

In order to determine whether said specified information matches said other information, SPAM-controller, 205C, must locate said specified information. More precisely, SPAM-controller, 205C, must locate two particular information fields of the meter-monitor segment of said second command. One is the program unit field whose information identifies uniquely the program unit of said "Wall Street Week" program. The other is the overlay number field whose information identifies uniquely the particular one of the overlays of said program that said command specifies and causes to be overlayed.

To locate said information, said conditional-overlay-at-205 instructions cause SPAM-controller, 205C, to execute the aforementioned evaluate-meter-monitor-format instructions. (Because said conditional-overlay-at-205 instructions are executed only by SPAM commands with "00" headers, comparing information at said SPAM-header-@205 memory with header-identification-@205 information is unnecessary.) Said evaluate-meter-monitor-format instructions cause SPAM-controller, 205C, to select particular bits at particular predetermined locations in said transferred binary information and record said bits at particular SPAM-format register memory. Said bits are the bits of the meter-monitor format field of said command. Then, automatically, by comparing the information at said SPAM-format memory with preprogrammed format-specification information, SPAM-controller, 205C, determines that said information at memory matches particular information that invokes particular process-this-specific-format instructions. Automatically SPAM-controller, 205C, executes said instructions, and said instructions cause one particular offset-address number to be placed at particular SPAM-mm-format-@205 register memory at SPAM-controller, 205C. Said number specifies the address/location at the RAM of SPAM-controller, 205C, of the first bit of information that identifies the specific format of the meter-monitor segment of said second command.

Then said conditional-overlay-at-205 instructions cause SPAM-controller, 205C, to execute the aforementioned locate-program-unit instructions. Making reference to the information at said SPAM-mm-format memory, said instructions cause SPAM-controller, 205C, to selects two particular preprogrammed binary numbers located at said RAM at two particular predetermined program-unit distances from said address/location and places said numbers, respectively, at the aforementioned first- and second-working register memories. Said numbers are respectively (1) the bit distance from the first bit of said transferred binary information to the first bit of said program unit field and (2) the bit length of said program field. Automatically SPAM-controller, 205C, selects particular information that begins at a bit distance after the first bit of said binary information, which bit distance is equal to the information at said first-working memory, and that is of a bit length equal to the information at said second-working memory. SPAM-controller, 205C, places said selected information at said first-working memory (thereby overwriting and obliterating the information previously there). In so doing, SPAM-controller, 205C, selects from the bits of said transferred binary information and records at said first-working memory the information of said program unit field.

Then said conditional-overlay-at-205 instructions cause SPAM-controller, 205C, to compare the information at said first-working memory, which is the unique "program unit identification code" that identifies the program unit of said "Wall Street Week" program, to the information at the aforementioned SPAM-first-precondition register memory, which is the same unique code (having been transmitted to SPAM-controller, 205C, in the program unit field of the meter-monitor segment of the first combining synch command and so selected and recorded at said register memory under control of said evaluate-meter-monitor-format instructions and said locate-program-unit instructions when said instructions were executed by said load-run-and-code instructions in the course of the processing of said first message). A match results (which indicates that SPAM-controller, 205C, executed said load-run-and-code instructions under control of said first message.)

(At any subscriber station where information at first-working register memory fails to match information at SPAM-first-precondition register memory [indicating that the SPAM-controller, 205C, had not executed said instructions], said failing to match causes the SPAM-controller, 205C, of said station to execute particular preprogrammed instructions that cause the microcomputer, 205, of said station to clear all SPAM information from main and video RAMs and commence waiting for subsequent control instructions. Then the preprogrammed instructions of said SPAM-controller, 205C, cause SPAM-controller, 205C, to discard all information of transferred binary information of said second message and commence waiting for the binary information of a subsequent SPAM header.)

At the subscriber station of FIG. 3, said match of information at said first-working memory and information at SPAM-first-precondition memory, causes SPAM-controller, 205C, to continuing executing particular conditional-overlay-at-205 instructions. Said instructions cause SPAM-controller, 205C, to execute particular preprogrammed locate-overlay-number instructions. Making reference to the information at said SPAM-mm-format memory, said instructions cause SPAM-controller, 205C, to selects two particular preprogrammed binary numbers located at said RAM at particular predetermined overlay-number distances from said address/location and places said numbers, respectively, at said first-an second-working register memories. Said numbers are respectively (1) the bit distance from the first bit of said transferred binary information to the first bit of said overlay number field and (2) the bit length of said overlay field. Automatically SPAM-controller, 205C, selects particular information that begins at a bit distance after the first bit of said binary information, which bit distance is equal to the information at said first-working memory, and that is of a bit length equal to the information at said second-working memory. SPAM-controller, 205C, places said selected information at said first-working memory (thereby overwriting and obliterating the information previously there). In so doing, SPAM-controller, 205C, selects from the bits of said transferred binary information and records at said first-working memory the information of said overlay number field. (After the information of said overlay field is placed at said memory, the information at said memory is "00000001".)

Then said conditional-overlay-at-205 instructions cause SPAM-controller, 205C, to compare the information at said first-working memory to the "00000001" information at the aforementioned SPAM-second-precondition register memory. A match results (indicating that microcomputer, 205, has completed placing appropriate FIG. 1A image at video RAM).

(At any subscriber station where information at first-working register memory fails to match information at SPAM-second-precondition memory [indicating that the microcomputer, 205, has failed to complete so placing information at video RAM], said failing to match causes the SPAM-controller, 205C, of said station to execute particular preprogrammed instructions that cause said SPAM-controller, 205C, to interrupt the operation of the CPU of said microcomputer, 205, in an interrupt fashion well known in the art, and transmit particular restore-efficiency instructions to said CPU that include information of the information at said first-working memory and that cause said microcomputer, 205, in a preprogrammed fashion discussed more fully below, to restore efficient operation.)

At the subscriber station of FIG. 3 (and at URS microcomputers, 205, at other subscriber stations where information at first-working memory matches information at SPAM-second-precondition memory), said match causes SPAM-controller, 205C, to continue executing particular conditional-overlay-at-205 instructions at a particular instruction. Said instruction causes SPAM-controller, 205C, to execute "GRAPHICS ON" at said PC-MicroKey System. In so doing, SPAM-controller, 205C, completes said conditional-overlay-at-205 instructions and the controlled functions of the second combining synch command.

Having completed said controlled functions, automatically SPAM-controller, 205C, prepares to receive the next instance of SPAM message information. Automatically, SPAM-controller, 205C, determines that the information at said SPAM-header-@205 register memory does not match said cause-retention-of-exec information that is "01"; causes all apparatus of SPAM-controller, 205C, to delete from memory all information of said transferred binary information; and commences waiting to receive the binary information of a subsequent SPAM header.

In the foregoing fashion and as described in "One Combined Medium" above, said transferred information of the second combining synch command causes microcomputer, 205, to combine the programming of FIG. 1A and of FIG. 1B and transmit said combined programming to monitor, 202M, where FIG. 1C is displayed.

Operating S. P. Systems

Example #1

Third Message

Subsequently, the embedded information of the third message, which conveys the third combining synch command, is transferred from divider, 4, to decoder, 203.

In the same fashion that applied to the first and second messages, receiving said embedded information causes decoder, 203, automatically to detect, check, correct as necessary, convert said information into binary information of said third message; to process and transfer said binary information at the EOFS valve of controller, 39; and then to process the header and execution segment information in said binary information at controller, 39.

Receiving said header and execution segment information causes controller, 39, to determine that said message is addressed to URS microcomputers, 205, and to transfer said message accordingly. Receiving the first H converted bits of said binary information from said valve causes controller, 39, to select and record said H bits (the "10" header of the third combining synch command which designates a SPAM command with only an execution segment) at said SPAM-header register memory then determine that the information at said SPAM-header memory does not match said "11" information. Not resulting in a match causes controller, 39, to process the next X received bits as the execution segment of a SPAM command. Receiving the next X bits of said binary information from said valve causes controller, 39, to select and record said next X bits (the execution segment of the third combining synch command) at said SPAM-exec register memory, compare the information at said SPAM-exec memory to said controlled-function-invoking information, determine that said information at memory matches particular preprogrammed this-message-addressed-to-205 information that invokes the aforementioned transfer-to-205 instructions, and execute said instructions. Automatically controller, 39, activates the output port that outputs to SPAM-controller, 205C; compares said information at SPAM-header memory to said header-identification information; and determines that said information at memory matches particular "10" information. Said match causes controller, 39, automatically to execute particular preprogrammed transfer-a-10-header-message instructions.

A "10" header distinguishes a message that is constituted only of first priority segments. At any given time, any given instance of "10" header message command information is of one constant binary length—the aforementioned header+exec constant length. (Hereinafter, said length is called "H+X" and is the sum of H plus X.) No length token information is processed, but it may be necessary to execute the aforementioned assess-padding-bit instructions to determine whether a full signal word of padding follows the last signal word in which command information occurs.

Said transfer-a-10-header-message instructions transfer a "10" header message by executing many of the preprogrammed instructions executed by the aforementioned transfer-a-00-header-message instructions that controlled the transferring of the "00" header second message of example #1.

Because length token information is not processed, said transfer-a-10-header-message instructions do not cause execution of said process-length-token instructions.

Because each instance of "10" header message command information is of said one constant binary length, H+X, said transfer-a-10-header-message instructions do not cause execution of said determine-command-information-word-length instructions. Instead, said transfer-a-10-header-message instructions include particular preprogrammed 10-header-word-length information that is described more fully below.

Just as with "00" header messages, the possibility can exist that a full signal word of padding bits may follow the last signal word of command information of a "10" header message. If H+X bits of binary information fill a whole number of signal words plus a decimal fraction, the last signal word of command information of any given instance of a "10" header message is not completely filled by command information bits. Padding bits that are MOVE bits fill out said word, and no possibility exists that a full word of padding bits follows said word. But if H+X bits fill a whole number of signal words exactly, the last signal word of command information is completely filled by command information bits. Said word may contain no MOVE bit information, and a full signal word of padding bits may follow said word.

Because each instance of "10" header message command information is of said one length, said transfer-a-10-header-message instructions do not cause execution of said evaluate-end-condition instructions to determine whether said possibility exists. Instead, said transfer-a-10-header-message instructions include particular preprogrammed 10-header-end-condition information. At those times when H+X bits of binary information fill a whole number of signal words exactly, said information is the binary value of zero. At all other times, said information is the binary value of one.

Likewise, because each instance of "10" header message command information is of said one length, said transfer-a-10-header-message instructions do not cause execution of said calculate-number-of-words-to-transfer instructions. Instead, at any given time said 10-header-word-length information is preprogrammed number information that applies to every instance of "10" header message information. At those times when H+X bits of binary information fill an integer number of signal words exactly and a full signal word of padding bits may follow the last signal word in which command information occurs, said 10-header-word-length information is, itself, and integer that equals said integer number minus one. In the preferred embodiment where signal words are eight-bit bytes said 10-header-word-length information equals (H+X/8)−1. At those times when H+X bits of binary information do not fill a whole number of signal words exactly and the quotient of H+X divided by the number of bits in a signal word is a whole number plus a decimal fraction, said 10-header-word-length information equals the smallest integer larger than said quotient.

The first set of preprogrammed instructions that said transfer-a-10-header-message instructions and said transfer-a-00-header-message instructions have in common are said commence-transfer instructions. But before said transfer-a-10-header-message instructions can execute said commence-transfer instructions, said 10-header-word-length information and said 10-header-end-condition information must be at particular locations. Accordingly, when executed said transfer-a-10-header-message instructions cause controller, 39, to place information of said 10-header-word-length information at the aforementioned particular working register memory and information of said 10-header-end-condition information at the aforementioned SPAM-Flag-working register memory.

Next said transfer-a-10-header-message instructions cause controller, 39, to execute said commence-transfer instructions. Said instructions cause controller, 39, to transfer a particular number of signal words of said command information, starting with the signal word in which the first of said first H bits occurs and transferring said information in its order after conversion, signal word by signal word. Said number is the numeric value of the integer information at said working memory.

Finally, said transfer-a-10-header-message instructions cause controller, 39, to execute said evaluate-padding-bits-? instructions that cause controller, 39, to compare the information at said SPAM-Flag-working memory to said continue-? information that is "0".

Not resulting in a match means that the last signal word in which command information occurs contains at least one MOVE bit of padding and that said 10-header-word-length information is the length of every instance of a "10" header message. Accordingly, not resulting in a match causes controller, 39, to end execution of said transfer-a-10-header-message instructions.

On the other hand, resulting in a match means that controller, 39, has transferred all but the last signal word of command information, and said word must be evaluated to ascertain whether it contains MOVE bit information. Accordingly, resulting in a match causes controller, 39, to execute said assess-padding-bit instructions. Said instructions cause controller, 39, to compare said last word to said end-?-EOFS-WORD information. If no match results, said word is the last word of said message. Otherwise, one full signal word of padding bits follows said word and ends said message. Accordingly, not resulting in a match causes controller, 39, to transfer just said last signal word, but resulting in a match causes controller, 39, to transfer said last signal word then the signal word, in said binary information, that is immediately after said signal word. In so doing, controller, 39, transfers the complete binary information of the message of the instance of header information at said SPAM-header memory and completes said transfer-a-10-header-message instructions.

The case of the "10" message of FIG. 2J illustrates the operation of said transfer-a-10-header-message instructions. As with the "00" messages of FIG. 2H and FIG. 2K, signal words are eight-bit bytes, H equals two, and X equals six. Hence, H+X equals eight. Accordingly, controller, 39, is preprogrammed with 10-header-word-length information that is integer information of (8/8)−1. More precisely, said 10-header-word-length information is integer information of zero. And because H+X bits of binary information fill a whole number of signal words exactly, controller, 39, is preprogrammed with 10-header-end-condition information that is the binary value of zero.

Like FIG. 2K, FIG. 2J shows a message that contains command information that fills a whole number of signal words exactly. The command information of said message fills one byte, and said byte is the last byte of said command information. As FIG. 2J shows, said last byte contains MOVE bit information. Accordingly said last byte is not followed by one full byte of padding bits. The one byte of said message is the last byte of said command information and the last byte of said message.

Said transfer-a-10-header-message instructions cause the message of FIG. 2J, to be processed in the following fashion.

Executing said instructions causes controller, 39, to place information of said 10-header-word-length information at said particular working register memory and information of said 10-header-end-condition information at said SPAM-Flag-working register memory. (After said 10-header-end-condition information is placed at said SPAM-Flag-working memory, the information at said memory may be "0" or "00000000".)

Next said commence-transfer instructions cause controller, 39, to transfer zero (0) eight-bit bytes (which zero (0) is the numeric value of the integer information at said working memory) of binary information. (In other words, controller, 39, transfers no information.) In so doing, controller, 39, transfers all but the last byte of command information. The one byte of said message, which is said last byte, remains untransferred.

Then said evaluate-padding-bits-? instructions cause controller, 39, to determine that the zero information at said SPAM-Flag-working memory matches said continue-? information that is "0". Resulting in a match causes controller, 39, to execute said assess-padding-bit instructions. Said instructions cause controller, 39, to compare said last byte to said end-?-EOFS-WORD information. Because the one byte of the message of FIG. 2J contains MOVE bit information, no match results. Not resulting in a match means that said one byte is the last byte of said message. Automatically, not resulting in a match causes controller, 39, to transfer one byte of binary information which byte is said one byte. Then said instructions cause controller, 39, to complete said transfer-a-10-header-message instructions.

In this fashion, said transfer-a-10-header-message instructions cause controller, 39, to transfer the message of FIG. 2J to the addressed apparatus of said message.

In applicable fashions of said transfer-a-10-header-message instructions, controller, 39, transfers to SPAM-controller, 205C, the complete binary information of the message that contains the third combining synch command.

When controller, 39, completes said transfer-a-10-header-message instructions, automatically controller, 39, prepares all apparatus of decoder, 203, to receive a next SPAM message. Controller, 39, deactivates all output ports; determines that the information at said SPAM-header register memory does not match said cause-retention-of-exec information that is "01"; causes all apparatus of decoder, 203, to delete from memory all information of said binary information; then commences to wait for the binary information of a subsequent SPAM header.

At SPAM-controller, 205C, (and at the SPAM-controllers, 205C, at other URS microcomputers, 205), receiving the transferred binary information of said third message causes all apparatus automatically to process the information of said message in their preprogrammed fashions.

Automatically the EOFS valve of SPAM-controller, 205C, processes said information and transfers said information, signal word by signal word.

Receiving the header and execution segment of said third message causes SPAM-controller, 205C, to identify and execute the controlled function or functions that said message instructs URS microcomputers, 205, to perform. Receiving the first H converted bits of said transferred binary information from said valve causes SPAM-controller, 205C, to select and record said H bits at said SPAM-header-@205 register memory; determine that the information at said memory does not match said 11-header-invoking information; then process the next X received bits of said binary information as the execution segment of a SPAM command. Receiving said next X bits causes SPAM-controller, 205C, to select and record said X bits at said SPAM-exec-@205 register memory; compare the information at said memory with said controlled-function-invoking-@205 information; determine that said information at memory matches particular cease-overlay information that causes SPAM-controller, 205C, to execute particular preprogrammed cease-overlaying-at-205 instructions; and execute said instructions.

Said instructions cause SPAM-controller, 205C, to execute "GRAPHICS OFF" at said PC-MicroKey System then transmit a particular clear-and-continue instruction to the CPU of microcomputer, 205, the function of which instruction is described more fully below. In so doing, SPAM-controller, 205C, completes said cease-overlaying-at-205 instructions.

(Because said cease-overlaying-at-205 instructions are executed only by SPAM commands with "10" headers, comparing information at said SPAM-header-@205 memory with header-identification-@205 information is unnecessary.)

Having completed the controlled functions of said second message, automatically SPAM-controller, 205C, prepares to receive the next instance of SPAM message information. Automatically, SPAM-controller, 205C, determines that the information at said SPAM-header-@205 register memory does not match said cause-retention-of-exec-@205 information that is "01"; causes all apparatus of SPAM-controller, 205C, to delete from memory all information of said transferred binary information; and commences waiting to receive the binary information of a subsequent SPAM header.

In the foregoing fashion and as described in "One Combined Medium" above, said transferred information of the third combining synch command causes microcomputer, 205, to cease combining the programming of FIG. 1A and of FIG. 1B and commence transmitting to monitor, 202M, only the composite video programming received from divider, 4, (which causes monitor, 202M, to commence displaying only said video programming) and to continue processing in a predetermined fashion (which fashion may be determined by the aforementioned program instruction set).

Operating S. P. Systems

Example #1

A Fourth Message

The "One Combined Medium" example does not include an instance of a SPAM message with a "11" header, but decoder, 203, is preprogrammed to process such messages.

A fourth message of example #1 illustrates the processing of a "11" header message.

Immediately after transmitting the third message of example #1, the program originating studio of the "Wall Street Week" program embeds and transmits a fourth message. Said message consists of an "11" header followed immediately by an information segment containing a second program instruction set. More precisely, the first two bits of the first signal word of said message are said "11" header, and the remaining bits of said signal word are padding bits. The first signal word of said information segment is the signal word immediately after said first word. And immediately after the last signal word of said segment, an end of file signal is transmitted that ends said message.

Subsequently, the embedded information of said fourth message is transferred from divider, 4, to decoder, 203.

Receiving the embedded information of said message causes decoder, 203, automatically to detect, check, correct as necessary, and convert said information into binary information of said fourth message; to process and transfer said binary information at the EOFS valve of controller, 39; then to process the header in said binary information.

Receiving said header causes controller, 39, to determine that said message is addressed to URS microcomputers, 205, and to transfer said message accordingly. Receiving the first H converted bits of said binary information from said valve causes controller, 39, to select and record said H bits (said "11" header) at said SPAM-header register memory then determine that the information at said SPAM-header memory matches said 11-header-invoking information that is "11". Said match causes controller, 39, to execute particular preprogrammed process-11-header-message instructions.

Said instructions cause controller, 39, to execute controlled functions as if the information at said SPAM-last-01-header-exec register memory were the execution segment information of said "11" header message. Automatically, said instructions cause controller, 39, to compare the information at said SPAM-last-01-header-exec memory (which information is the execution segment of the first combining synch command) with said controlled-function-invoking information. Automatically, controller, 39, determines that said information at memory matches particular preprogrammed this-message-addressed-to-205 information that invokes the aforementioned transfer-to-205 instructions. Automatically controller, 39, executes said instructions; activates the output port that outputs to SPAM-controller, 205C; and determines that said information at SPAM-header memory matches particular "11" information. Said match causes controller, 39, automatically to execute said transfer-a-01-or-a-11-header-message instructions.

An "11" header distinguishes a message that contains lowest priority information. Just like an "01" header message, each instance of a message with a "11" header ends with an end of file signal. Accordingly, said instructions cause controller, 39, to transfer said fourth message in precisely the same fashion that applied to the transfer of the first message of example #1. Automatically controller, 39, commences transferring the binary information of said fourth message, starting with said first H bits, and continues so transferring, as said binary information is outputted by said EOFS valve, until said valve detects the end of file signal of said message and causes EOFS-signal-detected information to be inputted to the CPU of controller, 39.

In due course and in precisely the fashion of the first message of example #1, said valve detects the eleven EOFS WORDs of said end of file signal and causes transmission of said EOFS-signal-detected information to controller, 39, which causes controller, 39, to transmit said transmit-and-wait instruction to said valve. Said instruction causes said valve to perform all the functions caused by the corresponding instruction of said first message, including transferring one complete end of file signal (which information is automatically transferred to SPAM-controller, 205C). In this fashion, controller, 39, transfers the complete information of said fourth message to the addressed apparatus of said message—the SPAM-controller, 205C.

Having transferred the binary information of said fourth message, controller, 39, prepares all apparatus of decoder, 203, to receive the next instance of SPAM message information in precisely the fashion of said first message with one exception. Unlike said first message which had an "01" header and contained a command with an execution segment, said fourth message has an "11" header and contains no execution segment information. Accordingly, receiving said fourth message does not cause controller, 39, to record information at said SPAM-last-01-header-exec memory. When controller, 39, compares the information at said SPAM-header register memory to said cause-retention-of-exec information that is "01", no match results. The information that was at said memory when said message was received—specifically, the execution segment of the first message—remains at said memory.

(If no information were to exist at said SPAM-last-01-header-exec memory when information at said memory is compared with said controlled-function-invoking information, controller, 39, would detect the absence of said information in a predetermined fashion and, in the fashion described above in the description of the first message, would cause all apparatus of decoder, 203, to discard all message information until an end of file signal were received and discarded then would process the first H converted bits of the next received binary information as a subsequent SPAM header.)

At SPAM-controller, 205C, (and at SPAM-controllers, 205C, of URS microcomputers, 205) receiving the transferred binary information of said fourth message causes all apparatus automatically to process the information of said message in the preprogrammed fashions of said apparatus.

Automatically the EOFS valve of SPAM-controller, 205C, processes and transfers said information until an end of file signal is detected.

Receiving the header of said fourth message causes SPAM-controller, 205C, to determine the controlled function or functions that said message instructs URS microcomputers, 205, to perform and to execute the instructions of said functions. Receiving the first H bits of said transferred binary information from said valve causes SPAM-controller, 205C, to select and record said first H bits (said "11" header) at said SPAM-header-@205 register memory then determine that said information at SPAM-header-@205 memory matches said 11-header-invoking-@205 information that is "11". Said match causes SPAM-controller, 205C, to execute particular preprogrammed process-11-header-message-@205 instructions.

Said instructions cause SPAM-controller, 205C, to execute controlled functions as if the information at said SPAM-last-01-header-exec-@205 register memory (which information is the execution segment of the first combining synch command) were the execution segment information of said "11" header message. Automatically, said instructions cause SPAM-controller, 205C, to compare the information at said memory with said controlled-function-invoking information-@205. A match results with said execute-load-run-and-code information, causing SPAM-controller, 205C, automatically to execute said load-run-and-code instructions. As with said first message, said instructions control the loading, at the main RAM of microcomputer, 205, and running of the information segment information that follows said H bits, which information is said second program instruction set.

To locate, in said transferred binary information, the first bit of said information, said instructions cause SPAM-controller, 205C, to compare the information at said SPAM-header-@205 memory with said header-identification-@205 information and determine that said information at memory matches particular "11" information. In other words, to locate said bit, SPAM-controller, 205C, must process only the information associated with an "11" header. Accordingly, said match causes SPAM-controller, 205C, automatically to execute particular preprogrammed prepare-to-load-11-header-message instructions.

At any given time, each instance of header information is of one constant binary length—H bits—that either does or does not fill a whole number of signal words exactly. If H bits do not, the last signal word of any given instance of a "11" header message header is not completely filled with header information, and padding bits that are MOVE bits fill out said signal word. But if H bits do fill a whole number of signal words exactly, the last signal word in which header information may contain no MOVE bit information, in which case one full word of padding bits follows said signal word and precedes the first information segment signal word of said message.

To locate said first bit, said prepare-to-load-11-header-message instructions include particular preprogrammed 11-header-word-length information and particular preprogrammed 11-header-end-condition information. At those times when H bits of binary information fill a whole number of signal words exactly, said 11-header-word-length information is the largest integer that is less than said whole number, and said end-condition information is the binary value of zero. At those times when H bits do not fill a whole number of signal words exactly, said 11-header-word-length information is the smallest integer larger than the number of signal words that said H bits do fill, and said header-end-condition information is the binary value of one.

When executed, said prepare-to-load-11-header-message instructions cause SPAM-controller, 205C, to place information of said 11-header-word-length at particular first-working-@205 register memory then compare said 11-header-end-condition information to particular preprogrammed information that is "0".

Not resulting in a match means that the last signal word in which header information occurs contains at least one MOVE bit of padding and that said 11-header-word-length information is the length of every instance of a "11" header information. Accordingly, not resulting in a match causes SPAM-controller, 205C, to execute of particular preprogrammed commence-loading-11-header-message instructions.

On the other hand, resulting in a match means that the last signal word of header information must be evaluated to ascertain whether it contains MOVE bit information. Accordingly, resulting in a match causes SPAM-controller, 205C, starting with the first signal word of said transferred binary information, to skip a number of signal words of said information, which number is the number of the integer information at said first-working-@205 memory. In so doing, SPAM-controller, 205C, skips every signal word of header information but said last word. Then, automatically, said instructions cause SPAM-controller, 205C, to compare said last word to said particular preprogrammed EOFS-WORD information. If no match results, said word is the last word of said message. Otherwise, one full signal word of padding bits follows said word and ends said message. Accordingly, not resulting in a match causes SPAM-controller, 205C, to add binary information of one to said integer information at said first-working-@205 memory, but resulting in a match causes SPAM-controller, 205C, to add binary information of two to said integer information at said first-working-@205 memory. Then, automatically, SPAM-controller, 205C, executes said commence-loading-11-header-message instructions.

When executed, said commence-loading-11-header-message instructions cause SPAM-controller, 205C, starting with the first signal word of said transferred binary information, to skip a number of signal words, which number is the number of the integer information at said first-working-@205 memory. In so doing, SPAM-controller, 205C, skips every signal word of header information. Then said instructions instruct SPAM-controller, 205C, to commence loading information at the main RAM of microcomputer, 205, starting with the first signal word after the last skipped signal word, and cause SPAM-controller, 205C, to commence executing said load-run-and-code instructions at a particular instruction.

Starting at said instruction, said load-run-and-code instructions cause SPAM-controller, 205C, to instruct microcomputer, 205, to commence receiving information from SPAM-controller, 205C, and loading said information at particular main RAM, in a fashion well known in the art.

Thereafter, said instructions cause SPAM-controller, 205C, to process said fourth message in precisely the same fashion that applied to the first message of example #1.

Said load-run-and-code instructions cause SPAM-controller, 205C, to commence transferring information to microcomputer, 205, beginning with said first signal word, and transfer the remaining signal words of said transferred binary information, signal word by signal word, until said valve detects the end of file signal of said message and causes EOFS-signal-detected information to be inputted to the CPU of SPAM-controller, 205C. As microcomputer, 205, receives said information, it loads said information at particular main RAM.

In due course, said valve transfers the last signal word of the information segment of said fourth message, which is the last signal word of said program instruction set, which causes SPAM-controller, 205C, to transfer said word to microcomputer, 205, and microcomputer, 205, to load said word at said RAM.

In this fashion, receiving the information of said fourth message causes the apparatus of the subscriber station of FIG. 3 to load said program instruction set at the main RAM of microcomputer, 205, (and other stations to load said set at other main RAMs).

Then, in precisely the fashion of the first message of example #1, said valve detects the eleven EOFS WORDs of said end of file signal and causes transmission of said EOFS-signal-detected information to SPAM-controller, 205C which causes SPAM-controller, 205C, to cause microcomputer, 205, to cease loading information at said RAM and execute the information so loaded as the machine executable code of one job. Continuing in said fashion, SPAM-controller, 205C, transmits said discard-and-wait instruction to said valve which causes said valve to set the information at said EOFS WORD Counter to "00000000" and to process no next inputted information until a control instruction is received from SPAM-controller, 205C.

Then the code portion of said load-run-and-code instructions cause SPAM-controller, 205C, to operate in a fashion that differs from the fashion of said first message. The instructions of said portion cause SPAM-controller, 205C, to compare the information at said SPAM-header memory to said load-run-and-code information that is "01". No match results because the header of said fourth message is "11" (which means that said message contains no meter-monitor information). Not resulting in a match causes SPAM-controller, 205C, automatically to skip the remaining instructions of said code portion and complete said load-run-and-code instructions without placing any program unit field information at said SPAM-first-precondition register memory. Accordingly, the program unit information of said "Wall Street Week" program that was caused to be placed at said SPAM-first-precondition memory by the first combining synch command remains at said memory.

Having processed the binary information of said fourth message, SPAM-controller, 205C, prepares all apparatus of decoder, 203, to receive the next instance of SPAM message information in precisely the fashion of said first message with one exception. Receiving said fourth message does not cause SPAM-controller, 205C, to record information at said SPAM-last-01-header-exec memory-@205. When SPAM-controller, 205C, compares the information at said SPAM-header-@205 memory to said cause-retention-of-exec-@205 information that is "01", no match results. The information that was at said memory when said message was received—specifically, the execution segment of the first message—remains at said memory.

In this fashion, the subscriber station of FIG. 3 processes a message with an "11" header.

Operating Signal Processor Systems

Example #2

In example #2, the first and third messages of the "Wall Street Week" combining are transmitted just as in example #1, but the second message is partially encrypted.

The second message conveys the second combining synch command. In example #2, before said message is embedded at the program originating studio and transmitted, the execution segment of said command and all of the meter-monitor segment except for the length-token are encrypted, using standard encryption techniques, well known in the art, that encrypt binary information without altering the number of bits in said information. Partially encrypting the second message in this fashion leaves the cadence information of said message unencrypted. In other words, the "00" header, the length-token, and any padding bits added at the end of said message remain unencrypted. Said message is only partially encrypted in order to enable subscriber stations that lack capacity to decrypt said message to process the cadence information of said message accurately.

In example #2, the encryption of said execution segment is done in such a fashion that, after encryption, said segment is identical to a particular execution segment that addresses URS signal processors, 200, and instructs said processors, 200, to use a particular decryption key J and decrypt the message in which said segment occurs.

Because said message is encrypted, its meter-monitor segment contains a sixth field, a meter instruction field. Accordingly, the length of the second message, the number of bits in its meter-monitor segment and the numeric value of MMS-L is greater in example #2 than in example #1.

As described above in "One Combined Medium," before any messages of the "Wall Street Week" programming are transmitted, control invoking instructions are embedded at said program originating studio and transmitted to all subscriber stations. Among said instructions are particular ones that command URS microcomputers, 205, to set their PC-MicroKey Model 1300 Systems to the "Graphics Off" mode. Thus, at the outset of example #2, all PC-MicroKey 1300s are in the "Graphics Off" mode, and no microcomputer, 205, is transmitting combined information of video RAM and received composite video to its associated monitor, 202M. As will be seen, this fact has particular relevance in example #2.

In example #2, the first message of the "Wall Street Week" program is transmitted precisely as in the example #1 and causes precisely the same activity at subscriber stations. At each station, a microcomputer, 205, enters appropriate FIG. 1A image information at particular video RAM.

When decoder, 203, receives the embedded information of the second message of example #2, decoder, 203, processes and transfers said information in the same fashion that applied to the second message of example #1 with three exceptions.

First, controller, 39, determines that the second message of example #2 is addressed to URS signal processors, 200, rather than URS microcomputers, 205, and transfers the binary information of said message accordingly. When controller, 39, compares the information at SPAM-exec memory, which is the encrypted execution segment information of the second message of example #2, with controlled-function-invoking information, said information at memory does not match the this-message-addressed-to-205 information matched in example #1. Rather said information at memory matches particular preprogrammed this-message-addressed-to-200 information that invokes preprogrammed transfer-to-200 instructions. Controller, 39, executes said instructions, and rather than activating the output port that outputs to SPAM-controller, 205C, said instructions cause controller, 39, to activate the output port that outputs to buffer/comparator, 8, of signal processor, 200.

Then, subsequently, when said process-length-token instructions cause controller, 39, to compare the information at SPAM-length-info memory, which is the length-token information of said second message of example #2, to token-comparison information, said information at memory does not match the X-token information matched by the length-token of the second message of example #1. Rather, said information at memory matches particular preprogrammed Y-token information associated with particular preprogrammed y-bits information whose numeric value is the MMS-L of the second message of example #2. Said match causes controller, 39, automatically to select said y-bits information and place said information at said SPAM-length-info memory. Thus controller, 39, processes a value of MMS-L that is different from the value processed in example #1.

Finally, because the second message of example #2 is longer than the second message of example #1 and the MMS-L of example #2 is greater than the MMS-L of example #1, when said transfer-a-00-header-message instructions control the transfer of the second message of example #2 to signal processor, 200, said instructions transfer a longer message.

In all other respects, controller, 39 processes and transfers the second message of example #2 just as it processed and transferred the second message of example #1. And when the transfer of the second message of example #2 is complete, controller, 39, automatically deactivates all output ports, deletes all received information of said message from memory, and commences waiting for the binary information of a subsequent SPAM header.

Receiving the binary signal information of said second message causes buffer/comparator, 8, automatically to execute a decryption sequence at signal processor, 200, that is fully automatic and for which all apparatus are preprogrammed.

Receiving said information causes buffer/comparator, 8, first, to place said information at a particular received signal location at buffer/comparator, 8, then to compare a particular portion the first X bits immediately after the first H bits of said binary information (which X bits are the executions segment of said message) to particular preprogrammed comparison information in its automatic comparing fashion. (Buffer/comparator, 8, is preprogrammed with information that identifies said portion.) A match results with particular comparison information that is the bit image of particular SPAM execution segment information that instructs URS signal processors, 200, to decrypt. Said match causes buffer/comparator, 8, to transfer to controller, 20, particular decrypt-this-message information that includes the memory position of the first bit location of said particular received signal location and information of the header and execution segment in said binary signal information. Receiving said information causes controller, 20, to compare the information of said execution segment to particular preprogrammed controlled-function-invoking-@200 information and determine a match with particular decrypt-with-key-J information that instructs controller, 20, to decrypt the received binary signal information with decryption key J.

(At subscriber stations whose URS signal processors, 200, are not preprogrammed with information of said key J, the information of said execution segment fails to match any controlled-function-invoking-@200 information. Said failures to match cause the controllers, 20, of said stations automatically to discard all information transferred by the buffer/comparators, 8; to cause said buffer/comparators, 8, to discard all received information of said second message; and to cause said controllers, 20, and said buffer/comparators, 8, to commence processing in the conventional fashion.)

(It is to facilitate SPAM processing at said stations that are not preprogrammed with necessary decryption key information that the cadence information of an otherwise encrypted SPAM message must remain unencrypted. Were either the header or length-token or any padding bits of said second message encrypted, the decoders, 203, and signal processors, 200, of said stations could process the information of the execution segment correctly but would be unable to locate the last bit of said second message and the header of the following message. Effective SPAM processing would cease and not resume until the apparatus at said stations detected an unencrypted end of file signal. Until that time, converted binary information could continue to invoke processing at said stations but said processing would be haphazard and almost certainly undesirable.)

Because the subscriber station of FIG. 3 is preprogrammed with all information needed to decrypt said second message, the aforementioned match with said decrypt-with-key-J information causes controller, 20, to execute particular preprogrammed decrypt-with-J instructions. Among said preprogrammed instructions is key information of J, and said instructions cause controller, 20, automatically to select and transfer said key information to decryptor, 10.

Decryptor, 10, receives said key information and automatically commences using it as its key for decryption.

Then said decrypt-with-J instructions cause controller, 20, to activate the output capacity of buffer/comparator, 8, that outputs to decryptor, 10; to compare said information of the header transferred from buffer/comparator, 8, to particular preprogrammed header-identification-@200 information; and to determine that said information of the header matches particular "00" header information. Said match causes controller, 20, automatically to invoke particular preprogrammed decrypt-a-00-header-message instructions.

Controller, 20, is preprogrammed with information of H, X, L, and H+X; with process-length-token, determine-command-information-word-length, evaluate-end-condition, calculate-number-of-words-to-transfer, evaluate-padding-bits-? instructions; and with token-comparison, W-token, X-token, Y-token, w-bits, x-bits, and y-bits information. Using preprogrammed information and instructions as required, said decrypt-a-00-header-message instructions transfer the received binary information of said second message from buffer/comparator, 8, to decryptor, 10, in the same fashion that the aforementioned transfer-a-00-header-message instructions controlled the transfer of the information of said message from controller, 39, to buffer/comparator, 8.

Under control of said decrypt-a-00-header-message instructions, said process-length-token instructions cause controller, 20, to select the L bits of said binary signal information that begin at the first bit location that is H+X bit locations following the memory position of the first bit location of said particular received signal location at buffer/comparator, 8. Said L bits are the length token of said second message. Automatically controller, 20, compares the information of said L bits to token-comparison information and determines a match with preprogrammed Y-token information. Said match causes controller, 20, automatically to select y-bits information and process said information as the numeric value of MMS-L. Next said determine-command-information-word-length instructions cause controller, 20, to determine the number of signal words in the command information of said second message by adding H+X+L to said y-bits information of MMS-L and dividing the resulting sum by the number of bits in one signal word. Then said evaluate-end-condition instructions cause controller, 20, to place a "0" at particular SPAM-Flag-@20 register memory if said command information fills a whole number of signal words exactly and "1" at said memory if it does not. And said calculate-number-of-words-to-transfer instructions cause controller, 20, to determine a particular number of signal words to transfer and place information of said number at particular working-@20 register memory.

Then said decrypt-a-00-header-message instructions cause controller, 20, to transmit to controller, 12, a particular transfer-decrypted-message instruction and particular decryption mark information of key J that identifies J as the decryption key.

Receiving said instruction and information causes controller, 12, to execute particular preprogrammed transfer-and-meter instructions then record said mark of key J at particular decryption-mark-@12 register memory.

Next said decrypt-a-00-header-message instructions cause controller, 20, to cause buffer/comparator, 8, to transfer to decryptor, 10, a quantity of signal words of said binary information of the second message which quantity is the number at said working-@20 register memory.

Buffer/comparator, 8, responds by transferring to decryptor, 10, binary information that begins at the first bit at said particular received signal location and transfers said information, signal word by signal word, until it has transferred said quantity of signal words.

Decryptor, 10, commences receiving said information, decrypting it using said key J information and transferring it to controller, 12, as quickly as controller, 12, accepts it. The process of decryption proceeds in a particular fashion. Said decrypt-a-00-header-message instructions cause controller, 20, to cause decryptor, 10, to transfer the first H bits without decrypting or altering said bits in any fashion, to decrypt and transfer the next X bits, to transfer the next L bits without decrypting or altering said bits, to decrypt and transfer the next MMS-L bits, and finally, to transfer any bits remaining after the last of said MMS-L bits without decrypting or altering said bits. In this fashion, the cadence information in said message, which is not encrypted, is transferred by decryptor, 10, to controller, 12, without alteration.

Under control of said transfer-and-meter instructions, controller, 12, commences receiving decrypted information of the second message from decryptor, 10. Having been decrypted, said information is identical to the binary information of the second message of example #1 (except that the meter-monitor information contains the aforementioned meter instruction information that is not in example #1 and the length token information of the meter-monitor format field reflects the presence of said instruction information).

Automatically controller, 12, processes said information of the second message of example #2 as a SPAM command. Receiving the header and execution segment causes controller, 12, to determine that said message is addressed to URS microcomputers, 205, and to transfer said message accordingly. Automatically, controller, 12, selects the first H converted bits and records said bits at particular SPAM-header-@12 register memory then selects the next X bits and records said bits at particular SPAM-exec-@12 register memory. Then, automatically, by comparing the information at said SPAM-exec memory with preprogrammed controlled-function-invoking-@12 information, controller, 12, determines that said information at memory matches preprogrammed transfer-this-message-to-205-@12 information. Automatically, controller, 12, executes preprogrammed transfer-to-205-@12 instructions; activates the output port that outputs to SPAM-controller, 205C; then commences transferring information of said decrypted information of the second message under control of said transfer-and-meter instructions commencing with the first of said H bits and transferring information, signal word by signal word, in the order in which it is received from decryptor, 10. In addition, controller, 12, is preprogrammed with all instructions and information necessary for processing the length-token and determining the length of the meter-monitor segment of said second message, does so, and records at particular SPAM-meter register memory the first L plus MMS-L bits of said decrypted information immediately after the last of said X bits which is the information of the meter-monitor segment of said message.

When buffer/comparator, 8, completes transferring to decryptor, 10, the quantity of signal words that is the number at said working-@20 register memory, said decrypt-a-00-header-message instructions cause controller, 20, to execute said evaluate-padding-bits-? instructions, determine which signal word is the last word of the second message of example #2, and ensure that said word is transferred to decryptor, 10. Following the transfer of said word, controller, 20, causes decryptor, 10, to transmit particular decryption-complete information to controller, 20, when decryptor, 10, completes the transfer to controller, 12, of said word following its decryption.

Receiving said word at controller, 12, causes controller, 12, to transfer said word to SPAM-controller, 205C, and in so doing, complete the transfer of the decrypted information of said second message.

At microcomputer, 205, (and at the URS microcomputers, 205, at other stations where the second message of example #2 is decrypted) in the fashion described in example #1, said information, which is the unencrypted binary information of the second combining synch command, executes "GRAPHICS ON" causing microcomputer, 205, to combine the programming of FIG. 1A and of FIG. 1B and transmit said combined programming to monitor, 202M, where FIG. 1C is displayed.

(Meanwhile, no second combining synch command reaches the URS microcomputers, 205, at those subscriber stations whose URS signal processors, 200, are not preprogrammed with information of decryption key J because all received information of the second message of example #2 has been discarded. No combining occurs at said microcomputers, 205. And at the time when FIG. 1C is displayed at subscriber stations preprogrammed with said key J, the monitors, 202M, of said subscriber stations display FIG. 1B.)

Then receiving said decryption-complete information from decryptor, 10, causes controller, 20, to cause buffer/comparator, 8, to discard any information of said second message that may remain at buffer/comparator, 8, and commence processing in the conventional fashion; to cause decryptor, 10, to discard said key information of decryption key J and any information of said second message that may remain at decryptor, 10; to transmit to controller, 12, a preprogrammed complete-transfer-phase instruction; and, itself, to commence processing in the conventional fashion.

Receiving said complete-transfer-phase instruction causes controller, 12, to cease transferring information, under control of said transfer-and-meter instructions, to deactivate all output ports, and to commence executing the meter instructions of said transfer-and-meter instructions. Said meter instructions cause controller, 12, to compare the information at said SPAM-header-@12 memory with particular collect-meter-info information and determine that said H bits match particular "00" information. (In other words, said SPAM command information contains meter-monitor information.) Said match causes controller, 12, automatically to transfer to buffer/comparator, 14, particular header identification information that identifies controller, 12, as the source of said transfer the information recorded at said SPAM-meter memory then the information recorded at said decryption-mark-@12 register memory, which information is the decryption mark of key J. (Hereinafter, said meter information generated by the second combining synch command in example #2 is called the "2nd meter information (#2).") Following said transferring, controller, 12, automatically deletes from register memory all information of said second message and commences processing in the conventional fashion.

Receiving the 2nd meter information (#2) causes buffer/comparator, 14, automatically to execute a meter sequence that is fully automatic and for which all apparatus are preprogrammed and have capacity to perform.

Receiving said information causes buffer/comparator, 14, to compare a particular portion of the meter-monitor format field of said 2nd meter information (#2) to particular distinguishing comparison information that identifies meter-monitor format fields that denote the presence of meter instruction fields. A match results which causes buffer/comparator, 14, to select information of bits at particular predetermined locations (which bits contain the information of the meter instruction field of said 2nd meter information (#2)) and compare said selected information to preprogrammed metering-instruction-comparison information and to determine that said field matches particular increment-by-one information that instructs buffer/comparator, 14, to add one incrementally to each meter record maintained at buffer/comparator, 14, that is associated with decryption key information that matches the decryption mark of the instance of meter information being processed. Accordingly, buffer/comparator, 14, compares the decryption mark of said 2nd meter information (#2) with preprogrammed decryption-key-comparison information. Said comparing results in more than one match, and buffer/comparator, 14, increments by one the meter record associated with each particular decryption-key-comparison datum that matches the decryption mark of said 2nd meter information (#2). Because the information of said meter instruction field instructs signal processor, 200, only to perform said incrementing, upon completing the last step of incrementing or comparing, automatically buffer/comparator, 14, discards all information of said 2nd meter information (#2) except the incremented record information and commences processing in the conventional fashion.

Thus, not only does the second message of example #2 cause the combining of FIG. 1A and FIG. 1B and the display of FIG. 1C only at selected subscriber stations that are preprogrammed with decryption key J, it also causes the retaining of meter information associated with its own decryption at said selected stations.

Subsequently, decoder, 203, receives the third message of the "Wall Street Week" program which conveys the third combining synch command.

In example #2, all signal processing apparatus process the third combining synch command precisely as in the first example. Said command reaches all URS microcomputers, 205, and causes each to execute the aforementioned "GRAPHICS OFF" command. But only at those selected ones of said URS microcomputers, 205, that are preprogrammed with decryption key J does the third combining synch command actually cause combining to cease. At all other URS microcomputers, 205, executing "GRAPHICS OFF" has no effect because each of said other URS microcomputers, 205, is already in "Graphics Off" mode when said "GRAPHICS OFF" is executed. Because the aforementioned particular ones among said control invoking instructions that preceded the first message of the "Wall Street Week" program caused all URS microcomputers, 205, to set their PC-MicroKey 1300s to the "Graphics Off" mode and because no information of the second combining synch command reached said other microcomputers, 205, and executed "GRAPHICS ON", the PC-MicroKey 1300 of each of said other URS microcomputers, 205, is in "Graphics Off" mode when the third message of example #2 is transmitted.

Thus in example #2, not only does the second combining synch command cause the combining and the display of FIG. 1C only at selected subscriber stations and the retaining of meter information at (and only at) said stations, it also causes selective processing—for example, the selecting of information of decryption key J at selected stations—that enables the third combining synch command to have effect only at selected stations without any selective processing of said third command. Placing particular so-called "soft switches," one of which exists at each subscriber station, all into one given original position, "off" or "on", then transmitting a command that is processed selectively at selected stations and places said switches at said stations into the opposite position, "on" of "off", makes it possible to transmit a subsequent command that returns said switches at said selected stations (and only said switches) to said original position without any additional selective processing.

Significant advantages of simplicity and speed are achieved by devising signal processing apparatus and methods that minimize the need for selective processing. With regard to said third combining synch command, for example, no step of decrypting is required to affect only those stations that are preprogrammed with decryption key J. Accordingly, no possibility exists that an error in decrypting may occur at one or more of said stations, causing the combining of video RAM information and received video information, at said one or more, not to cease at the proper time and to continue beyond said time (until such time as some subsequent command may execute "GRAPHICS OFF" or clear information from said video RAM at said stations). Because no time is required for decrypting, no possibility exists that some station may take longer (or shorter) than proper to perform decrypting causing the image of FIG. 1A to be displayed at some monitor, 202M, longer (or shorter) than proper. Perhaps most important, because no time is required for selective processing of said third command, the time interval that separates the time of embedding said third command at said remote station that originates the "Wall Street Week" program and the time of ceasing caused by said command at URS microcomputers, 205, can be the shortest possible interval. Making it possible for said time interval to be the shortest possible interval minimizes the chance that an error may occur in the timing of the embedding of said third command at said remote station causing all URS microcomputers, 205, to cease combining at a time that is other than the proper time.

The Preferred Configuration of Controller, 39, and SPAM-Controller, 205C.

Heretofore, this specification has treated the controller of decoder, 203, (which is controller, 39) and the SPAM input controller of microcomputer, 205, (which is SPAM-controller, 205C) as separate controllers. This treatment has served to show how SPAM messages are transferred from one controller to another, at any given subscriber station.

But, in the preferred embodiment, the controller of the decoder that detects the SPAM signals of a combined medium transmission, at any given subscriber station, and the controller that executes the information of said signals at the microcomputer that combines the local and broadcast programming, at said station, are one and the same. More precisely, controller, 39, of decoder, 203, and SPAM-controller, 205C, are one and the same (and are called, hereinafter, "controller, 39"). Thus the preferred embodiment of controller, 39, is configured and preprogrammed not only to control the detecting, correcting, converting, and executing of controlled functions at decoder, 203, but also to input to and execute at microcomputer, 205, the information of any given detected SPAM message that is addressed to URS microcomputers, 205.

Figure 3A:
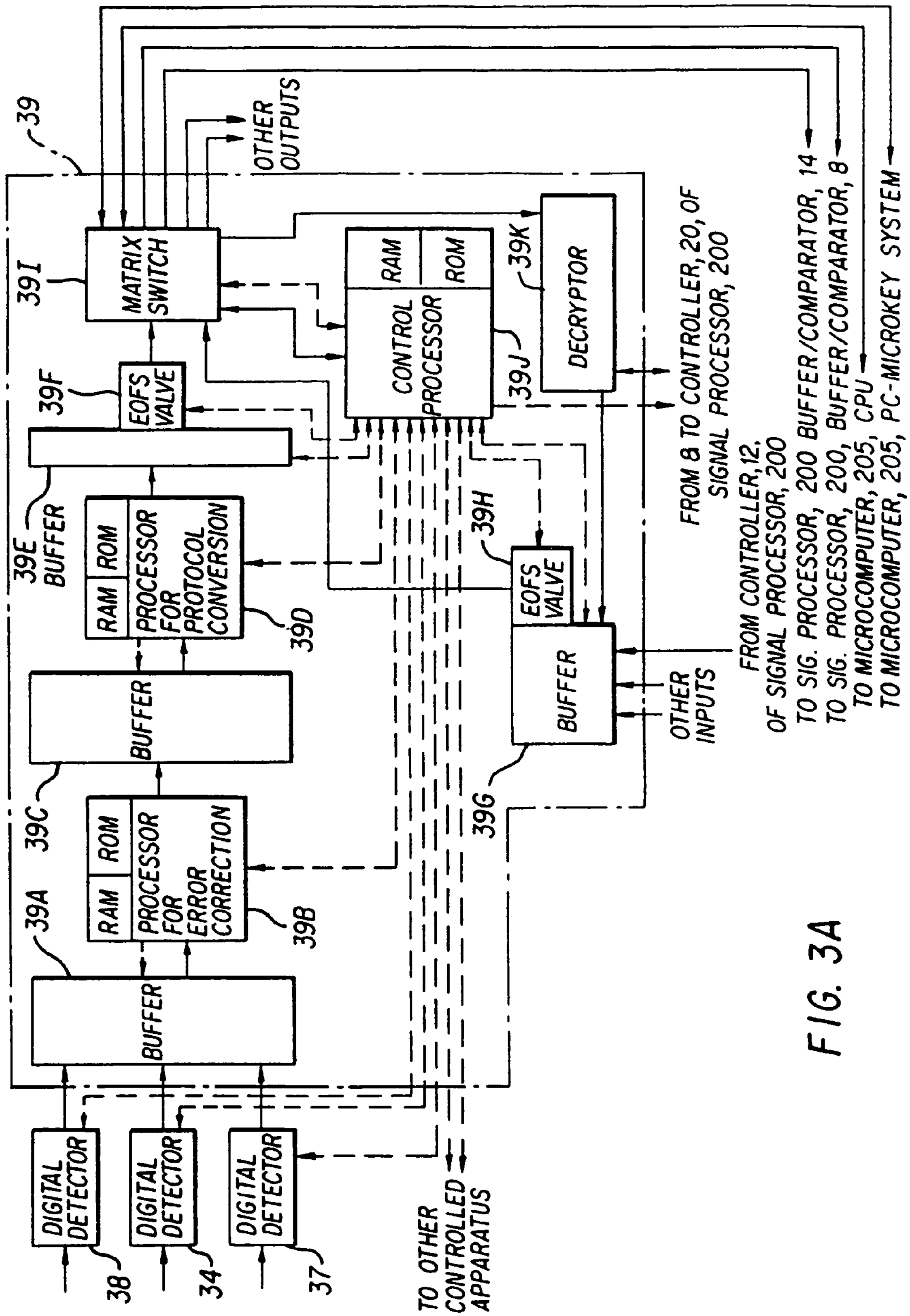
FIG. 3A is a block diagram of the preferred embodiment the controller apparatus of a SPAM decoder.

FIG. 3A shows one such preferred controller, 39.

One aspect of the preferred embodiment of controller, 39, is a series of buffers and processors at which forward error correction, protocol conversion, and the invoking of controlled functions take place in series. Buffer, 39A, and processor, 39B, are the first buffer and processor of the series and perform the forward error correcting functions of controller, 39. Buffer, 39C, and processor, 39D, are the second buffer and processor and perform protocol conversion functions. Buffer, 39E, and control processor, 39J, are the third buffer and processor. All controlled functions invoked at controller, 39, by received SPAM signals are invoked at control processor, 39J.

Performing forward error correction and protocol conversion and invoking the controlled functions at a series of processors, in this fashion, rather than sequentially at one processor has significant advantages as regards speed. Inputting the information of each SPAM signal word to three processors does take longer than inputting said information to just one processor. But this is more than offset by the fact that having three processors rather than just one enables controller, 39, to process the information of three signal words simultaneously. Control processor, 39J, can invoke and process the controlled function of a first signal word while processor, 39D, converts the information of a second signal word and processor, 39B, corrects the information of a third signal word.

A second aspect of the preferred embodiment of controller, 39, is a matrix switch, 39I, that operates under control of control processor, 39J, and can transfer information of received SPAM signals from buffer, 39E, directly to addressed apparatus. Transferring said information in this fashion rather than through control processor, 39J, has the advantage of freeing control processor, 39J, to perform other functions while said information is transferred.

As FIG. 3A shows, each processor, 39B, 39D, and 39J, has associated RAM and ROM and, hence, constitutes a programmable controller in its own right. Each processor, 39B, 39D, and 39J, controls its associated buffer, 39A, 39C, and 39E respectively. Each buffer, 39A, 39C, and 39E, is a conventional buffer that receives, buffers, and transfers binary information in fashions well known in the art. Each buffer, 39A and 39C, transfers its received and buffered information to its associated processor, 39B and 39D respectively, for processing. Buffer, 39E, transfers its received and buffered information, via EOFS Valve, 39F, to matrix switch, 39I.

The preferred embodiment of controller, 39, also has a buffer, 39G, that is a conventional buffer with means for receiving information from other inputs external to decoder, 203. Among said inputs is, in particular, an input from controller, 12, of signal processor, 200 (which input performs the functions of the input from controller, 12, to SPAM-controller, 205C, shown in FIG. 3). Buffer, 39G, outputs its received and buffered information, via EOFS Valve, 39H, to matrix switch, 39I. Buffer, 39G, is configured, in a fashion well known in the art, with capacity to identify to control processor, 39J, which input is the source of any given instance of information received and buffered at buffer, 39G, and capacity to output selectively, under control of control processor, 39J, any given instance of received information.

EOFS Valves, 39F and 39H, are EOFS valves of the type described above and transfer the buffered information of buffers, 39E and 39G respectively, to matrix switch, 39I. Said valves operate under control of control processor, 39J, and monitor all information, so transferred, continuously for end of file signals in the fashion described above.

Matrix switch, 39I, is a conventional digital matrix switch, well known in the art of telephone communication switching, that is configured for the small number of inputs and outputs required at controller, 39. Matrix switch, 39I, operates under control of control processor, 39J, and has capacity to receive SPAM signal information from a multiplicity of inputs, including EOFS Valves, 39E and 39F, and from control processor, 39J, and to transfer said information to a multiplicity of outputs, including control processor, 39J; the CPU of microcomputer, 205; buffer/comparator, 8, of signal processor, 200; buffer/comparator, 14, of signal processor, 200; and other outputs. Among such other outputs is one or more (hereinafter called, "null outputs") with capacity for accepting binary information and merely recording said information at particular memory associated with matrix switch, 39I, thereby overwriting and obliterating information previously recorded at said memory. The purpose of such a null output is to provide means whereby said switch can automatically cause information of any selected SPAM message to be discarded rather than transferred to addressed apparatus. (Other examples of other outputs are cited below.) Matrix switch, 39I, also has capacity to receive control information from control processor, 39J, and transfer said information to the CPU and/or the PC-MicroKey 1300 system of microcomputer, 205, and to receive control information from the CPU and/or the PC-MicroKey 1300 system of microcomputer, 205, and transfer said information to control processor, 39J. Matrix switch, 39I, transfers information in such a way that information inputted at any given input is transferred to a selected one or ones of said outputs without modification, and a multiplicity of information transfers can take place simultaneously.

Control processor, 39J, has capacity for computing information and processing all control information necessary for controlling all apparatus of decoder, 203 (or such other decoder as the controller of a given control processor, 39J, may be installed in). In keeping with the function of control processor, 39J, as the processor at which all controlled functions of controller, 39, are invoked, all aforementioned particular register memories of controller, 39, are located at control processor, 39J. The register memories of control processor, 39J, include (but are not limited to) particular SPAM-input-signal register memory whose length in bit locations is sufficient to contain the longest possible instance of SPAM command information with associated padding bits; the aforementioned SPAM-header and SPAM-exec register memories; particular SPAM-Flag-monitor-info, SPAM-Flag-at-secondary-control-level, SPAM-Flag-executing-secondary-command, SPAM-Flag-secondary-level-incomplete, SPAM-Flag-primary-level-2nd-step-incomplete, SPAM-Flag-primary-level-3rd-step-incomplete, SPAM-Flag-secondary-level-2nd-step-incomplete, SPAM-Flag-secondary-level-3rd-step-incomplete, SPAM-Flag-first-condition-failed, SPAM-Flag-second-condition-failed, SPAM-Flag-do-not-meter, and SPAM-Flag-working register memories each of which are one bit location in length; the aforementioned SPAM-length-info, SPAM-mm-format, SPAM-first-precondition, SPAM-second-precondition, SPAM-last-01-header-exec register memories; particular SPAM-decryption-mark, SPAM-primary-input-source, SPAM-secondary-input-source, SPAM-next-primary-instruction-address, SPAM-next-secondary-instruction-address, SPAM-executing-secondary-command, SPAM-last-secondary-01-header-exec, SPAM-address-of-next-instruction-upon-primary-interrupt, and SPAM-address-of-next-instruction-upon-secondary-interrupt register memories whose functions are described below; and a plurality of working register memories that include first-working and second-working register memories. (With the exception of the memories whose names include the word "working," all the aforementioned register memories are dedicated strictly to the functions described below and are not used for any other functions.) All preprogrammed information associated with the identification and execution of controlled functions and the aforementioned conventional instructions that control controller, 39, are preprogrammed at the RAM and/or ROM associated with control processor, 39J. Examples of said preprogrammed information include relevant information of the aforementioned controlled-function-invoking information, process-length-token instructions, and execute-conditional-overlay-at-205 information (that is part of the aforementioned controlled-function-invoking-@205 information).

Besides being the processor at which all controlled functions of controller, 39, are invoked, control processor, 39J, is the processor that controls all controlled apparatus of decoder, 203, (except for a decryptor, 39K, described more fully below) and controls all apparatus described above as being controlled by SPAM-controller, 205C. Control processor, 39J, controls not only buffers, 39E and 39G, valves, 39F and 39H, and switch, 39I, but also processors, 39B and 39D, as well as all other apparatus of decoder, 203, controlled by controller, 39. Control processor, 39J, has all required transmission capacity for transmitting control instructions to and receiving control information from all such controlled apparatus. In addition, control processor, 39J, controls the CPU and the PC-MicroKey 1300 system of microcomputer, 205, in certain SPAM functions and has capacity, via matrix switch, 39I, to transmit control information to and receive control information from said CPU and said PC-MicroKey 1300 system. In certain SPAM functions, controller, 20, of signal processor, 200, controls control processor, 39J, and as FIG. 3A shows, control processor, 39J, has means for communicating control information directly with said controller, 20. The RAM and/or ROM associated with control processor, 39J, are preprogrammed with all information necessary for controlling all such controlled apparatus.

As FIG. 3A shows, the preferred embodiment of controller, 39, also has a decryptor, 39K. Said decryptor, 39K, is a conventional decryptor that is identical to decryptor, 10, of signal processor, 200. Decryptor, 39K, receives inputted information from matrix switch, 39I; outputs its information to buffer, 39H; has means for communicating control information directly with controller, 20, of signal processor, 200; and is controlled by said controller, 20. Decryptor, 39K, is preprogrammed with relevant SPAM information (e.g., information of H, X, and L) and has capacity for processing SPAM message information if fashions described more fully below.

In the preferred embodiment, to maximize the speed of information transmission, all apparatus of controller, 39, are located physically on one so-called silicon microchip and communicate with one another, in fashions well known in the art, by means of the circuits of said chip. All apparatus of said chip function, in a fashion well known in the art, at the same clock speed. Said speed may be the speed of the control clock of microcomputer, 205, communicated to controller, 39, in an appropriate fashion, well known in the art. Or said speed may be the control clock speed of signal processor, 200.

Examples #3 and #4 of the combining of the "Wall Street Week" program described above, which relate elaborations of examples #1 and #2, illustrate in detail the operation of the preferred embodiment of controller, 39.

Operating S. P. Systems

Example #3

First Word

Example #3 differs from example #1 in just two respects.

First, example #3 focuses on selected subscriber stations where signal processing apparatus and methods are used to collect monitor information for so-called "program ratings" (such as so-called "Nielsen ratings") that estimate the sizes of television (or radio) program audiences. In the present invention, subscriber stations can be preprogrammed to process and record monitor information of SPAM commands and transfer said information to one or more remote data collection stations where computers process the monitor information to generate such ratings. In example #3, all apparatus of the subscriber station of FIG. 3 are so preprogrammed, and buffer/comparator, 14, of signal processor, 200, operates, in fashions described more fully below, under control of the aforementioned on-board controller, 14A.

Second, the controller, 39, of example #3 is the preferred embodiment of controller, 39, and replaces the controller, 39, and SPAM-controller, 205C, of example #1. Insofar as messages addressed to URS microcomputers, 205, are concerned, the preferred embodiment of controller, 39, is preprogrammed to perform the controlled functions of the SPAM-controller, 205C, of example #1. Thus the preprogrammed information at the RAM and/or ROM associated with control processor, 39J, includes, for example, the execute-at-205, execute-conditional-overlay-at-205, and cease-overlay information and the load-run-and-code, conditional-overlay-at-205, and cease-overlaying-at-205 instructions preprogrammed at SPAM-controller, 205C, in example #1.

In all other respects example #3 is identical to example #1.

Example #3 begins, like example #1, with divider, 4, transferring the embedded information of the first message to decoder, 203. In the same fashion that applied in example #1, receiving said embedded information at decoder, 203, causes the binary information of said first message to be received, with error correcting information, at decoder, 203, and detected at digital detector, 34. Detector, 34, inputs the detected information to controller, 39, at buffer, 39A.

The first step of processing at controller, 39, takes place at processor, 39B, where error correction occurs. As said detected information is inputted, buffer, 39A, receives, buffers, and transfers said information, signal word by signal word, an to processor, 39B, in a fashion well in the art. Processor, 39B, receives each word, in turn, with its associated error correcting information and uses the error correcting information, in its forward error correcting fashion, to check the binary information of said word and correct the information of said word, as required, then transfers the correct information of said word to buffer, 39C, and discards said error correcting information.

The second step of processing is protocol conversion and takes place at processor, 39D. Buffer, 39C, receives and buffers the corrected information of each word, in turn, and transfers said information to processor, 39D. As processor, 39D, receives said information, in its protocol conversion fashion, processor, 39B, converts the corrected binary information of each word into converted information that all appropriate subscriber station apparatus can receive and process and transfers the converted information of each word to buffer, 39E.

As buffer, 39E, receives the corrected information of each word, buffer, 39E, buffers and transfers said information to EOFS valve, 39F, as quickly as said valve, 39F, is prepared to receive said information. EOFS valve, 39F, processes said information, in its end of file signal detecting fashion described above, to detect information of an end of file signal and outputs said information to matrix switch, 39I, as quickly as the apparatus to which said switch, 39I, transfers said information is prepared to receive said information. As matrix switch, 39I, receives the converted information of each word, said switch, 39I, transfers said information to a selected output port of said switch, 39I. Said selected port is the particular port to which control processor, 39J, causes said switch, 39I, to transfer said information.

At the outset of example #3, matrix switch, 39I, is configured to input the output of EOFS Valve, 39F, to control processor, 39J, and control processor, 39J, awaits header information.

When EOFS valve, 39F, commences transferring the SPAM information of the first message of example #3, control processor, 39J, executes a first step of receiving SPAM message information and receives the header information in said first message. Control processor, 39J, accepts, receives in turn, and records in sequence at particular SPAM-input-signal register memory a particular first quantity of said words. Said first quantity is the smallest number of signal words that can contain one instance of header information (that is, H bits). In the simplest preferred embodiment where a SPAM header is two bits long and signal words are eight-bit bytes, said first quantity is one. Then, automatically, control processor, 39J, ceases accepting SPAM signal information transferred from EOFS valve, 39F, and said valve, 39F, commences holding the next processed signal word of said first message until control processor, 39J, becomes prepared, once again, to accept and receive SPAM signal information.

Then control processor, 39J, processes said header information. Automatically, control processor, 39J, selects information of the first H bits at said SPAM-input-signal memory and records said information of H bits at said SPAM-header memory then compares the information at said SPAM-header memory to the aforementioned 11-header-invoking information that is "11". No match results.

Because control processor, 39J, and the RAM and ROM associated with said processor, 39J, are preprogrammed to process the monitor information of SPAM commands to provide viewership data for remote computer processing, not resulting in a match with said 11-header-invoking information causes control processor, 39J, to execute particular preprogrammed evaluate-message-content instructions before receiving and processing the execution segment information in said first message. Automatically, said instructions cause control processor, 39J, to compare the information at said SPAM-header memory with preprogrammed invoke-monitor-processing information. A match results with particular "01" information. Said match signifies the presence of meter-monitor information in said first message and causes control processor, 39J, to enter "0" at particular SPAM-Flag-monitor-info register memory that is normally "1".

Then automatically control processor, 39J, executes a second step of receiving SPAM signal information and receives the execution segment information in said first message. Automatically, control processor, 39J, commences accepting and EOFS valve, 39F, commences transferring additional SPAM signal words. Automatically, control processor, 39J, receives and records said words in sequence at said SPAM-input-signal memory immediately following the last of said first quantity of signal words until the total quantity of SPAM signal words recorded at said memory equals a particular second quantity. Said second quantity is the smallest number of signal words that can contain one instance of header and execution segment information (that is, H+X bits). (If H+X bits can be contained in one signal word, said second quantity equals said first quantity, and control processor, 39J, records no additional SPAM signal words in the course of said second step of receiving SPAM signal information.) Automatically, control processor, 39J, ceases accepting SPAM signal information transferred from EOFS valve, 39F.

Then control processor, 39J, processes said execution segment information. Automatically, control processor, 39J, selects information of the first X bits of information at said SPAM-input-signal memory immediately after the first H bits, records said information of X bits at said SPAM-exec memory, and compares the information at said SPAM-exec memory with controlled-function-invoking information that is preprogrammed at the RAM and/or ROM associated with said processor, 39J. A match results with the aforementioned execute-at-205 information that is identical to the execute-at-205 information preprogrammed at SPAM-controller, 205C, of example #1. Said match causes control processor, 39J, to execute the aforementioned load-run-and-code instructions. Said instructions cause control processor, 39J, to place "0" at the aforementioned SPAM-Flag-primary-level-2nd-step-incomplete register memory and, separately, at SPAM-Flag-primary-level-3rd-step-incomplete register memory, which information signifies that specific load-run-and-code controlled functions have not been completed, and to place information of a particular reentry-address at the aforementioned SPAM-address-of-next-instruction-upon-primary-interrupt register memory which reentry-address specifies the location of the next decrypt-process-and-meter-current-message instruction to be executed when interrupt information of a detected end of file signal is received by control processor, 39J, from EOFS valve, 39F. Then said instructions cause control processor, 39J, to compare the information at said SPAM-header memory with preprogrammed header-identification information and determine a match with particular preprogrammed "01" information.

Under control of said instructions, said match causes control processor, 39J, automatically to execute a third step of receiving SPAM signal information and receive the length token information in said first message. Automatically, control processor, 39J, commences accepting and EOFS valve, 39F, commences transferring additional SPAM signal words. Automatically, control processor, 39J, receives and records said words in sequence at said SPAM-input-signal memory immediately following the last of said second quantity of signal words until the total quantity of SPAM signal words recorded at said memory equals a particular third quantity. Said third quantity is the smallest number of signal words that can contain one instance of header, execution segment, and length token information (that is, H+X+L bits). Then, automatically, control processor, 39J, ceases accepting SPAM signal information transferred from EOFS valve, 39F.

Automatically, control processor, 39J, processes said length token information. The RAM and ROM associated with control processor, 39J, are preprogrammed with all information necessary to determine the length of SPAM commands including information of H, X, L, and H+X; process-length-token, determine-command-information-word-length, evaluate-end-condition, calculate-number-of-words-to-transfer, evaluate-padding-bits-? instructions; and token-comparison, W-token, X-token, Y-token, Z-token, w-bits, x-bits, y-bits, z-bits, A-format, B-format, C-format, and D-format information. Said preprogrammed instructions and information cause control processor, 39J, to determine the number of signal words of command information in said first message in precisely the same fashion that controller, 39, determined the number of signal words of command information in the second message in example #2. Automatically, control processor, 39J, selects information of the first L bits of information at said SPAM-input-signal memory immediately after the first H+X bits and records said information of L bits at SPAM-length-info memory. Said L bits are the length token of said message. Automatically control processor, 39J, determines that the information at said SPAM-length-info memory matches said W-token information, selects said w-bits information, and processes said information as the numeric value of MMS-L. Automatically, control processor, 39J, determines the number of signal words in the command information of said second message by adding H+X+L to said w-bits information of MMS-L and dividing the resulting sum by the number of bits in one signal word. Automatically control processor, 39J, places a "0" at particular SPAM-Flag-working register memory if said command information fills a whole number of signal words exactly and "1" at said memory if it does not. Automatically, control processor, 39J, then determines a particular number of signal words to transfer and place information of said number at particular working register memory.

Next said load-run-and-code instructions cause control processor, 39J, to execute a fourth step of receiving SPAM signal information and commence receiving all remaining command information and padding bits in said first message. Automatically, control processor, 39J, commences accepting and EOFS valve, 39F, commences transferring additional SPAM signal words. Automatically, control processor, 39J, receives and records said words in sequence at said SPAM-input-signal memory immediately following the last of said third quantity of signal words until the total quantity of SPAM signal words recorded at said memory equals a particular fourth quantity. Said fourth quantity is the number at said working register memory. Then, automatically, control processor, 39J, compares the information at said SPAM-Flag-working register memory to particular information that is "0".

Not resulting in a match means that EOFS valve, 39F, has transferred and control processor, 39J, has recorded all command information of said first message together with any associated padding bits. Accordingly, not resulting in a match causes control processor, 39J, to cease accepting SPAM signal information from EOFS valve, 39F.

On the other hand, resulting in a match means that one full signal word of padding bits may follow the last signal word of said message that contains command information and that said last word must be evaluated to ascertain whether it contains MOVE bit information. Accordingly, under control of said preprogrammed instructions, resulting in a match causes control processor, 39J, to receive one additional signal word from EOFS valve, 39F, to compare said word to particular preprogrammed information of one EOFS WORD, and to record said word at said SPAM-input-signal memory immediately following the last of said fourth quantity of signal words. Said word is the last signal word of said message that contains command information. If said word matches said information of one EOFS WORD, one full signal word of padding bits follows said word, and said preprogrammed instructions cause control processor, 39J, to receive one more signal word from EOFS valve, 39F, and to record said word at said SPAM-input-signal memory immediately following said last signal word that contains command information. Then, whether or not a match has occurred with said information of one EOFS WORD, said preprogrammed instructions cause control processor, 39J, to cease accepting SPAM signal information from EOFS valve, 39F.

By receiving all command information and padding bits in said first message in the course of said four steps of receiving SPAM signal information, control processor, 39J, causes EOFS valve, 39F, to transfer every signal word in said first message prior to the first word of the information segment of said first message. Accordingly, the next signal word transferred by said valve, 39F, is the first word of said information segment, which is the first word of the program instruction set of the "Wall Street Week" combining.

Then said load-run-and-code instructions cause control processor, 39J, to commence loading information at the main RAM of microcomputer, 205. Automatically, under control of said instructions, control processor, 39J, causes matrix switch, 39I, to cease transferring information from EOFS valve, 39F, to control processor, 39J, and to commence transferring information from control processor, 39J, to the CPU of microcomputer, 205; transmits an instruction to said CPU that causes said CPU to commence receiving information from matrix switch, 39I, and loading said information at particular main RAM in a fashion well known in the art; and causes matrix switch, 39I, to commence transferring information from EOFS valve, 39F, to said CPU. Automatically, microcomputer, 205, commences receiving the information of the program instruction set in said first message, beginning with the first signal word of said set, and loads said information at particular main RAM.

Then, while EOFS valve, 39F, processes the information of the information segment of said first message to detect the end of file signal and while microcomputer, 205, loads the information of said program instruction set at RAM, said load-run-and-code instructions cause control processor, 39J, to commence executing the code portion of said instructions. The instructions of said portion cause control processor, 39J, to compare the information at said SPAM-header memory to particular load-run-and-code-header information that is "01". A match results (which indicates that said first message contains meter-monitor information). Control processor, 39J is preprogrammed with evaluate-meter-monitor-format, process-this-specific-format, and locate-program-unit instructions and with format-specification information and offset-address information, and said match control processor, 39J, to locate the "program unit identification code" information in the information at said SPAM-input-signal memory and record information of said "code" information at SPAM-first-precondition register memory in the same fashion that SPAM-controller, 205C, performed these functions in example #1.

To locate said "code" information, said code portion instructions cause control processor, 39J, to execute said evaluate-meter-monitor-format instructions. Said instructions cause control processor, 39J, to select information of bits at particular predetermined locations at said SPAM-input-signal memory and record said information at SPAM-mm-format register memory. Said bits are the bits of the meter-monitor format field in said first message. Then said instructions cause control processor, 39J, to compare the information at said SPAM-mm-format memory with said format-specification information, determine a match with particular A-format information that invokes particular process-A-format instructions, and execute said instructions. Said instructions cause control processor, 39J, to place a particular A-offset-address number at said SPAM-mm-format memory (thereby overwriting and obliterating the information previously at said memory) which number specifies the address/location at the RAM associated with control processor, 39J, of the first bit of information that identifies the specific format of the meter-monitor segment in said first message.

Then said code portion instructions cause control processor, 39J, to execute the aforementioned locate-program-unit instructions. Said instructions cause controller, 39J, to add a particular preprogrammed program-unit-field-start-datum-location number to information of said A-offset-address number and record the resulting first sum then add a particular preprogrammed program-unit-field-length-datum-location number to information of said A-offset-address number and record the resulting second sum. Next said instructions cause control processor, 39J, to select preprogrammed binary information of a particular preprogrammed datum-cell-length number of contiguous bit locations that begin at said first sum number of bit locations after a particular predetermined first-bit location at said RAM and place said binary information at first-working register memory and to select preprogrammed binary information of said datum-cell-length number of contiguous bit locations that begin at said second sum number of locations after said first-bit location and place said binary information at second-working register memory. In so doing, control processor, 39J, places at said first-working memory information of the bit distance from the first bit location of said SPAM-input-signal memory to the first bit location of said program unit field and places at said second-working memory information of the bit location length of said program unit field. Automatically, control processor, 39J, selects binary information of the second-working memory information number of contiguous bit locations at said SPAM-input-signal memory that begin at the first-working memory information number of bit locations after the first bit location at said memory. Automatically, control processor, 39J, places said binary information at said first-working memory. In so doing, control processor, 39J, selects information of the unique "program unit identification code" that identifies said "Wall Street Week" program.

Then said code portion instructions cause control processor, 39J, to place at the aforementioned SPAM-first-precondition memory information of said information at first working memory. In so doing, control processor, 39J, places said "code" at said memory. Then the final instructions of said portion cause control processor, 39J, place "1" at SPAM-Flag-primary-level-3rd-step-incomplete register memory (thereby overwriting and obliterating the "1" information at said memory), which "1" signifies the completion of the code step executed by said load-run-and-code instructions.

(At stations that are not preprogrammed to collect monitor information, each control processor, 39J, commences waiting for interrupt information of the end of file signal at the end of said first message from EOFS valve, 39F, when each completes the code portion of said load-run-and-code instructions.)

The station of FIG. 3 is preprogrammed to collect monitor information, and at any point where the control processor, 39J, of a station that is not so preprogrammed commences waiting, the control processor, 39J, of the station of FIG. 3 is preprogrammed automatically to execute particular preprogrammed collect-monitor-info instructions. Said instructions cause control processor, 39J, of the station of FIG. 3 to compare the information at said SPAM-Flag-monitor-info memory with particular preprogrammed "0" information. A match results. Under control of said instructions, said match causes control processor, 39J, to cause matrix switch, 39I, to commence transferring information from control processor, 39J, to buffer/comparator, 14, of signal processor, 200, (while said switch is simultaneously transferring information from control processor, 39J, to the CPU of microcomputer, 205); to transfer to said buffer/comparator, 14, header information that identifies a transmission of monitor information then particular decoder-203 information that is the source mark of said decoder, 203, (which source mark is binary information that is preprogrammed at control processor, 39J) then all of the received binary information of said first message that is recorded at said SPAM-input-signal memory; then to cause matrix switch, 39I, to cease transferring information from control processor, 39J, to said buffer/comparator, 14. (Said received information is complete information of the first combining synch command, and said information transmitted to buffer/comparator, 14, is called, hereinafter, the "1st monitor information (#3).") Then control processor, 39J, enters "1" at said SPAM-Flag-monitor-info memory, signifying completion of the transfer of said 1st monitor information (#3); completes said collect-monitor-info instructions; and commences waiting for interrupt information of end of file signal, transmitted by control transmission means.

In due course, EOFS valve, 39F, receives the last signal word of the information segment of said first message, which is the last signal word of said program instruction 7set, and transfers said word, via matrix switch, 39I, to microcomputer, 205, which causes microcomputer, 205, to load said word at said RAM.

Then said valve, 39F, commences receiving information of the eleven EOFS WORDs that constitute the end of file signal at the end of said first message. Receiving the first EOFS WORD of said eleven causes EOFS valve, 39F, to commence retaining information of said WORD, in the fashion described above, and to cease transferring information to microcomputer, 205. Accordingly, microcomputer, 205, ceases loading information at said RAM. Said valve, 39F, detects and retains information of the next nine EOFS WORDs in its end of file signal detection fashion. Then, receiving the eleventh and last EOFS WORD of said end of file signal causes EOFS valve, 39F, to increment the information at the EOFS WORD Counter of said valve, 39F, by one then determine that the information at said Counter matches the information at the EOFS Standard Length Location of said valve, 39F, which causes EOFS valve, 39F, to transmit EOFS-signal-detected information to control processor, 39J, as an interrupt signal then commence waiting for a control instruction from control processor, 39J.

Receiving an interrupt signal of EOFS-signal-detected information from an EOFS valve, 39F or 39H, while under control of any given set of preprogrammed controlled function instructions causes control processor, 39J, to execute a so-called "machine language jump" to a predesignated portion of said instructions, in a fashion well known in the art, and execute the instructions of said portion.

In the case of said load-run-and-code instructions, receiving an EOFS-signal-detected interrupt signal causes control processor, 39J, to jump to and execute the run portion of said instructions. Receiving the EOFS-signal-detected interrupt signal that the eleventh EOFS WORD of the end of file signal at the end of said first message causes EOFS valve, 39F, to transmit causes control processor, 39J, to jump to and execute instructions that begin with that particular one whose location is identified by the reentry-address information at the aforementioned SPAM-address-of-next-instruction-upon-primary-interrupt register memory. Said instructions are the instructions of said run portion. Automatically, said instructions cause control processor, 39J, to cause matrix switch, 39I, to cease transferring information from EOFS valve, 39F, to the CPU of microcomputer, 205, and to commence transferring information from control processor, 39J, to said CPU; to transmit a control instruction to said CPU that causes microcomputer, 205, to cease loading information at said main RAM and execute the information so loaded as so-called "machine executable code" of one so-called "job"; then to transmit the aforementioned discard-and-wait instruction, via control transmission means, to EOFS valve, 39F. In so doing, control processor, 39J, completes the instructions of said run portion.

Receiving said discard-and-wait instruction causes EOFS valve, 39F, to set the information at said EOFS WORD Counter to "00000000", to transmit the aforementioned complete-and-waiting information to control processor, 39J, as a second interrupt signal, then to commence waiting for a further control instruction from control processor, 39J.

Automatically said load-run-and-code instructions cause control processor, 39J, to compare the information at said SPAM-Flag-primary-level-3rd-step-incomplete memory with particular preprogrammed "1" information. A match results which signifies that control processor, 39J, has already completed the code portion of said load-run-and-code instructions. Said match causes control processor, 39J, to complete said load-run-and-code instructions.

Having completed the controlled functions of said first message, automatically control processor, 39J, prepares to receive the next SPAM message. Automatically, control processor, 39J, determines, in a predetermined fashion, that EOFS valve, 39F, is the primary input to control processor, 39J, of SPAM message information; causes matrix switch, 39I, to commence transferring information from EOFS valve, 39F, to control processor, 39J; then compares the information at said SPAM-header memory to particular preprogrammed cause-retention-of-exec information that is "01". A match results which causes control processor, 39J, to place at the aforementioned SPAM-last-01-header-exec register memory information of the information at said SPAM-exec memory. Being preprogrammed to collect monitor information, control processor, 39J, automatically compares the information at said SPAM-Flag-monitor-info memory with particular preprogrammed "0" information. No match results which indicates that control processor, 39J, has completed collect-monitor-info instructions in respect to said first message. Then, automatically, control processor, 39J, causes all apparatus of control processor, 39J, to delete from memory all information of said first message except information at said SPAM-first-precondition and SPAM-last-01-header-exec memories. Finally, after receiving said complete-and-waiting information from EOFS valve, 39F, control processor, 39J, causes said valve, 39F, to commence processing inputted signal words, in its preprogrammed detecting fashion, and outputting information to matrix switch, 39I, and control processor, 39J, commences waiting to receive information of a subsequent SPAM header from said switch, 39I.

As described in "One Combined Medium" above, running the information of said program instruction set causes microcomputer, 205, (and URS microcomputers, 205, at other subscriber stations) to place appropriate FIG. 1A image information at particular video RAM. In addition, running said set also causes microcomputer, 205, after completing placing said image information at said RAM, to transfer particular number-of-overlay-completed information and instructions to control processor, 39J. Said information and instructions cause control processor, 39J, to place the number "00000001" at particular SPAM-second-precondition register memory at control processor, 39J, signifying that said image information represents the first overlay of its associated video program.

Receiving said 1st monitor information (#3) causes buffer/comparator, 14, to compare the information, in said 1st information, of the header information that identifies a transmission of monitor information to particular preprogrammed header-identification-@14 information. A match results with particular monitored-instruction-fulfilled-identification information which causes buffer/comparator, 14, to input said 1st monitor information (#3) to onboard controller, 14A.

Receiving said 1st monitor information (#3) causes onboard controller, 14A, to record the source mark information in said 1st information at particular source-mark-@14A register memory; to record at particular SPAM-input-signal-@14A register memory all of the received binary information of said first message that was recorded at the aforementioned SPAM-input-signal memory of controller, 39J; and to execute particular preprogrammed process-monitor-info instructions. (Onboard controller, 14A, processes the 1st monitor information (#3) upon receipt, and this processing can occur simultaneously with the loading of the program instruction set of said first message at RAM at microcomputer, 205, while control processor, 39J, waits to receive an EOFS-signal-detected signal from EOFS valve, 39F.) Automatically, said instructions cause onboard controller, 14A, to compare the information at said source-mark-@14A memory, in a predetermined fashion, with particular pre-entered source-identification mark information that onboard controller, 14A, retains in memory associated with its pre-entered signal records of monitor information. A match results with that particular decoder-203 source mark information that is associated with the aforementioned record of the prior programming displayed at monitor, 202M. Said match causes onboard controller, 14A, to locate the instance of "program unit identification code" information in the information at said SPAM-input-signal-@14A register memory in precisely the same fashion that the code portion instructions of the aforementioned load-run-and-code instructions caused controller, 39J, to locate "program unit identification code" information in information of said first message. (Onboard controller, 14A, is preprogrammed with all information necessary for locating and processing the information of all the meter-monitor fields in any monitor information transmission such as said 1st monitor information (#3)—said preprogrammed information includes, for example, format-specification information, A-format information, and locate-program-unit instructions.) Automatically, said process-monitor-info instructions cause onboard controller, 14A, in a predetermined fashion, to locate the instance of "program unit identification code" information in said record of the prior programming displayed at monitor, 202M, and to compare said first named instance of "program unit identification code" information to said second named instance. No match results.

Not resulting in a match causes onboard controller, 14A, to cause signal processor, 200, to record said record of prior programming at recorder, 16. Automatically, under control of said process-monitor-info instructions, onboard controller, transmits to controller, 20, a particular preprogrammed instruct-to-record instruction that causes controller, 20, to cause onboard controller, 14A, to transmit the monitor record of said prior programming to recorder, 16, in a predetermined fashion and that causes controller, 20, to cause recorder, 16, to record said monitor record information in a predetermined fashion. (Certain transfer functions caused by said transmission of instruct-to-record information are described more fully below in "Operating Signal Processing Systems . . . Signal Record Transfer.")

Then said process-monitor-info instructions cause onboard controller, 14A, to initiate a new monitor record that reflects the new "Wall Street Week" programming. Automatically, said instructions cause onboard controller, 14A, in a predetermined fashion, to delete all information at the monitor record location of said monitor record of prior programming except the source mark information associated with said record; to record information of said first named instance of "program unit identification code" information (which is the "program unit identification code" of said "Wall Street Week" program to a particular "program unit identification code" location at said record location; to select particular information located at said SPAM-input-signal-@14A register memory and record information at said record location; to select particular preprogrammed record format information that identifies the format of the information at said record location and place information of said information at a particular location at said record location and, separately, at a particular format comparison location; and finally, to discard all unrecorded information of said 1st monitor information (#3) and commence waiting for the next inputted instance of monitor information.

The content of the 1st monitor information (#3) [more particularly, the information of the command execution segment and of the meter-monitor format field] causes onboard controller, 14A, to organize the information of said new monitor record in a particular fashion. The command execution segment of the 1st monitor information (#3) causes signal processor, 200, to assemble the this new monitor record in a particular format of a combined video/computer medium display and to include a particular record format field within said format identifying the format of said record. (Were the execution segment of said command of the aforementioned pseudo command, signal processor, 200, would initiate a record for a conventional television program.) From the command meter-monitor segment of the 1st monitor information (#3), onboard controller, 14A, selects and records at particular signal record field locations at said record location the information that identifies the program unit of the particular "Wall Street Week" program, the origin of the "Wall Street Week" transmission, and the day of the particular transmission within a one hundred year period. In a predetermined fashion, onboard controller, 14A, also records in a particular monitor record field location at said record location a particular display unit identification code that identifies monitor, 202M, as the display apparatus of said new monitor record. In a predetermined fashion, signal processor, 200, records date and time information received from clock, 18, in first and last particular time field locations at said record location that document the date and time respectively of the first and of the last received instances of monitor information of the particular program unit and source mark.

Operating S. P. Systems

Example #3

Second Message

Subsequently, the embedded information of the second message of the "Wall Street Week" program is inputted to decoder, 203. Receiving said embedded information at decoder, 203, causes the SPAM information of said second message to be detected at detector 34; inputted to controller, 39, at buffer, 39A; checked and corrected, as necessary, at processor, 39B; converted into locally usable binary information at processor, 39D; and processed by EOFS valve, 39F, in the end of file signal detecting fashion of said valve, 39F, with all these functions occurring in the same fashions that applied to the SPAM information of the first message.

When EOFS valve, 39F, commences transferring the SPAM information of the second message, receiving the information of the header of said message causes control processor, 39J, to commence processing the information of said message under control of the preprogrammed instructions at the RAM and ROM associated with said processor, 39J, and to process, in particular, the information of said header. Automatically, control processor, 39J, accepts the smallest number of signal words that can contain one instance of header information, records the information of said words in sequence at SPAM-input-signal register memory, then ceases accepting SPAM signal information transferred from EOFS valve, 39F. Automatically, control processor, 39J, selects information of the first H bits at said SPAM-input-signal memory and records said information of H bits at SPAM-header memory then compares the information at said SPAM-header memory to the aforementioned 11-header-invoking information that is "11". No match results.

Not resulting in a match causes control processor, 39J, first, to execute the aforementioned evaluate-message-content instructions then to receive and process the execution segment information in said second message. Automatically, control processor, 39J, compares the information at said SPAM-header memory with preprogrammed invoke-monitor-processing information. A match results with particular "00" information. Said match signifies the presence of meter-monitor information in said second message and causes control processor, 39J, to enter "0" at SPAM-Flag-monitor-info register memory that is normally "1". Then, automatically, control processor, 39J, commences accepting additional SPAM signal words from EOFS valve, 39F; receives and records additional words at said SPAM-input-signal memory, in sequence after the information already there, until the total quantity of SPAM signal words recorded at said memory equals the smallest number of signal words that can contain one instance of header and execution segment information; then ceases accepting SPAM signal information from EOFS valve, 39F. Automatically, control processor, 39J, selects information of the first X bits of information at said SPAM-input-signal memory immediately after the first H bits, records said information of X bits at said SPAM-exec memory, and compares the information at said SPAM-exec memory with controlled-function-invoking information that is preprogrammed at the RAM and/or ROM associated with said processor, 39J. A match results with the aforementioned execute-conditional-overlay-at-205 information that is identical to the execute-conditional-overlay-at-205 information preprogrammed at SPAM-controller, 205C, of example #1. Said match causes control processor, 39J, to execute the aforementioned conditional-overlay-at-205 instructions. Said instructions cause SPAM-controller, 205C, to execute "GRAPHICS ON" at the PC-MicroKey System of microcomputer, 205, if the information of the program unit field in the meter-monitor information of said second message matches the information at said SPAM-first-precondition register memory and the information of the overlay number field in said meter-monitor information matches the information at said SPAM-second-precondition register memory.

Automatically, said conditional-overlay-at-205 instructions cause control processor, 39J, to receive and process the length token information in said second message. Automatically, control processor, 39J, recommences accepting additional SPAM signal words from EOFS valve, 39F; receives and records additional words at said SPAM-input-signal memory, in sequence after the information already there, until the total quantity of SPAM signal words recorded at said memory equals the smallest number of signal words that can contain one instance of header, execution segment, and length token information; then ceases accepting SPAM signal information from EOFS valve, 39F. Under control of the same preprogrammed instructions that controlled the processing of the length token of the first message, control processor, 39J, processes the length token of the second message in the same fashion that applied to the first message but with one exception. Control processor, 39J, determines that the length token of said second message matches X-token information, when compared with token-comparison information, rather than Y-token information (which was the information matched by the length token information of the second message of example #2). Said match causes control processor, 39J, to select x-bits information, place said information at SPAM-length-info memory, and process said x-bits information as the numeric value of MMS-L. Then, in precisely the same fashion that applied in the case of the first message, control processor, 39J, determines a particular number of signal words to transfer and places information of said number at particular working register memory.

Next said conditional-overlay-at-205 instructions cause control processor, 39J, to receive all remaining command information and padding bits of said second message and to load said information and bits at said SPAM-input-signal memory in precisely the same fashion that applied in the case of the first message. Automatically, control processor, 39J, recommences accepting additional SPAM signal words from EOFS valve, 39F, and receives and records additional words at said SPAM-input-signal memory, in sequence after the information already there, until the total quantity of SPAM signal words recorded at said memory equals the number at said working register memory. Then, if the command information in said second message does not fill a whole number of signal words exactly, control processor, 39J, automatically ceases accepting SPAM signal information from EOFS valve, 39F. But if, instead, said command information does fill a whole number of signal words exactly, automatically control processor, 39J, receives one additional signal word from EOFS valve, 39F; compares said word to information of one EOFS WORD; records said word at said SPAM-input-signal memory immediately following the information already recorded at said memory; receives one more signal word from EOFS valve, 39F, and records said word at said SPAM-input-signal memory immediately following the information of said one additional signal word if said additional word matched said information of one EOFS WORD at the aforementioned comparing; and ceases accepting SPAM signal information from EOFS valve, 39F.

By receiving all command information and padding bits in said second message, control processor, 39J, causes EOFS valve, 39F, to transfer every signal word in said message. Accordingly, the next signal word to be transferred by said valve, 39F, is the first word of the next message embedded in the "Wall Street Week" programming transmission after said second message.

Then, in order to locate the information of the program unit and overlay number fields in the meter-monitor information of said second message, said conditional-overlay-at-205 instructions cause control processor, 39J, to execute said evaluate-meter-monitor-format instructions and said instructions cause control processor, 39J, to place a selected offset-address number at SPAM-mm-format memory in the same fashion that applied in the case of the first message. Automatically, control processor, 39J, selects information of the bits of the meter-monitor format field in said first message, records said information at SPAM-mm-format register memory, compares the information at said memory with format-specification information, determines a match with B-format information that invokes process-B-format instructions that cause control processor, 39J, to place at said SPAM-mm-format memory a particular B-offset-address number that is different from the aforementioned A-offset-address number and that specifies the RAM address/location of the first bit of information that identifies the specific format of the meter-monitor segment in said second message.

Then said conditional-overlay-at-205 instructions cause control processor, 39J, to execute the aforementioned locate-program-unit instructions and locate the program unit field in the meter-monitor information of said second message in the same fashion that applied in the case of the first message. Automatically, controller, 39J, adds the aforementioned program-unit-field-start-datum-location number to information of said B-offset-address number and records the resulting first sum then adds the aforementioned program-unit-field-length-datum-location number to information of said B-offset-address number and records the resulting second sum. Next said instructions cause control processor, 39J, to select information of the starting bit location of said program unit field which information is the number of bit locations from the first bit location at said SPAM-input-signal memory to the first bit location of said field. Automatically, control processor, 39J, places said information at first-working register memory then selects second information of the length of said program unit field in contiguous bit locations and places said second information at second-working register memory. Automatically, control processor, 39J, selects binary information of the second-working memory information number of contiguous bit locations at said SPAM-input-signal memory that begin at the first-working memory information number of bit locations after the first bit location at said memory. Automatically, control processor, 39J, places said binary information at said first-working memory. In so doing, control processor, 39J, places at said memory information of the unique "program unit identification code" that identifies the program unit of said "Wall Street Week" program.

Then said conditional-overlay-at-205 instructions cause control processor, 39J, to compare the information at said first-working memory to the information at the aforementioned SPAM-first-precondition register memory (which is the same unique code). A match results (which indicates that control processor, 39J, executed the aforementioned load-run-and-code instructions under control of the first message.) Said match causes control processor, 39J, to continue executing said conditional-overlay-at-205 instructions.

(As described in the case of the second message of example #1, at any subscriber station where information at first-working register memory fails to match information at SPAM-first-precondition register memory, said failing to match causes the control processor, 39J, of said station to clear all SPAM information from main and video RAMs of the microcomputers, 205, of said stations and, themselves, to discard all information of said second message and commence waiting for the binary information of a subsequent SPAM header.)

Next said conditional-overlay-at-205 instructions cause control processor, 39J, to execute the aforementioned locate-overlay-number instructions and locate the overlay number field in said meter-monitor information in the same fashion that the information of the program unit field is located. Said locate-overlay-number instructions cause controller, 39J, to add a particular preprogrammed overlay-number-field-start-datum-location number (that is different from the aforementioned program-unit-field-start-datum-location number) to information of said B-offset-address number and record the resulting first sum then add a particular preprogrammed overlay-number-field-length-datum-location number to information of said B-offset-address number and record the resulting second sum. Next said instructions cause control processor, 39J, to select preprogrammed binary information of the aforementioned datum-cell-length number of contiguous bit locations that begin at said first sum number of bit locations after the aforementioned first-bit location at said RAM and place said binary information at first-working register memory and to select preprogrammed binary information of said datum-cell-length number of contiguous bit locations that begin at said second sum number of locations after said first-bit location and place said binary information at second-working register memory. In so doing, control processor, 39J, places at said first-working memory information of the bit distance from the first bit location of said SPAM-input-signal memory to the first bit location of said overlay number field and places at said second-working memory information of the number of contiguous bit locations in said overlay number field. Automatically, control processor, 39J, selects binary information of the second-working memory information number of contiguous bit locations at said SPAM-input-signal memory that begin at the first-working memory information number of bit locations after the first bit location at said memory. Automatically, control processor, 39J, places said binary information at said first-working memory (thereby overwriting and obliterating the information previously there). In so doing, control processor, 39J, selects from the information at said SPAM-input-signal memory and records at said first-working memory the information of said overlay number field. (After the information of said overlay field is placed at said memory, the information at said memory is "00000001".)

Then said conditional-overlay-at-205 instructions cause control processor, 39J, to compare the information at said first-working memory to the "00000001" information at the aforementioned SPAM-second-precondition register memory. A match results (indicating that microcomputer, 205, has completed placing appropriate FIG. 1A image information at video RAM).

(As described in the case of the second message of example #1, at any subscriber station where information at first-working register memory fails to match information at SPAM-second-precondition memory, the control processor, 39J, of said station interrupts the operation of the CPU of said microcomputer, 205, in an interrupt fashion well known in the art, and causes said microcomputer, 205, to restore efficient operation in a fashion described more fully below.)

At the subscriber station of FIG. 3 (and at URS microcomputers, 205, at other subscriber stations where information at first-working memory matches information at SPAM-second-precondition memory), said match causes control processor, 39J, to cause matrix switch, 39I, to cease transferring information from EOFS valve, 39F, to control processor, 39J, and commence transferring information from control processor, 39J, to the PC-MicroKey System of microcomputer, 205; to transmit the instruction, "GRAPHICS ON", to said PC-MicroKey System; and to complete said conditional-overlay-at-205 instructions, the controlled functions of the second combining synch command, and the controlled functions of said second message.

At the subscriber station of FIG. 3 (and at URS microcomputers, 205, at other subscriber stations), said instruction, "GRAPHICS ON", causes said PC-MicroKey System to combine the programming of FIG. 1A and of FIG. 1B and transmit the combined programming to monitor, 202M, where FIG. 1C is displayed.

Automatically, the preprogrammed instructions that control control processor, 39J, cause said processor, 39J, to prepare to receive the next SPAM message. Automatically, control processor, 39J, determines, in a predetermined fashion, that EOFS valve, 39F, is the primary input to control processor, 39J, of SPAM message information; causes matrix switch, 39I, to commence transferring information from EOFS valve, 39F, to control processor, 39J; determines that the information at said SPAM-header memory does not match the aforementioned cause-retention-of-exec information that is "01".

Then, being preprogrammed to collect monitor information, control processor, 39J, automatically compares the information at said SPAM-Flag-monitor-info memory with particular preprogrammed "0" information. A match results. Said match causes control processor, 39J, to execute particular ones of its preprogrammed collect-monitor-information instructions. Under control of said ones, control processor, 39J, transfers to the buffer/comparator, 14, of signal processor, 200, header information that identifies a transmission of monitor information then the aforementioned decoder-203 source mark information then all of the received binary information of said second message that is recorded at said SPAM-input-signal memory. (Said information is complete information of the second combining synch command, and said information transmitted to buffer/comparator, 14, is called, hereinafter, the "2nd monitor information (#3).") Then control processor, 39J, enters "1" at said SPAM-Flag-monitor-info memory, completes said collect-monitor-info instructions, and continues the conventional preprogrammed instructions of said control processor, 39J.

Automatically control processor, 39J, deletes from memory all information of said second message and commences waiting to receive the binary information of a subsequent SPAM header from matrix switch, 39I.

At signal processor, 200, receiving said 2nd monitor information (#3) causes buffer/comparator, 14, to determine that the header information, in said 2nd monitor information (#3), that identifies a transmission of monitor information matches the aforementioned monitored-instruction-fulfilled-identification information which causes buffer/comparator, 14, to input said 2nd monitor information (#3) to onboard controller, 14A.

Receiving said 2nd monitor information (#3) causes onboard controller, 14A, to record the source mark information in said 2nd monitor information (#3) at source-mark-@14A register memory; to record, at particular SPAM-input-signal-@14A register memory, all of the received binary information of said first message that was recorded at the aforementioned SPAM-input-signal memory of controller, 39J; and to execute the aforementioned process-monitor-info instructions. Said instructions cause onboard controller, 14A, to compare the information at said source-mark-@14A memory with the aforementioned source-identification information. A match results with the aforementioned decoder-203 source mark information. Said match causes onboard controller, 14A, to locate the instance of "program unit identification code" information at said SPAM-input-signal-@14A register memory, in the fashion described above; to locate the instance of "program unit identification code" information in the aforementioned new monitor record; and to compare said first named instance to said second named instance. A match results. Under control of said process-monitor-info instructions, said match causes onboard controller, 14A, to record date and time information, received from clock, 18, at the aforementioned last particular time field of said new monitor record and, in a predetermined fashion, to compare the meter-monitor format field at said SPAM-input-signal-@14A register memory to the aforementioned record format field associated with said monitor record. No match results which indicates that said 2nd monitor information (#3) contains new information. Not resulting in a match causes onboard controller, 14A, in a predetermined fashion, to evaluate said new information and modify the information content of said new monitor record by adding and/or deleting and/or replacing information. One element of information modified at said new monitor record is said record format information which is replaced with new record format information that specifies the format in which the information of said new record is organized. Finally, said process-monitor-info instructions cause onboard controller, 14A, to discard all unrecorded information of said 2nd monitor information (#3) and commence waiting for the next inputted instance of monitor information.

The new information content of the 2nd monitor information (#3) causes controller, 20, to modify the information of said new monitor record in a particular fashion. The command meter-monitor segment information of the minute of the particular transmission within a particular one month period provides new information. By comparing said information with date and time information from clock, 18, in a predetermined fashion, controller, 20, determines whether said "Wall Street Week" programming is being displayed at the time of its original transmission or whether it has been so-called "time shifted"; that is, recorded at one time an a receiver station video tape recorder and played back at a subsequent time. If controller, 20, determines that the time of clock, 18, is the time of original transmission (plus or minus particular error parameter information), controller, 20, deletes the information of the day of the particular transmission within a one hundred year period from said monitor record, modifies the record format field with information that distinguishes said new record as a record of a display of an original transmission, and enters all other recorded information of said new monitor record into the particular fields of said format. If controller, 20, determines that the original transmission has been time shifted, controller, 20, modifies the record format field with information that distinguishes said new record as a record of a time shifted display, enters all previously recorded information within the proper fields of said format, and records the new information of the minute of the particular transmission within a particular one month period.

The particular overlay information of the command meter-monitor segment of the 2nd monitor information (#3) also provides new information. Controller, 20, uses said particular overlay information in several fashions. It records in a particular field of said new monitor record a count, starting with "1" for said first overlay, of the number of overlays processed in the course of said program unit. It increments by one a separate monitor record count of the aggregate number of overlays displayed at monitor, 202M, over a particular calendar month period. And it increments by one a separate monitor record count of the aggregate number of combinings processed by all receiver station apparatus over a particular time period.

Operating S. P. Systems

Example #3

Third Message

Subsequently, the embedded information of the third message of the "Wall Street Week" program is inputted to decoder, 203. Just as with the information of the first and second messages, receiving the embedded information of said third message causes the SPAM information of said message to be detected at detector, 34, and inputted to controller, 39, at buffer, 39A; checked and corrected, as necessary, at processor, 39B; converted into locally usable binary information at processor, 39D; and processed for end of file signal information at EOFS valve, 39F.

When EOFS valve, 39F, commences transferring the SPAM information of said third message, control processor, 39J, automatically accepts the smallest number of signal words that can contain one instance of header information, records the information of said words in sequence at SPAM-input-signal register memory, then ceases accepting SPAM signal information transferred from EOFS valve, 39F. Automatically, control processor, 39J, selects information of the first H bits at said SPAM-input-signal memory, records said information of H bits at SPAM-header memory, and compares the information at said SPAM-header memory to the aforementioned 11-header-invoking information that is "11". No match results.

Not resulting in a match causes control processor, 39J, first, to execute evaluate-message-content instructions then to receive and process the execution segment information in said third message. Automatically, control processor, 39J, compares the information at said SPAM-header memory with preprogrammed invoke-monitor-processing information. No match results which signifies the absence of meter-monitor information in said third message. Accordingly, the information at said SPAM-Flag-monitor-info register memory remains "1". Then control processor, 39J, recommences accepting additional SPAM signal words from EOFS valve, 39F; receives and records additional words at said SPAM-input-signal memory, in sequence after the information already there, until the total quantity of SPAM signal words recorded at said memory equals the smallest number of signal words that can contain one instance of header and execution segment information; then ceases accepting SPAM signal information from EOFS valve, 39F. Automatically, control processor, 39J, selects information of the first X bits of information at said SPAM-input-signal memory immediately after the first H bits, records said information of X bits at said SPAM-exec memory, and compares the information at said SPAM-exec memory with controlled-function-invoking information that is preprogrammed at the RAM and/or ROM associated with said processor, 39J. A match results with the aforementioned cease-overlay information causing control processor, 39J, to execute the aforementioned cease-overlaying-at-205 instructions.

Automatically, said instructions cause control processor, 39J, to cause matrix switch, 39I, to cease transferring information from EOFS valve, 39F, to control processor, 39J, and commence transferring information from control processor, 39J, to the PC-MicroKey System of microcomputer, 205; to transmit the instruction, "GRAPHICS OFF", to said PC-MicroKey System; to cause matrix switch, 39I, to cease transferring information from control processor, 39J, to said PC-MicroKey System and commence transferring information from control processor, 39J, to the CPU of microcomputer, 205; then to transmit the aforementioned clear-and-continue instruction (the function of which is described more fully below) to said CPU; and finally, to cause matrix switch, 39I, to cease transferring information from control processor, 39J, to said CPU. In so doing, control processor, 39J, completes said cease-overlaying-at-205 instructions.

At the subscriber station of FIG. 3 (and at URS microcomputers, 205, at other subscriber stations), said instruction, "GRAPHICS OFF", causes said PC-MicroKey System to cease combining the programming of FIG. 1A and of FIG. 1B and commence transmitting to monitor, 202M, only the composite video programming received from divider, 4, (which causes monitor, 202M, to commence displaying only said video programming). And said clear-and-continue instruction causes microcomputer, 205, to commence processing in a predetermined fashion (which fashion may be determined by the aforementioned program instruction set).

Having completed the controlled functions of said third message, the conventional control instructions that control control processor, 39J, cause said processor, 39J to prepare to receive the next instance of SPAM message information in the following fashion.

Automatically, control processor, 39J, determines, in a predetermined fashion, that EOFS valve, 39F, is the primary input to control processor, 39J, of SPAM message information; causes matrix switch, 39I, to commence transferring information from EOFS valve, 39F, to control processor, 39J; determines that the information at said SPAM-header memory does not match said cause-retention-of-exec information that is "01"; then, being preprogrammed to collect monitor information, compares the information at said SPAM-Flag-monitor-info memory with particular preprogrammed "0" information. No match results, and receiving said third message does not cause control processor, 39J, to transmit monitor information to buffer/comparator, 14, of signal processor, 200. Automatically, control processor, 39J, completes said collect-monitor-info instructions and continues the conventional preprogrammed instructions of said control processor, 39J.

Automatically control processor, 39J, deletes from memory all information of said third message, but in so doing, control processor, 39J, may perform particular functions that are not performed in deleting from memory information of the first and second messages. Control processor, 39J, has received all command information in said third message but may not have received all padding bits. If the command information in the smallest number of signal words that can contain one instance of header and execution segment information fills a whole number of signal words exactly, the last signal word of said command information may contain no MOVE bits and be followed by one full signal word of padding bits. To ensure that all padding bits of said third message are transferred from EOFS valve, 39F, control processor, 39J, is preprogrammed with particular additional conventional instructions if H+X fills a whole number of signal words exactly. Before information of said third message at said SPAM-header memory is deleted, said particular instructions cause control processor, 39J, to compare said information to particular preprogrammed "10" information. A match results which causes control processor, 39J, under control of said particular instructions, to compare the last signal word of information at said SPAM-input-signal memory to information of one EOFS WORD; to receive one additional signal word from EOFS valve, 39F, if said last word matches said information of one EOFS WORD; then to cease accepting SPAM signal information from EOFS valve, 39F. In this fashion, control processor, 39J, ensures automatically that the next signal word to be transferred by said valve, 39F, will be the first word of the next message embedded in the "Wall Street Week" programming transmission after said third message.

Then, having deleted from memory all information of said third message, automatically control processor, 39J, commences waiting to receive the binary information of a subsequent SPAM header from matrix switch, 39I.

Operating Signal Processor Systems

Example #4

In example #4, the first and second messages are both partially encrypted, and the combining of FIG. 1A and FIG. 1B information occurs only at selected subscriber stations where the information of said messages causes decrypting and collecting of meter information as well as combining. In addition, the information of said messages also causes the collecting of monitor information at selected ones of said selected stations which selected ones are preprogrammed to collect monitor information in the fashion of example #3. In example #4, all appropriate apparatus of the subscriber station of FIG. 3 are preprogrammed to collect monitor information, and buffer/comparator, 14, operates under control of the aforementioned on-board controller, 14A, in fashions elaborated on below.

Example #4 elaborates on the process of monitor information collection in one particular respect. The second message of example #2 causes particular monitor information to be recorded at those particular stations, preprogrammed to collect monitor information, where microcomputers, 205, fail to satisfy either condition of the invoked conditional-overlay-at-205 instructions. Thus the monitor information collected in example #4 documents not only what programming is displayed at the subscriber station monitors, 202M, of the present invention but also the efficiency of the operation of the system of subscriber station microcomputers, 205. Said monitor information also provides statistics on those particular subscriber stations that tune to and process the programming of said "Wall Street Week" program but cannot display FIG. 1C combined medium image information because said particular stations are preprogrammed with decryption key information of J but not of Z. Such statistics enable programming suppliers to evaluate their strategies for marketing and pricing programming.

In example #4, before the first message is embedded at the "Wall Street Week" program originating studio and transmitted, all information of the execution segment, the meter-monitor segment, and the program instruction set in the information segment are encrypted, using standard encryption techniques that encrypt binary information without altering the number of bits in said information. However, the cadence information of said message remains unencrypted. More precisely, the "01" header, any padding bits added at the end of the information segment, and the end of file signal that ends said message remain unencrypted. (The length token and any padding bits at the end of the command information in a message that ends with an end of file signal are not, strictly speaking, cadence information because they provide no information as to the location of the header that follows such a message.) Like the second message of example #2, the first message of example #4 is only partially encrypted in order to enable subscriber stations that lack capacity to decrypt said message to process accurately the cadence information of said message.

In example #4, the encryption of the execution segment of said first message is done in such a fashion that, after encryption, said segment is identical to a particular execution segment that addresses URS signal processors, 200, and instructs said processors, 200, to use a particular decryption key Z (different from the decryption key J that decrypted the second message of example #2) and decrypt the message in which said segment occurs.

Because said first message is encrypted, its meter-monitor segment contains a seventh field: a meter instruction field. Accordingly, the length of said first message, the number of bits in its meter-monitor segment, the information of the meter-monitor format field, and the numeric value of MMS-L is greater in example #4 than in example #1 and example #3.

As described above in "One Combined Medium," before any messages of the "Wall Street Week" programming are transmitted, control invoking instructions are embedded at said program originating studio and transmitted to all subscriber stations. Among said instructions are particular instructions, cited in example #2, that set PC-MicroKey Model 1300 Systems to the "Graphics Off" mode, and also instructions that command URS microcomputers, 205, to clear all RAM (except RAM containing operating system information). In addition (and not described in "One Combined Medium"), said instructions also include particular instructions that cause information of zero to be placed at the aforementioned SPAM-first-precondition and SPAM-second-precondition register memories. Accordingly, at the outset of example #4, no PC-MicroKey 1300 is in "Graphics On" mode; no microcomputer, 205, contains any image information at video RAM; and no "program unit identification code" information exists at the SPAM-first-precondition register memory of any control processor, 39J.

At the outset of example #4, information of "1" is at each of the aforementioned SPAM-Flag-monitor-info, SPAM-Flag-at-secondary-control-level, SPAM-Flag-executing-secondary-command, SPAM-Flag-secondary-level-incomplete, SPAM-Flag-primary-level-2nd-step-incomplete, SPAM-Flag-primary-level-3rd-step-incomplete, SPAM-Flag-secondary-level-2nd-step-incomplete, SPAM-Flag-secondary-level-3rd-step-incomplete, SPAM-Flag-first-condition-failed, SPAM-Flag-second-condition-failed, and SPAM-Flag-do-not-meter register memories, and matrix switch, 39I is configured to transfer SPAM message information from EOFS valve, 39F, to control processor, 39J.

Example #4 begins, like example #3, with divider, 4, transferring the embedded information of said first message to decoder, 203. In the same fashion that applied in example #3, receiving said embedded information at decoder, 203, causes the binary SPAM information of said first message to be received, with error correcting information, at decoder, 203; detected at detector, 34; inputted to controller, 39, at buffer, 39A; checked and corrected, as necessary, at processor, 39B; converted into locally usable binary information at processor, 39D; and processed for end of file signal information at EOFS valve, 39F.

Receiving said first message causes the apparatus of the station of FIG. 3, in the following fashion, to decrypt the encrypted portions of said message; to execute the controlled functions of the decrypted information of said message; to collect meter information and monitor information relating to said message; and in the fashion described more fully below in "Operating Signal Processing Systems . . . Signal Record Transfer," to transfer meter information and monitor information to one or more remote processing stations, causing said stations to process said information.

When EOFS valve, 39F, commences transferring the SPAM message information of said first message, control processor, 39J, automatically accepts the smallest number of signal words that can contain H bits; records the information of said words at SPAM-input-signal register memory; ceases accepting SPAM message information from EOFS valve, 39F; selects information of the first H bits at said SPAM-input-signal memory; records said information at SPAM-header memory; and compares the information recorded at said memory to the aforementioned 11-header-invoking information that is "11". No match results.

Not resulting in a match causes control processor, 39J, first, to execute the aforementioned evaluate-message-content instructions (because the stations of FIG. 3 is preprogrammed to collect monitor information) then to receive and process the execution segment information in said first message. Automatically, control processor, 39J, compares the information at said SPAM-header memory with preprogrammed invoke-monitor-processing information. A match results with particular "01" information. Said match signifies the presence of meter-monitor information (albeit encrypted) in said first message and causes control processor, 39J, to enter "0" at the aforementioned SPAM-Flag-monitor-info register memory. Then control processor, 39J, recommences accepting additional SPAM signal words from EOFS valve, 39F; receives and records said words at said SPAM-input-signal memory, in sequence after the information already there, until the total quantity of SPAM signal words recorded at said memory equals the smallest number of signal words that can contain H+X bits; ceases accepting SPAM signal information from EOFS valve, 39F; selects information of the first X bits of information at said SPAM-input-signal memory immediately after the first H bits; records said information at said SPAM-exec memory, and compares the information at said memory with the aforementioned controlled-function-invoking information. A match results with particular preprogrammed this-message-addressed-to-200 information.

In examples #1 and #2, whenever controller, 39, determined matches with either this-message-addressed-to-205 information or this-message-addressed-to-200 information, controller, 39, transferred the entire message containing the identified information to the addressed apparatus. But in the preferred embodiment, controller, 39, may be preprogrammed to transfer, by control information transmission means, only particular information of any given message that contains this-message-addressed-to-200 information. The first and second messages of example #4 illustrate instances of such transferring.

Said match with this-message-addressed-to-200 information causes control processor, 39J, automatically to execute particular preprogrammed transfer-header-and-exec-seg-info-to-200 instructions. Automatically, said instructions cause control processor, 39J, to transfer to controller, 20, of signal processor, 200, via control information transmission means, an interrupt signal that interrupts the operation of said controller, 20, in a fashion well known in the art, then particular process-this-message information then particular at-39J information that identifies control processor, 39J, as the source of the transmission of said process-this-message information then information of the header and execution segment of said first message (that is, information of the information recorded at said SPAM-header and SPAM-exec memories).

Receiving said interrupt signal and information causes controller, 20, to compare the information of said execution segment to the aforementioned controlled-function-invoking-@200 information and determine a match with particular decrypt-with-key-Z information that instructs controller, 20, to cause the decryption of the received binary signal information of said first message with decryption key Z.

(At subscriber stations whose URS signal processors, 200, are not preprogrammed with information of said key Z, the information of said execution segment fails to match any controlled-function-invoking-@200 information. Automatically, failing to match causes the controllers, 20, of said stations to cause the control processors, 39J, of said stations to discard all information of said first message by causing matrix switch, 39I, to transfer all information inputted from EOFS valve, 39F, to its null output; then causing EOFS valve, 39F, to transfer all received SPAM information until an end of file signal is detected; then, after said signal is detected, causing said valve, 39F, to discard its recorded information of said end of file signal; causing matrix switch, 39I, to commence transferring all information inputted from EOFS valve, 39F, to control processor, 39J; and, itself, deleting all recorded information of said message and commencing to wait for inputted information of a SPAM header.)

However, the subscriber station of FIG. 3 is preprogrammed with all information needed to decrypt said first message. The aforementioned at-39J information and match with decrypt-with-key-Z information cause controller, 20, to execute particular preprogrammed decrypt-with-Z-at-39K instructions. Said instructions cause controller, 20, to select particular preprogrammed key information of Z and transfer said key information to decryptor, 39K, of controller, 39. Then said decrypt-with-Z-at-39K instructions cause controller, 20, to compare said information of the header transferred from control processor, 39J, to particular preprogrammed header-identification-@200 information and to determine that said information of the header matches particular "01" header information. Said match causes controller, 20, automatically to transmit a particular decrypt-in-a-01-or-11-header-message-fashion instruction to decryptor, 39K.

Receiving said key information and said last named instruction causes decryptor, 39K, to commence using said key information as its key for decryption and decrypting inputted information in a predetermined 01-or-11-header-message fashion that is described more fully below.

Then said decrypt-with-Z-at-39K instructions cause controller, 20, to transmit to control processor, 39J, a particular decrypt-process-and-meter-a-01-or-11-header-message instruction and particular decryption mark information of key Z that identifies Z as the decryption key. Receiving said instruction and mark information causes control processor, 39J, to record said mark information at the aforementioned SPAM-decryption-mark register memory, to enter "1" at the aforementioned SPAM-Flag-monitor-info register memory because any meter-monitor information in the SPAM message being processed is encrypted, then to execute particular preprogrammed decrypt-process-and-meter-current-01-or-11-header-message instructions.

Said instructions cause control processor, 39J, first, to identify EOFS valve, 39F, in a predetermined fashion, as the primary source of input SPAM message information; to place particular from-39F information at the aforementioned SPAM-primary-input-source register memory; and to place information of a particular reentry-address at the aforementioned SPAM-address-of-next-instruction-upon-primary-interrupt register memory which reentry-address specifies the location of the next decrypt-process-and-meter-current-01-or-11-header-message instruction to be executed when interrupt information of end of file signal detected information is next received by control processor, 39J, from said primary source of input SPAM message information, EOFS valve, 39F.

Then said instructions cause control processor, 39J, to transfer to decryptor, 39K, the SPAM message associated with the particular information at the SPAM-header memory of control processor, 39J. Automatically, said instructions cause control processor, 39J, to cause matrix switch, 39I, to cease transferring information from EOFS valve, 39F, to control processor, 39J, and commence transferring information from control processor, 39J, to decryptor, 39K. Then said instructions cause control processor, 39J, to transfer all SPAM message information recorded at said SPAM-input-signal memory of control processor, 39J. Said information is all the information of said first message that EOFS valve, 39F, has already transferred. Automatically, decryptor, 39K, commences receiving SPAM signal information. Then said instructions cause control processor, 39J, to cause matrix switch, 39I, to cease transferring information from control processor, 39J, to decryptor, 39K, and to commence transferring SPAM message information from EOFS valve, 39F, to decryptor, 39K. As decryptor, 39K, then accepts transferred information from matrix switch, 39I, automatically EOFS valve, 39F, commences transferring SPAM signal information, beginning with the first signal word of said first message that is immediately after the information of said first message that EOFS valve, 39F, has already transferred. In this fashion, control processor, 39J, causes all information of said first message to be transferred to decryptor, 39K.

Then said decrypt-process-and-meter-current-01-or-11-header-message instructions cause control processor, 39J, to prepare to receive the decrypted information of said first message and to execute, at a secondary control level under primary control of said decrypt-process-and-meter-current-01-or-11-header-message instructions, the controlled functions invoked by said decrypted information. Under control of said decrypt-process-and-meter-current-01-or-11-header-message instructions, control processor, 39J, places information of a particular reentry-address at the aforementioned SPAM-next-primary-instruction-address register memory which reentry-address specifies the location of the next decrypt-process-and-meter-current-01-or-11-header-message instruction to be executed when control of control processor, 39J, reverts from the secondary control level to the primary control level; places information of "0" at the aforementioned SPAM-Flag-primary-level-2nd-step-incomplete register memory and, separately, at SPAM-Flag-primary-level-3rd-step-incomplete register memory which information signifies that specific primary level functions have not been completed; places information of "0" at the aforementioned SPAM-Flag-secondary-level-incomplete register memory that is normally "1" which information signifies that secondary control level functions have not been completed; compares the information at said SPAM-header memory to cause-retention-of-exec information that is "01" and places information of said information at SPAM-exec register memory at said SPAM-last-01-header-exec register memory because a match results; compares the information at said SPAM-Flag-monitor-info memory with particular preprogrammed "0" information and skips all steps of collecting monitor information because no match results; causes all apparatus of control processor, 39J, to delete from memory all information of said first message except information at said SPAM-last-01-header-exec, SPAM-decryption-mark, SPAM-Flag-at-secondary-control-level, SPAM-Flag-primary-level-2nd-step-incomplete, SPAM-Flag-primary-level-3rd-step-incomplete, SPAM-primary-input-source, SPAM-next-primary-instruction-address register memories; places particular from-39H information at the aforementioned SPAM-secondary-input-source register memory that identifies EOFS valve, 39H, as the secondary level source of input SPAM message information; causes matrix switch, 39I, to commence transferring SPAM message information from EOFS valve, 39H to control processor, 39J; places information of "0" at the aforementioned SPAM-Flag-executing-secondary-command register memory which information signifies that information placed subsequently at SPAM-exec register memory is secondary command level information; places information of "0" at the aforementioned SPAM-Flag-at-secondary-level register memory that is normally "1" which information signifies that control functions are being executed at said secondary level; and commences waiting to receive information of a subsequent SPAM header from said switch, 39I.

As decryptor, 39K, receives SPAM message information from matrix switch, 39I, decryptor, 39K, decrypts said information, using decryption key Z, in the aforementioned 01-or-11-header-message fashion and transfers the decrypted information to buffer, 39G. The aforementioned decrypt-in-a-01-or-11-header-message-fashion instruction causes decryptor, 39K, to transfer the first H bits received from matrix switch, 39I, without decrypting or altering said bits in any fashion then to decrypt and transfer all information following said first H bits. In this fashion, the cadence information of the header in said first message, which is not encrypted, is transferred by decryptor, 39K, to buffer, 39G, without alteration.

As buffer, 39G, receives said decrypted information, buffer, 39G, buffers said information and transfers it to EOFS valve, 39H. EOFS valve, 39H, checks said information for end of file signal information, in its preprogrammed end of file signal detection fashion, and transfers information that is not end of file signal, via matrix switch, 39I, to control processor, 39J, as fast as control processor, 39J, is prepared to receive said information.

Having been decrypted, said information is identical to the binary information of the first message of example #3 (except that the meter-monitor information contains the aforementioned meter instruction information that is not in example #3 and the information of the meter-monitor format field reflects the presence of said instruction information). Accordingly, receiving the decrypted information of the first message of example #4 from EOFS valve, 39H, causes control processor, 39J, to function, at the aforementioned secondary control level, in fashions that are identical (except as concerns the processing of the meter-monitor information) to the fashions invoked, at the primary control level, by receiving the information of the first message of example #3 from EOFS valve, 39F.

When EOFS valve, 39H, commences transferring the decrypted SPAM information of the first message of example #4, control processor, 39J, receives the smallest number of signal words that can contain H bits, records information said words in sequence at SPAM-input-signal memory, selects information of the first H bits at said memory, records said information at SPAM-header memory, and determines that the information at said memory does not match the aforementioned 11-header-invoking information.

Not resulting in a match causes control processor, 39J, automatically to compare the information at said SPAM-header memory with the aforementioned invoke-monitor-processing information, determine a match, and enter "0" at SPAM-Flag-monitor-info register memory.

Automatically, control processor, 39J, then receives additional SPAM signal words; records information of said words at said SPAM-input-signal memory in sequence immediately following the signal word information already recorded at said memory until the total quantity of SPAM signal words recorded at said memory is the smallest number of signal words that can contain H+X bits; selects information of the first X bits of information at said memory immediately after the first H bits, records said selected information at SPAM-exec memory, compares the information at said last named memory with controlled-function-invoking information, and determines a match with the aforementioned execute-at-205 information.

Said match causes control processor, 39J, to execute the aforementioned load-run-and-code instructions. Said instructions cause control processor, 39J, to determine that the information at said SPAM-Flag-at-secondary-level register memory is "0" which causes said processor, 39J, to place "0" at the aforementioned SPAM-Flag-secondary-level-2nd-step-incomplete register memory and, separately, at SPAM-Flag-secondary-level-3rd-step-incomplete register memory (rather than SPAM-Flag-primary-level-2nd-step-incomplete and SPAM-Flag-primary-level-3rd-step-incomplete memories) and to place information of a particular reentry-address at the aforementioned SPAM-address-of-next-instruction-upon-secondary-interrupt register memory (rather than SPAM-address-of-next-instruction-upon-primary-interrupt memory). Then said instructions cause control processor, 39J, to compare the information at said SPAM-header memory with header-identification information and determine a match with "01" information.

Said match causes control processor, 39J, to receive all remaining command information and padding bits in said first message in the fashion that applies to a SPAM message that contains meter-monitor information. Automatically, control processor, 39J, receives and processes decrypted length token information. Automatically, control processor, 39J, receives and records additional SPAM signal words at said SPAM-input-signal memory until the quantity of SPAM words recorded at said memory is the smallest number of words that can contain H+X+L bits, selects information of the first L bits of information at said memory immediately after the first H+X bits, records said information at SPAM-length-info memory, determines that the information at said last named memory matches Z-token information, selects z-bits information associated with said Z-token information, records said z-bits information at said SPAM-length-info memory (thereby overwriting and obliterating the information previously at said memory), and processes the information at said memory as the numeric value of MMS-L. Automatically, control processor, 39J, adds H+X+L to the information of z-bits at said memory, divides the information of the resulting sum by the number of bits in one signal word, places a "0" at particular SPAM-Flag-working register memory if the information of the resulting quotient is a whole number or "1" at said SPAM-Flag-working memory if it is not. Automatically, control processor, 39J, determines a particular number of signal words to receive, commences receiving additional SPAM signal words, and records said words in sequence at said SPAM-input-signal memory immediately following the last SPAM signal word previously recorded at said memory until the total quantity of SPAM signal words recorded at said memory equals the number at said working register memory. Then, if the information at said SPAM-Flag-working register memory is "0", control processor, 39J, ceases accepting SPAM signal information. Or, if the information at said SPAM-Flag-working register memory is not "0", control processor, 39J, receives one additional signal word, compares the information of said word to information of one EOFS WORD, records said word at said SPAM-input-signal memory immediately following the last SPAM signal word recorded at said memory, receives one more SPAM signal word and records the information of said word at said SPAM-input-signal memory immediately following the last SPAM signal word recorded at said memory if said one additional signal word has matched said EOFS WORD information, and ceases accepting SPAM signal information.

When control processor, 39J, ceases accepting SPAM signal information, said load-run-and-code instructions cause control processor, 39J, to commence loading information at the main RAM of microcomputer, 205. Automatically, control processor, 39J, causes matrix switch, 39I, to cease transferring information from EOFS valve, 39H, to control processor, 39J, and commence transferring information from control processor, 39J, to the CPU of microcomputer, 205; instructs said CPU to commence receiving information from matrix switch, 39I, and loading said information at particular main RAM; and causes matrix switch, 39I, to cease transferring information from control processor, 39J, to said CPU and commence transferring information from EOFS valve, 39H, to said CPU. Automatically, microcomputer, 205, commences receiving the information, beginning with the first signal word at EOFS valve, 39H, which is the decrypted information of the first word of the program instruction set in said first message. Automatically, microcomputer, 205, loads the received information at particular main RAM in a fashion well known in the art.

Then said load-run-and-code instructions cause control processor, 39J, to execute the code portion of said instructions. In the same fashion that that applied in example #3, the instructions of said portion cause control processor, 39J, to determine that said first message contains meter-monitor information, to locate the "program unit identification code" information in the information at said SPAM-input-signal memory, and to record information of said "code" information at SPAM-first-precondition register memory. Said instructions cause control processor, 39J, to select information of bits of the meter-monitor format field at said SPAM-input-signal memory, to record said information at SPAM-mm-format memory, to compare the information at said memory with the aforementioned format-specification information, to determine a match with C-format information, and to execute particular preprogrammed process-C-format instructions. Automatically, said last named instructions cause control processor, 39J, to place a particular C-offset-address number at SPAM-mm-format memory that identifies the address/location of the first bit of C format information. Then said instructions of the code portion cause control processor, 39J, to execute the aforementioned said locate-program-unit instructions; to select binary information of particular bit locations at said SPAM-input-signal memory, using the information of said C-offset-address number; and to place said selected information at said SPAM-first-precondition memory. Finally, said instructions of the code portion cause control processor, 39J, to determine, in a predetermined fashion, that control processor, 39J, is operating at secondary control level and place "1" at SPAM-Flag-secondary-level-3rd-step-incomplete register memory (rather than SPAM-Flag-primary-level-3rd-step-incomplete memory) signifying the completion of the code step executed by said load-run-and-code instructions.

Next said load-run-and-code instructions control processor, 39J, to determine that the information at said SPAM-Flag-at-secondary-level register memory is "0" which signifies that the run portion of said instructions remain uncompleted and which causes control processor, 39J, in a predetermined fashion, to commence waiting for interrupt information of the end of file signal from the EOFS valve that is inputting SPAM signal information to control processor, 39J, which is EOFS valve, 39H.

Whenever the control processor, 39J, of the station of FIG. 3 is instructed to commence waiting, the conventional instructions that control said processor, 39J, cause said processor, 39J, to execute particular steps before actually commencing to wait. Example #3 showed one such step: execution of particular collect-monitor-info instructions. In the preferred embodiment, said conventional instructions cause control processor, 39J, to execute particular primary-level-? instructions before executing said collect-monitor-info instructions. Said primary-level-? instructions cause control processor, 39J, to compare the information at the aforementioned SPAM-Flag-at-secondary-control-level memory with particular preprogrammed "0" information. A match results which means that control processor, 39J, has been instructed to wait at a secondary control level and instructions may exist at the primary control level that control processor, 39J, should execute before commencing to wait. Accordingly, said match causes control processor, 39J, to place information of a particular reentry-address at the aforementioned SPAM-next-secondary-instruction-address register memory which reentry-address is the location of the next instruction to be executed when the control of control processor, 39J, reverts from primary control level instructions to the secondary level instructions; to place "1" at the aforementioned SPAM-Flag-at-secondary-control-level memory signifying that control processor, 39J, is not operating at the secondary control level; and to commence executing control instructions beginning with that instruction whose particular address/location is the address/location of the information at the aforementioned SPAM-next-primary-instruction-address memory.

Automatically, the particular ones of said decrypt-process-and-meter-current-01-or-11-header-message instructions that begin at said address/location cause control processor, 39J, to execute the meter portion of said instructions. Under control of the instructions of said portion, control processor, 39J, compares the information at the aforementioned SPAM-decryption-mark register memory to particular preprogrammed information of zero. No match results. Not resulting in a match signifies the presence of decryption mark information and causes control processor, 39J, under control said instructions, to cause matrix switch, 39I, to commence transferring information from control processor, 39J, to the buffer/comparator, 14, of signal processor, 200; then to transfer header information that identifies a transmission of meter information then the aforementioned decoder-203 source mark information then information of the decryption mark of key Z information recorded at SPAM-decryption-mark register memory then all of the received binary information of said first message that is recorded at said SPAM-input-signal memory; then to cause matrix switch, 39I, to cease transferring information from control processor, 39J, to said buffer/comparator, 14. (Said received information is complete information of the first combining synch command of example #4, and said information that is transmitted to buffer/comparator, 14, is called, hereinafter, the "1st meter-monitor information (#4).") Then the instructions of said portion cause control processor, 39J, to enter "1" at said SPAM-Flag-monitor-info memory because the information of said 1st meter-monitor information (#4) is monitor information as well as meter information, to enter "1" at the aforementioned SPAM-Flag-primary-level-3rd-step-incomplete register memory signifying the completion of the meter step executed by said decrypt-process-and-meter-current-01-or-11-header-message instructions, and to commence waiting for interrupt information of an end of file signal.

In due course, EOFS valve, 39F, receives the last signal word of the information segment of said first message, which is the last signal word of said program instruction set. Receiving said word causes EOFS valve, 39F, to transfer said word, via matrix switch, 39I, to decryptor, 39K, which causes decryptor, 39K, to decrypt the information of said word and transfer the decrypted information of said word, via buffer, 39G, to EOFS valve, 39H. If the decrypted information of said word contains MOVE bit information, receiving said information causes EOFS valve, 39H, to transfer said information, via matrix switch, 39I, to the CPU of microcomputer, 205, which causes microcomputer, 205, to load said information at particular main RAM.

Then said valve, 39F, commences receiving information of the eleven EOFS WORDs that constitute the end of file signal at the end of said first message.

Receiving the first EOFS WORD of said eleven causes EOFS valve, 39F, to cease transferring SPAM message information which causes decryptor, 39K, to cease decrypting and causes microcomputer, 205, to cease loading information at main RAM if the decrypted information of the last signal word of the information segment of said first message contains MOVE bit information (which MOVE bit information causes EOFS valve, 39H, automatically to transfer inputted information of said word).

Subsequently, in the fashion described in the following twelve paragraphs, receiving the eleventh and last EOFS WORD of said end of file signal causes the apparatus of the subscriber station of FIG. 3 to load decrypted information of the last signal word of the information segment of said first message at main RAM if said decrypted information contains no MOVE bit information and cease loading; to terminate the process of decrypting at decryptor, 39K; to execute the program instruction set information loaded at said main RAM as a machine language program, thereby causing the events described in the thirteenth paragraph hereinafter (which begins, "As described in "One Combined Medium" above, running . . . "); and to commence waiting to receive from EOFS valve, 39F, the header information of a subsequent SPAM message.

Receiving the eleventh and last EOFS WORD of said end of file signal at EOFS valve, 39F, causes said valve, 39F, to transmit an interrupt signal of EOFS-signal-detected information to control processor, 39J, and to commence waiting for a control instruction from said processor, 39J.

Receiving said interrupt signal causes control processor, 39J, to determine, in a predetermined fashion, a match between information that identifies the EOFS valve that transmitted said signal and the aforementioned from-39F information at the aforementioned SPAM-primary-input-source register memory. Said match causes control processor, 39J, automatically to execute that particular portion of said decrypt-process-and-meter-current-01-or-11-header-message instructions that begins with the instruction that is located at the particular reentry-address of the reentry-address information at the aforementioned SPAM-address-of-next-instruction-upon-primary-interrupt register memory. Automatically, the instructions of said portion cause control processor, 39J, to transmit to controller, 20, of signal processor, 200, via control information transmission means, a particular preprogrammed first-EOFS-signal-detected interrupt signal then particular primary-end-of-file-signal-detected information and one instance of the aforementioned at-39J information. Receiving said interrupt signal of EOFS-signal-detected information causes control processor, 39J, then to cause matrix switch, 39I, to cease transferring information from EOFS valve, 39F, to decryptor, 39K.

Receiving first-EOFS-signal-detected said interrupt signal and information causes controller, 20, to execute particular ones of the aforementioned decrypt-with-Z-at-39K and decrypt-a-01-or-11-header-message instructions. Automatically, said ones cause controller, 20, to transmit a particular interrogate-message-end instruction to decryptor, 39K. Said instruction causes decryptor, 39K, in a predetermined fashion and after transferring the aforementioned decrypted information of the last signal word of the information segment of said first message, to transmit particular decryption-complete information to controller, 20, which information includes particular last-word information that is the binary image of said decrypted information of the last signal word.

Receiving said decryption-complete information causes controller, 20, to execute particular preprogrammed end-01-or-11-message-decryption instructions that cause controller, 20, to compare said last-word information to preprogrammed information of one EOFS WORD. Resulting in a match, under control of said instructions, causes controller, 20, automatically to transmit a particular transmit-padding-bits instruction to decryptor, 39K, that decryptor, 39K, has capacity to respond to in a predetermined fashion, which instruction causes decryptor, 39K, to transfer one signal word of padding bits to buffer, 39G, causing said buffer, 39G, automatically to input said word of padding bits to EOFS valve, 39H. (If the decrypted information of the last signal word of the information segment of said first message contains no MOVE bit information—in other words, if said word is an EOFS WORD—receiving said information causes EOFS valve, 39H, to transfer previously inputted information of said last word, via matrix switch, 39I, to microcomputer, 205, which causes microcomputer, 205, to load said information at particular main RAM.) Then said end-01-or-11-message-decryption instructions cause controller, 20, to cause decryptor, 39K, to discard said key information of decryption key Z, to cease decrypting inputted information and to commence transferring all inputted information to buffer, 39G, without alteration. Next said instructions cause controller, 20, to transmit a particular preprogrammed transmit-EOF-Signal-and-continue instruction to control processor, 39J. In so doing, controller, 20, completes said end-01-or-11-message-decryption instructions, said decrypt-a-01-or-11-header-message instructions and said decrypt-with-Z-at-39K instructions and commences processing in the conventional fashion.

Receiving said transmit-EOF-Signal-and-continue instruction causes control processor, 39J, in a predetermined fashion, to transmit the aforementioned transmit-and-wait instruction to EOFS valve, 39F, then to execute particular instructions of the process portion of said decrypt-process-and-meter-current-01-or-11-header-message instructions. Automatically said instructions cause control processor, 39J, to place "0" at the aforementioned SPAM-Flag-at-secondary-control-level memory signifying that control processor, 39J, is operating at the secondary control level and to commence executing control instructions beginning with that instruction whose particular address/location is the address/location of the information at the aforementioned SPAM-next-secondary-instruction-address memory. Automatically, control processor, 39J, executes particular instructions prior to commencing to wait, compares the information at SPAM-Flag-monitor-info memory with particular preprogrammed "0" information, and no match results. Not resulting in a match causes control processor, 39J, automatically to skip collect-monitor-info instructions and commence waiting for interrupt information of the end of file signal.

Receiving said transmit-and-wait instruction causes EOFS valve, 39F, to transfer sequentially eleven instances of EOFS WORD information—that is, one complete end of file signal—via switch, 39I, to decryptor, 39K; to set the information at the EOFS WORD Counter of said valve, 39F, to zero; to transmit the aforementioned complete-and-waiting information to said control processor, 39J, as an interrupt signal; and to commence waiting for a control instruction from control processor, 39J, before processing next inputted information.

Receiving said eleven instances of EOFS WORD information causes decryptor, 39K, to transfer said information, without alteration, via buffer, 39G, to EOFS valve, 39H.

Receiving said information—more precisely, receiving the eleventh instance of an EOFS WORD in said information—causes EOFS valve, 39H, to transmit an interrupt signal of EOFS-signal-detected information to control processor, 39J, and to commence waiting for a control instruction from said processor, 39J.

Receiving said interrupt signal causes control processor, 39J, to determine, in a predetermined fashion, that the EOFS valve that transmitted said signal is the valve identified by the aforementioned from-39H information at the aforementioned SPAM-secondary-input-source memory. Said determining causes control processor, 39J, automatically to jump to and execute that particular portion of said load-run-and-code instructions that begins with the instruction that is located at the particular reentry-address of the reentry-address information at the aforementioned SPAM-address-of-next-instruction-upon-secondary-interrupt memory. Said particular portion is the run portion of said load-run-and-code instructions. Automatically, the instructions of said portion cause control processor, 39J, to cause matrix switch, 39I, to cease transferring information from EOFS valve, 39H, to the CPU of microcomputer, 205, and to commence transferring information from control processor, 39J, to said CPU; to transmit a control instruction to said CPU that causes microcomputer, 205, to cease loading information at said main RAM and execute the information so loaded as so-called "machine executable code" of one so-called "job"; to cause matrix switch, 39I, to cease transferring information from control processor, 39J, to said CPU; then to transmit the aforementioned discard-and-wait instruction, via control transmission means, to EOFS valve, 39H, (causing said valve, 39H, to set the information at said EOFS WORD Counter to "00000000", to transmit the aforementioned complete-and-waiting information to control processor, 39J, as a second interrupt signal, then to commence waiting for a further control instruction from control processor, 39J); and finally, to determine that the information at the aforementioned SPAM-Flag-at-secondary-control-level memory matches particular preprogrammed "0" information and, accordingly, to place "1" at the aforementioned SPAM-Flag-secondary-level-2nd-step-incomplete memory which information indicates that control processor, 39J, has completed the instructions of said run portion. In so doing, control processor, 39J, completes the instructions of said run portion.

Automatically said load-run-and-code instructions cause control processor, 39J, to compare the information at the aforementioned SPAM-Flag-secondary-level-3rd-step-incomplete memory with particular preprogrammed information that is "1". No match results which signifies that control processor, 39J, has already completed the code portion of said load-run-and-code instructions. Not resulting in a match causes control processor, 39J, to complete said load-run-and-code instructions, to place "1" at the aforementioned SPAM-Flag-secondary-level-incomplete register memory signifying completion of the secondary level control functions, to place "1" at the aforementioned SPAM-Flag-at-secondary-control-level register memory, and to commence executing control instructions beginning with that instruction whose particular address/location is the address/location of the information at the aforementioned SPAM-next-primary-instruction-address memory.

Automatically, the particular instructions that begin at said address/location cause control processor, 39J, to execute particular end-process-portion-? instructions of said decrypt-process-and-meter-current-01-or-11-header-message instructions. Under control of said end-process-portion-? instructions, control processor, 39J, determines that the information at said SPAM-Flag-secondary-level-incomplete register memory matches a particular preprogrammed "1"; places "1" at the aforementioned SPAM-Flag-primary-level-2nd-step-incomplete register memory, signifying completion of the process portion of said decrypt-process-and-meter-current-01-or-11-header-message instructions; determines that the information at the aforementioned SPAM-Flag-primary-level-3rd-step-incomplete register memory matches a particular preprogrammed "1", signifying the completion of the meter portion of said decrypt-process-and-meter-current-01-or-11-header-message instructions; and completes execution of said decrypt-process-and-meter-current-01-or-11-header-message instructions.

Completing the controlled functions of said first message causes control processor, 39J, automatically to prepare to receive the next SPAM message. Automatically, control processor, 39J, compares the information at said SPAM-header memory to particular preprogrammed cause-retention-of-exec information that is "01". A match results which causes control processor, 39J, to compare the information at the aforementioned SPAM-Flag-executing-secondary-command register memory to particular preprogrammed information that is "0". A match results which signifies that control processor, 39J, is executing control functions invoked by information of a secondary level execution segment. Accordingly, said match causes control processor, 39J to place information of the information at said SPAM-exec memory at the aforementioned SPAM-last-secondary-01-header-exec register memory (rather than at SPAM-last-01-header-exec register memory). Being preprogrammed to collect monitor information, control processor, 39J, automatically compares the information at said SPAM-Flag-monitor-info memory with particular preprogrammed "0" information. No match results which indicates that control processor, 39J, has transferred monitor information in respect to said first message. Then, automatically, control processor, 39J, causes all apparatus of control processor, 39J, to delete from memory all information of said first message except information at said SPAM-first-precondition, SPAM-last-01-header-exec, and SPAM-last-secondary-01-header-exec memories. Finally, control processor, 39J, causes EOFS valves, 39F and 39H, to commence processing inputted signal words, in their preprogrammed detecting fashions, and outputting information to matrix switch, 39I; causes matrix switch, 39I, to commence transferring information from the EOFS valve identified by the information at the aforementioned SPAM-primary-input-source register memory, which is EOFS valve, 39F, to control processor, 39J; and commences waiting to receive information of a subsequent SPAM header from matrix switch, 39I.

As described in "One Combined Medium" above, running said program instruction set causes microcomputer, 205, (and URS microcomputers, 205, at other subscriber stations) to place appropriate FIG. 1A image information at particular video RAM then to transfer particular-number-of-overlay-completed information and instructions to control processor, 39J. Receiving said information and instructions causes control processor, 39J, to place the number "00000001" at the aforementioned SPAM-second-precondition register memory, signifying that said image information represents the first overlay of its associated video program.

Receiving said 1st meter & monitor information (#4) causes buffer/comparator, 14, automatically to compare the information, in said 1st information, of the header information that identifies a transmission of meter information to particular preprogrammed header-identification-@14 information. A match results with particular meter-identification information which causes buffer/comparator, 14, to select information of particular predetermined bit locations (which locations contain the information of the meter instruction field of said 1st meter & monitor information (#4)) and to compare said selected information to preprogrammed metering-instruction-comparison information. (Matches with particular metering-instruction-comparison information invoke simple metering processes that buffer/comparator, 14, has capacity to perform by itself). No match results (which signifies that the meter processing caused by the information said field is too complex to occur under control of buffer/comparator, 14, alone). Not resulting in a match causes buffer/comparator, 14, automatically to transmit to controller, 20, particular preprogrammed instruct-to-meter information then said selected information (which the meter instruction information of said first message).

Receiving said information causes controller, 20, to compare said meter instruction information to preprogrammed instruct-to-meter-@20 information and to determine that said information matches particular 1-2-3-meter information that invokes three particular sets of instructions preprogrammed at controller, 20. The first set initiates assembly at buffer/comparator, 14, of a first particular meter record that is based on the information, in one meter-monitor field of the first message, of the program unit information of said first command. Assembly of said record enables a particular remote metering station to account for the use of the information of said "Wall Street Week" program and bill subscribers who use said information. The second set causes assembly at buffer/comparator, 14, of a second particular meter record that is based on the information, in a second meter-monitor field, of the supplier of the program instruction set that follows said first command. The capacity for a given command to cause the assembly of more than one record enables separate ownership properties that are used jointly in a given instance of SPAM information to be accounted for separately. For example, the copyright owner of said "Wall Street Week" program (who owns the FIG. 1B image) and said supplier (whose information generates the FIG. 1A image) may be different parties. Said second record enables said remote station (or alternatively, a separate remote metering station) to account for use of said program set separately from the accounting of said "Wall Street Week" program and to charge subscribers separately. The third set causes the recording at recorder, 16, of said second meter record.

Said match causes controller, 20, to execute said instructions. Under control of said first set, controller, 20, initiates assembly of said first meter record by selecting and placing at particular record locations at buffer/comparator, 14, particular record format information, then program unit information from a particular meter-monitor field of said 1st meter & monitor information (#4), origin of transmission information from a second field, date and time of transmission information from a third field, decryption key information from the decryption mark of said 1st meter & monitor information (#4), and finally date and time of processing information from clock, 18.

In its preprogrammed fashion, when said first specified set is completed, controller, 20, executes said second specified set which causes controller, 20, to assemble said second record. Under control of said second set, controller, 20, places at a particular second record locations at buffer/comparator, 14, particular record format information, then information of the supplier of said program instruction set from a particular meter-monitor field of 1st meter & monitor information (#4), program unit information from a second field, origin of transmission information from a third field, date and time of transmission information from a fourth field, and finally date and time of processing information from clock, 18.

When said second set is completed, controller, 20, executes said third specified set which causes controller, 20, to cause buffer/comparator, 14, to transfer said second meter record to recorder, 16, in a predetermined fashion then discard all information of said record from its memory and to cause recorder, 16, to process and record said transferred meter record in its preprogrammed fashion.

Buffer/comparator, 14, and controller, 20, are preprogrammed to process monitor information, and completing the metering functions invoked by said 1-2-3-meter information causes controller, 20, to cause buffer/comparator, 14, to execute its preprogrammed automatic monitoring functions. These functions proceed in the same fashion that applied to the 1st monitor information (#3). Buffer/comparator, 14, determines that the source mark of said 1st meter & monitor information (#4) matches source information associated with the monitor record of the prior programming displayed at monitor, 202M, but that the program unit information of said 1st meter & monitor information (#4) does not match the program unit information of said monitor record. Accordingly, buffer/comparator, 14, causes the apparatus of signal processor, 200, to record said monitor record at recorder, 16, and to replace said monitor record at buffer/comparator, 14, with a new monitor record based on the information of the 1st meter & monitor information (#4). When buffer/comparator, 14, completes said monitoring functions, buffer/comparator, 14, deletes all unrecorded information of said 1st meter & monitor information (#4) and commences waiting for the next instance of inputted information.

The content of the 1st meter & monitor information (#4) causes controller, 20, to organize the information of said new monitor record in a particular fashion that differs, in one respect, from the new monitor record generated in the third example by the 1st monitor information (#3). Unlike the first combining synch command in the third example, the first combining synch command in the fourth example must be decrypted, and the 1st meter & monitor information (#4) includes a decryption mark. Thus the new monitor record generated by the 1st meter & monitor information (#4) includes decryption key information, not included in the new monitor record generated by the 1st monitor information (#3), and record format field information that reflects the presence of said decryption field information.

Operating S. P. Systems

Example #4

Second Message

With one exception, the information of the second message of example #4 is identical to the information of the second message of example #2. The meter instruction information the second message of example #4 instruct subscriber station apparatus to perform certain meter operations, described more fully below, that are not performed in example #2. In all other respects the second message of example #4 is identical to the second message of example #2 and is encrypted, embedded, and transmitted at the "Wall Street Week" program originating studio just as in example #2.

But a significant difference exists between examples #2 and #4. Unlike example #2 wherein FIG. 1A image information exists at all URS microcomputers, 205, FIG. 1A image information exists in example #4 only at those subscriber stations where the encrypted information of the first message has been decrypted, causing the apparatus of said stations to load and execute program instruction set information at the microcomputers, 205. Only at said stations does "program unit identification code" information of said "Wall Street Week" program exist at the SPAM-first-precondition register memories of the control processors, 39J. Only at said subscriber stations can the second combining synch command cause the display of FIG. 1C information.

Receiving said second message causes the apparatus of the station of FIG. 3 (and other stations that are configured and preprogrammed like the station of FIG. 3), in the following fashion, to decrypt the encrypted portions of said message, to execute the controlled functions of the decrypted information of said message; and to record meter information and monitor information relating to said message. (Simultaneously, receiving said message causes other stations that are configured and/or preprogrammed differently from the station of FIG. 3 to respond, automatically, in fashions that differ from the fashion of the station of FIG. 3 in ways that are described below parenthetically.)

When divider, 4, commences transferring the embedded information of said second message to decoder, 203, the binary SPAM information of said message is received at decoder, 203; detected at detector, 34; checked and corrected, as necessary, at processor, 39B; converted into locally usable binary information at processor, 39D; and processed for end of file signal information at EOFS valve, 39F. Receiving the SPAM message information of said message causes EOFS valve, 39F, to transfer said information, via matrix switch, 39I, to control processor, 39J, as fast as control processor, 39J, is prepared to receive said information.

Receiving said information causes control processor, 39J, to record the smallest number of signal words that can contain H bits at SPAM-input-signal memory; to select information of the first H bits at said memory; to record said information at SPAM-header memory; to compare the information at said SPAM-header memory with the aforementioned invoke-monitor-processing information, determine a match with particular preprogrammed "00" information, and enter "0" at the aforementioned SPAM-Flag-monitor-info register memory; to record additional SPAM signal words at said SPAM-input-signal memory until the total quantity of SPAM signal words recorded at said memory equals the smallest number of signal words that can contain H+X bits; to record information of the first X bits of information at said SPAM-input-signal memory immediately after the first H bits at said SPAM-exec memory; to compare the information at said memory with the aforementioned controlled-function-invoking information and determine a match with particular preprogrammed this-message-addressed-to-200 information; and to execute the aforementioned transfer-header-and-exec-seg-info-to-200 instructions.

Executing said instructions causes control processor, 39J, to transfer to controller, 20, of signal processor, 200, via control information transmission means, an interrupt signal, the aforementioned process-this-message information and at-39J information, and information of the header and execution segment of said second message.

Receiving said interrupt signal and information causes controller, 20, in a predetermined fashion, to cease a processing task that is unrelated to the processing of said second message; to compare said information of the execution segment to the aforementioned controlled-function-invoking-@200 information and determine a match with particular decrypt-with-key-J information; to execute particular preprogrammed decrypt-with-J-at-39K instructions; to select and transfer key information of J to decryptor, 39K; to compare said information of the header to the aforementioned header-identification-@200 information and determine a match with particular "00" header information; to execute particular preprogrammed decrypt-a-00-header-message-at-39K instructions; to transmit a particular preprogrammed process-and-transmit-info-of-MMS-L instruction, via control transmission means, to control processor, 39J; then, in a predetermined fashion, to commence an unrelated processing task.

Receiving said last named instruction causes control processor, 39J, to execute particular preprogrammed process-length-token-and-transmit-MMS-L instructions; to record additional SPAM signal words at said SPAM-input-signal memory until the quantity of SPAM words recorded at said memory is the smallest number of words that can contain H+X+L bits; to select information of the first L bits at said memory immediately after the first H+X bits; to determine that said information matches Y-token information; to select y-bits information associated with said Y-token information and record said y-bits information at said SPAM-length-info memory (thereby placing at said memory information of the number of encrypted meter-monitor segment bits in said second message after the last bit of length token—that is, the numeric value of MMS-L); and to transmit to controller, 20, via control transmission means, an interrupt signal, the aforementioned at-39J information, information of said numeric value of MMS-L.

Receiving said interrupt signal, at-39J information, information of MMS-L causes controller, 20, in the aforementioned predetermined fashion, to cease an unrelated processing task; to execute, in a predetermined fashion, particular preprogrammed ones of the aforementioned decrypt-a-00-header-message-at-39K instructions; to transmit to decryptor, 39K, particular decrypt-a-00-header-message instructions (which instructions include information of MMS-L); to transmit to control processor, 39J, a particular decrypt-process-and-meter-a-00-message instruction and particular decryption mark information of key J; then, in a predetermined fashion, to commence an unrelated processing task.

Receiving said last named instruction and mark information causes control processor, 39J, to record said mark information at the aforementioned SPAM-decryption-mark register memory; to enter "1" at the aforementioned SPAM-Flag-monitor-info register memory; to place particular from-39F information at the aforementioned SPAM-primary-input-source register memory; and to execute particular preprogrammed decrypt-process-and-meter-current-00-header-message instructions.

Executing said instructions causes control processor, 39J, first, to receive all remaining command information and padding bits in said second message in the following fashion. Said instructions cause control processor, 39J, to add H+X+L to the information of y-bits at the aforementioned SPAM-length-info memory; to determine a particular number of signal words to receive from EOFS valve, 39F; to receive and record said words at said SPAM-input-signal memory immediately following SPAM signal word previously recorded at said memory; if the command information of said message fills a whole number of signal words, to receive one additional signal word, compare the information of said word to information of one EOFS WORD, record said word at said SPAM-input-signal memory immediately following the last SPAM signal word recorded at said memory, and receive and record the information of one more SPAM signal word at said SPAM-input-signal memory immediately following the last SPAM signal word recorded at said memory if said one additional signal word has matched said EOFS WORD information; and to cease accepting SPAM signal information from EOFS valve, 39F.

Executing said decrypt-process-and-meter-current-00-header-message instructions causes control processor, 39J, then, to transfer to decryptor, 39K, the SPAM information of said second message in the following fashion. Said instructions cause control processor, 39J, to cause matrix switch, 39I, to cease transferring information from EOFS valve, 39F, to control processor, 39J, and commence transferring information from control processor, 39J, to decryptor, 39K, and cause control processor, 39J, to transfer all information recorded at said SPAM-input-signal memory of control processor, 39J, which information is complete information of said second message.

Automatically, decryptor, 39K, commences receiving SPAM signal information.

Executing said decrypt-process-and-meter-current-00-header-message instructions causes control processor, 39J, then, in the following fashion, to prepare to receive the decrypted information of said second message and to execute, at a secondary control level under primary control of said decrypt-process-and-meter-current-00-header-message instructions, the controlled functions invoked by said decrypted information. Said instructions cause control processor, 39J, to place information of a particular reentry-address at the aforementioned SPAM-next-primary-instruction-address register memory; to place information of "0" at the aforementioned SPAM-Flag-primary-level-2nd-step-incomplete register memory and, separately, at SPAM-Flag-primary-level-3rd-step-incomplete register memory; to place information of "0" at the aforementioned SPAM-Flag-secondary-level-incomplete register memory; to compare the information at said SPAM-Flag-monitor-info memory with particular preprogrammed "0" information and skip all steps of collecting monitor information because no match results; to cause all apparatus of control processor, 39J, to delete from memory all information of said second message except information at said SPAM-decryption-mark, SPAM-Flag-at-secondary-control-level, SPAM-primary-input-source, SPAM-next-primary-instruction-address register memories; to cause matrix switch, 39I, to cease transferring SPAM message information from control processor, 39J, to decryptor, 39K, and commence transferring SPAM message information from EOFS valve, 39H, to control processor, 39J; to place information of "0" at the aforementioned SPAM-Flag-executing-secondary-command register memory; to place information of "0" at the aforementioned SPAM-Flag-at-secondary-level register memory; and to commence waiting to receive information of a subsequent SPAM header from said switch, 39I.

Receiving from controller, 20, the aforementioned key information of J and decrypt-a-00-header-message instructions (that include information of MMS-L) and from matrix switch, 39I, the aforementioned transferred SPAM message information that is complete information of said second message causes decryptor, 39K, to transfer the first H bits of said SPAM information to buffer, 39G, without decrypting or altering said bits in any fashion; to decrypt and transfer the next X bits of said information; to transfer the next L bits without decrypting or altering said bits; to decrypt and transfer the next MMS-L bits; and finally, to transfer any bits remaining after the last of said MMS-L bits without decrypting or altering said bits remaining. In so doing, decryptor, 39K, inputs complete unencrypted information of said second message to buffer, 39G. Said complete unencrypted information is identical to the SPAM message information that decryptor, 10, inputs to controller, 12, in example #2.

Receiving said complete unencrypted information causes buffer, 39G, automatically to buffer said information and input said information to EOFS valve, 39H, and causes EOFS valve, 39H, to transfer said information, via matrix switch, 39I, to control processor, 39J, as fast as control processor, 39J, is prepared to receive said information.

Receiving said information causes control processor, 39J, to record the smallest number of signal words that can contain H bits at SPAM-input-signal memory; to select information of the first H bits at said memory; to record said information at SPAM-header memory; to compare the information at said SPAM-header memory with the aforementioned invoke-monitor-processing information, determine a match with particular preprogrammed "00" information, and enter "0" at the aforementioned SPAM-Flag-monitor-info register memory; to record additional SPAM signal words at said SPAM-input-signal memory until the total quantity of SPAM signal words recorded at said memory equals the smallest number of signal words that can contain H+X bits; to record information of the first X bits of information at said SPAM-input-signal memory immediately after the first H bits at said SPAM-exec memory; to compare the information at said memory with the aforementioned controlled-function-invoking information and determine a match with the aforementioned execute-conditional-overlay-at-205 information; and to execute the aforementioned conditional-overlay-at-205 instructions.

Executing said instructions causes control processor, 39J, first, to receive all remaining command information and padding bits in said second message in the following fashion. Said instructions cause control processor, 39J, to record additional SPAM signal words at said SPAM-input-signal memory until the quantity of SPAM words recorded at said memory is the smallest number of words that can contain H+X+L bits; to select information of the first L bits at said memory immediately after the first H+X bits; to determine that said information matches Y-token information; to select y-bits information that is information of the numeric value of MMS-L and record said information at said SPAM-length-info memory; add H+X+L to the information said memory; to determine a particular number of signal words to receive from EOFS valve, 39H; to receive and record said words at said SPAM-input-signal memory immediately following SPAM signal word previously recorded at said memory; if the command information of said message fills a whole number of signal words, to receive one additional signal word, compare the information of said word to information of one EOFS WORD, record said word at said SPAM-input-signal memory immediately following the last SPAM signal word recorded at said memory, and receive and record the information of one more SPAM signal word at said SPAM-input-signal memory immediately following the last SPAM signal word recorded at said memory if said one additional signal word has matched said EOFS WORD information; and to cease accepting SPAM signal information.

By receiving all command information and padding bits in said second message, control processor, 39J, receives all of the unencrypted complete information of said second message. Accordingly, the next signal word to be transferred by said valve, 39H, will be the first word of a subsequent message inputted to buffer, 39G.

Executing said conditional-overlay-at-205 instructions causes control processor, 39J, then, in the following fashion, to locate information of the unique "program unit identification code" that identifies the program unit of said "Wall Street Week" program and determine that said information matches the information at the aforementioned SPAM-first-precondition register memory. Said instructions cause control processor, 39J, to select information of the bits of the meter-monitor format field in said first message; to compare said information with format-specification information; to determine a match with particular D-format information; to place at the aforementioned SPAM-mm-format memory a particular D-offset-address number that is different from the aforementioned A-, B-, and C-offset-address numbers; to execute the aforementioned locate-program-unit instructions and locate the program unit field in the meter-monitor information of said second message in the fashion described above; to select binary information of a particular number of contiguous bit locations at said SPAM-input-signal memory that begin at a particular number of bit locations after the first bit location at said memory (which binary information is said information of the unique "program unit identification code"); and to compare said binary information to the information at the aforementioned SPAM-first-precondition register memory, causing a match to result.

(At those subscriber stations where the information of the program unit field in the meter-monitor information of said second message fails to match information at SPAM-first-precondition register memory—including all stations that are preprogrammed with decryption key information of J but not with decryption key information of Z—particular first-condition-test-failed instructions of said conditional-overlay-at-205 instructions cause the control processors, 39J, of said stations to enter "0" at each of the aforementioned SPAM-Flag-first-condition-failed and SPAM-Flag-do-not-meter register memories, which memories are each normally "1"; to cause all SPAM information at the main and video RAMs of the microcomputers, 205, of said stations to be cleared; and to complete all conditional-overlay-at-205 instructions and, in so doing, to complete all controlled functions invoked by said second message at the secondary control level.)

So resulting in a match, under control of the conditional-overlay-at-205 instructions at the station of FIG. 3, causes control processor, 39J, then, to execute the aforementioned locate-overlay-number instructions and locate the overlay number field in the meter-monitor information of said second message in the fashion described above; to select binary information of a particular number of contiguous bit locations at said SPAM-input-signal memory that begin at a particular number of bit locations after the first bit location at said memory (which binary information is the information of said overlay number field); and to compare said binary information to the information at the aforementioned SPAM-second-precondition register memory, causing a match to result.

(At those subscriber stations where the information of the overlay number fails to match information at SPAM-second-precondition memory, particular second-condition-test-failed instructions of said conditional-overlay-at-205 instructions cause the control processors, 39J, of said stations to interrupt the operation of the CPUs of the microcomputers, 205, of said stations; to cause said microcomputers, 205, to restore efficient operation in a fashion described more fully below; to enter "0" at the aforementioned SPAM-Flag-second-condition-failed register memory, which memories is normally "1"; and to complete all conditional-overlay-at-205 instructions and controlled functions invoked by said second message at the secondary control level.)

So resulting in a match, under control of said conditional-overlay-at-205 instructions at the station of FIG. 3, causes control processor, 39J, (and control processors, 39J, at other subscriber stations where matches with information at SPAM-second-precondition memory result) to cause matrix switch, 39I, to cease transferring information from EOFS valve, 39H, to control processor, 39J, and commence transferring information from control processor, 39J, to the PC-MicroKey System of microcomputer, 205; to transmit the instruction, "GRAPHICS ON", to said PC-MicroKey System; to cause matrix switch, 39I, to cease transferring information from control processor, 39J, to said PC-MicroKey System; and to complete all conditional-overlay-at-205 instructions and controlled functions invoked by said second message at the secondary control level.

Transmitting the instruction, "GRAPHICS ON", to the PC-MicroKey System of the subscriber station of FIG. 3 (and transmitting "GRAPHICS ON" to other PC-MicroKey Systems at other subscriber stations where the program instruction set of the first message has been run at a microcomputer, 205, and where said second message causes "GRAPHICS ON" to be transmitted) causes said PC-MicroKey System to combine the programming of FIG. 1A and of FIG. 1B and transmit the combined programming to monitor, 202M, where FIG. 1C is displayed.

Completing all conditional-overlay-at-205 instructions and controlled functions invoked at the secondary control level causes control processor, 39J, (and causes control processors, 39J, at other stations) to execute conventional control-function-complete instructions and compare the information at the aforementioned SPAM-Flag-at-secondary-control-level memory to particular "0" information. A match results.

Resulting in a match, under control of said instructions causes control processor, 39J, to place "1" at the aforementioned SPAM-Flag-secondary-level-incomplete memory, to place "1" at said SPAM-Flag-at-secondary-control-level memory, and to commence executing control instructions beginning with that instruction whose particular address/location is the address/location of the information at the aforementioned SPAM-next-primary-instruction-address memory.

Automatically, the particular instructions that begin at said address/location cause control processor, 39J, to execute the particular end-process-portion-? instructions of said decrypt-process-and-meter-current-00-header-message instructions. Under control of said end-process-portion-? instructions, control processor, 39J, determines that the information at said SPAM-Flag-secondary-level-incomplete memory matches a particular preprogrammed "1"; places "1" at the aforementioned SPAM-Flag-primary-level-2nd-step-incomplete register memory; determines that a comparison of the information at the aforementioned SPAM-Flag-primary-level-3rd-step-incomplete register memory with a particular preprogrammed "1" does not result in a match, signifying that the meter portion of said decrypt-process-and-meter-current-00-header-message instructions remains uncompleted.

Not resulting in a match causes control processor, 39J, under control of said decrypt-process-and-meter-current-00-header-message instructions, to execute the meter portion of said instructions. Under control of the instructions of said portion, control processor, 39J, compares the information at the aforementioned SPAM-Flag-do-not-meter register memory to particular preprogrammed information of "0". No match results.

(At those subscriber stations where the aforementioned first-condition-test-failed instructions caused "0" to be entered at the SPAM-Flag-do-not-meter memories of said stations, matches result when the information at said memories is compared to "0". Said matches cause the control processors, 39J, of said stations to complete the decrypt-process-and-meter-current-00-header-message instructions of said stations and all controlled functions invoked by said second message immediately, without transferring any meter information to the buffer/comparators, 14, of said stations and, at particular selected ones of said stations, without entering "1"

at the SPAM-Flag-monitor-info memories. Said selected stations are stations that are preprogrammed to collect monitor information.)

Not resulting in a match, under control said meter portion at the station of FIG. 3, causes control processor, 39J, to compare the information at the aforementioned SPAM-Flag-second-condition-failed register memory to particular preprogrammed information of “1”. A match results.

(At such other stations where no matches result, not resulting in a match, under control of said instructions, causes the control processor, 39J, of each one of said other stations, to execute particular second-precondition-failed-meter instructions of said meter portion. Automatically, said instructions cause control processor, 39J, to transfer to the buffer/comparator, 14, of said one, particular header information that identifies a transmission of meter information at a station where inefficient operation of a microcomputer, 205, prevented combining; then the decoder-203 source mark of the decoder, 203, of said station; then information of the decryption mark of key J information recorded at SPAM-decryption-mark register memory of said station; then all of the received binary information of said second message that is recorded at said SPAM-input-signal memory of said station. Said transmitted information is called, hereinafter, the “2nd meter-monitor information—second precondition failed—(#4).” Then said instructions cause control processor, 39J, to place “1” at said SPAM-Flag-second-condition-failed memory and continue the regular instructions of said portion.)

Resulting in a match, under control said meter portion at the station of FIG. 3, causes control processor, 39J, to cause matrix switch, 39I, to commence transferring information from control processor, 39J, to buffer/comparator, 14, of signal processor, 200; to transfer the aforementioned header information that identifies a conventional transmission of meter information then the aforementioned decoder-203 source mark then information of the information recorded at said SPAM-decryption-mark register memory, which is the decryption mark of key J, then all of the received binary information of said second message that is recorded at said SPAM-input-signal memory; then to cause matrix switch, 39I, to cease transferring information from control processor, 39J, to said buffer/comparator, 14. (Said received information is complete information of the second combining synch command of example #4, and said information that is transmitted to buffer/comparator, 14, is called, hereinafter, the “2nd meter-monitor information (#4).”) Then the instructions of said portion cause control processor, 39J, to enter “1” at said SPAM-Flag-monitor-info memory; to enter “1” at the aforementioned SPAM-Flag-primary-level-3rd-step-incomplete register memory; and to determine that a comparison of the information at the aforementioned SPAM-Flag-primary-level-2nd-step-incomplete register memory with a particular preprogrammed “1” results in a match, signifying the completion of the process portion of said decrypt-process-and-meter-current-00-header-message instructions.

Resulting in a match causes control processor, 39J, to complete said decrypt-process-and-meter-current-00-header-message instructions and all controlled functions of said second message.

Completing the controlled functions of said second message causes control processor, 39J, automatically to prepare to receive the next SPAM message. Automatically, control processor, 39J, compares the information at said SPAM-header memory to particular preprogrammed cause-retention-of-exec information that is “01”. No match results. Not resulting in a match causes control processor, 39J, to execute particular collect monitor information and to compare the information at said SPAM-Flag-monitor-info memory with particular preprogrammed “0” information. No match results.

(By contrast, matches result at every station that is preprogrammed to collect monitor information where said second message is decrypted but FIG. 1C image information is not displayed because the “program unit identification code” information in said second message fails to match information at SPAM-first-precondition register memory. Said matches cause the control processors, 39J, of said stations to execute the aforementioned collect-monitor-information instructions. Said instructions cause said control processors, 39J, to transfer to the buffer/comparators, 14, particular header information that identifies a transmission of monitor information at a station where no combining occurred because first precondition program unit information failed to match and which transmission contains decryption mark information, then to transfer the aforementioned decoder-203 source mark information, then information of the decryption mark of key J information recorded at SPAM-decryption-mark register memory, then all of the received binary information of said second message that is recorded at the SPAM-input-signal memories of said stations. Said information that is transmitted to said buffer/comparators, 14, is called, hereinafter, the “2nd monitor information (#4).” Then said instructions cause said control processors, 39J, to place “1” at said SPAM-Flag-monitor-info memory, at the aforementioned SPAM-Flag-first-condition-failed memory, and at the aforementioned SPAM-Flag-do-not-meter memory and to continue executing conventional control instructions. Then the conventional control instructions of said stations cause said control processors, 39J, to cause all apparatus of the controllers, 39, to delete from memory all information of said second message and to commence waiting to receive information of a subsequent SPAM header from the matrix switches, 39I.)

Not resulting in a match, at the station of FIG. 3, causes control processor, 39J, to cause all apparatus of controller, 39, to delete from memory all information of said second message; to cause matrix switch, 39I, to commence transferring information from the EOFS valve identified by the information at the aforementioned SPAM-primary-input-source register memory, which is EOFS valve, 39F, to control processor, 39J; and to commence waiting to receive information of a subsequent SPAM header from matrix switch, 39I.

Receiving said 2nd meter & monitor information (#4) causes buffer/comparator, 14, automatically to compare the header information that identifies a transmission of meter information to particular preprogrammed header-identification-@14 information. A match results with the aforementioned meter-identification information, causing buffer/comparator, 14, to select the meter instruction information of the aforementioned particular bit locations of the meter instruction field of said 2nd meter & monitor information (#4) and to compare said selected information to the aforementioned metering-instruction-comparison information. No match results, causing buffer/comparator, 14, automatically to transmit to controller, 20, the aforementioned instruct-to-meter information then said meter instruction information.

Receiving said information causes controller, 20, to compare said meter instruction information to the aforementioned instruct-to-meter-@20 information and to determine that said meter instruction information matches particular preprogrammed update-program-record-&-increment-by-one information that causes controller, 20, to execute particular update-and-increment instructions. Said instructions cause signal processor, 200, not only to add one incrementally to each meter record maintained at buffer/comparator, 14, that is associated with decryption key information of the instance of meter information being processed (which is, substantively, the metering function invoked by the 2nd meter information (#2)) but also to modify the information of the aforementioned first particular meter record, initiated by the 1st meter & monitor information (#4). (The particular metering function invoked by said 2nd meter information (#2) could not modify any of the information of said first particular meter record, even by incrementing by one, because no information of decryption key J is associated with said record when the 2nd meter & monitor information (#4) is received at buffer/comparator, 14.)

Executing said update-and-increment instructions causes controller, 20, in a predetermined fashion, to analyze the information of said 2nd meter & monitor information (#4); to place information of the information of the overlay number field in said 2nd information at a particular record field associated with said first particular meter record, signifying the combining of said overlay at the subscriber station of FIG. 3; and to place, at the particular record location occupied by record format information, particular new record format information that identifies the new format of said first particular meter record; to compare the decryption mark information in said 2nd meter & monitor information (#4) with the aforementioned decryption-key-comparison information, preprogrammed at buffer/comparator, 14; to determine several matches; to increment by one the meter record, at buffer/comparator, 14, associated with each particular decryption-key-comparison datum that matches the decryption mark of said 2nd meter & monitor information (#4); to discard all information of said 2nd meter & monitor information (#4) from its memory; and to complete said update-and-increment instructions.

Completing the metering functions invoked by said meter instruction information causes controller, 20, to cause buffer/comparator, 14, to execute its preprogrammed automatic monitoring functions. These functions proceed in the fashion that applied to the 2nd monitor information (#3).

The content of the 2nd meter & monitor information (#4) causes onboard controller, 14A, to organize the information of said new monitor record in a particular fashion that differs, in one respect, from the new monitor record generated in the third example by the 2nd monitor information (#3). The 2nd meter & monitor information (#4) includes a decryption mark. The presence of said mark causes causes onboard controller, 14A, to includes decryption key information of J, not included in the new monitor record generated by the 1st monitor information (#3), and record format field information that reflects the presence of said decryption field information.

(At each station where the aforementioned 2nd meter & monitor information—second precondition failed—(#4) is transmitted, receiving said 2nd information—failed—(#4) causes the buffer/comparator, 14, of said station automatically to compare the information, in said 2nd information—failed—(#4), of the header that identifies a transmission of meter information at a station where inefficient operation of a microcomputer, 205, prevented combining to the aforementioned header-identification-@14 information. A match results with particular second-precondition-failed information, causing buffer/comparator, 14, to select information of the aforementioned particular bit locations that contain the information of the meter instruction field of said 2nd information—failed—(#4) then automatically to transmit to controller, 20, a particular preprogrammed instruct-to-process-info-failed information then said selected information, which is the meter instruction information of said second message. Receiving said information causes controller, 20, in a predetermined fashion, to execute particular preprogrammed increment-by-one-&-record-failed-combining-info information that invokes to particular sets of instructions preprogrammed at controller, 20. The first set causes controller, 20, to cause buffer/comparator, 14, to add one incrementally to each meter record maintained at buffer/comparator, 14, that is associated with decryption key information that matches the decryption mark of said 2nd information—failed—(#4) in the fashion of example #2. Then the second set causes controller, 20, to assemble a record of a failed combining at buffer/comparator, 14; to record said record at recorder, 16, in the fashion of the second and third sets of example #4 (first message); and to complete the metering functions invoked by said increment-by-one-&-record-failed-combining-info information. The content of said record includes information that identifies said record as information of a combining aborted due to inefficient operation of a subscriber station microcomputer, 205; the unique digital code information capable of identifying the subscriber station of FIG. 3 uniquely, which information is preprogrammed at controller, 20; and the "program unit identification code" and overlay number information of the meter-monitor segment information of said second message in said 2nd information—failed—(#4). At each station that processes said 2nd information—failed—(#4) and that is preprogrammed to collect monitor information, completing said metering functions causes the controller, 20, of said station to cause the buffer/comparator, 14, to execute its preprogrammed automatic monitoring functions. These functions proceed in the fashion that applied to the 2nd meter & monitor information (#4) with particular exceptions. Receiving said 2nd information—failed—(#4) causes the onboard controller, 14A, to add not only decryption key information but also information that combining failed to occur because of inefficient microcomputer operation and that the combining is of the overlay number of the information of the overlay number field in said 2nd information—failed—(#4).)

(At each station where the aforementioned 2nd monitor information (#4) is transmitted, no 1st meter & monitor information (#4) transmission occurred; onboard controller, 14A, has not initiated a new monitor record of the "Wall Street Week" program; and the aforementioned record of the prior programming displayed at monitor, 202M, remains at buffer/comparator, 14. Accordingly, receiving said 2nd monitor information (#4) causes the buffer/comparator, 14, of said station to process information in the fashion of the 1st monitor information (#3). Automatically, said buffer/comparator, 14, determines that the header information in said 2nd monitor information (#4) matches particular preprogrammed monitored-instruction-not-fulfilled information which causes buffer/comparator, 14, to input said 2nd monitor information (#4) to onboard controller, 14A. Receiving said 2nd monitor information (#4) causes onboard controller, 14A, to execute the aforementioned process-monitor-info instructions; to determine that the "program unit identification code" in said 2nd monitor information (#4) does not match the "program unit identification code" information in said record of prior programming; to cause signal processor, 200, to record said record of prior programming at recorder, 16; to initiate a new monitor record that reflects the new "Wall Street Week" programming; and finally, to discard all unrecorded information of said 2nd monitor information (#4) and commence waiting for the next inputted instance of monitor information. The header information of the 2nd monitor information (#4) causes signal processor, 200, to assemble said new monitor record in the particular format of a combined video/computer medium transmission at a station where no combining occurred because first precondition program unit information failed to match and to include a particular record format field within said format identifying the format of said record. From the meter-monitor segment of said 2nd monitor information (#4), onboard controller, 14A, selects and records at particular signal record field locations the "program unit identification code" of the "Wall Street Week" program, the overlay number information, and minute of the "Wall Street Week" program transmission within a one month period. And onboard controller, 14A, records in a particular monitor record field location the aforementioned display unit identification code that identifies monitor, 202M, as the display apparatus of said new monitor record and date and time information received from clock, 18.)

Operating S. P. Systems

Example #4

Third Message

Subsequently, the embedded information of the third message of the "Wall Street Week" program is inputted to decoder, 203. Said information is identical to the embedded information of the third message of examples #1, #2, and #3 and causes the same processing at decoder, 203, that the information of the third message of example #3 caused. The information of the third message of example #4 causes "GRAPHICS OFF" to be executed at the PC-MicroKey System of the microcomputers, 205, of all subscriber stations tuned to the "Wall Street Week" transmission. But like the third message of example #2, the third message of example #4 causes combining actually to cease only each selected one of said stations where information of the second message previously caused combining to commence.

However, example #4 does differ from example #2. In example #2, the second message causes combining to commence at every selected station where the information of said second message is decrypted; that is, every station preprogrammed with information of decryption key J. But the second message of example #4 causes combining to commence only at those selected stations where information not only of said second message is decrypted but also where information of the first message of example #4 had been decrypted; that is, only at those stations preprogrammed not only with information of decryption key J but also information of decryption key Z.

Thus example #4 illustrates a case where not only does selective processing of the second message enable the third message to have effect only at selected stations without any selective processing of said third message, the selective processing of the first message enables the third message to have effect only at an even more selective group of stations than would otherwise be the case. Placing the PC-MicroKey Systems of all stations into the "Graphics Off" mode prior to transmitting the first message of example #4 enables the third message of example #4 in the simplest possible fashion to cause combining to cease only at those stations that are preprogrammed with decryption key information not only of J but also of Z, with all the benefits outlined at the end of example #2.

Placing particular so-called "soft switches," one of which exists at each subscriber station, all into one given original position, "off" or "on", then transmitting a command that is processed selectively at selected stations and places said switches at said stations into the opposite position, "on" of "off", makes it possible to transmit a subsequent command that returns said switches at said selected stations (and only said switches) to said original position without any additional selective processing.

Significant advantages of simplicity and speed are achieved by devising signal processing apparatus and methods that minimize the need for selective processing. With regard to said third combining synch command, for example, no step of decrypting is required to affect only those stations that are preprogrammed with decryption key J. Accordingly, no possibility exists that an error in decrypting may occur at one or more of said stations, causing the combining of video RAM information and received video information, at said one or more, not to cease at the proper time and to continue beyond said time (until such time as some subsequent command may execute "GRAPHICS OFF" or clear information from said video RAM at said stations). Because no time is required for decrypting, no possibility exists that some station may take longer (or shorter) than proper to perform decrypting causing the image of FIG. 1A to be displayed at some monitor, 202M, longer (or shorter) than proper. Perhaps most important, because no time is required for selective processing of said third command, the time interval that separates the time of embedding said third command at said remote station that originates the "Wall Street Week" program and the time of ceasing caused by said command at URS microcomputers, 205, can be the shortest possible interval. Making it possible for said time interval to be the shortest possible interval minimizes the chance that an error may occur in the timing of the embedding of said third command at said remote station causing all URS microcomputers, 205, to cease combining at a time that is other than the proper time.

Operating Signal Processor Systems

Example #5

Example #5 focuses on program unit identification signals detected at decoders, 30 and 40, of signal processor, 200.

Signal processor, 200, is preprogrammed with information that identifies each cable and over-the-air (hereinafter, "wireless") transmission or frequency in the locality of the subscriber station of FIG. 3 as well as the standard broadcast and cablecast practices that apply on said transmissions and frequencies. Via a conventional multi-channel cable transmission, in a fashion well known in the art, four channels of conventional television programming and two conventional FM radio signals are inputted to a first alternate contact of switch, 1, and to mixer, 2. Said television channels are transmitted normally assigned to channels 2, 4, 7, and 13 of the television frequency spectrum. Said radio signals are transmitted on 99.0 MHz and 100.0 MHz of the FM frequency spectrum. Via a conventional television receiving antenna, three conventional wireless television transmissions are inputted to the second alternate contact of switch, 1. Said wireless transmissions are on the frequencies of the television spectrum normally assigned to channels 5, 9, and 13. In a predetermined fashion, controller, 20, controls oscillator, 6, to sequence local oscillator, 6, in the pattern: cable channel 2, cable channel 4, cable channel 7, cable channel 13, wireless channel 5, wireless channel 9, wireless channel 13, then to repeat said pattern.

In example #5, the "Wall Street Week" combining synch commands are transmitted unencrypted as in the first example, and the "Wall Street Week" program is transmitted on the frequency of channel 13 by a wireless broadcast station whose transmission is retransmitted on the frequency of channel 13 on said cable. Thus a viewer can tune to the "Wall Street Week" program on either wireless channel 13 or cable channel 13. Simultaneously, different programs are transmitted on each of the other television and radio transmissions.

Controller, 20, has preprogrammed the RAM associated with the control processor, 39J, of the controller, 39, of decoder, 30, with bit information of a channel mark associated with each transmission of television programming received at decoder, 30. (While wireless channel 13 and cable channel 13 may transmit the same programming, they have different channel marks.) At said RAM, said control processor, 39J, maintains, associated with appropriate channel mark information, monitor information records of the last command containing meter-monitor program identification information inputted via each channel transmission. Said records include program unit identification information. At the outset of the example, no transmission of "Wall Street Week" program unit identification information has yet occurred, and the program unit information associated with the source mark of wireless channel 13 and, separately, with the source mark of cable channel 13 is the unit information of the television programming transmitted immediately before the start of the "Wall Street Week" transmission.

At the outset of example #5, the contact lever of switch, 1, is connected to said first alternate contact of switch, 1, to which is inputted the full spectrum of frequencies transmitted on said cable, and mixer, 3, is set to select the frequency of channel 13. Thus transmissions on cable channel 13 are inputted to decoder, 30. Furthermore, the EOFS valve, 39F, of controller, 39, of decoder, 30, has identified an end of file signal embedded in the inputted channel 13 transmission and is set to receive transfer SPAM message information; the matrix switch, 39I, of said controller, 39, is set to transfer SPAM message information from said EOFS valve, 39F, to said control processor, 39J; and said control processor, 39J is set to receive and process header information of a SPAM message.

Example #5 begins with the embedding and transmitting, at the remote station that originates the "Wall Street Week" broadcast, of the first message of the "Wall Street Week" program which is the message of the first combining synch command. The transmission of said broadcast is received at the remote cable transmission station that transmits the multichannel cable transmission inputted to signal processor, 200; combined into the full spectrum cable transmission on the frequency of channel 13; and retransmitted. Said cable transmission is inputted via said first alternate contact of switch, 1, and said contact lever to mixer, 3. Mixer, 3, selects the frequency of channel 13 and inputs said frequency of interest, at a fixed frequency, to TV signal decoder, 30.

Receiving said frequency of interest causes decoder, 30, (which is shown in greater detail in FIG. 2A and whose controller, 39, is shown in greater detail in FIG. 3A) to receive and process the command information of said first message. The inputted frequency of channel 13 is inputted, first, to filter, 31, which filters said input and outputs the one TV channel signal of channel 13 to amplitude demodulator, 32. Demodulator, 32, demodulates said inputted channel signal using standard demodulator techniques and transfers the demodulated channel signal of said channel 13 to digital detector, 38; line receiver, 33; and audio demodulator, 35. Thereafter, the embedded information of the first combining synch command is caused to be recorded at the SPAM-input-signal register memory of the control processor, 39J, of said decoder, 30, in the same fashion that the embedded information of said message is detected and recorded at decoder, 203, in example #3. Receiving said embedded information causes the binary SPAM information of said first command, with error correcting information, to be detected at detector, 34; checked and corrected, as necessary, at processor, 39B; converted into locally usable binary information at processor, 39D; and recorded at the SPAM-input-signal memory of said control processor, 39J.

The control apparatus of decoder, 30, is preprogrammed to process said information as monitor information and local control information. (Hereinafter, said first command may be called the 1st command (#5).) Receiving said first command causes the preprogrammed instructions at the RAM and ROM associated with control processor, 39J, to cause control processor, 39J, to process the information of said command in the following fashion. In a predetermined fashion, control processor, 39J, locates the monitor information that it retains in said RAM associated with the channel mark of cable channel 13 and compares the "program unit identification code" of said first command with the program unit information of said monitor information in RAM. No match results which indicates cable channel 13 is transmitting a new program unit. Not resulting in a match causes said controller, 39, automatically to transfer information of new programming to microcomputer, 205, and to transfer to buffer/comparator, 14, for further processing said monitor information in RAM which is monitor information of the programming transmitted on cable channel 13 prior to the "Wall Street Week" program. Automatically, said control processor, 39J, causes matrix switch, 39I, to cease transferring information from said EOFS valve, 39F, to control processor, 39J, and commence transferring information from control processor, 39J, to buffer/comparator, 8, (to which said matrix switch, 39I, has capacity to transfer information). Automatically said control processor, 39J, transmits a message that consists of binary information of a "00" header (indicating a command with execution and meter-monitor segments) then the execution segment information of the pseudo command then a meter-monitor segment containing said monitor information in RAM (including the associated channel mark and the format information of said information) then any padding bits required to end said message. (Hereinafter, said message whose transmission is caused by receiving said first command is called the "1st-old-program-command (#5).") Then, in a predetermined fashion, control processor, 39J, determines that said first command contains subject matter meter-monitor information causing said control processor, 39J, to transmit a message that consists of binary information of a "00" header then particular execution segment information that is addressed to microcomputer, 205, (and that causes microcomputer, 205, to process the information of the meter-monitor segment immediately following said execution segment information as new programming now being transmitted on the channel of the channel mark of said meter-monitor segment segment) then meter-monitor segment information that includes the "program unit identification code" and subject matter information of said first command and the channel mark of cable channel 13 as well as appropriate meter-monitor format information then any padding bits required to end said message. (Said message whose transmission is caused by receiving said first command enables microcomputer, 205, in a fashion described more fully below, to tune automatically to receive the program that said "program unit identification code" identifies if said program is of interest, and said message is called, hereinafter, the "1st-new-program-message (#5)".) Then said control processor, 39J, deletes from said RAM all information of said monitor information in RAM except the information of said channel mark and records at said RAM, associated with said channel mark, the meter-monitor segment information of the information at said SPAM-input-signal memory, which is said first command, but replaces the meter-monitor format information that is recorded with new format information that reflects the addition of a channel mark. Finally, controller, 39J, transmits particular detection-complete information to controller, 20; causes all apparatus of decoder, 30, except said RAM to cease receiving SPAM message information and delete all information received on said frequency of interest (that is, cable channel 13); and causes said matrix switch, 39I, to cease transferring information from said control processor, 39J, to said buffer/comparator, 8, and commence transferring SPAM message information from EOFS valve, 39F, to its null output.

Receiving said detection-complete information causes controller, 20, to cause oscillator, 6, to cause the selection of the next channel in the predetermined television channel selection pattern: wireless channel 5. Automatically oscillator, 6, causes switch, 1, to shift its contact lever from the first alternate contact to the second alternate contact to which wireless transmissions are inputted and causes mixer, 3, to select the frequency of channel 5 and input said frequency of interest, at a fixed frequency, to decoder, 30. Controller, 20, then transmits a particular preprogrammed wireless-5 instruction to said control processor, 39J, that informs said processor, 39J, wireless channel 5 is inputted to decoder, 30.

Receiving said wireless-5 instruction causes control processor, 39J, to cause all apparatus of decoder, 30, to commence receiving, detecting, and processing SPAM message information embedded in the inputted frequency of interest.

When the input of wireless channel 5 to decoder, 30, commences, the remote wireless station transmitting the channel 5 transmission is transmitting the embedded signal information of an information segment following a SPAM command. Shortly thereafter, embedded signal information of an end of file signal then a combining synch command with a "01" header is transmitted on wireless channel 5. Said command instructs ITS controller/computers, such as 73 in FIG. 6 (except that the intermediate transmission station of this transmission is a wireless transmission station rather than a cable station), to load and run the contents of the information segment following said command. The meter-monitor field of said command contains no subject matter information but identifies a particular super market chain commercial program unit.

Receiving the inputted frequency of interest of wireless channel 5 at decoder, 30, causes filter, 31, to filters the inputted fixed frequency and output the one TV channel signal of channel 5 to amplitude demodulator, 32; causing demodulator, 32, to demodulate said inputted channel signal and transfer the demodulated signal to line receiver, 33; causing line receiver, 33, to detect said embedded signal information and transmit it to digital detector, 34; causing digital detector, 34, to detect the binary information of said signal information and transfer said binary information to controller, 39. Receiving said binary information at controller, 39, causes the binary SPAM information of the wireless channel 5 transmission to be checked and corrected, as necessary, at processor, 39B; converted into locally usable binary information at processor, 39D; and checked for end of file signal information at EOFS valve, 39F, and transmitted to the null output of matrix switch, 39I, until EOFS valve, 39F, detects an end of file signal.

In due course, said EOFS valve, 39F, receives the aforementioned end of file signal causing said valve, 39F, to detect said signal and transmit the aforementioned interrupt signal of EOFS-signal-detected information to said control processor, 39J. Receiving said EOFS-signal-detected information causes control processor, 39J, to transmit the aforementioned discard-and-wait instruction to EOFS valve, 39F, and to cause said matrix switch, 39I, to cease transferring SPAM message information from said EOFS valve, 39F, to its null output information and commence transferring SPAM message information from said valve, 39F, to said control processor, 39J. Receiving said instruction causes said valve, 39F, to set the information at the EOFS WORD Counter of said valve, 39F, to "00000000" (thereby discarding information of said end of file signal) and to transmit the aforementioned complete-and-waiting information to control processor, 39J, as an interrupt signal. Receiving said complete-and-waiting information causes control processor, 39J, to transmit the aforementioned reopen-flow instructions to EOFS valve, 39F, causing said valve, 39F, to recommence processing inputted signal words in its preprogrammed fashion and transferring said words to matrix switch, 39I, and control processor, 39J, commences waiting to receive from said valve the binary information of a subsequent SPAM header.

The command that then follows on wireless channel 5 contains one example of an execution segment that invokes no controlled functions at the station of FIG. 3. Said command is addressed to intermediate transmission station controller/computers. Its instructions control, among others, the controller/computer of the remote station transmitting the wireless channel 5 transmission. (FIG. 6 shows one example of such a controller/computer, 73.) The subscriber station of FIG. 3 is an ultimate subscriber station, and the commands that invoke controlled functions at the computer of the station of FIG. 3 are those that are addressed to URS microcomputers, 205.

Nevertheless, control processor, 39J, of decoder, 30, certainly has capacity to process the meter-monitor information of said command for information that identifies the programming in which it is embedded. (Hereinafter, said command is called the "2nd command (#5).")

Receiving the binary information of said command causes control processor, 39J, to record said binary information at said SPAM-input-signal register memory then locate and compare the "program unit identification code" of said command with the program unit information of the monitor information that it retains in said RAM associated with the channel mark of wireless channel 5. Said "code" identifies a particular super market chain commercial program unit and because no information of said "code" has previously been received at control processor, 39J, no match results. Not resulting in a match causes said control processor, 39J, to cause matrix switch, 39I, to cease transferring information from said EOFS valve, 39F, to control processor, 39J, and commence transferring information from control processor, 39J, to buffer/comparator, 8; to transmit a message that consists of binary information of a "00" header then the execution segment information of the pseudo command then a meter-monitor segment containing said monitor information in RAM (including the associated channel mark and the format information of said information) then any padding bits required to end said message (which message is called, hereinafter, the "2nd-old-program-message (#5)"); to determine that said command does not contain subject matter meter-monitor information (causing said control processor, 39J, not to transmit a message that enables microcomputer, 205, to tune receiver apparatus automatically but to transmit a new program message for processing by buffer/comparator, 14, alone); and to transmit a message that consists of binary information of a "00" header then the execution segment information of the pseudo command then meter-monitor segment information that includes the "program unit identification code" of said 2nd command (#5) and the channel mark of cable channel 13 as well as appropriate meter-monitor format information then any padding bits required to end said message (which message is called, hereinafter, the "2nd-new-program-message (#5)") Automatically, said control processor, 39J, then deletes from said RAM all information of said monitor information in RAM except the information of said channel mark and records at said RAM, associated with said channel mark, the meter-monitor segment information of the information at said SPAM-input-signal memory, which is said 2nd command (#5), but replaces the meter-monitor format information that is recorded with new format information that reflects the addition of a channel mark. Finally, controller, 39J, transmits particular detection-complete information to controller, 20; causes all apparatus of decoder, 30, except said RAM to cease receiving SPAM message information and delete all information received on said wireless channel 5; and causes said matrix switch, 39I, to cease transferring information from said control processor, 39J, to said buffer/comparator, 8, and commence transferring SPAM message information from EOFS valve, 39F, to its null output.

Said detection-complete information causes controller, 20, to cause oscillator, 6, to cause the selection of the next channel in the predetermined television channel selection pattern: wireless channel 9. Automatically oscillator, 6, causes mixer, 3, to select the frequency of channel 9 and input said frequency of interest, at a fixed frequency, to decoder, 30. Controller, 20, then transmits a particular preprogrammed wireless-9 instruction to said control processor, 39J, that informs said processor, 39J, wireless channel 9 is inputted to decoder, 30.

Receiving said wireless-9 instruction causes control processor, 39J, to cause all apparatus of decoder, 30, to commence receiving, detecting, and processing SPAM message information embedded in the inputted frequency of interest.

When the input of wireless channel 9 to decoder, 30, commences, the remote wireless station transmitting the channel 9 transmission is transmitting no signal information in the normal transmission pattern.

EOFS valve, 39F, of decoder, 30, waits to receive detected SPAM signal information, but none is transmitted by said remote wireless station.

Controller, 20, has capacity for keeping track of elapsed time, and after determining in a predetermined fashion that a particular predetermined period of time has elapsed from the input of wireless channel 9 to decoder, 30, controller, 20, automatically causes control processor, 39J, to cause all apparatus of decoder, 30, cease receiving SPAM message information and delete all information received on said wireless channel 9 and causes oscillator, 6, to cause the selection of the next channel in the predetermined television channel selection pattern: wireless channel 13. Automatically, oscillator, 6, causes mixer, 3, to select the frequency of channel 13 and input said frequency to decoder, 30. Controller, 20, then transmits a particular preprogrammed wireless-13 instruction to said control processor, 39J, that informs said processor, 39J, wireless channel 13 is inputted to decoder, 30.

Receiving said wireless-13 instruction causes control processor, 39J, to cause all apparatus of decoder, 30, to commence receiving, detecting, and processing SPAM message information embedded in the inputted frequency of interest.

The remote wireless station transmitting the channel 13 transmission is transmitting the same "Wall Street Week" program that is transmitted by the remote cable station transmitting the cable channel 13 transmission. When the input of wireless channel 13 to decoder, 30, commences, said remote wireless station is still transmitting the binary information of the information segment following the first combining synch command of said "Wall Street Week" program.

In due course said remote wireless station transmits the end of file signal that terminates said information segment, and the EOFS valve, 39F, of decoder, 30, receives and detects said signal, in its end of file detecting fashion, causing said valve, 39F, to transmit the aforementioned EOFS-signal-detected information to said control processor, 39J. Just as applied in the case of the 2nd command (#5), receiving said EOFS-signal-detected information causes control processor, 39J, to cause EOFS valve, 39F, to discard all information of said end of file signal; to cause said matrix switch, 39I, to cease transferring SPAM message information from said EOFS valve, 39F, to its null output information and commence transferring SPAM message information from said valve, 39F, to said control processor, 39J; then to cause EOFS valve, 39F, to recommence processing inputted signal words in its preprogrammed fashion and transferring said words to matrix switch, 39I; and to commence waiting to receive from said switch, 39I, the binary information of a subsequent SPAM header.

Subsequently, said remote wireless station transmits the second combining synch command of the "Wall Street Week" program. (Hereinafter, said command may be called the "3rd command (#5).")

Receiving the binary information of said command causes control processor, 39J, to record said binary information at said SPAM-input-signal register memory then locate and compare the "program unit identification code" of said command with the program unit information of the monitor information that it retains in said RAM associated with the channel mark of wireless channel 13. Since this is the first monitor information of the "Wall Street Week" program received at control processor, 39J, from an inputted wireless channel 13 transmission, no match results. Not resulting in a match causes said control processor, 39J, automatically to cause matrix switch, 39I, to cease transferring information from said EOFS valve, 39F, to control processor, 39J, and commence transferring information from control processor, 39J, to buffer/comparator, 8, then to transmit a message that consists of binary information of a "00" header then the execution segment information of the pseudo command then a meter-monitor segment containing said monitor information in RAM (including the associated channel mark and the format information of said information) then any padding bits required to end said message. (Hereinafter, said message is called the "3rd-old-program-message (#5)".) Then, in a predetermined fashion, control processor, 39J, determines that said command contains subject matter meter-monitor information causing said control processor, 39J, to transmit a message that consists of binary information of a "00" header then the aforementioned execution segment information that is addressed to microcomputer, 205, (and that causes microcomputer, 205, to process the information of the meter-monitor segment immediately following said execution segment information as new programming now being transmitted on the channel of the channel mark of said meter-monitor segment segment) then meter-monitor segment information that includes the "program unit identification code" and subject matter information of said command and the channel mark of wireless channel 13 as well as appropriate meter-monitor format information then any padding bits required to end said message. (Hereinafter, said message is called the "3rd-new-program-message (#5)".) Then automatically said control processor, 39J, deletes from said RAM all information of said monitor information in RAM except the information of said channel mark and records at said RAM, associated with said channel mark, the meter-monitor segment information of the information at said SPAM-input-signal memory, which is said 3rd command (#5), but replaces the meter-monitor format information that is recorded with new format information that reflects the addition of a channel mark. Finally, controller, 39J, transmits particular detection-complete information to controller, 20; causes all apparatus of decoder, 30, except said RAM to cease receiving SPAM message information and delete all information received on said frequency of interest (that is, wireless channel 13); and causes said matrix switch, 39I, to cease transferring information from said control processor, 39J, to said buffer/comparator, 8, and commence transferring SPAM message information from EOFS valve, 39F, to its null output.

Receiving said detection-complete information causes controller, 20, to cause oscillator, 6, to cause selection of the next channel in the predetermined television channel selection pattern: cable channel 2. Automatically oscillator, 6, causes switch, 1, to shift its contact lever from the second alternate contact to the first alternate contact to which cable transmissions are inputted and causes mixer, 3, to select the frequency of channel 2 and to input said frequency of interest, at a fixed frequency, to decoder, 30. Controller, 20, then transmits a particular preprogrammed cable-2 instruction to said control processor, 39J, that informs said processor, 39J, cable channel 2 is inputted to decoder, 30.

While TV signal decoder, 30, is processing signal information in video transmissions inputted from switch, 1, and mixer, 3, radio signal decoder, 40, is, in a similar fashion, processing SPAM information in radio transmissions inputted from mixer, 2.

(Radio signal decoder, 40, is shown in greater detail in FIG. 2B. The controller, 44, of decoder, 40, is identical, in composition, to the controller, 39, of FIG. 3A. And the components of said controller, 44, are referred to, hereinafter, using the same alphanumeric identification system that applies to the components of FIG. 3A. For example, the control processor of said controller, 44, is referred to, hereinafter, as control processor, 44J.)

Controller, 20, has preprogrammed all apparatus of decoder, 40, appropriately to receive and process the SPAM information of said radio transmission in the same fashion that controller, 30, receives and processes SPAM information embedded in its inputted television transmissions. Control processor, 44J, controls all controlled apparatus of decoder, 40, and causes radio decoder, 42, to detect signal information in the normal radio transmission location. At the RAM associated with the control processor, 44J, is bit information of a channel mark associated with each radio frequency transmission received at decoder, 40. (The frequency identification information of decoder, 40, is called "channel marks" here rather than "frequency marks" for simplicity of exposition.) At said RAM, control processor, 44J, maintains, associated with appropriate channel mark information, monitor information records of the last command containing meter-monitor program identification information inputted via each frequency transmission.

At the outset of the example, mixer, 2, is selecting the frequency of 100.0 MHz of the FM frequency spectrum and inputting said frequency, at a fixed frequency, to decoder, 40. EOFS valve, 44F, has identified an end of file signal embedded in the inputted 100.0 MHz frequency transmission and is set to receive and transfer SPAM message information. Matrix switch, 44I, is set to transfer SPAM message information from EOFS valve, 44F, to control processor, 44J. And control processor, 44J is set to receive and process header information of a SPAM message.

Subsequently, the remote FM radio station that originates the 100.0 MHz broadcast embeds in the normal transmission location of its transmission and transmits a SPAM message that consists of a "00" header; the pseudo command execution segment; a meter-monitor segment that includes particular program unit identification information, particular subject matter information, and particular appropriate meter-monitor format information; and any required padding bits. (Hereinafter, the command of said message is called the "4th command (#5).") Said transmission is received at the remote cable transmission station that transmits the multi-channel cable transmission inputted to signal processor, 200; combined into the full spectrum cable transmission on the 100.0 MHz frequency; and retransmitted. Mixer, 2, selects said 100.0 MHz frequency of said transmission and inputs said frequency, at a fixed frequency, to radio signal decoder, 40.

Receiving said frequency causes decoder, 40, to detect and process the command information of said 4th command (#5). The inputted frequency of channel 13 is inputted, first, to radio receiver circuitry, 41, which receives the radio information of said frequency and inputs said information to radio decoder, 42, which decodes the embedded signal information of said command and transmits said signal information to digital detector, 43, which detects the binary information with error correcting bit information of said command and transfers said binary and bit information to controller, 44. Thereafter, the embedded information of said command is caused to be recorded at the SPAM-input-signal register memory of control processor, 44J, in the same fashion that the embedded information of the 1st command (#5) is detected and recorded at decoder, 30. Receiving the embedded information of the 4th command (#5) causes the binary SPAM information of said command to be detected at detector, 44; checked and corrected, as necessary, at processor, 44B; converted into locally usable binary information at processor, 44D; and recorded at the SPAM-input-signal memory of said control processor, 44J.

Receiving said command causes the instructions preprogrammed at the RAM and ROM associated with control processor, 39J, to cause control processor, 44J, to process the information of said command in the following fashion. In a predetermined fashion, control processor, 44J, locates the monitor information that it retains in said RAM associated with the channel mark of the 100.0 MHz frequency and compares the "program unit identification code" of said command with the program unit information of said monitor information in RAM. No match results which indicates a new program unit is being transmitted on said frequency. Not resulting in a match causes said controller, 44, automatically to transfer information of new programming to microcomputer, 205, and to transfer to buffer/comparator, 14, for further processing said monitor information in RAM which is monitor information of prior programming transmitted on said frequency. Automatically, said control processor, 44J, causes matrix switch, 44I, to cease transferring information from EOFS valve, 44F, to control processor, 44J, and commence transferring information from control processor, 44J, to buffer/comparator, 8, (to which said matrix switch, 44I, has capacity to transfer information). Automatically said control processor, 44J, transmits a message that consists of binary information of a "00" header then the execution segment information of the pseudo command then a meter-monitor segment containing said monitor information in RAM (including the associated channel mark and the format information of said information) then any padding bits required to end said message. (Hereinafter, said transmission of is called the "1st-old-radio-program-message (#5)".) Then, in a predetermined fashion, control processor, 44J, determines that said command contains subject matter meter-monitor information, causing control processor, 44J, to transmit a message that consists of binary information of a "00" header then particular execution segment information that is addressed to microcomputer, 205, (and that causes microcomputer, 205, to process the meter-monitor information of said message as new programming now being transmitted on said 100.0 MHz frequency) then meter-monitor segment information that includes the "program unit identification code" and subject matter information of said first command and the channel mark of said 100.0 MHz frequency as well as appropriate meter-monitor format information then any padding bits required to end said message. (Said message is called, hereinafter, the "1st-new-radio-program-message (#5)".) Then said control processor, 44J, deletes from said RAM all information of said monitor information in RAM except the information of said channel mark and records at said RAM, associated with said channel mark, the meter-monitor segment information of the information at said SPAM-input-signal memory, which is said command, but replaces the meter-monitor format information that is recorded with new format information that reflects the addition of a channel mark. Finally, controller, 44J, transmits particular radio-detection-complete information to controller, 20; causes all apparatus of decoder, 40, except said RAM to cease receiving SPAM message information and delete all information received on said frequency of interest (that is, frequency 100.0 MHz); and causes said matrix switch, 44I, to cease transferring information from said control processor, 44J, to said buffer/comparator, 8, and commence transferring SPAM message information from EOFS valve, 44F, to its null output.

Said radio-detection-complete information causes controller, 20, to cause oscillator, 6, to cause the selection of the next frequency in the predetermined radio frequency selection pattern: 99.0 MHz. Automatically oscillator, 6, causes mixer, 2, to select said frequency and input it, at a fixed frequency, to decoder, 40. Controller, 20, then transmits a particular preprogrammed radio-99.0 instruction to control processor, 44J, that informs said processor, 44J, 99.0 MHz is inputted to decoder, 40.

Receiving said radio-99.0 instruction causes control processor, 44J, to cause all apparatus of decoder, 40, to commence receiving, detecting, and processing SPAM message information embedded in the inputted frequency of interest.

When the input of FM radio frequency 99.0 MHz to decoder, 40, commences, the remote station transmitting the 99.0 MHz radio transmission is transmitting no SPAM information in the normal transmission location.

EOFS valve, 44F, of decoder, 40, waits to receive detected SPAM signal information, but none is transmitted by said remote wireless station.

After determining, in a predetermined fashion, that a particular predetermined period of time has elapsed from the input of said 99.0 MHz frequency to decoder, 40, controller, 20, automatically causes control processor, 44J, to cause all apparatus of decoder, 40, to cease acting to receive SPAM message information embedded in said frequency and to delete all information received on said frequency and causes oscillator, 6, to cause the selection of the next frequency in the predetermined radio frequency selection pattern: 100.0 MHz. Automatically, oscillator, 6, causes mixer, 2, to select said frequency and input it, at a fixed frequency, to decoder, 40. Controller, 20, then transmits a particular preprogrammed radio-100.0 instruction to control processor, 44J, that informs said processor, 44J, 100.0 MHz is inputted to decoder, 40.

In the example, buffer/comparator, 8, receives from decoder, 30, the 1st-, 2nd-, and 3rd-old-program-message (#5) messages and the 1st-, 2nd-, and 3rd-new-program-message (#5) messages and from decoder, 40, the 1st-old-radio-program-message (#5) and 1st-new-radio-program-message (#5) messages.

Receiving each one of said messages causes buffer/comparator, 8, first, to place said one at a particular received signal location at buffer/comparator, 8, then to compare a particular portion the first X bits immediately after the first H bits of said binary information (which X bits is the execution segment of said one) to the aforementioned particular comparison information in its automatic comparing fashion. In each case, no match results which signifies that none of said messages instructs URS signal processors, 200, to decrypt. Not resulting in a match causes buffer/comparator, 8, to transfer each one directly to controller, 12, as soon as controller, 12, becomes prepared to receive said one.

(The system of the present invention has capacity for processing encrypted SPAM program identification information; however, in the preferred embodiment, the decryption of said information takes place at the decryptors, 39K, 44K, or 47K, of the controllers, 39, 44, or 47, of decoders, 30, 40, or of FIG. 2C, before said decoders input their detected SPAM program identification information to buffer/comparators, 8. Such decryption is affected in the fashion of the decryption of the first and second messages of example (#4) at decoder, 203.)

All eight of said messages are commands. The 1st- and 3rd-new-program-message (#5) and the 1st-new-radio-program-message (#5) signals are addressed to microcomputer, 205. Each informs said microcomputer of new programming transmissions to which said microcomputer can tune appropriate station receiver and display apparatus in fashions described below. (Hereinafter said commands are called "guide commands" because they can guide station control apparatus to desired programming.) By contrast, the 1st-, 2nd-, and 3rd-old-program-message (#5) messages, the 2nd-new-program-message (#5), and the 1st-old-radio-program-message (#5) inform no station control apparatus of new programming transmissions because said commands are addressed to no apparatus; the execution segment of each is the aforementioned pseudo-command. (Hereinafter, each said signal is called a "transparent command" because no subscriber station control apparatus "sees" said signal.)

Receiving each transparent or guide command from buffer/comparator, 8, causes controller, 12, (which is equipped with a matrix switch, 12I, and a control processor, 12J, with associated RAM and ROM) to process each, in turn, in its preprogrammed fashions (which are similar to the preprogrammed fashions of controller, 39, of decoder, 203). Receiving each command causes controller, 12, to record said command at the SPAM-input-signal register memory of controller, 12, then to compare the execution segment of each command to the aforementioned controlled-function-invoking-@12 information. Each execution segment of a guide command matches particular preprogrammed transfer-this-message-to-205-@12 information that invokes particular preprogrammed instructions that cause controller, 12, to input the message of said command to buffer, 39G, of controller, 39, of decoder, 203. (Receiving said message causes said controller, 39, to input information of said command to microcomputer, 205, thereby informing microcomputer, 205, that new programming of the particular subject matter and program identification unit identified of said guide command is being transmitted on the channel of the channel mark of said guide command and causing microcomputer, 205, to process in a fashion that is described more fully below.) Each execution segment of a transparent command matches particular preprogrammed pseudo-function-@12 information that invokes no particular preprogrammed controlled function instructions.

In example #5, controller, 12, is preprogrammed to process monitor information, and completing the controlled functions invoked by any given message causes controller, 12, automatically to process the information of said message as monitor information, in the fashion of controller, 39, of decoder, 203, in example #3. Automatically after transmitting the last bit of each guide command or determining that the execution segment of each transparent command invokes no controlled function, controller, 12, commences processing the information at said SPAM-input-signal memory as monitor information. Automatically, control processor, 12J, transfers to buffer/comparator, 14, via matrix switch, 12 I, header information that identifies a transmission of monitor information of available programming then all of the information that is recorded at said SPAM-input-signal memory. (In each example #5 case, the information that is transferred—together with its newly added header information—continues to be called by its previously assigned name; for example, the 1st-old-radio-program-message (#5).) Then controller, 12, from memory all information of said given message and commences waiting to receive the binary information of a subsequent message from buffer/comparator, 8.

Particular ones of said eight messages convey first instances of particular program unit identification monitor information associated with particular channel marks. Said ones are the 1st-, 2nd-, and 3rd-new-program-message (#5) messages and the 1st-new-radio-program-message (#5). Others of said messages convey last instances of such information associated with said channel marks. Said others are the 1st-, 2nd-, and 3rd-old-program-message (#5) messages and the 1st-old-radio-program-message (#5). (Hereinafter, monitor information messages that convey first instances of particular program unit identification information associated with particular channel marks are called "new programming messages," and messages that convey last instance information are called "old programming messages.")

Signal processor, 200, processes the monitor information of said messages in a fashion that is similar to the monitor information processing of examples #3 and #4.

Receiving each of said eight messages (with said header information that identifies monitor information of available programming added) causes buffer/comparator, 14, to determine that said header information matches particular preprogrammed monitor-information-identification information, causing buffer/comparator, 14, to input each message, in turn, to onboard controller, 14A.

Receiving any given old programming message causes onboard controller, 14A, to execute particular preprogrammed process-monitor-info-of-available-programming instructions. Said instructions cause onboard controller, 14A, to determine that the channel mark and program unit identification information in said old programming message matches the channel mark and program unit identification information of a selected monitor information record previously initiated by a particular new programming message and to update the information of said selected record by modifying the information content of said record by adding and/or deleting and/or replacing information in such a way that the information of said record reflects to the fullest extent which particular programming is available on which channels at the station of FIG. 3 (and at selected other stations that are preprogrammed and preconfigured to collect monitor information) and by recording date and time information, received from clock, 18, in such a way that the information of said record reflects when said particular programming is available. The programming monitored for availability and the information recorded can include not only programming identified by the aforementioned "program unit identification codes" that identify television programs but also, for example, computer programming information such as the information, in the meter-monitor segment of the first combining synch command of the "Wall Street Week" example, that identifies the program instruction set that follows said command and the supplier of said set.

Receiving any given new programming message causes onboard controller, 14A, to determine that the program unit identification information in said message does not match the program unit identification information of that selected monitor information record whose channel mark matches the channel mark of said new programming message, causing onboard controller, 14A, automatically to cause signal processor, 200, to record said selected monitor information record at recorder, 16, in the fashion that onboard controller, 14A, caused signal processor, 200, to record the aforementioned record of prior programming upon receiving the 1st monitor information (#3). Then, automatically, onboard controller, 14A, executes the aforementioned process-monitor-info-of-available-programming instructions. Said instructions cause onboard controller, 14A, to initiate a new monitor record that reflects the availability of the programming identified in said new programming message. Automatically, said instructions cause onboard controller, 14A, to delete all information at the record location of said selected monitor information record except the channel mark associated with said record and to record at said record location the "program unit identification code" information of said new programming message, such other selected information of said new programming message that identifies other particular programming is available on the channel of said channel mark, and current date and time information, received from clock, 18. In this fashion, the system of the present invention initiates records at the station of FIG. 3 (and at selected other stations that are preprogrammed and preconfigured to collect monitor information) that reflect to the fullest extent which particular programming becomes available at said station (and said other stations), on which channels, and when.

Operating Signal Process of Systems . . . Signal Record Transfer

In examples #3, #4, and #5, the transmission of SPAM signal information causes signal processor, 200, to transfer signal record information by telephone to remote station computers. At the outset of each example, recorder, 16, has reached a level of fullness where recording the next signal record will cause the quantity of recorded information to equal or exceed the particular fullness information of said recorder, 16. In example #3 and #4, receiving the first message of the "Wall Street Week" program causes decoder, 203, to transfer to buffer/comparator, 14, the 1st monitor information (#3) and the 1st meter & monitor information (#4), respectively, and receiving the 1st monitor information (#3) and the 1st meter & monitor information (#4) causes buffer/comparator, 14, to transfer record information of the prior program displayed at monitor, 202M, to recorder, 16, and causes recorder, 16, to record said information. In example #5, receiving transmitted SPAM message information causes decoders, 30 and 40, to transmit the 1st-new-program-message (#5) and the 1st-new-radio-program-message (#5) messages, respectively, and receiving information of said 1st-new-program-message (#5) and said 1st-new-radio-program-message (#5) causes buffer/comparator, 14, to transfer old programming record information to recorder, 16, and causes recorder, 16, to record said information. In each example, the transfer of the first record information from buffer/comparator, 14, causes recorder, 16, to execute the automatic telephone signal record transfer sequence described above.

In each example, when the automatic processing caused by the received SPAM signal information reaches the point at which recorder, 16, finishes recording the first signal record information transferred from buffer/comparator, 14, recorder, 16, measures the quantity of its recording capacity that holds signal records, in a predetermined fashion, and determines that said quantity is equal to or greater than said particular fullness information. Said determining causes recorder, 16, to transfer a particular instruct-to-call instruction to controller, 20, that causes controller, 20, to activate telephone connection, 22, and proceed with a particular preprogrammed telephone signal record transfer sequence that is fully automatic.

The first stage of said sequence involves transferring audit information to a particular first host computer at a first remote station. Controller, 20, transfers the telephone number, 1-800-AUDITOR, to auto dialer, 24, and causes said dialer, 24, to dial said number. Said first computer answers said telephone call, and in a fashion well known in the art, controller, 20, and said first computer automatically establish telephone communications. Automatically, controller, 20, causes telephone connection, 22, to transfer particular identifying information that includes the unique digital identifying code of ROM, 21, to said first computer followed by a particular instruct-to-receive signal. Said instruct-to-receive signal causes said first computer automatically to prepare to receive audit records then to transfer a particular start signal via connection, 22, to controller, 20. Receiving said start signal, sent automatically in response to controller, 20's, instruct-to-receive signal, causes controller, 20, to cause recorder, 16, to transmit all recorded meter audit records and particular other audit information to telephone connection, 22, which causes said connection, 22, to transmit said records and information to said first computer. When recorder, 20, transmits the last bit of said record and other information, recorder, 20, transmits particular finished-with-first-stage information to controller, 20, which causes controller, 20, to transmit a particular acknowledge receipt instruction to said first computer. Automatically said first computer determines, in a predetermined fashion, that the audit information has been received correctly and completely, and said determining causes said first computer automatically to transmit a particular transmission complete signal to controller, 20. Receiving said complete signal causes controller, 20, to cause telephone connection, 22, to terminate said telephone call. Then controller, 20, transfers information to recorder, 16, that causes recorder, 16, to erase from memory all said record and other information that is not also meter charge information or monitor information.

Having completed the first stage, controller, 20, then commences automatically the second stage of said sequence which involves transferring meter charge information to a particular second host computer at a second remote station. Controller, 20, transfers the telephone number, 1-800-CHARGES, to auto dialer, 24, and causes the dialing of said number. But said number is busy. Telephone connection, 22, receives a telephone busy signal, well known in the art, and transfers information of said signal to controller, 20. Receiving said information causes controller, 20, to execute a preprogrammed redial sequence. Thereafter, whenever controller, 20, polls its input sources for input signal information in a polling fashion well known in the art, it causes dialer, 24, regularly to redial said number. Controller, 20, continues said redialing until said second computer answers said call.

Said redial sequence does not prevent controller, 20, from proceeding with other processing tasks; it merely defers execution of the remaining preprogrammed instructions of the second stage. When said second computer answers said call, controller, 20, will automatically execute said remaining instructions.

Having deferred further execution of the second stage, controller, 20, proceeds to the third stage which involves transferring monitor information to a particular third host computer at a third remote station. Controller, 20, causes the dialing of the telephone number, 1-800-MONITOR, and establishes telephone communications with said third computer. Automatically, controller, 20, causes the transfer to said third computer of particular identifying information and a particular instruct-to-receive signal causing said third computer to determine that it is not prepared to receive information and to respond with a particular call-back signal. Said call-back signal instructs controller, 20, to defer further execution of the third stage until a particular deferred time—the first waiting moment after 1:00 AM the following morning—and causes controller, 20, to execute a preprogrammed time-check-and-determining sequence. Under control of said sequence, as a regular step in the sequence of the aforementioned polling fashion, controller, 20, checks the time of clock, 18, and determines whether said clock time is after said deferred time.

Having deferred further execution of the third stage, controller, 20, proceeds with other processing. The third stage is the final stage of said automatic telephone signal record transfer sequence. Accordingly, controller, 20, starts polling for instructions and commences regularly executing said redial and said time-check-and-determining sequences.

Subsequently, in the course of executing said redial instructions, controller, 20, and said second computer establish telephone communications in the fashion described in the first stage above. Controller, 20, then causes the transfer to said second computer of particular identifying information followed by a particular instruct-to-receive signal causing said second computer to respond with a particular start signal that causes controller, 20, to cause the transmitting of all recorded meter charge records to said second computer. When recorder, 20, finishes transmitting meter charge information, controller, 20, transmits a particular acknowledge receipt instruction to said second computer. Automatically said second computer responds with a particular transmission complete signal that causes controller, 20, to terminate said telephone call then to cause recorder, 16, to erase from memory all said meter charge information. Then, in a preprogrammed fashion, controller, 20, deactivates the redial sequence instruction portion of said polling sequence.

So completing the second stage causes controller, 20, once again to commence polling for instructions.

Subsequently, controller, 20, determines that said clock time is after said deferred time which causes controller, 20, automatically to deactivate said time-check-and-determining sequence and recommence said third stage. Automatically, controller, 20, reestablishes telephone communications with said third computer and causes said third computer to transfer to controller, 20, its particular start signal. Then controller, 20, causes the transmitting of all recorded monitor records to said third computer. When said transmitting is finished, controller, 20, transmits a particular acknowledge receipt instruction to said third computer. Automatically said third computer responds with a particular transmission complete signal that causes controller, 20, to terminate said telephone call then to cause recorder, 16, to erase from memory all said monitor record information.

Completing the final deferred instructions of said automatic telephone signal record transfer sequence causes controller, 20, to end said sequence and commence processing in the conventional fashion.

In examples #3 and #4 (and #5 if information of said 1st-new-program-message (#5) reaches buffer/comparator, 14, before any other instance of monitor information), receiving the first message of the "Wall Street Week" program causes the apparatus of the FIG. 3 subscriber station to carry out said signal record transfer sequence. Simultaneously, other stations have reached a similar level of fullness, and said command causes said other stations also to execute said transfer sequence. Accordingly, not only does transmitting said first message cause all the functions described above in example #3 and #4 (and #5), transmitting said message also causes apparatus at one and more subscriber stations to transfer recorded information selectively to one and more remote stations at the time of execution and at deferred times, causes computers at said stations to process said information, and causes said computers to transfer information, point-to-point, to said subscriber station apparatus.

Examples #3, #4, and #5 do not show the second message of the "Wall Street Week" program causing information to be recorded at the recorder, 16, of the subscriber station of FIG. 3. Accordingly, said message does not cause apparatus of said station to transfer of record information to one or more remote station computers.

Nevertheless, it is clear from the above exposition that the transmission of any SPAM command (including the pseudo command) that includes meter-monitor information can cause monitor record information to be recorded at the recorder, 16, of selected stations and can cause signal processors, 200, at selected ones of said stations (that is, at stations where recorders, 16, equal or exceed particular fullness information) to transfer meter and/or monitor record information selectively to one or more remote stations and cause computers at said stations to process the information in the fashions described herein.

(Indeed, as the above exposition makes clear, the impact of the transmission of SPAM information can be yet more complex and meaningful. In example #4, receiving the second message does cause selected stations to record monitor record information the recorders, 16, of said stations. Said stations are those stations that are preprogrammed to collect monitor information at which the first message is not decrypted but the second message is; at which, as a consequence, program unit identification information does not exist at SPAM-first-precondition memories and, hence, where FIG. 1C combinings fail to occur because the first precondition is not satisfied; and at which, as a consequence, receiving said second messages causes a 2nd monitor information (#4) transmission and causes processing of said 2nd monitor information (#4) at buffer/comparators, 14. At said stations, because no monitor information of the first "Wall Street Week" program message was previously processed—because none was decrypted—monitor record information of prior programming still exists at said buffer/comparators, 14, when said 2nd monitor information (#4) is received at said buffer/comparators, 14. At selected ones of said stations which ones where recorders, 16, will equal or exceed particular fullness information when the next instance of record information is recorded, receiving said second message causes the recording of said monitor record information of prior programming, causes the transferring of meter and/or monitor record information selectively to one or more remote stations, and causes computers at said stations to process the information in the fashions described herein.)

Regulating the Reception and Use of Programming

Including Example #6

Examples #2 and #4, above, illustrate methods of controlling encryption and decryption means, well known in the art, within signal processing systems to regulate (and meter) the reception and use of control instructions that generate combined medium overlay information and cause combinings to commence and cease at selected stations. Said means and methods involve the operation of preprogrammed cipher keys (such as keys J and Z) and cipher algorithms to decrypt transmitted information.

The present invention includes other apparatus and methods for regulating the reception and use of combined medium control instructions, and the apparatus and methods of the present invention that are used to control (and meter) combined medium communication can also regulate the reception and use of prior art electronic programming transmissions.

In the prior art, various means and methods exist for regulating the reception and use of electronically transmitted programming. Various scrambling means are well known in the art for scrambling, usually the video portion of analogue television transmissions in such a fashion that only subscriber stations with appropriate descrambling means have capacity to tune suitably to the television transmissions and display the transmitted television image information. Encryption/decryption means and methods, well known in the art, can regulate the reception and use of, for example, digital video and audio television transmissions, digital audio radio and phonograph transmissions, digital broadcast print transmission, and digital data communications. Other techniques, well known in the art, involve controlling interrupt means that may be as simple as on/off switches to interrupt or disconnect programming transmissions at stations that lack authorizing information or are determined in other fashions not to be duly authorized. Still other techniques, also well known in the art, involve controlling jamming means that spoil transmitted programming at stations that lack authorizing information or are determined not to be duly authorized, thereby degrading the usefulness of said programming. Such other techniques include, for example, inserting so-called "noise" into the transmitted programming which noise may be, for example, overlays of one or more separate transmissions.

Figure 4:
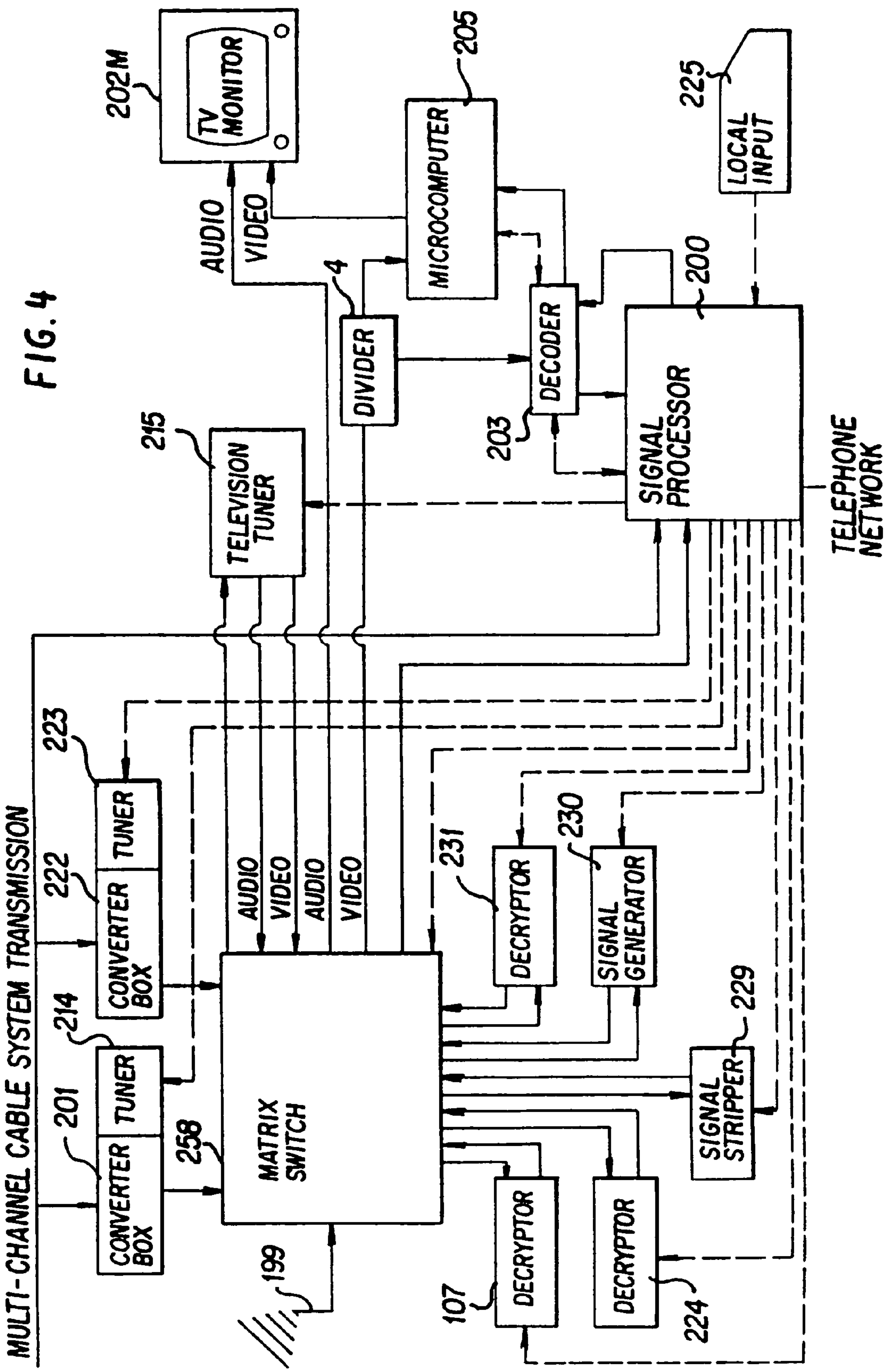
FIG. 4 is a block diagram of one example of a signal processing programming reception and use regulating system.

The means and methods of the present invention for regulating reception and use of programming relate, in particular, to three features of the present invention. The computer system of the present invention has capacity at each subscriber station to compute station specific information based on preprogrammed information that exists at each station and that differs from station to station. Given this capacity, any central control station of the present invention that originates a SPAM transmission can cause subscriber station apparatus to decrypt received SPAM information in different fashions with each station decrypting its received information is its own station specific fashion. A central station can cause different stations to compute different station specific decryption cipher keys and/or algorithms to use in any given step of decryption or to compute station specific key and/or algorithm identification information that differs from station to station and controls each station in identifying the key and/or algorithm to use for any given step of decrypting. A second feature of the present invention is that effective SPAM processing depends on the correspondence between the transmitted SPAM information that causes processing at the subscriber stations and the information preprogrammed at the various stations that controls the SPAM processing at each station. In order for any given SPAM execution segment to invoke any given controlled function at any given station, the received binary information of said segment (for example, “010011”) must match preprogrammed controlled-function-invoking information (“010011”) at each station. This feature permits each station to be preprogrammed with station specific controlled-function-invoking information that differs from station to station (which means that no single SPAM execution segment could invoke a given function at all stations without first being processed at selected stations to render its information to correspond to the station specific preprogrammed invoking information of said stations). The third feature of the present invention is an extended system of means and methods for regulating the reception and use of SPAM information—including decryption key and algorithm information—that is illustrated in FIG. 4 and discussed more fully below.

By themselves, the first and second features provide a technique whereby a message such as the second message of the “Wall Street Week” program can take affect at only selected stations (such as those stations preprogrammed with decryption key J) without being decrypted at said stations. (Hereinafter, this technique is called “covert control.”)

An example #6, that focuses on the second message of the “Wall Street Week” program and is set within the context of example #4, illustrates the operation of covert control.

In examples #1, #2, #3, and #4, the information of the execution segment of said second message, when unencrypted, is identical from example to example. For example, if said information is “100110” in example #1, it is “100110” in example #3 and, after decryption, in examples #2 and #4. And the preprogrammed execute-conditional-overlay-at-205 information that said information of the execution segment matches when compared with controlled-function-invoking information is also “100110”.

But in example #6 the information of the execution segment of said second message is different; for example, said information is “111111”. And the particular binary number that is selected—“111111” in the particular example—is selected because no subscriber station is preprogrammed, at the outset of the example, with any controlled-function-invoking information that is “111111”. (In other words, were said “111111” information of the execution segment transmitted without any other action taking place first, transmitting said information would cause no controlled function to be executed at any subscriber station because said information would not match any controller-function-invoking information at any station.)

In example #6, two particular messages are transmitted each of which consists of a “01” header; execution, meter-monitor, and information segments; and an end of file signal. (Hereinafter, said messages are called the “1st supplementary message (#6)” and the “2nd supplementary message (#6)”.) In each message, the information of said segments is encrypted prior to transmission in the same fashion that the information of the first message of example #4 is encrypted, except that the encryption is done with key J rather than key Z and the encrypted information of the execution segment instructs subscriber stations to decrypt with key J.

The “Wall Street Week” program originating studio embeds and transmits the 1st supplementary message (#6) before transmitting said second message.

Just as is the case with the first message of example #4, at the subscriber station of FIG. 3 (and at other stations that are preprogrammed with decryption key J), receiving the 1st supplementary message (#6) causes the apparatus of said station to decrypt said message (using key J) and execute any controlled functions that are invoked by the unencrypted execution segment of said message. Automatically, control processor, 39J, causes decryptor, 39K, to receive the information of said message; decryptor, 39K, decrypts the encrypted information of said message and transfers said message to EOFS valve, 39H; and EOFS valve, 39H, inputs the information of said message, unencrypted, to control processor, 39J, until the end of file signal of said message is detected. Automatically, control processor, 39J, compares the unencrypted information of the execution segment in said message to the aforementioned controlled-function-invoking information, and a match occurs with particular preprogrammed execute-at-39J information that causes control processor, 39J, to execute particular preprogrammed load-and-run-at-39J instructions.

Executing said instructions causes control processor, 39J, to record the received SPAM information of said 1st supplementary message (#6) in a fashion similar to the recording of the first message of example #4 except that the information of the information segment of said 1st supplementary message (#6) is recorded at particular RAM associated with control processor, 39J, rather than particular RAM of microcomputer, 205. Automatically, control processor, 39J, records all remaining command information of said 1st supplementary message (#6) together with any padding bits immediately following said command at the aforementioned SPAM-input-signal register memory then continues receiving the SPAM information of said message and loads said information (which is the information of the information segment of said message) at particular working memory of said RAM associated with control processor, 39J.

In due course, EOFS valve, 39H, receives complete information of the end of file signal that ends said 1st supplementary message (#6). Receiving said information causes EOFS valve, 39H, to transmit the aforementioned interrupt signal of EOFS-signal-detected information to control processor, 39J.

Receiving said signal while under control of said load-and-run-at-39J instructions causes control processor, 39J, to execute the information of the information segment of said 1st supplementary message (#6) that is loaded at said RAM as the so-called machine language instructions of one so-called job.

Executing said information causes control processor, 39J, in the predetermined fashion of the said information that is preprogrammed at said RAM at the time of execution by virtue of being so loaded prior to being so executed, to locate the location of that particular instance of controlled-function-invoking information that is “100110” (which is the execute-conditional-overlay-at-205 information that causes control processor, 39J, to execute the controlled function of said conditional-overlay-at-205 instruction) and modify the information at said location to be “111111”. (Simultaneously, other control processors, 39J, and at other stations that are preprogrammed with decryption key J execute information of loaded information of said information segment and modify information of the execute-conditional-overlay-at-205 information, at said control processors, 39J, to be “111111”.)

In this fashion, the execute-conditional-overlay-at-205 information at the control processors, 39J, of those selected subscriber stations that are preprogrammed with information of decryption key J is altered from its standard “100110” and becomes “111111”.

Accordingly, when the second message of the “Wall Street Week” program of example #6 is transmitted with its “111111” execution segment, said message is processed at those stations that are preprogrammed with said information of decryption key J precisely as the second message of example #3 is processed at said stations. (At all other stations, all information of said message is automatically discarded because the "111111" information of its execution segment fails to match any preprogrammed controlled-function-invoking information.)

The "Wall Street Week" program originating studio embeds and transmits the 2nd supplementary message (#6) after transmitting said second message.

At the subscriber station of FIG. 3 (and at other stations that are preprogrammed with decryption key J), receiving said 2nd supplementary message (#6) causes precisely the same processing that is caused by receiving the 1st supplementary message (#6) with just one exception. Whereas executing the loaded information of the information segment of the 1st supplementary message (#6) causes control processor, 39J, to locate that instance of controlled-function-invoking information that is "100110" and modify the information at the location of said "100110" to be "111111", executing the loaded information of the information segment of the 2nd supplementary message (#6) causes control processor, 39J, to locate that instance of controlled-function-invoking information that is "111111" and modify the information at the location of said "111111" to be "100110".

In this fashion, the execute-conditional-overlay-at-205 information at the control processors, 39J, of those selected subscriber stations that are preprogrammed with information of decryption key J is returned to its standard value: "100110". (Hereinafter, the normal binary value of a given instance of information that invokes a preprogrammed function—such as, for example, the "100110" that is the normal value of said execute-conditional-overlay-at-205 information—is called a "standard control-invoking value", and a value that temporary replaces a standard control-invoking value in the course a covert control application—such as "111111" in example #6—is called a "covert control-invoking value".)

Covert control provides significant benefits. One benefit is speed. For example, when covert control is employed, no time is spent decrypting messages (such as the second "Wall Street Week" message of examples #2 or #4) that convey combining synch commands. Thus the shortest possible interval of time can exist between the moment when a given combining synch command (such as the command of said second message) is embedded at the program originating studio and transmitted and the moment when it causes combining at those selected stations at which it causes combining. A second benefit arises out of the capacity to repeat. In example #6, after transmitting said 1st supplementary message (#6) and causing the covert control-invoking value, "111111", to replace the standard control-invoking value of the execute-conditional-overlay-at-205 information at those selected subscriber stations that are preprogrammed with decryption key J, the "Wall Street Week" program originating studio can invoke the aforementioned conditional-overlay-at-205 instructions at said selected stations not just once but many time by transmitting execution segments that are "111111" before transmitting said 2nd supplementary message (#6) and causing the standard control-invoking value of said execute-conditional-overlay-at-205 information, "100110", to replace said covert control-invoking value at said selected stations.

FIG. 4 shows the Signal Processing Programming Reception and Use Regulating System that is the third feature of the present invention.

The subscriber station of FIG. 4 has capacity for receiving wireless television programming transmissions at a conventional antenna, 199, and a multi-channel cable transmission at converter boxes, 201 and 222. Said boxes, 201 and 222, are conventional cable converter boxes with capacity, well known in the art, for receiving information of a selected channel of a multiplexed multi-channel transmission and converting the selected information to a given output frequency. The selected channels whose information is received at said boxes, 201 and 222 respectively, are selected by tuners, 214 and 223 respectively, which are conventional tuners, well known in the art, each with capacity for tuning to a selected channel. Antenna, 199, and boxes, 201 and 222, transmit their received information to matrix switch, 258, which is a conventional matrix switch, well known in the art, with capacity for receiving multiple inputs and outputting said inputs selectively to selected output apparatus. One apparatus that said switch has capacity for outputting to is television tuner, 215. However, the configuration FIG. 4 differs from the configuration of FIGS. 1 and 3 in that television tuner, 215, outputs its audio and video outputs to said matrix switch, 258, rather than to monitor, 202M, and divider, 4, respectively. Instead, in FIG. 4, it is said switch, 258, that outputs the information that is input to said monitor, 202M, and divider, 4. FIG. 4 shows five additional devices—three decryptors, 107, 224 and 231, a signal stripper, 229, and a signal generator, 230—associated with matrix switch, 258. Decryptors, 107, 224 and 231, are conventional decryptors, well known in the art, with capacity for receiving encrypted digital information, decrypting said information by means of a selected cipher algorithm and a selected cipher key, and outputting the decrypted information. Signal stripper, 229, is a conventional signal stripper, well known in the art, with capacity for receiving a transmission of video information, removing embedded or otherwise inserted signal information selectively, and outputting the transmission absent the removed information. Signal generator, 230, is a conventional signal inserter, well known in the art, with capacity for receiving a transmission of video information, embedding or otherwise inserting signal information selectively, and outputting the transmission with the embedded or otherwise inserted information. Matrix switch, 258, has capacity for outputting selected inputted transmissions to each said five devices, and each of said devices processes its inputted information in its specific fashion and outputs its processed information to said switch, 258.

As FIG. 4 shows, signal processor, 200, controls all the aforementioned apparatus. Signal processor, 200, controls the tuning of tuners, 214, 215, and 223; controls the switching of matrix switch, 258; supplies cipher algorithm and cipher key information to and controls the decrypting of decryptors, 107, 224 and 230; controls signal stripper, 229, in selecting transmission locations and/or information to strip and in signal stripping; and controls signal generator, 230, in selecting transmission locations at which to insert signals, in generating specific signals to insert, and in inserting.

In addition, FIG. 4 also shows divider, 4, monitor, 202M, decoder, 203, and microcomputer, 205, all of which function and are controlled as in FIGS. 1 and 3.

Finally, FIG. 4 shows local input, 225, well known in the art, which has means for generating and transmitting control information to controller, 20, of signal processor, 100. The function of local input, 225, is to provide means whereby a subscriber may input information to the signal processor of his subscriber station, thereby controlling the functioning of his personal signal processor system is specific predetermined fashions that are described more fully below. In the preferred embodiment, local input, 225, is actuated by keys that are depressed manually by the subscriber in the fashion of the keys of a so-called touch-tone telephone or the keys of a typewriter (or microcomputer) keyboard. As FIG. 4 shows, microcomputer, 205, also has capacity for inputting control information to microcomputer, 205, via decoder, 203, and in the preferred embodiment, microcomputer, 205, may also automatically substitute for local control, 225, in predetermined fashions in inputting control information to said controller, 20, on the basis of preprogrammed instructions and information previously inputted to said microcomputer, 205.

Operating S. P. Regulating Systems

Example #7

Example #7 illustrates the operation of the signal processing regulating system of FIG. 4 and demonstrates the interaction of the aforementioned first and third features of the present invention—the capacity to compute station specific information at each subscriber station and the system of regulating (and metering) means and methods that is illustrated in FIG. 4.

In example #7, the program originating studio that originates the "Wall Street Week" transmission transmits a television signal that consists of so-called "digital video" and "digital audio," well known in the art. Prior to being transmitted, the digital video information is doubly encrypted, by means of particular cipher algorithms A and B and cipher keys Aa and Ba, in such a way that said information requires decryption at subscriber stations in the fashion described below. The digital audio is transmitted in the clear. Said studio transmits the information of said program to a plurality of intermediate transmission stations by so-called "landline" means and/or Earth orbiting satellite transponder means, well known in the art.

Each of said intermediate transmission stations receives the transmission originated by said studio and retransmits the information of said transmission to a plurality of ultimate receiver stations.

In example #7, the intermediate station that retransmits "Wall Street Week" program information to the subscriber station of FIG. 4 is a cable television system head end (such as the head end of FIG. 6). Prior to retransmission, said station encrypts the digital audio information of said transmission, in a fashion well known in the art, using particular cipher algorithm C and cipher key Ca, then transmits the information of said program on cable channel 13, commencing at a particular 8:30 PM time on a particular Friday night.

In example #7, the controller, 20, of the signal processor, 200, of FIG. 4 is preprogrammed at a particular time with particular information that indicates that the subscriber of said station wishes to view said "Wall Street Week" program when transmission of said program on cable cable 13 commences.

(So preprogramming controller, 20, can occur in several fashions. For example, prior to a particular time, a subscriber may enter particular please-fully-enable-WSW-on-CC13-at-particular-8:30 information at local input, 225, and cause said information, in a predetermined fashion, to be inputted to controller, 20, by local input, 225. Alternately, microcomputer, 205, can be preprogrammed with particular specific-WSW information and, in a predetermined fashion that is described more fully below, caused to input said please-fully-enable-WSW-on-CC13-at-particular-8:30 information to said controller, 20.)

Receiving any given instance of please-fully-enable-WSW-on-CC13-at-particular-8:30 information causes controller, 20, in a predetermined fashion, to select particular WSW-on-CC13-at-particular-8:30 information in said received information, record said selected information at particular memory, and execute particular receive-authorizing-info-at-appointed-time instructions.

In a predetermined fashion, executing said instructions causes controller, 20, causes prepare to receive a particular enabling SPAM message at a particular time. Automatically, controller, 20, checks the time of the clock, 18, of signal processor, 200, periodically. At a particular commence-enabling time that is a predetermined interval prior to the aforementioned 8:30 PM time (when said originating studio commences transmitting the "Wall Street Week" program), controller, 20, causes all apparatus of the TV signal decoder, 30, to delete from memory all information of received SPAM information; transmits particular preprogrammed enable-next-program-on-CC13 information to the control processor, 39J, of said decoder, 30, and causes said control processor, 39J, to place one instance of said information at a particular controlled-function-invoking information location; causes the oscillator, 6, then to cause switch, 1, and mixer, 3, to select information of a particular master cable control channel (that may or may not be cable channel 13) from the multi-channel cable system transmission inputted to signal processor, 200, and to input said selected to TV signal decoder, 30; causes said control processor, 39J, to cause digital detectors, 34, 37, and 38, to cease inputting detected information to controller, 39, and commence discarding said information (which said detectors, 34, 37, and 37, have capacity to do) and to cause particular apparatus of decoder, 30, —for example, line receiver, 33, and digital detector, 34—to commence receiving and inputting to controller, 39, SPAM information detected in the frequency inputted to decoder, 30; causes said control processor, 39J, to commence waiting to receive the header information of a SPAM message; and places one instance of said enable-next-program-on-CC13 information at a particular controlled-function-invoking-@20 information location.

In the interval between said commence-enabling time and said 8:30 PM time, said head end is caused, in a predetermined fashion, to transmit a particular enabling SPAM message that consists of a "01" header, execution segment information that matches said enable-next-program-on-CC13 information, particular meter-monitor information, information segment information of particular enable-CC13 instructions and particular enable-WSW instructions that include particular enable-WSW-programming information, and an end of file signal on the frequency of said master control channel. (Hereinafter said message is called the "local-cable-enabling-message (#7).")

In the fashions described above, so transmitting said SPAM message causes signal processor, 200, at decoder, 30, (to which said master control channel is inputted), to detect the information of said message, select the information of the execution segment in said message, and determine that said selected information matches the aforementioned instance of enable-next-program-on-CC13 information at said particular controlled-function-invoking information location. So determining a match causes the control processor, 39J, to execute particular preprogrammed transfer-this-message-to-controller-20 instructions that are associated with the instance of information at said particular location.

The matrix switch, 39I, of the controller, 39 of decoder, 30, has capacity to transfer information to controller, 20, via control transmission means and executing said instructions causes said control processor, 39J, to cause the transfer of the information of said message to controller, 20, in the fashion in which information of first message of example #4 is transferred from control processor, 39J, and buffer, 39E (by way of EOFS valve, 39F), via matrix switch, 39I, to decryptor, 39K.

Receiving said message causes controller, 20, to load the enable-CC13 instructions and the enable-WSW instructions of the information segment of said message at particular RAM of controller, 20, and execute said instructions as the machine language instructions of one job. Automatically, controller, 20, selects the information of the execution segment in said message, determines that said selected information matches the aforementioned instance of enable-next-program-on-CC13 information at said particular controlled-function-invoking-@20 information location, executes particular preprogrammed load-and-run-@20 instructions that are associated with the instance of information at said particular location, loads the information of the information segment of said message—which information is said enable-CC13 instructions—at said RAM, and executes the information so loaded. (The process of so receiving, loading, and executing the information of said message proceeds at controller, 20, in the fashion of the receiving, loading, and executing the information of the aforementioned 1st supplementary message (#6) at the apparatus of the controller, 39, of decoder, 203, following the transfer of the converted information of said 1st supplementary message (#6) by the processor, 39D, of said controller, 39.)

Executing said enable-CC13 instructions at controller, 20, in this fashion, causes controller, 20, to sample selected preprogrammed SPAM information of the station of FIG. 4 and determine whether unauthorized tampering has occurred at said station. Automatically, in the predetermined fashion of the said instructions, controller, 20, selects information of the unique digital code at ROM, 21, that identifies signal processor, 200, and the subscriber station of FIG. 4 uniquely; computes the quotient that results from dividing said selected information by 65,536 (which is 2 raised to the 16th power); selects the integer portion of said quotient; branches, in a branching fashion well known in the art, to a selected one of a plurality of subroutines of said enable-CC13 instructions on the basis of the value of said integer; and executes said selected one subroutine. Executing said subroutine causes controller, 20, in a predetermined fashion, to select information of a particular sixteen contiguous bit locations that contain information of said enable-CC13 instructions and compare said selected information to selected information of a particular sixteen contiguous bit locations that hold preprogrammed SPAM operating information. (Said contiguous bit locations that hold preprogrammed SPAM operating information may be bit locations at any signal processing RAM or ROM at the station of FIG. 4, such as, for example, the RAM of controller, 20; the RAM of controller, 12; the RAM associated with the control processor, 39J, of decoder, 203; the RAM associated with the processor, 39B, of the decoder, 30, of signal processor, 200; etc.) A match indicates that said sixteen contiguous bit locations that hold preprogrammed SPAM operating information are preprogrammed with properly. A match occurs at the station of FIG. 4.

(Simultaneously other stations compare information of other selected information of bit locations that contain information of said enable-CC13 instructions with information of other local bit locations that hold preprogrammed SPAM operating information. At each station where a match fails to occur—which suggests that the preprogrammed SPAM operating information of said station has been tampered with in an unauthorized fashion—not resulting in a match causes the controller, 20, of said station to cause all information of said local-cable-enabling-message (#7) to be erased from all memory of said station except for a particular portion of said enable-CC13 instructions loaded at the RAM of said controller, 20, then to execute the information of said portion as information of a so-called "machine language job". Erasing said information from memory prevents the apparatus of said station from decrypting the encrypted information of said "Wall Street Week" program, and executing said portion causes said controller, 20, to cause the auto dialer, 24, and telephone connection, 22, to establish telephone communications with a particular predetermined remote station, in the fashion described above in "Operating Signal Processor Systems . . . Signal Record Transfer," and causes controller, 20, then to transmit information of the aforementioned unique digital code at ROM, 21, that identifies said station and signal processor, 200, of said station uniquely as well as particular predetermined appearance-of-tampering information. Transmitting said unique code and appearance-of-tampering information enables apparatus at said remote station to identify said remote station. If telephone communications are not established with said remote station in a predetermined fashion and/or within a predetermined time interval, executing said portion causes said controller, 20, to erase all preprogrammable RAM and EPROM of the signal processing apparatus at said station, thereby disabling said apparatus.)

Resulting in a match causes controller, 20, to execute a particular portion of said enable-CC13 instructions.

Executing the instructions of said portion causes controller, 20, in the predetermined fashion of the said portion, to cause selected apparatus of the station of FIG. 4 to receive the cable channel 13 transmission, to cause selected apparatus to decrypt the audio portion of said transmission, to cause selected apparatus to commence waiting to receive further enabling information, and to create a meter record that documents the decryption of the cable audio transmission at the station of FIG. 4. Automatically, controller, 20, causes matrix switch, 258, to cease transferring video and audio information to monitor, 202M. Then, automatically, controller, 20, causes a selected tuner, 214, to tune to the frequency of cable channel 13, thereby causing its associated converter box, 201, to convert its received information of said frequency (which information is received by means of its multi-channel cable system transmission input) to a selected output frequency and transfer said information at said frequency to matrix switch, 258. (Said selected tuner, 214, said selected frequency, and all other apparatus and/or modes of operation selected by controller, 20, under control of the information of said information segment are selected in predetermined fashions.) Automatically, controller, 20, causes matrix switch, 258, to transfer the information inputted from said box, 201, to the output that outputs to television tuner, 215, and causes said tuner, 215, to tune to said selected frequency, thereby causing said tuner, 215, to receive the information of cable channel 13 and output the audio and video portions of said information to matrix switch, 258, on the separate audio and video outputs of said tuner, 215. Automatically, controller, 20, causes matrix switch, 258, to transfer the information of said audio portion inputted from said tuner, 215, to the output that outputs to a selected decryptor, 107, thereby causing said decryptor, 107, to receive the information of said audio portion (said information being, as explained above, encrypted digital audio). Automatically, controller, 20, selects information of cipher key Ca from among the information of said portion; transfers said cipher key information to decryptor, 107; and causes decryptor, 107, to commence decrypting its received audio information, using said key information and selected decryption cipher algorithm C, and outputting decrypted information of the audio portion of the "Wall Street Week" program transmission to matrix switch, 258. Automatically, controller, 20, causes matrix switch, 258, to transfer the information inputted from decryptor, 107, to the output that that outputs to signal processor, 200, thereby causing signal processor, 200, to receive said information at a particular third alternate contact of switch, 1, (that is not shown in FIG. 2). Automatically, controller, 20, clears all information of any prior SPAM message from decoder, 30; causes switch, 1, to connect to said third contact, thereby inputting said information to mixer, 3; and causes mixer, 3, (by control transmission means via oscillator, 6) to transfer said information without any modification; causes the control processor, 39J, of decoder, 30, to cause the filter, 31, and modulator, 32, to transfer said information without any modification; causes said control processor, 39J, to cause digital detectors, 34 and 37, to cease inputting detected information to controller, 39, and commence discarding said information and to cause digital detector, 38, to commence inputting detected information to controller, 39; and causes said control processor, 39J, to commence waiting to receive the header information of a SPAM message. Then automatically, said enable-CC13 instructions cause controller, 20, to execute said enable-WSW instructions.

Executing said enable-WSW instructions causes controller, 20, to cause the control processor, 39J, of said decoder, 30, to place one instance of said enable-WSW-programming information (that said enable-WSW instructions include) at the particular controlled-function-invoking information location occupied by said enable-next-program-on-CC13 information (thereby overwriting said information), and said instruction cause controller, 20, to places one instance of said enable-WSW-programming information at the particular controlled-function-invoking-@20 information location occupied by said enable-next-program-on-CC13 information (thereby overwriting said information at said location, too).

Finally, controller, 20, completes execution of all information of the information segment of local-cable-enabling-message (#7) loaded at controller, 20, then in the fashion of the first message of example #4, controller, 20, processes automatically the information of the meter-monitor segment as meter information, causes a meter record of prior programming to be transferred from buffer/comparator, 14, and recorded at recorder, 16, (and causes the aforementioned signal record transfer sequence if recorder, 16, equals or exceeds if predetermined level of fullness); causes information of the meter-monitor segment to be placed at particular locations of buffer/comparator, 14, thereby creating a meter record that records the decryption of the audio portion of the "Wall Street Week" program transmission; and causes monitor information to be recorded by onboard controller, 14A, if the station of FIG. 4 is preprogrammed to collect monitor information.

Subsequently, but still in the interval between said commence-enabling time and said 8:30 PM time, said program originating studio embeds in the audio portion and transmits a particular SPAM message that consists of a "01" header, execution segment information that matches said enable-WSW-programming information, particular meter-monitor information, particular 1st-stage-enable-WSW-program instructions as the information segment information, and an end of file signal. (Hereinafter said message is called the "1st-WSW-program-enabling-message (#7).")

In the fashions described above, so transmitting said SPAM message causes signal processor, 200, at the digital detector, 38, of decoder, 30, to detect the information of said message and at the control processor, 39J, to select the information of the execution segment in said message and determine that said selected information matches the aforementioned instance of enable-WSW-programming information at said particular controlled-function-invoking information location. So determining a match causes said control processor, 39J, to execute the aforementioned transfer-this-message-to-controller-20 instructions.

Executing said instructions causes said control processor, 39J, to transfer the information of said message to controller, 20, in the fashion of the local-cable-enabling-message (#7).

Receiving the "1st-WSW-program-enabling-message (#7) causes controller, 20, to execute the aforementioned load-and-run-@20 instructions, to load the 1st-stage-enable-WSW-program instructions of the information segment at particular RAM of controller, 20, then to execute the information so loaded as the so-called machine language instructions of one so-called job.

Executing said 1st-stage-enable-WSW-program instructions causes controller, 20, in the predetermined fashion of said instructions, to affect a first stage of decrypting the video information of the "Wall Street Week" program transmission. Automatically, controller, 20, causes the control processor, 39J, of decoder, 30, to accept no SPAM message information from the EOFS valve, 39F. Then automatically, controller, 20, selects information of the last three significant digits of the binary information of the aforementioned unique digital code at ROM, 21; computes that particular Q quantity that is 16 less than the product of multiplying the numerical information of said digits times 256 (which is 2 to the 8th power); and selects information of those particular sixteen contiguous bit locations at the RAM associated with the control processor, 39J, of decoder, 30, that commence at the first bit location that is said Q quantity of bit locations after a particular first bit location at said RAM. At the station of FIG. 4, the preprogrammed information of said sixteen contiguous bit locations is decryption cipher key Ba. (In the present invention, the preferred method of preprogramming subscriber station signal processing apparatus is to preprogram each station with all authorized information but to vary the locations of the information from station to station in accordance with station specific information that varies from station to station—for example, in example #7, Ba cipher information can be preprogrammed at eight different RAM locations and the particular location that applies at any given station that is authorized with such information relates to the last three significant digits of the unique digital code of said station in the fashion of the above Q quantity computation.) Automatically, controller, 20, transfers said decryption cipher key Ba information to a selected decryptor, 224, and causes decryptor, 224, to commence decrypting any received information, using said key information and selected decryption cipher algorithm B, and outputting decrypted information to matrix switch, 258. Automatically, controller, 20, causes matrix switch, 258, to transfer the information of the aforementioned video output inputted from said tuner, 215, to the output that outputs to decryptor, 224, thereby causing said decryptor, 224, to receive the information of said video portion (said information being, as explained above, encrypted digital video), to decrypt said information, and to transfer decrypted information of said video portion to matrix switch, 258. Automatically, controller, 20, causes matrix switch, 258, to transfer the information inputted from decryptor, 224, to the output that that outputs to signal processor, 200, thereby causing signal processor, 200, to receive said information at the aforementioned third alternate contact of switch, 1. Automatically, controller, 20, clears all information of any prior SPAM message from decoder, 30; causes mixer, 3, and the filter, 31, and the modulator, 32, of decoder, 30, to input said information to the digital detector, 38, without any modification (switch, 1, is already connected to said third contact); and causes the control processor, 39J, of decoder, 30, to commence accepting SPAM message information from EOFS valve, 39F, and record all received SPAM message information in a predetermined fashion at the RAM associated with said control processor, 39J, until an interrupt signal of EOFS-signal-detected information is received and then to process said EOFS-signal-detected information in a predetermined fashion.

In due course, but still before said 8:30 PM time, said program originating studio embeds in the video portion and transmits particular SPAM check information that is not a SPAM message and consists only of a particular check sequence of binary information followed by an end of file signal. (Hereinafter said SPAM check information is called the "1st-WSW-decryption-check (#7).") Then said program originating studio ceases transmitting a television signal of digital video and digital audio.

Receiving the binary information of said check sequence at decoder, 30, causes digital detector, 38, to detect said information and causes control processor, 39J, to record said information at the RAM associated with said control processor, 39J, in the aforementioned predetermined fashion. Then receiving said end of file signal causes EOFS valve, 39F, to transmit an interrupt signal of EOFS-signal-detected information to control processor, 39J, thereby causing said processor, 39J, to transmit a particular check-data-loaded signal to controller, 20, in the aforementioned predetermined fashion.

Receiving said check-data-loaded signal causes controller, 20, under control of said 1st-stage-enable-WSW-program instructions, to cause the control processor, 39J, of decoder, 30, to transfer to controller, 20, selected information of said check sequence of binary information and compare said selected information to selected information of said 1st-stage-enable-WSW-program instructions. A match occurs at the station of FIG. 4, indicating that decryptor, 224, is decrypting its received information correctly.

(Simultaneously other stations compare selected information of said check sequence to selected information of said 1st-stage-enable-WSW-program instructions. At each station where a match fails to occur—which indicates that a decryptor, 224, is not decrypting its received information correctly and suggests that the preprogrammed SPAM operating information of said station may have been tampered with—not resulting in a match causes the controller, 20, of said station to cause all information of said 1st-WSW-program-enabling-message (#7) to be erased from all memory of said station except for a particular portion of said 1st-stage-enable-WSW-program instructions loaded at the RAM of said controller, 20, then to execute the information of said portion as instructions of a machine language job. Executing said portion causes controller, 20, to cause the auto dialer, 24, and telephone connection, 22, of said station to establish telephone communications with a particular predetermined remote station, in the fashion described above, and causes controller, 20, then to transmit the aforementioned appearance-of-tampering information together with complete information of the unique digital code that identifies said station uniquely. If telephone communications are not established with said remote station in a predetermined fashion and/or within a predetermined time interval, the instructions of said portion cause said controller, 20, to erase all preprogrammable RAM and EPROM of the signal processing apparatus at said station, thereby disabling said apparatus.)

Resulting in a match causes controller, 20, to execute a particular portion of said 1st-stage-enable-WSW-program instructions.

Executing the instructions of said portion causes controller, 20, to cause the apparatus of the station of FIG. 4 to cease receiving and decrypting the television information of said cable channel 13 as digital video and audio, to commence receiving said television information as conventional analog television, and to prepare to receive particular embedded SPAM information at the decoder, 30, of signal processor, 200. Automatically, controller, 20, causes matrix switch, 258, to cease transferring the information inputted from said converter box, 201, to the output that outputs to television tuner, 215; to cease transferring the information inputted from decryptor, 224, to the output that outputs to third alternate contact of switch, 1; and to commence transferring the information inputted from said converter box, 201, to the output that outputs to said third alternate contact. Automatically, controller, 20, causes mixer, 3, to select the frequency of channel 13 and input said frequency, at a fixed frequency, to TV signal decoder, 30. Automatically, controller, 20, causes decoder, 30, to cease transferring detected digital information from digital detector, 38, to controller, 39, and to commence filtering and demodulating inputted information at filter, 31, and demodulator, 32. Automatically, controller, 20, selects information of the first three of the last four significant digits of the binary information of the aforementioned unique digital code at ROM, 21; computes that particular Q quantity that is the sum of the numerical information of said three digits plus 20; and causes decoder, 30, to commencing receiving information embedded on the line Q (and only on line Q) of the inputted video at line receiver, 33, and transferring detected digital information from detector, 34, to controller, 39. (In other words, if the binary information of said three digits is "000", decoder, 30, receives information embedded on line 20; if the binary information of said three digits is "001", decoder, 30, receives information embedded on line 21; etc.) Finally, controller, 20, completes execution of said 1st-stage-enable-WSW-program instructions then, in the fashion of the first message of example #4, processes automatically the information of the meter-monitor segment of said 1st-WSW-program-enabling-message (#7) as meter information; causes the meter record that records the decryption of the audio portion of the "Wall Street Week" program transmission to be transferred from buffer/comparator, 14, and recorded at recorder, 16, (and causes the aforementioned signal record transfer sequence if recorder, 16, equals or exceeds if predetermined level of fullness); causes information of said meter-monitor segment to be placed at particular locations of buffer/comparator, 14, thereby initiating a meter record that records the decryption of the program transmission of the "Wall Street Week" program originating studio; and causes monitor information to be recorded by onboard controller, 14A, if the station of FIG. 4 is preprogrammed to collect monitor information.

In due course, but still before said 8:30 PM time, said program originating studio commences transmitting analog television information on its transmission frequency and embeds and transmits particular SPAM message information on lines 20, 21, 22, 23, 24, 25, 26, and 27. On each line said station transmits one particular message, and the messages of said lines are addressed to apparatus at subscriber stations where the first three of the last four significant digits of the binary information of the unique digital code at the ROMs, 21, are "000", "001", "010", "011", "100", "101", "110", and "111" respectively. Each of said messages consists of a "01" header, execution segment information that matches said enable-WSW-programming information, particular meter-monitor information, particular 2nd-stage-enable-WSW-program instructions as the information segment information, and an end of file signal. Each of said messages is identical except as regards certain differences in said 2nd-stage-enable-WSW-program instructions that are described below. Prior to being embedded and transmitted the information of each of said messages is encrypted, in the same fashion as the first message of example #4 (except that key J is used), and the encrypted information of the execution segment is identical to particular controlled-function-invoking information that instructs use decryption key J to decrypt the information of said message in the fashion of the decrypting of said second message. (Hereinafter, each of said SPAM messages is called a "2nd-WSW-program-enabling-message (#7).") Then said program originating studio ceases transmitting analog television information.

Transmitting said message causes the line receiver, 33, of decoder, 30, to receive the embedded SPAM information of that particular 2nd-WSW-program-enabling-message (#7) that is embedded on said line Q; the detector, 34, to detect the digital information of said message; and the controller, 39, to process said information. Automatically, control processor, 39J, causes controller, 20, to cause the decryptor, 39K, of decoder, 30, to commence decrypting using decryption key J and causes decryptor, 39K, to receive the information of said message. Automatically, decryptor, 39K, decrypts the encrypted information of said message and transfers said message to EOFS valve, 39H. Automatically, EOFS valve, 39H, inputs the information of said message, unencrypted, to control processor, 39J, until the end of file signal of said message is detected. Automatically, control processor, 39J, determines that the unencrypted information of the execution segment of said message matches the aforementioned instance of enable-WSW-programming information at said particular controlled-function-invoking information location and executes the aforementioned transfer-this-message-to-controller-20 instructions.

Executing said instructions causes the transfer of the information of said message to controller, 20, in the fashion of the local-cable-enabling-message (#7).

Receiving said 2nd-WSW-program-enabling-message (#7) causes controller, 20, to execute the aforementioned load-and-run-@20 instructions, to load the 2nd-stage-enable-WSW-program instructions of the information segment at particular RAM of controller, 20, then to execute the information so loaded as the machine language instructions of one job.

Executing said 2nd-stage-enable-WSW-program instructions causes controller, 20, in the predetermined fashion of said instructions, to strip particular SPAM information from said "Wall Street Week" program transmission, to generate and insert particular information into said transmission, and to affect a second and last stage of decrypting the digital video information of the "Wall Street Week" program transmission. Automatically, controller, 20, causes the control processor, 39J, of decoder, 30, to accept no SPAM message information from the EOFS valve, 39F. Automatically, controller, 20, causes matrix switch, 258, to cease transferring the information inputted from said converter box, 201, to the output that outputs to said third alternate contact; to commence transferring the information inputted from said converter box, 201, to the output that outputs to television tuner, 215; to commence transferring the information inputted from decryptor, 224, to the output that outputs to signal stripper, 229; to commence transferring the information inputted from signal stripper, 229, to the output that outputs to signal generator, 230; to commence transferring the information inputted from signal generator, 230, to the output that outputs to decryptor, 231; and to commence transferring the information inputted from decryptor, 231, to the output that outputs to said third alternate contact of switch, 1. Automatically, controller, 20, causes signal stripper, 229, to strip information, in a fashion well known in the art, from a particular strip-designated portion of the video transmission received at said stripper, 229, and transfer the received video, without said stripped information, to matrix switch, 258. (Said stripped information may be information that would cause disabling chips, well known in the art, to prevent microcomputer, 205, or monitor, 202M, from processing or displaying the information of said video transmission if said stripped information were present in said transmission when said transmission was received at microcomputer, 205, or monitor, 202M.) Automatically, controller, 20, selects complete information of the aforementioned unique digital code at ROM, 21, transmits said complete information to signal generator, 230, and causes said generator, 230, to insert said complete information, in a predetermined periodic fashion and in an inserting fashion well known in the art, into a particular insertion-designated portion of the video transmission received at said generator, 230, and to transfer the received video, with said inserted information, to matrix switch, 258. (By causing information that identifies the station at which encrypted information is decrypted to be so inserted, the present invention makes it possible to identify particular stations where their information is misused—for example, if pirated decrypted copies of information are distributed, the station at which decryption occurred can be identified by means of the inserted information—and by causing said information to be inserted and then processed at a decryptor as if said inserted information were encrypted, the present invention renders the inserted information into a form that can easily be rendered back into clear form—for example, by using the same cipher algorithm and cipher key to "encrypt" said information into its predecryption form—while rendering said inserted information into a form that others, such as pirates, can find very difficult to distinguish from other binary information, to locate or identify and, therefore, to remove.) Automatically, controller, 20, selects information of the aforementioned first three of the last four significant digits of the binary information of the aforementioned unique digital code at ROM, 21 and computes a particular Q quantity according to a particular formula that is preprogrammed in said 2nd-stage-enable-WSW-program instructions. The information of said Q quantity is the decryption key Aa. (The formulas in each of the eight different 2nd-WSW-program-enabling-message (#7) messages differ from each other in such a way that when each station computes its own Q quantity according to its own first three of last four significant unique digital code digits, the Q quantities computed all properly preprogrammed and functioning stations are identical—for example, at stations where said three digits are "000" can compute by a formula that instructs said stations to add binary information of 9999 to the information of said three digits to compute the quantity Q while stations where said three digits are "001" can compute by a formula that instructs said stations to add binary information of 10000 to the information of said three digits to compute the quantity Q, etc.) Automatically, controller, 20, clears all information of any prior SPAM message from decoder, 30; causes mixer, 3, and the filter, 31, and the modulator, 32, of decoder, 30, to input said information to the digital detector, 38, without any modification (switch, 1, is already connected to said third contact); and causes the control processor, 39J, of decoder, 30, to commence accepting SPAM message information from EOFS valve, 39F, and record all received SPAM message information in a predetermined fashion at the RAM associated with said control processor, 39J, until an interrupt signal of EOFS-signal-detected information is received and then to process said EOFS-signal-detected information in a predetermined fashion.

In due course, but still before said 8:30 PM time, said program originating studio encrypts and transmits, in its digital video transmission, particular SPAM check information that consists of a particular check sequence of binary information followed by an end of file signal (and is not a SPAM message). (Hereinafter said SPAM check information is called the "2nd-WSW-decryption-check (#7).")

As with the 1st-WSW-decryption-check (#7), receiving the 2nd-WSW-decryption-check (#7) causes control processor, 39J, to record the information of the check sequence of said 2nd-WSW-decryption-check (#7) at the RAM associated with said control processor, 39J, then to transmit a particular check-data-loaded signal to controller, 20.

Receiving said signal causes controller, 20, under control of said 2nd-stage-enable-WSW-program instructions, to cause said control processor, 39J, to transfer to controller, 20, selected information of said check sequence; to compare said selected information to selected information of said 2nd-stage-enable-WSW-program instructions; and to determine that a match results, indicating that decryptors, 224 and 231, are decrypting received information correctly. Determining a match causes controller, 20, to determine, in a predetermined fashion, that signal stripper, 229, is correctly stripping information from the aforementioned strip-designated portion of the video transmission and transferring received video without said stripped information and that signal generator, 230, is correctly inserting complete information of the aforementioned unique digital code into the aforementioned insertion-designated portion of the video transmission and transferring received video with said inserted information.

(Simultaneously other stations compare selected information of said check sequence to selected information of said 2nd-stage-enable-WSW-program instructions and verify the correct functioning of local signal strippers, 229, and generators, 230. At each station where a controller, 20, determines that a match does not result—which indicates that a decryptor, 224 or 231, is not decrypting its received information correctly and suggests that the preprogrammed SPAM operating information of said station may have been tampered with—or determines that a stripper, 229, or a generator, 230, fails to function correctly, so determining match causes said controller, 20, to cause all information of said 2nd-WSW-program-enabling-message (#7) to be erased from all memory of said station except for a particular portion of said 2nd-stage-enable-WSW-program instructions loaded at the RAM of said controller, 20, then to execute the information of said portion as instructions of a machine language job. Executing said portion causes said controller, 20, to cause the auto dialer, 24, and telephone connection, 22, of said station to establish telephone communications with a particular predetermined remote station, in the fashion described above, and causes said controller, 20, then to transmit the aforementioned appearance-of-tampering information together with complete information of the unique digital code that identifies said station uniquely. If telephone communications are not established with said remote station in a predetermined fashion and/or within a predetermined time interval, the instructions of said portion cause said controller, 20, to erase all preprogrammable RAM and EPROM of the signal processing apparatus at said station, thereby disabling said apparatus.)

Determining that signal stripper, 229, and that signal generator, 230, are stripping and inserting correctly (after having determined that that decryptors, 224 and 231, are decrypting correctly) causes the controller, 20, of the station of FIG. 4 (and causes controllers, 20, at other stations where so determining occurs) to execute particular additional 2nd-stage-enable-WSW-program instructions, and executing said instructions causes controller, 20, to cause the apparatus of the station of FIG. 4 to commence transferring the decrypted television information of the "Wall Street Week" program to microcomputer, 205, and monitor, 202M. Automatically, controller, 20, causes matrix switch, 258, to transfer the decrypted audio information inputted from decryptor, 107, to monitor, 202M, thereby causing monitor, 202M, to commence receiving said audio information and emitting sound in accordance with said audio information. Automatically, controller, 20, causes matrix switch, 258, to cease transferring the decrypted video information inputted from decryptor, 231, to the output that outputs to said third alternate contact of switch, 1, and to commence transferring said video information inputted from said decryptor, 231, to divider, 4, thereby causing divider, 4, to transfer said decrypted video information to microcomputer, 205, and to decoder, 203. Automatically, controller, 20, causes decoder, 203, to discard any previously received SPAM information; to commence detecting SPAM information in the inputted decrypted video information and waiting to receive SPAM header information; and to cause microcomputer, 205, to commence transferring the decrypted information of the transmitted video image to monitor, 202M, thereby causing monitor, 202M, to commence displaying, at its television picture tube, the information of the transmitted television image. Automatically, controller, 20, causes decoder, 30, to discard all previously received SPAM information (including all information of said 2nd-WSW-program-enabling-message (#7) and said 2nd-WSW-decryption-check (#7)); causes oscillator, 6, and decoder, 30, to commence the detecting of example (#7); and in a predetermined fashion, causes oscillator, 6, to cause switch, 1, to connect to connect its contact lever to the aforementioned first alternate contact of switch, 1. Finally, controller, 20, completes execution of said 2nd-stage-enable-WSW-program instructions then processes the information of the meter-monitor segment of said message as meter information; causes selected information of said meter-monitor segment to be placed at particular locations of buffer/comparator, 14, thereby incrementing the information of the aforementioned meter record that records the decryption of the program transmission of the "Wall Street Week" program originating studio; and causes monitor information to be recorded by onboard controller, 14A, if the station of FIG. 4 is prepreogammed to collect monitor information.

In due course, at said 8:30 PM time, said program originating studio commences transmitting the programming information of said "Wall Street Week" program, thereby causing the apparatus of the station of FIG. 4 (and of other correctly regulated and connected stations) to commence functioning in the fashions described above in "One Combined Medium" and in examples #1, #2, #3, and #4.

It is obvious to one of ordinary skill in the art that the foregoing is presented by way of example only and that the invention is not to be unduly restricted thereby since modifications may be made in the structure of the various parts without functionally departing from the spirit of the invention. For example, the decryption cipher key information and/or algorithm instructions and/or the location or locations of said key information and/or instructions may be computed in other, more complex or less complex, fashions. And for example, the transmitted programming may be processed through fewer than three steps of decryption or more than three. And for example, the "Wall Street Week" transmission may be of conventional analog television, and the decryptors, 107, 224, and 231, may be conventional descramblers, well, known in the art, that descramble analog television transmissions and are actuated by receiving digital key information. And for example, determining that a local station is not preprogrammed properly and/or that decryption, stripping, and/or signal generating apparatus are not functioning correctly may cause apparatus of said station to perform other steps of disabling and/or communicating—eg., the local apparatus may disable local apparatus selectively and only partially by, for example, preventing a decoder, 203, from processing embedded SPAM combining synch commands and may interrogate remote station apparatus, by telephone, for cipher key and/or cipher algorithm instructions and information. And for example, the transmitted programming may be caused, in a predetermined fashion to be recorded at an apparatus such as a properly configured video recorder rather than being played and displayed at a monitor, 202M. And for example, the transmitted programming may be only audio (for example, of a radio transmission) or print (for example, of broadcast print) rather than television. And for example, the output apparatus may be speakers or one or more printers rather than a television monitor. And for example, rather than being a transmitter at a remote wireless or cable transmission station, the source of the transmission may be a local apparatus such as a video (or audio or digital information) tape recorder or a laser disc player, well known in the art, that transmits a transmission of conventional rerecorded programming that has been encrypted (either fully or partially) and in which SPAM regulating instructions and information have been appropriately prerecorded which transmission is inputted to matrix switch, 258, from said local apparatus and which SPAM regulating instructions cause the decryption of the encrypted programming in the fashions of the present invention. And for example, covert control means may be used to control any regulating process of the present invention.

Monitoring Receiver Station Reception and Operation

Figure 5:
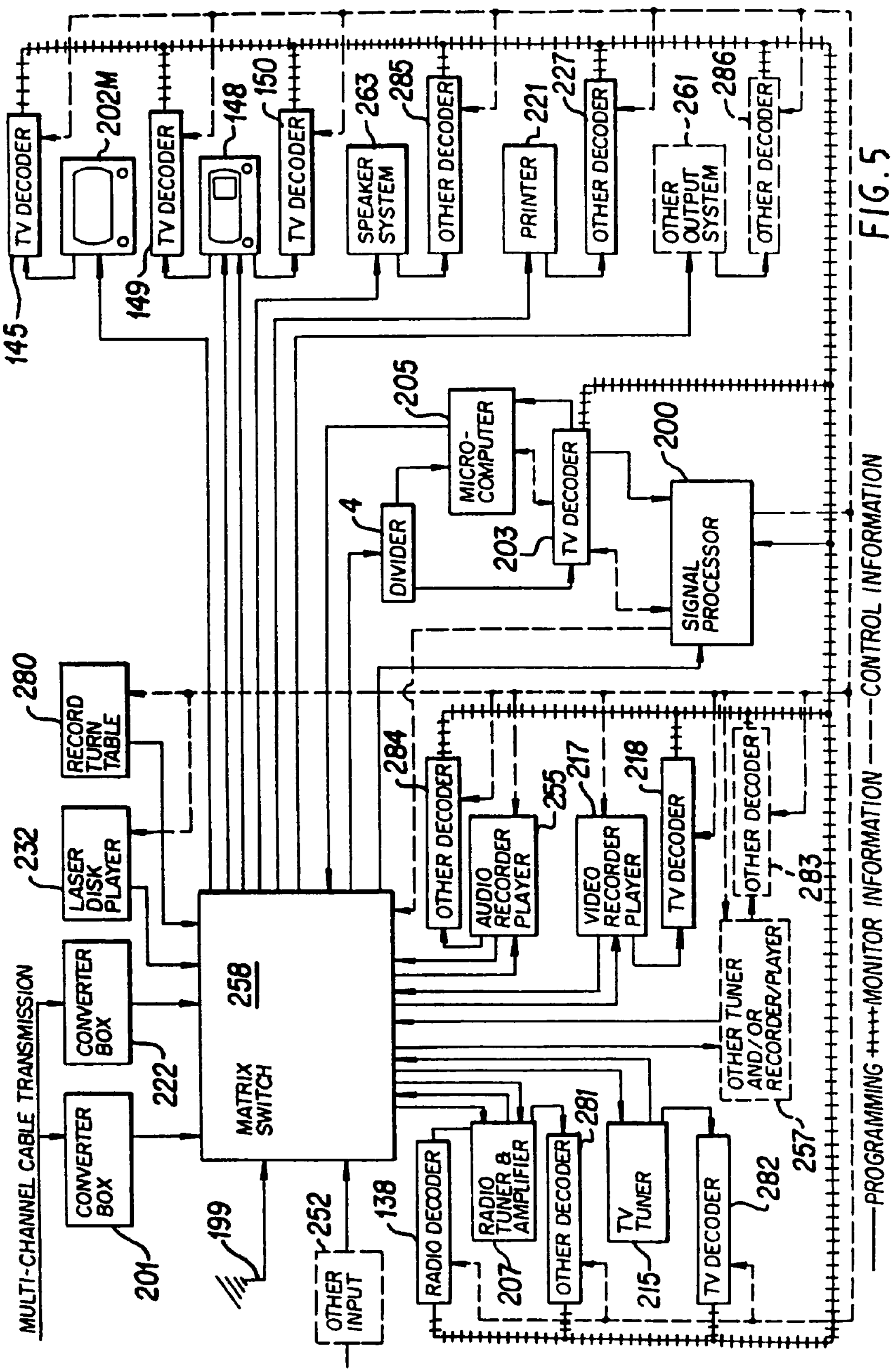
FIG. 5 is a block diagram of one example of a signal processing apparatus and methods monitoring system installed to monitor a subscriber station.

FIG. 5 illustrates means and methods for monitoring receiver station reception and use of programming and modes of receiver station operation and exemplifies one embodiment of a subscriber station that is preconfigured and preprogrammed to collect monitor information. The means and methods facilitate the collection of statistics that identify not only what programming is received and displayed at given subscriber stations but also, for example, which local apparatus receives programming and which displays programming, how received programming is processed, what local apparatus is controlled in the course of processing and how, what locally preprogrammed data is processed by or with the received programming, which local apparatus is caused to transmit programming, etc. Efficient collection of such statistics enables suppliers of programming and of subscriber station apparatus to identify which programming subscribers demand and how subscribers use their programming and apparatus.

FIG. 5 shows a variety of input apparatus with capacity for inputting programming (including SPAM information) selectively, via matrix switch, 258, to apparatus of the subscriber station of FIG. 5, intermediate apparatus with capacity for processing and/or recording inputted programming selectively, and output apparatus for displaying or otherwise outputting programming selectively to human senses.

Input apparatus include antenna, 199, and converter boxes, 201 and 222, that input programming transmitted from remote stations. Laser disc player, 232, and record turn table, 280, which are apparatus well known in the art, input prerecorded programming. The programming input by laser disc player, 232, in particular, may include video (as, for example, from a so-called "laser videodisc player"), digital audio (as, for example, from a so-called "compact disc player"), and digital data (as, for example, from a so-called "CD ROM"), and systems are well known in the art with capacity for playing all three forms of programming prerecorded on one given disc. Other input, 252, which may be, for example, a telephone, also has capacity for inputting programming to matrix switch, 258.

Intermediate apparatus include microcomputer, 205, radio tuner & amplifier, 213, TV tuner, 215, audio recorder/player, 255, and video recorder/player, 217, all of which are well known in the art. The station of FIG. 5 also has capacity for including one or more other tuners and/or recorder/players, 257, well known in the art, such as, for example, computer peripheral MODEMs and/or such expanded memory units as so-called "fixed disk" recorder/players.

Output apparatus that display or otherwise output programming selectively to human senses include, for example, TV monitor, 202M, multi-picture television monitor, 148, speaker system, 263, and printer, 221, all of which are well known in the art. Said apparatus that output could also include one or more other output systems, 261.

(This is only a representative group of equipment; many other types of communications and computer apparatus could be included in FIG. 5.)

Associated with each intermediate apparatus and output apparatus is one or more appropriate decoders. At radio tuner & amplifier, 138, are radio decoder, 138, and other decoder, 281. At TV tuner, 215, is TV decoder, 282. At audio recorder/player, 255, is other decoder, 284. At video recorder/player, 217, is TV decoder, 218. At microcomputer, 205, is TV decoder, 203. At other tuner and/or recorder/player, 257, is other decoder, 283. At TV monitor, 202M, is TV decoder, 145. At multi-picture TV monitor, 148, are TV decoders, 149 and 150. At speaker system, 263, is other decoder, 285. At printer, 221, is other decoder, 227. At other output system, 261, is other decoder, 286. Each decoder is likely to be located physically inside the unit of its associated intermediate or output apparatus.

At any given subscriber station, any given SPAM decoder may merely monitor the operation of its associated subscriber station apparatus or may function not only to monitor the operation of its associated apparatus but also to control said apparatus in the execution of SPAM controlled functions (in which case said decoder is preprogrammed to execute one or more controlled functions).

FIG. 5 shows each decoder as having capacity for transferring monitor information to signal processor, 200, by bus communications means. Said information is received (and processed) at signal processor, 200, by the onboard controller, 14A, which controls the communications of said bus means in a fashion well known in the art.

In FIG. 5, decoders, 138, 281, 282, 284, 218, 283, 145, 149, 150, 285, 227, and 286, merely monitor the operation of associated subscriber station apparatus. In the preferred embodiment, each one of said decoders is located at a point in the circuitry of its associated apparatus where said one receives (so as to detect all SPAM information on) the information of the selected frequency, channel or transmission to which its associated apparatus is tuned. Each one of said decoders is preprogrammed to detect and transfer to said onboard controller, 14, via said bus means, the meter-monitor information of every unencrypted SPAM message in the transmission to which its associated apparatus is tuned.

In FIG. 5, decoder, 203, which is part of the signal processor system of the station of FIG. 5, not only monitors the operation of its associated apparatus, microcomputer, 205, but also controls said apparatus, in the fashions described above, in the execution of SPAM controlled functions. Decoder, 203, has means for detecting SPAM information in any programming transmission inputted to its associated apparatus, microcomputer, 205, and not only for detecting and transferring to said onboard controller, 14, via said bus means, the meter-monitor information of every unencrypted SPAM message of said transmissions but also for inputting selected detected information to microcomputer, 205, and for controlling microcomputer, 205, in selected fashions. (FIG. 5 also shows that decoder, 203, has capacity for inputting detected information to signal processor, 200, and for receiving from and transferring control information to signal processor, 200.)

Any given decoder may have more or less apparatus than that shown if FIG. 2A, 2B, or 2C. For example, each one of said decoders, 138, 281, 282, 284, 218, 283, 145, 149, 150, 285, 227, and 286, requires less apparatus than is shown in the appropriate corresponding figure, 2A, 2B, or 2C. Said decoders can be located in the aforementioned circuitry of their associated apparatus in such fashions that said decoders do not require filters, 31, and demodulators, 32 and 35, (in the case of TV signal decoders) or radio receiver circuitry, 41, (in the case of radio signal decoders) or other receiver circuitry, 45, (in the case of other signal decoders). On the other hand, decoder, 203, may have more apparatus that that shown in FIG. 2A. FIG. 7D, which is described more fully below, shows that a microcomputer, 205, can be controlled by SPAM information embedded in transmissions other than television transmissions. Thus, because the particular decoder that controls a particular associated apparatus will be configured and preprogrammed to detect SPAM information in every transmission that can be inputted to and control said apparatus, the decoder, 203, associated with microcomputer, 205, may be modified to constitute an "All Signal Decoder" through the addition of additional apparatus such as the radio receiver circuitry, 41, radio decoder, 42, and digital detector, 43, of the Radio Signal Decoder of FIG. 2B and the other receiver circuitry, 45, and digital detector, 46, of the Other Signal Decoder of FIG. 2C, said additional apparatus operating under the control of the controller, 39, of said decoder, 203, and inputting detected digital information to the buffer, 39A, of said controller, 39.

If a given intermediate or output apparatus can receive transmissions from more than one source or of more than one kind—television, radio, or other—it will have sufficient apparatus to monitor every channel and kind of transmission it can receive. For example, FIG. 5 shows multi-picture TV monitor, 148, that has capacity to receive two inputted transmissions and has two TV decoders, 149 and 150. In the preferred embodiment, one decoder, 149, is located at a point in the circuitry of monitor, 148, where said decoder, 149, receives the information of one inputted transmission; the other decoder, 150, is located at a point in said circuitry said decoder, 150, receives the information of the other inputted transmission. And for example, FIG. 5 shows radio tuner & amplifier, 213, that also has capacity to receive two inputted transmissions and has two decoders: radio decoder, 138, and other decoder, 281. In the preferred embodiment, one decoder, 138, is located at a point in the circuitry of tuner & amplifier, 213, where said decoder, 138, receives information of one inputted transmission (eg., the selected radio frequency that is the particular frequency, of the spectrum of wireless frequencies received at antenna, 199, and inputted via switch, 258, that is the frequency that the radio tuner of tuner & amplifier tunes to); the other decoder, 281, is located at a point in said circuitry where said decoder, 281, receives the information of the other inputted transmission (eg., the output frequency of record turn table, 280, inputted via said switch, 258).

The onboard controller, 14A, controls the operation of all the decoders that merely monitor the operation of associated subscriber station apparatus and also controls other particular apparatus of the subscriber station of FIG. 5 in particular monitor information functions. FIG. 5 shows that signal processor, 200, (at onboard controller, 14A) has bus communications means for communicating control information to the aforementioned decoders, 138, 281, 282, 284, 218, 283, 145, 149, 150, 285, 227, and 286. By such bus means, onboard controller, 14A, can cause any on or all of said decoders to commence or cease processing and transmitting SPAM monitor information and can cause any one or all of said decoders to change the location or locations that are searched for SPAM information. FIG. 5 shows that, via said bus communications means, signal processor, 200, has capacity for communicating control information (from onboard controller, 14A) to subscriber station player apparatus that has capacity for playing prerecorded programming (and in so doing, originating transmission at said station of said programming). Said player apparatus includes laser disc player, 232, record turn table, 280, audio recorder/player, 255, video recorder/player, 217, and other recorder/player, 257. Each of said player apparatus has capacity, under control of onboard controller, 14A, for generating, embedding in programming transmissions, and transmitting source mark information that identifies (and distinguishes from one another) each one of said player apparatus. By causing said player apparatus to transmit identifying source mark information, onboard controller, can cause local apparatus to collect monitor information that identifies which local player apparatus is the source of any given output of a locally originated, prerecorded programming transmission.

But the onboard controller, 14A, does not control the operation of those decoders that control the operation of subscriber station apparatus in the execution of SPAM controlled functions. Instead, all decoders that execute SPAM controlled functions are controlled, even in monitoring the operation of their associated apparatus, by the controller, 20, of signal processor, 200. In FIG. 5, decoder, 203, is the only such decoder with capacity to execute SPAM controlled functions. As FIG. 5 shows, decoder, 203, and signal processor, 200, (at onboard controller, 14A) have no capacity to communicate with each other via the aforementioned bus communications means for communicating control information. Rather decoder, 203, communicates control information directly with the controller, 20, of signal processor, 200, as in FIG. 3. (In respect to a decoder and other apparatus that are controlled by a controller, 20, the onboard controller, 14A, of the signal processor, 200, of said controller, 20, is preprogrammed to input to said controller, 20, all monitor instructions addressed to said decoder or associated apparatus, and said controller, 20, is preprogrammed to receive said instructions and transfer said instructions to said decoder or associated apparatus appropriately in accordance with the priority of the operation of said decoder or associated apparatus.)

Decoders that execute SPAM controlled functions are controlled in regard to monitoring by controller, 20, rather than onboard controller, 14A, because timely execution of controlled functions (and the transmission of control information related to such execution such as, for example, decryption key information as in example #4 above) has far higher priority that the collection of monitor information.

One particular advantage of these methods for monitoring programming is that, by embedding the SPAM information in the audio and/or video and/or other parts of the programming that are conventionally recorded by, for example, conventional video cassette recorders, these methods provide techniques for gathering statistics on what is recorded, for example, on video and audio cassette recorders and on how people replay such recordings. For example, a subscriber might instruct video recorder/player, 217, automatically to record the NBC Network Nightly News as might receive the programming over Manhattan Cable TV channel 4 and record the programming at the time of original broadcast transmission—from 7:00 PM to 7:30 PM on the evening of Jul. 15, 1985. Each discrete bit of this information could be transmitted to the subscriber station of FIG. 5 in meter-monitor information (of a SPAM command with an appropriate execution segment such as information of the pseudo command) embedded in the transmitted programming. So embedding and transmitting said meter-monitor information would cause recorder, 217, to record said information. In addition, decoder, 218, would detect said information and transfer said information to signal processor, 200, together with appropriate source mark information, but no decoder apparatus associated with any of the aforementioned output apparatus would detect said information, causing said signal processor, 200, in a predetermined fashion to record a signal record of programming recorded at recorder, 217. (Simultaneously, the information of said programming is being displayed at the monitors, 202M, of other subscriber stations that are tuned to the frequency of said News as broadcast; decoders, 145, associated with said monitors, 202M, are detecting said embedded meter-monitor information and transmitting said information to the signal processors, 200, of said stations; and said signal processors, 200, are recording signal records of programming displayed at said monitors, 202M.) Subsequently, the subscriber might play back the recorded programming and view said programming on TV monitor, 202M, from 10:45 PM to 11:15 PM the same evening. So playing back and transmitting the recorded programming to monitor, 202M, would cause TV signal decoder, 145, to detect said meter-monitor information and transfer said information, together with appropriate source mark information, to signal processor, 131, causing said signal processor, 200, to record a signal record of said information together with date and time information of said 10:45 PM to 11:15 PM the same evening selected from the clock, 18, of signal processor, 200.

Prerecorded, commercially distributed video and audio tapes, videodiscs, so-called “compact discs” of audio, and so-called “CD ROM” discs of data can also contain unique codes, embedded in the prerecorded programming, that identify the use and usage of said programming when said tapes or discs are played. For example, laser disc player, 232, can be a compact disc player upon which is loaded a compact disc. SPAM messages, embedded in the programming prerecorded on said disc, can contain pseudo command execution segment information and meter-monitor information that documents that said prerecorded programming is of Anton Bruckner’s Symphony No. 4 as recorded by the Berlin Philharmoniker and the disc is distributed by EMI Records Ltd. on the Angel label with a particular catalog serial number. Through matrix switch, 258, the output of player, 232, is inputted to the amplifier, 213, and the output of amplifier, 213, is inputted to speaker system, 263. When player, 232, commences playing and transmitting said prerecorded programming, transmitting said programming causes other decoder, 281, and other decoder, 285, to detect said embedded messages at amplifier, 213, and speaker system, 263, respectively, and transmit said meter-monitor information to signal processor, 200, via the aforementioned bus communications means for transferring monitor information, thereby causing onboard controller, 14A, to commence retaining monitor information in a signal record that reflects the outputting of said programming and, in a predetermined fashion, to determine that the information of said record includes no information identifying a station or apparatus originating the transmission of said programming. So determining causes onboard controller, 14A, to transmit a particular transmit-source-code instruction, via the aforementioned bus communications means for transferring control information, to the local apparatus that have capacity for playing prerecorded programming, which apparatus include player, 232, and record turn table, 280. Receiving said instruction causes player, 232, and turn table, 280, each to generate, embed in its transmitted programming in a predetermined fashion, and transmit its own preprogrammed identifier code information that identifies each distinctly differently it from all other subscriber station apparatus (all of which apparatus have the capacity so to do). Causing player, 232, to transmit its distinct code causes other decoders, 281 and 285, to detect said code and transmit information of said code to signal processor, 200, causing onboard controller, 14A, to retain information of said code in said signal record, thereby adding to said record information of the apparatus originating the transmission of said programming.

In the case of any given programming that is outputted at any given output apparatus, thereby enabling a subscriber to view or hear or read or in some other way perceive the information of said programming, the onboard controller, 14A, may and probably will receive monitor information from several different sources. For example, in the case of the “Wall Street Week” program, transmitting the first and second SPAM messages of example #3 (which are not encrypted) will cause not only decoder, 203, to process the meter-monitor information of said messages and transmit the aforementioned 1st monitor information (#3) and 2nd monitor information (#3), via the monitor information bus means of FIG. 5, to onboard controller, 14A. The programming of said “Wall Street Week” program is received at tuner, 215, and displayed at monitor, 202M. Accordingly, transmitting said messages will also cause the decoder associated with tuner, 215—decoder, 282—to detect, process, and transmit monitor information of said messages to onboard controller, 14A, that is identical to said 1st monitor information (#3) and 2nd monitor information (#3) except that the source mark information identifies decoder, 282, rather than decoder, 203. Likewise, unless the FIG. 1B information overlaid at microcomputer, 205, covers and obliterates the embedded information of said messages that is inputted from divider, 4, to microcomputer, 205, and would otherwise be transmitted to monitor, 202M, in the combined programming outputted by microcomputer, 205, (which covering and obliterating does not occur in example #3), transmitting said messages will also cause the decoder, 145, to detect, process, and transmit monitor information of said messages to onboard controller, 14A, that is also identical to said 1st and 2nd monitor information (#3) except that the source mark information identifies decoder, 145.

As described above, onboard controller, 14A, organizes its contained signal records on the basis of the different source mark information of the separate decoders of its subscriber station. Were onboard controller, 14A, preprogrammed to process monitor information just in this simple fashion, transmitting the first and second messages of example #3 would cause onboard controller, 14A, to record (and subsequently transmit to recorder, 16, then later to one or more remote stations) three separate signal records that would duplicate each other except that each would be associated with the source mark of a different decoder, 282, 203, or 145.

In the preferred embodiment, to minimize unnecessary duplication, prior to retaining monitor information in signal records, onboard controller, 14A, is preprogrammed to consolidate, in a predetermined fashion or fashions, monitor information transmissions that contain different source mark information but common "program unit identification code" information in such a way that subordinate sources are identified—which, in the "Wall Street Week" example, are tuner, 215/decoder, 282, and monitor, 202M/decoder, 145, where no combined medium functions and no SPAM controlled functions are executed—the monitor information from said sources is included, in a predetermined fashion, within the signal record information of the principal source—which source is, in the example, decoder, 203, at microcomputer, 205—in such a way that only exception information is recorded in the recorded information of the monitor information transmitted from the subordinate sources.

Automating Intermediate Transmission Stations

The signal processing apparatus outlined in FIGS. 2, 2A, 2B, 2C, and 2D, and their variants as appropriate, can be used to automate the operations of intermediate transmission stations that receive and retransmit programming. The stations so automated may transmit any form of electronically transmitted programming, including television, radio, print, data, and combined medium programming and may range in scale of operation from wireless broadcast stations that transmit a single programming transmission to cable systems that cablecast many channels simultaneously.

FIG. 6 illustrates Signal Processing Apparatus and Methods at an intermediate transmission station that is a cable television system "head end" and that cablecasts several channels of television programming. The means and methods for transmitting conventional programming are well known in the art. The station receives programming from many sources. Transmissions are received from a satellite by satellite antenna, 50, low noise amplifiers, 51 and 52, and TV receivers, 53, 54, 55, and 56. Microwave transmissions are received by microwave antenna, 57, and television video and audio receivers, 58 and 59. Conventional TV broadcast transmissions are received by antenna, 60, and TV demodulator, 61. Other electronic programming transmissions are received by other programming input means, 62. Each receiver/modulator/input apparatus, 53 through 62, transfers its received transmissions into the station by hard-wire to a a conventional matrix switch, 75, well known in the art, that outputs to one or more recorder/players, 76 and 78, and/or to apparatus that outputs said transmissions over various channels to the cable system's field distribution system, 93, which apparatus includes cable channel modulators, 83, 87, and 91, and channel combining and multiplexing system, 92. Programming can also be manually delivered to said station on prerecorded videotapes and videodiscs. When played on video recorders, 76 and 78, or other similar equipment well known in the art, such prerecorded programming can be transmitted via switch 75 to field distribution system, 93.

In the prior art, the identification of incoming programming, however received; the operation of video player and recorder equipment, 76 and 78; and the maintenance of records of programming transmissions are all largely manual operations.

FIG. 6 shows the introduction of signal processing apparatus and methods to automate these and other operations.

In line between each of the aforementioned receiver/demodulator/input apparatus, 53, 54, 55, 56, 57, 58, 59, 60, 61, or 62, and matrix switch, 75, is a dedicated distribution amplifier, 63, 64, 65, 66, 67, 68, 69, or 70, that splits each incoming feed into two paths. One path is the conventional path whereby programming flows from each given receiver/demodulator/input apparatus, 53, 54, 55, 56, 57, 58, 59, 60, 61, or 62, to matrix switch, 75. The other path inputs the transmission of said given receiver/demodulator/input apparatus, 53, 54, 55, 56, 57, 58, 59, 60, 61, or 62, individually to signal processor system, 71. (In other words, distribution amplifier, 63, continuously inputs the programming transmission of receiver, 53, to matrix switch, 75, and separately to signal processor system, 71; distribution amplifier, 64, inputs the programming transmission of receiver, 54, to matrix switch, 75, and separately to signal processor system, 71; etc.)

At signal processor system, 71, which is a system as shown in FIG. 2D, the outputted transmission of each distribution amplifier, 63, 64, 65, 66, 67, 68, 69, or 70, is inputted into a dedicated decoder (such as decoders, 27, 28, and 29 in FIG. 2D) that processes continuously the inputted transmission of said distribution amplifier, 63, 64, 65, 66, 67, 68, 69, or 70; selects SPAM messages in said transmission that are addresses to ITS apparatus of said intermediate transmission station; automatically adds, in a predetermined fashion, source mark information that identifies said associated distribution amplifier, 63, 64, 65, 66, 67, 68, 69, or 70; and transfers said selected messages, with said source mark information, to code reader, 72. Signal processor system, 71, also has signal processor means to control signal processor system, 71, to record meter-monitor information of said message information, and to transfer recorded information to external communications network, 97.

Code reader, 72, buffers and passes the received SPAM message information, with source mark information, to cable program controller and computer, 73.

Cable program controller and computer, 73, is the central automatic control unit for the transmission station. Computer, 73, has an installed clock and is preprogrammed with information on the operating speeds and capacities of all station apparatus and the connections of said apparatus with matrix switch, 75.

Computer, 73, has capacity for maintaining records on the station's programming schedule and records on the status of operating apparatus. Computer, 73, has means for receiving input information from local input, 74, and from remote stations via telephone or other data transfer network, 98. Such input information can include the complete programming schedule of the station of FIG. 6, with each discrete unit of programming identified by its own "program unit identification code" information. Such input information can indicate when and how the station should expect to receive each program unit, when and on which channel or channels and how the station should transmit the unit, what kind of programming the unit is—eg., conventional television, television/computer combined medium programming, etc.—and how the station should process the programming. Computer, 73, is preprogrammed to receive and record said schedule information and may record it in RAM or on an appropriate recording medium such as a magnetic disk at a disk drive. Likewise, computer, 73, is preprogrammed to maintain records of the control instructions that computer, 73, transmits to all controlled apparatus which records indicate, at any given time, the operating status of each controlled apparatus.

Computer, 73, monitors the operation of the head end station by means of TV signal decoders, 77, 79, 80, 84, and 88, each of which are shown in detail in FIG. 2A. Computer, 73, has means to communicate control information with each decoder, 77, 79, 80, 84, and 88, to instruct each how to operate and how and where to search for SPAM information. (The control system of the station of FIG. 6 may be reconfigured to have the signal processor of system, 71, control said decoders, 77, 79, 80, 84, and 88, if decryption of encrypted SPAM message information is required at said decoders.)

Computer, 73, monitors outgoing programming by means of decoders, 80, 84, and 88. By decoders, 80, 84, and 88, to select and transfer SPAM meter-monitor information and by comparing said information to information of its contained schedule records, computer, 73, can determine whether scheduled programming is being transmitted properly to field distribution system, 93, on each cable channel of the station of FIG. 6. Whenever computer, 73, detects errors, computer, 73, can execute predetermined error correction procedures which may include sounding an alarm to alert station personnel.

Computer, 73, monitors incoming programming by means of the aforementioned dedicated decoders of signal processor system, 71. By means of the SPAM message information, with source mark information, received from code reader, 72, computer, 73, determines what specific program unit has been received by each receiver, 53 through 62, and is passing in line, via each distribution amplifier, 63 through 70, to matrix switch, 75.

By comparing selected meter-monitor information of said message information with information of the programming schedule received earlier from input, 74, and/or network, 98, computer, 73, can determine, in a predetermined fashion, when and on what channel or channels the station of FIG. 6 should transmit the programming of each received program unit.

Computer, 73, has means for communicating control information with matrix switch, 75, and video recorders, 76 and 78, and can cause selected programming to be transmitted to field distribution system, 93, or recorded.

Determining that particular incoming programming is scheduled for immediate retransmission can cause computer, 73, to cause matrix switch, 75, to configure its switches so as to transfer said incoming programming to a scheduled output channel. For example, computer, 73, receives a given SPAM message that contains given "program unit identification code" information and the added source mark information of said message identifies distribution amplifier, 63. Receiving said message causes computer, 73, to determine, in a predetermined fashion, that said "code" information matches particular preprogrammed schedule information of programming that is scheduled to be retransmitted immediately upon receipt to field distribution system, 93, via cable channel modulator, 87. In its preprogrammed fashion, so determining causes computer, 73, to cause matrix switch, 75, to configure its switches so as to transfer the programming transmission inputted (via distribution amplifier, 63) to matrix switch, 75, from TV receiver, 53, to that output of matrix switch, 75, that outputs to modulator, 87.

Determining that particular incoming programming is scheduled for time deferred transmission can cause computer, 73, to cause the recording of said programming. For example, computer, 73, receives a given SPAM message that contains given "program unit identification code" information and the added source mark information of said message identifies distribution amplifier, 67. Receiving said message causes computer, 73, to determine, in a predetermined fashion, that said "code" information matches particular preprogrammed schedule information of programming that is scheduled to be recorded upon receipt and transmitted to the field system, 93, at a later time. So determining causes computer, 73, in its preprogrammed fashion, to select a video recorder/player, 76 or 78; to cause said selected recorder, 76 or 78, to turn on and record programming; and to cause matrix switch, 75, to configure its switches so as to transfer the programming transmission inputted (via distribution amplifier, 67) from television receiver, 58, to the output that leads to said selected recorder, 76 or 78. In so doing, computer, 73, causes said selected recorder, 76 or 78, to record said programming.

Determining that particular incoming programming is not scheduled for transmission can cause computer, 73, to cause station apparatus to discard the transmission of said programming. For example, computer, 73, receives a given SPAM message that contains given "program unit identification code" information and the added source mark information of said message identifies distribution amplifier, 69. Receiving said message causes computer, 73, to determine, in a predetermined fashion, that said "code" information matches no particular preprogrammed schedule information. In its preprogrammed fashion, so determining causes computer, 73, either to cause matrix switch, 75, to configure its switches so as to transfer the programming transmission inputted (via distribution amplifier, 69) to matrix switch, 75, from TV demodulator, 61, to no output of matrix switch, 75; or to cause a selected recorder, 76 or 78, to cease recording; or both.

Computer, 73, has capacity for determining what programming is prerecorded on the magnetic tapes (or other recording media) loaded on the recorders, 76 and 78, and capacity for positioning the start points (or other selected points) of program units at the play heads of said recorders. Whenever programming is played on recorder, 76 or 78, decoder, 77 or 79 respectively, detects SPAM information embedded in the prerecorded programming played at the play heads of recorder, 76 or 78, and transmits said SPAM information to computer, 73. Said SPAM information can include not only "program unit identification code" information but also information regarding of the distance from the point on the tape at which a given SPAM message is embedded to the point on the tape where the program unit begins and ends (or to any other selected point). To position the start point (or another selected point) of a given program unit at the play heads of a given recorder, 76, computer, 73, instructs switch, 75, to configure its switches so as to transfer the transmission input from said recorder, 76, to no output. Then by instructing recorder, 76, to play and decoder, 77, to detect SPAM information in a particular location or locations, computer, 73, causes decoder, 77, to detect and transfer to computer, 73, said program unit and distance information. Receiving said information causes computer, 73, to cause recorder, 76, to stop playing; to analyze said distance information in a predetermined fashion; and to compute the precise time required to rewind to reach the start of the program unit or to move fast forward to reach the end. Then automatically, computer, 73, causes said recorder, 76, first, to start rewinding or moving fast forward then to stop after the precise time elapses.

(Such distance information can be embedded as SPAM message information segment information anywhere in the programming that SPAM information can be embedded and need not repeat continuously—one embedded signal word is sufficient for this method to work. But a method wherein only one instance of distance information is embedded in any given program unit of programming has the disadvantage of causing too much apparatus at too many stations to spend too much time searching for said instance. In the preferred embodiment, distance information is embedded in the relevant normal transmission location of its programming and occurs periodically throughout a program unit with increasing frequency as the closeness of the start or end of the programming approaches and with one instance, in television programming, occurring on the first and fourth frames and the last two frames of the programming.)

Computer, 73, has capacity for automatically organizing the locations of units of prerecorded programming on recording media such as magnetic video tapes loaded on a plurality of recorder/players to play according to a given schedule. For example, four spot commercials—program units Q, Y, W, and D—are loaded on 76 and 78. D and Q are recorded on the video tape loaded on recorder, 76, with D first. W and Y are recorded on the tape on recorder, 78, with W first. According to the schedule recorded at computer, 73, Q should play first on the cable channel modulated by cable channel modulator, 83; then subsequently Y and W should start to play simultaneously on the channels modulated by modulators, 83 and 87 respectively; then D should play on the channel modulated by modulator, 83, immediately after Y ends. Caused to organize the locations of said units to play according to said schedule, computer, 73, determines automatically, in a predetermined fashion, that units Q, Y and D should be recorded on the tape loaded on recorder, 76, with Q recorded first and D recorded immediately after Y. In a predetermined fashion, computer, 73, determines that insufficient available space exists on the tape on recorder, 76, to record Y immediately before D or on recorder, 78, to record D immediately after Y. So determining causes computer, 73, automatically to locate a place on the tape loaded on recorder, 78, that contains sufficient space for recording D. (Computer, 73, can contain records that identify how space on particular tapes is allocated or it can locate this space by playing the tapes, retaining information of "program unit identification code" and distance information prerecorded on said tapes [or the absence of such information], and analyzing said information in a predetermined fashion.) Automatically, computer, 73, verifies that the space is truly available by causing recorder, 78, to move forward or rewind to the start of the located space then to play for the duration of the space; by causing decoder, 79, simultaneously to search for embedded SPAM message information, detect said information, and transfer said information to computer, 73; and by checking the detected SPAM information in a predetermined fashion to ensure that detected meter-monitor information does not identify a program unit that is scheduled to be transmitted at a future time. Determining said located space to be available causes computer, 73, to cause recorder, 76, to move forward or rewind to the start of program unit D; to cause recorder, 78, to rewind to the start of said located space; and to cause switch, 75, to configure its switches so as to transfer the output of recorder, 76, to the input of recorder, 78. Automatically, computer, 73, then causes recorder, 76, to play and recorder, 78, to record for the duration of program unit D. Then automatically, in a predetermined fashion, computer, 73, alters the records it contains to reflect the location of unit D on recorder, 78, and that the space on the tape on recorder, 76, that program unit D had occupied is now available and may be recorded over. (Computer, 73, may automatically make available the space on the tape on recorder, 76, that program unit D has occupied by causing recorder, 76, to rewind to the start of said space and to erase or record for the duration of D—since the output of recorder, 78, is the input to recorder, 76, and since recorder, 78, is not playing, a recording so recorded by recorder, 76, would contain no programming or SPAM information.) Program unit D is now recorded on the tape on recorder, 78, and program unit Q is the only unit on recorder, 76. Then automatically, in the locating fashion described above, computer, 73, locates an available space on the tape on recorder, 76, that is large enough for recording program units Y and D together. Computer, 73, verifies the availability of the space in the verifying fashion above. Computer, 73, causes recorder, 78, to move forward or rewind to the start of program unit Y; causes recorder, 76, to rewind to the start of the available space; and causes switch, 75, to configure its switches so as to transfer the output of recorder, 78, to the input of recorder, 76. Computer, 73, causes recorder, 78, to play and recorder, 76, to record for the duration of program unit Y. Computer, 73, causes recorder, 78, to move forward or rewind to the start of program unit D and causes recorder, 78, to play and recorder, 76, to record for the duration of program unit D. Finally, in the record keeping fashion above, computer, 73, alters its contained records to document the locations of Y and D on the tape on recorder, 76, and the availability of the spaces that Y and D have occupied on the tape on recorder, 78, for recording other programming. (The station of FIG. 6 may have, at recorders, 76 and 78, stripping and embedding apparatus such as signal strippers, 81 and 85, and signal generators, 82 and 86, and computer, 73, may cause said generator apparatus to record at particular places on the tapes loaded at recorders, 76 and 78, information of the contained records of computer, 73, that identify how space on said tapes is allocated.) In this fashion, computer, 73, causes units Y and W to be located on different recorders because said units are scheduled to be transmitted simultaneously and units Y then D to be located in sequence on the same recorder because unit D is scheduled to play on the same channel immediately after Y.

Computer, 73, has capacity for automatically playing organized scheduled program units according to its recorded station schedule. Computer, 73, may be caused to commence playing any given unit of programming previously loaded at a recorder, 76 or 78, in any of a number of different fashions. For example, a remote program originating studio can embed and transmit a SPAM message that contains particular cueing information, and receiving said message can cause controller, 73, to cause a selected recorder, 76 or 78, to commence playing a tape that has been positioned at the tape head of said recorder, 76 or 78, according to the schedule of computer, 73. Or for example, the aforementioned clock of computer, 83, may be caused, in a predetermined fashion, to transmit time information periodically, and receiving particular time information can cause controller, 73, to cause a selected recorder, 76 or 78, to commence playing said tape.

In the preferred embodiment, in the case of so-called "cut ins" to network transmissions, any given intermediate station computer, 73, is cued (that is, caused) to cut in any given local transmission of prerecorded programming (or top a given local transmission) by a SPAM message (that contains an execution segment and a meter-monitor segment that contains "program unit identification code" information of the program unit in which it is embedded) that is a cueing message and that is embedded in a given network transmission and transmitted by the program originating studio that originates the transmission of said network. In the case of sequential transmissions of more than one program unit of so-called "local origination" programming, each intermediate station computer, 73, is cued to start transmission of the first unit by a time transmission of the aforementioned clock of said computer, 73, (or in the case of a cut in to a network transmission, by a network transmitted SPAM cueing message), and the transmission of each subsequent unit is cued by such a SPAM cueing message that is embedded in the last one-half second of the programming of its predecessor program unit.

For example, in the case of the aforementioned schedule of computer, 73, units Q, Y, and D are scheduled to be cut into a particular first network transmission that is received at receiver, 53, and is transferred to field distribution system, 93, via modulator, 83. Unit W is scheduled to be cut into a particular second network transmission that is received at receiver, 58, and is transferred to field distribution system, 93, via modulator, 87.

Completing the organization of any given group of prescheduled tapes causes computer, 73, automatically to position the first organized unit or units to play according to schedule. Accordingly, completing the above described organization of any units Q, Y, W, and D causes computer, 73, automatically to cause recorder, 76, to move forward or rewind to the start of unit Q and to cause recorder, 78, to move forward or rewind to the start of unit W.

In due course, a particular first instance of the aforementioned SPAM cueing message is embedded in said first network transmission and transmitted at the program originating studio that originates said transmission (hereinafter, said first instance is called the "first-network-cue-to-transmit-locally message (#8)") then, after an interval of time equal to the duration of the playing of unit Q passes, a particular second instance of said message is embedded at said studio and transmitted in said transmission (hereinafter, said second instance is called the "first-network-cue-to-transmit-network message (#8)").

Said first and second instances are each detected at that decoder of signal processor system, 71, that continuously processes the transmission outputted by distribution amplifier, 63, and are inputted to computer, 73, with appropriate source mark information.

Receiving said first instance causes computer, 73, under control of instructions of said schedule, to cause recorder, 76, to commence playing and to cause matrix switch, 75, to configure its switches to cease transferring the transmission received at receiver, 53, to modulator, 83, and to commence transferring the output of recorder, 76, to modulator, 83. In so doing, computer, 73, causes the cable head end station of FIG. 6 to cease transmitting said first network transmission to field distribution system, 93, and to commence transmitting the locally originated transmission of unit Q. Then receiving said second instance causes computer, 73, under control of instructions of said schedule, to cause matrix switch, 75, to configure its switches to cease transferring the output of recorder, 76, to modulator, 83, and to commence transferring the transmission received at receiver, 53, to modulator, 83, and to cause recorder, 76, to cease playing and to move forward or rewind to the start of unit Y. In so doing, computer, 73, causes the head end station of FIG. 6 to cease transmitting to field distribution system, 93, the locally originated transmission of unit Q; to recommence transmitting said first network transmission; and to prepare to play the locally originated transmission of unit Y. In this locating and playing fashion, computer, 73, can then play program units Y, W, and D according to its recorded schedule. (Because unit D is scheduled to play immediately after Y on the same channel, no SPAM cueing message causes computer, 73, to cause recorder, 76, to stop playing or matrix switch, 75, to switch another transmission to modulator, 83, until Y and D have both played.)

FIG. 6 shows particular signal processor system monitoring apparatus associated with the intermediate station of FIG. 6. In field distribution system, 93, amplifier, 94, inputs programming transmissions to signal processor system, 71, (where said transmissions are inputted to one alternate contact of the switch, 1, of the signal processor of said system, 71), and amplifier, 95, inputs programming transmissions to signal processor, 96, which permits both signal processor apparatus to monitor all programming transmitted by the cable television system head end station to field distribution system, 93, in the fashion of the signal processor, 200, of FIG. 3 in example #5. By recording all different received "program unit identification code" information in the fashion described above, said signal processor apparatus can automatically record, for each transmission channel of the station of FIG. 6, information, for example, that the U.S. Federal Communications Commission requires broadcast station operators to maintain as station logs. And said signal processor apparatus can transmit such records of programming to remote sites via telephone or other data transfer networks, 97 and 99 respectively. In this fashion, said signal processor apparatus can automatically provide their contained records to one or more remote independent auditor stations.

In the preferred embodiment, at least two signal processors (such as the signal processor of said system, 71, and signal processor, 96) monitor the transmissions of any given transmission station. One (eg., the signal processor of said system, 71) is at said station which permits station personnel to inspect said one and ensure that said one is operating continuously and correctly. At least one other (eg., signal processor, 96) is located at a site within the distribution system of said station (eg., field system, 93) that is remote from the transmission station of said site, and said is inspected and serviced by independent auditor personnel. The records of said processors are regularly caused to be transmitted to one or more remote auditing stations (eg., by networks, 98 and 99), in the fashions described above, and computers at said stations are caused to receive said records, compare said records with each other, and record any differences between the two sets of records are recorded.

The cases of the transmission of units Q, Y, W, and D provide examples of the operation of signal processor apparatus, 71 and 96. As the aforementioned program originating studio of the aforementioned first and second network transmissions transmit programming, at said signal processor apparatus, 71 and 96, switches, 1; mixers, 3; and TV signal decoders, 30, detect SPAM message information in successive channel transmissions of the station of FIG. 6, under control of controllers, 20, and oscillators, 6, and transmit detected SPAM information to onboard controllers, 14A, causing signal records of program units transmitted at said station to be retained, recorded, and retransmitted to remote auditing stations in the fashion of example #5, above. Any SPAM message that contains meter-monitor information can cause said apparatus, 71 and 96, to detect, transmit, retain, record, and retransmit in the fashion described above. For example, a SPAM cueing message such as the aforementioned first-network-cue-to-transmit-locally message (#8) can cause not only the cut in and transmission of locally originated programming (eg. the programming of unit Q) but also the processing of meter-monitor information in the fashion described in example #5, at said apparatus, 71 and 96. Said message could cause said apparatus, 71 and 96, to add time information to retained signal records, thereby documenting a last instance of receiving the "program unit identification code" information contained in the meter-monitor information of said message. And embedding SPAM messages in the prerecorded programming of, for example, program unit Q that contain "program unit identification code" information that identifies unit Q can cause the station of FIG. 6 to transmit said messages in its transmission of Q, thereby causing said apparatus, 71 and 96, to detect, retain, and retransmit signal records of said "code" information which signal records serve as so-called "proof of performance" that the programming of said program unit Q was transmitted according to schedule by the station of FIG. 6.

So far this disclosure has described an intermediate transmission station that transmits conventional television programming; however, the intermediate station automating concepts of the present invention apply to all forms of electronically transmitted programming. The station of FIG. 6 can process and transmit radio programming in the fashions of the above television programming by adding radio transmission and audio recorder/player means, each with associated radio decoder means as shown in FIG. 2B, wherever television means are shown in FIG. 6, all with similar control means to that shown in FIG. 6 and by processing radio programming with appropriately embedded signals according to the same processing and transmitting methods described above. Likewise, said station can transmit broadcast print and data communications programming by adding appropriate transmission and recorder/player means and decoder/detector means with control means and using the same processing and transmitting methods. This example has described methods at a multi-channel intermediate transmission station; the methods are also applicable in a station that transmits only a single channel of television, radio, broadcast print or data. In addition, the programming and SPAM information transmitted to intermediate transmission station can be encrypted and decrypted and monitored in the fashions described above. Intermediate transmission station apparatus can include signal processing regulating system apparatus such as the apparatus of FIG. 4 by means of which encrypted transmissions that are transmitted to intermediate stations are caused to be decrypted and metered. Intermediate transmission station apparatus can include encryptor apparatus that encrypt programming transmissions selectively. And intermediate transmission station apparatus can include signal processing monitoring system apparatus in the spirit of the apparatus of FIG. 5 whereby the availability, use, and usage of programming at selected intermediate station apparatus is recorded and records are transmitted to remote stations that process such records.

Automating Intermediate Transmission Stations

Example #8

Using the capacity described above for identifying, selecting, and recording received programming; for organizing recorded programming to play according to schedule; for playing selected organized programming on schedule; and for retaining, recording, and retransmitting monitor records that document the transmission of program units, a remote distribution station can transmit to a plurality of intermediate transmission stations programming that is scheduled for delayed transmission, cause each station of said plurality automatically to select and retransmit programming according to its own specific schedule, and cause signal processing apparatus automatically to transmit to a remote auditing station or stations signal records that document the transmission of specific program units at the specific stations of said plurality.

One such remote distribution station might be, for example, a so-called "satellite uplink" that transmits programming, in a fashion well known in the art, to a plurality of receiver stations via a satellite transponder (said intermediate transmission stations being among said receiver stations). Said programming might be, for example, so-called "television spot commercials." Providing means where by one station can transmit programming to a plurality of intermediate transmission stations and cause each intermediate station to transmit its own specific selected units of said programming according to its own specific schedule enables one such distribution station such as a so-called "spot rep." agency that sells the so-called "spot time" of many, widely separated local broadcast stations and cable systems to transmit many different spot commercial program units to said stations and systems automatically and cause each station or system automatically to retransmit its specific selected commercial program units according to its specific schedule. And providing means that document the specific program units transmitted at each specific station enables said distribution station to provide so-called "proof of performance" to parties who pay for the transmission of said spot commercials.

Example #8 illustrates a remote distribution station transmitting programming and causing apparatus at a plurality of intermediate transmission stations to operate in this fashion.

In example #8, a given remote distribution station that is located in Carteret, N.J., USA transmits television programming to a plurality of intermediate transmission stations by means of a satellite that is located approximately 20,000 miles above the Earth in so-called "geosynchronous orbit" and transmits programming to the North American continent. Among said intermediate stations are cable system head ends located in California and Florida, broadcast stations located in Texas and Washington, D.C., and the station of FIG. 6 which is, for example, in Vermont.

At each intermediate transmission station is a computer, 73, that is preprogrammed to receive, process, and record, in a predetermined fashion, program schedule information that is transmitted from said remote distribution station. And the signal processor system, 71, and the computer, 73, of each station are preprogrammed to process particular SPAM message instructions are transmitted from said remote distribution station.

At a particular time on a particular day—for example, at 5 P.M. eastern standard time, on Jan. 27, 1988—said remote distribution station commences contacting, individually and in turn in a fashion well known in the art, the computers, 73, of each of said intermediate station, via telephone or other data transfer network, 98 (which has capacity to communicate information individually between said remote station and each of said computers, 73). Said remote station inputs schedule information to each computer, 73. Said information identifies the particular time and date when all of said intermediate transmission stations should commence receiving a particular satellite transmission—for example, at 4 A.M. eastern standard time, on Jan. 28, 1988—and which particular satellite transponder transmission said stations should prepare to receive the programming on—for example, transponder 23 on the Galaxy 1 satellite. Said schedule information also identifies to each specific computer, 73, which specific program units, transmitted via said transponder, said computer, 73, should cause the apparatus of its station to select and record, and when and on which channel of said station said computer, 73, should cause the apparatus of said station to transmit each of said program units to the field distribution system, 93, of said station. For example, in the case of the computer, 73, of the station of FIG. 6, said remote distribution station informs said computer, 73, to select and record program units Q, D, Y, and W; to transmit program unit Q at 2:30:30 PM eastern standard time, on Jan. 29, 1988 on the cable channel transmitting the Cable News Network; to transmit program unit Y at 2:45:00 PM eastern standard time, on Jan. 29, 1988 on the cable channel transmitting the Cable News Network; to transmit program unit W at 2:45:00 PM eastern standard time, on Jan. 29, 1988 on the cable channel transmitting the USA Cable Network; to transmit program unit D at 9:15:30 PM eastern standard time, on Jan. 30, 1988 on the cable channel transmitting the Cable News Network.

In inputting schedule information to each computer, 73, said remote distribution station instructs different computers, 73, to operate differently. For example, said remote station instructs a particular Florida computer, 73, at a cable system head end station in Florida (which computer, 73, is not the computer, 73, of the station of FIG. 6) to select and record program units Q, J, and L; to transmit program unit J at 2:30:30 PM eastern standard time, on Jan. 29, 1988 on the cable channel of said station in Florida that transmits the Cable News Network; and to transmit units Q and L subsequently at particular times on the cable channel of said station that transmits the Spanish International Network.

Subsequently, at a particular time—more precisely, at 3:50 A.M. eastern standard time, on Jan. 28, 1988—said schedule information and particular preprogrammed receive-scheduled-programming instructions at each computer, 73, cause the computers, 73, at said intermediate transmission stations each, in a predetermined fashion, to commence preparing its particular station to receive and record information of the transmission of transponder 23 of the Galaxy 1 satellite. Automatically, at the station of FIG. 6, the computer, 73, instructs a selected earth station, 50, to move its antenna so as to receive transmissions from a satellite at the celestial coordinates of the Galaxy 1 satellite and instructs amplifier, 51, and receiver, 53, to amplify and tune as required to receive the transmission of the frequency of the transponder 23 of said satellite. (Said celestial coordinates and the transmission frequency of said transponder are preprogrammed at the computer, 73, of each of said intermediate stations, and while FIG. 6 does not show means whereby computer, 73, can control earth station, 50, amplifier, 51, and receiver, 53, said means are well known in the art and exist at each of said intermediate stations, including the station of FIG. 6.) Automatically, at the station of FIG. 6, the computer, 73, causes matrix switch, 75, to configure its switches so as to transfer transmissions from receiver, 53, to a selected primary recorder, 76; causes said recorder, 76, to turn on; and causes said recorder, 76, to move forward or rewind to a particular place on the tape loaded at its record head such as the start of the tape. Automatically, said computer, 73, also causes a selected secondary recorder, 78, to turn on and causes said recorder, 78, to move forward or rewind to a particular place on the tape loaded at its record head such as the start of the tape. (The station could include apparatus well known in the art for automatically loading tape on said recorders, 76 and 78, and control means whereby computer, 73, could instruct said apparatus to load a particular tapes selectively on recorder, 76 and 78.) Simultaneously, the computer, 73, of every other one of said intermediate stations similarly to prepare to receive and record information of the transmission of transponder 23 of the Galaxy 1 satellite.

At 4 A.M. eastern standard time, on Jan. 28, 1988 said remote distribution station commences transmitting programming by satellite up-link means, well known in the art. Said programming consists of a sequence of the program units of 26 spot commercials, each of thirty seconds duration. In succession, said station transmits units A, B, C, D, E, F, G, H, I, J, K, L, M, N, O, P, Q, R, S, T, U, V, W, X, Y, and Z. Embedded in each of said program units are SPAM messages containing appropriate "program unit identification code" information and distance information. Separating the transmission of the end of each program unit and the commencement of the succeeding unit is a brief interval of time. Before transmitting the first program unit and, subsequently, in each one of said intervals, said distribution station transmits a SPAM message that contains execution and meter-monitor segments. Each message contains the same execution segment information that is addressed to ITS computers, 73, and instructs each computer, 73, to identify the information in the meter-monitor segment of said message, to compare said "code" information to the preprogrammed schedule information of said computer, 73, and if a match results, to select and record the programming of the program unit that follows said message, or if no match results, to not select and not record said programming. Each message contains meter-monitor "program unit identification code" information of the program unit that immediately follows. (Hereinafter, said messages are called individually the "select-A-message (#8)," the "select-B-message (#8)," the "select-C-message (#8)," and so forth up to the "select-Z-message (#8)," each message referring to the corresponding program unit: A, B, C, and so forth up to Z, respectively, and said messages are called collectively the "cue-to-select messages (#8).") In the preferred embodiment, the length of each of said intervals is greater than the minimum amount of time necessary for each and every one of said intermediate stations to cause a recorder to commence recording a properly recorded recording of said programming, and said distribution station transmits each of said SPAM messages early enough before commencing to transmit its succeeding program unit to enable all intermediate stations that record said unit to record said unit completely.

Transmitting said programming and said cue-to-select messages (#8) causes signal processing system apparatus at each of said stations to detect said cue-to-select messages (#8) and input said messages to the computers, 73, of said intermediate stations. At the station of FIG. 6, said cue-to-select messages (#8) are detected and transferred to computer, 73, by that dedicated decoder of signal processing system, 71, that receives a transmission from distribution amplifier, 63.

The computers, 73, of said intermediate stations are preprogrammed to process the information of said cue-to-select messages (#8), and receiving any given one of said messages causes each computer, 73, of one of said intermediate transmission stations to determine whether the "program unit identification code" information of said one matches schedule information previously inputted to said computer, 73, by said distribution station. Determining a match causes said computer, 73, to cause apparatus of its station to record the programming of the program unit transmitted immediately after said one. Not determining a match causes said computer, 73, to cause apparatus of its station not to record said program unit.

At the computer, 73, of the station of FIG. 6, receiving the select-A-message (#8), the select-B-message (#8), and the select-C-message (#8), cause said computer, 73, not to cause recording of the programming of program units A, B, and C. Then receiving the select-D-message (#8) causes said computer, 73, to determine that the "program unit identification code" information of unit D matches preprogrammed schedule information which causes said computer, 73, to cause recorder, 76, to commence recording, thereby causing said recorder, 76, to record the programming of program unit D which follows said select-D-message (#8). Then receiving the select-E-message (#8) causes said computer, 73, to determine that the "program unit identification code" information of unit E does not match any preprogrammed schedule information which causes said computer, 73, to cause recorder, 76, to cease recording, thereby causing said recorder, 76, not to record the programming of program unit E which follows said select-E-message (#8). Subsequently, receiving the select-Q-message (#8) causes said computer, 73, to determine that the "program unit identification code" information of unit Q matches preprogrammed schedule information which causes said computer, 73, to cause recorder, 76, to commence recording, thereby causing said recorder, 76, to record the programming of program unit Q which follows said select-Q-message (#8). Then receiving the select-R-message (#8) causes said computer, 73, to determine that the "program unit identification code" information of unit R does not match any preprogrammed schedule information which causes said computer, 73, to cause recorder, 76, to cease recording, thereby causing said recorder, 76, not to record the programming of program unit R which follows said select-R-message (#8).

Each computer, 73, of said intermediate stations is preprogrammed to account for and keep track of the quantity of time available for additional recording on the individual tapes loaded on the recorders (eg., 76 and 78) of its station, and receiving any given message of said cue-to-select messages (#8) can cause any given computer, 73, to cause the apparatus of its station to switch from a primary to a secondary recorder of said station. For example, at the station of FIG. 6, each time computer, 73, receives a SPAM message that identifies the end of a program unit that its primary recorder, 76, has been recording, said computer, 73, determines, in a predetermined fashion, whether sufficient tape recording capacity exists on said recorder, 76, to continue recording. Determining that sufficient capacity does not exist causes computer, 73, to switch the input of the received transmission of said remote distribution station to the aforementioned alternate recorder, recorder, 78. At the station of FIG. 6, receiving said select-R-message (#8) causes said computer, 73, (after causing recorder, 76, to cease recording) to cause matrix switch, 75, to configure its switches to commence transferring the transmission from receiver, 53, to recorder, 78, and to cease transferring said transmission to recorder, 76.

In due course, receiving the select-W-message (#8) causes said computer, 73, to determine that the "program unit identification code" information of unit W matches preprogrammed schedule information which causes said computer, 73, to cause recorder, 78, to commence recording, thereby causing said recorder, 78, to record the programming of program unit W which follows said select-W-message (#8). Then receiving the select-X-message (#8) causes said computer, 73, to cause recorder, 78, to cease recording, thereby causing said recorder, 78, not to record the programming of program unit X. Then, receiving the select-Y-message (#8) causes said computer, 73, to cause recorder, 78, to commence recording, thereby causing said recorder, 78, to record the programming of program unit Y. Then receiving the select-Z-message (#8) causes said computer, 73, to cease recording.

Whenever any given computer, 73, of said intermediate stations causes a recorder (eg., 76 or 78) of its station to cease recording, said computer, 73, then checks its contained records in a predetermined fashion to determine whether all scheduled program units have been received (and, hence, that no further units will be received). And when said remote distribution station finishes transmitting the final program unit (unit Z), said station transmits a particular final SPAM message that, in a predetermined fashion, causes any given computer, 73, whose records show that one or more program units remain unreceived to determine that no units will be received.

Whenever any given computer, 73, of said stations determines that no further units will be received, said computer, 73, causes apparatus of its station to cease receiving the transmission of said remote distribution station, alters its operating records to show that the receiver apparatus receiving said transmission is available for other use; and commences automatically organizing, in the fashions described above, the order of the program units so selected and recorded and playing said units according to its contained schedule.

At the station of FIG. 6, receiving said select-Z-message (#8) causes computer, 73, to determine that program units Q, Y, W, and D have been received and that no further units will be received. Determining that no further units will be received causes computer, 73, to cause matrix switch, 75, to configure its switches so as to transfer transmissions inputted from receiver, 53, to no output; to alter its operating records to show that the receiver apparatus receiving the transmission of said remote distribution station is no longer in use and is available; and to organize the locations of the recorded program units, D, Q, W, and Y, to play according to the schedule inputted by said distribution station in the fashion described above (in the paragraph of the section, "AUTOMATING INTERMEDIATE TRANSMISSION STATIONS," that begins, "Computer, 73, has capacity for automatically organizing the locations of units of prerecorded programming . . . to play according to a given schedule").

(In so transmitting said programming and said cue-to-select messages (#8), said remote distribution station causes different intermediate transmission stations to select and record different programming and to organize recorded program units differently. For example, transmitting the select-J-message (#8), the select-K-message (#8) the select-L-message (#8), the select-M-message (#8), the select-Q-message (#8), and the select-R-message (#8) causes signal processing apparatus at the aforementioned cable system head end station in Florida to input the aforementioned Florida computer, 73, that said distribution has instructed to select, record, and play program units Q, J, and L according to schedule. Receiving said select-J-message (#8), the select-L-message (#8), and the select-Q-message (#8) cause said Florida computer, 73, to determine that "program unit identification code" information matches preprogrammed schedule information which causes said Florida computer, 73, to cause a selected recorder of said station to commence recording, thereby causing said recorder to record the programming of program units J, L, and Q. Receiving the select-K-message (#8) and the select-M-message (#8) causes said Florida computer, 73, to determine that "program unit identification code" information does not match preprogrammed schedule information which causes said computer, 73, to cause said recorder, 76, to cease recording. And receiving the select-R-message (#8) and the select-M-message (#8) causes said Florida computer, 73, to determine that no further units will be received and to organize the locations of the recorded program units, J, L, and Q, to play according to its own schedule, previously inputted by said distribution station.)

In due course, as described above, completing the organization of units Q, Y, W, and D causes the computer, 73, of the station of FIG. 6 automatically to cause recorder, 76, to move forward or rewind to the start of unit Q and to cause recorder, 78, to move forward or rewind to the start of unit W. (Completing the organization of units J, L, and Q causes said Florida computer, 73, automatically to cause the aforementioned recorder of its station to move forward or rewind to the start of unit J.)

At a particular time prior to 2:30 PM eastern standard time, on Jan. 29, 1988 particular preprogrammed schedule-network information and receive-scheduled-programming instructions cause the computer, 73, of the station of FIG. 6 to cause apparatus at said station to receive the transmission of the Cable Channel Network; to transmit said transmission to field distribution system, 93, via the cable channel of modulator, 83; and to commence processing monitor information embedded in said transmission. Automatically, said computer, 73, causes earth station, 50, to move its antenna so as to receive transmissions from a satellite at particular preprogrammed celestial coordinates; causes amplifier, 51, and receiver, 53, to amplify and tune as required to receive the transmission of the particular preprogrammed frequency of a particular CNN transponder of said satellite; and causes matrix switch, 75, to configure its switches so as to transfer transmissions from receiver, 53, to modulator, 83. Automatically, signal processor, 96, and the signal processor of signal processor system, 71, each commence detecting SPAM messages in said transmission and retaining and recording signal records of Cable News Network program units.

At 2:30:29 PM eastern standard time, on Jan. 29, 1988 the Atlanta, Ga. program originating studio that originates said transmission of the Cable Channel Network embeds the aforementioned first-network-cue-to-transmit-locally message (#8) in said transmission and transits said transmission to said CNN transponder. Automatically, said transponder retransmits said transmission, said transmission is received at the station of FIG. 6, and said message is inputted to computer, 73, with source mark information of distribution amplifier, 63. (Automatically, said message is also inputted to the computers, 73, of others of said intermediate transmission stations including said Florida computer, 73.)

Receiving said first-network-cue-to-transmit-locally message (#8) causes the computer, 73, of the station of FIG. 6, as described above, to cause the apparatus of said station to cease transmitting the Cable News Network transmission to field distribution system, 93, and to commence transmitting the locally originated transmission of unit Q. (Receiving said first-network-cue-to-transmit-locally message (#8) causes said Florida computer, 73, to cause the apparatus of its station to cease transmitting the Cable News Network transmission to its field distribution system and to commence transmitting the locally originated transmission of unit J.)

Because said first-network-cue-to-transmit-locally message (#8) is transmitted, via matrix switch, 73, to field distribution system, 93, at the station of FIG. 6 (and so transmitted also at the station of said Florida computer, 73) before receiving said message can cause said switch, 73, to cease transmitting said Cable News Network transmission to said field, 93, receiving said first-network-cue-to-transmit-locally message (#8) causes the signal processor of the signal processor system, 71, and the signal processor, 96, of station of FIG. 6 to retain signal record information of the meter-monitor information of said first-network-cue-to-transmit-locally message (#8) as described above. (Receiving said message causes corresponding signal processor apparatus at the station of said Florida computer, 73, similarly to retain signal record information.)

Causing the apparatus of the station of FIG. 6 to commence transmitting the locally originated transmission of unit Q to field distribution system, 93, causes the signal processor of the signal processor system, 71, and the signal processor, 96, of station of FIG. 6 to retain signal record information of the meter-monitor information of SPAM messages embedded in the prerecorded programming of said unit Q, as described above; causes said processors (in the fashion described in example #3 above) each to record previously retained signal record information of the prior programming—i.e., programming of said Cable News Network—and may cause one or both of said processors to transmit signal record information or one or more remote auditing stations.

At 2:30:59 PM eastern standard time, on Jan. 29, 1988 said program originating studio that originates said transmission of the Cable Channel Network embeds the aforementioned first-network-cue-to-transmit-network message (#8) in said transmission and transits said transmission to said CNN transponder. And automatically, said message is inputted, with source mark information, to the computer, 73, of the station of FIG. 6 (and to said Florida computer, 73).

Receiving said first-network-cue-to-transmit-network message (#8) causes the computer, 73, of the station of FIG. 6, to cause the apparatus of said station, as described above, to cease transmitting to field distribution system, 93, the locally originated transmission of unit Q; to recommence transmitting said Cable News Network transmission; and to prepare to play the locally originated transmission of unit Y. (At the station of said Florida computer, 73, receiving said first-network-cue-to-transmit-network message (#8) causes said Florida computer, 73, to cause the apparatus of said station to cease transmitting the locally originated transmission of unit J; to recommence transmitting said Cable News Network transmission; and to prepare to play the locally originated transmission of unit Q or unit L.)

Subsequently, other SPAM cueing messages cause the computer, 73, of the station of FIG. 6; said Florida computer, 73; and the computers, 73, of others of said intermediate transmission stations to locate, position to play, and transmit automatically other local origination program units. And the transmission of other SPAM messages with meter-monitor information cause the signal processors at said intermediate transmission station to retain, record, and transmit to remote auditing stations signal records that document the specific program units transmitted at each specific one of said stations.

In this fashion, a remote distribution station can deliver prerecorded programming to a plurality of intermediate transmission stations, control the automatic time-delayed insertion of specific program units of programming into other programming transmissions at specific intermediate transmission stations according to the specific schedule of each station, and cause records to be recorded and transmitted to a remote auditing station or stations that document which specific program units were transmitted at which specific station at what specific times.

Automating Intermediate Station Combined Medium Operations

Including Example #9

The station of FIG. 6 has capacity to automatically process and transmit television-based combined medium programming such as that of the "Wall Street Week" example above. In the case of programming that is transmitted to said station with all required program instruction sets and combining synch commands already properly embedded, said station records and transmits said programming just as said station records and transmits conventional television programming.

But said station also has means for automatically generating and embedding combined medium programming control instructions in certain fashions. FIG. 6 shows signal strippers, 81, 85, and 89, of which models exist well known in the art, that computer, 73, can cause to remove SPAM information from programming as required, and signal generators, 82, 86, and 90, also well known in the art, that computer, 73, can cause to embed SPAM information as required. Said generators, 82, 86, and 90, have capacity for receiving control information and programming in a transmission from computer, 73, and distinguishing, in a predetermined fashion, said control information from said programming. Said strippers, 81, 85, and 89, and generators, 82, 86, and 90, have capacity for stripping or embedding SPAM information at as little as one portion of one line of one frame of a television transmission or as much as every line of every frame and capacity to strip or insert SPAM information on a given frame at multiple, non-contiguous locations.

For sake of example, program units, Q and D, above are combined medium programming of the same sort as "Wall Street Week" except that computer, 73, must insert one or more particular locally generated program instruction sets into a local transmission of the programming of each of said program units. For example, program unit Q is a spot commercial of a supermarket chain that describes discounts and so-called "cents-off coupon specials" at local supermarkets. The particular formulas that apply to discounts and the particular items on special vary from specific supermarket to specific supermarket and from time to time, and the information in the embedded program instruction sets of any given transmission of unit Q must reflect the particular formulas and items that apply at specific local supermarkets at the time of said transmission.

Program units Q and D are delivered, organized to play, and played according to schedule in the automatic fashions described above but with certain variations.

Computer, 73, is preprogrammed to process combined medium programming. When the aforementioned remote distribution station inputs information to computer, 73, via network, 98, regarding unit Q, said distribution station inputs information that Q is particular combined medium programming and instructs computer, 73, to commence particular program instruction set generation in a particular fashion at a particular time interval prior to the scheduled playing of Q. (Hereinafter, a particular instance of such a time period is called "interval," as in "interval Q" of unit Q.) Inputting said information and instructions causes Computer, 73, to record said information and instructions in its record keeping fashion together with the scheduled generation time which computer, 73, calculates as the scheduled play time minus interval Q. Prior to the scheduled generation time, particular local-formula-and-item information is inputted to computer, 73, regarding the formulas and items that apply in the case of this particular transmission of Q. (In other words, said local-formula-and-item information reflects specific information such as the particular discounts and cents-off coupon specials that apply at the scheduled time of the transmission of unit Q at the particular supermarket or markets that are local to the station of FIG. 6.) Said information may be inputted from local input, 74, or over network, 98, and computer, 73, records said information in a predetermined fashion.

Computer program instructions, of the sort well known in the art, are also inputted to computer, 73, and computer, 73, is caused to execute said instructions. Executing said instructions causes computer, 73, to generate information of a program instruction set. (Hereinafter, an instance of computer program instructions that cause a computer, at an intermediate transmission station, to generate information of a program instruction set is called an "intermediate generation set.")

For example, when executed, one particular intermediate generation set that is inputted to computer, 73, causes computer, 73, in a fashion that is described more fully below, to generate particular program instruction set information of the combined medium programming of program unit Q.

Computer, 73, can receive and be caused to execute intermediate generation set information in any fashion that a computer receives and is caused to execute computer program instructions.

In the case of prerecorded programming, in the preferred embodiment, the information of any given intermediate generation set is prerecorded in a program unit with the conventional programming—for example, the conventional television or radio programming—into whose transmission is embedded the program instruction set whose generation said given intermediate set causes. And said intermediate set is prerecorded in said program unit before the start of said conventional programming. For example, in the case of television programming such as the programming of unit Q, the particular intermediate set that is inputted to computer, 73, is located on the recording medium of unit Q within the defined space of program unit Q immediately following the point at which unit Q starts and before the point at which the conventional television information of Q commences. Said intermediate generation set information is embedded in the so-called "full frame" video on each successive frame until complete information of said set information is embedded; that is, embedding of said set information commences at the first line of the normal transmission location and continues on each successive detectable line of a first frame and, continuing in this fashion, on each successive frame until all intermediate generation set information is embedded. The conventional television video and audio information of program unit Q are prerecorded in the conventional fashion, commencing at the frame immediately following the last frame in which intermediate generation set information is embedded.

Any given intermediate generation set contains generally applicable information of the particular program instruction set whose generation it causes. Generally applicable information is specific. For example, the generally applicable information of the intermediate generation set of the programming of Q includes binary sound image information of a particular announcer's voice saying, "forty-three", "forty-five", "forty-six", "low-salt Vindaloo", "Mild version Quick", and "Hot version Quick". And any given datum of generally applicable information may be specific information only of selected subscriber stations. Yet such information is generally applicable at any given transmission station because any given datum may be applicable at any or all of the subscriber stations of said transmission station.

Said generally applicable information lacks specific information that is required to complete the generation of a given instance of a generated program instruction set. (For example, in the case of unit Q, the intermediate generation set lacks information of the particular discount formulas and items offered as cents-off coupon specials that apply at the scheduled time of the transmission of unit Q at the particular supermarket or markets that are local to the station of FIG. 6.)

When executed at a computer, 73, that is preprogrammed with particular local-formula-and-item information (that is, particular data), the instructions of a given intermediate generation set (that is, of a given computer program) cause said computer, 73, to generate particular formula-and-item-of-this-transmission information and incorporate said information into said generally applicable information of said particular program instruction set, thereby generating the particular program instruction set instance applicable to a particular transmission at a particular intermediate transmission station. The set information so generated may consist of computer program instructions and/or data.

An example #9, that focuses on generating, embedding, and transmitting combined medium program instruction set programming of unit Q at the station of FIG. 6 illustrates automating intermediate station combined medium operations.

At the aforementioned interval Q time prior to the scheduled playing of Q, particular preprogrammed preplay-and-generate instructions cause computer, 73, to commence said program instruction set generation. Said instructions cause computer, 73, to cause matrix switch, 75, to switch the input from recorder, 76, to no output; to cause recorder, 76, to position the start of unit Q at its play head; to cause decoder, 77, to commence detecting signals on all video lines from the beginning of the normal transmission pattern to the end of the last detectable line of the full video frame; then to cause recorder, 76, to commence playing which causes recorder, 76, to transmit and decoder, 77, to detect a particular SPAM message. (Hereinafter, said message is called the "generate-set-information message (#9)".) Said message is addressed to ITS computers, 73, and contains a particular execution segment, appropriate meter-monitor information, padding bits as required, an information segment whose information is the intermediate generation set of Q, and an end of file signal. (Hereinafter, the intermediate generation set that causes any given intermediate transmission station to generate a program instruction set of an instance of the transmission of the programming of program unit Q is called the "intermediate generation set of Q".)

Detecting said message causes decoder, 77, to transmit said message to computer, 73, and receiving said message at computer, 73, causes particular SPAM decoder apparatus of computer, 73, (which apparatus is analogous to SPAM-controller, 205C, at microcomputer, 205, above and is not distinguished from computer, 73, hereinafter) to execute particular controlled functions. In the fashion of the first message of the "Wall Street Week" example at microcomputer, 205, computer, 73, is caused to load information of said intermediate generation set at particular RAM. Then receiving the end of file signal that ends said message causes computer, 73, to execute particular additional instructions of said controlled functions. Executing said instructions, causes computer, 73, to cause recorder, 76, to cease playing and position the start of the unit Q conventional television programming at the play head of recorder, 76; to cause decoder, 77, to commence detecting information in the normal transmission location alone; to cause stripper, 81, and generator, 82, to prepare to commence stripping and embedding information, respectively, in the normal transmission location; and to execute the information of said intermediate generation set as a compiled, machine language job.

Executing the information of said set causes computer, 73, to compute said formula-and-item-of-this-transmission information in the predetermined fashion of said intermediate generation set according to the prerecorded data of said local-formula-and-item information; to compile formula-and-item-of-this-transmission information into a machine language program module; and to link said module to other program modules of said program instruction set (which modules may include modules of the aforementioned generally applicable information of said program instruction set and may also include modules preprogrammed at computer, 73). (Formula-and-item-of-this-transmission information can be incorporated into more than one module by any given intermediate generation set.)

Said formula-and-item-of-this-transmission information can consist of both computer program instructions and data. For example, one of the aforementioned discounts and cents-off coupon specials is of a 15 cents off coupon special on an offered product that varies from week to week and market to market. The information of the particular product that is offered at the particular time of the scheduled transmission at the station of FIG. 6 and at the particular supermarkets in the locality of said station is data that exist in the aforementioned local-formula-and-item information—eg., "Nabisco Zweiback Teething Toast". Other data in said local-formula-and-item information includes, for example, the street address of every one of said supermarket chain's markets in the locality said station.

Other formula-and-item-of-this-transmission information can be computer program instructions. For example, another of the aforementioned discounts and cents-off coupon specials is of a particular product—eg. untrimmed pork bellies—that is advertised in the conventional television programming of unit Q. In the conventional programming, an announcer makes an offer, "Super Discount Supermarkets will deliver to you, at cost, all the pork you need . . . . " In the example, the costs of delivery involve transportation from the central warehouse of the supermarket chain to each local market and transportation from each market to the station of any given subscriber who orders a pork belly package. In the example, the cost of delivery for any given subscriber is calculated under control of formulae that are computer program instructions.

The particulars of the untrimmed pork belly and "Nabisco Zweiback Teething Toast" specials of example #9 illustrate generating formula-and-item-of-this-transmission information.

The cost of a unit of pork belly product for any given subscriber is computed according to a particular formula:

$$Y=a+b+c(X) \quad (1)$$

where:

Y is the delivered cost to said subscriber per unit of pork belly product, a is the supermarket chain's cost per unit of pork belly onboard an outbound vehicle at said warehouse, b is the cost of transportation to the market of said subscriber, c is the cost per mile of transportation that applies to deliveries from said market, and X is the distance in miles between said market the station of said subscriber.

Pork belly prices vary from day to day as so-called "spot" prices change on commodity markets. And transportation costs vary from time to time and place to place according to variations in, for example, costs of gasoline and wages of vehicle drivers. Accordingly, each time the programming of unit Q is transmitted to subscribers, the values of variables a, b, and c in equation (1) that are applicable to the particular time and place of transmission must be computed and processed. For any given transmission of the television commercial of program unit Q, the price of an advertised unit of pork bellies (which price is a) is a datum that is pre-entered into computer, 73, and recorded in said local-formula-and-item information. And said values of b and c are computed according to the following equations (2) and (3) respectively:

$$b=(p+q+d)Z \quad (2)$$

where:

b is the b of equation (1), p is the cost of gasoline per pork belly unit mile between said warehouse and said market, q is the wage of the driver per unit mile between said warehouse and said market, d is the depreciation of the vehicle per unit mile between said warehouse and said market, and Z is the distance in miles between said warehouse and said market.

$$c=r+s+dd \quad (3)$$

where:

c is the c of equation (1), r is the cost of gasoline per unit mile between said market and the station of said subscriber, s is the wage of the local driver per unit mile between said market and said station, and dd is the depreciation of the local vehicle per unit mile between said market and said station.

For any given transmission of the television commercial of program unit Q, the following variables are also data that are pre-entered into computer, 73, and recorded in said local-formula-and-item information: p, q, d, Z, r, s, and dd.

At the aforementioned interval Q time prior to the scheduled playing of Q, when computer, 73, commences generating said program instruction set, the local-formula-and-item information of computer, 73, includes information that:

a is 1000.00
p is 0.00625
q is 0.12
d is 0.1
Z is 275
r is 0.007
s is 2.00
dd is 0.11

The intermediate generation set information of said generate-set-information message (#9) includes program instructions that cause each addressed ITS computer, 73, to compute values of variables b and c according to formulas (2) and (3), given the local-formula-and-item information of p, q, d, Z, r, s, and dd, and to incorporate said computed values of b and c into generally applicable program instruction set information of equation (1).

Executing the information of said intermediate generation set causes computer, 73, to generate said program instruction set in the following fashion. Automatically, computer, 73, selects information of each of the aforementioned variables, a, p, q, d, Z, r, s, and dd; computes the value of variable b, under control of intermediate generation set instructions of equation (2), to be 62.21875; computes the value of variable c, under control of intermediate generation set instructions of equation (3), to be 2.117; and replaces particular variable values, a, b, and c, in a particular so-called "higher language line of program code" that is among the aforementioned generally applicable information of said program instruction set and is:

$$Y=a+b+(c*X)$$

[which is equation (1) in the language of the IBM BASIC of the IBM Personal Computer Hardware Reference Library] with said selected information of a and the so computed information of b and c to become formula-and-item-of-this-transmission information of:

$$Y=1000.00+62.21875+(2.117*X)$$

[which is formula-and-item-of-this-transmission information in said BASIC]. Automatically, computer, 73, selects and computes information of other variables and replaces other variable values of said generally applicable program instruction set information until a complete instance of higher language code of said program instruction set with all required formula-and-item-of-this-transmission information has been generated and exists at particular memory. Automatically, computer, 73, compiles the information of said instance and places the resulting so-called "object module" at particular memory (which compiling could be done, in the case of a program written in IBM BASIC, with the IBM BASIC Compiler of the IBM Personal Computer Language Series). Automatically, computer, 73, links the information of said object module with information of other compiled object modules that exist in memory at computer, 73, (and may have been transmitted to computer, 73, in the generally applicable program instruction set information if said intermediate generation set); generates a particular PROGRAM.EXE output file that is said program instruction set; and places said file at particular program-set-to-transmit memory of computer, 73, (which linking could be done, in the case of a program compiled by the IBM BASIC Compiler with the linker program of the IBM Disk Operating System of the IBM Personal Computer Computer Language Series). One of said other compiled object modules is a module that, when accessed in a fashion well known in the art, computes the shortest vehicle driving distance between any two locations in the local vicinity of the station of FIG. 6 when passed two street addresses of said vicinity. (Hereinafter, the program instruction set generated in example #9, under control of said intermediate generation set of Q, is called the "program instruction set of Q".)

Executing the information of said intermediate generation set causes computer, 73, also to generate a particular associated data module. (Hereinafter, a data module that is transmitted to subscriber stations and processed by computers of said stations under control of instructions of a program instruction set is called a "data module set," and any given intermediate generation set may cause generation of information of a data module set or sets in addition to or rather than generating information of a program instruction set or sets.) In a fashion well known in the art, computer, 73, selects, from among the data in said local-formula-and-item information, information of the aforementioned "Nabisco Zweiback Teething Toast"; information of the street address of every one of said supermarket chain's markets in the local vicinity of the station of FIG. 6; particular cost-of-a-trimmed-pork-belly-unit information of 1987.25 that is the cost of all the trimmed cuts of meat of a pork belly unit; binary video image information of several telephone numbers, including a particular southwest delivery route telephone number, "456-1414", and a particular northwest delivery route telephone number, "224-3121"; and information of the particular local-automatic-order-taking telephone number of the supermarket chain applicable in the vicinity of the intermediate transmission station of FIG. 6 which is 1-(800) 247-8700. Automatically, computer, 73, places said selected information (and any other information so selected) in a particular file called DATA_OF.ITS until the information of said file constitutes a complete instance of a particular data module set of Q. (Hereinafter, the data module set generated in example #9, under control of said intermediate generation set of Q, is called the "data module set of Q".)

Subsequently, at the scheduled time of the playing of Q, the station of FIG. 6 is transmitting via modulator, 83, a television network transmission that is inputted to matrix switch, 75, from distribution amplifier, 63. At said time, at the particular program originating studio that originates said network transmission, a particular SPAM message that contains execution and meter-monitor segments and that is addressed to ITS computers, 73, is embedded in said network transmission and transmitted. (Hereinafter, said message is called the "first cueing message (#9).")

Transmitting said message causes that decoder of signal processing system, 71, that receives the transmission of said distribution amplifier, 63, to detect said message and input said message, with appropriate source mark information, via code reader, 72, to computer, 73.

Receiving said message and said mark information causes computer, 73, to so-called "cue" recorder, 76, and generator, 82, and to operate in its automatic playing fashion. Receiving said message and mark causes computer, 73, to cause recorder, 76, to commence playing and to cause matrix switch, 75, to configure its switches so as to cease transferring programming inputted from distribution amplifier, 63, to modulator, 83, then to commence transferring the output of recorder, 76, to modulator, 83, which causes the transmission of unit Q to field distribution system, 93. In addition, because the playing schedule of the station of FIG. 6 includes preprogrammed information that program unit Q is combined medium programming, receiving said message causes generator, 82, to cease embedding other signal information in the normal transmission location (such as, for example, teletext information well known in the art [and in so causing said generator, 82, to cease embedding said other information—for, example, said teletext—detecting said message at said intermediate station causes subscriber stations that are receiving said other information—for, example, said teletext—to cease receiving said other information]) and to transmit information of a SPAM end of file signal (and in so doing, to cause subscriber station decoder apparatus—for example, apparatus at teletext processor units—to commence detecting and discarding SPAM messages of the combined medium programming of Q).

Causing recorder, 76, to play causes recorder, 76, to transmit programming of Q, via matrix switch, 75, and modulator, 83, to field distribution system, 93, and also causes recorder, 76, to input the programming of Q to decoder, 77.

Immediately after commencing to transmit said programming of Q, recorder, 76, plays and transmits three SPAM messages that are embedded in the prerecorded programming of Q.

The first message is addressed to URS signal processors, 200, and causes subscriber stations that are tuned to the channel of transmission of said modulator, 83, to combine their microcomputers, 205, to the computer system of said transmission, which transmission is originated by said recorder, 76. (Said message and the functioning that said message causes are described more fully below, and hereinafter, said message is called the "align-URS-microcomputers-205 message (#9)".)

The second message is embedded in the prerecorded programming of Q at a distance after said first message that is sufficient to allow time for apparatus at each of said subscriber stations so to combine. The execution segment of said second message is of the aforementioned pseudo command, and transmitting said message causes decoder apparatus at said subscriber stations each to detect an end of file signal and to commence identifying and processing the individual SPAM messages of the SPAM information subsequently embedded in the transmission of the programming of Q. (Said message and the functioning that said message causes are described more fully below, and hereinafter, said message is called the "synch-SPAM-reception message (#9)".) Thereafter, embedding and transmitting any given SPAM message in said transmission invokes a controlled function or functions at particular ones of said decoder apparatus.

The third message invokes broadcast control of the microcomputers, 205, of said stations in the invoking broadcast control fashion described above in "One Combined Medium." Said third message is embedded in said prerecorded programming of Q immediately after said second message and is addressed to URS decoders, 203. (Said message is described more fully below, and hereinafter, said message is called, the "control-invoking message (#9)".) Said message causes each decoder, 203, to input control invoking instructions (that are preprogrammed at said decoder, 203) to its associated microcomputer, 205. In so doing, transmitting said control-invoking message (#9) causes the microcomputers, 205, of said subscriber stations to come under control of the computer system of said recorder, 77.

Causing recorder, 76, to play unit Q causes the decoder, 77, of the station of FIG. 6 then to detect a series of SPAM messages that are embedded in the programming of Q and are addressed to ITS computers, 73. Detecting said messages causes decoder, 77, to transfer said messages to computer, 73. (Decoder, 80, can detect and transfer said messages to computer, 73, but in respect to any given embedded signal in a programming transmission, computer, 73, is preprogrammed to operate under the control of just one decoder; decoder, 77 or 79, is the default decoder for transmissions from recorder, 76 or 78 respectively, and signal processor, 71, contains the default decoder of any given transmission received at a receiver; and computer, 73, is preprogrammed to operate under the control of signals from decoder, 80, only for verifying the transmission of signals unless its methods of processing signals from decoder, 80, are changed in a predetermined fashion.)

The first message of said series contains execution and meter-monitor segments. (Said first message is called, hereinafter, the "transmit-data-module-set message (#9)".)

Receiving said transmit-data-module-set message (#9) causes computer, 73, to generate a particular first outbound SPAM message that includes information of the aforementioned data file, DATA_OF.ITS, whose information constitutes a complete instance of a data module set of Q and to cause said message to be embedded in the transmission of the programming of Q and transmitted to field distribution system, 93, in the following fashion. (Hereinafter, said first outbound SPAM message is called the "data-module-set message (#9).") Automatically, computer, 73, causes stripper, 81, to commence stripping all signals from the normal transmission location; causes generator, 82, to commence embedding information received from computer, 73; selects the information of said meter-monitor segment, adds particular information that identifies the station of FIG. 6 and the time of transmission, modifies the meter-monitor format field information to reflect said added information, and retains the received, added, and modified meter-monitor information; and selects and transmits to generator, 82, complete information of said data-module-set message (#9). In selecting and transmitting said complete information, computer, 73, automatically selects and transmits information of a "01" header; information of a particular SPAM execution segment that is addressed to URS microcomputers, 205; said retained meter-monitor information; any required padding bits (the requirement for and number which computer, 73, determines in a predetermined fashion); complete information of said data file, DATA_OF.ITS; and information of a SPAM end of file signal.

(The apparatus of the station of FIG. 6 may be preprogrammed in such a fashion that computer, 73, causes generator, 82, to cease embedding in the normal transmission location other signal information such as teletext information then to transmit an end of file signal each time computer, 73, causes generator, 82, to embed a SPAM message of the programming of Q then to recommence transmitting other signal information such as teletext automatically upon embedding said last named message by transmitting an "01" header; execution segment information addressed to appropriate URS receiver apparatus such as URS teletext receiver apparatus; appropriate meter-monitor information; padding bits as required; and information segment information of said other signal information such as teletext. [No end of file signal is transmitted until generator, 82, is caused to cease the transmission of said other signal information.])

Receiving the information of said data-module-set message (#9) causes generator, 82, to embed said information in the normal transmission location of the programming of Q transmission being transmitted via generator, 82, to field distribution system, 93, thereby transmitting said data-module-set message (#9) to said system, 93.

In due course, decoder, 77, detects the second SPAM message in the aforementioned series of SPAM messages that are addressed to ITS computers, 73, and transfers said message to computer, 73.

Said second message contains execution and meter-monitor segments (and is called, hereinafter, the "transmit-and-execute-program-instruction-set message (#9).")

Receiving said transmit-and-execute-program-instruction-set message (#9) causes computer, 73, to generate a second outbound SPAM message that includes information of said program instruction set of Q and to cause said message to be embedded in the transmission of the programming of Q and transmitted to field distribution system, 93, in the following fashion. (Hereinafter, said second outbound SPAM message is called the "program-instruction-set message (#9).") Automatically, computer, 73, selects the information of said meter-monitor segment, adds particular information that identifies the station of FIG. 6 and the time of transmission, modifies the meter-monitor format field information to reflect said added information, and retains the received, added, and modified meter-monitor information. Then, automatically, computer, 73, selects and transmits to generator, 82, information of a "01" header; information of a particular SPAM execution segment that is addressed to URS microcomputers, 205; said retained meter-monitor information; any required padding bits; complete information of the aforementioned file that is at the aforementioned program-set-to-transmit memory of computer, 73, and that is said program instruction set of Q; and information of a SPAM end of file signal. Said selected and transmitted information is complete information of said program-instruction-set message (#9).

Receiving said information causes generator, 82, to embed said information in the normal transmission location of the programming of Q transmission being transmitted via generator, 82, to field distribution system, 93, thereby transmitting said program-instruction-set message (#9) to said system, 93.

Then decoder, 77, detects the third SPAM message in the aforementioned series of SPAM messages that are addressed to ITS computers, 73, and transfers said message to computer, 73.

Said third message contains an execution segment and is addressed to ITS computers, 73. (Said third message is called, hereinafter, the "cease-stripping-and-embedding message (#9)".)

Receiving said message causes computer, 73, to cause stripper, 81, to cease stripping signal information from the normal transmission location and to cause generator, 82, to cease embedding signal information in the normal transmission location.

Subsequently, as recorder, 76, plays and transmits the programming of Q, via modulator, 83, to field distribution system, 93, recorder, 76, transmits eight SPAM messages that are embedded in the prerecorded programming of Q. (Hereinafter, said messages are called [in the order in which said messages are transmitted], the "1st commence-outputting message (#9)", the "2nd commence-outputting message (#9)", the "3rd commence-outputting message (#9)", the "1st cease-outputting message (#9)", the "4th commence-outputting message (#9)", the "5th commence-outputting message (#9)", the "6th commence-outputting message (#9)", and the "2nd cease-outputting message (#9)".) Each of said eight SPAM messages contains execution segment information addressed to URS microcomputers, 205, (which causes decoder, 77, to discard the information of said messages). Said messages are discussed more fully below.

At the scheduled end time of the playing of program unit Q, another particular SPAM message that contains an execution segment and that is addressed to ITS computers, 73, is embedded at said program originating studio and transmitted in said network transmission. (Hereinafter, said message is called the "second cueing message (#9).")

Transmitting said message causes said decoder of signal processing system, 71, to detect said message and input said message, with appropriate source mark information, to computer, 73.

Receiving said message and said mark information causes computer, 73, to so-called "cue" said network transmission and continue in its automatic playing fashion. Automatically, computer, 73, causes matrix switch, 75, to configure its switches to cease transferring the output of recorder, 76, to modulator, 83, and commence transferring the transmission inputted from distribution amplifier, 63, to modulator, 83, which causes the transmission said network transmission to field distribution system, 93. Automatically, computer, 73, may cause generator, 82, to embed a particular message (that is described more fully below and called, hereinafter, the "disband-URS-microcomputers-205 message (#9)") that causes subscriber stations whose microcomputers, 205, are combined to the computer system of the transmission of recorder, 76, to separate said microcomputers, 205, from said transmission. Automatically, according to the play schedule of the station of FIG. 6, computer, 73, may cause generator, 82, to commence embedding other signal information in the normal transmission location (such as, for example, teletext information [and in so causing said generator, 82, to commence embedding said other information—for, example, said teletext—detecting said message at said intermediate station causes subscriber stations that are receiving said other information—for, example, said teletext—to commence receiving said other information]), by transmitting an "01" header then execution segment information addressed to receiver apparatus of said other information then appropriate meter-monitor information then said other information. And automatically, computer, 73, causes recorder, 76, to cease playing and to commence preparing to play its next scheduled local origination program unit.

(Example #9 ends, insofar as intermediate station operations are concerned, with computer, 73, commencing to prepare to play said next program unit; however, the effects of so transmitting unit Q and said data-module-set message (#9), said program-instruction-set message (#9), said 1st commence-outputting message (#9), said 1st cease-outputting message (#9), said 2nd commence-outputting message (#9), said 3rd commence-outputting message (#9), and said 2nd cease-outputting message (#9) are described more fully below.)

Network Control of Intermediate Generating and Embedding

Example #10

In the present invention, a remote network origination and control station, such as the aforementioned program originating studio that originates the transmission of the "Wall Street Week" program, can control a plurality of intermediate transmission stations in generating and embedding combined medium control instructions—that is, program instruction sets, data module sets, and combining synch commands—that control generating and transmitting at pluralities of ultimate receiver stations.

An example #10, focuses on combined medium network control of intermediate transmission stations, controlling ultimate receiver stations.

In example #10, a particular program originating studio transmits the commercial of program unit Q in a network transmission and controls a plurality of intermediate transmission stations each of which controls, in turn, a plurality of subscriber stations that are ultimate receiver stations.

The station of FIG. 6 is one intermediate transmission station controlled by said studio. The station of FIG. 6 receives said network transmission at receiver, 53, and retransmits said transmission immediately via modulator, 83.

The program unit Q of example #10 is identical to the program unit Q of example #9, and each intermediate transmission station must generate transmit its own, station specific program instruction set and data module set information that contains its own, station specific formula-and-item-of-this-transmission information.

Prior to a particular early time, complete local-formula-and-item information is inputted to and caused to be recorded at the computer, 73, of each controlled intermediate transmission station in such a way that each computer, 73, contains complete information relevant to the particular discounts and specials in effect at the particular markets in the vicinity of said station and at the particular time of the network transmission of Q. Thus each computer, 73, contains the specific values of a, p, q, d, Z, r, s, and dd of its specific station; the specific street address of every one of said supermarket chain's markets in the locality of said station; and other specific data of said station such as, for example, "Nabisco Zweiback Teething Toast".

Local-formula-and-item information can be inputted to said computers, 73, in any fashion that said computers, 73, can receive information. However, in the preferred embodiment, information that applies at all network stations at the time of any given transmission of a given program unit—for example, the undelivered per unit cost of pork bellies: a—is transmitted to all stations simultaneously in a SPAM message that causes each station to select and record properly said information. And information that applies only at a selected one of said stations—for example, the street address of every one of said supermarket chain's markets in the locality of a given station—is inputted individually to the computers, 73, of said stations by means of, for example, a local input, 74, or a network, 98.

At the computer, 73, of the station of FIG. 6, the local-formula-and-item information in example #10 is identical to the local-formula-and-item information in example #9. For example, said local-formula-and-item information in example #10 includes:

a is 1000.00
p is 0.00625
q is 0.12
d is 0.1
Z is 275
r is 0.007
s is 2.00
dd is 0.11

(At a particular second intermediate transmission station, the local-formula-and-item information of the computer, 73, include the specific values: a is 1000.00, p is 0.00625, q is 0.13, d is 0.11, Z is 537, r is 0.0082, s is 1.98, and dd is 0.10. Said local-formula-and-item information also includes the specific street address of one of said supermarket chain's markets in the locality of said station, particular cost-of-a-trimmed-pork-belly-unit information of 2021.42 that is the cost of the trimmed meat of one pork belly unit; binary video image information of several telephone numbers, including a particular southeast delivery route telephone number, "623-3000"; information of the particular local-automatic-order-taking telephone number of the supermarket chain applicable in the vicinity of said second intermediate station which is 1-(800) 371-2100; and specific data of "Cheerios Toasted Oat Cereal" instead of "Nabisco Zweiback Teething Toast."

At said early time (which time is, in the preferred embodiment, a time of reduced operational requirement such as, for example, the middle of the night that precedes said network transmission of Q), the computers, 73, of said controlled intermediate transmission stations are caused to receive information of a particular transmission. For example, at 3:00 AM on said night, automatic schedule information and instructions (previously inputted by a computer at said network originating and control station, via network, 98, individually to each of said computers, 73) causes said computers, 73, to cause their associated earth station receivers, 50, amplifiers, 51, and TV receivers, 53, to tune to a particular satellite transmission (while causing the switches, 75, to output information of said transmission to no modulator, 83, 87, or 91). Causing said station apparatus to tune to said transmission causes those particular dedicated decoders of the signal processor systems, 71, of said stations that process continuously the inputted transmission of the distribution amplifiers, 63, to detect SPAM information embedded in the normal transmission location of said transmission and input said SPAM information to the computers, 73, of said stations.

Then the program originating studio at said network originating and control station, embeds in said normal transmission location and transmits a SPAM message that is addressed to ITS computers, 73, and consists of a "01" header, a particular execution segment, appropriate meter-monitor information, padding bits as required, information segment information of the aforementioned intermediate generation set of Q, and an end of file signal. (Hereinafter, said message is called the "generate-set-information message (#10)".) Except for its meter-monitor information, said generate-set-information message (#10) is identical to the aforementioned generate-set-information message (#9).

Transmitting said generate-set-information message (#10) causes said dedicated decoders to detect and input said message to the computers, 73, of said stations.

Receiving said message at said computers, 73, causes each of said computers, 73, to load information of said intermediate generation set at particular RAM. Then receiving the end of file signal that ends said message causes each of said computers, 73, to execute the information so loaded as a machine language job; to compute the specific formula-and-item-of-this-transmission-information of said computer, 73, in the predetermined fashion of said intermediate generation set according to the prerecorded data of the local-formula-and-item information of said computer, 73; to compile said specific formula-and-item-of-this-transmission information into one or more specific machine language program modules; and to link said specific module or modules to other program modules to become complete program instruction set information of this instance of the network transmission of Q; and to record said information at particular memory. (Hereinafter, the program instruction set generated at the station of FIG. 6 in example #10 is called the "program instruction set of Q.1", signifying that said set is one version of complete program instruction set information of said instance of the network transmission of Q.) Executing the information of said intermediate generation set also causes each said computers, 73, to generate and record complete information of a data module set. (Hereinafter, the data module set generated at the station of FIG. 6 in example #10 is called the "data module set of Q.1", signifying that said set is one version of complete data module set information of said instance of the network transmission of Q.) In the preferred embodiment, executing said intermediate generation set at said early time causes said computers, 73, to record said program instruction set of Q and said data module set of Q information at non-volatile, disk memory.

At the station of FIG. 6, for example, executing the information of said intermediate generation set causes the computer, 73, in precisely the fashion that applied in example #9, to compute the value of a particular variable b to be 62.21875; to computes the value of a particular variable c to be 2.117; and to replaces particular variable values, a, b, and c, in a particular so-called "higher language line of program code" to become formula-and-item-of-this-transmission information of:

$$Y=1000.00+62.21875+(2.117*X)$$

to select, compute, and replace other variable information until complete program instruction set information exists in higher language code at particular memory; to compile said higher language information; to link the information so complied with other compiled information; and to record the information so computed, compiled, and linked (which is complete information the program instruction set of Q of the station of FIG. 6) in a file named "PROGRAM.EXE", in a fashion well known in the art, on a computer memory disk of computer, 73. In so doing, said computer, 73, generates the specific program instruction set version—that is, the program instruction set of Q.1—that applies to the particular discounts and specials in effect at the particular markets in the vicinity of said station and at the particular time of the network transmission of Q. In precisely the fashion that applied in example #9, executing the information of said intermediate generation set causes said computer, 73, to select data, from among the local-formula-and-item information of said station, including the aforementioned "Nabisco Zweiback Teething Toast" and the street address of every one of said supermarket chain's markets in the local vicinity of the station of FIG. 6, and to record said selected data on said memory disk in a data file named DATA_OF.ITS. In so doing, said computer, 73, generates said data module set of Q.1.

(At said second intermediate transmission station, executing the information of said intermediate generation set causes the computer, 73, of said station to compute the values of variables b and c as 132.2362 and 2.0882 respectively; to replace variable values, a, b, and c, with formula-and-item-of-this-transmission information of:

$$Y=1000.00+132.2362+(2.0882*X)$$

to process other variable information; and to compile, link, and record information at a particular peripheral memory unit of said computer, 73, in a file named "PROGRAM.EXE" that is the specific program instruction set of said second intermediate station. [Hereinafter, the program instruction set generated at said second station is called the "program instruction set of Q.2", signifying that said set is a second version of complete program instruction set information of said instance of the network transmission of Q.] Executing the information of said intermediate generation set causes said computer, 73, also to select particular data, including said "Cheerios Toasted Oat Cereal" and the street address of every one of said supermarket chain's markets in the locality of said second intermediate station and to record said selected data at said memory unit in a data file named DATA_OF.ITS that corresponds in content to the file of the same name generated a the intermediate station of FIG. 6. [Hereinafter, the data module set generated at said second station is called the "data module set of Q.2", signifying that said set is a second version of complete data module set information of said instance of the network transmission of Q.])

(One difference between example #9 and example #10, which is based on the preprogrammed schedule information of each intermediate transmission station, is that executing the information of the generate-set-information message (#10) causes the generated program instruction set and data module set information to be recorded at non-volatile, disk memory whereas in example #10 the generated information may be recorded merely at RAM.)

Shortly before commencing to transmit the television programming of unit Q, at a time when all controlled intermediate transmission stations are receiving and retransmitting said network transmission (which the station of FIG. 6 and said second station each receives at a receiver, 53, and transmits via a modulator, 83), said program originating studio embeds in the normal transmission location of said transmission and transmits a second SPAM message. Said second message is addressed to ITS computers, 73, and consists of a "01" header, a particular execution segment, appropriate meter-monitor information, padding bits as required, particular information segment instruction information, and an end of file signal. (Hereinafter, said message is called the "load-set-information message (#10)".)

Transmitting said message causes the decoders of the signal processing systems, 71, of said stations that receive programming transmissions from the distribution amplifiers, 63, to detect and input said message to the computers, 73, of said stations.

Receiving said message causes each of said computers, 73, to load said information segment instruction information at particular RAM. Then receiving said end of file signal causes each of said computers, 73, to execute the instruction information of so loaded as an compiled, machine language job.

Executing said instruction information causes said computers, 73, each to load the information of said files, PROGRAM.EXE and DATA_OF.ITS, at particular program-set-to-transmit and data-set-to-transmit RAM memories of computer, 73, and each to cause a generator, 82, to cease embedding any other signal information in the normal transmission location and to transmit information of a SPAM end of file signal. (Said other signal information may include, for example, teletext information, and in so causing said generators, 82, to cease embedding said other information—for example, said teletext—transmitting said message causes pluralities of ultimate receiver stations that are subscriber stations of said intermediate transmission stations to cease receiving said other information—for example, said teletext.)

Then said program originating studio starts to transmit the conventional television programming of unit Q.

Immediately after commencing to transmit said programming of Q, said studio embeds in the normal transmission location of the transmission of said programming and transmits a particular SPAM message is addressed to URS signal processors, 200, and that causes ultimate receiver stations to combine their microcomputers, 205, to the computer system of the transmission of said program originating studio. (Said message and the functioning that said message causes are described more fully below, and hereinafter, said message is called the "align-URS-microcomputers-205 message (#10)".)

After an interval that is sufficient to allow apparatus at each ultimate receiver station so to combine, said studio embeds in said transmission and transmits a particular SPAM message whose execution segment is of the aforementioned pseudo command. Transmitting said message causes particular decoder apparatus at said ultimate receiver stations to detect an end of file signal and to commence identifying and processing the individual SPAM messages of the SPAM information subsequently embedded in the transmission of the programming of Q. (Said message and the functioning that said message causes are described more fully below, and hereinafter, said message is called the "synch-SPAM-reception message (#10)".) Thereafter, embedding and transmitting any given SPAM message in said transmission invokes a controlled function or functions at particular ones of said decoder apparatus.

Then said studio invokes broadcast control of the microcomputers, 205, of said stations. Said studio embeds in said transmission and transmits a particular SPAM message that is addressed to URS decoders, 203. (Said message is described more fully below, and hereinafter, said message is called, the "control-invoking message (#10)".) Said message causes each decoder, 203, to input the aforementioned control invoking instructions (that are preprogrammed at said decoder, 203) to its associated microcomputer, 205. In so doing, transmitting said control-invoking message (#10) causes said microcomputers, 205, to come under control of the computer system of the transmission of said studio.

Then said studio embeds in said transmission and transmits a SPAM message is addressed to ITS computers, 73, and that contains execution and meter-monitor segments. (Said message is called, hereinafter, the "transmit-data-module-set message (#10)".) Receiving said transmit-data-module-set message (#10) causes each of said computers, 73, to cause stripping and embedding to commence; to generate a particular first outbound SPAM message that includes information of the data file, DATA_OF.ITS, at its data-set-to-transmit RAM memory; and to cause said message to be transmitted to its field distribution system, 93. (Hereinafter, the first outbound SPAM message of any given one of said computers, 73, is called a "data-module-set message (#10)" and all of said first messages are the "data-module-set messages (#10)".) At the station of FIG. 6, the computer, 73, automatically causes stripper, 81, station to commence stripping all signals from the normal transmission location; causes generator, 82, to commence embedding information received from said computers, 73; selects the information of the meter-monitor segment of said transmit-data-module-set message (#10); adds particular information that identifies the station of FIG. 6 and the time of transmission; modifies the meter-monitor format field information to reflect said added information; and retains the received, added, and modified meter-monitor information. Then said computer, 73, selects and transmits to generator, 82, complete information of its data-module-set message (#10) in the following fashion. Automatically, said computer, 73, selects and transmits information of a "01" header; information of a particular SPAM execution segment that is addressed to URS microcomputers, 205; said retained meter-monitor information; any required padding bits (the requirement for and number which said computer, 73, determines in a predetermined fashion); complete information of the data file at the data-set-to-transmit RAM memory of said computer, 73, which is said file, DATA_OF.ITS and which is complete information of said data module set of Q.1; and information of a SPAM end of file signal. (Receiving said message at said second intermediate station causes the apparatus of said station, in the same fashion, to generate and transmit the data-module-set message (#10) of said station which includes meter-monitor information that identifies said second station and said data module set of Q.2.)

Receiving the information of the particular data-module-set message (#10) of the computer, 73, of its station causes each generator, 82, to embed said information in the normal transmission location of the programming of Q transmission being transmitted via said generator, 82, to the field distribution system, 93, of said station, thereby transmitting the particular data-module-set message (#10) of said station to said system, 93.

Then said program originating studio embeds in the normal transmission location of said transmission and transmits a SPAM message that is addressed to ITS computers, 73, and that contains execution and meter-monitor segments. (Said message is called, hereinafter, the "transmit-and-execute-program-instruction-set message (#10)".)

Receiving said message causes each of said computers, 73, to generate a second outbound SPAM message that includes information of the program instruction set at its program-set-to-transmit RAM memory and to cause said message to be transmitted to its field distribution system, 93. (Hereinafter, the second outbound SPAM message of any given one of said SPAM computers, 73, is called a "program-instruction-set message (#10)", and all of said second messages are the "program-instruction-set messages (#10).") Automatically, each of said computers, 73, selects the information of said meter-monitor segment, adds particular information that identifies its station and the time of transmission, modifies the meter-monitor format field information to reflect said added information, and retains the received, added, and modified meter-monitor information. Then, automatically, each of said computers, 73, selects and transmits to the generator, 82, of its station, information of a "01" header; information of a particular SPAM execution segment that is addressed to URS microcomputers, 205; its retained meter-monitor information; any required padding bits; complete information of the program instruction set that is at its program-set-to transmit RAM memory; and information of a SPAM end of file signal. Said selected and transmitted information that each of said computers, 73, transmits is complete information of the particular program-instruction-set message (#10) of said computer, 73. (Receiving said message causes the apparatus of the intermediate station of FIG. 6 to transmit the program instruction set of Q.1 in the program-instruction-set message (#10) of said station and causes the apparatus of said second intermediate station to transmit the program instruction set of Q.2 in the program-instruction-set message (#10) of said second station.)

Receiving the information of the particular program-instruction-set message (#10) of the computer, 73, of its station causes a generator, 82, to embed said information in the normal transmission location of the programming of Q transmission being transmitted via said generator, 82, to the field distribution system, 93, of said station, thereby transmitting the particular program-instruction-set message (#10) of said station to said system, 93.

(After transmitting the aforementioned transmit-data-module-set message (#10) and before transmitting a particular commence-outputting message (#10) that is discussed more fully below, said program originating studio embeds and transmits other SPAM messages that are addressed to URS microcomputers, 205. Said other messages correspond in function to the data-module-set messages (#10) and program-instruction-set messages (#10) of the intermediate transmission stations of example #10 but said other messages are transmitted to and control microcomputers, 205, at particular direct-receiving ultimate receiver stations that receive the transmission of said studio directly rather than via a retransmission of one of said intermediate transmission stations. Information of said other messages is received at the aforementioned decoders of the signal processing systems, 71, of said stations that process the transmission of said studio, but said decoders discard said SPAM messages because said decoders are preprogrammed only to transmit or execute controlled functions of SPAM messages that are addressed to intermediate transmission station apparatus. And said other SPAM messages do not reach the ultimate receiver stations to which said intermediate transmission stations transmit said data-module-set messages (#10) and program-instruction-set messages (#10) because said other SPAM messages are stripped from the transmissions of said stations by the strippers, 81, of said stations.)

Then said program originating studio embeds in the normal transmission location of said network transmission and transmits a SPAM message that is addressed to ITS computers, 73, and that contains an execution segment. (Said message is called, hereinafter, the "cease-stripping-and-embedding message (#10)".)

Receiving said message causes each of said computers, 73, to cause the stripper, 81, of its station to cease stripping signal information from the normal transmission location and causes each of said computers, 73, to cause the generator, 82, to cease embedding signal information generated under control of said intermediate generation set in the normal transmission location.

Subsequently, said program originating studio embeds in the normal transmission location of said network transmission and transmits a further series of messages that are addressed to URS microcomputers, 205, and that are described more fully below. (Hereinafter, said messages are called [in the order in which said messages are transmitted at said studio]: the "1st commence-outputting message (#10)", the "2nd commence-outputting message (#10)", the "3rd commence-outputting message (#10)", the "1st cease-outputting message (#10)", the "4th commence-outputting message (#10)", the "5th commence-outputting message (#10)", the "6th commence-outputting message (#10)", and the "2nd cease-outputting message (#10)".)

After transmitting the last conventional programming of Q, said studio embeds and transmits a particular message (that is described more fully below and called, hereinafter, the "disband-URS-microcomputers-205 message (#10)") that causes subscriber stations whose microcomputers, 205, are combined to the computer system of the transmission of said studio to separate said microcomputers, 205, from said transmission.

Then said studio embeds and transmits a particular SPAM message that contains an execution segment and that is addressed to ITS computers, 73. (Hereinafter, said message is called the "local-output-cueing message (#10).")

Receiving said message and said mark information causes intermediate transmission stations to continue transmitting locally originated programming in their scheduled fashions. At the station of FIG. 6, the dedicated decoder of signal processor system, 71, that processes the inputted transmission of distribution amplifier, 63, detects said message and inputs said message, with appropriate source mark information, to computer, 73. Automatically, receiving said message may cause computer, 73, to cause generator, 82, to commence embedding other signal information in the normal transmission location, such as, for example, teletext information. Automatically, generator, 82, embeds a "01" header; execution segment information addressed to appropriate URS receiver apparatus such as URS teletext receiver apparatus; appropriate meter-monitor information; padding bits as required; and information segment information of said other signal information—for example, teletext. (No end of file signal is transmitted until generator, 82, is caused to cease the transmission of said other signal information.) In so doing, transmitting said local-output-cueing message (#10) causes one or more ultimate receiver stations that are subscriber stations of said intermediate transmission station of FIG. 6 to commence receiving said other information—for example, said teletext. Simultaneously, other intermediate stations such as said second station commence embedding their specific other signal information—for example, their own specific teletext information which has different information content from the information of the station of FIG. 6—causing subscriber stations of said other intermediate stations that are tuned to receive said other information to commence receiving said other information.

(Example #10 ends, insofar as intermediate station operations are concerned, with said computers, 73, causing their associated generators, 82, to commence embedding said other signal information; however, the effects of so transmitting the conventional programming of program unit Q and the SPAM messages that are associated with the network transmission of said programming and that are addressed to URS apparatus are discussed more fully below.)

So far this disclosure has described an intermediate transmission station transmitting conventional television programming. The station could process and transmit radio programming in the same fashions by adding radio transmission and audio recorder/player means, each with associated radio decoder means as shown in FIG. 2B, wherever television means are shown in FIG. 6, all with similar control means to that shown in FIG. 6 and by processing radio programming with appropriately embedded signals according to the same processing and transmitting methods described above. Likewise, the station could transmit broadcast print and data communications programming by adding appropriate transmission and recorder/player means and decoder/detector means with control means and using the same processing and transmitting methods. This example has described methods at a multi-channel intermediate transmission station; the methods are also applicable in a station that transmits only a single channel of television, radio, broadcast print or data. In addition, intermediate transmission station can be encrypted and decrypted and monitored in the fashions described above. Intermediate transmission station apparatus can include signal processing regulating system apparatus such as the apparatus of FIG. 4 by means of which encrypted transmissions that are transmitted to intermediate stations are caused to be decrypted and metered. Intermediate transmission station apparatus can include encryptor apparatus that encrypt programming transmissions selectively. And intermediate transmission station apparatus can include signal processing monitoring system apparatus in the spirit of the apparatus of FIG. 5 whereby the availability, use, and usage of programming at selected intermediate station apparatus is recorded and records are transmitted to remote stations that process such records.

Automating Ultimate Receiver Stations

Ultimate receiver stations are stations where programming is displayed (or otherwise outputted) to one or more subscribers, thereby enabling said subscriber or subscribers to view (or otherwise perceive) the information content of the programming. The programming so displayed (or outputted) may be any form of electronically transmitted programming, including television, radio, print, data, and combined medium programming and may be received via any electronic transmission means including wireless and cable means. The programming so displayed (or outputted) may also include computer and/or combined medium programming that is locally generated under control of SPAM message information.

The signal processing apparatus outlined in FIGS. 2, 2A, 2B, 2C, and 2D, and their variants as appropriate, can be used to automate the operations of ultimate receiver stations in varieties of ways.

FIG. 7 exemplifies one embodiment of an ultimate receiver station; is a subscriber station in the field distribution system, 93, of the intermediate transmission station of FIG. 6; and may be a home, an office, a theater, a hotel, or any other station where programming such as television or radio is displayed to persons.

(NOTE: "Automating Ultimate Receiver Stations" focuses on controlling subscriber station apparatus in functions that do not necessarily involve generating or combining programming. Accordingly, whereas SPAM message transmission means have been depicted in FIGS. 1 through 6 by solid lines that depict programming transmission [said lines are often marked "SIGNALS ONLY" meaning SPAM information only], in FIG. 7 et seq. the means for transmitting SPAM messages that have been detected in and separated from programming transmissions are depicted by dashed lines that depict control information transmissions.)

FIG. 7 shows a variety of input apparatus with capacity for inputting programming (including SPAM information) selectively, via matrix switch, 258, to other apparatus of the subscriber station of FIG. 7; intermediate apparatus with capacity for processing and/or recording inputted programming selectively; output apparatus for displaying or otherwise outputting programming selectively to human senses; other controlled apparatus; and other meter apparatus.

Input apparatus include satellite earth station, 250, satellite receiver circuitry, 251, converter boxes, 201 and 222 (by means of which the station of FIG. 6 receives the multiplexed multi-channel cable transmission of the cable head end station of FIG. 6), antennas, 298 and 299, and other input apparatus, 252 (which may be, for example, a laser disc player or a record player); and the subscriber station of FIG. 4 has capacity for receiving wireless programming transmissions (for example, at a satellite earth station, 250, and satellite receiver circuitry, 251), a multi-channel cable transmission (for example, at converter boxes, 201 and 222), and locally transmitted input (for example, at other input apparatus, 252). Said input apparatus input their received information to matrix switch, 258, which is a conventional matrix switch, well known in the art.

Intermediate apparatus include microcomputer, 205, television recorder/player, 217, audio recorder/player, 255, computer memory unit, 256 (which may be, for example, a so-called "fixed disk"), decryptor, 224, decryptor, 231, signal stripper, 229, signal generator, 230, and other intermediate apparatus, 257, which could be, for example, other receiver/amplifier apparatus. In addition, the TV tuner apparatus of TV set, 202—that is, TV tuner, 215—(which is not distinguished from the TV monitor, 202M, apparatus of said set, 202, in FIG. 7), and the tuner/amplifier apparatus of radio, 209—that is, radio tuner & amplifier, 213—(which is not distinguished from radio, 209, in FIG. 7), are also intermediate apparatus. All said intermediate apparatus receive their programming inputs from and transmit their programming outputs to matrix switch, 258.

Output apparatus that display or otherwise output programming selectively to human senses include, for example, TV monitor apparatus of TV set, 202, printer, 221, speaker system, 263, and one or more other output systems, 261 (which could be, for example, electronically actuated apparatus that emit odors). All said output apparatus receive their programming inputs from matrix switch, 258. (The monitor apparatus of TV set, 202, and the amplifier and speaker apparatus of radio, 209, have capacity for receiving a programming input that is separate from the inputs to the intermediate apparatus of said TV set, 202, and radio, 209, respectively.)

Other controlled apparatus include electronically actuated window opening and closing means, 208, furnace, 206, air conditioning system, 207, and other controlled apparatus, 260, which could be, for example, an electronically actuated automatic lawn watering system, all of which are well known in the art. Said other apparatus do not output programming and receive no input of programming.

Other meter apparatus include an electronically actuated utilities meter, 262, of which many models exist in the prior art for metering flows of electricity, gas, water, etc. Said meter, 262, does not output programming and receive no input of programming.

One or more appropriate SPAM decoders exist at each apparatus that receives and is controlled by SPAM message information. Appropriate SPAM decoders exist at microcomputer, 205, (which can be controlled in the fashions described above) at recorder/players, 217 and 255, (which recorder/players can be caused to operate in fashions similar to the recorder/players of the intermediate transmission station of FIG. 6) at radio, 209, and TV set, 202, (which radio and TV set can be actuated, tuned, and controlled in other functions) and at computer memory unit, 256, other intermediate apparatus, 257, printer, 221, speaker system, 263, and other output means, 261, (which unit, apparatus, printer, system, and means can be actuated individually and controlled in other functions. (For simplicity, FIG. 7 does not distinguish said decoders at or separately from their associated apparatus.)

Two matrix switches, 258 and 259, communicate the programming and SPAM message/control information transmissions among station apparatus. Matrix switch, 258, is a conventional matrix switch, well known in the art, with capacity for switching programming transmissions of television, radio, and other forms of electronically transmitted programming. Matrix switch, 259, is a digital matrix switch, well known in the art, with capacity for switching binary information transmissions. By means of matrix switch, 259, all apparatus communicate control information and the information of SPAM messages that have been detected in programming transmissions.

The station of FIG. 7 is preprogrammed to collect monitor information, and said decoders have bus means of the sort illustrated in FIG. 5 for communicating monitor information to an onboard controller, 14A, at signal processor, 200. (For simplicity, FIG. 7 does not show said monitor information bus means.)

For communicating particular switching request control information to the controller, 20, of signal processor, 200, said decoders also have separate control information bus means (which, for simplicity, is also not shown in FIG. 7). A particular control processor, 20A, that is located, with appropriate RAM and ROM, at controller, 20; that is separate from the CPU of controller, 20; and that is controlled by said CPU in particular functions controls the communications of said control information bus means. Said communications are conducted in a contention fashion, well known in the art.

Signal processor, 200, is the basic SPAM control apparatus of the station of FIG. 7 and has means for communicating control information (from its controller, 20) and SPAM messages (from its controller, 12) with each of said decoders and their associated apparatus. Signal processor, 200, communicates control information directly with decryptors, 224 and 231, signal stripper, 229, signal generator, 230, microcomputer, 205, and matrix switch, 259. Via matrix switch, 259, signal processor, 200, has means for communicating control information individually to all other controlled apparatus including satellite earth station, 250; satellite receiver circuitry, 251; converter boxes, 201 and 222; other input apparatus, 252; radio tuner & amplifier, 213; TV tuner, 215; television recorder/player, 217; audio recorder/player, 255; computer memory unit, 256; other intermediate apparatus, 257; the TV monitor apparatus, 202M, of TV set, 202; the speaker apparatus of radio, 209; printer, 221; speaker system, 263; and other output system, 261. In addition, the aforementioned SPAM decoders at those of said other controlled apparatus where there are SPAM decoders have capacity for communicating with each of said other controlled apparatus by means of said matrix switch, 259, in a fashion described more fully below. Signal processor, 200, controls matrix switches, 258 and 259, and has means for communicating switch control instructions to said switches, 258 and 259. (FIG. 7 also shows capacity whereby microcomputer, 205, can communicate switch control instructions to said switches, 258 and 259; said capacity is intended to suggest that microcomputer, 205, may control said switches, 258 and 259, at stations that lack a signal processor, 200—for example, stations that are not configured and preprogrammed to generate and/or display/output combined medium programming.)

Microcomputer, 205, controls apparatus of the station of FIG. 7 in accordance with the preprogrammed instructions of the subscriber of said station. Microcomputer, 205, has means for controlling window opening and closing means, 208, furnace, 206, air conditioning system, 207, and other controlled apparatus, 260. Microcomputer, 205, has capacity to communicate control information (under control of signal processor, 200) with other selected apparatus of the station of FIG. 7 by means of matrix switch, 259.

In the spirit of the present invention, signal processor, 200, enables local apparatus of the station of FIG. 6 to process and/or display/output received programming and SPAM information in accordance with the intentions of the owners and suppliers of said programming and information (who may, for example, wish to be paid for use of their programming). Simultaneously, the apparatus of said station are configured and microcomputer, 205, is preprogrammed to process and/or display/output said supplied programming and information in accordance with the demands of said subscriber. Local input, 225, has capacity to input control instructions to signal processor, 200, and enables the subscriber of the station of FIG. 7 to manually input control instructions at any relevant time. Microcomputer, 205, also has capacity to input control information (under control of signal processor, 200) to signal processor, 200, which enables microcomputer, 205, at any relevant time, to automatically input control information that reflects particular instructions of said subscriber that are preprogrammed at microcomputer, 205.

(This is only a representative group of equipment; many other types of input, intermediate, output, controlled, and meter apparatus could be included in FIG. 7.)

Features, benefits, and modes of operation of the station of FIG. 7 are demonstrated in the following individual examples.

More Regarding the Preferred Controller of a SPAM Decoder

The controller, 39, 44, or 47, of any given SPAM decoder (such as, for example, the decoder, 203, associated with microcomputer, 205) has capacity for communicating information from the matrix switch, 39I, of said decoder to matrix switch, 259, and for receiving information from matrix switch, 259, at the decryptor, 39K, buffer, 39G, and control processor, 39J. Said control processor, 39J, also has capacity to communicate particular switch request information to the controller, 20, of signal processor, 200, directly via the aforementioned control information bus means. In addition, said control processor, 39J, has particular SPAM-control-information-matrix-switch-connection register memory at which said control processor, 39J, retains information that identifies the particular station apparatus to which matrix switch, 259, connects said matrix switch, 39I.

Automating U.R. Stations . . . Regulating Station Environment

Figure 7A:
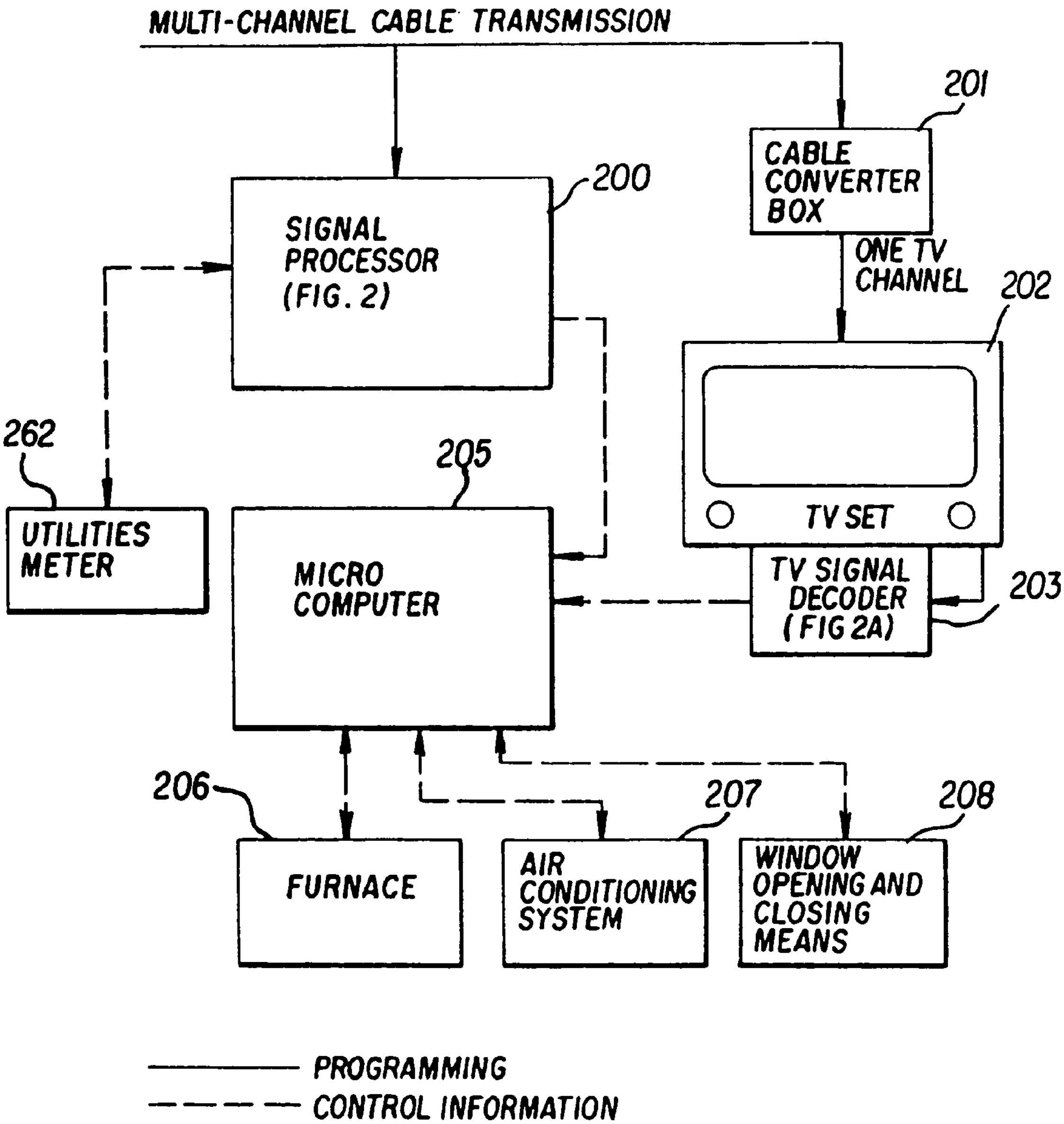
FIG. 7A is a block diagram of signal processing apparatus and methods with external equipment regulating the environment of the local receiver site.

FIG. 7A illustrates methods for regulating automatically the environment of subscriber stations such as homes and offices. Particular SPAM regulating messages are embedded in one or more television program channels that are inputted to signal processor, 200, and cable converter box, 201. Said messages include weather bulletin messages that convey local weather information and instructions, including, for example, current outside temperature information, barometric readings, and forecast data. Said messages also include meter reading messages that cause meter records of subscriber station utilities meters to be transmitted to remote metering stations.

Each subscriber station microcomputer, 205, is preprogrammed with particular weather condition instructions that control selected subscriber station apparatus under alternate weather conditions such as, for example, forecast rain instructions, forecast no rain instructions, forecast warming instructions, and forecast cooling instructions. And each subscriber station signal processor, 200, is preprogrammed at its controller, 20, with particular meter reading instructions.

Each subscriber station signal processor, 200, operates continuously; scans all incoming channels sequentially at its switch, 1, and mixer, 3, as described in example #5 above; is preprogrammed at its controller, 20, to cause its apparatus to tune to a particular master channel at a particular master-control time; and is preprogrammed at the controller, 39, of its decoder, 30, and at its controller, 12, to transfer to the decoder, 203, of the microcomputer, 205, of its station any detected SPAM message with an instance of particular URS-205 execution segment information (which information is different from the execution segment information of the combining synch commands of the "Wall Street Week" example). Said controller, 39, is also preprogrammed to transfer to said controller, 20, via control transmission means, any detected SPAM message with an instance of particular URS-200 execution segment information (which information is different from the execution segment information of any encrypted combining synch commands of the "Wall Street Week" example).

The master-control time preprogrammed at the controller, 20, of the station of FIGS. 7 and 7A is daily at 2:32 AM, 10:32 AM, and 6:32 PM.

At 6:32 PM on Feb. 27, 1988, receiving particular time information from the clock, 18, of said signal processor, 200, causes said controller, 20, to cause the switch, 1, and mixer, 3, of said signal processor, 200, to input the transmission of said master channel to the decoder, 30, of said signal processor, 200, and to cause said decoder, 30, to clear all information of any SPAM message from memory and commence processing to detect a SPAM end of file signal.

In due course, the computer, 73, of the station of FIG. 6 causes an end of file signal to be embedded in the normal transmission location of said master channel, causing the control processor, 39J, of said decoder, 30, to commence waiting to detect a SPAM header.

Then said computer, 73, causes the embedding in said location and the transmission of a particular Weather-Bulletin-125 SPAM message that consists of a "01" header, an execution segment of said URS-205 execution segment information, a meter-monitor segment that contains Weather-Bulletin-125 identification information that distinguishes said Weather-Bulletin-125 from all other weather bulletins, appropriate padding bits, an information segment that contains particular current temperature thirty-two degrees centigrade, forecast rain, and forecast cooling to twenty-one degrees centigrade information, and an end of file signal.

Said message is detected at said decoder, 30, and inputted to said controller, 39, in the above described fashion.

Receiving said message causes said controller, 39, to execute particular preprogrammed controlled function instructions that cause said controller, 39, to locate said Weather-Bulletin-125 identification information and determine that said information does not match particular information at particular last-weather-bulletin-identification RAM at said controller, 39; to input said message to the buffer/comparator, 8, of said signal processor, 200; to retain information of said Weather-Bulletin-125 identification information at said last-weather-bulletin-identification RAM; and to input particular step-completed information to said controller, 20.

(Receiving said step-completed information causes controller, 20, to cause said switch, 1, mixer, 3, and decoder, 30, to commence functioning to identify program unit identification signal information in the fashion described in example #5.)

Receiving said Weather-Bulletin-125 message causes buffer/comparator, 8, to input said message to controller, 12.

Receiving said message causes said controller, 12, to execute particular preprogrammed controlled function instructions that cause said controller, 12, to transfer said message to decoder, 203. Automatically, controller, 12, determines that said message is addressed to URS microcomputers, 205; compares particular preprogrammed to-203 information to the information at its particular SPAM-control-information-matrix-switch-connection-@12 register memory (which memory serves the same function as the aforementioned SPAM-control-information-matrix-switch-connection register memory at each SPAM decoder of the station of FIG. 7). A match results which signifies that the switches of matrix switch, 259, are configured in such a way that the input to switch, 259, that receives the output of controller, 12, is switched to transfer information to the output of switch, 259, that inputs to the buffer, 39G, of decoder, 203. Resulting in a match causes controller, 12, to transfer said Weather-Bulletin-125 SPAM message to matrix switch, 259, which causes matrix switch, 259, to input said message to said buffer, 39G, and causes said buffer, 39G, to input said message, in a fashion well known in the art, to control processor, 39J.

Receiving said Weather-Bulletin-125 SPAM message causes decoder, 203, to execute the information of the information segment of said message as a machine language job. Automatically, control processor, 39J, executes particular preprogrammed Weather-Bulletin controlled function instructions that cause said control processor, 39J, to locate the Weather-Bulletin-125 identification information of said message; to determine that said information does not match particular information at particular last-weather-bulletin-identification RAM associated with said control processor, 39J; to input the information of the information segment of said message to the CPU of microcomputer, 205; to retain information of said Weather-Bulletin-125 identification information at said last-weather-bulletin-identification RAM; and to cause said CPU to execute the information so inputted as a machine language job.

So executing said information causes microcomputer, 205, to reducing the power usage of said air conditioning system, 207, causes any open windows at said station to be closed. Automatically, microcomputer, 205, interrogates air conditioning system, 207, in a predetermined fashion well known in the art; determines that the thermostat setting at said system, 207, is a particular maintain-22-degrees-centigrade setting and that the thermostat is programmed to cause said system, 207, to cease operating when the thermometer of said thermostat reads twenty-one degrees centigrade; computes particular a particular cease-operating-at-22-degrees-centigrade temperature that reflects the forecast drop in temperature; transmits said instructions of said temperature to said system, 207, thereby reducing the power usage of said system, 207, by causing said thermostat, thenceforth, to cause said system, 207, to cease operating when the thermometer of said thermostat reads twenty-two degrees centigrade; so-called "chains to", in a fashion well known in the art, the aforementioned forecast rain instructions; and executes said instructions. Executing said forecast rain instructions causes microcomputer, 205, to cause window opening and closing means, 208, to close any open windows (and could cause the aforementioned other controlled apparatus, 260, which could be an automatic lawn watering system to cease watering).

Simultaneously, by transmitting said Weather-Bulletin-125 SPAM message to other subscriber stations of its field distribution system, 93, the station of FIG. 6 causes other subscriber stations to function in the fashion of the station of FIG. 7.

In this fashion, SPAM messages can control and regulate the operation of individual subscriber station controlled apparatus (the thermostat control of furnace, 206, for example, could be similarly controlled) and control and regulate controlled apparatus at pluralities of stations.

(TV signal decoder, 203, has capacity, itself, to detect said Weather-Bulletin-125 SPAM message but only when TV set, 202, is on and operating and when the frequency of said master channel is the one TV channel transferred by box, 201, to TV set, 202. Accordingly, decoder, 203, may receive said message more than once. For this reason, decoder, 203, is preprogrammed to load and execute the information segment only once. Receiving said message a second time causes the control processor, 39J, of decoder, 203, to execute the aforementioned Weather-Bulletin controlled function instructions, and said instructions cause said control processor, 39J, to locate the aforementioned Weather-Bulletin-125 identification information in said message and determine that said information matches the aforementioned information of said Weather-Bulletin-125 identification information retained at particular last-weather-bulletin-identification RAM associated with said control processor, 39J. So matching causes said control processor, 39J, under control of said controlled function instructions to discard the information of said message by transferring the information segment to the null output of the matrix switch, 39I, of said decoder, 203, and deleting all information of said message at the SPAM-input-signal memory of said control processor, 39J.)

(No other SPAM decoder at the station of FIG. 7 is preprogrammed with SPAM-controlled-function-invoking information that matches said URS-205 execution segment information. SPAM decoders of said station such as, for example, the decoder, 218, of video recorder/player, 218, may detect said Weather-Bulletin-125 SPAM message, but doing so will cause said decoders to discard said message because the execution segment information of said message with fail to match any SPAM-controlled-function-invoking information.)

A second example illustrates the capacity of signal processor, 200, for interrogating receiver station utilities meters (as shown in FIG. 7A), recording so-called "readings," and transmitting said readings to remote stations.

The next day, Feb. 28, 1988 at 2:32 AM, receiving particular time information from said clock, 18, causes said controller, 20, again to cause said switch, 1, and said mixer, 3, to input the transmission of said master channel to said decoder, 30, and to cause said decoder, 30, to commence processing to detect a SPAM end of file signal.

In due course, the computer, 73, of the station of FIG. 6 causes an end of file signal to be transmitted, causing the control processor, 39J, of said decoder, 30, to commence waiting to detect a SPAM header.

Then said computer, 73, causes the embedding and transmission of a particular Read-Meters-of-Selected-Stations SPAM message that consists of a "01" header, an execution segment of said URS-200 execution segment information, a meter-monitor segment that contains Meter-Reading-of-2/28/88 identification information that distinguishes said Read-Meters-of-Selected-Stations SPAM message from all other meter reading messages, appropriate padding bits, an information segment that contains particular determine-if-station-I.D.-is-in-particular-range instructions and particular if-so-read-meter-262 instructions, and an end of file signal.

Said message is detected at said decoder, 30, and inputted to the controller, 39, of said decoder, 30.

Receiving said message causes said controller, 39, to transmit said Read-Meters-of-Selected-Stations SPAM message to the controller, 20, of the signal processor, 200, of said station. Automatically, controller, 39, executes particular preprogrammed controlled function instructions that cause said controller, 39, to locate said Meter-Reading-of-2/28/88 identification information and to transmit a particular read-meter instruction and information of said Meter-Reading-of-2/28/88 identification information to said controller, 20. Receiving said instruction and information causes controller, 20, to determine that said Meter-Reading-of-2/28/88 information does not match particular information at particular last-meter-reading-identification RAM at said controller, 20, and to transmit a particular transmit-to-20 instruction to said controller, 39. Receiving said instruction causes said controller, 39, to transmit said message to said controller, 20, via control information transmission means and to commence waiting for the header of a subsequent SPAM message.

Receiving said Read-Meters-of-Selected-Stations message causes said controller, 20, to execute the information of the information segment of said message as a job. Automatically, said controller, 20, executes particular preprogrammed load-and-execute controlled function instructions that cause said controller, 20, to input the information of the information segment of said message to the CPU of controller, 20, to retain information of said Meter-Reading-of-2/28/88 identification information at said last-meter-reading-identification RAM, and to cause said CPU to execute the information so inputted as a machine language job.

So executing said information causes controller, 20, under control of said determine-if-station-I.D.-is-in-particular-range instructions, to locate at ROM, 21, the unique digital code information that identifies the station of FIG. 7 uniquely and to determine that the numeric value of said information is greater than a particular lower range limit of said instructions and less than a particular upper range limit. So determining causes controller, 20, to execute said if-so-read-meter-262 instructions.

(At any station where a controller, 20, determines that the numeric value of the unique digital code information that identifies said station is less than said lower limit or greater than said upper limit, so determining causes said controller, 20, to discard all information of said message, except information at the last-meter-reading-identification RAM of said station, and to commence processing in the conventional fashion.)

Executing said instructions causes controller, 20, first, to determine whether a communications link exists between controller, 20, and utilities meter, 262. Automatically, controller, 20, compares particular preprogrammed to-262 information to the information at its particular SPAM-control-information-matrix-switch-connection-@20 register memory (which memory serves the said function at controller, 20, that a SPAM-control-information-matrix-switch-connection register memory serves at each SPAM decoder of the station of FIG. 7). No match results which signifies that the switches of matrix switch, 259, are configured to transfer the input from controller, 20, to switch, 259, to apparatus different from utilities meter, 262. Not resulting in a match causes controller, 20, to input a particular preprogrammed switch-to-262 instruction to the aforementioned control processor, 20A.

Receiving said instruction causes control processor, 20A, to establish a transmission link between controller, 20, and meter, 262. Automatically, control processor, 20A, executes particular instructions, preprogrammed at the aforementioned appropriate RAM and ROM located with said processor, 20A, and under control of said instructions, causes matrix switch, 259, to configure its switches in such a way that the input to switch, 259, from controller, 20, is switched to transfer information to the output of switch, 259, that inputs to meter, 262—thereby establishing said link between controller, 20, and meter, 262—and to transfer a particular to-262 instruction to said controller, 20.

Receiving said to-262 instruction causes controller, 20, in a predetermined fashion, to place particular to-262 information at said particular SPAM-control-information-matrix-switch-connection-@20 register memory then to execute particular ones of said if-so-read-meter-262 instructions.

Executing said ones causes controller, 20, to transmit the current reading information of utilities meter, 262, to a remote metering station computer and cause said computer to process said information. Automatically, controller, 20, transmits particular instructions, via said transmission link, to meter, 262, thereby causing meter, 262, to transmit its particular THIS-READING information (which is the current reading information of said meter), via said transmission link, to controller, 20; activates telephone connection, 22; inputs a particular telephone number (which number is preprogrammed among said ones) to auto dialer, 24, causing said dialer, 24, to dial said number; establishes a telephone communication link with a particular remote metering station computer in the fashion described above; and transmits said THIS-READING information and information of the aforementioned unique digital code that identifies the station of FIG. 7 uniquely to said computer, in a fashion well known in the art, causing said computer to process said information as particular meter reading information of said station and to respond by transmitting to said controller, 20, via said link, particular reading-received information.

Receiving said reading-received information causes controller, 20, to deactivate telephone connection, 22, to discard all information of said Read-Meters-of-Selected-Stations SPAM message, except information at the last-meter-reading-identification RAM of said station, and to commence processing in the conventional fashion.

(In an alternate meter reading fashion, said if-so-read-meter-262 instructions are permanently preprogrammed at ROM, 21, and receiving particular day-of-month and time information from clock, 18, causes said controller, 20, at a particular time each month, to execute said instructions, causing the transmission of meter reading information of said meter, 262, said remote metering station, in the above fashion, and the processing of said information at said station. Each station of the field distribution system, 93, of an intermediate station such as FIG. 6 is preprogrammed to function in this fashion at a different time over the course of a month, and all stations transmit meter reading information during said month.)

(No SPAM decoder at the station of FIG. 7 other than said decoder, 30, is preprogrammed with SPAM-controlled-function-invoking information that matches said URS-200 execution segment information. Thus, while a SPAM decoder such as, for example, decoder, 203 or 218, may detect said Read-Meters-of-Selected-Stations SPAM message, doing so will cause said decoder to discard said message.)

Automating U. R. Stations . . . Coordinating a Stereo Simulcast

Figure 7B:
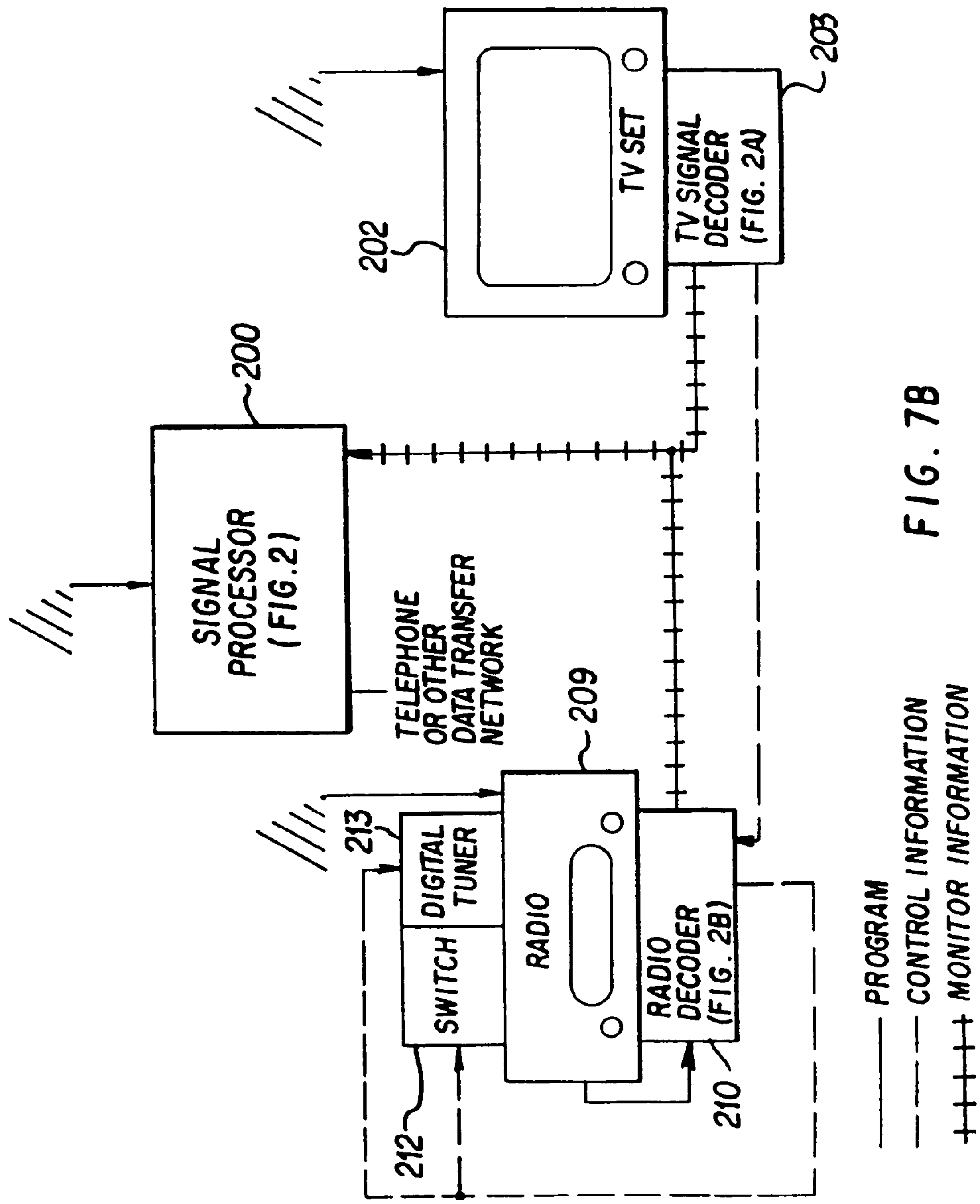
FIG. 7B is a block diagram of signal processing apparatus and methods used to control a combined medium, multi-channel presentation and to monitor such viewership.

FIG. 7B illustrates automatic control of one kind of combined medium presentation—a stereo simulcast.

(In the present invention, turning on or changing a channel at a receiver, 215, of a television set, 202, causes apparatus at said receiver automatically to transmit an interrupt signal of new-channel-input information and input said interrupt signal directly to the control processor, 39J, of the controller, 39, of the decoder, 203, associated with said receiver, 215, [which signal said apparatus has means to input directly].)

At the station of FIGS. 7 and 7B, a subscriber decides to watch a particular television program the audio of which is stereo simulcast on a local radio station, in a fashion well known in the art. Said subscriber switches power on to TV set, 202, and manually selects the proper channel, which is, for example, channel 13, at the television tuner, 215, of said set, 202, thereby display of the video and audio information of the transmission of said channel.

Switching power on to said set, 202, and tuning said tuner, 215, in this fashion causes said tuner, 215, to input an interrupt signal of new-channel-input information to the control processor, 39J, of the controller, 39, of TV signal decoder, 203, and to commence inputting the demodulated transmission of said channel to said decoder, 203.

Receiving said interrupt signal causes said control processor, 39J, to cause all apparatus of decoder, 203, to cease receiving television transmission information and to delete all previously received SPAM information (and, in so doing, to set the information at the EOFS WORD Counter of the EOFS valve, 39F, of said controller, 39 to "00000000", thereby discarding any previously received end of file signal information); to cause the matrix switch, 39I, to commence transferring information from EOFS valve, 39F, to its null output; to cause EOFS valve, 39F, to commence processing detected SPAM information for an end of file signal; and to cause all apparatus of decoder, 203, to commence receiving television transmission information.

Then so inputting said demodulated transmission to said decoder, 203, causes said decoder, 203, to commence detecting and processing SPAM message information embedded in said transmission.

In due course, the program originating studio that originates the transmission of said channel embeds an end of file signal in said transmission, causing the EOFS valve, 39F, of said controller, 39, to detect said signal and transfer an interrupt signal of EOFS-signal-detected information to the control processor, 39J, of said controller, 39.

Receiving said interrupt signal at said control processor, 39J, causes said control processor, 39J, to process the next received SPAM information as information of the header of a SPAM message, thereby causing said controller, 39, to commence identifying and processing the individual SPAM messages of said detected SPAM information.

Periodically thereafter, said program originating studio embeds in said transmission and transmits a particular Tune-Radio-to-FM-104.1 SPAM message that consists of a "01" header, an execution segment of particular activate-simulcast information that is addressed to URS radio decoders, 210, a meter-monitor segment that contains the "program unit identification code" information of said particular television program, appropriate padding bits, an information segment that contains particular 104.1-MHz information, and an end of file signal.

Said message is detected at said decoder, 203, and inputted to said controller, 39, in the above described fashion.

Receiving said message causes said controller, 39, to execute particular preprogrammed controlled function instructions that cause said controller, 39, to transfer said message to the radio decoder, 210, of radio, 209. First, said controller, 39, determines whether a transmission link exists between said controller, 39, and said controller, 44. Automatically, said controller, 39, compares particular preprogrammed to-210 information to the information at its particular SPAM-control-information-matrix-switch-connection register memory. No match results which signifies that the switches of matrix switch, 259, are configured to transfer the input to switch, 259, from said controller, 39, to apparatus other than radio decoder, 210. Not resulting in a match causes said controller, 39, to input a particular preprogrammed switch-203-to-210 instruction to the aforementioned control processor, 20A, via the aforementioned control information bus means for communicating particular switching request control information.

Receiving said instruction causes control processor, 20A, to establish a transmission link between the controller, 39, of decoder, 203, and the controller, 44, of decoder, 210. Automatically, under control of particular preprogrammed instructions, control processor, 20A, causes matrix switch, 259, to configure its switches in such a way that the input to switch, 259, from the controller, 39, of decoder, 203, is switched to transfer information to the output of switch, 259, that inputs to the buffer, 44G, of the controller, 44, of said decoder, 210, (said controller, 44, being identical to the controller, 39, of FIG. 3A, but the alphanumeric designation of the components of said controller, 44, being designated with a "44" rather than a "39" number)—thereby establishing said transmission link—and to transfer a particular to-210 instruction to said controller, 39.

Receiving said to-210 instruction causes said controller, 39, in a predetermined fashion, to place particular to-210 information at said SPAM-control-information-matrixswitch-connection register memory then to execute particular ones of said controlled function instructions.

Executing said ones causes said controller, 39, to transfer said message to the radio decoder, 210, of radio, 209. Automatically, the control processor, 39J, of said decoder, 203, causes the matrix switch, 39I, to commence transferring information to matrix switch, 259, and causes the apparatus of controller, 39, in the fashion for transferring a "01" header message described above, to transfer said Tune-Radio-to-FM-104.1 SPAM message, via said communications link, to the controller, 44, of said decoder, 210.

Receiving said SPAM message causes said controller, 44, switch power on to and tune radio, 209, to the frequency, 104.1 MHz. (Controller, 44, has means for transmitting control information from its matrix switch, 44I, to a particular switch, 212, and a particular digital tuner, 213, that are digitally actuated apparatus, well known in the art, that have capacity, respectively, for switching power on to radio, 209, and for tuning radio, 209.) Automatically, the control processor, 44J, of said controller, 44, executes particular preprogrammed activate-simulcast controlled function instructions, loads said 104.1-MHz information of the information segment of said message at particular tune-to working register memory, and determines that the information at said working memory does not match information at particular SPAM-is-tuned-to register memory (which signifies that radio, 209, is not tuned to the radio frequency, 104.1 MHz). Not resulting in a match causes said controller, 44, to determine, in a predetermined fashion, that radio, 209, is not on and operating. So determining causes said controller, 44, under control of said instructions, to transmit particular preprogrammed instructions, via said matrix switch, 44I, to switch, 212, thereby causing said switch, 212, to switch on and actuate radio, 209; to transmit particular preprogrammed instructions, via said matrix switch, 44I, to tuner, 213, thereby causing said tuner, 213, to tune radio, 209, to said frequency, 104.1 MHz; and to place information of said 104.1-MHz information at said SPAM-is-tuned-to register memory. Automatically, the speaker apparatus of said radio, 209, commences receiving information of the radio transmission of said frequency and emitting the audio sound of said simulcast.

Thus switching power on to TV set, 202, and selecting channel 13 at television tuner, 215, are the only manual steps necessary to actuate the radio simulcast of said channel at radio, 209.

In addition, because the station of FIG. 7 (and FIG. 7B) is preprogrammed to collect monitor information, receiving said Tune-Radio-to-FM-104.1 SPAM message also causes the transmission of monitor information to the onboard controller, 14A, of said signal processor, 200, in the fashion of example #3 above. At decoder, 203, completing the controlled functions invoked by receiving said message causes the transfer, via the aforementioned bus means for communicating monitor information, to said onboard controller, 14A, of a first information transmission of the execution and meter-monitor information of said message with particular first source mark information that identifies TV set, 202. At decoder, 210, completing the controlled functions invoked by receiving said message causes the transfer, via said bus means, to said onboard controller, 14A, of a second information transmission of the execution and meter-monitor information of said message with appropriate source mark information identifying radio, 209.

In the fashion of example #3 above, receiving said first transmission of monitor information causes said onboard controller, 14A, to cause a signal record of prior programming of TV set, 202, to be recorded at the recorder, 16, of signal processor, 200, (and may cause records to be transferred to a remote location) and causes said onboard controller, 14A, to initiate a first signal record, associated with source mark information that identifies TV set, 202, that is based on the "program unit identification code" information of said particular television program in the meter-monitor information of said Tune-Radio-to-FM-104.1 SPAM message.

In the same fashion, receiving said second transmission of monitor information causes said onboard controller, 14A, to cause a signal record of prior programming of radio, 209, to be recorded at the recorder, 16, of signal processor, 200, (and may cause records to be transferred to a remote location) and causes said onboard controller, 14A, to initiate a second signal record, associated with source mark information that identifies radio, 209, that is based on said "program unit identification code" of said Tune-Radio-to-FM-104.1 SPAM message. However, to minimize unnecessary duplication, in a predetermined fashion, onboard controller, 14A, determines that TV set, 202/decoder, 203, is the principal source of information associated with said "program unit identification code"; retains information of said "program unit identification code" in said second signal record together with information that identifies said second record as a secondary record of said first signal record; and retains information at said first signal record that identifies radio, 209/decoder, 210, as a secondary source of monitor information associated with said "program unit identification code." In so doing, onboard controller, 14A, consolidates signal record information of two different monitor information transmissions that contain different source mark information but common "program unit identification code" information.

(If receiving said Tune-Radio-to-FM-104.1 SPAM message causes decryption at decoder, 203, as receiving the first message of example #4 caused decryption, receiving said Tune-Radio-to-FM-104.1 SPAM decoder, 203, causes, in the fashion of example #4, the decrypting of said message at decoder, 203, and thereafter, the processing of the unencrypted information of said message. Said processing includes processing at signal processor, 200, as in example #4, of meter and monitor information transferred from decoder, 203. Said processing includes the transmitting of unencrypted information of said message from decoder, 203, to decoder, 210; the execution of the controlled functions invoked at decoder, 210, by receiving said message; the transmission of monitor information of said message, in the fashion of example #3, from decoder, 210, to signal processor, 200. and the processing of said monitor information at signal processor, 200, in the fashion of example #3.)

(In the present invention, switching power on to a radio, 209, or changing a frequency at a radio, 209, causes apparatus at said radio, 209, automatically to transmit an interrupt signal of new-frequency-input information and input said interrupt signal directly to the control processor, 44J, of the controller, 44, of the decoder, 210, associated with said radio, 209 [which signal said apparatus has means to input directly].)

Switching power on to said radio, 209, and tuning radio, 209, to said frequency, 104.1 MHz, causes decoder, 210, to commence processing SPAM message information in the transmission of said frequency. In the fashion of TV set, 202, and decoder, 203, above, switching on and tuning radio, 209, causes said radio, 209, to input an interrupt signal of new-frequency-input information to the control processor, 44J, of the controller, 44, of radio decoder, 210, and to commence inputting the received transmission of said frequency to said decoder, 210, (which decoder, 210, does not include the radio receiver circuitry, 41, of FIG. 2B because the transmission input decode, 210, is the transmission already received by the receiver circuitry of radio, 209, and which input is input directly to the radio decoder, 42, apparatus of said decoder, 210).

In the same fashion, receiving said interrupt signal of new-frequency-input information causes said controller, 44, to delete all previously received SPAM information, to commence processing detected SPAM information for an end of file signal, and to discard all detected SPAM information until and end of file signal is detected.

In due course, the program originating studio that originates the transmission of said frequency embeds an end of file signal in said transmission, causing said controller, 44, to detect said signal and commence identifying and processing the individual SPAM messages of said detected SPAM information.

Periodically thereafter, said program originating studio embeds in said transmission and transmits a particular Activate-Stereo-Output SPAM message that consists of a "01" header, an execution segment of particular activate-speakers information that is addressed to URS signal processors, 200, a meter-monitor segment that contains secondary "program unit identification code" information of the audio program unit of said radio transmission and primary "program unit identification code" information of said particular television program, and appropriate padding bits, an information segment that contains information of television channel 13 and radio frequency 104.1 MHz, and an end of file signal.

Said message is detected at said decoder, 210, and inputted to said controller, 44.

Receiving said message causes said controller, 44, to execute particular preprogrammed controlled function instructions that cause said controller, 44, to transfer said message to the controller, 20, of signal processor, 200. Automatically, said controller, 44, compares particular preprogrammed to-20 information to the information at its particular SPAM-control-information-matrix-switch-connection register memory. No match results which signifies that the switches of matrix switch, 259, are configured to transfer the input to switch, 259, from said controller, 44, to apparatus different from said controller, 20. Not resulting in a match causes said controller, 44, to input a particular preprogrammed switch-210-to-20 instruction to the aforementioned control processor, 20A, via the aforementioned control information bus means for communicating switching request information.

Receiving said instruction causes control processor, 20A, to establish a control information transmission link between said controller, 44, and said controller, 20. Automatically, under control of particular preprogrammed instructions, control processor, 20A, causes matrix switch, 259, to configure its switches to transfer the input from said controller, 44, to the output of switch, 259, that inputs to said controller, 20—thereby establishing said transmission link—and transfers a particular to-20 instruction to said controller, 44.

Receiving said to-20 instruction causes said controller, 44, to transfer said Activate-Stereo-Output message to said controller, 20. Automatically, in a predetermined fashion, controller, 44, places particular to-20 information at said SPAM-control-information-matrix-switch-connection register memory then executes particular ones of said controlled function instructions. Automatically, under control of said ones, said controller, 44, causes its matrix switch, 44I, to commence transferring information to matrix switch, 259, and causes, in the fashion for transferring a "01" header message described above, transfers said Activate-Stereo-Output SPAM message, via said link, to said controller, 20.

Receiving said SPAM message causes said controller, 20, to determine that certain preconditions are satisfied—more precisely, that TV set, 202, and radio, 209, are tuned, respectively, to the proper television channel and the radio frequency of the stereo simulcast. Automatically, controller, 20, executes particular preprogrammed conditional-speaker-activation controlled function instructions; loads the information of television channel 13 and radio frequency 104.1 MHz of the information segment of said message at particular first and second register memory respectively; causes control processor, 20A, to cause matrix switch, 259, to establish a communications link between controller, 20, and the control processor, 39J, of decoder, 203; determines, in a predetermined fashion, that information of the channel to which TV set, 202, is tuned matches the television channel 13 information at said first register memory; causes control processor, 20A, to cause matrix switch, 259, to establish a communications link between controller, 20, and the control processor, 44J, of decoder, 210; and determines, in a predetermined fashion, that information of the frequency to which radio, 209, is tuned matches the radio frequency 104.1 MHz information at said second register memory. Determining a match with said television channel 13 information and a match with said radio frequency 104.1 MHz information satisfies said certain preconditions and causes controller, 20, to execute particular station-specific-stereo-simulcast instructions.

Station-specific-stereo-simulcast instructions reflect the particular fashion in which the subscriber of any given station wishes to have audio of stereo simulcasts outputted at his station, and preprogrammed station-specific-stereo-simulcast instructions vary from subscriber station to subscriber station.

Figure 7C:
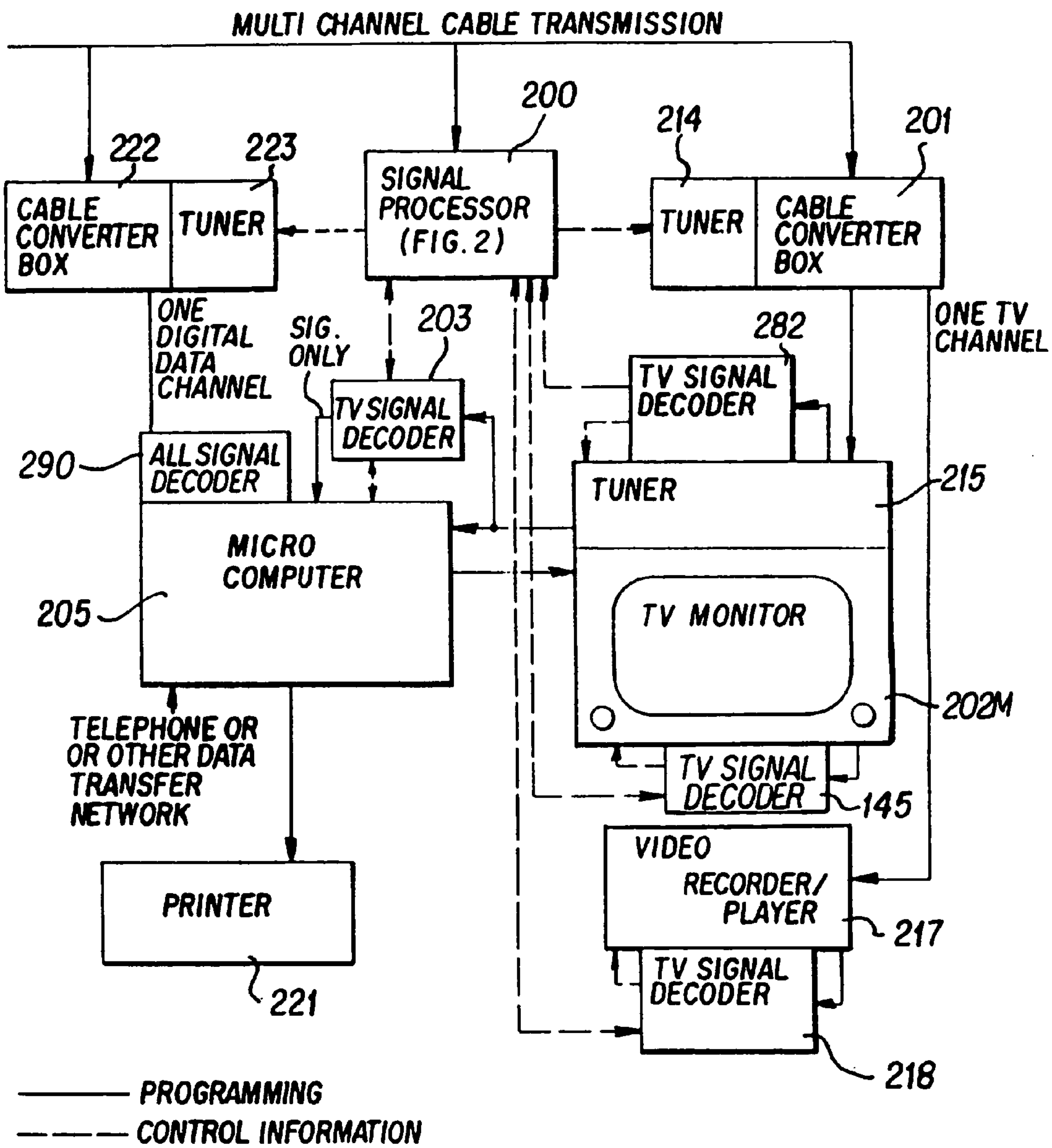
FIG. 7C is a block diagram of signal processing apparatus and methods selecting receivable information and programming and controlling combined medium, multi-channel presentations.
Figure 7D:
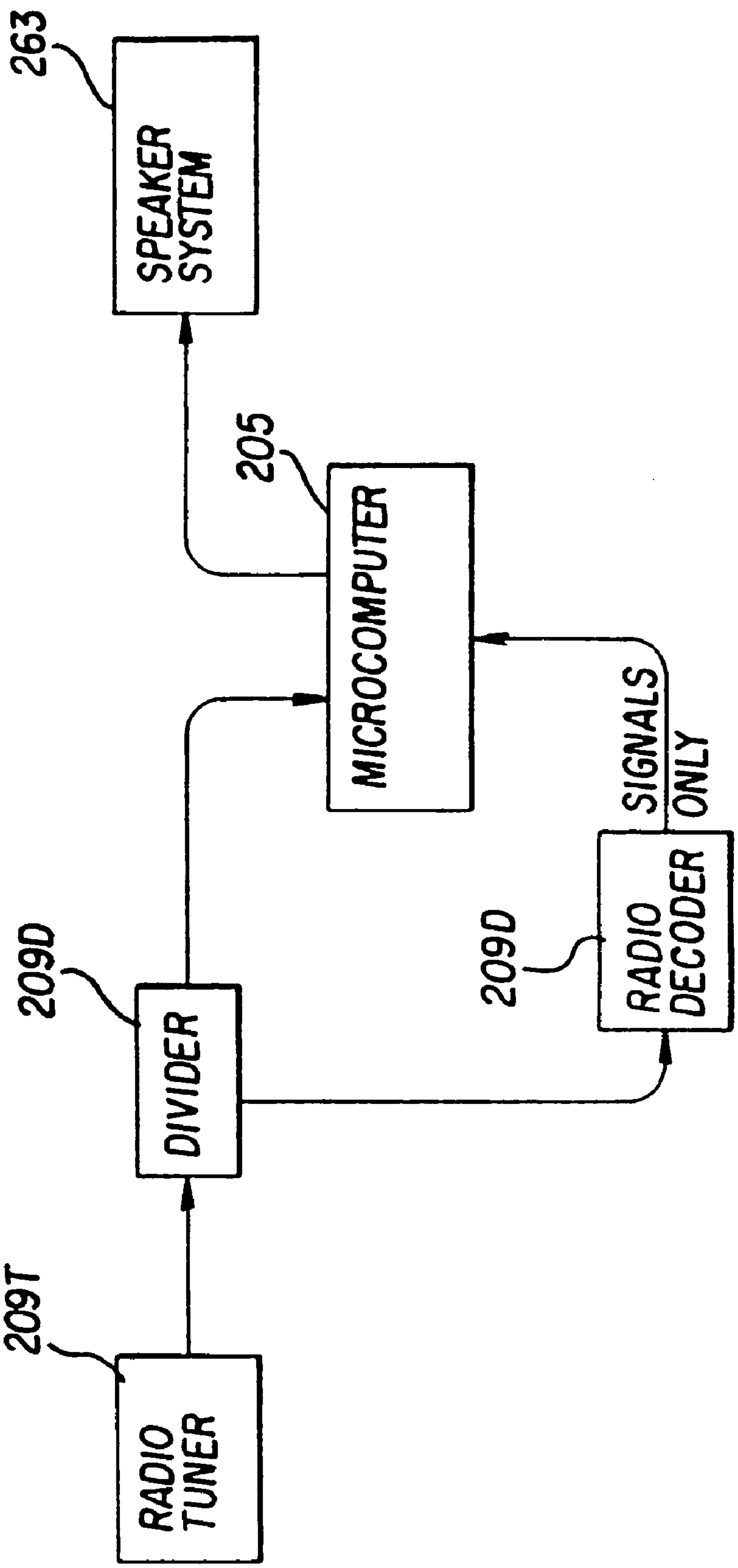
FIG. 7D is a block diagram of a radio/computer combined medium receiver station.

Executing the particular station-specific-stereo-simulcast instructions of the station of FIGS. 7 and 7C causes the controller, 20, of said station to cause stereo speaker system, 263 to emit the audio sound of said transmission in a particular fashion and causes apparatus of TV set, 202, and of radio, 209, to cease emitting sound. Automatically, controller, 20, transmits switch control information to matrix switch, 258, that causes said switch, 258, to configure its switches in such a way that the programming input to switch, 258, from radio, 209, (which inputs the audio information received at radio, 209) is switched to transfer information to the output of switch, 258, that inputs to speaker system, 263; causes control processor, 20A, to cause matrix switch, 259, to establish a communications link between controller, 20, and speaker system, 263; and causes speaker system, 263, to switch power on and commence operating, in a fashion well known in the art, at a particular so-called "balance" and a particular sound emitting volume. In so doing, controller, 20, causes speaker system, 263, to commence receiving and emitting sound of the audio information of the stereo simulcast radio transmission received at radio, 209, in a particular fashion. Then automatically, under control of said station-specific-stereo-simulcast instructions, controller, 20, causes control processor, 20A, to cause matrix switch, 259, to establish a communications link between controller, 20, and the control processor, 39J, of decoder, 203; causes TV set, 202, in a predetermined fashion, to cease emitting sound of received audio; causes control processor, 20A, to cause matrix switch, 259, to establish a communications link between controller, 20, and the control processor, 44J, of decoder, 210; and causes radio, 209, in a predetermined fashion, to cease emitting sound of received audio. In so doing, controller, 20, causes speaker system, 263, to be the only apparatus of the station of FIG. 7 emitting sound of said stereo simulcast.

(At other stations where said Activate-Stereo-Output SPAM message is received, said certain preconditions may not be satisfied—at one given station, for example, the radio, 209, of may be tuned to radio frequency 104.1 MHz but the TV set, 202, may be tuned to a channel other than television channel 13 which would signify that the subscriber of said station was not viewing a simulcast. Said stations would not execute station-specific-stereo-simulcast instructions. Instead, other instructions would be executed, and said instructions might, for example, merely discard all information of said Activate-Stereo-Output SPAM message. And at stations where station-specific-stereo-simulcast instructions are executed, the executed instructions, which are station specific and vary from station to station, will cause different functioning at different stations. For example, balance and sound emitting volume can vary from station to station, and at some stations, radios, 209, and/or TV sets, 202, may continue emitting sound of received audio.)

Thus, by switching power on to TV set, 202, and selecting channel 13 at television tuner, 215, said subscriber not only actuates automatically the radio simulcast of said channel at radio, 209, but also causes the apparatus of his station automatically to emit the sound of the received audio in his own predetermined fashion.

And automatically, monitor information is collected at signal processor, 200, that reflects the operation of speaker system, 263.

Because the information of said Activate-Stereo-Output SPAM message is transmitted periodically in said radio programming transmission, a subsequent instance of said information is received at speaker system, 263, embedded in the audio information received (via switch, 258) from radio, 209. Receiving said subsequent instance causes the SPAM decoder apparatus associated (in the fashion of the decoder, 285, if FIG. 5) with said speaker system, 263, to detect the Activate-Stereo-Output SPAM message information of said instance and to transfer to the onboard controller, 14A, of signal processor, 200, via the aforementioned bus means for communicating monitor information, a particular third transmission of monitor information containing the execution and meter-monitor information of said instance, with appropriate source mark information identifying speaker system, 263.

In the fashion described above, receiving said third transmission of monitor information causes said onboard controller, 14A, to cause a signal record of prior programming of speaker system, 263, to be recorded at the recorder, 16, of signal processor, 200, (and may cause records to be transferred to a remote location) and causes said onboard controller, 14A, to initiate a third signal record, associated with source mark information that identifies speaker system, 263, that is based on the aforementioned secondary "program unit identification code" information of the audio program unit of said radio transmission. However, to minimize unnecessary duplication, in a predetermined fashion, onboard controller, 14A, determines that radio, 209/decoder, 210, is the principal source of information associated with said secondary "program unit identification code"; retains information of said secondary "code" in said third signal record together with information that identifies said third record as a subordinate record of the aforementioned second signal record; and retains information at the aforementioned first signal record that identifies speaker system, 263, as a tertiary source of monitor information associated with the "program unit identification code" information of said particular television program. In so doing, onboard controller, 14A, consolidates signal record information of three different monitor information transmissions that contain different source mark information but common "program unit identification code" information.

Automating U. R. Stations . . . Receiving Selected Programming

FIG. 7C illustrates methods for monitoring multiple programming channels, selecting programming and information of interest, and receiving said selected programming and information.

The microprocessor, 205, of the station of FIGS. 7 and 7C, is preprogrammed to hold records of a portfolio of stocks and to receive and process automatically news items about said stocks and about the industries of said stocks. The signal processor, 200, of said station is preprogrammed at the RAM associated with the control processor, 39J, of the controller, 39, of its decoder, 30, with particular news-items-of-interest information that includes identification information of the particular stocks in said portfolio and at its controller, 20, with particular cause-selection instructions that control said controller, 20, in selecting transmissions of news items of interest.

One company whose stock is preprogrammed at said microprocessor, 205, is the American Telephone and Telegraph Company whose stock is identified by particular binary information of "T". And among the news-items-of-interest information at said RAM is an instance of said binary information of "T".

Two remote stations—remote news-service-A station and remote news-service-B station—transmit, from geographically separate locations, two different broadcast print transmissions.

The intermediate transmission station of FIG. 6 receives and retransmits information the transmissions of said remote stations on digital data channels A and B, respectively, that are inputted to converter boxes, 222 and 201, and to signal processor, 200. (Other intermediate stations receive and retransmit information of said transmission on other channels.)

Each remote station transmits each particular news item within the particular format of a Transmit-News-Item SPAM message, and receiving any given message in a Transmit-News-Item SPAM message format causes the computer, 73, of any given intermediate transmission station to transmit a particular Select-News-Item message a particular preprogrammed number of times in a particular Select-Digital-News-Item message format then to transmit the information of said news items within a message that is transmitted particular Specific-Digital-News-Item message format.

In due course, said remote news-service-A station transmits a particular AT&T news item in a particular Transmit-AT&T-News-Item message that is in said Transmit-News-Item SPAM message format and that consists of an "01" header, an execution segment of particular transmit-news-message information that is addressed to ITS computers, 73, a meter-monitor segment that contains the "program unit identification code" information of said AT&T news item and subject matter information of said binary information of "T", appropriate padding bits, an information segment that contains said AT&T news item, and an end of file signal.

Receiving said Transmit-AT&T-News-Item message causes the computer, 73, of the station of FIG. 6 to transmit a particular preprogrammed number of times on digital data channel A a particular Select-AT&T-News-Item message then to transmit a particular Specific-AT&T-News-Item message. (Receiving said Transmit-AT&T-News-Item message causes a computer, 73, at each one of said other intermediate transmission stations to cause the transmission of similar messages on a selected channel a each of said stations.) Said Select-AT&T-News-Item message is in said Select-Digital- News-Item message format and consists of an "01" header; an execution segment of particular select-news-item information that is addressed to URS signal processor, 200; a meter-monitor segment that consists of the meter-monitor information of said Transmit-News-Item SPAM message plus information that identifies said intermediate station (the format information of said meter-monitor information being modified to reflect the addition of said information that identifies said station); appropriate padding bits; an information segment that contains the binary information of "T" information of said subject matter information; and an end of file signal. The particular number of times that any given intermediate station transmits said message is the number of times necessary to permit apparatus of a signal processor, 200, at each subscriber station of said intermediate station, functioning in the fashion of example #5, to detect and process at least one instance of said Select-AT&T-News-Item message and to permit apparatus each station then to tune to the transmission of a selected digital data channel and receive, in the fashion described below, said Specific-AT&T-News-Item message. And said Specific-AT&T-News-Item message is in said Specific-Digital-News-Item message format consists of an "01" header; an execution segment of particular process-news-item information that is addressed to URS microcomputers, 73; a meter-monitor segment that is identical to the meter-monitor segment of said Select-AT&T-News-Item message; appropriate padding bits; an information segment that contains the information of said AT&T news item; and an end of file signal.

At the station of FIGS. 7 and 7C, signal processor, 200, scans sequentially all channels at its switch, 1, mixer, 3, and decoder, 30, in the fashion of example #5.

In due course, one instance of said Select-AT&T-News-Item message is detected at said decoder, 30, and inputted to the controller, 39, of said decoder, 30.

Receiving said Select-AT&T-News-Item message causes said controller, 39, to transmit said message to the controller, 20, of said signal processor, 200. Automatically, controller, 39, executes particular preprogrammed controlled function instructions that cause said controller, 39, to load the binary information of "T" information of the information segment of said message at particular working register memory and determine that the information at said memory matches the aforementioned binary information of "T" that is among the news-items-of-interest information at the RAM associated with control processor, 39J. Determining a match causes said controller, 39, to transmit said message, with channel mark information that identifies the particular channel in which said message was embedded, to said controller, 20, via control information transmission means and to continue functioning in the fashion of example #5.

Receiving said message causes said controller, 20, to cause a selected cable converter box, 222, to receive the transmission identified by said channel mark; to cause All signal decoder, 290, (which is identical to the TV signal decoder of FIG. 2A with the added capacity of the radio signal decoder of FIG. 2B to receive, detect, and input SPAM information embedded in radio frequency transmissions to a controller, 39, plus the added capacity of the other signal decoder of FIG. 2C to receive, detect, and input SPAM information embedded in other frequency transmissions to said controller, 39) at microcomputer, 205, to receive the transmission of a particular television frequency transmission and to commence processing detected SPAM information for an end of file signal; and to establish a programming transmission link between said selected box, 222, and All signal decoder, 290, at microcomputer, 205. Automatically, controller, 20, executes the instructions of a particular preprogrammed controlled function (that is different from the function invoked by said message at said controller, 39). Automatically, controller, 20, establishes a control information transmission link between controller, 20, and the tuner, 223, of said selected box, 222, by inputting a particular instruction to control processor, 20A, that causes control processor, 20A, to cause matrix switch, 259, to configure its switches in such a way that its input from controller, 20, is switched to its output that inputs to said tuner, 223. Then receiving a particular to-223 instruction from said control processor, 20A, causes controller, 20, to transmits particular instructions, via said control information transmission link, to said tuner, 223, thereby causing said tuner, 223, to tune its associated cable converter box, 222, the to the particular channel transmission of said multi-channel cable transmission that is identified by said channel mark. Automatically, controller, 20, establishes a control information transmission link between controller, 20, and said decoder, 290, by inputting a particular instruction to control processor, 20A, that causes control processor, 20A, to cause matrix switch, 259, to configure its switches to transfer information from its input from controller, 20, to its output that inputs to said decoder, 290. Then receiving a particular to-290 instruction from said control processor, 20A, causes controller, 20, to input an interrupt signal of new-channel-input information, in a predetermined fashion, to the control processor, 39J, of the controller, 39, of said decoder, 290. Receiving said interrupt signal causes said control processor, 39J, to delete all previously received SPAM information; to cause its associated matrix switch, 39I, to commence transferring information from the EOFS valve, 39F, to its null output; and to cause said EOFS valve, 39F, to commence processing detected SPAM information for an end of file signal. Then automatically, controller, 20, inputs switch control instructions to matrix switch, 258, thereby causing matrix switch, 258, to configure its switches in such a way that the input to switch, 258, from cable converter box, 222, is switched to transfer information to the output of switch, 258, that inputs to said decoder, 290. In so doing, controller, 20, causes said decoder, 290, to commence receiving the programming transmission of digital data channel A and causes said decoder, 290, to commence detecting and processing SPAM message information embedded in said transmission.

In due course, a subsequent instance of said Select-AT&T-News-Item message is transmitted on said channel A, causing the EOFS valve, 39F, of said decoder, 290, to detect the end of file signal of said message and causing the controller, 39, of said decoder, 290, to commence identifying and processing the individual SPAM messages detected in the transmission of said channel A. (Said decoder, 290, is not preprogrammed with any controlled-function-invoking information that matches the execution segment information of a said Select-AT&T-News-Item message, so receiving any given instance of said message causes decoder, 290, merely to discard said message.)

In due course, said Specific-AT&T-News-Item message is transmitted on said channel A.

Transmitting said message causes decoder, 290, to detect and input said message to the controller, 39, of said decoder, 290.

Receiving said message causes said controller, 39, to cause microcomputer, 205, to process information of said message. Automatically, controller, 39, executes the instructions of a particular preprogrammed controlled function and inputs to an input buffer of microcomputer, 205, a particular input-from-290 computer job that consists of process-this-data-input-from-290 instructions and particular data. Said data includes the meter-monitor information of said message and the information of the information segment of said message—that is, said AT&T news item.

In due course and in a predetermined fashion, microcomputer, 205, processes said job; determines that the preprogrammed instructions entered by the subscriber of the station of FIGS. 7 and 7C are to print at printer, 221, data of any job of process-this-data-input-from-290 instructions; and causes said AT&T news item to be printed at said printer, 221. Automatically, microcomputer, 205, executes particular preprogrammed instructions and inputs a particular switch-205-to-221 instruction to the controller, 20, of signal processor, 200. Receiving said instruction causes said controller, 20, to input particular switch control instructions to matrix switch, 258, thereby causing matrix switch, 258, to configure its switches in such a way that the input to switch, 258, from microcomputer, 205, is switched to transfer information to the output of switch, 258, that inputs to said printer, 221. Then automatically, microcomputer, 205, transfers said data to said printer, 221. In so doing, microcomputer, 205, causes printer, 221, in a predetermined fashion, to print said AT&T news item. (Said preprogrammed instructions entered by the subscriber might cause said microcomputer, for example, then to establish a programming communication link with computer memory unit, 256, and to cause said unit, 256, to record said AT&T news item.)

Receiving the aforementioned instance of said Select-AT&T-News-Item message and said Specific-AT&T-News-Item message at the station of FIG. 7 also causes processing of monitor information at said signal processor, 200, in the fashions described above. After transferring the information of said Select-AT&T-News-Item message to said controller, 20, said controller, 39, automatically transfers monitor information of said message to buffer/comparator, 14, thereby causing the onboard controller, 14A, to process information of the availability at said station of said AT&T news item. After executing the controlled functions invoked by said Specific-AT&T-News-Item message, said controller, 20, automatically transfers monitor information of said message to buffer/comparator, 14, thereby causing the onboard controller, 14A, to process information of the use of said AT&T news item at microcomputer, 205. And receiving said data at printer, 221, causes other decoder, 227 (see FIG. 5), in a predetermined fashion, to detect in said data the meter-monitor information of said Specific-AT&T-News-Item message and to transmit said meter-monitor information to signal processor, 200, thereby causing said onboard controller, 14A, to retain monitor information and initiate a secondary signal record in the fashion described above.

Automating U. R. Stations . . . More on Example #7 . . . Receiving Selected Programming and Combining Selected URS Microcomputers, 205, Automatically to the Computer System of a Selected Programming Transmission In the present invention, the computer information of any given combined medium combining is processed by a computer system that consists of a plurality of computers each of which is at a subscriber station and all of which process, in parallel, and output their specific information under control of one transmission of embedded computer programming inputted to said system at a program originating studio. The FIG. 1C combining of the "Wall Street Week" example provides one example of such a combining. The computer system of said example consists of a plurality of microcomputers, 205, each of which is at a different subscriber station, and the program originating studio that originates transmission of the "Wall Street Week" programming embeds and transmits a series of SPAM messages that control all of said microcomputers, 205. Under control of the first message, each one of said plurality of microcomputers, 205, generates its own specific FIG. 1A information. Then, under control of the second message, each of said microcomputers, 205, combines its specific FIG. 1A information with transmitted FIG. 1B information, and all of said microcomputers, 205, display their specific FIG. 1C images (which differ from station to station).

The present invention includes capacity whereby SPAM message information transmitted by any given program originating studio can cause a plurality of selected computers to select programming in the fashion described above, and in so doing, to combine to an come under control of the computer system of said studio.

For example, all URS microcomputers, 205, of a large plurality of subscriber stations (of which the station of FIGS. 7 and 7C is one station) are preprogrammed with particular program-unit-of-interest information and with particular station-specific-television-program-selection-and-display instructions. Said program-unit-of-interest information includes information of particular television programs that the subscribers of the stations of said microcomputers, 205, wish to view when said programs are transmitted. Some among said television programs are combined medium television programs. Said station-specific-television-program-selection-and-display instructions reflect the specific fashion in which any selected one of said programs is to be selected and displayed when said program is transmitted.

The program-unit-of-interest information preprogrammed at the microcomputer, 205, of the station of FIGS. 7 and 7C includes particular specific-WSW information that reflects the wish of the subscriber of said station to view (or record) said "Wall Street Week" program when said program is transmitted. In a predetermined fashion, said subscriber has caused to be included in said program-unit-of-interest information. (Microcomputers, 205, of selected other stations of said large plurality of stations are also so preprogrammed.) The station-specific-television-program-selection-and-display instructions at the microcomputer, 205, of the station of FIGS. 7 and 7C includes particular information that said subscriber will pay up to a certain limit—for example, twenty-five cents—to be permitted to receive said program and that, if the TV set, 202, of said station is switched off when information of the transmission of said program is detected, power should be switched on to said TV set, 202, and said program should be displayed at the monitor, 202M, of said set and, in addition, power should be switched on to the video recorder/player, 217, of said station, and said program should be recorded at said recorder/player, 217.

The signal processor, 200, of said station scans sequentially all received television transmission channels in the fashion described above and is preprogrammed at the RAM associated with the control processor, 39J, of its decoder, 30, to respond in a particular controlled function fashion whenever a SPAM message with an execution segment of particular available-television-program information is detected. Said signal processor, 200, has capacity for actuating and tuning TV set, 202, and video recorder, 217, and for controlling microcomputer, 205.

(The microcomputers, 205, of selected other stations of said large plurality of stations are also preprogrammed with select-WSW information and with station-specific-television-program-selection-and-display instructions [which instructions differ from station to station], and the signal processors, 200, of said stations are preprogrammed function in the same fashion as the signal processor, 200, of the station of FIGS. 7 and 7C.)

The program originating studio that originates the "Wall Street Week" program originates, embeds, and transmits the programming in the encrypted fashion of example #7 above, and the intermediate transmission station of FIG. 6 receives and retransmits said programming, in the fashion of example #7, on cable channel 13 which is inputted, at the station of FIGS. 7 and 7C, to converter boxes, 222 and 201, and to signal processor, 200. (Other intermediate stations receive and retransmit information of said transmission on other channels, and the aforementioned specific-WSW information [that is included in program-unit-of-interest information] is specified above, in example #7, at page 289, line 35.)

Before transmitting any given program unit of television programming, any given program originating studio transmits a particular intermediate-station-control message in the particular format of a Prepare-To-Retransmit-Television-Program-Unit SPAM message, and receiving any given SPAM message in said format causes the computer, 73, of any given intermediate transmission station to generate a particular series of messages and retain complete information of said messages at particular memory locations, to prepare particular apparatus of said station to retransmit the programming of said program unit, and to transmit said retained messages in a particular fashions at particular times.

The cable program controller & computer, 73, of each intermediate station is preprogrammed with schedule information that reflects the particular time at which and the channel on which said station will retransmit said "Wall Street Week" program. The particular channel information of the computer, 73, of the station FIG. 6 is CC13 and the particular time information is particular-8:30, reflecting that said station is schedule to retransmit said program on cable channel 13 at a particular 8:30 PM time (which is the time at which the program originating studio that originates the "Wall Street Week" program transmits the so-called "live" programming of said program. (A particular other computer, 73, is preprogrammed with particular channel information of CC11 and particular time information of particular-9:30, reflecting that the station of said other computer, 73, is schedule to retransmit said program, so-called "time delayed," on cable channel 11 at a particular 9:30 PM time.)

In due course, the program originating studio that originates the transmission of said "Wall Street Week" program transmits a particular Prepare-To-Retransmit-WSW message (which is the particular intermediate-station-control message of said "Wall Street Week" program) in said Prepare-To-Retransmit-Television-Program-Unit format, and said message consists of an "01" header; an execution segment of particular load-and-execute information that is addressed to ITS computers, 73; a meter-monitor segment that contains the "program unit identification code" information of said "Wall Street Week" program; appropriate padding bits; an information segment of particular incorporate-and-retain-Select-WSW-Program-Unit-SPAM-message instructions that include particular generally applicable please-fully-enable-WSW-on-XXXX-at-YYYYYYYYYYYYYYY information and specific-WSW information, particular incorporate-and-retain-Specific-WSW-Enabling-message instructions that include the aforementioned particular enable-WSW instructions, particular timing instructions that include particular-8:30-PM information, and particular interconnect-and-encrypt-the-audio-of-WSW instructions; and an end of file signal.

Receiving said Prepare-To-Retransmit-WSW message causes apparatus of the station of FIG. 6 to input the information of the information segment of said message to the computer, 73, of said station and to execute the information so inputted as a machine language job. (Receiving said message causes apparatus at other stations to function similarly.)

Executing said incorporate-and-retain-Select-WSW-Program-Unit-SPAM-message instructions causes said computer, 73, to generate particular please-fully-enable-WSW-on-CC13-at-particular-8:30 information and a particular Select-WSW-Program-Unit SPAM message and to retain said message at particular Select-Program-Unit-Message-to-Transmit memory. Automatically, said computer, 73, generates said please-fully-enable-WSW-on-CC13-at-particular-8:30 information by replacing the information of particular variables, XXXX and YYYYYYYYYYYYYYY, in said generally applicable please-fully-enable-WSW-on-XXXX-at-YYYYYYYYYYYYYYY information with said CC13 and said particular-8:30 information that are preprogrammed at said computer, 73, and that reflect that the schedule of the intermediate station of said computer, 73. Said Select-WSW-Program-Unit message consists of an "01" header; an execution segment of information that is identical to the aforementioned available-television-program information; a meter-monitor segment that consists of the meter-monitor information of said Prepare-To-Retransmit-WSW message plus information that identifies said intermediate station (the format information of said meter-monitor information being modified to reflect the addition of said information that identifies said station); appropriate padding bits; an information segment of generally applicable determine-whether-to-select instructions of said Transmit-Select-WSW message that contain said particular specific-WSW information and said please-fully-enable-WSW-on-CC13-at-particular-8:30 information; and an end of file signal.

(The modified meter-monitor format information in said message is preprogrammed in said incorporate-and-retain-Select-WSW-Program-Unit-SPAM-message instructions and is caused, by said instructions, to replace the meter-monitor format information of said Prepare-To-Retransmit-WSW message message to reflect the addition of the aforementioned information that identifies the station of FIG. 6. In other words, a station specific identification datum is added at each station to the meter-monitor information of said Prepare-To-Retransmit-WSW message. The station specific identification data vary from station to station. However, all station specific identification data are in the same format and are added to said meter-monitor information in the same fashion. Hence, all instances of Select-WSW-Program-Unit message meter-monitor information are in the same format.)

(Executing said incorporate-and-retain-Select-WSW-Program-Unit-SPAM-message instructions causes said other computer, 73, that is preprogrammed with particular CC11 and particular-9:30 information to generate particular please-fully-enable-WSW-on-CC11-at-particular-9:30 information that reflects the schedule of the station of said other computer, 73, and to incorporate said information into the information segment of the station specific Select-WSW-Program-Unit SPAM message of said station.)

Executing said incorporate-and-retain-Specific-WSW-Enabling-message instructions causes the computer, 73, of the station of FIG. 6 to generate a Specific-WSW-Enabling-message, which is the aforementioned local-cable-enabling-message (#7) (see the paragraph that begins above at page 291, line 9), and to retain said message at particular Specific-WSW-Enabling-Message-to-Transmit memory. (see the paragraph that begins above at page 291, line 9.) All information of said message is preprogrammed at said computer, 73, prior to the executing of said instructions (including the aforementioned enable-WSW instructions and enable-WSW-programming information that are preprogrammed in said incorporate-and-retain-Specific-WSW-Enabling-message instructions), and said incorporate-and-retain-Specific-WSW-Enabling-message instructions cause said computer, 73, to select the specific preprogrammed information of said message from among all the preprogrammed information of said computer, 73, and to assemble said selected information at said memory. When assembled, said message consists of an "01" header; an execution segment of particular preprogrammed enable-next-program-on-CC13 information that is addressed to URS signal processors, 200; a meter-monitor segment whose information is identical to the meter-monitor information of said Select-WSW-Program-Unit SPAM message; appropriate padding bits; an information segment that contains particular enable-CC13 instructions and said enable-WSW instructions which include said enable-WSW-programming information; and an end of file signal.

Executing said timing instructions, causes each intermediate station to commence transmitting its station specific Select-WSW-Program-Unit SPAM message at a station specific time; to transmit said message over and over for a station specific interval of time; to execute said interconnect-and-encrypt-the-audio-of-WSW instructions at a particular time; and to transmit its station specific Specific-WSW-Enabling-message after a particular enabling time. The particular time at which any given station commences transmitting its station specific Select-WSW-Program-Unit SPAM message is before the minimum time prior to the commence enabling time of said station necessary for each subscriber station of said intermediate station, functioning in the fashion of example #5, to detect and process at least one instance of said Select-WSW-Program-Unit message and then to tune to the transmission of a selected master cable control channel and receive, in the fashion described below, the station specific Specific-WSW-Enabling-message of its intermediate transmission station. The particular number of times that any given intermediate station transmits its station specific Select-WSW-Program-Unit SPAM message is the number of times necessary to permit apparatus of a signal processor, 200, at each subscriber station of said intermediate station to detect and process at least one instance of said Select-WSW-Program-Unit message.

In due course, executing said timing instructions causes the computer, 73, of the station of FIG. 6 to commence transmitting the SPAM message at its particular Select-Program-Unit-Message-to-Transmit memory, which is its station specific Select-WSW-Program-Unit SPAM message, embedded in the normal transmission location of cable channel 13.

Subsequently. executing said timing instructions causes said computer, 73, to execute said interconnect-and-encrypt-the-audio-of-WSW instructions.

Executing said last named instructions causes said computer, 73, to cause apparatus of said station to receive the transmission of the program originating studio of the "Wall Street Week" program; to input said transmission, via the matrix switch, 75, of said station, to particular apparatus, well known in the art, that encrypt the audio portion of said transmission and output the video and encrypted audio portions of said transmission in proper synchronization; to cause said apparatus to encrypt the information of said audio portion using a particular preprogrammed cipher algorithm C and cipher key Ca; and to transfer the output of said apparatus, via matrix switch, 75, to field distribution system, 93, via the particular modulator, 82, 86, or 90, of cable channel 13.

In due course, while scanning sequentially all channels in the fashion of example #5, the apparatus of the signal processor, 200, of the station of FIGS. 7 and 7C detects one instance of the Select-WSW-Program-Unit SPAM message of the station of FIG. 6 and inputs said message to the controller, 39, of the decoder, 30, of said signal processor, 200.

Receiving said Select-WSW-Program-Unit message causes the apparatus of said signal processor, 200, to input said message to the microcomputer, 205, of said station. Automatically, said controller, 39, determines that the execution segment of said message matches its preprogrammed available-television-program controlled-function-invoking information; executes the associated controlled function instructions; inputs said message to the buffer/comparator, 8, of said signal processor, 200; and to inputs particular step-completed information to said controller, 20. (Receiving said information causes controller, 20, to cause the relevant apparatus of said signal processor, 200, to commence functioning to identify program unit identification signal information in the fashion described in example #5.) Receiving said message causes buffer/comparator, 8, to input said message to controller, 12. Receiving said message causes controller, 12, to execute particular preprogrammed controlled function instructions; to establish a control information communications link, via matrix switch, 259, to the buffer, 39G, of the controller, 39, of said decoder, 203; to transfer said message, via said link, to said buffer, 39G.

Receiving said Select-WSW-Program-Unit message causes decoder, 203, to execute the information of the information segment of said message as a machine language job. Automatically, control processor, 39J, executes particular preprogrammed available-television-program controlled function instructions that cause said control processor, 39J, to input the information of the information segment of said message to the CPU of microcomputer, 205, and to cause said CPU to execute the information so inputted as a machine language job. The information so inputted is the aforementioned determine-whether-to-select instructions that contain said particular specific-WSW information and said please-fully-enable-WSW-on-CC13-at-particular-8:30 information.

Executing said determine-whether-to-select instructions causes microcomputer, 205, to input said please-fully-enable-WSW-on-CC13-at-particular-8:30 information to the controller, 20, of signal processor, 200. Said instructions contain one instance, and the aforementioned program-unit-of-interest information that is preprogrammed at said microcomputer, 205, contains a second instance of specific-WSW information, which second instance reflects the wish of the subscriber of said station to view (or record) said "Wall Street Week" program when said program is transmitted. Automatically, microcomputer, 205, compares said one instance to said program-unit-of-interest information and determines a match with said second instance. Determining a match causes microcomputer, 205, automatically to input said please-fully-enable-WSW-on-CC13-at-particular-8:30 information to the controller, 20.

Receiving said please-fully-enable-WSW-on-CC13-at-particular-8:30 information causes controller, 20, in a predetermined fashion, to prepare particular apparatus of signal processor, 200, to receive said local-cable-enabling-message (#7) (which is the station specific Specific-WSW-Enabling-message of the station of FIG. 6). Controller, 20, is preprogrammed with particular receive-authorizing-info-at-appointed-time instructions, information of a particular standard-local-station-interval quantity of time, particular enable-next-program-on-CC13 information, and information of a particular master cable control channel. Receiving said please-fully-enable-WSW-on-CC13-at-particular-8:30 information causes controller, 20, to execute said receive-authorizing-info-at-appointed-time instructions. Automatically, controller, 20, selects said CC13 and said particular-8:

30 information from the information of said please-fully-enable-WSW-on-CC13-at-particular-8:30 information and computes the aforementioned commence-enabling time (see example #7) by subtracting said standard-local-station-interval quantity of time from the schedule time information of said particular-8:30 information. At said commence-enabling time, receiving time information from clock, 18, causes controller, 20, automatically to cause all apparatus of decoder, 30, to delete from memory all information of received SPAM information; to cause the controller, 39J, of said decoder, 30, to place one instance of said enable-next-program-on-CC13 information at a particular controlled-function-invoking information location; to cause apparatus of signal processor, 200, to input the transmission of said cable control channel to decoder, 30; and to cause the EOFS valve, 39F, of said decoder, 30, to commence processing detected SPAM information to detect an end of file signal. In so doing, controller, 20, causes decoder, 30, to commence receiving the transmission of said master cable control channel and processing SPAM information in said transmission. In addition, controller, 20, automatically places one instance of said enable-next-program-on-CC13 information at a particular controlled-function-invoking-@20 information location at controller, 20.

In due course, executing said timing instructions causes the computer, 73, of the station of FIG. 6 to transmit a particular message that ends with an end of file signal.

Receiving said message causes said EOFS valve, 39F, to detect the end of file signal in said message, thereby causing the apparatus of decoder, 30, to commence identifying and processing the individual SPAM messages embedded in said transmission.

Then executing said timing instructions causes said computer, 73, to transmit said local-cable-enabling-message (#7)

(At each other intermediate transmission station that receives and executes the information of said Prepare-To-Retransmit-WSW message, executing said information causes said station to transmit its own station specific Specific-WSW-Enabling-message on its own station specific master cable control channel, thereby enabling its subscriber stations that receive and execute the information of said message to receive the “Wall Street Week” retransmission of said intermediate transmission station in a fashion that differs from intermediate station to intermediate station. For example, whereas the intermediate station of FIG. 6 encrypts the audio of said transmission using cipher key Ca, another intermediate transmission station can use a different cipher key—for example, Ta—and cause its selected subscriber stations to decrypt said audio properly by means of the information of its own station specific Specific-WSW-Enabling-message.)

Receiving said local-cable-enabling-message (#7) at the station of FIG. 7 causes the apparatus of said station to function in precisely the fashion of example #7. Receiving said message causes the decoder, 30, of signal processor, 200, to detect and transfer said message to the controller, 20. Receiving said message causes said controller, 20, to execute said enable-CC13 instructions; to sample selected SPAM information of the station of FIG. 7 and determine that unauthorized tampering has not occurred; to cause selected apparatus of said station—cable converter box, 201, matrix switch, 258, and a decryptor, 107 (that exists at said station, that receives its input from and transfers its output to matrix switch, 258, and is controlled by controller, 20, but that is not shown in FIG. 7)—to receive the transmission of cable channel 13; to cause said selected decryptor, 107, to decrypt the audio portion of said transmission using selected cipher algorithm and key information; to cause selected apparatus of signal processor, 200, to commence waiting to receive further enabling information; to execute said enable-WSW instructions; and to place instances of said enable-WSW-programming information at particular controlled-function-invoking information memory locations at the controller, 39, of decoder, 30, and at controller, 20. And completing said enable-WSW instructions causes controller, 20, to initiate a meter record at buffer/comparator, 14, that documents the decryption of the cable audio transmission at said station.

(Simultaneously, other subscriber stations [i.e., ultimate receiver stations] of the field distribution system, 93, of the intermediate transmission station of FIG. 6 sample selected SPAM information in their subscriber station specific fashions and determine whether unauthorized tampering has occurred and decrypt the audio portion of said transmission or respond in the fashions described above in example #7 if they determine that unauthorized tampering has occurred. Meanwhile, at the field distribution systems, 93, of other intermediate transmission stations, other subscriber stations each receive the station specific Select-WSW-Program-Unit SPAM messages of their specific intermediate station, tune to an intermediate station specific transmission channel [eg. cable channel 11 rather than 13] in an intermediate station specific fashion [eg. by decrypting with cipher key Ta rather than Ca] and even at an intermediate station specific time [eg. at 9:30 PM rather than 8:30 PM] to receive said “Wall Street Week” program, sample selected subscriber station specific SPAM information in their subscriber station specific fashions, determine whether unauthorized tampering has occurred, and respond station specifically in the fashions described above.)

Subsequently, but still in the interval between said commence-enabling time and said 8:30 PM time, said program originating studio that originates the “Wall Street Week” transmission embeds and transmits the 1st-WSW-program-enabling-message (#7) SPAM message.

Transmitting said message causes said message to be detected at the signal processor, 200, of the station of FIG. 7 and inputted to the controller, 20, and causes controller, 20, to load and execute the 1st-stage-enable-WSW-program instructions in said message.

Executing said 1st-stage-enable-WSW-program instructions causes controller, 20, in the predetermined fashion of said instructions (which fashion that is not described in example #7 above), to cause microcomputer, 205, to authorize reception of said “Wall Street Week” program so-called “pay-per-view” basis. Automatically, under control of said instructions, controller, 20, inputs to microcomputer, 205, a particular check-station-specific-selection-and-display instruction and particular reception-of-WSW-costs-20-cents information (which instruction and information is preprogrammed in said 1st-stage-enable-WSW-program instructions). Receiving said instruction and said information causes microcomputer, 205, to execute particular preprogrammed instructions and, in a predetermined fashion, to determine that the aforementioned station-specific-television-program-selection-and-display instructions at said microcomputer, 205, include particular information that the subscriber of said station is willing pay up to a certain limit—twenty-five cents—to receive said program. So determining, under control of said instructions, causes microcomputer, 205, to input a particular preprogrammed pay-per-view-authorizing instruction to said controller, 20.

Receiving said instruction causes controller, 20, under control of said 1st-stage-enable-WSW-program instructions, to perform a first stage of decrypting the video information of the "Wall Street Week" program transmission in precisely the fashion described in example #7.

(Executing the information of said 1st-WSW-program-enabling-message (#7) message causes the microcomputers, 205, of selected other stations that receive said message also to authorize so-called "pay-per-view" reception of said "Wall Street Week" program. At said stations that authorize reception, apparatus receive and process subsequent information of the "Wall Street Week" transmission just as at the station of FIG. 7. However, at certain other stations that receive and process said message the preprogrammed station-specific-television-program-selection-and-display instructions at the microcomputers, 205, do not include information that the subscribers of said last named stations are willing pay to receive said program. Executing the information of said message at said last named stations causes the microcomputers, 205, of said stations to identify and execute particular station-specific-alternate-handling ones of said station-specific-television-program-selection-and-display instructions. Executing said ones causes each station in its preprogrammed fashion to handle subsequent information of said transmission. Under control of their particular station-specific-alternate-handling instructions, selected ones of said certain other stations discard all subsequent information of said transmission by causing their station apparatus to cease receiving and decrypting the information of said transmission. Under control of their particular station-specific-alternate-handling instructions, selected others of said certain other stations cause apparatus of their specific stations to record the information of said transmission—albeit, the encrypted information—thereby enabling a subscriber at each of said specific stations individually and manually to so-called "play back" the recorded encrypted information of said transmission and input a pay-per-view-authorizing instruction to a controller, 20, at his specific station, thereby causing said controller, 20, and other apparatus of the station of said subscriber [under control of said controller, 20] at a delayed time to decrypt, process, and display the information of said transmission in the fashion of the apparatus of the station of FIG. 7 [because in the preferred embodiment, the information of said 1st-WSW-program-enabling-message (#7) SPAM message embedded and transmitted more than once in said transmission in a fashion that enables a video recorder/player, 217, to record at least one full instance of an end of file signal followed by said information at every one of said certain other stations]. Executing said station-specific-alternate-handling instructions at said certain other stations causes a controller, 20, at each of said stations to switch power on to a video recorder/player, 217, at each of said stations; to cause a matrix switch, 258, at each of said station to commence transferring the output of the decryptor, 107, of said station to said recorder/player, 217; and to cause said recorder/player, 217, to commence recording the inputted transmission.)

Subsequently, but still before said 8:30 PM time, the program originating studio that originates the "Wall Street Week" transmission embeds and transmits the 1st-WSW-decryption-check (#7), the eight SPAM messages each of which is called a "2nd-WSW-program-enabling-message (#7)", and the 2nd-WSW-decryption-check (#7) just as in example #7.

Up to a particular point, receiving each of said messages causes the apparatus of the station of FIG. 7 (and all other subscriber stations that receive said messages—whether so-called "live" or so-called "time delayed") to function just as receiving said messages causes the apparatus of the station of FIG. 4 in example #7 to function. Said point occurs after controller, 20, executes the aforementioned additional 2nd-stage-enable-WSW-program instructions which, at the station of FIG. 4, cause the apparatus of said station to commence transferring the decrypted television information of the "Wall Street Week" program to microcomputer, 205, and monitor, 202M.

Executing said additional 2nd-stage-enable-WSW-program instructions at the station of FIG. 7 causes controller, 20, first to cause the apparatus of said station to commence transferring the decrypted television information of the "Wall Street Week" program transmission to decoder, 203, and microcomputer, 205. Automatically, controller, 20, causes matrix switch, 258, to cease inputting the decrypted video information of said transmission to signal processor, 200, (at switch, 1), and to commence transferring said video information (which is inputted to matrix switch, 258, from said decryptor, 231) to divider, 4, thereby causing divider, 4, to transfer said decrypted video information to microcomputer, 205, and to decoder, 203. Automatically, controller, 20, causes decoder, 203, to discard any previously received SPAM information and to commence detecting and processing SPAM information in the inputted decrypted video information in the fashion described above. In so doing, controller, 20, causes decoder, 203, to detect and process any embedded SPAM information of the transmission of the program originating station that originates said "Wall Street Week" program and combines the microcomputer, 205, of the station of FIG. 7 to the computer system of the program originating station that originates said "Wall Street Week" program.

(Simultaneously, the SPAM message information embedded and transmitted at said originating station cause microcomputers, 205, at other stations to be combined to said computer system in the same fashion.)

Thereafter, said additional 2nd-stage-enable-WSW-program instructions affect the apparatus of the station of FIG. 7 differently from the station of FIG. 4. At the station of FIG. 4 where the television programming output transmission of the PC MicroKey System of microcomputer, 205, is inputted directly to TV monitor, 202M. By contrast, at the station of FIG. 7, the television programming output transmission of microcomputer, 205, is inputted to matrix switch, 258. Furthermore, the station of FIG. 7 is preprogrammed with the aforementioned station-specific-television-program-selection-and-display instructions.

At the station of FIG. 7, executing said additional 2nd-stage-enable-WSW-program instructions causes controller, 20, thereafter to cause the apparatus of said station to determine that monitor, 202M, is not on and operating. Automatically, controller, 20, causes control processor, 20A, in the fashion described above, to establish a control information communications link, via matrix switch, with a SPAM TV signal decoder, 145, at monitor, 202M, that controls monitor, 202M. Automatically, controller, 20, transmits particular information to said decoder, 145, that causes said decoder, 145, to determine, in a predetermined fashion, that power is not on to monitor, 202M, and to respond by transmitting particular 202M-is-not-on information to controller, 20, via said link.

The fact that monitor, 202M, is not on signifies that the subscriber of the station of FIG. 7 is not viewing television information at monitor, 202M, and suggests that said subscriber may not even be present at said station.

Receiving said 202M-is-not-on information causes controller, 20, under control of said additional 2nd-stage-enable-WSW-program instructions, to cause microcomputer, 205, to input particular preprogrammed instructions to said controller, 20, which instructions reflect the specific fashion in which said subscribe wants any given selected program to be selected and displayed. Automatically, controller, 20, inputs a particular choose-mode-of-selection-and-display instruction and said 202M-is-not-on information to microcomputer, 205, and receiving said instruction and said information causes microcomputer, 205, in a predetermined fashion, to process the aforementioned station-specific-television-program-selection-and-display instructions. Automatically, under control of said instructions, microcomputer, 205, inputs to controller, 20, particular preprogrammed display-at-202M-and-record-at-217 instructions.

Receiving said display-at-202M-and-record-at-217 instructions causes controller, 20, to switch power on to monitor, 202M, and commence transferring the television output transmission of microcomputer, 205, to said monitor, 202M; to switch power on to video recorder/player, 217, (which has capacity to receive and record the information of an audio and a composite video transmission); to commence transferring the television output transmission of microcomputer, 205, to said recorder/player, 217; and to cause said recorder/player, 217, to record said transmission. Automatically, controller, 20, inputs a particular instruction to decoder, 145, via said communications link, that causes decoder, 145, to switch power on to monitor, 202M, and to tune monitor, 202M, in a predetermined fashion. Automatically, controller, 20, causes matrix switch, 258, to transfer the decrypted audio information inputted from decryptor, 107, to monitor, 202M, and also to recorder/player, 217. Automatically, controller, 20, causes matrix switch, 258, to transfer the video information inputted from microcomputer, 205, to monitor, 202M, and also to recorder/player, 217. Automatically, controller, 20, causes control processor, 20A, to establish a control information communications link, via matrix switch, 259, with a SPAM TV signal decoder, 218, at recorder/player, 217, that controls recorder/player, 217, and transmits particular information to said decoder, 218, that causes said decoder, 218, to switch power on to recorder/player, 217, and to cause recorder/player, 217, to record the inputted audio and video information (including any SPAM message information embedded in said audio and video information). In so doing, controller, 20, causes monitor, 202M, to receive the decrypted video and audio information of the "Wall Street Week" program, to display the video image of said information, and to emit sound in accordance with said audio information and causes recorder/player, 217, to record said information of the "Wall Street Week" program.

(Simultaneously, the SPAM message information embedded and transmitted at said program originating station and the station-specific-television-program-selection-and-display instructions of other stations cause the apparatus of said stations to handle the programming transmitted by said originating station in station specific fashions. Some stations, where monitors, 202M, are determined to be off, may respond by causing receiver apparatus to cease receiving the transmission of said programming, thereby discarding all information of said "Wall Street Week" program. At other stations that lack microcomputers, 205, the controllers, 20, operating under control of said additional 2nd-stage-enable-WSW-program instructions, cause the apparatus of said stations to transfer the decrypted video information outputted by decryptors, 231, directly to monitors, 202M, thereby causing said monitors, 202M, to display the conventional television information of said program [eg. FIG. 1B] without any combined, locally generated information [eg. FIG. 1A].)

In due course, at said 8:30 PM time, said program originating studio commences transmitting the programming information of said "Wall Street Week" program, thereby causing the apparatus of the station of FIG. 7 (and of other correctly regulated and connected stations) to commence functioning in the fashions described above in "One Combined Medium" and in examples #1, #2, #3, and #4.

And in the fashions described above, receiving each SPAM message that causes decrypting causes the station of FIG. 7 (and causes other stations) to retain and process meter information. And receiving at any SPAM decoder of said station any SPAM message that contains meter-monitor information causes the apparatus of said station (and causes apparatus at other stations that are preprogrammed to collect monitor information) to retain and process monitor information.

Controlling Computer-Based Combined Media Operations

So far in this specification has treated the process of controlling combined medium operations as if the process of generating the computer information of any given computer based combining—for example, the FIG. 1A information of the FIG. 1C combining—begins with the embedding, at a program originating studio, and transmitting of instructions that cause subscriber station microcomputers, 205, to generate said computer information. (In the case of said FIG. 1A information, this specification has, so far, treated the process of generating the particular information of said FIG. 1A as if said process begins with the embedding and transmitting of the first message of the "Wall Street Week" example.)

In actuality, the process of controlling computer-based combined media operations is continuous and involves systematic inputting and maintaining of up-to-date user specific data at each subscriber station. (For example, only at subscriber stations where user specific stock data is maintained systematically and up-to-date can the program instruction set of the first message of the "Wall Street Week" example generate FIG. 1A images that actually show the performance of the portfolios of the subscribers of said stations.)

Of course, individual subscribers can, themselves, maintain their data systematically and up-to-date. And at stations where subscribers so do, control computer-based of combined medium operations can, indeed, begin with the embedding, at a program originating studio, and transmitting of instructions that cause subscriber station microcomputers, 205, to generate the computer information of a given computer based combining.

However, the present invention provides means and methods for systematically inputting and maintaining user specific data at subscriber stations.

Microcomputer, 205, has an installed modem; receives information that is transmitted by means of telephone or data communications network, 262; is preprogrammed to answer telephone calls automatically, in a fashion well known in the art; and is preprogrammed to process data received via said network, 262. Each time the stockbroker who represents the subscriber of the station of microcomputer, 205, executes a transaction (that is, buys or sells stocks) for said subscriber's account, a computer at said broker's office station telephones microcomputer, 205; inputs data of the transaction (which data includes, for example, the identity of the company whose shares were traded, the number of shares bought or sold, and whether the transaction was a buy or a sale); and causes microcomputer, 205, to updates its stock portfolio records in a predetermined fashion (for example, by adding to said records data of shares bought and removing data of shares sold). In so doing, said office station computer causes an up-to-date record of the identity of the stocks and number of shares in the subscriber portfolio automatically to exist at microcomputer, 205. (While a time lag may exist between the actual purchase or sale and the updating at microcomputer, 205, said updating always occurs before 4:30 PM on the day of sale or purchase.)

Each weekday after 4:30 PM, a remote stock-price-data-transmission station transmits all closing stock price data applicable that day and causes apparatus at each subscriber station, in a predetermined fashion, to select and record at the microcomputer, 205, of said station the particular closing price datum or data that apply to the particular stock or stocks of the preprogrammed portfolio of said computer. (Said remote station transmits said closing stock price data and causes specific subscriber stations to select and process their specific information of interest in the fashion in which remote news-service-A station transmitted the AT&T news item and caused selected stations to select and process, in their specific fashions, the information of said item.) Alternatively, microcomputer, 205, is caused in a predetermined fashion (for example, by a SPAM message a given transmission monitored by signal processor, 200, in any of the above described fashions) automatically to telephone a remote data service computer, by means of network, 262, in a fashion well known in the art, and to cause said remote computer to select and transmit the particular closing price datum or data of the stock or stocks of the portfolio of said microcomputer, 205, thereby causing said microcomputer, 205, to record said datum or data in a predetermined fashion.

In this fashion, by a particular time (for example, 8:00 PM) on a particular Friday evening, the microcomputer, 205, of the station of FIG. 7 (and microcomputers, 205, similarly at each of a large plurality of other subscriber stations) has been updated and contains all relevant stock information.

Subsequently, but before the aforementioned 8:30 PM time (which is 8:30 PM, Eastern Standard Time on said Friday evening and is the time when so-called "live" transmission of the "Wall Street Week" program commences), the program originating studio that originates transmission of the "Wall Street Week" program transmits the aforementioned Prepare-To-Retransmit-WSW message, 1st-WSW-program-enabling-message (#7), 1st-WSW-decryption-check (#7), eight SPAM messages each of which is called a "2nd-WSW-program-enabling-message (#7)", and 2nd-WSW-decryption-check (#7). In so doing, said studio causes a plurality of intermediate transmission stations that are preprogrammed and function in the fashion of the station of FIG. 6 and a plurality of subscriber stations that are preprogrammed and function in the fashion of the station of FIGS. 7 (and 7C) to cause apparatus at each of said subscriber stations to interconnect, receive information of said transmission, decrypt said information, and prepare to display (or otherwise output) information of said "Wall Street Week" program in the fashions of example #7 and of the above description called "MORE ON EXAMPLE #7".

(To accomplish all this has required only that the subscriber of microcomputer, 205, [and other subscribers at other stations] cause the installation and connection of the apparatus shown in the figures of this submission, especially FIGS. 7 (and 7C); caused his microcomputer, 205, to be preprogrammed as described above; and preinformed microcomputer, 205, of his wish to view said "Wall Street Week" program by causing the aforementioned select-WSW information to be recorded at said microcomputer, 205.)

Then the combined medium combining process described above in "One Combined Medium" and in examples #1, #2, #3, #4, etc. commences. And the FIG. 1C combining is displayed.

But the combining of FIG. 1C is just part of a larger process.

When the "Wall Street Week" transmission begins at 8:30 PM on a Friday evening, the program instruction set in the first message of the "Wall Street Week" example instructs microcomputer, 205, to generate not one but a plurality overlays. The combining of FIG. 1C is merely the first.

Computer operations take time and some computers are slower than others. Partly this is a question of hardware; a so-called eight bit microprocessor is generally slower performing a given operation than a sixteen bit processor for reasons that are well known in the art. But even with precisely the same hardware and systems software, two computers can take different times to complete a given operation if only because they contain different data. For example, it takes longer to calculate the value of a portfolio containing one thousand stocks than a portfolio of one. Furthermore, it is undesirable to separate computer operations merely because they result in the generation of separate overlays because such separation may result in unnecessary duplication of calculations. For example, the FIG. 1C display of user specific overall stock portfolio performance could be followed by second and third displays that analyze portions of the subscriber's portfolio—eg., the portion invested in New York Stock Exchange listed stocks in comparison to the so-called "NYSE" index and the portion invested in so-called "over-the-counter" stocks in comparison to the so-called "NASDAQ" index. In order to calculate the value of the overall portfolio, it is necessary to calculate the value of these portions. To require that the values of the portions be recalculated for subsequent overlays would be inefficient.

In computer-based combined medium communications, the amount of information that a given system can convey is dependent on the efficiency of the employment of program instruction sets and combining synch commands.

In the preferred embodiment, unlike conventional television where information is presented strictly in the sequence of its transmission, the transmission and execution of program instruction set information for second (or subsequent) overlays can precede the transmission of the combining synch command of first overlays and the time of first overlay ceasings. To minimize waiting time, the controllers, 39, of decoders, 203, (or analogous controllers, 44 or 47, of analogous radio decoders of FIG. 2C of other decoders of FIG. 2D that execute SPAM message information at a microcomputer, 205) combining synch commands that cause combining or the ceasing of combining (as, for example, the commands of the second and third messages of the "Wall Street Week" example) are processed as interrupts to the CPUs of microcomputers, 205; program instruction sets, once executed, instruct microcomputers, 205, to wait only when further processing, under the control of the instructions of said sets, would entail overwriting RAM information whose overlay time or processing time has not yet ended. And to prevent microcomputers, 205, that fall behind from displaying incomplete overlays, any given SPAM message that causes a combining specifies the identity of the particular overlay information whose combining it causes and causes a combining only at subscriber station where information exists of the completion of the identified overlay. For example, receiving the second message of the "Wall Street Week" program causes the combining of FIG. 1A information and FIG. 1B information only at stations where information at the aforementioned SPAM-first-precondition and SPAM-second-precondition register memories matches selected information of the meter-monitor segment of said message.

Finally, in order to cause microcomputers, 205, that fall behind to catch up, a particular fashion exists in the preferred embodiment for restoring efficient operations. Microcomputers, 205, that fall behind are caused to jump over and avoid executing instructions that control the generating of overlay information (such as FIG. 1A) whose overlay time (that is, combining time) has passed. In a fashion well known in the art, selected so-called "lines of code" of program instruction sets are preprogrammed with label information that identifies each one of said line, and the instructions of said set periodically compare preprogrammed information of said set to information at particular overlay-target RAM memory in order to control efficient operation in a fashion described more fully below. When a combining fails to occur at any given station because information of the completion of an identified overlay does not exist at said station, the controller, 203, of said station automatically causes the microcomputer, 205, to so-called "jump", in a jump fashion well known in the art, to that selected one of said lines of code where the instructions of said program instruction set commence causing the generation of the information of that particular overlay that is next to be combined. For example, at the start of the "Wall Street Week" example, information of "00000000" exists at the SPAM-second-precondition register memories of the decoders, 203, of every subscriber station. The overlay of FIG. 1A is the first overlay of the "Wall Street Week" program, and the information of the meter-monitor field of the second message of said example identifies said overlay with binary information of "00000001". The next overlay of said program, which is the second overlay, is identified with information of "00000010". Receiving said second message causes the decoders, 203, at each subscriber station to compare information at said SPAM-second-precondition register memories to the "00000001" information of the overlay number field of said message. At those stations that have completed generating at RAM the information of said first overlay (eg., FIG. 1A), the instructions of the program instruction set of said example have caused information of "00000001" to be placed at said SPAM-second-precondition memories. At said stations, matches result and cause the combining of locally generated overlay information (eg., FIG. 1A) with the transmitted FIG. 1B information and cause the display of combined medium information (eg., FIG. 1C). At other stations that have not completed generating at RAM the information of said first overlay (eg., FIG. 1A), matches do not result, causing the controllers, 39, of the decoders, 203, of said stations to execute the aforementioned particular second-condition-test-failed instructions of the aforementioned conditional-overlay-at-205 instructions. Executing said second-condition-test-failed instructions causes each of said controllers, 39, to compute a particular overlay-target number; to interrupt the operation of the CPU of the microcomputer, 205, of its station; to cause said CPU to place information of said overlay-target number at particular overlay-target RAM memory; to cause said CPU to execute a so-called "machine language jump" to the particular so-called "offset address" of the information at RAM of said program instruction set that is associated, in the predetermined fashion of the instructions of said set, with said overlay-target number; and to cause said microcomputer, 205, to continue executing the instructions of said set from the instruction at said address. In so doing, said microcomputer, 205, can skip over and avoid executing instructions whose overlay time has passed.

The particular overlay-target number that any given controller, 39, calculates, under control of said second-condition-test-failed instructions, is a function of the overlay number information of the SPAM message that invokes said conditional-overlay-at-205 instructions and is also a function of the history of the efficiency of the operation of the microcomputer, 205, of the subscriber station of said controller, 39, at the time when said instructions are invoked. In the case the second message of the "Wall Street Week" example, the overlay that said message causes to be combined is the first overlay generated under control of the program instruction set that generates said overlay. Accordingly, the information recorded, in a predetermined fashion, at particular history-of-efficiency memory at each controller, 39, of a decoder, 203, of said other stations (that have not completed generating the information of said first overlay at the time of receiving said second message) is "00000000" and indicates that said microcomputer, 205, has not failed to generate any overlay, generated under control of said set, on time. Thus when receiving said second message at said other stations causes the execution of said second-condition-test-failed instructions, said instructions cause said controllers, 39, to increment by one the overlay number information of said message, thereby generating overlay-target information of "00000010"; to cause the microcomputers, 205, of said stations to place information of said "00000010" at said overlay-target RAM memory; to cause said microcomputers, 205, to jump to and continue executing the instructions of said program instruction set at the instruction at the particular preprogrammed "offset address" of the particular line of code of said set that is identified by the particular label associated, in a predetermined fashion, with said "00000010"; and to increment by one the information at said history-of-efficiency memory, thereby generating history-of-efficiency information of "00000001" which indicates that said microcomputer, 205, has failed to generate one overlay, generated under control of said set, on time. Thereafter, whenever receiving a SPAM message of said "Wall Street Week" program causes a controller, 39, of said other stations to execute said second-condition-test-failed instructions, said instructions cause said controller, 39, to compute its overlay-target number by incrementing the overlay number information of said message by more than one and to cause the microcomputer, 205, of its station to restore efficiency by skipping over instructions that cause the generation of more than one overlay (including one or more overlays whose overlay time has not yet come). As said microcomputer, 205, generates the information of the overlay that is identified by said overlay-target number, the instructions of said set cause said microcomputer, 205, in a predetermined fashion that involves comparing preprogrammed particular overlay-being-generated information of said set to information at said overlay-target RAM memory, to identify particular instructions of said set that control just the generation of said one or more overlays whose overlay time has not yet come and to jump over and avoid executing said instructions, thereby executing only those instructions that control generation of information of said identified overlay (or of overlays whose overlay time follows the overlay time of said identified overlay). In so doing, said microcomputer, 205, can skip over and avoid executing selected instructions whose overlay time has not passed in order to catch up and recommence combining at an overlay time that is after the overlay time of the overlay or overlays whose generation is controlled by said selected instructions.

Thus transmitting to a plurality of subscriber stations any given SPAM message that invokes said conditional-overlay-at-205 instructions causes apparatus at selected ones of said stations to combine locally generated overlay information (eg., FIG. 1A) with transmitted information (eg., FIG. 1B) and to cause the display of combined medium information (eg., FIG. 1C) and causes apparatus at selected other stations to generate information of overlays whose combining is not caused by receiving said message (because the overlay times of said overlays is subsequent to the overlay time of said locally generated overlay information [eg., FIG. 1A] whose combining is caused by said message). Furthermore, transmitting said messages causes the apparatus at said selected other stations to generate information of overlays in such a way that each station generates information of an overlay that has a specific overlay time and the specific overlay time of the overlays generated at specific station varies from station to station and is different at different stations.

Transmitting and Receiving Program Instruction Sets

In television, the normal transmission location is in the vertical interval of the television transmission. SPAM signals are not normally transmitted in the visible portion of the television picture because the information of said signals can be seen by viewers (often as so-called "snow"). However, the transmission capacity of the vertical interval is limited.

In computer-based combined medium communications, the amount of locally generated information that any given system can display (or otherwise output) to subscribers is dependent on maximizing the volume of program instruction set instructions that said system can transmit and maximizing the time interval between the transmission (more precisely, the execution) of the instructions of any given program instruction set and the overlay times of the individual locally generated overlays whose generation said instructions cause. The greater the volume of program instruction set information that is transmitted in any given combined medium program, the greater is the amount of overlay information can be generated at subscriber stations. And the earlier said information is transmitted in said program, the greater is the efficiency with which generating is controlled at subscriber stations (because the longest possible time intervals can separate the commencement of the generating of the information of individual overlays and the individual overlay times of said overlays).

In the preferred embodiment, the program instruction set information of any given combined medium program is transmitted as soon as possible after commencement of said program, and the present invention includes means and methods to maximize the transmission of program instruction set information at the start of combined medium programs. (As related above, in the preferred embodiment, all SPAM commands are transmitted in the normal transmission location of any given transmission.)

In the video/computer combined medium, capacity is found by transmitting said sets in portions of the television picture that are covered by locally generated overlays (which in digital television transmissions can include frames of transmitted video that are "frozen" after reception in fashions well known in the art). One controlled function that is preprogrammed at the controllers, 39, of the decoders, 203, of subscriber stations and that is caused to be executed by receiving a SPAM message containing expand-to-full-field-search execution segment information is a function whose instructions cause said controller, 39, to cause the line receivers, 33, of said decoders, 203, to commence detecting digital information in every frame of its received video information from the first detectable portion of line 20 of said frame to the last detectable portion of the last line of said frame. A second controlled function that is preprogrammed at said controllers, 39, and that is caused to be executed by receiving a SPAM message containing resume-normal-location-search execution segment information is a function whose instructions cause said controller, 39, to cause said line receivers, 33, to commence detecting digital information in the normal transmission location of every frame of its received video information.

An example illustrates transmitting program instruction set information in a portion of the television picture that is normally visible but that is temporarily covered by an overlay. In the example, the program originating studio that originates a given program causes each subscriber station to generate information of the so-called "titles" of said program (that is, the textual information listing the title said program, the names of the cast and crew members, etc.), causes said locally generated information to overlay and obscure completely the transmitted video information of said program, and transmits program instruction set information in the full field video of the transmission so obscured (that is, in every frame of the transmitted video information from the first detectable portion of line 20 of said frame to the last detectable portion of the last line of said frame).

The decoder, 203, of the station of FIGS. 7 and 7C (and the decoder, 203, of every other subscriber station tuned to said program) is preprogrammed to respond to SPAM messages containing expand-to-full-field-search execution segment information and resume-normal-location-search information and responsively to alter automatically the portions of its received video information that are searched for embedded digital information.

At the start of the conventional television information of said program, said program originating studio embeds a SPAM message that contains the execution segment information that is identical to the execution segment information of the first message of the "Wall Street Week" example and information segment information of a particular set-to-color program instruction set. Receiving said message causes apparatus at each station, in the fashions described above, to execute the information of said set; to clear the video RAM of the microcomputer, 205, of said station; and to set all of said RAM, in a fashion well known in the art, to an opaque background color such as light blue.

Next said program originating studio embeds a SPAM message that contains the execution segment information that is identical to the execution segment information of the second message of the "Wall Street Week" example. Receiving said message causes said apparatus to combine the overlay information of said video RAM and the transmitted video and to continue executing the instructions of said first set. In so doing, said apparatus causes said transmitted video to be covered and obscured completely by said opaque background color.

Then said studio embeds a SPAM message that contains one instance of said expand-to-full-field-search execution segment information. Receiving said message causes apparatus at each station to cause the line receiver, 33, of the decoder, 203, of said station to commence detecting digital information in every frame of its received video information from the first detectable portion of line 20 of said frame to the last detectable portion of the last line of said frame.

Then said studio embeds in the full field video and transmits a SPAM message that contains said execute-at-205 execution segment information and information segment information of a particular titles-of-this-program program instruction set. Receiving said message causes apparatus at each station to execute the information of said set at the microcomputer, 205, of said station. So executing said information causes said microcomputer, 205, to commence generating at said RAM, in a fashion well known in the art, the image information of a so-called "crawl" of said titles. In so doing, said studio causes said microcomputer, 205, to display the information of said titles at the monitor, 202M, of said station. (Simultaneously, a microcomputer, 205, at every other subscriber station executes the same information and displays the same titles, and said studio transmits audio information of appropriate so-called "program theme music," causing apparatus at each station to emit the sound of said music.)

Then said studio embeds in the full field video and transmits a particular program-instruction-set-of-this-program SPAM message that contains particular record-at-256 execution segment information and information segment information of a particular generate-overlays-of-this-program program instruction set.

Receiving said message causes apparatus at each station to transfer the information of said message to the computer memory unit, 256, of said station (which is shown in FIG. 7 and is, for the purposes of this example, a floppy disk drive of microcomputer, 205, that is labelled drive "C:" by said microcomputer, 205, and that is capable of receiving and recording information independently of said microcomputer, 205), and receiving said message causes said unit, 256, to record said program instruction set. Automatically, the controller, 39, of said decoder, 203, causes the control processor, 20A, of said station to establish a control information communication link, via matrix switch, 259, with the controller, 20, of the signal processor, 200; transmits particular instructions to said controller, 20, that cause said controller, 20, to establish a programming information communication link, via matrix switch, 258, with said computer memory unit, 256; and transmits said message, via said matrix switch, 258, to a SPAM decoder, 256A, at said unit, 256. Automatically, said decoder, 256A, receives said message; invokes particular preprogrammed controlled function instructions; causes said unit, 256, to record inputted information in a particular file, "OVERLAYS.EXE"; and inputs the information of said program instruction set to said unit, 256, in the fashion that decoder, 203, inputs the information of the information segment of the first message of the "Wall Street Week" example to microcomputer, 205, thereby causing said unit, 256, to record the information of said set in said file. (Simultaneously, other computer memory units, 256, that are labelled drive "C:" of the microcomputers, 205, of other stations record the information of said set as "OVERLAYS.EXE".)

Then said studio embeds a SPAM message that contains one instance of said resume-normal-location-search execution segment information. Receiving said message causes apparatus at each station to cause the line receiver, 33, of the decoder, 203, of said station to commence detecting digital information in just the normal transmission location of every frame of its received video information.

Then said studio commences transmitting conventional television video image information and embeds and transmits a SPAM message that that is identical to the third message of the "Wall Street Week" example. Receiving said message causes apparatus of said station (and similar apparatus at every other station) to cease combining the overlay information of said video RAM and the transmitted video and to cause the display of only the transmitted video information at said monitor, 202M. In so doing, said studio causes each station to cease displaying the locally generated information of said "titles" and to commence displaying the information of said conventional television video image.

Then said studio embeds a SPAM message that contains execution segment information that is identical to the execution segment information of the first message of the "Wall Street Week" example and information segment information of a particular "C:OVERLAYS". Receiving said message causes apparatus at each station to input the information of said "C:OVERLAYS" to the microcomputer, 205, of said station and execute said information. Executing said information causes said microcomputer, 205, to load from its C: drive (which is said unit, 256) the information of said OVERLAYS.EXE file and execute the information so loaded as a machine language job.

In this fashion, a program originating studio can transmit information of a program instruction set to a multiplicity of subscriber stations in the full field video of its video transmission and execute the information so transmitted at the microcomputer, 205, of each of said stations as a machine language job without having a viewer of any station view any information of said set at a monitor, 202M.

(To minimize the risk that program instruction sets may become separated from their associated television programming, said sets are normally embedded in their associated television transmissions. But it is not an absolute requirement of the preferred embodiment that all program instruction sets be so embedded. If the volume of program instruction set information that a given programming transmission must transmit exceeds the transmission capacity of said transmission [eg., if the audience includes viewers who do not have overlay capacity and would see "snow" were set information transmitted in portions of the transmission obscured by overlays], at the proper time transmission stations can transmit said set information outside the conventional transmission [a program originating studio may transmit said set information, for example, in a satellite side lobe of the transponder transmission transmitting the conventional transmission, and a cable head end intermediate transmission station transmits it in a separate television channel or in a transmission in a multiplexed FM frequency spectrum transmission].)

Audio Overlays and Other Overlays

In the present invention, many combinings are caused and controlled besides combinings of video overlay information (such as FIG. 1A) and transmitted television image information (such as FIG. 1B). SPAM messages cause user specific audio to be combined with transmitted radio or television audio information and emitted as sound at subscriber stations. SPAM messages insert user specific print into broadcast print. And SPAM messages insert user specific data into data communications.

FIG. 7D illustrates a radio/computer combined medium. Radio tuner, 209T, receives a conventional radio broadcast transmission. Divider, 209D, splits the received transmission into two paths and transmits one to microcomputer, 205, and the other to radio decoder, 211, (where the received transmission is inputted to the radio decoder, 42, component). Decoder, 211, detects embedded digital SPAM information; corrects and converts said information; processes said information at the control processor, 44J, of its controller, 44; and inputs selected SPAM information to microcomputer, 205. Microcomputer, 205, has installed capacity to receive an inputted audio transmission; capacity to receive control information and SPAM program instruction set information from said controller, 44; to generate and enter information into audio RAM; to combine audio overlay programming, by means of audio synthesizing techniques and overlay techniques well known in the art, into the received audio transmission; and to transmit the combined audio to speaker system, 263, which has capacity, well known in the art, to convert the received audio into sound.

An example illustrates the operation of the subscriber station of FIGS. 7 and 7D.

A radio station transmits radio programming at 9:00 PM, immediately following the time at which said "Wall Street Week" program ends. At each subscriber station, the stock portfolio and closing price data are recorded precisely as at the start of said "Wall Street Week" program. In the normal transmission location of the radio transmission of said programming, said station embeds and transmits particular SPAM information.

At the station of FIGS. 7 and 7D, the transmission of said station is received at tuner, 209T, and inputted to divider, 209D, which inputs the received radio transmission separately to decoder, 211, and to microcomputer, 205. Receiving said transmission causes decoder, 211, to detect the SPAM information embedded in said transmission and to input information of said SPAM information to microcomputer, 205, which is preprogrammed to process said inputted information. And receiving said transmission causes microcomputer, 205, to input said transmission to speaker system, 263, which is caused thereby to emit sound.

In due course, said radio station embeds a SPAM message that is analogous to the first message of the "Wall Street Week" example. Receiving information of said message causes microcomputer, 205, to record at RAM the digital audio images of three statements made and prerecorded by an announcer—"And the value of your portfolio went up more than the market", "And your portfolio went up but no faster than the market", and "But the value of your portfolio went down"—to compute a first value of the subscriber's portfolio as of the close of business of the day before said transmission; to compute a second value of the subscriber's portfolio as of the close of business of the day of said transmission; to determine that said first value is greater than said second value; to clear audio RAM in a clearing fashion well known in the art; to select information of the audio image, "But the value of your portfolio went down", in a predetermined fashion; and to transfer said selected information to audio RAM. (Receiving said message causes apparatus of other station to function in their own user specific fashions.)

Simultaneously, the audible audio portion of said radio transmission has conveys information of the announcer's voice describing the activity of the stock market and saying, "Stock prices rose today in heavy trading."

Then said radio station transmits an interval of silent audio and embeds, at the beginning of said interval, a SPAM command that causes microcomputer, 205, to generate the synthesized audio of one instance of the image at said audio RAM, to overlay said audio into the transmitted audio, and to transmit the combined audio to speaker system, 263. In so doing, said station causes system, 263, to emit the sound of the announcer's voice saying, "But the value of your stock portfolio went down." (Simultaneously, receiving said message causes apparatus every other station receiving said radio transmission its one selected one of said three statements.)

After an interval of transmitting silent audio that is longer than the longest time required to cause any given subscriber station speaker system, 263, to emit the sound of one of said selected audio images completely, said radio station transmits the audio of said announcer's voice saying, "Now let us turn to the bond markets."

(A broadcast print and computer combined medium subscriber station operates in a similar fashion and is configured similarly to the apparatus of FIG. 7D [except that said station has no divider apparatus analogous to divider, 209D]. Said station has receiver apparatus analogous to radio, 209T; appropriate decoder apparatus that may consist of the digital detector, 46, and controller, 47, of the other decoder of FIG. 2C; a microcomputer, 205; and a printer, 221, instead of speaker system, 263. Said receiver apparatus receives the broadcast print transmission of a broadcast print transmission station and inputs said transmission to said decoder apparatus. Said decoder detects digital information in the inputted transmission; processes SPAM information in the detected digital information; and inputs selected digital information to the CPU of said microcomputer, 205, or transfers other selected digital information to a buffer at microcomputer, 205, that is an input buffer to said printer, 221. In operation, the apparatus of said station receives, transfers to printer, 221, and prints the digital information of a SPAM message information segment [which information conveys stock market information and ends with information that is printed as, "Stock prices rose today in heavy trading,"]. Then the decoder of said station detects a SPAM end of file signal and a subsequent SPAM message. Receiving said subsequent message causes said decoder to input information of said message to said CPU. Receiving said information at said CPU causes microcomputer, 205, to receive digital information of three alternate print messages; to compute a first value of the portfolio of the subscriber of said station as of the close of business of the day before said transmission; to compute a second value of the subscriber's portfolio as of the close of business of the day of said transmission; to determine that said first value is greater than said second value; and to transfer to said printer, 221, selected digital information of the print message, "but the value of your portfolio went down." In so doing, said microcomputer, 205, causes said printer, 221, to print the information of said selected print message. Then the decoder of said station detects a SPAM end of file signal and a subsequent SPAM message. Receiving said subsequent message causes said decoder to input information of said message to printer, 221, and causes printer, 221, to initiate a new print paragraph and commence printing information of the information segment of said last named message, beginning with, "Now let us turn to the bond markets." [Simultaneously, the transmission received at said station is also received at other similar stations and causes apparatus at said other stations to print general message information with user specific information. For example:

> Stock prices rose today in heavy trading, and the value of your portfolio went up more than the market.
>
> Now let us turn to the bond markets.

is printed at a particular other station where the computations of a microcomputer, 205, determine that the value of the portfolio of said last named station's subscriber increased at a faster rate than the rate of increase of a particular market average.])

Figure 7E:
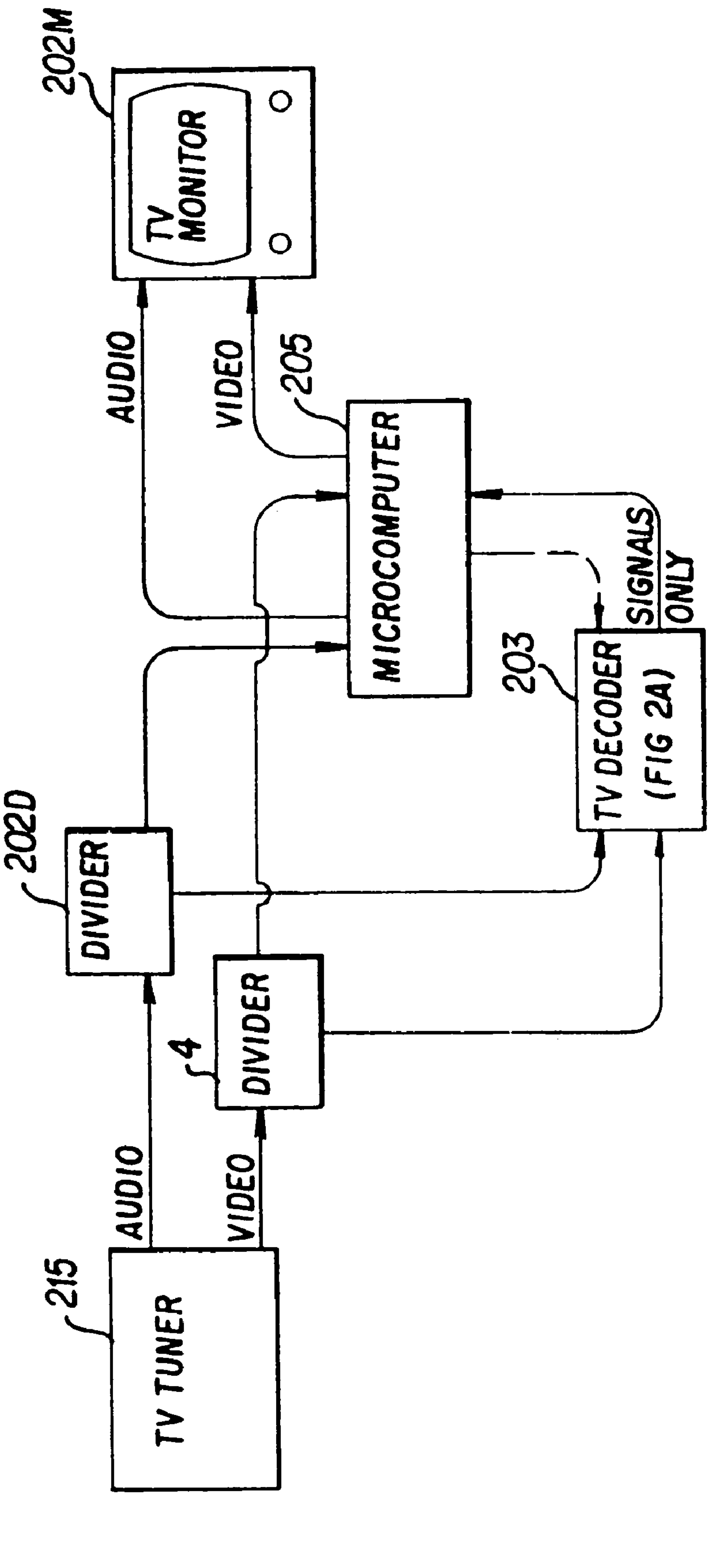
FIG. 7E is a block diagram of a television/computer combined medium receiver station.

FIG. 7E shows how the audio system of FIG. 7D is added to the video system of FIG. 1 to achieve the full combined medium of television and computers. To the apparatus of FIG. 1, a divider, 202D, is added in the audio transmission path which splits the transmission into two paths and transmits one to the appropriate audio processing apparatus of TV decoder, 203, and the other to microcomputer, 205, at particular apparatus, well known in the art, that has capacity for combining computer synthesized audio into the transmitted audio and that inputs its received audio information to monitor, 202M. Microcomputer, 205, has audio RAM and audio synthesizing and combining capacities. Using precisely the same methods whereby the apparatus of FIG. 7D is caused to input audio information (including user specific audio information) to speaker system, 263, (causing said system, 263, to emit the sound of the voice of the radio announcer as described above), the apparatus of the station of FIG. 7E can be caused to input audio information (including user specific audio information) to the speaker of monitor, 202M, (causing said speaker to emit the sound of the voice of an announcer making the above audio statements). The only difference between the systems of FIGS. 7D and 7E is that SPAM information of the audio of FIG. 7E is transmitted, in the preferred embodiment, in the normal transmission location of television (which means that said information is embedded in the video rather than the audio).

Automating U. R. Stations

Examples #9 and #10

Continued Coordinating Computers, Television, and Print

Figure 7F:
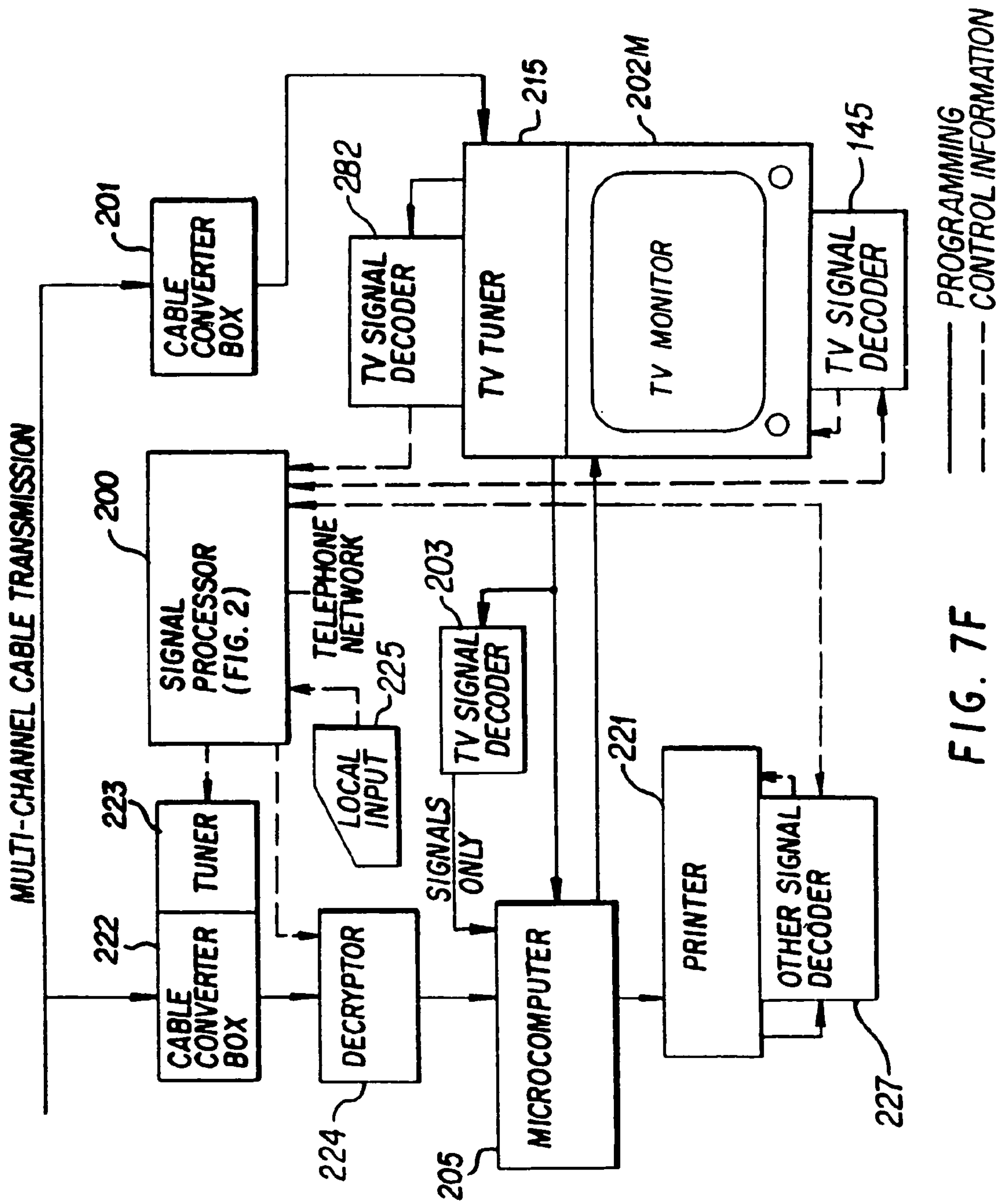
FIG. 7F is a block diagram of an example of controlling television and print combined media.

FIG. 7F illustrates a method for generating and communicating information to selected subscribers through the coordination of computers, television, and broadcast print. FIG. 7F also illustrates use of a local input, 225.

The microcomputer, 205, of the station of FIGS. 7 and 7F, is preprogrammed to receive and process automatically meal recipe instructions and holds records of the size of the family of the subscriber of said station together with the tastes and dietary habits of the members of said family. For example, particular information is recorded in a file named DATA_OF.URS that is on a so-called "floppy disk" that is loaded at the A: disk drive at said microcomputer, 205. Said information specifies that said family prefers particular very hot and spicy foods, prefers to minimize salt consumption, and consists of four adults.

(Simultaneously, a particular second microcomputer, 205, that is at the different station of a second subscriber and is also preprogrammed to receive and process automatically meal recipe instructions, holds information in a file named DATA_OF.URS on a floppy disk that is loaded at its A: disk drive which information specifies that the family of said second subscriber prefers particular mild foods, is indifferent regarding salt consumption, and consists of two adults. And a particular third microcomputer, 205, that is at another different station of a third subscriber and that is also preprogrammed to receive and process automatically meal recipe instructions, holds information in a file named DATA_OF.URS on a floppy disk that is loaded at its A: disk drive which information specifies that the family of said third subscriber prefers particular moderately hot and spicy foods, is indifferent regarding salt consumption, and consists of two adults and three children.)

The program originating studio of a particular network transmits the programming transmission of a particular conventional television program on cooking techniques that is called "Exotic Meals of India." Said transmission is received at the intermediate transmission station of FIG. 6 and retransmitted immediately on the cable channel of modulator, 83. (Said transmission is also received at the aforementioned second intermediate transmission station of example #10 and retransmitted immediately.)

At the station of FIGS. 7 and 7F (which station is a subscriber station of the intermediate station of FIG. 6), in the fashions described above, apparatus is caused to receive the particular transmission of said program that is retransmitted by the intermediate station of FIG. 6; to interconnect in such a way that the audio information received at a tuner, 215, and the video information received at said tuner, 215, are inputted separately, via matrix switch, 258, to monitor, 202M; to retain and process meter and monitor information of the use and usage of the information of said transmission, and to display the television information of said transmission (that is, information of said audio and video) at monitor, 202M. (In other words, because said "Exotic Meals of India" programming is conventional television programming rather than combined medium programming, no information of said programming is inputted to microcomputer, 205, and no programming outputted by microcomputer, 205, is inputted to monitor, 202M.)

(Simultaneously and in the same fashion, apparatus of the station of said second subscriber [which station is a subscriber station of the intermediate station of FIG. 6] receives, interconnects, meters and monitors, and displays at a monitor, 202M, the information of said transmission. And apparatus of the station of said third subscriber [which station is a subscriber station of said second intermediate station] also receives, interconnects, meters and monitors, and displays at a monitor, 202M, the information of the transmission of said program that is transmitted by said second intermediate station.)

The program is devoted to the subject of cooking a particular fish curry that can be mild or moderately hot and spicy or, as a vindaloo, very hot and spicy.

Halfway through the program the host says, "If you are interested in cooking what we are preparing here and want a your own printed copy of the recipe tailored to your own tastes and your own shopping list for a charge of only 10 cents, enter on your Widget Signal Generator and Local Input the information that you see on your screen." The information that appears on the screen of each subscriber is "TV567#".

Each subscriber—in particular, the subscriber of the station of FIGS. 7 and 7F, said second subscriber, and said third subscriber—enters TV567#, in a fashion well known in the art, at the keyboard of the specific local input, 225, of his own station which causes said input, 225, to transmit a particular preprogrammed process-local-input instruction and said TV567# information to the controller, 20, of the signal processor, 200, of said station.

Receiving said instruction and information causes the controller, 20, at each station where TV567# is entered, in a predetermined fashion, to retain said TV567# information at particular last-local-input-# memory.

Five minutes later, said program originating studio embeds in the transmission of the "Exotic Meals of India" programming and transmits a particular first SPAM message that consists of an "01" header, particular execution segment information that is addressed to URS signal processors, 200, appropriate meter-monitor information, padding bits as required, an information segment of particular check-for-entered-information-and-process instructions, and an end of file signal.

At the station of FIGS. 7 and 7F, said message is detected at TV signal decoder, 145, and said execution segment information invokes particular controlled function instructions that cause said message to be transferred to the controller, 20, of signal processor, 200. Automatically, the controller, 39, of decoder, 145, transmits particular switching request information to the control processor, 20A, of signal processor, 200, via the aforementioned control information bus means. Receiving said information causes control processor, 20A, to cause matrix switch, 259, to establish a communications link between said controller, 39, and said controller, 20. Automatically, said controller, 39, transfers said message to said controller, 20.

Receiving said message causes controller, 20, to load and execute said check-for-entered-information-and-process instructions, and executing said instructions causes controller, 20, to determine that TV567# information exists at said last-local-input-# memory and to cause an instance of particular covert control information (which is preprogrammed in said instructions) to be placed at particular control-function-invoking information memory of the controller, 39, of decoder, 145, and also at particular control-function-invoking information memory of the controller, 39, of decoder, 203. Executing said instructions also causes controller, 20, to initiate a particular signal record of meter information at the buffer, 14, of signal processor, 200, which record contains particular program unit information and TV567# information. (At stations where TV567# information does not exist at last-local-input-# memory of the controllers, 20, said instructions cause said controllers, 20, to cease executing and delete all information of said instructions without placing any information at the decoders, 145 and 203, or initiating any meter information.)

(Receiving said first message at the stations of said second and said third subscribers causes apparatus of said station to function in the fashion of the station of FIGS. 7 and 7F.)

One minute later, said program originating studio embeds in the transmission of said "Exotic Meals of India" programming and transmits a particular second SPAM message that consists of an "01" header, particular execution segment information that is identical to said covert control information, appropriate meter-monitor information including unit code identification information that identifies the programming of the information segment of said message, padding bits as required, information segment of particular generate-recipe-and-shopping-list instructions, and an end of file signal.

At the station of FIGS. 7 and 7F, said message is detected at TV signal decoder, 145, and said execution segment information invokes particular controlled function instructions that cause said message to be transferred to the controller, 39, of decoder, 203. Automatically, the controller, 39, of decoder, 145, transmits particular switching request information to the control processor, 20A, of signal processor, 200, via the aforementioned control information bus means. Receiving said information causes control processor, 20A, to cause matrix switch, 259, to establish a communications link between the controller, 39, of decoder, 145, and the controller, 39, of decoder, 203. Automatically, said controller, 39, of decoder, 145, transfers said message to the controller, 39, of decoder, 203.

Receiving said message causes the controller, 39, of decoder, 203, to load and execute said generate-recipe-and-shopping-list instructions at microcomputer, 205, and to transfer particular meter-monitor information to the buffer/comparator, 14, of signal processor, 200, causing said buffer/comparator, 14, to increment the information of said signal record of meter information in the fashion described above.

Executing said generate-recipe-and-shopping-list instructions causes microcomputer, 205, to generate information of the specific fish curry recipe and fish curry shopping list of the family of the subscriber of the station of FIGS. 7 and 7F; to cause said recipe and shopping list to be printed at printer, 221; and to retain information of said shopping list at particular memory. Automatically, microcomputer, 205, accesses its A:DATA_OF.URS file, in a fashion well known in the art, and selects the aforementioned information that specifies the size of the family of the subscriber of said station together with the tastes and dietary habits of the members of said family; determines that one ingredient of the recipe of said family is "Patak's low-salt Vindaloo Curry Paste" (because said family prefers particular very hot and spicy foods and prefers to minimize salt consumption); computes that, at one-half pound of halibut fish and one teaspoonful of said Vindaloo Paste per adult, the recipe of said family (which is of four adults) calls for two pounds of halibut and four teaspoonfuls of said Paste and that the shopping list of said family lists two pounds of halibut and one jar of "Patak's low-salt Vindaloo Curry Paste"; incorporates information of said two pounds and four teaspoonfuls of "Patak's low-salt Vindaloo Curry Paste" into generally applicable information of the recipe of said "Exotic Meals of India" programming and information of said two pounds and one jar of "Patak's low-salt Vindaloo Curry Paste" into generally applicable information of the shopping list of said programming, thereby generating (through the processes of so determining, computing, and incorporating) output information of the specific recipe and shopping list of said family; records one instance of the output of said shopping list at particular shopping-list memory; and outputs output information of said specific recipe and list to printer, 221.

Receiving said output information causes printer, 221, to print the information of said specific recipe and list.

(Receiving said second message at the stations of said second and said third subscribers causes apparatus of said station to function in the fashion of the station of FIGS. 7 and 7F except that the specific recipe and list information processed, recorded, outputted, and printed at said stations are the specific recipes and lists of the families of said subscribers. The microcomputer, 205, of the station of said second subscriber determines that one ingredient of the recipe of said family is "Patak's Quick Curry Paste (Mild)" (because said family prefers particular mild foods and is indifferent regarding salt consumption); computes that the recipe of said family (which is of two adults) calls for one pound of halibut and two teaspoonfuls of said Paste and that the shopping list of said family lists one pound of halibut and one jar of "Patak's Quick Curry Paste (Mild)"; completes generating; records selectively at particular shopping-list memory; outputs; and causes to be printed output information of the specific recipe and shopping list of said family that reflects the one pound, two teaspoonfuls, and one jar of "Patak's Quick Curry Paste (Mild)" information so determined and computed. The microcomputer, 205, of the station of said third subscriber determines that one ingredient of the recipe of said family is "Patak's Quick Curry Paste (Hot)" (because said family prefers particular moderately hot and spicy foods and is indifferent regarding salt consumption); computes that, at one-half pound of halibut fish and one teaspoonful of said Paste per adult and at one-quarter pound of halibut fish and one-half teaspoonful of said Paste per child, the recipe of said family (which is of two adults and three children) calls for one and three-quarters pounds of halibut and three and one-half teaspoonfuls of said Paste and that the shopping list of said family lists one and three-quarters pounds of halibut and one jar of "Patak's Quick Curry Paste (Hot)"; completes generating; records selectively at particular shopping-list memory; outputs; and causes to be printed output information of the specific recipe and shopping list of said family that reflects the one and three-quarters pounds, three and one-half teaspoonfuls, and one jar of "Patak's Quick Curry Paste (Hot)" information so determined and computed.)

(At stations where TV567# information was not entered at a local input, 225, the decoders, 145, discard all information of said second message because the executions segment information of said message fails to match any controlled-function-invoking information, and receiving said message causes no further processing.)

One benefit of this method of transmitting the information of said generate-recipe-and-shopping-list instructions is that by causing said instructions to be embedded in the transmission of said "Exotic Meals of India" programming this method enables any subscriber who records the transmission of said programming at a recorder/player, 217, to access the embedded information of said instructions automatically in this fashion whenever the recorded transmission of said programming is played back—and in so doing, to cause the signal processor, 200, of his station to process meter-monitor information of said embedded first and second messages anew whenever TV567# is entered at a local input, 225, in the course of the play back of said transmission. However, this method has the drawback of making the information of said instructions relatively vulnerable to programming pirates (who may be able to manipulate and extract said information relatively easily without causing meter information to be transmitted to remote metering stations) because the embedded location of said instructions is relatively easy to find.

(An alternate method for inputting said second message to the microcomputers, 205, at stations where TV567# is entered at a local input, 225, is to embed said message in a particular second transmission that is different from the transmission of said "Exotic Meals of India" programming and to cause a selected All signal decoder, 290, at each one of said stations to receive said second transmission, thereby causing said decoder, 290, to detect and transfer the information of said second message to the microcomputer, 205, of said station. In this alternate method, executing said check-for-entered-information-and-process instructions of said first SPAM message causes controller, 20, of signal processor, 200, of each one of said stations to cause the tuner, 223, of a selected converter box, 222, to tune said box, 222, to receive said second transmission; to cause the matrix switch, 258, to establish a programming communication link between said selected converter box, 222, and said decoder, 290; to cause the appropriate receiver apparatus of said decoder, 290, to receive said transmission and the appropriate detector and EOFS valve, 39F, to commence detecting an end of file signal; and to cause an instance of particular covert control information that is in said instruction to be placed at particular control-function-invoking information memory of the controller, 39, of said decoder, 290. In due course, said programming originating studio causes the intermediate transmission station to embed an end of file signal then said second message in said second transmission. Transmitting said end of file signal then said second message causes the apparatus of said decoder, 290, to detect and process properly the information of said second message. This method has the advantage of making the information of said instructions relatively invulnerable to programming pirates because the location of said instructions [more precisely, the particular transmission in which said instructions are embedded] is harder to identify without causing meter information [if only of said first message] to be transmitted to remote metering stations.)

(Whichever transmission method is employed the information of said second message can be encrypted and caused to be decrypted in any of the methods described above—for example, in the method of the first message of example #4.)

Toward the end of the transmission of said "Exotic Meals of India" programming and after each microcomputer, 205, that processes the information of said second message records one instance of specific shopping list output information at particular shopping-list memory, said programming origination studio commences the example #10 transmission of the programming of the supermarket chain commercial of Q. While still transmitting said "Exotic Meals of India" programming, said studio embeds and transmits said load-set-information message (#10) in the transmission of said programming.

As described above, receiving said message causes intermediate transmission stations, including the station of FIG. 6 and said second intermediate transmission station, each to load the information of particular files, PROGRAM.EXE and DATA_OF.ITS, at particular program-set-to-transmit and data-set-to-transmit RAM memories of a computer, 73.

Then said studio ceases transmitting "Exotic Meals of India" programming for a so-called "commercial break" and commences transmitting the conventional television video and audio information of program unit Q.

Immediately after commencing to transmit said video and audio of Q, said studio transmits said align-URS-microcomputers-205 message (#10), embedded in the programming transmission of Q. Said message consists of a "10" header, and information of a particular SPAM align-subscriber-station-microcomputers-to-receive-combined-medium-computer-programming execution segment that is addressed to URS signal processors, 200, and any required padding bits.

Receiving said message at the station of FIGS. 7 and 7F causes TV signal decoder, 282, to detect said message and execute particular preprogrammed controlled function instructions that cause said decoder, 282, to cause a communications link to be established that links said decoder, 282, via matrix switch, 259, with the controller, 20, of signal processor, 200; to transfer said message to controller, 20; and to transfer particular preprogrammed source mark information that identifies said decoder, 282, as the local source inputting said message to controller, 20. (Decoder, 145, is not preprogrammed with controlled-function-invoking information that matches the execution segment information of said message, and decoder, 145, discards all information of said message.)

Receiving said message causes controller, 20, to combine microcomputer, 205, to the computer system of said program originating studio and to cause the video and audio output transmissions of microcomputer, 205, to be inputted to monitor, 202M. Automatically, controller, 20, determines, in a predetermined fashion, that the television information received at tuner, 215, is displayed at monitor, 202M; that the audio emitted at monitor, 202M, is inputted to said monitor, 202M, via matrix switch, 258, from said tuner, 215; and that the video displayed at monitor, 202M, is also inputted to said monitor, 202M, via matrix switch, 258, from said tuner, 215. Automatically, controller, 20, causes matrix switch, 258, to configure its switches so as to transfer the video information that is inputted to monitor, 202M, also to divider, 4, and to configure its switches so as to transfer the audio information that is inputted to monitor, 202M, also to divider, 202D. In so doing, receiving said message causes the apparatus of said station to combine to the computer system of said program originating studio. Automatically, controller, 20, causes a control information communication link to be established that links controller, 20, and the controller, 39, of decoder, 203, then inputs an interrupt signal of new-channel-input information to said controller, 39. In so doing, receiving said message causes the decoder, 203, of said station to delete all previously received SPAM information and commence discarding all received SPAM information until an end of file signal is detected. Automatically, controller, 20, causes matrix switch, 258, to configure its switches so as to cease transferring audio information inputted from said tuner, 215, to monitor, 202M, and video information inputted from said tuner, 215, to monitor, 202M. Automatically, controller, 20, causes matrix switch, 258, to configure its switches so as to commence transferring audio information inputted from said microcomputer, 205, to monitor, 202M, and video information inputted from said microcomputer, 205, to monitor, 202M. In so doing, receiving said message causes matrix switch, 258, to interconnect the apparatus of said station in the fashion of FIG. 7E.

(Receiving said align-URS-microcomputers-205 message (#10) at the stations of said second subscriber and of said third subscriber causes apparatus at said stations to function in the station of FIGS. 7 and 7F, apparatus of said stations to combine to the computer system of said program originating studio, to discard received SPAM information, and to interconnect at each of said stations in the fashion of FIG. 7E.)

After an interval that is sufficient to allow apparatus at each subscriber station so to combine and interconnect, said studio transmits said synch-SPAM-reception message (#10), embedded in the transmission of said programming. Said message consists of a "01" header, information of the aforementioned pseudo-command execution segment, appropriate meter-monitor information that includes the "program unit identification code" information of said programming of Q, any required padding bits, an information segment that contains no binary information, and information of a SPAM end of file signal.

Receiving said message at the station of FIGS. 7 and 7F causes decoder, 203, to detect the end of file signal of said message and to process the next received SPAM information as information of the header of a SPAM message, thereby causing said decoder, 203, to commence identifying and processing the individual SPAM messages of the SPAM information subsequently embedded in the transmission of the programming of Q. In so doing, receiving said message causes decoder apparatus of the station of FIGS. 7 and 7F to commence executing controlled functions in response to SPAM messages transmitted by said program originating studio. (In the fashions described above, receiving said message at decoders, 145 and 282, causes said decoders, 145 and 282, to process the meter-monitor information of said message and to transmit meter-monitor information to the onboard controller, 14A, of signal processor, 200, and causes said onboard controller, 14A, to initiate signal record information of said programming of Q and process in the fashions described above that include transferring recorded signal record information to one or more remote auditing stations.)

Then immediately, said studio transmits said control-invoking message (#10), embedded in the transmission of said programming. Said message consists of a "00" header, information of a particular control-invoking execution segment that is addressed to URS decoders, 203, appropriate meter-monitor information that includes the "program unit identification code" information of said programming of Q, any required padding bits.

Receiving said message at the station of FIGS. 7 and 7F causes decoder, 203, to input the aforementioned control invoking instructions to its microcomputer, 205, thereby causing microcomputer, 205, to come under control of the computer system of the transmission of said studio. (Decoder, 203, has capacity to turn power on to microcomputer, 205, and receiving said message may cause decoder, 203, first to turn power on to microcomputer, 205, before inputting control invoking instructions.) Automatically, decoder, 203, also transfers meter-monitor information, causing to said onboard controller, 14A, to increment its signal record information of Q in the fashion described above.

(Receiving said synch-SPAM-reception message (#10) and said control-invoking message (#10) at the stations of said second subscriber and of said third subscriber causes apparatus at said stations, in the same fashion, to come under control of the computer system of said program originating studio.)

(At other stations that lack microcomputer, 205, capacity, that display only the conventional programming of the transmission of Q at a monitor, 202M, and that are preprogrammed to collect monitor information, receiving said messages at decoders, 145 and 282, causes decoders, 145 and 282, and onboard controllers, 14A, of signal processors, 200, to process the meter-monitor information of said message, to initiate signal record information of said programming of Q, and at selected ones of said stations where recorders, 16, record signal record information and equal or exceed predetermined capacity, to transfer recorded signal record information to one or more remote auditing stations.)

Then said studio transmits said transmit-data-module-set message (#10), causing each intermediate transmission station, including the station of FIG. 6 and said second intermediate transmission station, to transmit its specific data-module-set message (#10), as described above.

Receiving the specific data-module-set message (#10) of its intermediate transmission station causes each ultimate receiver station to record one instance of the DATA_OF.ITS information in said message in a particular file, named "DATA_OF.ITS" at so-called "RAM disk" memory of the microcomputer, 205, of said station. At the station of FIGS. 7 and 7F, receiving the data-module-set message (#10) transmitted by the intermediate transmission station of FIG. 6 causes said message to be detected at decoder, 203, and causes decoder, 203, to load and execute at microcomputer, 205, the information segment of said message (which includes complete information of the aforementioned data file, DATA_OF.ITS, of said station). Executing said information causes microcomputer, 205, to place said complete information at a so-called "D:" RAM disk at the RAM of said microcomputer, 205, in a file entitled, at the directory of said disk, "DATA_OF.ITS". (Simultaneously, the microcomputer, 205, at the station of said second subscriber [which station is a also subscriber station of the intermediate transmission station of FIG. 6] receives the same data-module-set message (#10) and is caused, in the same fashion, to place complete information said aforementioned data file, DATA_OF.ITS, at the "D:" RAM disk at said microcomputer, 205, in a file entitled "DATA_OF.ITS". And the microcomputer, 205, at the station of said third subscriber [which station is a subscriber station of said second intermediate transmission station] receives the data-module-set message (#10) of said second intermediate station and is caused, in the same fashion, to place complete information the data file, DATA_OF.ITS, of said second intermediate station at the "D:" RAM disk at said microcomputer, 205, in a file also entitled "DATA_OF.ITS".) (Alternately, receiving the specific data-module-set message (#10) of its intermediate transmission station may cause each ultimate receiver station to record one instance of the DATA_OF.ITS information in said message in a particular file, named "DATA_OF.ITS", on appropriate recording medium of a peripheral disk drive, designated drive D:, of the microcomputer, 205, of said station.)

Then said studio transmits said transmit-and-execute-program-instruction-set message (#10), causing each intermediate transmission station, including the station of FIG. 6 and said second intermediate transmission station, to transmit its specific program-instruction-set message (#10), as described above.

Receiving the specific program-instruction-set message (#10) of its intermediate transmission station causes each ultimate receiver station to record one instance of the PROGRAM.EXE information in said message at particular RAM and execute the information so loaded as a machine language job. At the station of FIGS. 7 and 7F, receiving the program-instruction-set message (#10) transmitted by the intermediate transmission station of FIG. 6 causes said message to be detected at decoder, 203, and causes decoder, 203, to load and execute at microcomputer, 205, the information segment of said message (which is the program instruction set of Q.1 and is the output file, PROGRAM.EXE, of said station). As described above, the information of said segment includes formula-and-item-of-this-transmission information of the higher language line of program code:

$$Y=1000.00+62.21875+(2.117*X)$$

compiled and linked to other compiled information. (Simultaneously, the microcomputer, 205, at the station of said second subscriber receives the same program-instruction-set message (#10) and is caused, in the same fashion, to load and execute said program instruction set of Q.1 that is the information of the information segment of said message. And the microcomputer, 205, at the station of said third subscriber receives the program-instruction-set message (#10) of said second intermediate station and is caused, in the same fashion, to load and execute the complete instructions of the output file, PROGRAM.EXE, of said second intermediate station which is the information of the information segment of said last named message and is the program instruction set of Q.2. Said instructions so executed include formula-and-item-of-this-transmission information of the higher language line of program code:

$$Y=1000.00+132.2362+(2.0882*X)$$

compiled and linked to other compiled information.)

Executing the specific program instruction set instructions received at each subscriber station causes the microcomputer, 205, of said station to generate its own specific information of a series of outputs.

Under control of the instructions of said program instruction set of Q.1, the microcomputer, 205, of FIGS. 7 and 7F generates image information of a first video overlay and generates selected information of subsequent overlays in the following fashion. Automatically, in a fashion well known in the art, microcomputer, 205, accesses its file A:DATA_OF.URS and locates the aforementioned information of the particular address of the subscriber station of FIGS. 7 and 7F the accesses its file D:DATA_OF.ITS and locates the aforementioned information of the particular street addresses of each of the markets of said supermarket chain that is in the locality of the intermediate station of FIG. 6. Then automatically, microcomputer, 205, accesses the aforementioned distance-and-relative-location module that, when accessed, computes the shortest vehicle driving distance between any two locations in the local vicinity of the station of FIG. 6 when passed two street addresses of said vicinity and passes to said module and passes to said module the address of said subscriber station and, one at a time, the address of each of said markets. Automatically, under control of the instructions of said module, microcomputer, 205, computes the shortest vehicle distance and the relative direction between said subscriber station and each of said markets. Then automatically, by comparing distance information, microcomputer, determines which market is closest to said subscriber station, that the distance between said subscriber station and said market is 4.3 miles, and that said subscriber station is southwest of said market. Automatically, microcomputer, 205, stores particular southwest-quadrant information at particular 1st working memory of said microcomputer, 205. Then automatically, on a machine language basis and in a fashion well known in the art, said microcomputer, 205, substitutes the value 4.3 for the variable X in the equation:

$$Y=1000.00+62.21875+(2.117*X)$$

computes the value of Y that is specific the station of FIGS. 7 and 7F to be: 1071.32 (rounded in a fashion well known in the art); and stores 1071.32 information at particular 2nd working memory of said microcomputer, 205. Automatically, microcomputer, 205, clears video RAM; causes the background color of video RAM to be a color such as black that is transparent when combined with transmitted video by the PC-MicroKey System; causes binary image information of "$1,071.32" to be placed at bit locations of video RAM that produce video image information in the upper left hand of a video screen when video RAM information is transmitted to said screen. (Simultaneously, under control of the instructions of said program instruction set of Q.1, the microcomputer, 205, at the station of said second subscriber computes and determines that the distance between said last named station and the market closest to said station is 8.7 miles and that said station is northwest of said market; stores particular northwest-quadrant information at particular 1st working memory of said microcomputer, 205; substitutes the value 8.7 for the variable X in its received information of said last named equation and computes the value of Y that is specific the station of said second subscriber to be 1080.64 (rounded); stores 1080.64 information at particular 2nd working memory of said microcomputer, 205; clears and sets video RAM to said transparent background color; and causes binary image information of "$1,080.64" to be placed at particular upper left hand video screen bit locations of video RAM. And under control of the instructions of said program instruction set of Q.2, the microcomputer, 205, at the station of said third subscriber computes and determines that the distance between said last named station and the closest selected market in the vicinity of said second intermediate transmission station is 3.2 miles and that said subscriber station is southeast of said market; stores particular southeast-quadrant information at particular 1st working memory of said microcomputer, 205; substitutes the value 3.2 for the variable X in its received information of the equation:

$$Y=1000.00+132.2362+(2.0882*X)$$

and computes the value of Y that is specific to the station of said third subscriber to be 1138.92 (rounded); stores 1138.92 information at particular 2nd working memory of said microcomputer, 205; clears and sets video RAM to said transparent background color; and causes binary image information of "$1,138.92" to be placed at particular upper left hand video screen bit locations of video RAM.)

Then, under control of said instructions that constitute the specific program instruction set of the microcomputer, 205, of the station of FIGS. 7 and 7F, said microcomputer, 205, generates and stores additional information of subsequent outputs, selects sound image information of a first audio overlay, and places said selected information at audio RAM. At the station of FIGS. 7 and 7F, microcomputer, 205, computes the amount that the subscriber of said station will save by buying an untrimmed pork belly unit as compared with buying a trimmed pork belly unit at the aforementioned local market selected at said station. Automatically, microcomputer, 205, locates the aforementioned cost-of-a-trimmed-pork-belly-unit information in its file, D:DATA_OF.ITS. Then, by subtracting the information stored at said 2nd working memory of said microcomputer, 205, (which is 1071.32) from said cost-of-a-trimmed-pork-belly-unit information (which is 1987.25), microcomputer, 205, automatically computes said amount to be 915.93 and saves information of 915.93 at particular 3rd working memory of said microcomputer, 205. Then microcomputer, 205, selects audio information that represents the percentage saving that said subscriber can save by buying an untrimmed pork belly unit in comparison to a trimmed pork belly unit at said market. Automatically, microcomputer, 205, clears its audio RAM. Then automatically, by dividing the information at said 3rd working memory (which is 915.93) by said cost-of-a-trimmed-pork-belly-unit information (which is 1987.25), microcomputer, 205, computes information of 0.4609 (rounded), which is the decimal equivalent of the percentage saving; determines that said information is greater than 0.4600 and less than 0.4700; and selects the audio information of an announcer's voice saying "forty-six" from among the information of said file, D:DATA_OF.ITS; and places said information at audio RAM. (In similar fashion, the microcomputer, 205, at the station of said second subscriber computes information of the amount that the subscriber of said station will save by buying an untrimmed pork belly unit by subtracting the information stored at the aforementioned 2nd working memory of said microcomputer, 205, [which information is 1080.64] from the cost-of-a-trimmed-pork-belly-unit information of the program instruction set instructions received by said microcomputer, 205, [which information is 1987.25]; stores the difference information so computed [which is 896.61] at particular 3rd working memory of said microcomputer, 205; clears the audio RAM of said microcomputer, 205; by dividing the information at said 3rd working memory [which is 896.61] by the cost-of-a-trimmed-pork-belly-unit information [which is 1987.25] at its file, D:DATA_OF.ITS, computes information of 0.4562 [rounded], which is the decimal equivalent of the percentage saving of said second subscriber; determines that said information of 0.4562 is greater than 0.4500 and less than 0.4600; selects the aforementioned audio information of an announcer's voice saying "forty-five" from its file, D:DATA_OF.ITS; and places said information at said audio RAM. And the microcomputer, 205, at the station of said third subscriber computes information of the amount that said subscriber will save by buying an untrimmed pork belly unit by subtracting the information stored at the 2nd working memory of said microcomputer, 205, [which is 1138.92] from the cost-of-a-trimmed-pork-belly-unit information of its file, D:DATA_OF.ITS, [which information is 2021.42]; stores the difference information so computed [which is 882.50] at particular 3rd working memory of said microcomputer, 205; clears the audio RAM of said microcomputer, 205; computes information of 0.4366 [rounded], which is the decimal equivalent of the percentage saving of said second subscriber by dividing the information at said 3rd working memory [which is 882.50] by said cost-of-a-trimmed-pork-belly-unit information [which is 2021.42]; determines that said information of 0.4366 is greater than 0.4300 and less than 0.4400; selects the audio information of an announcer's voice saying "forty-three" from its file, D:DATA_OF.ITS; and places said information at said audio RAM.)

As each subscriber station microcomputer, 205, completes placing selected information of an announcer's voice at audio RAM, the program instruction set instructions received by said microcomputer, 205, cause said microcomputer, 205, to pause, in a fashion well known in the art, and wait for an input instruction.

Meanwhile, in the conventional television programming transmission of Q, the video conveys television picture information of a large outdoor barbecue party, and the audio transmits information of an announcer saying:

"Think how much your friends enjoy outdoor barbecues."

Said studio transmits television picture information of the upper torso of a person and audio information of an announcer saying, > "For a limited time only, Super Discount Supermarkets make this special offer to you. Super Discount Supermarkets will deliver to you, at cost, all the pork you need to entertain five hundred people for this low, low price . . . ."

Said studio transmits television picture information of the right hand and arm of said person pointing moving to point at the upper left hand corner of the television screen.

At this moment, said studio embeds and transmits said 1st commence-outputting message (#10). Said message consists of a "00" header; execution segment information that is identical to the execution segment of the second message of the "Wall Street Week" example, appropriate meter-monitor information including "program unit identification code" information and overlay number field information, and any required padding bits. And each intermediate transmission station (including the intermediate station of FIG. 6 and said second intermediate station) receives and retransmits said message.

Receiving said message causes each subscriber station that has completed the generation of first overlay image information at video RAM to combine its specific image information with the conventional video information transmitted by said studio and cause its specific monitor, 202M, to display the combined specific image information and transmitted video information. At the station of FIGS. 7 and 7F, decoder, 203, detects the information of said message, and receiving said 1st commence-outputting message (#10) causes decoder, 203, to execute "GRAPHICS ON" at the PC-MicroKey system of microcomputer, 205. Automatically, microcomputer, 205, combines its specific video RAM binary image information of "$1,071.32" with its received conventional video information. And automatically $1,071.32 is displayed at the upper left hand corner of the picture screen of monitor, 202M, which is the corner to which the image of the person shown at said screen is pointing. (Simultaneously and in the same fashion, apparatus at the station of said second subscriber causes the specific video RAM image information of said station, which is "$1,080.64", to be displayed at the upper left hand corner of the picture screen of the monitor, 202M, of said station and said subscriber can see the image said person pointing at $1,080.64. And at the station of said third subscriber, in the same fashion, apparatus causes the specific video RAM image information of said station, which is "$1, 138.92", to be displayed at the upper left hand corner of the picture screen of the monitor, 202M, of said station and said third subscriber can see the image said person pointing at $1,138.92.)

Said studio then transmits audio information of the announcer saying:

> "Super Discount Supermarkets makes this offer—today only—at cost, and this offer represents a saving to you of over."

Then said program originating studio embeds and transmits said 2nd commence-outputting message (#10). Said message consists of a "00" header; particular audio-overlay execution segment information that is addressed to URS microcomputers, 205, appropriate meter-monitor information including "program unit identification code" information and overlay number field information, and any required padding bits. And each intermediate transmission station (including the intermediate station of FIG. 6 and said second intermediate station) receives and retransmits said message.

Receiving said 2nd commence-outputting message (#10) causes each subscriber station that has completed the generation of first audio image information at audio RAM to combine its specific image information to the conventional audio information transmitted by said studio and to emit sound of its combined specific audio information and its received conventional audio information at its specific monitor, 202M. At the station of FIGS. 7 and 7F, decoder, 203, detects the information of said message, and receiving said 2nd commence-outputting message (#10) causes decoder, 203, to execute "SOUND ON" at the microcomputer, 205 of said station. Automatically, microcomputer, 205, transmits to monitor, 202M, via audio information transmission means, one instance of the information at the audio RAM of said microcomputer, 205, causing the emission of sound of said audio information, and the subscriber of said station can hear said announcer's voice saying:

"forty-six".

(Simultaneously, the microcomputer, 205, at the station of said second subscriber transmits to the monitor, 202M, of said station, via audio information transmission means, one instance of the information at the audio RAM of said microcomputer, 205, causing emission of sound of said audio information, and said second subscriber can hear said announcer's voice saying:

"forty-five".

And the microcomputer, 205, at the station of said third subscriber transmits to the monitor, 202M, of said station, one instance of the information at the audio RAM of said microcomputer, 205, causing emission of sound of said audio information, and the sound of said announcer's voice saying:

"forty-three"

is what said third subscriber can hear.)

Then after an interval that is long enough for each subscriber station to emit sound of its specific audio RAM information, said studio transmits audio information of the announcer saying:

"percent."

Receiving said 2nd commence-outputting message (#10) causes each subscriber station that outputs audio information in this fashion, immediately after so transmitting one instance of its specific information at audio RAM, to continue executing instructions of its specific program instruction set at the next instruction following the aforementioned pause. Automatically, after outputting one instance of audio RAM information, each subscriber station clears its audio RAM, selects sound image information of a second audio overlay, and places said selected information at audio RAM. At the station of FIGS. 7 and 7F, microcomputer, 205, clears its audio RAM then determines, in the predetermined fashion of said program instruction set of Q.1, that the shopping list information at particular shopping-list memory at said station includes information of Patak's low-salt Vindaloo Curry Paste. So determining causes said microcomputer, 205, in said predetermined fashion, to select particular sound image information of an announcer's voice saying "low-salt Vindaloo" from among the information of its D:DATA_OF.ITS file and to place said selected information at said audio RAM. (In similar fashion, at the station of said second subscriber, the microcomputer, 205, clears its audio RAM; determines that the shopping list information at the shopping-list memory at said station includes information of Patak's Quick Curry Paste (Mild); selects particular sound image information of an announcer's voice saying "Mild version Quick" from its D:DATA_OF.ITS file; and places said selected information at said audio RAM. And at the station of said third subscriber, the microcomputer, 205, clears its audio RAM; determines that the information at its shopping-list memory includes information of Patak's Quick Curry Paste (Hot); selects particular sound image information of "Hot version Quick" from its D:DATA_OF.ITS file; and places said selected information at said audio RAM.)

As each subscriber station microcomputer, 205, completes placing selected information of an announcer's voice at audio RAM, the program instruction set instructions received by said microcomputer, 205, cause said microcomputer, 205, to pause a second time and wait for an input instruction.

Meanwhile, as said studio continues to transmit television picture information of the person pointing to the upper left hand corner of the television screen, said studio transmits audio information of an announcer saying, "To confirm this very special limited offer to you in writing, we are now printing, at your printer . . . . "

Then said program originating studio embeds and transmits said 3rd commence-outputting message (#10). Said message consists of a "00" header; particular print-output execution segment information that is addressed to URS microcomputers, 205; appropriate meter-monitor information including "program unit identification code" information and overlay number field information; and any required padding bits. And each intermediate transmission station (including the intermediate station of FIG. 6 and said second intermediate station) receives and retransmits said message.

Receiving said 3rd commence-outputting message (#10) causes each subscriber station to commence printing specific offer and coupon information at its printer, 221. At the station of FIGS. 7 and 7F, decoder, 203, detects the information of said message, and receiving said 3rd commence-outputting message (#10) causes decoder, 203, to execute "PRINT OUT" at the microcomputer, 205 of said station. Under control of said program instruction set instructions received by said microcomputer, 205, microcomputer, 205, commences to generate print output information and to transmit said information to printer, 221. Automatically, microcomputer, 205, transmits to printer, 221, particular print information (that is transmitted to intermediate stations in the generate-set-information message (#10) as generally applicable information of the intermediate generation set of Q and is complied and/or linked to become part of said program instruction sets of Q.1 and Q.2) of "Super Discount Supermarkets offers to deliver at cost one unit of untrimmed pork belly product, suitable for a large outdoor barbecue party, to:". Automatically, microcomputer, 205, accesses the file A:DATA_OF.URS, selects information of the aforementioned particular address of the subscriber station of FIGS. 7 and 7F, and causes said information to be printed at printer, 221. Automatically, microcomputer, 205, transmits additional print information of said program instruction set of Q.1 to printer, 221, causing printer, 221, to print: "in exchange for this coupon and the sum of" and "$". Automatically, microcomputer, 205, selects information of the aforementioned 1071.32 at said 2nd working memory and transmits said information to printer, 221, causing printer, 221, to print: "1,071.32". Automatically, microcomputer, 205, transmits additional print information of said program instruction set of Q.1 including information of "15 cents off" and of "Nabisco Zweiback Teething Toast" (incorporated into said generally applicable information at the station of FIG. 6).

At printer, 221, the printed so-called "hard copy" of said offer and coupon information emerges as:

| |
|---|
| Super Discount Supermarkets offers to deliver at cost one unit of untrimmed pork belly product suitable for a large outdoor barbecue party, to:<br><br>111 First St.<br>Anytown, Massachusetts<br><br>in exchange for this coupon and the sum of:<br><br>$1,071.32 |
| 15 cents off 15 cents off<br><br>Nabisco Zweiback Teething Toast |

(Simultaneously, at the station of said second subscriber, the decoder, 203, executes "PRINT OUT" at the microcomputer, 205; said microcomputer, 205, transmits to the printer, 221, of said station the same print information of program instruction set of Q.1 together with selected information of the particular address of said second station and of the aforementioned 1080.64 at said 2nd working memory of said microcomputer, 205; and printed hard copy offer and coupon information emerges at said printer, 221, as:

| |
|---|
| Super Discount Supermarkets offers to deliver at cost one unit of untrimmed pork belly product suitable for a large outdoor barbecue party, to:<br><br>222 Second St.<br>Anytown, Massachusetts<br><br>in exchange for this coupon and the sum of:<br><br>$1,080.64 |
| 15 cents off 15 cents off<br><br>Nabisco Zweiback Teething Toast |

And at the station of said third subscriber, the decoder, 203, executes "PRINT OUT" at the microcomputer, 205; said microcomputer, 205, transmits to the printer, 221, of said station its received program instruction set print information [including information of "Cheerios Toasted Oat Cereal" that was incorporated at said second intermediate station into the generally applicable of the said intermediate generation set of Q instead of "Nabisco Zweiback Teething Toast"] together with selected information of the particular address of said second station and of the aforementioned 1138.92 at said 2nd working memory of said microcomputer, 205; and:

| |
|---|
| Super Discount Supermarkets offers to deliver at cost one unit of untrimmed pork belly product suitable for a large outdoor barbecue party, to:<br><br>333 Third St.<br>Anothertown, Florida<br><br>in exchange for this coupon and the sum of:<br><br>$1,138.92 |
| 15 cents off 15 cents off<br><br>Cheerios Toasted Oat Cereal |

is the printed hard copy offer and coupon information that emerges at said printer, 221, at the station of said third subscriber.)

Then, having transmitted audio of an announcer saying, "To confirm this very special limited offer to you in writing, we are now printing, at your printer . . . " (whereupon said 3rd commence-outputting message (#10) was transmitted and offer and coupon printing commenced), said studio then transmits audio of said announcer saying, > "the current specials and coupon offers of Super Discount Supermarkets which include a special coupon for you with which you can buy enough pork for your own barbecue party."

(As said announcer makes this statement, the transmitted video image is of said person pointing to the upper left hand corner of the television screen where $1,071.32 continues to be displayed at the station of FIGS. 7 and 7F [while, simultaneously, $1,080.64 is displayed at the station of said second subscriber, and $1,138.92 is displayed at the station of said third subscriber].)

Then said program originating studio embeds and transmits said 1st cease-outputting message (#10). Said message is identical to the aforementioned third message of the "Wall Street Week" example.

Receiving said 1st cease-outputting message (#10) causes each subscriber station to cease combining and to display only the transmitted video information at its monitor, 202M. At the station of FIGS. 7 and 7F, decoder, 203, detects the information of said message, and receiving said 1st cease-outputting message (#10) causes decoder, 203, to execute "GRAPHICS OFF" at the PC-MicroKey System of microcomputer, 205. In so doing, decoder, 203, causes said PC-MicroKey to cease combining its specific image information with the conventional video information transmitted by said studio, to commence transmitting only the transmitted video information to monitor, 202M.

Receiving said message causes each subscriber station then temporarily to stop generating and outputting said print output information, to prepare to combine a second specific video overlay image, then to resume generating and outputting said print output information. At the station of FIGS. 7 and 7F, receiving said 1st cease-outputting message (#10) causes decoder, 203, after so executing "GRAPHICS OFF", to input the aforementioned clear-and-continue instruction to the CPU of microcomputer, 205. In the preferred embodiment, said instruction is inputted to said CPU as an interrupt signal. Receiving said clear-and-continue instruction as an interrupt signal causes microcomputer, 205, in a fashion well known in the art, to cease its current function, to store particular information at particular instruction-at-which-to-resume memory that identifies the location of the particular instruction at which to resume said function, and to execute a particular when-interrupted portion of said program instruction set of Q.1. Automatically, microcomputer, 205, ceases generating and transmitting said print output information, having just outputted information of "in exchange for this coupon and the sum of:" which causes printer, 221, to stop printing after printing "of:". (Simultaneously, receiving the interrupt signal of its station's clear-and-continue instruction at the microcomputer, 205, of the station of said second subscriber causes said microcomputer, 205, to cease generating and outputting its specific print output information, having just outputted information of "222 Second St." which causes the printer, 221, of said station to stop printing after printing "St.". And receiving its station's clear-and-continue instruction at the microcomputer, 205, of the station of said third subscriber causes said microcomputer, 205, to cease generating and outputting its specific print output information, having just outputted information of "$1,138.92" which causes the printer, 221, of said station to stop printing after printing "0.92".) Then, under control of the instructions of said when-interrupted portion, microcomputer, 205, determines that said clear-and-continue instruction is the first instance of a clear-and-continue instruction that microcomputer, 205, has received while under control of said program instruction set of Q.1. So determining causes microcomputer, 205, to place "0" at particular Flag-interrupt register memory of said CPU that is normally "1" then to jump to a particular first-clear-and-continue address of the instructions of said program instruction set of Q.1 and to commence executing first-clear-and-continue instructions at said address. Automatically, under control of said instructions, microcomputer, 205, clears video RAM; sets the background color of video RAM to a transparent overlay black; determines that the aforementioned 1st working memory of said microcomputer, 205, holds southwest-quadrant information; selects from said D:DATA_OF.ITS file information of the aforementioned southwest delivery route telephone number, "456-1414", and causes binary image information of said number to be placed at bit locations that produce video image information in the lower middle portion of a video screen. (Under control of the first-clear-and-continue instructions of its station's program instruction set of Q.1, the microcomputer, 205, of the station of said second subscriber clears video RAM; sets background to transparent black; determines that the 1st working memory of said microcomputer, 205, holds northwest-quadrant information; and causes binary information of the selected northwest delivery route telephone number, "224-3121", to be placed at particular lower middle video screen bit locations. And under control of the first-clear-and-continue instructions of its station's program instruction set of Q.2, the microcomputer, 205, of the station of said third subscriber clears video RAM; sets background to transparent black; determines that the 1st working memory of said microcomputer, 205, holds southeast-quadrant information; and causes binary information of the selected southeast delivery route telephone number, "623-3000", to be placed at particular lower middle video screen bit locations.) Then said first-clear-and-continue instructions cause microcomputer, 205 to determine that the information at said Flag-interrupt register memory is "0", to place "1" at said Flag-interrupt register memory, and to resume generating and transmitting said print output information by executing the instruction located at the location identified by the information at said instruction-at-which-to-resume memory. Automatically, microcomputer, 205, commences generating and transmitting its specific output information, starting immediately after the aforementioned "of:", thereby causing printer, 221, to print:

" .
. .
$1,071.32
. . ", and the information that follows. (At the station of said second subscriber, the microcomputer, 205, resumes generating and transmitting its specific print output information, executing the instruction whose location is identified by the information at the instruction-at-which-to-resume memory of said microcomputer, 205, thereby causing the printer, 221, of said station to print:

" .
. .
Anytown, Massachusetts
. . ", and the information that follows. And at the station of said third subscriber, the microcomputer, 205, resumes generating and transmitting its specific print output information, executing the instruction identified by the information at its instruction-at-which-to-resume memory, thereby its printer, 221, to print:

" .
. .
. . . . . . . . . . . . . . . . . . . . . . . . . . . . . .
. . ", and the information that follows.)

(In example #10, receiving said 1st cease-outputting message (#10) causes each subscriber station to cease combining and to display only the transmitted video information at its monitor, 202M; to stop generating and outputting particular output information; to generate second video overlay image information; then to resume generating and outputting said particular output information. The fact that the particular output information generated and outputted is print information that is outputted to a printer is only incidental to the present invention. Receiving said 1st cease-outputting message (#10) could as easily cause each subscriber station to stop generating and outputting then to resume generating and outputting any form of computer output information, outputted to any appropriate computer peripheral device. Said output could be data and/or computer program instructions outputted to a disk drive and caused to be recorded or outputted to a modem and caused to be transmitted. Said output could be audio and/or video information outputted to a monitor, 202M, and caused to be emitted as sound and/or displayed as picture information.)

Then, having caused locally generated video images to cease appearing in the upper left hand corner of subscriber station television screens (including "$1,071.32" at the station of FIGS. 7 and 7F, "$1,080.64" at the station of said second subscriber, and "$1,138.92" at the station of said third subscriber), immediately said studio ceases transmitting a video image of said person pointing to the upper left hand corner of the television screen.

Promptly said program originating studio commences transmitting the video image of the so-called "talking head" of said person standing in front of a background image of the logo of said program, "Exotic Meals of India," and transmits audio information of said announcer saying:

"Super Discount Supermarkets is proud to sponsor the television series, 'Exotic Meals of India.' Being truly exotic, many of the ingredients, can't be found in average supermarkets, but your friendly Super Discount manager is happy to supply all of these ingredients to your family. Tonight your personal recipe and shopping list call for Patak's"

Then said program originating studio embeds and transmits said 4th commence-outputting message (#10). Said message consists of a "00" header; said audio-overlay execution segment information that is addressed to URS microcomputers, 205; appropriate meter-monitor information including "program unit identification code" information and overlay number field information; and any required padding bits. And each intermediate transmission station (including the intermediate station of FIG. 6 and said second intermediate station) receives and retransmits said message.

Receiving said 4th commence-outputting message (#10) causes apparatus at each subscriber station that has completed the generation of second audio image information at audio RAM to combine its specific audio information to the transmitted audio and to emit sound of its combined audio. At the station of FIGS. 7 and 7F, decoder, 203, receiving said 4th commence-outputting message (#10) causes decoder, 203, to execute "SOUND ON" at the microcomputer, 205 of said station. Automatically, microcomputer, 205, transmits to monitor, 202M, via audio information transmission means, one instance of the information at the audio RAM of said microcomputer, 205, causing the emission of sound of said audio information, and the subscriber of said station can hear said announcer's voice saying:

"low-salt Vindaloo".

(Simultaneously, the microcomputer, 205, at the station of said second subscriber transmits to the monitor, 202M, of said station, via audio transmission means, one instance of its information at audio RAM, and said second subscriber can hear said announcer's voice saying "Mild version Quick".

And at the station of said third subscriber, emission at the monitor, 202M, of sound of said announcer's voice saying "Hot version Quick"

is caused by the microcomputer, 205.)

(The instructions of the program instruction sets of Q.1 and Q.2 do not cause subscriber stations to clear audio RAM after the audio combining caused by receiving said 4th commence-outputting message (#10).)

Then after an interval that is long enough for each subscriber station to emit sound of its specific audio RAM information, said studio transmits audio information of the announcer saying:

"Curry Paste. Your local Super Discount Supermarket has a complete line of Patak's Curry Paste products in stock. Call the telephone number,"

At this moment, said program originating studio embeds and transmits said 5th commence-outputting message (#10). Said message consists of a "00" header; execution segment information that is identical to the execution segment of the second message of the "Wall Street Week" example, appropriate meter-monitor information including "program unit identification code" information and overlay number field information, and any required padding bits. And each intermediate transmission station (including the intermediate station of FIG. 6 and said second intermediate station) receives and retransmits said message.

Receiving said message causes each subscriber station that has completed the generation of second overlay image information at video RAM to combine its specific image information with the conventional video information transmitted by said studio and cause its specific monitor, 202M, to display the combined video information. At the station of FIGS. 7 and 7F, receiving said 5th commence-outputting message (#10) causes decoder, 203, to execute "GRAPHICS ON" at the PC-MicroKey system of microcomputer, 205. Automatically, microcomputer, 205, combines its specific video RAM binary image information of "456-1414" with its received conventional video information. And automatically 456-1414 is displayed in the lower middle portion of the picture screen of monitor, 202M. (Simultaneously and in the same fashion, apparatus at the station of said second subscriber causes the specific video RAM image information of said station, which is "224-3121", to be displayed in the lower middle portion of the picture screen of the monitor, 202M, of said station. And at the station of said third subscriber, in the same fashion, apparatus causes the specific video RAM image information of said station, which is "623-3000", to be displayed in the lower middle portion of the picture screen of the monitor, 202M, of said station.)

Said studio then transmits audio information of the announcer saying,

"that you see on your screen to have your order delivered to your door. Or if you enter on your Widget Signal Generator and Local Input the information that you see here on your screen,"

Said studio transmits video information of said person pointing to the upper left hand corner of the video screen, and the image of "TV568*" appears in said corner. Thus each viewer—including the subscriber of the station of FIGS. 7 and 7F, said second subscriber, and said third subscriber—can see TV568* in the upper left hand corner of the picture on the monitor, 202M, of his station.

Said studio then transmits audio information of the announcer saying,

"your Super Discount manager will see that all the ingredients that you need for your personal 'Exotic Meals of India' fish curry recipe are delivered to you in time for dinner tomorrow. And as a special inducement to enter "TV568*" on your Widget Signal Generator and Local Input now, your manager promises to include one jar of Patak's"

Then said program originating studio embeds and transmits said 6th commence-outputting message (#10). Said message is identical to the 4th commence-outputting message (#10) except for different overlay number field information.

In the same fashion that applied to receiving the 4th commence-outputting message (#10), receiving the 6th commence-outputting message (#10) causes apparatus at each subscriber station that has completed the generation of second audio image information to combine its specific audio information to the transmitted audio and to emit sound of its combined audio. At the station of FIGS. 7 and 7F, decoder, the monitor, 202M, emits sound of said announcer's voice saying:

"low-salt Vindaloo".

(Simultaneously, the monitor, 202M, of the station of said second subscriber emits sound of said announcer's voice saying:

"Mild version Quick".

And at the station of said third subscriber, sound of said announcer's voice saying:

"Hot version Quick"

is emitted at the monitor, 202M.) After causing emission of audio information of the information at audio RAM once, the instructions of said program instruction sets of Q.1 and Q.2 cause a microcomputer, 205, to clear audio RAM then pause.

Then after an interval that is long enough for each subscriber station to emit sound of its specific audio RAM information, said studio transmits audio information of the announcer saying:

"Curry Paste. Do it now! Enter 'TV568*' on your Widget Signal Generator and Local Input or call the telephone number that you see on your television screen."

At the station of FIGS. 7 and 7F, the subscriber enters TV568* at the keyboard of local input, 225, which causes said input, 225, to transmit the aforementioned process-local-input instruction and said TV568* information to the controller, 20, of the signal processor, 200, of said station. (And at the station of said third subscriber, said third subscriber enters TV568* at the keyboard of his local input, 225.)

Receiving said instruction and information causes the controller, 20, at each station where TV568* is entered, in a predetermined fashion, to retain said TV568* information at particular last-local-input-* memory.

Coincidentally, said program originating studio embeds and transmits said 2nd cease-outputting message (#10). Said message is identical to the aforementioned third message of the "Wall Street Week" example.

Receiving said 2nd cease-outputting message (#10) causes each subscriber station to cease combining and to display only the transmitted video information at its monitor, 202M. At the station of FIGS. 7 and 7F, receiving said 2nd cease-outputting message (#10) causes decoder, 203, to execute "GRAPHICS OFF" at the PC-MicroKey System of microcomputer, 205. Automatically, said PC-MicroKey ceases combining its specific image information with the conventional video information transmitted by said studio, and the image of 456-1414 disappears from the lower middle portion of the picture screen of monitor, 202M. (Simultaneously and in the same fashion, at the station of said second subscriber, the image of 224-3121 disappears from the lower middle portion of the picture screen of the monitor, 202M, and at the station of said third subscriber, the image of 623-3000 disappears from the lower middle portion of the picture screen of the monitor, 202M.)

Receiving said 2nd cease-outputting message (#10) causes each subscriber station then to clear video RAM and continue executing instructions of its specific program instruction set of Q.1 or Q.2.

In due course, said studio ceases transmitting programming of said program unit of Q and recommences transmitting programming of said "Exotic Meals of India" program.

Subsequently, so continuing executing instructions of its specific program instruction set of Q.1 or Q.2 causes apparatus at each subscriber station where TV568* has been inputted to a local input, 225, automatically to telephone a shopping list order. At the station of FIGS. 7 and 7F, under control of said program instruction set of Q.1, microcomputer, 205, measures elapsed time, in a fashion well known in the art, and determining that ninety seconds have passed from receiving said 2nd cease-outputting message (#10) causes microcomputer, 205, to input particular check-for-entered-TV568*-and-respond instructions to the controller, 20, of signal processor, 200. Receiving said instructions causes controller, 20, to determine that TV567* information exists at said last-local-input-* memory and to transmit particular TV567*-entered information to microcomputer, 205. Receiving said information causes microcomputer, 205, under control of said program instruction set of Q.1, to access said D:DATA_OF.ITS file; to select information from said file of the aforementioned local-automatic-order-taking telephone number of the supermarket chain applicable in the vicinity of the intermediate transmission station of FIG. 6 which is 1-(800) 247-8700; to transmit to controller, 20, particular call-this-number-and-respond-with-"A:SHOPPING.EXE" instructions and information of 1-(800) 247-8700; and to record particular instructions at the recording medium of the disk at the A: disk drive of microcomputer, 205, in a file named "SHOPPING.EXE". Receiving said call-this-number-and-respond-with-"A:SHOPPING.EXE" instructions and information of 1-(800) 247-8700 causes controller, 20, in the fashion described above, to cause auto dialer, 24, to dial the telephone number, 1-(800) 247-8700. Automatically, in the fashion described above, controller, 20, establishes telephone communications with a computer of said super market chain at a remote station. Then said call-this-number-and-respond-with-"A:SHOPPING. EXE" instructions cause controller, 20, to cause the instruction "A:SHOPPING.EXE" to be entered to microcomputer, 205. Entering said instruction causes microcomputer, 205, to execute the instructions of said file, "SHOPPING.EXE" as a machine language job. Under control of said instructions, microcomputer, 205, transmits via controller, 20, to said computer at a remote station information of the street address of the station of FIGS. 7 and 7F (selected from the file, A:DATA_OF.URS) and complete information of the aforementioned file, A:SHOPPING.LST, which is the shopping list of the subscriber of said station. (At the station of said second subscriber where TV567* has not been entered at the local input, 225, the controller, 20, does not transmit TV567*-entered information to the microcomputer, 205, and all apparatus cease functioning under control of program instruction set of Q.1 instructions. And at the station of said third subscriber where TV567* has been entered at the local input, 225, in similar fashion, the instructions of the program instruction set of Q.2 cause apparatus to telephone the aforementioned local-automatic-order-taking telephone number of the vicinity of said second intermediate station which is 1-(800) 371-2100 and to transmit information of the street address and shopping list of said third subscriber.)

In due course, after sufficient time has elapsed for each subscriber station where TV567* has been entered at a local input, 225, to record information of a file named "SHOPPING.EXE" at a disk drive, said program originating studio embeds and transmits the aforementioned disband-URS-microcomputers-205 message (#10). Said message consists of a "10" header, information of a particular SPAM separate-subscriber-station-microcomputers-from-programming-transmission execution segment that is addressed to URS signal processors, 200, and any required padding bits.

Receiving said message at the station of FIGS. 7 and 7F causes TV signal decoder, 203, to detect said message and input said message to the controller, 20, of signal processor, 200.

Receiving said message causes controller, 20, to separate microcomputer, 205, from the computer system of said program originating studio and to cause the video and audio output transmissions of tuner, 215, to be inputted to monitor, 202M. Automatically, controller, 20, executes particular controlled functions and determines, in a predetermined fashion, that microcomputer, 205, is outputting television audio and video to monitor, 202M, that microcomputer, 205, receives from tuner, 215. Automatically, controller, 20, causes matrix switch, 258, to configure its switches so as to cease transferring audio information and video information inputted from said microcomputer, 205, to monitor, 202M, then to commence transferring audio information and video information inputted from said tuner, 215, to monitor, 202M. Then automatically, controller, 20, causes matrix switch, 258, to cease transferring audio information and video information inputted from tuner, 215, to dividers, 202D and 4, respectively. Automatically, decoder, 203, ceases receiving SPAM information.

Receiving said disband-URS-microcomputers-205 message (#10) may also cause controller, 20, (under control of information and instructions preprogrammed at controller, 20) to cause the microcomputer, 205, of the station of FIGS. 7 and 7F to combine to and commence processing the SPAM information of the computer system of a second program originating studio that is different from said studio that originates the transmission of program unit Q (or in the case of example #9, that is different from the recorder, 76, that transmits the prerecorded programming of Q). In this case, controller, 20, causes appropriate receiver apparatus to receive the transmission of said second studio; causes matrix switch, 258, to input audio and video information of the transmission of said programming to dividers, 202D and 4, respectively; and inputs an interrupt signal of new-channel-input information to the controller, 39, of decoder, 203.

Alternatively, receiving said disband-URS-microcomputers-205 message (#10) may also cause controller, 20, (under control of information and instructions preprogrammed at controller, 20) to cause the microcomputer, 205, revert from broadcast control to local control. In this case, in a predetermined fashion that is functionally the reverse of invoking broadcast control, controller, 20, causes microcomputer, 205, to clear all RAM (except for that portion of RAM containing operating system information) and all CPU registers and any other designated processors; then to load at RAM the information of a particular file such as "INTERUPT.BAK" that exists at a designated place on a particular disk at a particular disk drive; then to record at particular CPU registers selected information at designated locations at RAM; then to cause said CPU to resume processing in the fashion of a resumption that follows an interrupt and that is well known in the art. In so doing, controller, 20, causes microcomputer, 205, to revert from broadcast control to local control; to commence processing the particular job that was interrupted when broadcast control was invoked; and to commence so processing said job at the particular instruction at which invoking broadcast control interrupted the processing of said job. (Hereinafter, the steps associated with returning a microcomputer, 205, from broadcast control to local control are called "revoking broadcast control.")

(Receiving said disband-URS-microcomputers-205 message (#10) at the stations of said second subscriber and of said third subscriber causes apparatus at said stations to separate the microcomputers, 205, of said stations from the transmission of said studio that originates the transmission of program unit Q [or in the case of example #9, from the transmission of said recorder, 76] and may cause apparatus at either station, in the preprogrammed fashion of said apparatus, to cause a microcomputer, 205, to combine to and commence processing the SPAM information of the computer system of a program originating studio that is different from said studio [or in the case of example #9, that is different from said recorder, 76] or may cause said apparatus to revoke broadcast control [thereby causing said apparatus to resume processing a station specific local job].)

(NOTE: Except for the content of their meter-monitor information, the messages transmitted in example #9 by the intermediate transmission station of FIG. 6 to the subscriber stations of its field distribution system, 93, are identical to the messages transmitted to the same field distribution system, 93, in example #10 and cause the same functioning. More precisely, except for their meter-monitor information content, said align-URS-microcomputers-205 message (#9), synch-SPAM-reception message (#9), data-module-set message (#9), program-instruction-set message (#9), 1st commence-outputting message (#9), 2nd commence-outputting message (#9), 3rd commence-outputting message (#9), 1st cease-outputting message (#9), 4th commence-outputting message (#9), 5th commence-outputting message (#9), 6th commence-outputting message (#9), 2nd cease-outputting message (#9), and disband-URS-microcomputers-205 message (#9) are all identical to the messages of like name of example #10. Furthermore, said program instruction set of Q of example #9 is identical to said program instruction set of Q.1 of example #10. Thus except as regards the collection of meter-monitor record information, transmitting the messages of example #9 causes precisely the same functioning at the stations of FIGS. 7 and 7F and of said second subscriber as is caused by transmitting the messages of example #10.)

(In addition to the above described functioning, transmitting said messages in examples #9 and #10 causes apparatus at subscriber stations of particularly slow microcomputers, 205, said field distribution system, 93, to function in the restoring efficiency fashion described above. Receiving each of said commence-outputting messages causes a decoder, 203, of at least one of said stations to input particular second-condition-test-failed instructions to its associated microcomputer, 205, causing said microcomputer, 205, to jump to and commence processing additional instructions of its received program instruction set of Q.1 rather than to commence outputting locally generated combined medium programming. For example, receiving said 1st commence-outputting message (#10) (or (#9)) causes at least one decoder, 203, of at least one station to input the aforementioned second-condition-test-failed instructions to a microcomputer, 205, causing at least one microcomputer, 205, to jump to and execute the instructions caused to be executed by the aforementioned clear-and-continue instructions described above. Automatically, said microcomputer, 205, ceases its current function; stores particular information at particular instruction-at-which-to-resume memory that identifies the location of the particular instruction at which to resume said function; executes the aforementioned when-interrupted portion of said program instruction set of Q.1 [or of Q in the case of example #9]; and determines, under control of the instructions of said portion, that said second-condition-test-failed instructions constitute the first instance of video overlay second-condition-test-failed instructions that microcomputer, 205, has received while under control of said program instruction set of Q.1 [or of Q]. So determining causes said microcomputer, 205, to jump to the aforementioned first-clear-and-continue address of the instructions of said program instruction set of Q.1 [or of Q] and to commence executing first-clear-and-continue instructions at said address. Automatically, said microcomputer, 205, clears video RAM; sets the background color of video RAM to transparent black; determines that 1st working memory of said microcomputer, 205, holds particular quadrant information; and causes selected binary image information of said number a telephone number to be placed at bit locations that produce video image information in the lower middle portion of a video screen. Automatically, said microcomputer, 205, places information at particular Flag-interrupt register memory which information causes said microcomputer, 205, subsequently to jump over and not reexecute said first-clear-and-continue instructions. Then automatically, said microcomputer, 205, resumes executing instructions of said program instruction set of Q.1 [or of Q] at the location identified by the information at said instruction-at-which-to-resume memory.)

Preprogramming Receiver Station Operating Systems

So-called "operating systems" are well known in the art and generally comprise the most basic form of processor control instructions. In order to control fundamental aspects of the processing of any given data file, such as a DATA_OF.ITS or DATA_OF.URS file, under control of any given computer program, such as a PROGRAM.EXE program, a computer is usually preprogrammed with an operating system that controls such fundamental aspects as, for example, so-called "input/output" functions. One such system that is commonly known as "PC-DOS" or "MS-DOS" is an operating system of the IBM personal computer, commonly known as the "IBM PC." (PC-DOS or MS-DOS is described in Disk Operating System of the IBM Personal Computer Computer Language Series.)

Many computers are designed to hold operating system instructions at RAM. The IBM PC is one such computer. When power is turned on to an IBM PC, under control of particular instructions that are permanently recorded at ROM and are commonly known as "ROM BIOS", said PC accesses a disk at a particular disk drive and loads the instructions of a particular prerecorded file from said disk to particular locations of RAM in a fashion well known in the art that is commonly known as "booting."

One advantage of recording operating system instructions at memory such as RAM that can be conveniently overwritten relates to expanding system functions. New so-called "routines" can easily be entered into a given system to control existing apparatus of said system in new functions, and the operating system of a given system can be expanded easily to control newly installed apparatus. Thus many versions usually exist of any given operating system which versions have greater or lesser capacities. For example, versions 1.00, 1.10, 2.00, etc. exist of PC-DOS and MS-DOS. Each version has capacity for controlling the operation of an IBM PC, and later versions generally have expanded capacities in comparison to earlier versions.

Efficient operation of any given computer system of the present invention requires capacity to control the preprogramming of the operating system software of receiver station apparatus.

Receiver station apparatus of the present invention is extensive and can vary greatly from station to station. For example, apparatus that requires preprogramming at the station of FIG. 7, includes microcomputer, 205; controllers, 12 and 20, of signal processor, 200; the RAMs associated with the processors, 39B and 39D, and with the control processor, 39J, of decoder, 30, of signal processor, 200; and the RAMs associated with the processors, 39B and 39D, and with the control processor, 39J, of other decoders of said station such as decoders, 203 and 282. Other ultimate receiver stations can include less apparatus, more apparatus, or simply different apparatus. (For example, one receiver station may have the decoder, 203/SPAM controller, 205C, apparatus of example #1 while another station has the preferred decoder, 203, apparatus of example #3.) Furthermore, the complete computer system of a remote network origination and control station such as the program originating studio that transmits the program unit of Q in example #10 involves apparatus not only at ultimate receiver stations but also at intermediate transmission stations.

One objective of the unified system of programming communication of the present invention is standardization of receiver station operating systems. With standardization, any given transmission station such as the program originating studio of example #10 can assemble and take control of a computer system of the computers of selected subscriber stations in the fashion described above in example #7 without any need to preprogram system software at any apparatus of said selected subscriber stations.

Another objective of the present invention is flexibility and convenience in reprogramming operating systems in order to expand system functions.

The present invention provides means and methods whereby one remote system master control station can preprogram all intermediate transmission stations and ultimate receiver station in a given geographical area (such as, for example, the continental United States of America) by transmitting a given sequence of SPAM messages that contain operating system instructions which sequence is received at and processed by all receiver stations and from which selected stations select selected messages that contain instructions of specific relevance. Each message is addressed to specific station SPAM control apparatus such as ITS computers, 73, in the case of intermediate transmission stations and URS signal processors, 200, in the case of ultimate receiver stations. Each message consists of a "01" header; execution segment information addressed to the appropriate station SPAM control apparatus; meter-monitor information that identifies not only a specific preprogrammable apparatus such as URS decoders, 203, but also the particular version of said apparatus (for example, URS decoders, 203, of the version illustrated above in example #1 rather than example #3); padding bits as required; an information segment that consists, itself, of a particular SPAM message without an end of file signal; and an end of file signal. The information of each information segment consist of a "01" header; execution segment information addressed to said specific preprogrammable apparatus version which segment information causes said apparatus version to invoke its ROM preprogramming instructions; appropriate meter-monitor information that may include particular meter instructions; padding bits as required; and an information segment that contains the operating system instructions of said specific apparatus version.

Each appropriate receiver station apparatus that receives and processes a SPAM message of said sequence is preprogrammed with the necessary controlled-function-invoking information and controlled function instructions invoked by said message, and the information and instructions so invoked are preprogrammed at ROM.

Likewise, each specific receiver station SPAM control apparatus has access to specific information that is preprogrammed at non-volatile memory that identifies not only the specific preprogrammable apparatus (such as URS decoders, 203) of said station but also the particular version of said apparatus (for example, URS decoders, 203, of the version illustrated above in example #3).

Figure 8:
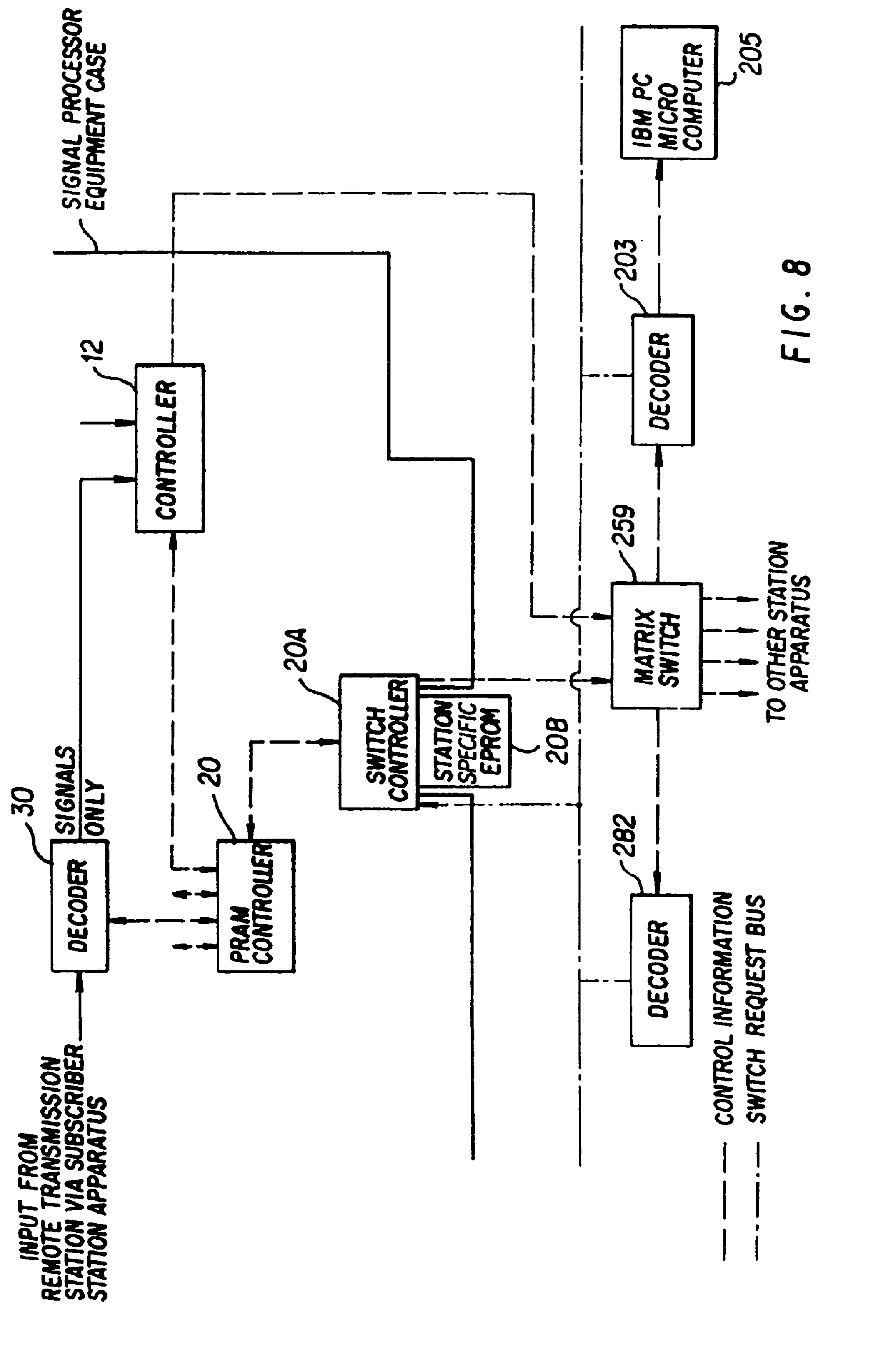
FIG. 8 is a block diagram of selected apparatus of the station of FIG. 7 with a station specific EPROM, 20B, installed.

FIG. 8 illustrates the installation of the station specific non-volatile memory apparatus that identifies specific preprogrammable apparatus of the station of FIG. 7. Said specific non-volatile memory apparatus is station specific EPROM, 20B. Station specific EPROM, 20B, is reprogrammed whenever apparatus is installed at or removed from the station of FIGS. 7 and 8 and contains not only information that identifies specific preprogrammable apparatus of said station but also switch control instructions that identify which particular apparatus input to the specific inputs of matrix switch, 259; that identify which particular outputs of said matrix switch, 259, output to which particular station apparatus; and that control switch controller, 20A, in causing matrix switch, 259, to configure its switches to transfer information from one given station apparatus to another. Station specific EPROM, 20B, is mounted in a cartridge and inserted manually into switch controller, 20A, in a fashion well known in the art, at a port in the equipment case of signal processor, 200. Station specific EPROM, 20B, is also preprogrammed with information of a specific operating system master control frequency of the station of FIG. 7. (FIG. 8 also illustrates other selected apparatus and programming and control information transmission means that process SPAM information in the course of the preprogramming of operating system instructions at selected apparatus of the station of FIG. 7.)

At other ultimate receiver stations, other station specific EPROMs, 20B, are installed in the same fashion with each station specific EPROM, 20B, containing programmed information of the specific apparatus and apparatus versions of its specific station and a specific operating system master control frequency. (Similar station specific non-volatile memory apparatus is installed at each computers, 73, of an intermediate station such as the station of FIG. 6 which non-volatile memory apparatus identifies the specific preprogrammable apparatus of said station.)

An example that focuses, in particular, on preprogramming operating system instructions at the station of FIGS. 7 and 8 illustrates preprogramming receiver station operating systems.

At a particular time such as, for example, 4:00 AM Eastern Standard Time on Jan. 3, 1989, the controller, 20, of the signal processor, 200, of said station causes the oscillator, 6, switch, 1, and mixer, 3, of the signal processor, 200, of the station of FIG. 7 to input a selected frequency to the decoder, 30, and causes said decoder, 30, to commence processing the information of said frequency. Said selected frequency is the specific operating system master control frequency of the information preprogrammed at station specific EPROM, 20B. (Said controller, 20, may be caused so to function in any of the fashions described above that cause a controller, 20, to function. For example, said remote system master control station may transmit particular SPAM message information that causes apparatus at each receiver station, in the fashion of the news items of "AUTOMATING U. R. STATIONS . . . RECEIVING SELECTED PROGRAMMING" above, to tune to and commence processing SPAM information embedded in its preprogrammed specific operating system master control frequency at a selected decoder which decoder is said decoder, 30. Controller, 20, may also cause selected station apparatus such as earth station, 250, and satellite receiver circuitry, 251, to receive the transmission of said frequency and cause selected station apparatus such as matrix switch, 258, to input said transmission to a selected contact of said switch, 1.)

At 4:01 AM, said remote system master control station transmits a SPAM end of file signal causing each receiver station, including the station of FIGS. 7 and 8, to commence identifying and processing the individual SPAM messages embedded in said transmission.

Then said remote master control station commences transmitting said sequence of SPAM messages that contain operating system instructions causing each receiver station to select those specific SPAM messages that contain information applicable to specific preprogrammable apparatus and to program said apparatus.

Said remote station transmits a first SPAM message that contains meter-monitor information of an APPLE II microcomputer, 205, apparatus version and an information segment that contains SPAM message information of APPLE II microcomputer operating system instructions. (APPLE II microcomputers are well known in the art.)

Receiving said message causes the apparatus of the station of FIGS. 7 and 8 to determine that the microcomputer, 205, of said station is not an APPLE II microcomputer and to discard all information of said message. Automatically, decoder, 30, detects said message and executes particular controlled function instructions that cause decoder, 30, to transfer all information of said message, via buffer/comparator, 8, to controller, 12. Automatically, controller, 12, loads the command information (and associated padding bits) of said message at its SPAM-input-signal register memory, executes particular controlled functions, selects the particular meter-monitor information that identifies a specific preprogrammable apparatus version, and inputs to controller, 20, a particular preprogrammed operating-instructions-received-for-specific-apparatus instruction as an interrupt signal together with said information that identifies a specific apparatus version. Receiving said instruction and information causes controller, 20, to transfer said instruction and information to switch controller, 20A, causing switch controller, 20A, to determine, in a predetermined fashion, that no information of an APPLE II microcomputer, 205, exists at station specific EPROM, 20B. So determining causes switch controller, 20A, to transmit a particular preprogrammed discard-operating-system-message instruction to controller, 20, causing controller, 20, to transmit said instruction to controller, 12. Receiving said instruction causes controller, 12, to discard all information of said first SPAM message. (Simultaneously, at stations where the microcomputers, 205, are APPLE II microcomputers, receiving said first message causes apparatus, in a fashion described more fully below, to cause the operating system instructions of said message to be recorded at disk drives of said APPLE II microcomputers, 205, and so-called "booted" at said APPLE II microcomputers, 205.)

Then said remote station transmits a second SPAM message that contains meter-monitor information of an IBM PC microcomputer, 205, apparatus version and an information segment that contains SPAM message information of IBM PC microcomputer operating system instructions.

Receiving said message causes apparatus of the station of FIGS. 7 and 8 to determine that the microcomputer, 205, of said station is an IBM PC microcomputer and to input the contained SPAM message information of said second SPAM message to decoder, 203. Automatically, decoder, 30, detects said message and transfers all information of said message to controller, 12. Automatically, controller, 12, loads at its SPAM-input-signal memory the command information of said message and any padding bits immediately following said command information, selects the meter-monitor information that identifies a specific preprogrammable apparatus version—that is, an IBM PC—and inputs to controller, 20, said operating-instructions-received-for-specific-apparatus instruction together with said information that identifies an apparatus version. Receiving said instruction and information causes controller, 20, to transfer said instruction and information to switch controller, 20A, causing switch controller, 20A, to determine, in a predetermined fashion, that said meter-monitor information that identifies a specific preprogrammable apparatus version matches information that is preprogrammed at station specific EPROM, 20B, and that identifies specific preprogrammable apparatus of the station of FIGS. 7 and 8—in other words, to determine that an IBM PC is the microcomputer, 205, of said station. So determining causes switch controller, 20A, in a predetermined fashion, to cause matrix switch, 259, to configure its switches so as to transfer information inputted from controller, 12, to decoder, 203, then causes switch controller, 20A, to transmit a particular preprogrammed transfer-operating-system-message instruction to controller, 20, causing controller, 20, to transmit said instruction to controller, 12. Receiving said instruction causes controller, 12, to transmit to matrix switch, 259, all information of said second SPAM message after said command and padding bit information recorded at said SPAM-input-signal register memory. In so doing, controller, 12, transfers the information segment and end of file signal of said second message to matrix switch, 259, and causes said switch, 259, to input said information to decoder, 203. (Simultaneously, at stations where the microcomputers, 205, are APPLE II microcomputers, receiving said second message causes the controllers, 12, [functioning with controllers, 20 and 20A, and with EPROMs, 20A] to cause all information of said message to be discarded.)

Said information that is inputted to decoder, 203, is the contained SPAM message of said second SPAM message, and having been separated from the command information and immediately following padding bits of said second SPAM message, said contained SPAM message is a SPAM message in its own right. Said contained message consists of a "01" header; execution segment information that is addressed to URS decoders, 203, of IBM PCs and that causes said decoders, 203, each to invoke its ROM instructions for entering operating system instructions into its microcomputer, 205; appropriate meter-monitor information that may include particular meter instructions; padding bits as required; and an information segment that contains the SPAM operating system instructions of an IBM PC microcomputer. Immediately following the last bit of said information segment is the end of file signal of said second SPAM message which is also the end of file signal of said contained SPAM message. (Another benefit of the message composition fashion of the present invention, which places distinctive signals at the end of messages rather than the beginning, is capacity to transmit any number of contained SPAM messages within the information segment of any given SPAM message that has an information segment and thus that ends with an end of file signal. Said contained messages may be sequential messages or may be nested in the sense of each being contained in the information segment of its preceding message.)

Receiving said contained SPAM message causes decoder, 203, to cause the operating system instructions of said message to be recorded on the recording medium of a disk at a particular disk drive of microcomputer, 205, and to cause microcomputer, 205, to boot the operating system so recorded. Automatically, decoder, 203, executes the controlled functions of its ROM instructions for entering operating system instructions into microcomputer, 205. Automatically, decoder, 205, interrupts the operation of the CPU of microcomputer, 205, and inputs particular instructions to said CPU that cause microcomputer, 205, to load received information in a file at RAM. Automatically, decoder, 203, commences inputting the information segment information of said contained message to microcomputer, 205, and microcomputer, 205, records said inputted information in said file at RAM. Then receiving said end of file signal causes decoder, 203, to cease inputting information segment information to microcomputer, 205, and to cause microcomputer, 205, to record the information of said file in a designated file such as "COMMAND.COM" on a disk at a designated disk drive such as drive A: In so doing, receiving said message causes the operating system instructions in said message to be recorded at the particular disk drive and in the particular file from which the ROM BIOS of said microcomputer, 205, is preprogrammed to load the operating system of said microcomputer, 205, at boot time. When microcomputer, 205, completes recording the information of said file at said disk drive, microcomputer, 205, inputs particular preprogrammed file-recorded information to decoder, 203. Receiving said file-recorded information causes decoder, 203, under control of said ROM instructions for entering operating system instructions, to turn power to said microcomputer, 205, off then on (which decoder, 205, has capacity to do). Automatically, microcomputer, 205, under control of the instructions of said ROM BIOS, boots the instructions of the disk drive file A:COMMAND.COM in a fashion well known in the art, loads the operating system instructions of said file (which are the operating system instructions of said contained SPAM message) at operating system memory, and commences to function at so-called "operating system level" under control of said instructions. (Simultaneously, at other stations where the microcomputers, 205, are IBM PC microcomputers, receiving said contained SPAM message of said second SPAM message causes other decoders, 203, and microcomputers, 205, to cause the operating system instructions of said contained message to be recorded and booted in the same fashion.)

Then said remote station transmits a third SPAM message that contains meter-monitor information of a decoder, 203, apparatus of the example #3 version and an information segment that contains SPAM message information of decoder, 203, of example #3 operating system instructions. (The operating system of a SPAM apparatus such as a decoder, 203, contains all instructions required at said apparatus to control the operation of said apparatus. SPAM apparatus operating system instructions include, in particular, the controlled function instructions and controlled-function-invoking information of said apparatus. Permanent operation system instructions of any given SPAM apparatus are recorded at the ROM of said apparatus.)

Receiving said third message causes apparatus of the station of FIGS. 7 and 8 to determine that a decoder, 203, apparatus of the example #3 version exists at said station and to input the contained SPAM message information of said third SPAM message to decoder, 203. Automatically, decoder, 30, detects said message and transfers all information of said message to controller, 12. Automatically, controller, 12, selects the meter-monitor information that identifies a specific preprogrammable apparatus version—that is, an example #3 version of a decoder, 203—and inputs to controller, 20, said operating-instructions-received-for-specific-apparatus instruction together with said information that identifies an apparatus version. Automatically, controller, 20, transfers said instruction and information to switch controller, 20A, causing switch controller, 20A, to determine, in a predetermined fashion, that said information that identifies an apparatus version matches information that is preprogrammed at EPROM, 20B, and that identifies the decoder, 203, of said station. Automatically, switch controller, 20A, causes matrix switch, 259, to configure its switches so as to transfer information inputted from controller, 12, to decoder, 203, then transmits said transfer-operating-system-message instruction to controller, 20, causing controller, 20, to transmit said instruction to controller, 12, and causing controller, 12, to transmit to matrix switch, 259, all information of the information segment and end of file signal of said third SPAM message. In so doing, controller, 12, inputs said information segment and end of file signal to decoder, 203. (Simultaneously, at stations where the decoders, 203, are of the version of example #1, receiving said third message causes controllers, 12, [functioning with controllers, 20 and 20A, and with EPROMs, 20A] to discard all information of said message.)

Said information that is inputted to decoder, 203, is the contained SPAM message of said third SPAM message and is a complete SPAM message in its own right. Said contained message consists of a "01" header; execution segment information that is addressed to URS decoders, 203, of the example #3 version and that causes said decoders, 203, each to invoke its ROM instructions for entering operating system instructions into its RAM; appropriate meter-monitor information that may include particular meter instructions; padding bits as required; and an information segment that contains the SPAM operating system instructions of an example #3 version decoder, 203. Immediately following the last bit of said information segment is the end of file signal of said third SPAM message which is also the end of file signal of said contained SPAM message.

Receiving said contained SPAM message causes decoder, 203, to record the operating system instructions of said message at particular operating system locations at the RAMs of decoder, 203, and to commence operating under control of said instructions. Automatically, control processor, 39J, compares the execution segment information of said message to controlled-function-invoking information and determines that said execution segment information matched particular load-operating-system-of-203 information that is preprogrammed at the ROM associated with control processor, 39J, and that invokes particular load-operating-system-of-203 instructions that are preprogrammed at the ROM associated with control processor, 39J. Automatically, control processor, 39J, executes said instructions and, under control of said instructions, causes processor, 39B, to cease receiving information from buffer, 39A, then loads all information of the information segment of said message sequentially at the RAM associated with control processor, 39J, (which has capacity to contain all information of an operating system of an example #3 version decoder, 203) starting at the first bit location of said RAM and overwriting, if necessary, the information of all bit locations of said RAM. Then, receiving interrupt information of an end of file signal from EOFS valve, 39F, causes control processor, 39J, automatically, under control of said load-operating-system-of-203 instructions, to load all information so loaded at selected operating system locations of decoder, 203. Automatically, control processor, 39J, selects particular information at particular first bit locations of said RAM (which information is particular first binary information of the information segment of said contained SPAM message) and determines the composition of the operating system information so recorded at RAM by processing said information in a predetermined fashion under control of said load-operating-system-of-203 instructions. Automatically, control processor, 39J, inputs particular commence-loading-operating-system instructions to processor, 39B; selects the binary information of particular bit locations at said RAM; and inputs said information to processor, 39B, thereby causing processor, 39B, to record said information sequentially at particular operating system locations of the RAM associated with said processor, 39B, beginning at the first bit location of said RAM. Automatically, control processor, 39J, then inputs said commence-loading-operating-system instructions to processor, 39D; selects the binary information of particular bit locations at said RAM associated with said control processor, 39J; and inputs said information to processor, 39D, thereby causing processor, 39D, to record said information sequentially at particular operating system locations of the RAM associated with said processor, 39D, beginning at the first bit location of said RAM. Automatically, control processor, 39J, then selects the binary information of a particular first signal word of bit locations and a particular second signal word of bit locations at said RAM associated with said control processor, 39J; and inputs said selected information separately to EOFS valves, 39F and 39H, thereby causing said valves, 39F and 39H, each to record at its EOFS Standard Word Location the information of said first signal word of bit locations and at its EOFS Standard Length Location the information of said second signal word of bit locations. In so doing, receiving said third messages may causes said decoder, 203, subsequently to commence detecting end of file signals of new composition and/or length. (In other words, thereafter said valves, 39F and 39H, may detect end of file signals that are composed of, for example, fifteen sequential instances of "11101110" binary information rather than eleven sequential instances of "11111111" binary information.) Automatically, control processor, 39J, then moves selected binary information of particular bit locations at said RAM associated with said control processor, 39J, to particular operating system locations of said RAM, beginning at the first bit location of said RAM. In so doing, control processor, 39J, completes causing all operating system instructions of said contained SPAM message to be located at the appropriate operating system RAM locations of said decoder, 203. Then automatically, under control of said commence-loading-operating-system instructions, control processor, 39J, causes all buffer, non-operating system RAM, and non-operating system register locations of decoder, 203, (except for buffer, 39A) to be cleared; causes all other apparatus of decoder, 203, to commence processing under control of the new operating system instructions; causes processor, 39B, to commence receiving and processing information from buffer, 39A; and commences waiting for information of a SPAM header under control, first, of a particular new operating system instruction that is located at a predetermined location said RAM associated with control processor, 39J. (Simultaneously, at other stations where the decoders, 203, are of the example #3 version, receiving said third SPAM message causes other apparatus to load the operating system instructions of the contained SPAM message of said third message at the appropriate operating system RAM locations of said decoders, 203, and causes said decoders, 203, to come under control of said instructions in the same fashion.)

Subsequently, said remote station transmits additional operating system SPAM messages until one SPAM message has been transmitted that is addressed to each separate version of SPAM apparatus. Each message contains meter-monitor information of its apparatus version and an information segment that contains SPAM message information operating system instructions of said version.

Receiving each message causes apparatus of each receiving station, in the fashions described above, to determine whether an apparatus of the apparatus version identified by the meter-monitor information of said message exists at said station, to input a contained SPAM message to an apparatus of said apparatus version if an apparatus of said apparatus version exists at said station, and to discard all information of said message if no apparatus of said apparatus version exists at said station. (Said contained messages that are addressed to apparatus such as decoder, 30, PRAM controller, 20, and switch controller, 20A, that exist within the equipment case of a signal processor, 200, are inputted to said apparatus from controller, 12, via controller, 20, rather than via matrix switch, 259.)

Receiving each contained SPAM message causes the apparatus version of said message, in the fashion described above, to record the operating system instructions and information of said message to at particular operating system locations at the RAMs and EOFS valves that control the operation of said apparatus and to commence operating under control of said instructions and information.

Following the transmission of each message, for a particular interval of time no SPAM information is transmitted that is causes any processing at any apparatus of the apparatus version of message. Said interval is the length of time required for the slowest apparatus of said apparatus version to receive said message, record the operating system instructions and information of said message, and commence operating under control of said instructions and information.

The Preferred SPAM Header

An important feature of the preferred embodiment of the present invention is flexibility for expansion while continuing to accommodate, within the unified system, existing information requirements. Subscribers who have simple information demands must have capacity to receive and process simple SPAM messages with simple subscriber station apparatus. Such simple messages may contain, for example, only sixty-four alternate instances of SPAM execution segment binary information, and the optimal length of SPAM execution segment information for such subscribers would be six binary digits. Simultaneously, subscribers who have complex information demands must have capacity to receive and process more complex SPAM messages that control more extensive subscriber station apparatus. Controlling the subscriber station apparatus of subscribers who have complex information demands far more execution segment capacity than is provide by a system that has only six binary digits of execution segment information transmission capacity. And invariably, many different classes of subscriber will exist with different information demands and different optimal SPAM execution segment lengths.

Two objectives of the unified system of the present invention are to provide capacity whereby any given transmission can transmit SPAM messages to all classes of subscribers and capacity whereby the apparatus of subscribers with complex information demands can process not only complex messages but also simple messages. More precisely, the present invention provides means and methods whereby SPAM messages of different execution segment lengths can be transmitted, intermixed on one transmission, and complex SPAM receiver apparatus with capacity to process long SPAM execution segment information can also process short SPAM execution segment information.

In the preferred embodiment these objectives are realized by having SPAM header information identify not only the four alternate message compositions of the simplest preferred embodiment specified above but also many alternate versions of message composition.

In the preferred embodiment, the length of a SPAM header—and of the SPAM-header register memory of any given SPAM apparatus—is the length of one signal word which is one byte of eight binary digits. SPAM messages are composed of varying numbers and sequences of segments of highest priority, intermediate priority, and lowest priority segment information. Complex SPAM receiver apparatus have means and are preprogrammed to process at register memory execution segment information of varying lengths of binary information. And simple SPAM receiver apparatus are preprogrammed to process at RAM and/or ROM SPAM messages that are too complex to be processed at their register memories (if only to discard said messages).

A Summary Example #11

And the General Case

The full scope of the unified system of programming communication of the present invention comprehends and includes all of the above described apparatus and methods in all of their variations.

An example #11 that focuses on generating and communicating information of farmers at a time in the future illustrates a few features of the full scope of the present invention.

In February, 2027, farmers all over Europe make plans regarding which crops to plant for the 2027 growing season. Each farmer is confronted with the problem of deciding what mix of crops is most profitable to grow on his property, given his resources. Each farmer has a subscriber station that is identical to the station of FIG. 7 except that each station has two television recorder/players that are recorder/players, 217 and 217A; two television tuners, 215 and 215A; and a laser disk player, 232. Particular farm information of the specific farm of each farmer is recorded in a file named MY_FARM-.DAT on a disk at the A: disk drive of the microcomputer, 205, of each station. The recorded data includes, for example, data of the number and size of the individual parcels of property of the farmer's farm, the soil conditions of said parcels, the aspects of said parcels with respect to sunlight and shade, the history of crop rotation of said parcels, the farm equipment of said farmer, and the financial resources of said farmer. Each farmer's laser disc player, 232, is loaded with a so-call "optical disk" on which is recorded a file named "PROPRIET-.MOD" that contains encrypted information of a proprietary software module. When accessed, the instructions of said module cause a microcomputer, 205, to analyze any given crop planting plan and generate information of a recommended planting plan and growing method that minimizes the expense of insect and other crop pest damage given maximum revenue.

Elsewhere and at the same time, national planners of each member nation of the European Economic Community seek to formulate agricultural policy for the 2027 growing season and to communicate information of that policy to farmers, thereby influencing the farmers decisions regarding which crops to plant. Each nation has a national intermediate transmission station that is identical to the intermediate station of FIG. 6 except that it transmits output information of several individual television channels to receiver stations via a satellite in geosynchronous orbit over Europe rather than via a cable field distribution system. At the computer, 73, of each national intermediate transmission station is local-formula-and-item information of specific data, in a file named NATIONAL.AGI, regarding proposed subsidy formulas and items regarding the various alternate crops that farmers of the nation may choose to grow.

Simultaneously, other national planners of each nation seek to formulate other economic policies including tax and revenue raising policies and monetary policies. At the computer, 73, of each national intermediate transmission station, in a file named NATIONAL.TAX, is local-formula-and-item information of specific proposed tax formulas and items regarding, for example, taxes on farm incomes and proposed depreciation schedules of farm equipment. And in a file named NATIONAL.MON is local-formula-and-item information of specific proposed money supply growth rates and interest rates.

Each nation also has a plurality of local governments at which local planners seek to formulate local tax and revenue raising policies and welfare and subsidized employment policies. Each local government has a local intermediate transmission station that is identical to the intermediate station of FIG. 6 and that transmits multiplexed output information of several separate television channels via a cable field distribution system. At the computer, 73, of each local intermediate transmission station, in a file named LOCAL.TAX, is local-formula-and-item information of specific proposed tax formulas and items regarding, for example, income taxes that relate to farmers and property taxes that relate to farm land and equipment. And in a file named LOCAL.EMP is local-formula-and-item information of specific proposed employment subsidy formulas relating to local unemployed persons which formulas vary with respect to the specific education levels of the unemployed.

Just as government planners wish to communicate policy information to and receive response information from farmers, so too, businessmen wish to advertise to farmers the benefits of their goods and proprietary information services and to persuade farmers to respond by ordering their goods and services.

Each farmer's station has capacity and is preprogrammed to receive programming transmitted via satellite by a particular European master network origination and control station and the specific national intermediate transmission station of the specific nation of said farmer and is a subscriber station in the field distribution system of the local intermediate transmission station of the farmer's local government.

At 3:00 AM Greenwich Mean Time on Monday, Feb. 15, 2027, the signal processor of each receiver station in the nations of the European Economic Community—including each national and each local intermediate transmission station and each ultimate receiver station of a farmer—commences receiving information of the particular master transmission of said European master network station. Automatically, the controller, 20, of the signal processor of each receiver station in said nations causes its oscillator, 6, switch, 1, and mixer, 3, to input a selected frequency to its decoder, 30, and causes said decoder, 30, to commence processing the information of said frequency. Said selected frequency is the specific operating system master control frequency of the information preprogrammed at its station specific EPROM, 20B. Automatically each receiver station that is equipped with a satellite earth station (50 in FIG. 6 or 250 in FIG. 7) receives and inputs to its switch, 1, information of a particular master transmission of said European master network station. Then the controller, 20, of the signal processor of the signal processor system, 71, of each intermediate transmission station (of FIG. 6) in said nations causes the computer, 73, of said station to cause apparatus of said station also to retransmit information of said master transmission on the frequency of a selected master channel transmission. Automatically each receiver station that is not equipped with a satellite earth station commences receiving and inputting to its switch, 1, information of said master transmission that is retransmitted on the frequency of a selected master channel transmission of a selected intermediate transmission station.

At 3:10 AM, GMT, said European master network station transmits particular SPAM message information, embedded in the information of said master transmission, including a SPAM end of file signal and the aforementioned sequence of SPAM messages that contain operating system instructions. In so doing, said European master network station inputs operating system instructions to all SPAM apparatus and receiver station computers, 73, and microcomputers, 205, thereby causing said apparatus and computers, 73 and 205, as described above in "PREPROGRAMMING RECEIVER STATION OPERATING SYSTEMS," to commence operating under control of the instructions of said operating systems.

Causing each signal processor at every receiver station in said nations to commence operating under control of its specific operating system instructions causes apparatus of each signal processor to commence processing sequentially information of a plurality of specific frequencies in the fashion of example #5 to detect program unit identification signal information. One frequency that is processed at each receiver station is the specific operating system master control frequency of the information preprogrammed at the station specific EPROM, 20B, of said station. Said frequency is either said master transmission of said European master network station or a selected master channel transmission of a selected intermediate transmission station upon which information of said master transmission is retransmitted. Thus information of said master transmission is processed at each receiver station for program unit identification information of interest.

In due course, various transmission stations commence embedding program unit identification signal information in programming transmissions and transmitting the transmissions.

Transmitting the programming with said embedded program unit identification information causes signal processors at selected receiver stations each to commence selecting and receiving specific programming of interest in the fashion of "AUTOMATING U. R. STATIONS . . . RECEIVING SELECTED PROGRAMMING." Automatically receiver stations all over said nations commence tuning to different transmissions and receiving selected programming that differs from receiver station to receiver station.

At 3:59 PM, GMT on Monday, Feb. 15, 2027, said European master network station commences embedding in the information of said master transmission and transmitting program unit identification information of a particular combined medium television program, "Farm Plans of Europe."

Farmers and government planners all over Europe wish to receive and interact with the information of said program and have preprogrammed the apparatus of their stations to receive and combined to the programming transmission of said program. Thus so transmitting said program unit identification information of said "Farm Plans of Europe" program causes apparatus at the ultimate receiver stations of farmers in all of said nations to interconnect display (or other output apparatus) to the transmission of said program and to combine to the computer system of said transmission in the fashions described in example #10 and in "AUTOMATING U. R. STATIONS . . . MORE ON EXAMPLE #7 . . . RECEIVING SELECTED PROGRAMMING AND COMBINING SELECTED URS MICROCOMPUTERS, 205, AUTOMATICALLY TO THE COMPUTER SYSTEM OF A SELECTED PROGRAMMING TRANSMISSION." Automatically each ultimate receiver station that is equipped with a satellite earth station, 250, commences transferring received information of said master transmission, via its matrix switch, 258, to its divider, 4, (thereby inputting said received information to its computer, 205, and its decoder, 203) and commences transferring the television output information of its microcomputer, 205, to its television monitor, 202M, thereby causing display and emission of the television images and sound of said output information. Automatically each receiver station that is not equipped with a satellite earth station tunes its tuner, 215, to receive the specific master channel transmission of its specific selected local intermediate transmission station (which retransmits the master transmission of said European European master network station on its master channel transmission) and commences transferring received information of said master channel transmission, via its matrix switch, 258, to its divider, 4, (thereby inputting said received information to its computer, 205, and its decoder, 203) and commences transferring the television output information of its microcomputer, 205, to its television monitor, 202M, thereby causing display and emission of the television images and sound of said output information.

At 3:59:45 PM, GMT said European master network station embeds in the information of said master transmission and transmits a SPAM message that is addressed to the ITS computers, 73, of intermediate stations that are local stations.

Receiving said message causes each of said local intermediate station automatically to tune selected receiver apparatus to the specific satellite transmission that is the particular second television channel output transmission of its specific national intermediate transmission station and to input the embedded SPAM information of said transmission to its computer, 73, thereby causing said computer, 73, to come under control of the output transmission of the computer, 73, of its national intermediate station.

At 3:59:55 PM, GMT, said European master network station transmits end of file signal information then invokes broadcast control of each national intermediate transmission station computer, 73, and each ultimate receiver station microcomputer, 205, that receives SPAM information of said master transmission. Automatically said European master network station commences controlling directly the computers, 73, of said national intermediate stations and the microcomputers, 205, of said ultimate receiver stations. And said master station causes each national intermediate station computer, 73, to embed in its particular second television channel transmission and to transmit end of file signal information then to invoke broadcast control of the computers, 73, of its specific local intermediate transmission stations.

At 4:00 PM, GMT, said European master network station commences transmitting the conventional television information of said “Farm Plans of Europe” program.

Immediately, said European master network station causes ultimate receiver stations to obscure all video information of said master transmission and display only locally generated information and causes all national intermediate station computers, 73, and ultimate receiver station microcomputers, 205, that are combined to the transmission of said master station to commence receiving SPAM information embedded in the full frame video of said master transmission. Said master station transmits SPAM information that is addressed to URS microcomputers, 205, that causes said microcomputers, 205, to commence combining and displaying locally titles information (while sound is emitted of transmitted audio theme music) in the fashion described in “CONTROLLING COMPUTER-BASED COMBINED MEDIA OPERATIONS.” Then said master station transmits SPAM information that is addressed to ITS computers, 73, of intermediate stations that are national stations and to URS microcomputers, 205, which SPAM information causes decoder apparatus to commence receiving SPAM information embedded in the full frame video of said master transmission at each national intermediate station and each ultimate receiver station where a microcomputer, 205, is combined to the computer system of said master transmission.

Then said European master network station causes said ultimate receiver stations each to commence receiving and emitting at its speaker system, 261, sound information of a selected transmission that transmits audio language information of said “Farm Plans of Europe” program in the specific language that is the primary language of its subscriber. On a selected secondary transmission, said master station transmits, in a fashion well known in the art, a spectrum of radio frequencies containing a plurality of individual frequency transmission each of which expresses the audio of said program in a separate European language including minority languages such as Flemish, Welsh, Basque, etc. (Each local intermediate station receives and retransmits said spectrum on a particular channel frequency spectrum.) Particular specific primary language information is preprogrammed at specific SPAM apparatus (such as, for example, radio decoders, 211). Said master station embeds and transmits particular specific-language SPAM information addressed to said specific SPAM apparatus, and receiving said specific-language information causes said specific apparatus at each ultimate receiver station to tune and emit the sound of the specific primary language of the subscriber of said station (for example, in the fashion of AUTOMATING U. R. STATIONS . . . COORDINATING A STEREO SIMULCAST.”

Next said European master network station transmits in the full frame video of said master transmission a SPAM message that is addressed to ITS computers, 73, of intermediate stations that are national stations and that contains information segment information of a particular national level intermediate generation set. Receiving said message causes each national intermediate transmission station to input to and execute at its computer, 73, the information of said set. (The information of said set and the processing and functioning caused by executing said information are described more fully below.)

Said European master network station then transmits a series of SPAM messages that cause ultimate receiver stations to commence processing combined medium programming of said “Farm Plans of Europe” program and displaying (or otherwise outputting) combined medium information in a particular fashion. First, said master station transmits a SPAM message that causes the signal processor, 200, of each ultimate receiver station to cause its oscillator, 6, switch, 1, and mixer, 3, to input the specific operating system master control frequency of its EPROM, 20B, continuously to its decoder, 30, thereby causing said decoder, 30, to commence processing the information of said frequency continuously. (In so doing, said master station causes SPAM information embedded in said master transmission to be inputted to said signal processor, 200, continuously irrespective of the transmissions inputted to decoders, 145, 203, or 282, and prevents signal processor, 200, from identifying any other programming of interest at its station.) Then said master station embeds and transmits in the full frame video of said master transmission a SPAM message that is addressed to URS microcomputers, 205, that contains information segment information of a particular first program instruction set. Transmitting said message causes the all ultimate receiver station microcomputers, 205, that are combined to the computer system of the transmission of said master station to commence executing the instructions of said set and to commence generating local video, audio, and print overlay and output information in the fashions described above. Then said master station transmit a SPAM message that causes all SPAM decoder apparatus of all national intermediate stations and all ultimate receiver stations with microcomputers, 205, combined to the transmission of said master station to commence receiving SPAM information embedded in only the normal transmission location of said master transmission; commences embedding SPAM information only in the normal transmission location; and commences transmitting the conventional video of said “Farm Plans of Europe” program. And as said master station transmits conventional video and audio information that shows visually and describes aurally information of general interest to farmers in all of said nations, said master station commences periodically embedding and transmitting SPAM messages that are addressed to URS microcomputers, 205, and that cause specific information of each farmer to be generated, under control of the instructions of said program instruction set, at each ultimate receiver station and that cause locally generated information periodically to be displayed or emitted as sound or printed in the fashion of example #10 at each ultimate subscriber station whose microcomputer, 205, is combined to the computer system of said master transmission.

In the mean time, executing their inputted information of said national level intermediate generation set causes the computers, 73, of said national intermediate stations each to generate information of a specific local level intermediate generation set in the fashion that receiving the intermediate generation set of Q caused different intermediate stations to compute and incorporate specific formula-and-item-of-this-transmission information into generally applicable information of the program instruction sets of Q.1 and Q.2 in example #10. Said national level intermediate generation set includes generally applicable information of national agriculture and economic policy information, of local tax formulas and items and employment subsidy formulas, and of farmers' recommended crop planting plans. Said national level set also contains a particular projected market price at which farmers are projected to be able to sell each alternate crop. Each price is projected on the basis of projected demand for each crop and the aggregate quantity that European farmers are projected to supply. In addition, said national level set contains information of the aggregate amount of farm borrowing. Executing the information of said set causes the computer, 73, of each national intermediate transmission station to access its specific NATIONAL.AGI, NATIONAL.TAX, and NATIONAL-.MON files and to compute formula-and-item-of-this-transmission information specific subsidy formulas and items regarding each alternate crop that national farmers may grow, regarding specific tax formulas and depreciation schedules, and regarding specific monetary growth and interest rates, all given the specific market price information of said national level intermediate generation set and the projected aggregate amount of farm borrowing. Having computed said formula-and-item-of-this-transmission information, each computer, 73, is caused to incorporate said information selectively into selected generally applicable information of said national level set, thereby generating at each of said computers, 73, a specific local level intermediate generation set that applies to the local intermediate transmission stations of its nation.

After an interval of time that is long enough for each national intermediate generation station to generate its specific local level intermediate generation set, said European master network station embeds and transmits a SPAM message that is addressed to ITS, computers, 73, of intermediate stations that are national stations and that instructs said stations to embed and transmit their specific local intermediate sets.

Receiving said message causes the computer, 73, of each national intermediate station to embed in the normal location of its particular second television channel transmission and to transmit a particular SPAM message that is addressed to ITS computers, 73, and that contains information segment information of its specific local level intermediate generation set.

Receiving the specific SPAM message of its national intermediate station causes the computer, 73, of each local intermediate station to execute the contained local level intermediate generation set of said message and to generate information of a specific program instruction set in the fashion that executing the intermediate generation set of Q caused different intermediate stations in example #10 to generate their specific program instruction sets of Q.1 or Q.2. Executing the information of its local level set causes the computer, 73, of each local intermediate station to access its specific LOCAL.TAX and LOCAL.EMP files and to compute formula-and-item-of-this-transmission information of specific local income and property tax formulas and local employment subsidy formulas, all given the specific market price information, the projected aggregate amount of farm borrowing, the specific national subsidy formulas and items regarding each alternate crop that national farmers may grow, the specific national tax formulas and depreciation schedules, and the specific national monetary growth and interest rates that are information of its local level intermediate generation set. Automatically, each computer, 73, of a local intermediate station incorporates its computed information selectively into selected generally applicable information of said local level intermediate generation set, compiles information, and links information, thereby generating its specific program instruction set.

At 4:29:50 PM, GMT, after an interval of time that is long enough for each local intermediate generation station to generate its specific program instruction set, said European master network station transmits a particular SPAM first-master-cueing message (#11) that is addressed to ITS computers, 73, of intermediate stations that are national stations. Receiving said message causes each national intermediate station to generate and embed in the normal location of its particular second television channel transmission a particular SPAM first-national-cueing message (#11) that is addressed to ITS computers, 73, of intermediate stations that are local stations.

Receiving said message causes each local intermediate station to commence playing prerecorded programming loaded at its recorder, 76, and transmitting said programming to its field distribution system, 93, on the television channel transmission that is the master channel transmission of said intermediate station. In so doing, each local intermediate station commences transmitting television information of a national and local segment of the "Farm Plans of Europe" program. (Each national intermediate station can have transmitted said prerecorded programming to its local intermediate stations and caused said stations to organize said programming in the fashion of examples #8 and #9 or, alternatively, said first-national-cueing message (#11) could cause each local station to commence transmitting on its master channel transmission the its received television transmission of the second television channel output transmission of its specific national intermediate transmission station.)

Automatically each ultimate receiver station that is not equipped with a satellite earth station (and which is, as a consequence, receiving the master transmission of said European master station retransmitted on the master channel transmission of its local intermediate transmission station) commences receiving the programming transmitted by the recorder, 76, of its local intermediate station.

At 4:29:55 PM, GMT, said European master network station embeds in its master transmission and transmits a particular SPAM second-master-cueing message (#11) that is addressed to URS microcomputers, 205.

Only ultimate receiver stations that are equipped with and that receive the information of said master transmission directly by means of satellite earth station apparatus receive said second-master-cueing message (#11), and receiving said message causes said stations each to receive and process the combined medium programming of the television channel transmission that is the master channel transmission of its particular local intermediate transmission station (of which transmission information is preprogrammed at its EPROM, 20B). Automatically, a tuner, 215, is tuned at each of said stations to receive the particular master channel transmission of the EPROM, 20B, of said station and apparatus of said station interconnects to input the received master channel transmission to the microcomputer, 205, and the decoder, 203, of said station.

In due course, each recorder, 76, transmits prerecorded end of file information then a particular transmit-program-instruction-set SPAM message (#11) addressed to ITS computers, 73.

In the fashion of example #9, each local intermediate station detects the particular SPAM message of its recorder, 76, at its decoder, 77, and receiving its particular message causes each station to embed and transmit end of file signal information then a particular first SPAM message that is addressed to URS microcomputers, 205, and that contains complete information of its particular program instruction set. (In example #11, the local stations are preprogrammed in such a fashion that receiving its specific transmit-program-instruction-set message (#11) causes each station to transmit the program instruction set generated by the local intermediate generation set of its national intermediate station rather than by a prerecorded intermediate generation set previously transmitted by its recorder, 76.) Subsequently, additional SPAM messages that are embedded in said prerecorded programming and that are addressed to URS microcomputers, 205, are transmitted by said recorder, 76.

Receiving the particular first SPAM message of its local intermediate station causes apparatus of the subscriber station of each farmer to execute the contained program instruction set of said message at the microcomputer, 205, of said station and to commence generating the specific combined medium output information of its subscriber station. And receiving said additional SPAM messages causes apparatus at each subscriber station of a farmer to display or otherwise output (or to cease displaying or otherwise outputting) combined medium program of said national and local segment of the "Farm Plans of Europe" program. Automatically, the display and output apparatus of each farmer's station commences displaying and outputting television picture image, sound, and print information of the national and local agricultural, economic, tax, and employment subsidy policies combined periodically with related locally generated information of specific relevance to each farmer.

So executing a specific contained program instruction set causes each microcomputer, 205, to generate a specific so-called "optimal" solution for its particular farmer's problem of deciding what mix of crops is most profitable to grow on his property, given his resources.

First, each microcomputer, 205, accesses the specific information of its particular farmer. Automatically, under control of its specific received program instruction set, each microcomputer, 205, accesses the file, MY_FARM.DAT, that is prerecorded on the disk loaded at its A: disk drive and also accesses the encrypted "PROPRIET.MOD" file that is prerecorded at the laser disc player, 232, of each farmer's station (the information of which last named file is prerecorded by any one of a plurality of proprietary services companies whose information any given farmer may acquire and the information of which varies from farmer's station to farmer's station).

To access the information of its encrypted "PROPRIET.MOD" file, the instructions of its particular program instruction set cause each microcomputer, 205, to decrypt the information of said file and enter the decrypted information of said file at particular RAM. In so doing, said instructions also cause each signal processor, 200, to retain meter information of the decryption of said file. (Selected stations that are preprogrammed to retain monitor information are also caused to retain monitor information.) The information of said file is embedded in the so-called "full frame" video at a laser disc loaded at the disk player, 232, of each station intermixed with SPAM messages that control the decryption and metering of the information of said file. Automatically, at the beginning of a particular interval during which its local intermediate station transmits no SPAM message information to URS microcomputers, 205, instructions of its particular program instruction set cause each microcomputer, 205, to instruct its signal processor, 200, to cause its laser disk player, 232, to play. Then, in the fashion of example #7, apparatus of each station are caused to decrypt and retain meter information of the decryption of the encrypted information of said file. (At each station, in a predetermined fashion that is controlled by the instructions of its program instruction set, apparatus is caused, to input the received television information transmitted by the recorder, 76, of its local intermediate station directly from its tuner, 215, to its TV monitor, 202M then to input the decrypted information of its "PROPRIET.MOD" file to its microcomputer, 205, via its decoder, 203, then to recommence inputting said received television information from its tuner, 215, to its TV monitor, 202M, via its divider, 4, and microcomputer, 205.)

Then using linear programming techniques that are well known in the art, each farmer's microcomputer, 205, under control of the particular program instruction set generated and transmitted by its local intermediate station, computes its particular farmer's "optimal" crop planting plan by making reference to said farmer's specific data that includes, for example, the number and size of the individual parcels of property of the farmer's farm, the soil conditions of said parcels, the aspects of said parcels with respect to sunlight and shade, the history of crop rotation of said parcels, the farm equipment of said farmer, and the financial resources of said farmer; by using said data as so-called "constraints"; and by applying information of said program instruction set. Said information that is applied includes the specific market price information and projected aggregate amount of farm borrowing transmitted by said European master network control station as generally applicable information in its outputted national level intermediate generation set; the specific national subsidy formulas and items regarding each alternate crop that national farmers may grow, the specific national tax formulas and depreciation schedules, and the specific national monetary growth and interest rates that were incorporated at the national intermediate station of each farmer into the generally applicable information of said national level intermediate generation set to generate its local level intermediate generation set; and the specific local income and property tax formulas and local employment subsidy formulas that were incorporated at the local intermediate station of each farmer into the generally applicable information of its received local level intermediate generation set to generate its program instruction set (which is the program instruction set received at said farmer's station).

The specific "optimal" crop planting plans so computed vary from station to station and include budget information of projected revenues, expenses, and profits. The plan of one particular farmer calls for planting forty acres of oats and sixty acres of wheat and projects profits of fifteen thousand units of local currency. The plan of a particular second farmer calls for planting fifteen acres of broad beans and five acres of tomatoes and projects profits of thirty thousand units of local currency. The plan of a particular third farmer calls for planting ten acres of red tulips and two acres of blue tulips and projects profits of twenty thousand units of local currency.

Each specific "optimal" crop planting plan may also include so-called "sensitivity analyses" that are well known in the art and information of alternate planting plans that are close to but not quite optimal.

Automatically, under control of its received program instruction set, the microcomputer, 205, of its farmer's station records complete information of said farmer's crop planting plan at its A: disk in a file named PLANTING.DAT.

Then automatically, under control of its particular program instruction set, each farmer's microcomputer, 205, computes and retains information of a particular schedule of spot commercials. Information of twenty-six specific potential commercials of any given schedule are included in the information of its set, and the specific commercials include, for example, commercials for a particular new farm truck, a particular new farm tractor, a particular new farm disk harrow, software of a particular new "PROPRIET.MOD" module for analyzing crop planting plans and generating recommended planting plans in a "new improved fashion," etc. Under control of the instructions of its particular set, by analyzing the budget information of its farmers crop planting plan, each microcomputer, 205, automatically identifies four commercial spots that are of a particular possible highest potential value to its farmer. For example, by analyzing equipment depreciation information, one microcomputer, 205, determines that its farmer has an old truck, a new tractor, and a new disk harrow and selects, as one of its four commercials, the commercial of the new truck. Meanwhile, another microcomputer, 205, determines that its farmer has an old truck, a new tractor, and a old disk harrow and selects the commercial of the new truck because a new truck is costlier than a disk harrow and may be more valuable to its farmer. Automatically, the microcomputer, 205, of each station inputs to the signal processor, 200, of its station particular schedule information of its four identified commercial spots.

In due course, the recorder, 76, of each local intermediate station transmits further additional SPAM messages that are embedded in its prerecorded programming and that are addressed to URS microcomputers, 205, then transmits a particular local-second-cueing message (#11) that is addressed to ITS computers, 73.

Receiving the further additional SPAM messages of its local intermediate station causes apparatus at each subscriber station of a farmer to display or otherwise output (or to cease displaying or otherwise outputting) further combined medium programming of said national and local segment of the "Farm Plans of Europe" program. Automatically, in the fashion of example #10, the display and output apparatus of each farmer's station commences displaying and outputting generally applicable television picture image, sound, and print information of a crop planting plan combined periodically with related locally generated specific crop planting plan information of its specific farmer. Automatically, crop and budget information of the aforementioned optimal crop planting plan of each farmer is explained in the outputted the generally applicable programming and is displayed, emitted in sound, and printed at the station of each farmer.

Then so transmitting a particular local-second-cueing message (#11) at each local intermediate station causes a decoder, 77, at each station to detect the local-second-cueing message (#11) transmitted at its station and input said message to the computer, 73.

Receiving its local-second-cueing message (#11) causes the computer, 73, of each local intermediate station to embed SPAM message information that is addressed to URS signal processors, 200, in the normal location of its master channel transmission then after a particular interval to cause the video recorder/player, 78, of its station to commence playing and to cause apparatus of its station to transmit the output of said recorder/player, 78, to the field distribution system of said station on the television transmission of a particular second television channel.

Transmitting said SPAM message information at its local intermediate station causes apparatus of each farmer's station to receive and input said information to the signal processor, 200, of said station, and receiving said information causes the signal processor, 200, of said station to cause its tuner, 215A, to commence receiving the transmission of the particular second television channel of its local intermediate station; to cause apparatus of said station to interconnect to transfer the transmission received at said tuner, 215A, to a selected video recorder/player, 217 or 217A; and to cause said video recorder, 217 or 217A, to prepare to record selected programming.

Then after an interval that is long enough for each of its subscriber stations to prepare a selected recorder/player, 217 or 217A, to record selected programming, each computer, 73, causes said recorder, 78, to commence playing. In so doing, each computer, 73, causes twenty-six program units of commercial spot programming to be transmitted, in series, to its subscriber stations. Each program unit is preceded by embedded program unit identification information of its own that is addressed to URS signal processors, 200.

Automatically, the signal processor, 200, of each station causes its recorder/players, 217 and 217A, in the fashion that applied to computer, 73, and recorders, 76 and 78, in example #8, to record and then to organize to play the selected programming of the selected commercial spots of its station. Automatically, a decoder, 282A, at the tuner, 215A, of each station detects each datum of program unit identification information received at its tuner, 215A, and inputs each datum to the signal processor, 200, of its station. Automatically, said signal processor, 200, causes a selected recorder/player, 217 or 217A, to record selected programming then, after a particular last unit is received, to organize the recorded programming to play according to its schedule previously inputted by its microcomputer, 205.

In due course, the instructions of the program instruction set received at each farmer's station cause a particular module, TELEPHON.EXE, to be recorded at a particular disk drive of the microcomputer, 205, of each farmer's station (in the fashion of the file, "SHOPPING.EXE" in example #10) which, when executed, will permit the farmer to modify the information of his specific crop planting plan and associated budget and to transmit the specific information of his plan (as modified if modified) to a particular data collection computer at a remote station.

Then a particular second-cueing message (#11) that is embedded at the end of the prerecorded national and local segment of the "Farm Plans of Europe" programming at the recorder, 76, of each local intermediate station and that is addressed to URS signal processors, 200, is transmitted and causes the signal processor, 200, of each farmer's station to separate the apparatus of its station from the master channel transmission and second television of its local intermediate station; to cause its recorder/players, 217 and 217A, to commence playing their prerecorded commercial spot programming in the fashion of example #8, and to cause apparatus of its station to interconnect so as to commence generating and displaying (or otherwise outputting) combined medium programming of the programming transmitted by its selected recorder/player, 217 or 217A.

Playing each commercial spot causes the combined medium information of said spot to display information of a particular commercial product such as a truck or a particular service such as a software package; to access the prerecorded "A:PLANTING.DAT" disk file information of a farmer's crop planting plan; in a fashion well known in the art, to generate cost/benefit financial analysis of the incremental benefit of acquiring and using the displayed product or service (by comparison with the farmer's existing product or service of like kind); and to display (or otherwise output) information of said analysis (if said analysis results in a positive net present benefit).

After studying his specific crop planting plan and associated budget projections, his associated sensitivity analyses, and the output information of the selected commercial spots of his station, each farmer loads and runs his prerecorded module, TELEPHON.EXE, in a fashion well known in the art. Under control of the instructions of the TELEPHON.EXE module of his station controlling the operation of his signal processor, 200, each farmer enters information at his local input, 225, that modifies the information of his file, "PLANTING.DAT," to suit his own wishes and inclinations then executes particular information of said TELEPHON.EXE module that causes the instructions of said module to cause his signal processor, 200, to transmit the information of his "PLANTING.DAT" file, via telephone network in the fashion of example #10, to a computer at a particular remote data collection station.

Over the course of a particular time such as two days, computers at remote data collection stations receive data automatically from each farmer of said nations which data indicates the specific quantity of each crop that each farmer expects to harvest during the 2027 growing season. Automatically, the received data is aggregated, in a fashion well known in the art, at the computer of said European master network origination and control station which allows planners at said station to modify and refine the variables of the national intermediate generation set of said station, especially the projected market prices at which farmers are projected to be able to sell each alternate crop.

The aggregated data is also distributed automatically to computers at the national and local intermediate transmission stations, enabling national and local planners to vary and refine the policy variables of their stations' local-formula-and-item information.

Then, at 3:59 PM, on Thursday, Feb. 18, 2027, the cycle of generating and communicating information of farmers is repeated using the refined variables. Once again farmers receive optimal planting plans, given the new refined variables, and respond with their own plans, causing data to be aggregated at the computer of said European master network origination and control station.

In an iterative fashion well known in the art, this cycle is repeated several times until a satisfactory European master agricultural plan is achieved. Invariable early cycles result in excessive planned planting, but as projected variables are refined in subsequent planning cycles, the excesses are eliminated. Ultimately the planners are able to establish policy formula and item variables at levels that yield socially beneficial economic conditions while enabling farmers individually to maximize the profitability of their planting plans, subject to their individual resources.

In this fashion, the unified system of programming communication of the present invention facilitates efficient economic planning and decision making.

It is obvious to one of ordinary skill in the art that the foregoing is presented by way of example only and that the invention is not to be unduly restricted thereby since modifications may be made in the structure of the various parts or in the methods of their functioning without functionally departing from the spirit of the invention. Any SPAM message and any other programming transmission can be caused, through encryption/decryption and other SPAM regulating techniques of the present invention, to take affect fully only selected stations and station apparatus. Because any transmission station can invoke any SPAM controlled function by transmitting a SPAM message with meter-monitor segment information, invoking any given SPAM controlled function can also cause meter information and or monitor information to be processed in the fashions described above at apparatus and stations where said controlled function is invoked. Intermediate transmission stations can be equipped with SPAM regulating capacity such as that illustrated in FIG. 4, monitoring capacity such as that illustrated in FIG. 5, and control information switching and bus communications capacity such as that illustrated in FIGS. 7 and 8. Controlling such capacity by means of transmitted SPAM messages, a remote network origination and control station can transmit programming to intermediate transmission stations, regulate and meter the use of said programming at said stations, monitor the use and usage of said programming at said stations, and control communication of control information at said stations all in the fashions that apply above to ultimate receiver stations. And any given transmission station can cause its receiver stations to function automatically not only in the fashions described above in the sections on automating ultimate receiver stations but in any appropriate fashion that a network origination and control station can cause intermediate transmission stations to function automatically.

What is claimed is:

1. A method of processing signals at a receiver station based on a received information transmission, said method comprising the steps of:

storing a subscriber datum at a computer at said receiver station, said subscriber datum being at least one of the group consisting of:
(1) a property datum;
(2) a financial datum;
(3) an income datum; and
(4) an interest datum;

receiving at least one control signal in said received information transmission;

detecting the presence of said at least one control signal in said received information transmission;

passing said detected at least one control signal to said computer;

computing a value datum by processing said stored subscriber datum in response to said detected control signal;

generating a financial analysis including said value datum by processing said stored subscriber datum in response to said detected control signal; and outputting at least a portion of said financial analysis to a subscriber.

2. A method for information delivery for use with an interactive mass medium program output apparatus comprising the steps of:

receiving, in a mass medium program signal including identification data or instruct signals embedded therein, a mass medium program that explains at least one subscriber specific datum, said interactive mass medium program output apparatus having an input device to receive input from a subscriber and an output device for outputting said program;

outputting said mass medium program;

receiving a reply from said subscriber at said input device, said interactive mass medium program output apparatus having a transmitter for communicating information to a remote station;

communicating said reply to a remote station, said interactive mass medium program output apparatus and said remote station comprising a network having a plurality of transmitter stations;

generating, in said network, a user specific financial analysis which is to be output at said interactive mass medium program output apparatus, said interactive mass medium program output apparatus having a receiver for receiving at least a portion of said user specific financial analysis from said remote station;

delivering said user specific financial analysis.

3. A method of processing signals at a receiver station based on a broadcast or cablecast transmission, said method comprising the steps of:

storing a subscriber datum at a computer at said receiver station, said subscriber datum being at least one of:

(1) a property datum;

(2) a financial datum;

(3) an income datum; and (4) an interest datum;

receiving one or more control signals in said broadcast or cablecast transmission;

detecting the presence of said one or more control signals in said broadcast or cablecast transmission;

passing said one or more control signals to said computer;

computing a value datum by processing said stored subscriber datum in response to one or more of said detected and passed control signals;

selecting a mass medium program on the basis of a stored parameter;

outputting said mass medium program to a subscriber at said receiver station; and presenting some portion of a user specific financial analysis in said mass medium program, said user specific financial analysis being based on said subscriber datum.

4. A method of communicating subscriber station information from said subscriber station to one or more remote stations, said method comprising the steps of:

storing subscriber data at said subscriber station;

processing an instruct signal and a control signal wherein said control signal is effective to deliver a user specific financial analysis at said subscriber station, said processing at said subscriber station is directed by instructions from said instruct signal, and said user specific financial analysis being based on said subscriber data;

computing a value datum by processing said stored subscriber data in response to control signal;

generating one or more subscriber specific data from said step of processing said instruct signal;

transferring said one or more subscriber specific data from said subscriber station to said one or more remote stations; and receiving at least one of viewer modified or planner modified information for use in a subsequent iteration of processing an instruct signal.

5. A method of communicating program material to a receiver station which includes a broadcast or cablecast program receiver, an output device, a control signal detector, a processor operatively connected to said output device, wherein said receiver station is adapted to detect and respond to one or more instruct signals, said method comprising the steps of:

outputting a program to be transmitted at a transmitter station and delivering said program to a transmitter;

storing said one or more instruct signals at said transmitter station, said one or more instruct signals at said receiver station operating to deliver a user specific financial analysis, said user specific financial analysis based on pre-stored subscriber data; and transmitting from said transmitter station an information transmission comprising said program and said one or more instruct signals, wherein some identification data or said one or more instruct signals are embedded in a mass medium program signal including said program.

6. The method of claim 5, wherein said step of transmitting directs said information transmission to a plurality of receiver stations at the same time and each of said plurality of receiver stations receives or responds to said one or more instruct signals concurrently.

7. The method of claim 5, wherein said step of transmitting directs said broadcast or cablecast transmission to a plurality of receiver stations at different times and each of said plurality of receiver stations responds to said one or more instruct signals at a different time.

8. The method of claim 5, further comprising the steps of receiving said program at a receiver in said transmitter station, communicating said program from said receiver in said transmitter station to a memory location, and storing said program at said memory location for a period of time prior to communicating said program to said transmitter.

* * * * *